US006150964A

United States Patent [19]

McLaughlin

[11] Patent Number: 6,150,964

[45] Date of Patent: *Nov. 21, 2000

[54] M=10 (2,10), D=3.75 RUNLENGTH LIMITED CODE FOR MULTI-LEVEL DATA

[75] Inventor: Steven W. McLaughlin, Rochester, N.Y.

[73] Assignee: Calimetrics, Inc., Alameda, Ga.

[ * ] Notice: This patent issued on a continued prosecution application filed under 37 CFR 1.53(d), and is subject to the twenty year patent term provisions of 35 U.S.C. 154(a)(2).

[21] Appl. No.: 08/915,282

[22] Filed: Aug. 20, 1997

Related U.S. Application Data

[63] Continuation of application No. 08/669,062, Jun. 24, 1996, abandoned.

[51] Int. Cl.[7] ............................ H03M 7/00; H03M 5/02; G11B 3/90; H04N 5/76

[52] U.S. Cl. ................................ 341/59; 369/59; 341/56

[58] Field of Search ................................ 341/56, 57, 59; 375/264, 340; 360/41, 46; 371/43; 369/59; 714/752, 781

[56] References Cited

U.S. PATENT DOCUMENTS

| | | | |
|---|---|---|---|
| 4,413,251 | 11/1983 | Adler et al. | 341/59 |
| 4,463,344 | 7/1984 | Adler et al. | 341/51 |
| 4,488,142 | 12/1984 | Franaszek | 341/59 |
| 4,506,252 | 3/1985 | Jacoby et al. | 341/57 |
| 4,566,044 | 1/1986 | Langdon, Jr. et al. | 360/40 |
| 4,691,193 | 9/1987 | Khu | 341/67 |
| 4,760,378 | 7/1988 | Iketani et al. | 341/59 |
| 4,864,536 | 9/1989 | Lindmayer | 365/119 |
| 4,870,414 | 9/1989 | Karabed et al. | 341/59 |
| 4,882,583 | 11/1989 | Dimitri et al. | 341/59 |
| 4,914,438 | 4/1990 | Kameyama | 341/59 |
| 4,928,187 | 5/1990 | Rees | 360/40 |
| 4,949,196 | 8/1990 | Davie et al. | 360/40 |
| 5,047,767 | 9/1991 | Weathers et al. | 341/59 |
| 5,099,237 | 3/1992 | Fitingof | 341/59 |
| 5,136,573 | 8/1992 | Kobayashi | 369/116 |
| 5,142,493 | 8/1992 | Lindmayer | 365/119 |
| 5,163,039 | 11/1992 | Lindmayer | 369/100 |
| 5,173,694 | 12/1992 | Lynch, Jr. et al. | 341/59 |
| 5,196,849 | 3/1993 | Galbraith | 341/59 |
| 5,257,270 | 10/1993 | Hilden et al. | 341/59 X |
| 5,260,703 | 11/1993 | Nguyen et al. | 341/100 |
| 5,271,016 | 12/1993 | Hilden | 714/752 |
| 5,287,228 | 2/1994 | Sawaguchi | 360/57 |
| 5,329,512 | 7/1994 | Fukimoto et al. | 369/121 |
| 5,390,198 | 2/1995 | Higgins | 371/43 |
| 5,398,260 | 3/1995 | Min | 375/286 |
| 5,400,313 | 3/1995 | Belser et al. | 369/116 |

OTHER PUBLICATIONS

A.B. Marchant, *Optical Recording, A Technical Overview*, Addison–Westley, Reading, MA, 1990.

M. Tomlinson, "New Automatic Equalizer Employing Modulo Arithmetic," *Electronic Letters*, vol. 7, Nos. 5–6, pp. 138–139, Mar. 25, 1971.

(List continued on next page.)

*Primary Examiner*—Michael Tokar
*Assistant Examiner*—Patrick Wamsley
*Attorney, Agent, or Firm*—Ritter,VanPelt, & Yi, LLP

[57] ABSTRACT

A system for encoding digital data with an M-ary (d,k) code to provide multi-level coded data where M>2 comprises an M-ary (d,k) encoder for accepting digital input data. The M-ary (d,k) coder encodes the digital input data to produce a plurality of code symbols, where each code symbol is at one of M levels and each pair of non-zero code symbols is separated by at least d but no more than k zeros. A waveform encoder converts the code symbols into waveform signal amplitudes compatible with a multi-level channel. Each waveform signal amplitude is generated by modulo M addition of a current code symbol with a previous waveform signal amplitude. A specific M=10(2,10) code provides high density recording to a multi-level storage medium. The M=10 (2,10) encoder is implemented using a seven-state encoder and a modulo ten waveform encoder.

25 Claims, 4 Drawing Sheets

OTHER PUBLICATIONS

G. Underboeck, "Channel Coding With Multilevel/Phase Signals," *IEEE Trans. on Information Theory*, vol. IT–28, No. 1, pp. 55–67, Jan., 1982.

S. W. McLaughlin, "Improved Distance M–ary (d,k) Codes for High Density Recording," Rochester Institute of Technology, Rochester, NY, Jun., 1994.

S. W. McLaughlin et al., "Full Digital Video Read Write Disk Drive Using M–ary Coding," Rochester, Date unknown.

Brita H. Olson et al., "Multidimensional Partial Response For Partial Readout Optical Memories," *SPIE*, vol. 2297, pp. 331–337, May, 1994.

Siegel, Paul H., "Recording Codes For Digital Magnetic Storage," *IEEE Transactions On Magnetics*, vol. 21, No. 5, pp. 1344–1349, Sep. 1985.

Kobayashi, H. et al., "Application of Partial–responsse Channel Coding to Magnetic Recording Systems," IBM J. Res. Develop., pp. 368–375, Jul. 1970.

Lindmayer, Dr. Joseph et al., "Electron Trapping Optical Technology—Memory's Next Generation?," *Computer Technology Review*, Summer, 1990.

Earman, Allen, "Optical Data Storage With Electron Trapping Materials Using M–ary Data Channel Coding," *Proceedings of the Optical Data Storage Conference*, SPIE, Feb. 1992, San Jose, California.

Forney, Jr., G. David et al., "Coset Codes For Partial Response Channels; or, Coset Codes With Spectral Nulls," *IEEE Transactions on Information Theory*, vol. 35, No. 5, Sep. 1989, pp. 925–943.

Laroia, Rajiv et al., "A Simple and Effective Precoding Scheme for Noise Whitening on Intersymbol Interference Channels," *IEEE Transactions on Communications*, vol. 41, No. 10, Oct. 1993, pp. 1460–1463.

McLaughlin, Steven et al., "M–ary Runlength Limited Codes for High Density Optical Recording," 1994 *Int'l Symposium on Information Theory*, Trondheim, Norway, Jun. 1994.

Ungerboeck, Gottfried, "Trellis–Coded Modulation with Redundant Signal Sets, Part I: Introduction," *IEEE Communications Magazine*, vol. 25, No. 2, pp. 5–11, Feb. 1987.

Ungerboeck, Gottfried, "Trellis–Coded Modulation with Redundant Signal Sets, Part II: State of the Art," *IEEE Communications Magazine*, vol. 25, No. 2, pp. 12–21, Feb. 1987.

Marcus, Brian et al., "Finite–State Modulation Codes for Data Storage," *IEEE Journal On Selected Areas In Communications*, vol. 10, No. 1, pp. 5–37, Jan. 1992.

Adler, Roy et al., "Algorithms for Sliding Block Codes," *IEEE Transactions in Information Theory*, vol. IT–29, No. 1, pp. 5–22, Jan. 1983.

Forney, Jr., G. David et al., "Combined Equalization and Coding Using Precoding," IEEE *Communications Magazine*, pp. 25–34, Dec. 1991.

McLaughlin, Steven et al., "Modulation Codes for Multi–amplitude Optical Recording Channels," Rochester Institute of Technology, Rochester, New York, paper presented Nov. 1994.

M=10 (2,10), D=3.75 RUNLENGTH LIMITED CODE FOR MULTI-LEVEL DATA

This application is a continuation of application Ser. No. 08/669,062, filed Jun. 24, 1996, now abandoned.

BACKGROUND OF THE INVENTION

1. Field of the Invention

The present invention relates generally to multi-level coding techniques, and more specifically to a system and method for coding data using an M=10 (2,10) runlength limited code, such code being particularly useful for storing and/or transmitting multi-level data.

2. Related Art

Various techniques are currently in use for increasing the recording density on various digital recording mediums such as magnetic tapes and disks and in other similar media. One technique utilizes an approach known as run-length-limited coding. This technique requires that each "1" in a coded bit sequence must be separated by a specified number of "0's." This number of zeros must be at least a minimum quantity, d, to reduce intersymbol interference, and is limited to a maximum quantity k for self clocking purposes. Such codes are generally referred to as (d,k) run-length-limited (RLL) codes.

Because conventional recording techniques use saturation recording to store information, binary recording techniques are often used to mark the recording medium. As a result, conventional (d,k) RLL codes developed to date are developed and optimized to store binary data.

Significant advances in data storage materials have lead to the development of a storage medium that provides a linear response characteristic. One such material providing a linear response characteristic is an electron trapping material such as is disclosed in U.S. Pat. Nos. 4,864,536, 5,007,037, and 5,142,493, all to Lindmayer.

Using a material which provides a linear response characteristic yields an advantage over saturation-type media in that it adds an analog dimension to the storage capacity of the medium. Because the response is linear, the linear-response storage materials provide the ability to encode information in two dimensions—amplitude and phase.

As a result, the storage medium is no longer confined to storing binary or even tri-level data. Instead, the concept of M-ary, or non-binary, data coding and storage is provided. The increased symbol set allowed by such encoding provides the opportunity to dramatically increase the data recording density and transfer rate of the storage device. For example, the potential storage capacity of a single 5¼ inch disk can be extended to several gigabytes if that disk is implemented using electron trapping materials with M-ary (multi-level) data coding.

SUMMARY OF THE INVENTION

The present invention is directed toward an M=10 (2,10) runlength-limited code for multi-level data storage and/or communications. Also disclosed herein is a system and method for generating multi-level data from a binary input data stream using an M-ary (d,k) code such as the M=10 (2,10) runlength limited code.

According to the invention input data bits are coded using an M-ary (d,k) encoder to generate code symbols. Specifically, input data bits x are encoded using the M-ary (d,k) encoder to generate code symbols y, where:

$$x=(x_0,x_1, \ldots x_{p-1})$$

for p input date bits, and $$y=(y_0, y_1, \ldots y_{q-1})$$

where p/q is the code rate R.

The code symbols y are multi-level symbols, each being at one of M levels. The code symbol stream provided meets the code specifications of no fewer than d and no greater than k zeros between each non-zero symbol. Thus, according to the M=10 (2,10) code disclosed herein, code symbols are each at one of ten levels and there is a minimum of two and a maximum of ten zeros between each non-zero symbol.

The code symbols y are encoded to generate a series of waveform amplitudes z. The waveform amplitudes are generated by modulo M addition of the current code symbol $y_i$ with the previous waveform amplitude $z_{i-1}$. The waveform amplitudes are used to modulate a write laser to store information onto an optical disk or to otherwise store or communicate the input data bits x in the form of multi-level information.

To recover the original data bits x from the medium, the information stored on the medium is read and the resultant signal amplitudes are decoded. Two stages of decoding are provided. In the first stage, the waveform amplitudes are decoded to generate code symbols. In the second stage, the code symbols are decoded to recover the original data bits.

The system and method described herein for coding and decoding the data is described with respect to the M=10 (2,10) code disclosed herein. However, while other codes may not be obvious in light of the code disclosed herein, given a specific M-ary (d,k) code, after reading the below disclosure, it will become apparent to a person skilled in the relevant art how the disclosed system and method can be implemented to code and decode the data using such a specific M-ary (d,k) code.

An advantage of the invention is that the recording density can be increased by coding the input data using the disclosed M=10 (2,10) code. Because there are at least d zeros between every non-zero code symbol, there can be at least d+1 symbols stored for a given minimum feature size. Given a code of rate R, the density achievable is (d+1)R.

It should be noted that the coding techniques described herein are not limited to optical recording. Other recording systems capable of supporting multi-level data would benefit from the coding techniques described herein. Additionally, these coding techniques are also applicable to communications systems where the communications channel is capable of supporting multi-level data. In such an implementation, the waveform amplitudes could be used to modulate a signal carrier for transmission across the multi-level channel.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE EMBODIMENTS

1. Introduction

Figure 1:
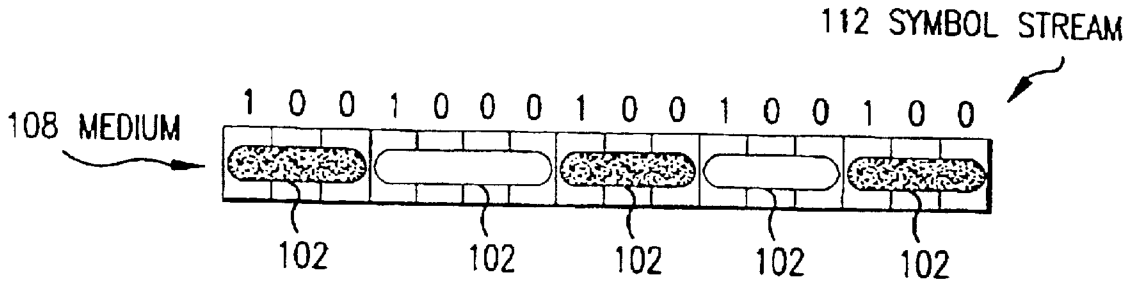
FIG. 1 is a diagram illustrating a portion of an optical storage medium and features thereon.

The present invention is directed toward an M-ary (d,k) code for use in storage and/or transmission of multi-level data, and a system and method for generating the same. This discussion is provided in several sections. In Section 2, before discussing the invention in detail, a brief discussion of binary (d,k) codes is presented. In Section 3, a coding system for coding input data using an M-ary (d,k) code is described. In Section 4, some code design factors are described. In Section 5, a specific M=10 (2,10) code is described that is particularly useful for storage and/or transmission of multi-level data. Section 5 also provides a detailed description of the encoder used to code data using the disclosed M=10 (2,10) code. In Section 6 there is presented a discussion of a sliding block decoder generally useful for decoding M-ary (d,k) codes, as well as a specific decoder for decoding the M=10 (2,10) code described in Section 5.

The present invention is generally described in terms of an embodiment where multi-level data are stored on and retrieved from an optical disk. In such an embodiment, the encoder and decoder described herein may be implemented for multi-level data storage in an optical disk system such as that disclosed in U.S. Pat. No. 5,007,037, which is incorporated herein by reference. However, after reading the below description, it will become apparent to a person skilled in the relevant art how the systems and methods of the invention can be implemented for alternative applications such as multi-level data communications and storage of multi-level data on media other than optical disks. In yet other alternative embodiments, the invention can be implemented to transmit and receive data across an M-ary communications channel. In this document, the term "channel" is sometimes used to refer to the optical disk. It should be understood that in the alternative embodiments the term channel can be used to describe alternative storage media and/or communications channels.

Additionally, after reading the below detailed description of the encoder and decoder of the present invention, it will become apparent to a person skilled in the art that these disclosed components can be implemented using hardware, software or a combination of both hardware and software.

2. Binary (d,k) Run-Length-Limited Coding

Using conventional binary storage techniques, data are written to a storage medium using binary 1's and 0's. Using run-length limited coding, the data to be recorded are first encoded using a run-length-limited encoder. As stated above, with a (d,k) RLL code, there is a minimum and a maximum number of 0's that can occur between each pair of 1's, as specified by the code parameters d and k. Thus, the (d,k) RLL encoder results in a 1 followed by at least d and at most k 0's before another 1 occurs. Such (d,k) RLL codes for binary applications are well known in the art.

To write input data to the saturation storage medium, the input data are first encoded to create symbols. The encoder is designed such that the output symbols conform to the code specifications: each 1 is followed by a minimum of d and a maximum of k 0's. These symbols are then written to the storage medium as a series of features. For example, for optical disks, a feature is the presence or absence of a bum mark. In a magnetic tape, the feature is a grouping of magnetic particles oriented in a particular manner.

FIG. 1 illustrates a portion of an optical storage medium 108 that stores binary data as features 102. Illustrated are shaded and unshaded features 102, indicating the absence or presence of a bum mark. Also illustrated in FIG. 1 is an example symbol stream 112 that is used to write the features 102 to medium 108. As discussed above, symbol stream 112 is the result of encoding input data using a (d,k) RLL code. Symbol stream 112 is written to medium 108 using an additional coding step as follows: the occurrence of a 1 indicates a change in the type of mark (i.e., absence or presence of a bum mark); the occurrence of a 0 indicates no change in mark type. This additional coding step is sometimes referred to as non-return-to-zero interleaved (NRZI) precoding.

Note that with a (d,k) RLL code where d=2, the minimum number of symbols represented by a single feature 102 is three. Thus, for a minimum feature size (e.g., for the smallest spot size on medium 108) three symbols can be represented. As a result, for a rate ½ code, where each input bit corresponds to two symbols, the minimum density of data written to medium 108 is 1.5 bits per feature. Thus, as a result of using the (d,k) RLL coding in the described scenario, the density of the recording system can be increased by 50%.

3. A Generic M-ary Runlength-Limited (d,k) Coder

A few advantages of (d,k) coding are described above with reference to binary data systems. It is important to note that similar gains in density can be realized for storage and communications systems using multi-level (versus binary) data. To optimize such gains, however, new codes and new coding techniques are required to take full advantage of the unique properties of the multi-level data. Thus, the inventors have developed a system and method for encoding data using M-ary (d,k) codes.

Figure 2:
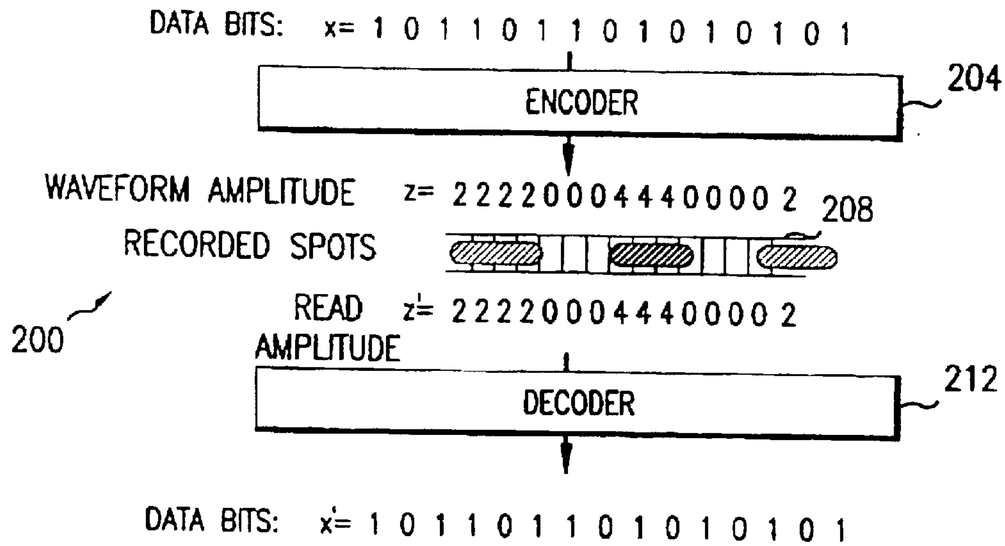
FIG. 2 is a diagram illustrating a data storage system for storing a multi-level coded data.

FIG. 2 is a high-level block diagram generally illustrating a multi-level data recording system 200. The recording system is comprised of an encoder 204, multi-level storage medium 208 and a decoder 212. As stated above, multi-level storage medium 208 can be replaced with a communications channel allowing the multi-level (dk) code and coding scheme to be used with multi-level data communications. In such a communications embodiment, encoder 204 and decoder 212 can be provided on both ends of the communications channel to allow bidirectional coded communications.

According to the invention, input data bits $x=(x_0, x_1, \ldots, x_{p-1})$ are the actual data that a user wishes to be stored on and retrieved from medium 208. However, to take full advantage of the multi-level properties of medium 208 and to increase the storage density achieved, the invention provides for the encoding of input data x so that multi-level data is stored on medium 208. Such encoding is accomplished using encoder 204.

Figure 3:
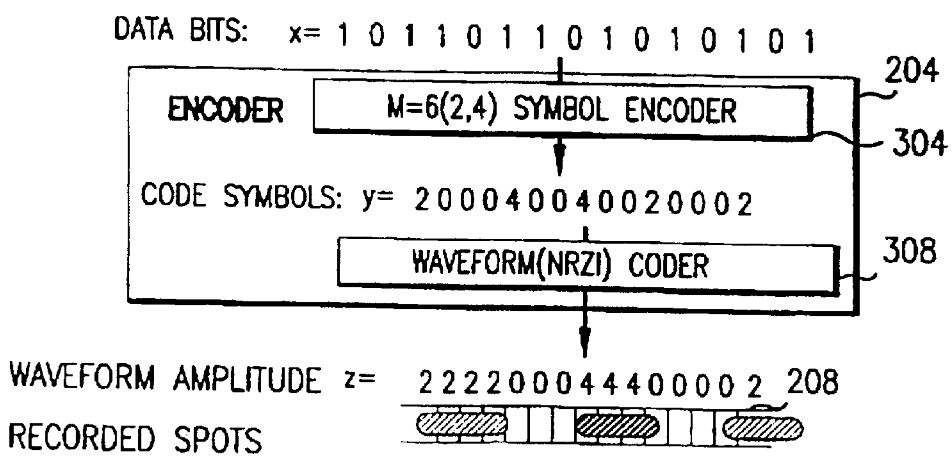
FIG. 3 is a diagram illustrating an encoder for encoding multi-level data using a multi-level (d,k) code.

In one embodiment, encoder 204 is implemented as a two-stage encoder. FIG. 3 is a block diagram illustrating encoder 204 in this embodiment. Referring to FIG. 3, encoder 204 is comprised of a symbol encoder 304 and a waveform encoder 308, referred to herein as encoder 304 and encoder 308, respectively.

Encoder 304 is a (d,k) RLL symbol encoder that accepts the input data bits x and converts them to a stream of code symbols $y=(y_0, y_1, \ldots, y_{q-1})$. To take advantage of the multi-level characteristics of medium 208, encoder 304 generates code symbols y at M different levels, where M>2. A second feature of encoder 304 is that the stream of code symbols y meets the code specification that there are no fewer than d and no greater than k zeros between each non-zero code symbol. Another feature of encoder 304 is that there are R input bits $x_i$ for each code symbol $y_i$ generated. This feature is referred to as the code rate. Thus for a rate 1/N code (i.e., where R=1/N), there are N code symbols $y_i$ generated for each input data bit $x_i$.

Waveform encoder 308 accepts code symbols y and converts them to a series of waveforms $z=(z_0, z_1, \ldots, z_{q-1})$, each of a given amplitude. Waveform encoder 308 generates output waveforms z, each at one of M different amplitudes. The waveform amplitudes are generated by modulo M addition of the current code symbol $y_i$ with the previous waveform amplitude $z_{i-1}$. It is the waveforms z which are used to modulate a write laser for storing data onto medium 208 (or transmitted across the multi-amplitude channel).

Because there are at a minimum d zeros, between each non-zero code symbol, each waveform amplitude z generated represents, at a minimum, d+1 code symbols y. Also, because there are 1/R code symbols y generated for each input data bit x, each waveform amplitude z generated represents, at a minimum, (d+1)R data bits x. Thus, for a minimum feature size (e.g., the smallest spot that can be written to the storage medium or the shortest pulse that can be transmitted across the communications channel), the density achieved is D=(d+1)R.

Consider this density in terms of the specific M=10 (2,10) code described below. The rate of this code is R=5/4 and d=2. For this code, the density is 3.75 input data bits $x_i$ per minimum feature size. In other words, 3.75 input data bits can be stored using a single minimum-size feature.

4. Code Design Factors

The coding system and method described above can be used to code input data using any of number of M-ary (d,k) codes. However, the design of a specific M-ary (d,k) code is not a trivial matter.

There are several factors that must be taken into consideration when designing M-ary (d,k) codes. The specific coding scheme used to implement a given code impacts the performance of the encoding and decoding systems. For example, the code should be designed such that encoders and decoders can be implemented in a straight-forward and cost-effective manner. Toward this end, the desirable code can be implemented using encoders that have a relatively small number of states while still meeting the code parameters (i.e., M, d and k). Additionally, the decoder required to decode the coded data should be implementable using a small sliding block window size and the decoder should have a relatively a small table size.

Further, the code design must result in an encoder and decoder that operate such that errors in the decoder side have a minimum effect. It would be undesirable for errors to propagate too far in the decoded data stream. In some less-than-desirable systems, a single decoding error can result in a very large, if not infinite, number of additional decoding errors.

Achievement of such design goals is not a trivial matter. Not every M-ary (d,k) code of a given set of parameter values will perform in a desirable manner. Provided in the next section of this document is a specific M=10 (2,10) runlength-limited code that meets the design goals outlined above.

5. M=10 (2,10) runlength-limited code

As stated above, code design is not a trivial matter as there are several coding factors that affect the performance of the system. The specific code implemented for a given set of parameters can impact the overall performance of the system. This section of the patent document describes a specific M-ary (d,k) code and the specific encoder used to implement this code. In particular, this section describes a specific M=10 (2,10) runlength-limited code having a rate R=5/4.

Table 1 is a state table illustrating an encoder 400 for encoding input data x to generate code symbols y for the M=10 (2,10) code (i.e. a specific version of encoder 304). Encoder 400 is a seven-state, M=10 (2,10) encoder. For each input data bit set $x_0$–$x_4$, an output code symbol set $y_0$–$y_3$ is produced; each output code symbol $y_i$ is at one of ten levels (0–9). The various states as well as the inputs and outputs of Encoder 400 M=10 (2,10) are illustrated using Table 1.

Figure 4:
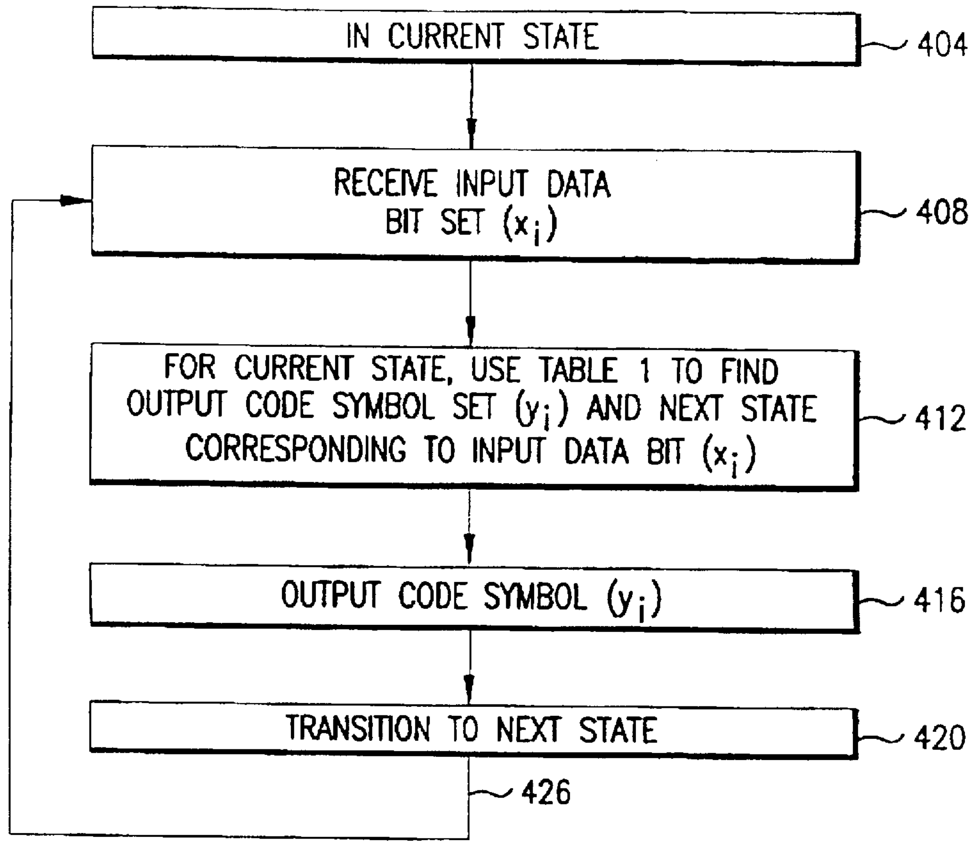
FIG. 4 is a flow diagram illustrating the operation of a multi-state encoder.

FIG. 4 is an operational flow diagram illustrating the operation of state machine 400. The operation of state machine 400 is now described with reference to Table 1 and FIG. 4. In a step 404, the operation starts in a given state at time t=0. In a step 408, an input data bit set $x_0$–$x_4$ is received. In a step 412, Table 1 is used to determine the output code symbol set $y_0$–$y_3$ and next state from the current state and the input data bit set $x_0$–$x_4$ received in step 408. In a step 416, encoder 304 outputs code symbol set $y_0$–$y_3$ determined in step 412. In a step 420, state machine 400 transitions to the next state determined in step 412. At this time, the operation continues at step 408 as indicated by flow line 426.

As is evident by the above description, an output code symbol set $y_0$–$y_3$ of encoder 304 is a function of the input data bit set $x_0$–$x_4$, and the current state 404 of encoder 304. For the M=10 (2,10) encoder of the present invention, Table 1 describes the output code symbol set $y_0$–$y_3$ and next state of encoder 304 for each current state and input data bit set $x_0$–$x_4$.

TABLE 1

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |

TABLE 1-continued

| INPUT | OUTPUT | NEXT STATE |
|---|---|---|
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |
| 26 | 0600 | 4 |
| 27 | 0700 | 4 |
| 28 | 0100 | 5 |
| 29 | 0200 | 5 |
| 30 | 0300 | 5 |
| 31 | 0400 | 5 |
| | State 2 | |
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 3 | |
| 0 | 1001 | 0 |
| 1 | 1002 | 0 |
| 2 | 1003 | 0 |
| 3 | 1004 | 0 |
| 4 | 1005 | 0 |
| 5 | 1006 | 0 |
| 6 | 1007 | 0 |

TABLE 1-continued

| INPUT | OUTPUT | NEXT STATE |
|---|---|---|
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |
| 1 | 4007 | 0 |
| 2 | 4008 | 0 |
| 3 | 4009 | 0 |
| 4 | 5001 | 0 |
| 5 | 5002 | 0 |
| 6 | 5003 | 0 |
| 7 | 5004 | 0 |
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |
| 6 | 8008 | 0 |
| 7 | 8009 | 0 |
| 8 | 9001 | 0 |
| 9 | 9002 | 0 |
| 10 | 9003 | 0 |
| 11 | 9004 | 0 |
| 12 | 9005 | 0 |
| 13 | 9006 | 0 |
| 14 | 9007 | 0 |
| 15 | 9008 | 0 |

TABLE 1-continued

| INPUT | OUTPUT | NEXT STATE |
|---|---|---|
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |
| 10 | 8000 | 2 |
| 11 | 9000 | 2 |
| 12 | 4000 | 3 |
| 13 | 5000 | 3 |
| 14 | 6000 | 3 |
| 15 | 7000 | 3 |
| 16 | 8000 | 3 |
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

To further illustrate the operation of symbol encoder 304, consider an example input data stream x as illustrated in Table 2. In this example, assume the encoder 304 starts in state 3 and that the first input data bit set $x_0$–$x_4$ is ‘10100’. Referring to the node 404 for state 3, the edge where $x_0$–$x_4$=‘10100’ indicates that encoder 304 outputs symbol ‘3003’ and transitions to state 0. This can also be determined by referring to the rows in Table 1 corresponding to a current state of 3.

Figure 5:
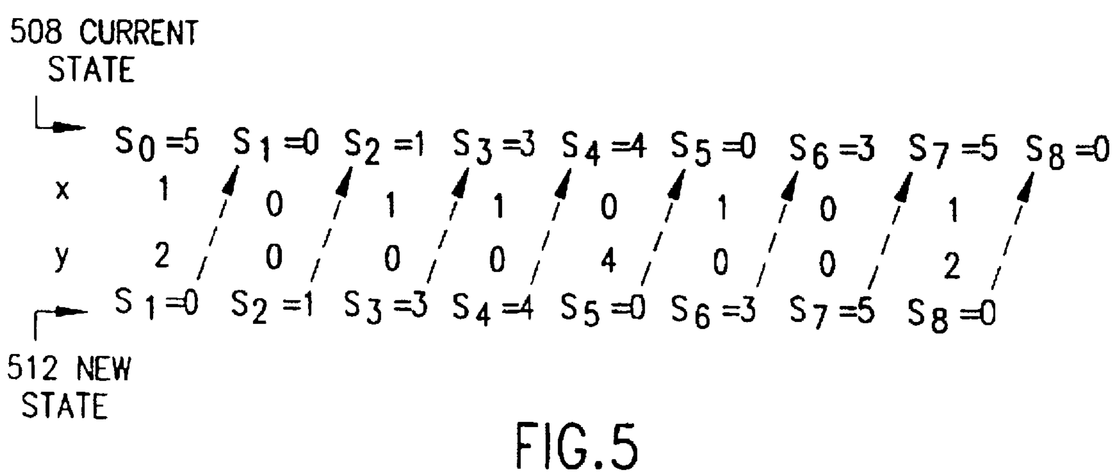
FIG. 5 is a diagram illustrating an example input data stream being coded using the encoder illustrated in FIG. 4.

FIG. 5 is a diagram further illustrating the example. FIG. 5 illustrates a current state 508 and a new state 512 for the example input data stream provided in Table 2. Referring to FIG. 5 and state machine 400, given the input data stream illustrated in Table 2, for each input data bit set $x_0$–$x_4$, encoder 304 transitions from a current state 508 to a new state 512 and produces an output symbol set $y_0$–$y_3$. FIG. 5 illustrates the example for 15 data bits x of the input data stream while Table 2 is an example for 20 data bits x.

TABLE 2

| | | | |
|---|---|---|---|
| x | 10100 | 00110 | 11000 |
| y | 3003 | 0002 | 0020 |
| z | 3336 | 6668 | 8800 |

As described above with reference to FIG. 3, code symbols y are further coded by waveform encoder 308 to generate a sequence of amplitudes z used to modulate the write laser. According to one embodiment, waveform encoder 308 is a modulo ten encoder that, for a given time, determines the waveform amplitude $z_i$ by $$z_i=(z_{i-1}+y_i)\bmod M$$

Note that z is a transformed version of y, where the difference (mod M) between waveform amplitudes $z_i$ and $z_{i-1}$ is the coded symbol $y_i$. Thus, in this embodiment, each new code symbol $y_i$ is modulo ten added to the previous waveform amplitude $z_{i-1}$ to result in the current waveform amplitude $z_i$. In following the example described above and illustrated in FIG. 5 and Table 2, the code symbols y are encoded by waveform encoder 308 to waveform amplitudes z, as illustrated in Table 2.

To briefly summarize the encoding process, input binary data bits x are first encoded using an M=10 (2,10) symbol encoder to produce code symbols y at M=10 levels. Code symbols y are then encoded by waveform encoder 308 to produce waveform amplitudes z. According to the current code, M=10 amplitudes (illustrated in the above examples as 0–6) are possible. These amplitudes are written to the media by the write laser as illustrated in FIG. 3.

6. Decoder

In order to recover the original data bits x from the amplitudes z stored on the media (or transmitted across the communications channel) a decoder is implemented. In one embodiment, the decoder uses a state independent lookup table to decode amplitude levels z read from the disk. In this embodiment, the decoder is a sliding block decoder, where a sliding window is used to decode amplitudes read from the disk.

Figure 6:
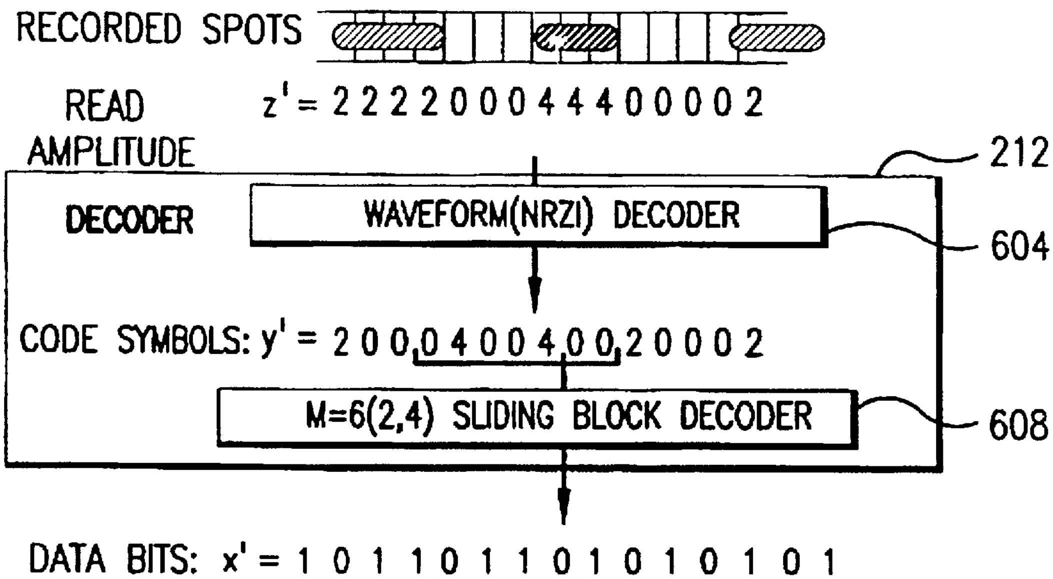
FIG. 6 is a diagram illustrating a decoder for decoding multi-level (d,k) coded data.

FIG. 6 is a block diagram illustrating the decoder. As illustrated in FIG. 6, decoder 212 is comprised of a waveform decoder 604 and a sliding block decoder 608. Waveform decoder 604 receives the signal amplitudes z' (multilevel) from the media and converts them to a sequence of digital code symbols y'. Sliding block decoder 608 performs a table lookup to convert output code symbols y' into output data bits x'. Note that in an error free environment, output code symbols y' correspond identically to input code symbols y and output data bits x' correspond identically to input data bits x.

Any of a number of different techniques can be implemented to read waveform amplitudes z off of the media to provide the signal amplitudes z' to waveform decoder 604. It should be noted that the actual read scheme implemented is not important to the invention as long as data are read accurately.

As stated above, the purpose of waveform decoder 604 is to decode signal amplitudes z' to recover the actual code symbols y'. Waveform decoder converts a sequence of amplitudes $z'=(z'_0, z'_1, \ldots, z'_{N-1})$ where $z'_i \epsilon [0,A]$, for some real number A, to a sequence of code symbols $y'=(y'_0, y'_1, \ldots, y'_{N-1})$.

The operation of waveform decoder 604 is now described. For a given time i, the code symbol $y'_i$ is determined by $$y'_i=(z'_i-z'_{i-1})\bmod M$$

According to this technique, each output symbol y' is determined as being the modulo M difference between the current amplitude waveform $z'_i$ and the previous amplitude waveform $z'_{i-1}$. This decoding essentially undoes the coding performed by waveform encoder 308. Specifically, for M=10 (d,k) codes, such as the M=10 (2,10) code described above in Section 5, the decoding is implemented using a modulo ten difference.

6.1 Sliding Block Decoder

The purpose of sliding block decoder 608 is to convert the sequence of code symbols y' into a sequence of data bits x' that coincide with input data bits x. In a preferred embodiment, the decoder is a state independent lookup table. The size of the lookup table is dependent on the specific code implemented. Therefore, the design of encoder 304 affects the size of the lookup table implemented.

Figure 7:
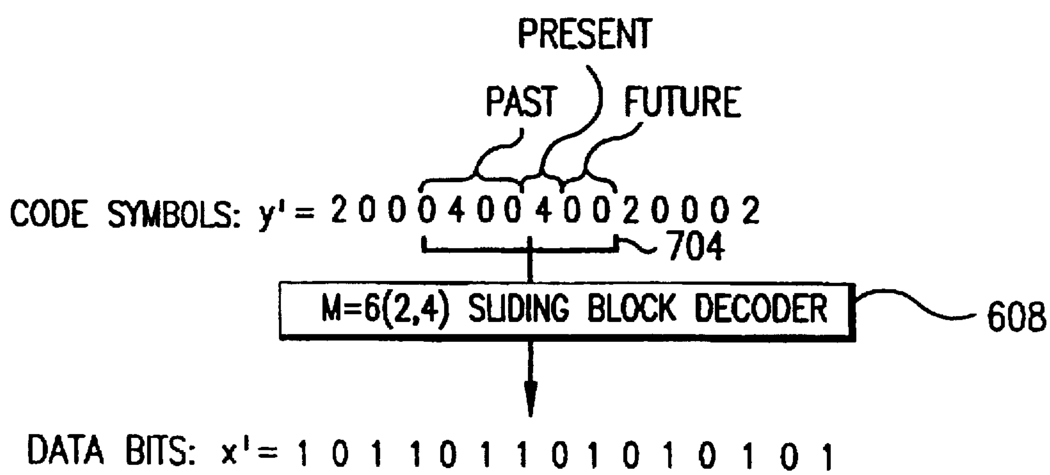
FIG. 7 is a diagram illustrating a sliding block decoder.

Sliding block decoder 608 is illustrated in FIG. 7. Sliding block decoder comprises a sliding window 704 to decode the code symbols y' to arrive at output data bits x'. Whereas encoder 304 accepts one data bit set $x_0$–$x_4$ and generates one code symbol set $y_0$–$y_3$ therefrom, sliding block decoder 608 must look at multiple code symbols y' to decode one data bit set. Specifically, for the encoder described above with reference to Table 1, sliding block decoder 608 requires a block of twelve code symbols $y_i'$ to uniquely decode one data bit set $x_0'$–$x_4'$.

The actual size of sliding window 704 is determined during code design. An optimally sized sliding window 704 is large enough such that the symbols y' within sliding window 704 unambiguously define the correct output bit set $x_0'$–$x_4'$ without being so large that unneeded code symbols y' are included therein. In other words, the window size is chosen as the smallest window which guarantees unique decodability.

With the use of a sliding window 704 to decode the data, knowledge of state information is not required. In fact, the contents of sliding window 704 at any given time contain sufficient information such that state information can be determined therefrom. Thus, sliding block decoder 608 is computationally less complex than conventional decoders; more importantly, the sliding block decoder limits the propagation of errors.

Sliding window 704 actually represents the past, present and future. The one code symbol y' actually being decoded to generate a data bit x' represents the present. Past symbols y' are those occurring earlier in time than the present symbol. Likewise, future symbols y' are those that occur after the present symbol. In FIG. 7, the past is represented by ‘0002’, the present by ‘0020’, and the future by ‘0200’.

Note that sliding block decoders are well known for decoding binary data. One well known technique for implementing sliding block decoders with binary data is the Adler-Coppersmith-Hassner technique disclosed in U.S. Pat. No. 4,413,251. Another, related technique is disclosed in U.S. Pat. No. 4,882,583 to Dimitri et al. According to these techniques, the number of past symbols required in the window is fixed based on the code design. The number of future symbols should be maintained as small as possible. These goals apply to the M-ary sliding block decoder as well.

The lookup table contains a plurality of entries. In one embodiment, each entry contains a possible sequence of N code symbols y', where N is the size of sliding window 704. In alternative embodiments, each entry of the lookup table is addressed by (directly, indirectly or via a decoding scheme) one of the possible sequences of code symbols.

Based on the specific design of coder 304, there are a limited number of possible occurrences of N code symbols y'. The lookup table comprises a sufficient number of entries such that there is one entry for each of the possible occurrences of N code symbols. As stated above, N is chosen such that for each sequence of N code symbols y' an output bit set x' is unambiguously defined.

For the encoder 304 described above with reference to Table 1, the preferred lookup table has 2205 entries and is illustrated in Table 3. For each entry of twelve code symbols y', there is an output bit set x'. Thus, to decode code symbols y', twelve consecutive code symbols y' are loaded into sliding window 704. The entry corresponding to those twelve code symbols y' is located in the lookup table and the corresponding data bit set x' is output. To determine the next output data bit set x', sliding window 704 is ‘slid’ one code symbol set y' into the future (i.e., in one embodiment, a next code symbol set y' is shifted into window 704 and the oldest shifted out) and the lookup process is repeated. This sliding process continues as long as code symbols y' are provided to sliding block decoder 608.

In one embodiment, the contents of window 704 are real-valued and, therefore, the table entry retrieved is the entry that is closest in squared Euclidean distance. Specifically, for a given window $w=(w_1, \ldots, w_{12})$, the distance $d_j$ for each table entry $t_j$ is computed as:

$$d_j^2 = \sum_{i=1}^{12} (w_i - t_{ji})^2 \quad \text{for } j = 1, \ldots 2205$$

where, $t_{ji}$ is the i'th component of the j'th table entry. The window w is then decoded to the table entry with the minimum distance $d_j$.

Other embodiments are contemplated where the contents of window 704 are used as an address or used to generate an address of an entry in a memory, where the contents of that entry contain the appropriate output data bit set x'.

The complexity of the decoding process can be reduced significantly by making hard decisions regarding read signal amplitudes. Specifically, in one embodiment, the read signal amplitudes z' are rounded-off or quantized to be one of the ten permissible amplitude levels. Even though this results in a decrease in the performance of the decoder it can significantly reduce its complexity: that is, the table can be a true lookup table requiring no distance calculations.

TABLE 3

| Window Contents | | | X' |
|---|---|---|---|
| 0 0 0 X | 0 0 0 0 | 0 1 0 0 | 0 0 0 0 0 |
| 0 0 0 X | 0 0 0 0 | 0 2 0 0 | 0 0 0 0 0 |
| 0 0 0 X | 0 0 0 0 | 0 3 0 0 | 0 0 0 0 0 |
| 0 0 0 X | 0 0 0 0 | 0 4 0 0 | 0 0 0 0 0 |
| 0 0 0 X | 0 0 0 0 | 0 5 0 0 | 0 0 0 0 0 |
| 0 0 0 X | 0 0 0 0 | 0 6 0 0 | 0 0 0 0 0 |
| 0 0 0 X | 0 0 0 0 | 0 7 0 0 | 0 0 0 0 0 |
| 0 0 X 0 | 0 0 0 0 | 0 1 0 0 | 0 0 0 0 0 |
| 0 0 X 0 | 0 0 0 0 | 0 2 0 0 | 0 0 0 0 0 |
| 0 0 X 0 | 0 0 0 0 | 0 3 0 0 | 0 0 0 0 0 |
| 0 0 X 0 | 0 0 0 0 | 0 4 0 0 | 0 0 0 0 0 |
| 0 0 X 0 | 0 0 0 0 | 0 5 0 0 | 0 0 0 0 0 |
| 0 0 X 0 | 0 0 0 0 | 0 6 0 0 | 0 0 0 0 0 |
| 0 0 X 0 | 0 0 0 0 | 0 7 0 0 | 0 0 0 0 0 |
| X 0 0 X | 0 0 0 0 | 0 1 0 0 | 0 0 0 0 0 |
| X 0 0 X | 0 0 0 0 | 0 2 0 0 | 0 0 0 0 0 |
| X 0 0 X | 0 0 0 0 | 0 3 0 0 | 0 0 0 0 0 |
| X 0 0 X | 0 0 0 0 | 0 4 0 0 | 0 0 0 0 0 |
| X 0 0 X | 0 0 0 0 | 0 5 0 0 | 0 0 0 0 0 |
| X 0 0 X | 0 0 0 0 | 0 6 0 0 | 0 0 0 0 0 |
| X 0 0 X | 0 0 0 0 | 0 7 0 0 | 0 0 0 0 0 |

TABLE 3-continued

| Window Contents | | | X' |
|---|---|---|---|
| 0 0 0 X | 0 0 0 0 | 0 0 0 0 | 0 0 0 0 1 |
| 0 0 0 X | 0 0 0 0 | 0 0 X 0 | 0 0 0 0 1 |
| 0 0 0 X | 0 0 0 0 | 0 0 0 X | 0 0 0 0 1 |
| 0 0 X 0 | 0 0 0 0 | 0 0 0 0 | 0 0 0 0 1 |
| 0 0 X 0 | 0 0 0 0 | 0 0 X 0 | 0 0 0 0 1 |
| 0 0 X 0 | 0 0 0 0 | 0 0 0 X | 0 0 0 0 1 |
| X 0 0 X | 0 0 0 0 | 0 0 0 0 | 0 0 0 0 1 |
| X 0 0 X | 0 0 0 0 | 0 0 X 0 | 0 0 0 0 1 |
| X 0 0 X | 0 0 0 0 | 0 0 0 X | 0 0 0 0 1 |
| 0 0 0 X | 0 0 0 0 | 1 0 0 1 | 0 0 0 1 0 |
| 0 0 0 X | 0 0 0 0 | 1 0 0 2 | 0 0 0 1 0 |
| 0 0 0 X | 0 0 0 0 | 1 0 0 3 | 0 0 0 1 0 |
| 0 0 0 X | 0 0 0 0 | 1 0 0 4 | 0 0 0 1 0 |
| 0 0 0 X | 0 0 0 0 | 1 0 0 5 | 0 0 0 1 0 |
| 0 0 0 X | 0 0 0 0 | 1 0 0 6 | 0 0 0 1 0 |
| 0 0 0 X | 0 0 0 0 | 1 0 0 7 | 0 0 0 1 0 |
| 0 0 0 X | 0 0 0 0 | 1 0 0 8 | 0 0 0 1 0 |
| 0 0 0 X | 0 0 0 0 | 1 0 0 9 | 0 0 0 1 0 |
| 0 0 0 X | 0 0 0 0 | 2 0 0 1 | 0 0 0 1 0 |
| 0 0 0 X | 0 0 0 0 | 2 0 0 2 | 0 0 0 1 0 |
| 0 0 0 X | 0 0 0 0 | 2 0 0 3 | 0 0 0 1 0 |
| 0 0 0 X | 0 0 0 0 | 2 0 0 4 | 0 0 0 1 0 |
| 0 0 0 X | 0 0 0 0 | 2 0 0 5 | 0 0 0 1 0 |
| 0 0 0 X | 0 0 0 0 | 2 0 0 6 | 0 0 0 1 0 |
| 0 0 0 X | 0 0 0 0 | 2 0 0 7 | 0 0 0 1 0 |
| 0 0 0 X | 0 0 0 0 | 2 0 0 8 | 0 0 0 1 0 |
| 0 0 0 X | 0 0 0 0 | 2 0 0 9 | 0 0 0 1 0 |
| 0 0 0 X | 0 0 0 0 | 3 0 0 1 | 0 0 0 1 0 |
| 0 0 0 X | 0 0 0 0 | 3 0 0 2 | 0 0 0 1 0 |
| 0 0 0 X | 0 0 0 0 | 3 0 0 3 | 0 0 0 1 0 |
| 0 0 0 X | 0 0 0 0 | 3 0 0 4 | 0 0 0 1 0 |
| 0 0 0 X | 0 0 0 0 | 3 0 0 5 | 0 0 0 1 0 |
| 0 0 0 X | 0 0 0 0 | 3 0 0 6 | 0 0 0 1 0 |
| 0 0 0 X | 0 0 0 0 | 3 0 0 7 | 0 0 0 1 0 |
| 0 0 0 X | 0 0 0 0 | 3 0 0 8 | 0 0 0 1 0 |
| 0 0 0 X | 0 0 0 0 | 3 0 0 9 | 0 0 0 1 0 |
| 0 0 0 X | 0 0 0 0 | 4 0 0 1 | 0 0 0 1 0 |
| 0 0 0 X | 0 0 0 0 | 4 0 0 2 | 0 0 0 1 0 |
| 0 0 0 X | 0 0 0 0 | 4 0 0 3 | 0 0 0 1 0 |
| 0 0 0 X | 0 0 0 0 | 4 0 0 4 | 0 0 0 1 0 |
| 0 0 0 X | 0 0 0 0 | 4 0 0 5 | 0 0 0 1 0 |
| 0 0 X 0 | 0 0 0 0 | 1 0 0 1 | 0 0 0 1 0 |
| 0 0 X 0 | 0 0 0 0 | 1 0 0 2 | 0 0 0 1 0 |
| 0 0 X 0 | 0 0 0 0 | 1 0 0 3 | 0 0 0 1 0 |
| 0 0 X 0 | 0 0 0 0 | 1 0 0 4 | 0 0 0 1 0 |
| 0 0 X 0 | 0 0 0 0 | 1 0 0 5 | 0 0 0 1 0 |
| 0 0 X 0 | 0 0 0 0 | 1 0 0 6 | 0 0 0 1 0 |
| 0 0 X 0 | 0 0 0 0 | 1 0 0 7 | 0 0 0 1 0 |
| 0 0 X 0 | 0 0 0 0 | 1 0 0 8 | 0 0 0 1 0 |
| 0 0 X 0 | 0 0 0 0 | 1 0 0 9 | 0 0 0 1 0 |
| 0 0 X 0 | 0 0 0 0 | 2 0 0 1 | 0 0 0 1 0 |
| 0 0 X 0 | 0 0 0 0 | 2 0 0 2 | 0 0 0 1 0 |
| 0 0 X 0 | 0 0 0 0 | 2 0 0 3 | 0 0 0 1 0 |
| 0 0 X 0 | 0 0 0 0 | 2 0 0 4 | 0 0 0 1 0 |
| 0 0 X 0 | 0 0 0 0 | 2 0 0 5 | 0 0 0 1 0 |
| 0 0 X 0 | 0 0 0 0 | 2 0 0 6 | 0 0 0 1 0 |
| 0 0 X 0 | 0 0 0 0 | 2 0 0 7 | 0 0 0 1 0 |
| 0 0 X 0 | 0 0 0 0 | 2 0 0 8 | 0 0 0 1 0 |
| 0 0 X 0 | 0 0 0 0 | 2 0 0 9 | 0 0 0 1 0 |
| 0 0 X 0 | 0 0 0 0 | 3 0 0 1 | 0 0 0 1 0 |
| 0 0 X 0 | 0 0 0 0 | 3 0 0 2 | 0 0 0 1 0 |
| 0 0 X 0 | 0 0 0 0 | 3 0 0 3 | 0 0 0 1 0 |
| 0 0 X 0 | 0 0 0 0 | 3 0 0 4 | 0 0 0 1 0 |
| 0 0 X 0 | 0 0 0 0 | 3 0 0 5 | 0 0 0 1 0 |
| 0 0 X 0 | 0 0 0 0 | 3 0 0 6 | 0 0 0 1 0 |
| 0 0 X 0 | 0 0 0 0 | 3 0 0 7 | 0 0 0 1 0 |
| 0 0 X 0 | 0 0 0 0 | 3 0 0 8 | 0 0 0 1 0 |
| 0 0 X 0 | 0 0 0 0 | 3 0 0 9 | 0 0 0 1 0 |
| 0 0 X 0 | 0 0 0 0 | 4 0 0 1 | 0 0 0 1 0 |
| 0 0 X 0 | 0 0 0 0 | 4 0 0 2 | 0 0 0 1 0 |
| 0 0 X 0 | 0 0 0 0 | 4 0 0 3 | 0 0 0 1 0 |
| 0 0 X 0 | 0 0 0 0 | 4 0 0 4 | 0 0 0 1 0 |
| 0 0 X 0 | 0 0 0 0 | 4 0 0 5 | 0 0 0 1 0 |
| X 0 0 X | 0 0 0 0 | 1 0 0 1 | 0 0 0 1 0 |
| X 0 0 X | 0 0 0 0 | 1 0 0 2 | 0 0 0 1 0 |
| X 0 0 X | 0 0 0 0 | 1 0 0 3 | 0 0 0 1 0 |
| X 0 0 X | 0 0 0 0 | 1 0 0 4 | 0 0 0 1 0 |

TABLE 3-continued

| Window Contents | | | X' |
|---|---|---|---|
| X 0 0 X | 0 0 0 0 | 1 0 0 5 | 0 0 0 1 0 |
| X 0 0 X | 0 0 0 0 | 1 0 0 6 | 0 0 0 1 0 |
| X 0 0 X | 0 0 0 0 | 1 0 0 7 | 0 0 0 1 0 |
| X 0 0 X | 0 0 0 0 | 1 0 0 8 | 0 0 0 1 0 |
| X 0 0 X | 0 0 0 0 | 1 0 0 9 | 0 0 0 1 0 |
| X 0 0 X | 0 0 0 0 | 2 0 0 1 | 0 0 0 1 0 |
| X 0 0 X | 0 0 0 0 | 2 0 0 2 | 0 0 0 1 0 |
| X 0 0 X | 0 0 0 0 | 2 0 0 3 | 0 0 0 1 0 |
| X 0 0 X | 0 0 0 0 | 2 0 0 4 | 0 0 0 1 0 |
| X 0 0 X | 0 0 0 0 | 2 0 0 5 | 0 0 0 1 0 |
| X 0 0 X | 0 0 0 0 | 2 0 0 6 | 0 0 0 1 0 |
| X 0 0 X | 0 0 0 0 | 2 0 0 7 | 0 0 0 1 0 |
| X 0 0 X | 0 0 0 0 | 2 0 0 8 | 0 0 0 1 0 |
| X 0 0 X | 0 0 0 0 | 2 0 0 9 | 0 0 0 1 0 |
| X 0 0 X | 0 0 0 0 | 3 0 0 1 | 0 0 0 1 0 |
| X 0 0 X | 0 0 0 0 | 3 0 0 2 | 0 0 0 1 0 |
| X 0 0 X | 0 0 0 0 | 3 0 0 3 | 0 0 0 1 0 |
| X 0 0 X | 0 0 0 0 | 3 0 0 4 | 0 0 0 1 0 |
| X 0 0 X | 0 0 0 0 | 3 0 0 5 | 0 0 0 1 0 |
| X 0 0 X | 0 0 0 0 | 3 0 0 6 | 0 0 0 1 0 |
| X 0 0 X | 0 0 0 0 | 3 0 0 7 | 0 0 0 1 0 |
| X 0 0 X | 0 0 0 0 | 3 0 0 8 | 0 0 0 1 0 |
| X 0 0 X | 0 0 0 0 | 3 0 0 9 | 0 0 0 1 0 |
| X 0 0 X | 0 0 0 0 | 4 0 0 1 | 0 0 0 1 0 |
| X 0 0 X | 0 0 0 0 | 4 0 0 2 | 0 0 0 1 0 |
| X 0 0 X | 0 0 0 0 | 4 0 0 3 | 0 0 0 1 0 |
| X 0 0 X | 0 0 0 0 | 4 0 0 4 | 0 0 0 1 0 |
| X 0 0 X | 0 0 0 0 | 4 0 0 5 | 0 0 0 1 0 |
| 0 0 0 X | 0 0 0 0 | 4 0 0 6 | 0 0 0 1 1 |
| 0 0 0 X | 0 0 0 0 | 4 0 0 7 | 0 0 0 1 1 |
| 0 0 0 X | 0 0 0 0 | 4 0 0 8 | 0 0 0 1 1 |
| 0 0 0 X | 0 0 0 0 | 4 0 0 9 | 0 0 0 1 1 |
| 0 0 0 X | 0 0 0 0 | 5 0 0 1 | 0 0 0 1 1 |
| 0 0 0 X | 0 0 0 0 | 5 0 0 2 | 0 0 0 1 1 |
| 0 0 0 X | 0 0 0 0 | 5 0 0 3 | 0 0 0 1 1 |
| 0 0 0 X | 0 0 0 0 | 5 0 0 4 | 0 0 0 1 1 |
| 0 0 0 X | 0 0 0 0 | 5 0 0 5 | 0 0 0 1 1 |
| 0 0 0 X | 0 0 0 0 | 5 0 0 6 | 0 0 0 1 1 |
| 0 0 0 X | 0 0 0 0 | 5 0 0 7 | 0 0 0 1 1 |
| 0 0 0 X | 0 0 0 0 | 5 0 0 8 | 0 0 0 1 1 |
| 0 0 0 X | 0 0 0 0 | 5 0 0 9 | 0 0 0 1 1 |
| 0 0 0 X | 0 0 0 0 | 6 0 0 1 | 0 0 0 1 1 |
| 0 0 0 X | 0 0 0 0 | 6 0 0 2 | 0 0 0 1 1 |
| 0 0 0 X | 0 0 0 0 | 6 0 0 3 | 0 0 0 1 1 |
| 0 0 0 X | 0 0 0 0 | 6 0 0 4 | 0 0 0 1 1 |
| 0 0 0 X | 0 0 0 0 | 6 0 0 5 | 0 0 0 1 1 |
| 0 0 0 X | 0 0 0 0 | 6 0 0 6 | 0 0 0 1 1 |
| 0 0 0 X | 0 0 0 0 | 6 0 0 7 | 0 0 0 1 1 |
| 0 0 0 X | 0 0 0 0 | 6 0 0 8 | 0 0 0 1 1 |
| 0 0 0 X | 0 0 0 0 | 6 0 0 9 | 0 0 0 1 1 |
| 0 0 0 X | 0 0 0 0 | 7 0 0 1 | 0 0 0 1 1 |
| 0 0 0 X | 0 0 0 0 | 7 0 0 2 | 0 0 0 1 1 |
| 0 0 0 X | 0 0 0 0 | 7 0 0 3 | 0 0 0 1 1 |
| 0 0 0 X | 0 0 0 0 | 7 0 0 4 | 0 0 0 1 1 |
| 0 0 0 X | 0 0 0 0 | 7 0 0 5 | 0 0 0 1 1 |
| 0 0 0 X | 0 0 0 0 | 7 0 0 6 | 0 0 0 1 1 |
| 0 0 0 X | 0 0 0 0 | 7 0 0 7 | 0 0 0 1 1 |
| 0 0 0 X | 0 0 0 0 | 7 0 0 8 | 0 0 0 1 1 |
| 0 0 0 X | 0 0 0 0 | 7 0 0 9 | 0 0 0 1 1 |
| 0 0 0 X | 0 0 0 0 | 8 0 0 1 | 0 0 0 1 1 |
| 0 0 X 0 | 0 0 0 0 | 4 0 0 6 | 0 0 0 1 1 |
| 0 0 X 0 | 0 0 0 0 | 4 0 0 7 | 0 0 0 1 1 |
| 0 0 X 0 | 0 0 0 0 | 4 0 0 8 | 0 0 0 1 1 |
| 0 0 X 0 | 0 0 0 0 | 4 0 0 9 | 0 0 0 1 1 |
| 0 0 X 0 | 0 0 0 0 | 5 0 0 1 | 0 0 0 1 1 |
| 0 0 X 0 | 0 0 0 0 | 5 0 0 2 | 0 0 0 1 1 |
| 0 0 X 0 | 0 0 0 0 | 5 0 0 3 | 0 0 0 1 1 |
| 0 0 X 0 | 0 0 0 0 | 5 0 0 4 | 0 0 0 1 1 |
| 0 0 X 0 | 0 0 0 0 | 5 0 0 5 | 0 0 0 1 1 |
| 0 0 X 0 | 0 0 0 0 | 5 0 0 6 | 0 0 0 1 1 |
| 0 0 X 0 | 0 0 0 0 | 5 0 0 7 | 0 0 0 1 1 |
| 0 0 X 0 | 0 0 0 0 | 5 0 0 8 | 0 0 0 1 1 |
| 0 0 X 0 | 0 0 0 0 | 5 0 0 9 | 0 0 0 1 1 |
| 0 0 X 0 | 0 0 0 0 | 6 0 0 1 | 0 0 0 1 1 |
| 0 0 X 0 | 0 0 0 0 | 6 0 0 2 | 0 0 0 1 1 |
| 0 0 X 0 | 0 0 0 0 | 6 0 0 3 | 0 0 0 1 1 |
| 0 0 X 0 | 0 0 0 0 | 6 0 0 4 | 0 0 0 1 1 |

TABLE 3-continued

| Window Contents | | | X' |
|---|---|---|---|
| 0 0 X 0 | 0 0 0 0 | 6 0 0 5 | 0 0 0 1 1 |
| 0 0 X 0 | 0 0 0 0 | 6 0 0 6 | 0 0 0 1 1 |
| 0 0 X 0 | 0 0 0 0 | 6 0 0 7 | 0 0 0 1 1 |
| 0 0 X 0 | 0 0 0 0 | 6 0 0 8 | 0 0 0 1 1 |
| 0 0 X 0 | 0 0 0 0 | 6 0 0 9 | 0 0 0 1 1 |
| 0 0 X 0 | 0 0 0 0 | 7 0 0 1 | 0 0 0 1 1 |
| 0 0 X 0 | 0 0 0 0 | 7 0 0 2 | 0 0 0 1 1 |
| 0 0 X 0 | 0 0 0 0 | 7 0 0 3 | 0 0 0 1 1 |
| 0 0 X 0 | 0 0 0 0 | 7 0 0 4 | 0 0 0 1 1 |
| 0 0 X 0 | 0 0 0 0 | 7 0 0 5 | 0 0 0 1 1 |
| 0 0 X 0 | 0 0 0 0 | 7 0 0 6 | 0 0 0 1 1 |
| 0 0 X 0 | 0 0 0 0 | 7 0 0 7 | 0 0 0 1 1 |
| 0 0 X 0 | 0 0 0 0 | 7 0 0 8 | 0 0 0 1 1 |
| 0 0 X 0 | 0 0 0 0 | 7 0 0 9 | 0 0 0 1 1 |
| 0 0 X 0 | 0 0 0 0 | 8 0 0 1 | 0 0 0 1 1 |
| X 0 0 X | 0 0 0 0 | 4 0 0 6 | 0 0 0 1 1 |
| X 0 0 X | 0 0 0 0 | 4 0 0 7 | 0 0 0 1 1 |
| X 0 0 X | 0 0 0 0 | 4 0 0 8 | 0 0 0 1 1 |
| X 0 0 X | 0 0 0 0 | 4 0 0 9 | 0 0 0 1 1 |
| X 0 0 X | 0 0 0 0 | 5 0 0 1 | 0 0 0 1 1 |
| X 0 0 X | 0 0 0 0 | 5 0 0 2 | 0 0 0 1 1 |
| X 0 0 X | 0 0 0 0 | 5 0 0 3 | 0 0 0 1 1 |
| X 0 0 X | 0 0 0 0 | 5 0 0 4 | 0 0 0 1 1 |
| X 0 0 X | 0 0 0 0 | 5 0 0 5 | 0 0 0 1 1 |
| X 0 0 X | 0 0 0 0 | 5 0 0 6 | 0 0 0 1 1 |
| X 0 0 X | 0 0 0 0 | 5 0 0 7 | 0 0 0 1 1 |
| X 0 0 X | 0 0 0 0 | 5 0 0 8 | 0 0 0 1 1 |
| X 0 0 X | 0 0 0 0 | 5 0 0 9 | 0 0 0 1 1 |
| X 0 0 X | 0 0 0 0 | 6 0 0 1 | 0 0 0 1 1 |
| X 0 0 X | 0 0 0 0 | 6 0 0 2 | 0 0 0 1 1 |
| X 0 0 X | 0 0 0 0 | 6 0 0 3 | 0 0 0 1 1 |
| X 0 0 X | 0 0 0 0 | 6 0 0 4 | 0 0 0 1 1 |
| X 0 0 X | 0 0 0 0 | 6 0 0 5 | 0 0 0 1 1 |
| X 0 0 X | 0 0 0 0 | 6 0 0 6 | 0 0 0 1 1 |
| X 0 0 X | 0 0 0 0 | 6 0 0 7 | 0 0 0 1 1 |
| X 0 0 X | 0 0 0 0 | 6 0 0 8 | 0 0 0 1 1 |
| X 0 0 X | 0 0 0 0 | 6 0 0 9 | 0 0 0 1 1 |
| X 0 0 X | 0 0 0 0 | 7 0 0 1 | 0 0 0 1 1 |
| X 0 0 X | 0 0 0 0 | 7 0 0 2 | 0 0 0 1 1 |
| X 0 0 X | 0 0 0 0 | 7 0 0 3 | 0 0 0 1 1 |
| X 0 0 X | 0 0 0 0 | 7 0 0 4 | 0 0 0 1 1 |
| X 0 0 X | 0 0 0 0 | 7 0 0 5 | 0 0 0 1 1 |
| X 0 0 X | 0 0 0 0 | 7 0 0 6 | 0 0 0 1 1 |
| X 0 0 X | 0 0 0 0 | 7 0 0 7 | 0 0 0 1 1 |
| X 0 0 X | 0 0 0 0 | 7 0 0 8 | 0 0 0 1 1 |
| X 0 0 X | 0 0 0 0 | 7 0 0 9 | 0 0 0 1 1 |
| X 0 0 X | 0 0 0 0 | 8 0 0 1 | 0 0 0 1 1 |
| 0 0 0 X | 0 0 0 0 | 8 0 0 2 | 0 0 1 0 0 |
| 0 0 0 X | 0 0 0 0 | 8 0 0 3 | 0 0 1 0 0 |
| 0 0 0 X | 0 0 0 0 | 8 0 0 4 | 0 0 1 0 0 |
| 0 0 0 X | 0 0 0 0 | 8 0 0 5 | 0 0 1 0 0 |
| 0 0 0 X | 0 0 0 0 | 8 0 0 6 | 0 0 1 0 0 |
| 0 0 0 X | 0 0 0 0 | 8 0 0 7 | 0 0 1 0 0 |
| 0 0 0 X | 0 0 0 0 | 8 0 0 8 | 0 0 1 0 0 |
| 0 0 0 X | 0 0 0 0 | 8 0 0 9 | 0 0 1 0 0 |
| 0 0 0 X | 0 0 0 0 | 9 0 0 1 | 0 0 1 0 0 |
| 0 0 0 X | 0 0 0 0 | 9 0 0 2 | 0 0 1 0 0 |
| 0 0 0 X | 0 0 0 0 | 9 0 0 3 | 0 0 1 0 0 |
| 0 0 0 X | 0 0 0 0 | 9 0 0 4 | 0 0 1 0 0 |
| 0 0 0 X | 0 0 0 0 | 9 0 0 5 | 0 0 1 0 0 |
| 0 0 0 X | 0 0 0 0 | 9 0 0 6 | 0 0 1 0 0 |
| 0 0 0 X | 0 0 0 0 | 9 0 0 7 | 0 0 1 0 0 |
| 0 0 0 X | 0 0 0 0 | 9 0 0 8 | 0 0 1 0 0 |
| 0 0 0 X | 0 0 0 0 | 9 0 0 9 | 0 0 1 0 0 |
| 0 0 0 X | 0 0 0 0 | 1 0 0 0 | 0 0 1 0 0 |
| 0 0 0 X | 0 0 0 0 | 2 0 0 0 | 0 0 1 0 0 |
| 0 0 0 X | 0 0 0 0 | 3 0 0 0 | 0 0 1 0 0 |
| 0 0 X 0 | 0 0 0 0 | 8 0 0 2 | 0 0 1 0 0 |
| 0 0 X 0 | 0 0 0 0 | 8 0 0 3 | 0 0 1 0 0 |
| 0 0 X 0 | 0 0 0 0 | 8 0 0 4 | 0 0 1 0 0 |
| 0 0 X 0 | 0 0 0 0 | 8 0 0 5 | 0 0 1 0 0 |
| 0 0 X 0 | 0 0 0 0 | 8 0 0 6 | 0 0 1 0 0 |
| 0 0 X 0 | 0 0 0 0 | 8 0 0 7 | 0 0 1 0 0 |
| 0 0 X 0 | 0 0 0 0 | 8 0 0 8 | 0 0 1 0 0 |
| 0 0 X 0 | 0 0 0 0 | 8 0 0 9 | 0 0 1 0 0 |
| 0 0 X 0 | 0 0 0 0 | 9 0 0 1 | 0 0 1 0 0 |
| 0 0 X 0 | 0 0 0 0 | 9 0 0 2 | 0 0 1 0 0 |

TABLE 3-continued

| Window Contents | | | X' |
|---|---|---|---|
| 0 0 X 0 | 0 0 0 0 | 9 0 0 3 | 0 0 1 0 0 |
| 0 0 X 0 | 0 0 0 0 | 9 0 0 4 | 0 0 1 0 0 |
| 0 0 X 0 | 0 0 0 0 | 9 0 0 5 | 0 0 1 0 0 |
| 0 0 X 0 | 0 0 0 0 | 9 0 0 6 | 0 0 1 0 0 |
| 0 0 X 0 | 0 0 0 0 | 9 0 0 7 | 0 0 1 0 0 |
| 0 0 X 0 | 0 0 0 0 | 9 0 0 8 | 0 0 1 0 0 |
| 0 0 X 0 | 0 0 0 0 | 9 0 0 9 | 0 0 1 0 0 |
| 0 0 X 0 | 0 0 0 0 | 1 0 0 0 | 0 0 1 0 0 |
| 0 0 X 0 | 0 0 0 0 | 2 0 0 0 | 0 0 1 0 0 |
| 0 0 X 0 | 0 0 0 0 | 3 0 0 0 | 0 0 1 0 0 |
| X 0 0 X | 0 0 0 0 | 8 0 0 2 | 0 0 1 0 0 |
| X 0 0 X | 0 0 0 0 | 8 0 0 3 | 0 0 1 0 0 |
| X 0 0 X | 0 0 0 0 | 8 0 0 4 | 0 0 1 0 0 |
| X 0 0 X | 0 0 0 0 | 8 0 0 5 | 0 0 1 0 0 |
| X 0 0 X | 0 0 0 0 | 8 0 0 6 | 0 0 1 0 0 |
| X 0 0 X | 0 0 0 0 | 8 0 0 7 | 0 0 1 0 0 |
| X 0 0 X | 0 0 0 0 | 8 0 0 8 | 0 0 1 0 0 |
| X 0 0 X | 0 0 0 0 | 8 0 0 9 | 0 0 1 0 0 |
| X 0 0 X | 0 0 0 0 | 9 0 0 1 | 0 0 1 0 0 |
| X 0 0 X | 0 0 0 0 | 9 0 0 2 | 0 0 1 0 0 |
| X 0 0 X | 0 0 0 0 | 9 0 0 3 | 0 0 1 0 0 |
| X 0 0 X | 0 0 0 0 | 9 0 0 4 | 0 0 1 0 0 |
| X 0 0 X | 0 0 0 0 | 9 0 0 5 | 0 0 1 0 0 |
| X 0 0 X | 0 0 0 0 | 9 0 0 6 | 0 0 1 0 0 |
| X 0 0 X | 0 0 0 0 | 9 0 0 7 | 0 0 1 0 0 |
| X 0 0 X | 0 0 0 0 | 9 0 0 8 | 0 0 1 0 0 |
| X 0 0 X | 0 0 0 0 | 9 0 0 9 | 0 0 1 0 0 |
| X 0 0 X | 0 0 0 0 | 1 0 0 0 | 0 0 1 0 0 |
| X 0 0 X | 0 0 0 0 | 2 0 0 0 | 0 0 1 0 0 |
| X 0 0 X | 0 0 0 0 | 3 0 0 0 | 0 0 1 0 0 |
| X X X X | 0 0 0 1 | X X X X | 0 0 1 0 1 |
| X X X X | 0 0 0 2 | X X X X | 0 0 1 1 0 |
| X X X X | 0 0 0 3 | X X X X | 0 0 1 1 1 |
| X X X X | 0 0 0 4 | X X X X | 0 1 0 0 0 |
| X X X X | 0 0 0 5 | X X X X | 0 1 0 0 1 |
| X X X X | 0 0 0 6 | X X X X | 0 1 0 1 0 |
| X X X X | 0 0 0 7 | X X X X | 0 1 0 1 1 |
| X X X X | 0 0 0 8 | X X X X | 0 1 1 0 0 |
| X X X X | 0 0 0 9 | X X X X | 0 1 1 0 1 |
| X X X X | 0 0 1 0 | 0 0 0 0 | 0 1 1 1 0 |
| X X X X | 0 0 1 0 | 0 0 X 0 | 0 1 1 1 0 |
| X X X X | 0 0 1 0 | 0 0 0 X | 0 1 1 1 0 |
| X X X X | 0 0 2 0 | 0 0 0 0 | 0 1 1 1 1 |
| X X X X | 0 0 2 0 | 0 0 X 0 | 0 1 1 1 1 |
| X X X X | 0 0 2 0 | 0 0 0 X | 0 1 1 1 1 |
| X X X X | 0 0 3 0 | 0 0 0 0 | 1 0 0 0 0 |
| X X X X | 0 0 3 0 | 0 0 X 0 | 1 0 0 0 0 |
| X X X X | 0 0 3 0 | 0 0 0 X | 1 0 0 0 0 |
| X X X X | 0 0 4 0 | 0 0 0 0 | 1 0 0 0 1 |
| X X X X | 0 0 4 0 | 0 0 X 0 | 1 0 0 0 1 |
| X X X X | 0 0 4 0 | 0 0 0 X | 1 0 0 0 1 |
| X X X X | 0 0 5 0 | 0 0 0 0 | 1 0 0 1 0 |
| X X X X | 0 0 5 0 | 0 0 X 0 | 1 0 0 1 0 |
| X X X X | 0 0 5 0 | 0 0 0 X | 1 0 0 1 0 |
| X X X X | 0 0 6 0 | 0 0 0 0 | 1 0 0 1 1 |
| X X X X | 0 0 6 0 | 0 0 X 0 | 1 0 0 1 1 |
| X X X X | 0 0 6 0 | 0 0 0 X | 1 0 0 1 1 |
| X X X X | 0 0 7 0 | 0 0 0 0 | 1 0 1 0 0 |
| X X X X | 0 0 7 0 | 0 0 X 0 | 1 0 1 0 0 |
| X X X X | 0 0 7 0 | 0 0 0 X | 1 0 1 0 0 |
| X X X X | 0 0 8 0 | 0 0 0 0 | 1 0 1 0 1 |
| X X X X | 0 0 8 0 | 0 0 X 0 | 1 0 1 0 1 |
| X X X X | 0 0 8 0 | 0 0 0 X | 1 0 1 0 1 |
| X X X X | 0 0 9 0 | 0 0 0 0 | 1 0 1 1 0 |
| X X X X | 0 0 9 0 | 0 0 X 0 | 1 0 1 1 0 |
| X X X X | 0 0 9 0 | 0 0 0 X | 1 0 1 1 0 |
| X X X X | 0 0 1 0 | 0 1 0 0 | 1 0 1 1 1 |
| X X X X | 0 0 1 0 | 0 2 0 0 | 1 0 1 1 1 |
| X X X X | 0 0 1 0 | 0 3 0 0 | 1 0 1 1 1 |
| X X X X | 0 0 1 0 | 0 4 0 0 | 1 0 1 1 1 |
| X X X X | 0 0 1 0 | 0 5 0 0 | 1 0 1 1 1 |
| X X X X | 0 0 1 0 | 0 6 0 0 | 1 0 1 1 1 |
| X X X X | 0 0 1 0 | 0 7 0 0 | 1 0 1 1 1 |
| X X X X | 0 0 2 0 | 0 1 0 0 | 1 1 0 0 0 |
| X X X X | 0 0 2 0 | 0 2 0 0 | 1 1 0 0 0 |
| X X X X | 0 0 2 0 | 0 3 0 0 | 1 1 0 0 0 |
| X X X X | 0 0 2 0 | 0 4 0 0 | 1 1 0 0 0 |

TABLE 3-continued

| Window Contents | | | X' |
|---|---|---|---|
| X X X X | 0 0 2 0 | 0 5 0 0 | 1 1 0 0 0 |
| X X X X | 0 0 2 0 | 0 6 0 0 | 1 1 0 0 0 |
| X X X X | 0 0 2 0 | 0 7 0 0 | 1 1 0 0 0 |
| X X X X | 0 0 3 0 | 0 1 0 0 | 1 1 0 0 1 |
| X X X X | 0 0 3 0 | 0 2 0 0 | 1 1 0 0 1 |
| X X X X | 0 0 3 0 | 0 3 0 0 | 1 1 0 0 1 |
| X X X X | 0 0 3 0 | 0 4 0 0 | 1 1 0 0 1 |
| X X X X | 0 0 3 0 | 0 5 0 0 | 1 1 0 0 1 |
| X X X X | 0 0 3 0 | 0 6 0 0 | 1 1 0 0 1 |
| X X X X | 0 0 3 0 | 0 7 0 0 | 1 1 0 0 1 |
| X X X X | 0 0 4 0 | 0 1 0 0 | 1 1 0 1 0 |
| X X X X | 0 0 4 0 | 0 2 0 0 | 1 1 0 1 0 |
| X X X X | 0 0 4 0 | 0 3 0 0 | 1 1 0 1 0 |
| X X X X | 0 0 4 0 | 0 4 0 0 | 1 1 0 1 0 |
| X X X X | 0 0 4 0 | 0 5 0 0 | 1 1 0 1 0 |
| X X X X | 0 0 4 0 | 0 6 0 0 | 1 1 0 1 0 |
| X X X X | 0 0 4 0 | 0 7 0 0 | 1 1 0 1 0 |
| X X X X | 0 0 5 0 | 0 1 0 0 | 1 1 0 1 1 |
| X X X X | 0 0 5 0 | 0 2 0 0 | 1 1 0 1 1 |
| X X X X | 0 0 5 0 | 0 3 0 0 | 1 1 0 1 1 |
| X X X X | 0 0 5 0 | 0 4 0 0 | 1 1 0 1 1 |
| X X X X | 0 0 5 0 | 0 5 0 0 | 1 1 0 1 1 |
| X X X X | 0 0 5 0 | 0 6 0 0 | 1 1 0 1 1 |
| X X X X | 0 0 5 0 | 0 7 0 0 | 1 1 0 1 1 |
| X X X X | 0 0 6 0 | 0 1 0 0 | 1 1 1 0 0 |
| X X X X | 0 0 6 0 | 0 2 0 0 | 1 1 1 0 0 |
| X X X X | 0 0 6 0 | 0 3 0 0 | 1 1 1 0 0 |
| X X X X | 0 0 6 0 | 0 4 0 0 | 1 1 1 0 0 |
| X X X X | 0 0 6 0 | 0 5 0 0 | 1 1 1 0 0 |
| X X X X | 0 0 6 0 | 0 6 0 0 | 1 1 1 0 0 |
| X X X X | 0 0 6 0 | 0 7 0 0 | 1 1 1 0 0 |
| X X X X | 0 0 7 0 | 0 1 0 0 | 1 1 1 0 1 |
| X X X X | 0 0 7 0 | 0 2 0 0 | 1 1 1 0 1 |
| X X X X | 0 0 7 0 | 0 3 0 0 | 1 1 1 0 1 |
| X X X X | 0 0 7 0 | 0 4 0 0 | 1 1 1 0 1 |
| X X X X | 0 0 7 0 | 0 5 0 0 | 1 1 1 0 1 |
| X X X X | 0 0 7 0 | 0 6 0 0 | 1 1 1 0 1 |
| X X X X | 0 0 7 0 | 0 7 0 0 | 1 1 1 0 1 |
| X X X X | 0 0 8 0 | 0 1 0 0 | 1 1 1 1 0 |
| X X X X | 0 0 8 0 | 0 2 0 0 | 1 1 1 1 0 |
| X X X X | 0 0 8 0 | 0 3 0 0 | 1 1 1 1 0 |
| X X X X | 0 0 8 0 | 0 4 0 0 | 1 1 1 1 0 |
| X X X X | 0 0 8 0 | 0 5 0 0 | 1 1 1 1 0 |
| X X X X | 0 0 8 0 | 0 6 0 0 | 1 1 1 1 0 |
| X X X X | 0 0 8 0 | 0 7 0 0 | 1 1 1 1 0 |
| X X X X | 0 0 9 0 | 0 1 0 0 | 1 1 1 1 1 |
| X X X X | 0 0 9 0 | 0 2 0 0 | 1 1 1 1 1 |
| X X X X | 0 0 9 0 | 0 3 0 0 | 1 1 1 1 1 |
| X X X X | 0 0 9 0 | 0 4 0 0 | 1 1 1 1 1 |
| X X X X | 0 0 9 0 | 0 5 0 0 | 1 1 1 1 1 |
| X X X X | 0 0 9 0 | 0 6 0 0 | 1 1 1 1 1 |
| X X X X | 0 0 9 0 | 0 7 0 0 | 1 1 1 1 1 |
| X X X X | 0 1 0 0 | 0 1 0 0 | 0 0 0 0 0 |
| X X X X | 0 1 0 0 | 0 2 0 0 | 0 0 0 0 0 |
| X X X X | 0 1 0 0 | 0 3 0 0 | 0 0 0 0 0 |
| X X X X | 0 1 0 0 | 0 4 0 0 | 0 0 0 0 0 |
| X X X X | 0 1 0 0 | 0 5 0 0 | 0 0 0 0 0 |
| X X X X | 0 1 0 0 | 0 6 0 0 | 0 0 0 0 0 |
| X X X X | 0 1 0 0 | 0 7 0 0 | 0 0 0 0 0 |
| X X X X | 0 2 0 0 | 0 1 0 0 | 0 0 0 0 1 |
| X X X X | 0 2 0 0 | 0 2 0 0 | 0 0 0 0 1 |
| X X X X | 0 2 0 0 | 0 3 0 0 | 0 0 0 0 1 |
| X X X X | 0 2 0 0 | 0 4 0 0 | 0 0 0 0 1 |
| X X X X | 0 2 0 0 | 0 5 0 0 | 0 0 0 0 1 |
| X X X X | 0 2 0 0 | 0 6 0 0 | 0 0 0 0 1 |
| X X X X | 0 2 0 0 | 0 7 0 0 | 0 0 0 0 1 |
| X X X X | 0 3 0 0 | 0 1 0 0 | 0 0 0 1 0 |
| X X X X | 0 3 0 0 | 0 2 0 0 | 0 0 0 1 0 |
| X X X X | 0 3 0 0 | 0 3 0 0 | 0 0 0 1 0 |
| X X X X | 0 3 0 0 | 0 4 0 0 | 0 0 0 1 0 |
| X X X X | 0 3 0 0 | 0 5 0 0 | 0 0 0 1 0 |
| X X X X | 0 3 0 0 | 0 6 0 0 | 0 0 0 1 0 |
| X X X X | 0 3 0 0 | 0 7 0 0 | 0 0 0 1 0 |
| X X X X | 0 4 0 0 | 0 1 0 0 | 0 0 0 1 1 |
| X X X X | 0 4 0 0 | 0 2 0 0 | 0 0 0 1 1 |
| X X X X | 0 4 0 0 | 0 3 0 0 | 0 0 0 1 1 |
| X X X X | 0 4 0 0 | 0 4 0 0 | 0 0 0 1 1 |

TABLE 3-continued

| Window Contents | | | X' |
|---|---|---|---|
| X X X X | 0 4 0 0 | 0 5 0 0 | 0 0 0 1 1 |
| X X X X | 0 4 0 0 | 0 6 0 0 | 0 0 0 1 1 |
| X X X X | 0 4 0 0 | 0 7 0 0 | 0 0 0 1 1 |
| X X X X | 0 5 0 0 | 0 1 0 0 | 0 0 1 0 0 |
| X X X X | 0 5 0 0 | 0 2 0 0 | 0 0 1 0 0 |
| X X X X | 0 5 0 0 | 0 3 0 0 | 0 0 1 0 0 |
| X X X X | 0 5 0 0 | 0 4 0 0 | 0 0 1 0 0 |
| X X X X | 0 5 0 0 | 0 5 0 0 | 0 0 1 0 0 |
| X X X X | 0 5 0 0 | 0 6 0 0 | 0 0 1 0 0 |
| X X X X | 0 5 0 0 | 0 7 0 0 | 0 0 1 0 0 |
| X X X X | 0 6 0 0 | 0 1 0 0 | 0 0 1 0 1 |
| X X X X | 0 6 0 0 | 0 2 0 0 | 0 0 1 0 1 |
| X X X X | 0 6 0 0 | 0 3 0 0 | 0 0 1 0 1 |
| X X X X | 0 6 0 0 | 0 4 0 0 | 0 0 1 0 1 |
| X X X X | 0 6 0 0 | 0 5 0 0 | 0 0 1 0 1 |
| X X X X | 0 6 0 0 | 0 6 0 0 | 0 0 1 0 1 |
| X X X X | 0 6 0 0 | 0 7 0 0 | 0 0 1 0 1 |
| X X X X | 0 7 0 0 | 0 1 0 0 | 0 0 1 1 0 |
| X X X X | 0 7 0 0 | 0 2 0 0 | 0 0 1 1 0 |
| X X X X | 0 7 0 0 | 0 3 0 0 | 0 0 1 1 0 |
| X X X X | 0 7 0 0 | 0 4 0 0 | 0 0 1 1 0 |
| X X X X | 0 7 0 0 | 0 5 0 0 | 0 0 1 1 0 |
| X X X X | 0 7 0 0 | 0 6 0 0 | 0 0 1 1 0 |
| X X X X | 0 7 0 0 | 0 7 0 0 | 0 0 1 1 0 |
| X X X X | 0 1 0 0 | 0 0 0 0 | 0 0 1 1 1 |
| X X X X | 0 1 0 0 | 0 0 X 0 | 0 0 1 1 1 |
| X X X X | 0 1 0 0 | 0 0 0 X | 0 0 1 1 1 |
| X X X X | 0 2 0 0 | 0 0 0 0 | 0 1 0 0 0 |
| X X X X | 0 2 0 0 | 0 0 X 0 | 0 1 0 0 0 |
| X X X X | 0 2 0 0 | 0 0 0 X | 0 1 0 0 0 |
| X X X X | 0 3 0 0 | 0 0 0 0 | 0 1 0 0 1 |
| X X X X | 0 3 0 0 | 0 0 X 0 | 0 1 0 0 1 |
| X X X X | 0 3 0 0 | 0 0 0 X | 0 1 0 0 1 |
| X X X X | 0 4 0 0 | 0 0 0 0 | 0 1 0 1 0 |
| X X X X | 0 4 0 0 | 0 0 X 0 | 0 1 0 1 0 |
| X X X X | 0 4 0 0 | 0 0 0 X | 0 1 0 1 0 |
| X X X X | 0 5 0 0 | 0 0 0 0 | 0 1 0 1 1 |
| X X X X | 0 5 0 0 | 0 0 X 0 | 0 1 0 1 1 |
| X X X X | 0 5 0 0 | 0 0 0 X | 0 1 0 1 1 |
| X X X X | 0 6 0 0 | 0 0 0 0 | 0 1 1 0 0 |
| X X X X | 0 6 0 0 | 0 0 X 0 | 0 1 1 0 0 |
| X X X X | 0 6 0 0 | 0 0 0 X | 0 1 1 0 0 |
| X X X X | 0 7 0 0 | 0 0 0 0 | 0 1 1 0 1 |
| X X X X | 0 7 0 0 | 0 0 X 0 | 0 1 1 0 1 |
| X X X X | 0 7 0 0 | 0 0 0 X | 0 1 1 0 1 |
| X X X X | 0 1 0 0 | 1 0 0 1 | 0 1 1 1 0 |
| X X X X | 0 1 0 0 | 1 0 0 2 | 0 1 1 1 0 |
| X X X X | 0 1 0 0 | 1 0 0 3 | 0 1 1 1 0 |
| X X X X | 0 1 0 0 | 1 0 0 4 | 0 1 1 1 0 |
| X X X X | 0 1 0 0 | 1 0 0 5 | 0 1 1 1 0 |
| X X X X | 0 1 0 0 | 1 0 0 6 | 0 1 1 1 0 |
| X X X X | 0 1 0 0 | 1 0 0 7 | 0 1 1 1 0 |
| X X X X | 0 1 0 0 | 1 0 0 8 | 0 1 1 1 0 |
| X X X X | 0 1 0 0 | 1 0 0 9 | 0 1 1 1 0 |
| X X X X | 0 1 0 0 | 2 0 0 1 | 0 1 1 1 0 |
| X X X X | 0 1 0 0 | 2 0 0 2 | 0 1 1 1 0 |
| X X X X | 0 1 0 0 | 2 0 0 3 | 0 1 1 1 0 |
| X X X X | 0 1 0 0 | 2 0 0 4 | 0 1 1 1 0 |
| X X X X | 0 1 0 0 | 2 0 0 5 | 0 1 1 1 0 |
| X X X X | 0 1 0 0 | 2 0 0 6 | 0 1 1 1 0 |
| X X X X | 0 1 0 0 | 2 0 0 7 | 0 1 1 1 0 |
| X X X X | 0 1 0 0 | 2 0 0 8 | 0 1 1 1 0 |
| X X X X | 0 1 0 0 | 2 0 0 9 | 0 1 1 1 0 |
| X X X X | 0 1 0 0 | 3 0 0 1 | 0 1 1 1 0 |
| X X X X | 0 1 0 0 | 3 0 0 2 | 0 1 1 1 0 |
| X X X X | 0 1 0 0 | 3 0 0 3 | 0 1 1 1 0 |
| X X X X | 0 1 0 0 | 3 0 0 4 | 0 1 1 1 0 |
| X X X X | 0 1 0 0 | 3 0 0 5 | 0 1 1 1 0 |
| X X X X | 0 1 0 0 | 3 0 0 6 | 0 1 1 1 0 |
| X X X X | 0 1 0 0 | 3 0 0 7 | 0 1 1 1 0 |
| X X X X | 0 1 0 0 | 3 0 0 8 | 0 1 1 1 0 |
| X X X X | 0 1 0 0 | 3 0 0 9 | 0 1 1 1 0 |
| X X X X | 0 1 0 0 | 4 0 0 1 | 0 1 1 1 0 |
| X X X X | 0 1 0 0 | 4 0 0 2 | 0 1 1 1 0 |
| X X X X | 0 1 0 0 | 4 0 0 3 | 0 1 1 1 0 |
| X X X X | 0 1 0 0 | 4 0 0 4 | 0 1 1 1 0 |
| X X X X | 0 1 0 0 | 4 0 0 5 | 0 1 1 1 0 |

TABLE 3-continued

| Window Contents | | | X' |
|---|---|---|---|
| XXXX | 0200 | 1001 | 01111 |
| XXXX | 0200 | 1002 | 01111 |
| XXXX | 0200 | 1003 | 01111 |
| XXXX | 0200 | 1004 | 01111 |
| XXXX | 0200 | 1005 | 01111 |
| XXXX | 0200 | 1006 | 01111 |
| XXXX | 0200 | 1007 | 01111 |
| XXXX | 0200 | 1008 | 01111 |
| XXXX | 0200 | 1009 | 01111 |
| XXXX | 0200 | 2001 | 01111 |
| XXXX | 0200 | 2002 | 01111 |
| XXXX | 0200 | 2003 | 01111 |
| XXXX | 0200 | 2004 | 01111 |
| XXXX | 0200 | 2005 | 01111 |
| XXXX | 0200 | 2006 | 01111 |
| XXXX | 0200 | 2007 | 01111 |
| XXXX | 0200 | 2008 | 01111 |
| XXXX | 0200 | 2009 | 01111 |
| XXXX | 0200 | 3001 | 01111 |
| XXXX | 0200 | 3002 | 01111 |
| XXXX | 0200 | 3003 | 01111 |
| XXXX | 0200 | 3004 | 01111 |
| XXXX | 0200 | 3005 | 01111 |
| XXXX | 0200 | 3006 | 01111 |
| XXXX | 0200 | 3007 | 01111 |
| XXXX | 0200 | 3008 | 01111 |
| XXXX | 0200 | 3009 | 01111 |
| XXXX | 0200 | 4001 | 01111 |
| XXXX | 0200 | 4002 | 01111 |
| XXXX | 0200 | 4003 | 01111 |
| XXXX | 0200 | 4004 | 01111 |
| XXXX | 0200 | 4005 | 01111 |
| XXXX | 0300 | 1001 | 10000 |
| XXXX | 0300 | 1002 | 10000 |
| XXXX | 0300 | 1003 | 10000 |
| XXXX | 0300 | 1004 | 10000 |
| XXXX | 0300 | 1005 | 10000 |
| XXXX | 0300 | 1006 | 10000 |
| XXXX | 0300 | 1007 | 10000 |
| XXXX | 0300 | 1008 | 10000 |
| XXXX | 0300 | 1009 | 10000 |
| XXXX | 0300 | 2001 | 10000 |
| XXXX | 0300 | 2002 | 10000 |
| XXXX | 0300 | 2003 | 10000 |
| XXXX | 0300 | 2004 | 10000 |
| XXXX | 0300 | 2005 | 10000 |
| XXXX | 0300 | 2006 | 10000 |
| XXXX | 0300 | 2007 | 10000 |
| XXXX | 0300 | 2008 | 10000 |
| XXXX | 0300 | 2009 | 10000 |
| XXXX | 0300 | 3001 | 10000 |
| XXXX | 0300 | 3002 | 10000 |
| XXXX | 0300 | 3003 | 10000 |
| XXXX | 0300 | 3004 | 10000 |
| XXXX | 0300 | 3005 | 10000 |
| XXXX | 0300 | 3006 | 10000 |
| XXXX | 0300 | 3007 | 10000 |
| XXXX | 0300 | 3008 | 10000 |
| XXXX | 0300 | 3009 | 10000 |
| XXXX | 0300 | 4001 | 10000 |
| XXXX | 0300 | 4002 | 10000 |
| XXXX | 0300 | 4003 | 10000 |
| XXXX | 0300 | 4004 | 10000 |
| XXXX | 0300 | 4005 | 10000 |
| XXXX | 0400 | 1001 | 10001 |
| XXXX | 0400 | 1002 | 10001 |
| XXXX | 0400 | 1003 | 10001 |
| XXXX | 0400 | 1004 | 10001 |
| XXXX | 0400 | 1005 | 10001 |
| XXXX | 0400 | 1006 | 10001 |
| XXXX | 0400 | 1007 | 10001 |
| XXXX | 0400 | 1008 | 10001 |
| XXXX | 0400 | 1009 | 10001 |
| XXXX | 0400 | 2001 | 10001 |
| XXXX | 0400 | 2002 | 10001 |
| XXXX | 0400 | 2003 | 10001 |
| XXXX | 0400 | 2004 | 10001 |

TABLE 3-continued

| Window Contents | | | X' |
|---|---|---|---|
| XXXX | 0400 | 2005 | 10001 |
| XXXX | 0400 | 2006 | 10001 |
| XXXX | 0400 | 2007 | 10001 |
| XXXX | 0400 | 2008 | 10001 |
| XXXX | 0400 | 2009 | 10001 |
| XXXX | 0400 | 3001 | 10001 |
| XXXX | 0400 | 3002 | 10001 |
| XXXX | 0400 | 3003 | 10001 |
| XXXX | 0400 | 3004 | 10001 |
| XXXX | 0400 | 3005 | 10001 |
| XXXX | 0400 | 3006 | 10001 |
| XXXX | 0400 | 3007 | 10001 |
| XXXX | 0400 | 3008 | 10001 |
| XXXX | 0400 | 3009 | 10001 |
| XXXX | 0400 | 4001 | 10001 |
| XXXX | 0400 | 4002 | 10001 |
| XXXX | 0400 | 4003 | 10001 |
| XXXX | 0400 | 4004 | 10001 |
| XXXX | 0400 | 4005 | 10001 |
| XXXX | 0500 | 1001 | 10010 |
| XXXX | 0500 | 1002 | 10010 |
| XXXX | 0500 | 1003 | 10010 |
| XXXX | 0500 | 1004 | 10010 |
| XXXX | 0500 | 1005 | 10010 |
| XXXX | 0500 | 1006 | 10010 |
| XXXX | 0500 | 1007 | 10010 |
| XXXX | 0500 | 1008 | 10010 |
| XXXX | 0500 | 1009 | 10010 |
| XXXX | 0500 | 2001 | 10010 |
| XXXX | 0500 | 2002 | 10010 |
| XXXX | 0500 | 2003 | 10010 |
| XXXX | 0500 | 2004 | 10010 |
| XXXX | 0500 | 2005 | 10010 |
| XXXX | 0500 | 2006 | 10010 |
| XXXX | 0500 | 2007 | 10010 |
| XXXX | 0500 | 2008 | 10010 |
| XXXX | 0500 | 2009 | 10010 |
| XXXX | 0500 | 3001 | 10010 |
| XXXX | 0500 | 3002 | 10010 |
| XXXX | 0500 | 3003 | 10010 |
| XXXX | 0500 | 3004 | 10010 |
| XXXX | 0500 | 3005 | 10010 |
| XXXX | 0500 | 3006 | 10010 |
| XXXX | 0500 | 3007 | 10010 |
| XXXX | 0500 | 3008 | 10010 |
| XXXX | 0500 | 3009 | 10010 |
| XXXX | 0500 | 4001 | 10010 |
| XXXX | 0500 | 4002 | 10010 |
| XXXX | 0500 | 4003 | 10010 |
| XXXX | 0500 | 4004 | 10010 |
| XXXX | 0500 | 4005 | 10010 |
| XXXX | 0600 | 1001 | 10011 |
| XXXX | 0600 | 1002 | 10011 |
| XXXX | 0600 | 1003 | 10011 |
| XXXX | 0600 | 1004 | 10011 |
| XXXX | 0600 | 1005 | 10011 |
| XXXX | 0600 | 1006 | 10011 |
| XXXX | 0600 | 1007 | 10011 |
| XXXX | 0600 | 1008 | 10011 |
| XXXX | 0600 | 1009 | 10011 |
| XXXX | 0600 | 2001 | 10011 |
| XXXX | 0600 | 2002 | 10011 |
| XXXX | 0600 | 2003 | 10011 |
| XXXX | 0600 | 2004 | 10011 |
| XXXX | 0600 | 2005 | 10011 |
| XXXX | 0600 | 2006 | 10011 |
| XXXX | 0600 | 2007 | 10011 |
| XXXX | 0600 | 2008 | 10011 |
| XXXX | 0600 | 2009 | 10011 |
| XXXX | 0600 | 3001 | 10011 |
| XXXX | 0600 | 3002 | 10011 |
| XXXX | 0600 | 3003 | 10011 |
| XXXX | 0600 | 3004 | 10011 |
| XXXX | 0600 | 3005 | 10011 |
| XXXX | 0600 | 3006 | 10011 |
| XXXX | 0600 | 3007 | 10011 |
| XXXX | 0600 | 3008 | 10011 |

TABLE 3-continued

| Window Contents | | | X' |
|---|---|---|---|
| XXXX | 0600 | 3009 | 10011 |
| XXXX | 0600 | 4001 | 10011 |
| XXXX | 0600 | 4002 | 10011 |
| XXXX | 0600 | 4003 | 10011 |
| XXXX | 0600 | 4004 | 10011 |
| XXXX | 0600 | 4005 | 10011 |
| XXXX | 0700 | 1001 | 10100 |
| XXXX | 0700 | 1002 | 10100 |
| XXXX | 0700 | 1003 | 10100 |
| XXXX | 0700 | 1004 | 10100 |
| XXXX | 0700 | 1005 | 10100 |
| XXXX | 0700 | 1006 | 10100 |
| XXXX | 0700 | 1007 | 10100 |
| XXXX | 0700 | 1008 | 10100 |
| XXXX | 0700 | 1009 | 10100 |
| XXXX | 0700 | 2001 | 10100 |
| XXXX | 0700 | 2002 | 10100 |
| XXXX | 0700 | 2003 | 10100 |
| XXXX | 0700 | 2004 | 10100 |
| XXXX | 0700 | 2005 | 10100 |
| XXXX | 0700 | 2006 | 10100 |
| XXXX | 0700 | 2007 | 10100 |
| XXXX | 0700 | 2008 | 10100 |
| XXXX | 0700 | 2009 | 10100 |
| XXXX | 0700 | 3001 | 10100 |
| XXXX | 0700 | 3002 | 10100 |
| XXXX | 0700 | 3003 | 10100 |
| XXXX | 0700 | 3004 | 10100 |
| XXXX | 0700 | 3005 | 10100 |
| XXXX | 0700 | 3006 | 10100 |
| XXXX | 0700 | 3007 | 10100 |
| XXXX | 0700 | 3008 | 10100 |
| XXXX | 0700 | 3009 | 10100 |
| XXXX | 0700 | 4001 | 10100 |
| XXXX | 0700 | 4002 | 10100 |
| XXXX | 0700 | 4003 | 10100 |
| XXXX | 0700 | 4004 | 10100 |
| XXXX | 0700 | 4005 | 10100 |
| XXXX | 0100 | 4006 | 10101 |
| XXXX | 0100 | 4007 | 10101 |
| XXXX | 0100 | 4008 | 10101 |
| XXXX | 0100 | 4009 | 10101 |
| XXXX | 0100 | 5001 | 10101 |
| XXXX | 0100 | 5002 | 10101 |
| XXXX | 0100 | 5003 | 10101 |
| XXXX | 0100 | 5004 | 10101 |
| XXXX | 0100 | 5005 | 10101 |
| XXXX | 0100 | 5006 | 10101 |
| XXXX | 0100 | 5007 | 10101 |
| XXXX | 0100 | 5008 | 10101 |
| XXXX | 0100 | 5009 | 10101 |
| XXXX | 0100 | 6001 | 10101 |
| XXXX | 0100 | 6002 | 10101 |
| XXXX | 0100 | 6003 | 10101 |
| XXXX | 0100 | 6004 | 10101 |
| XXXX | 0100 | 6005 | 10101 |
| XXXX | 0100 | 6006 | 10101 |
| XXXX | 0100 | 6007 | 10101 |
| XXXX | 0100 | 6008 | 10101 |
| XXXX | 0100 | 6009 | 10101 |
| XXXX | 0100 | 7001 | 10101 |
| XXXX | 0100 | 7002 | 10101 |
| XXXX | 0100 | 7003 | 10101 |
| XXXX | 0100 | 7004 | 10101 |
| XXXX | 0100 | 7005 | 10101 |
| XXXX | 0100 | 7006 | 10101 |
| XXXX | 0100 | 7007 | 10101 |
| XXXX | 0100 | 7008 | 10101 |
| XXXX | 0100 | 7009 | 10101 |
| XXXX | 0100 | 8001 | 10101 |
| XXXX | 0200 | 4006 | 10110 |
| XXXX | 0200 | 4007 | 10110 |
| XXXX | 0200 | 4008 | 10110 |
| XXXX | 0200 | 4009 | 10110 |
| XXXX | 0200 | 5001 | 10110 |
| XXXX | 0200 | 5002 | 10110 |
| XXXX | 0200 | 5003 | 10110 |

TABLE 3-continued

| Window Contents | | | X' |
|---|---|---|---|
| XXXX | 0200 | 5004 | 10110 |
| XXXX | 0200 | 5005 | 10110 |
| XXXX | 0200 | 5006 | 10110 |
| XXXX | 0200 | 5007 | 10110 |
| XXXX | 0200 | 5008 | 10110 |
| XXXX | 0200 | 5009 | 10110 |
| XXXX | 0200 | 6001 | 10110 |
| XXXX | 0200 | 6002 | 10110 |
| XXXX | 0200 | 6003 | 10110 |
| XXXX | 0200 | 6004 | 10110 |
| XXXX | 0200 | 6005 | 10110 |
| XXXX | 0200 | 6006 | 10110 |
| XXXX | 0200 | 6007 | 10110 |
| XXXX | 0200 | 6008 | 10110 |
| XXXX | 0200 | 6009 | 10110 |
| XXXX | 0200 | 7001 | 10110 |
| XXXX | 0200 | 7002 | 10110 |
| XXXX | 0200 | 7003 | 10110 |
| XXXX | 0200 | 7004 | 10110 |
| XXXX | 0200 | 7005 | 10110 |
| XXXX | 0200 | 7006 | 10110 |
| XXXX | 0200 | 7007 | 10110 |
| XXXX | 0200 | 7008 | 10110 |
| XXXX | 0200 | 7009 | 10110 |
| XXXX | 0200 | 8001 | 10110 |
| XXXX | 0300 | 4006 | 10111 |
| XXXX | 0300 | 4007 | 10111 |
| XXXX | 0300 | 4008 | 10111 |
| XXXX | 0300 | 4009 | 10111 |
| XXXX | 0300 | 5001 | 10111 |
| XXXX | 0300 | 5002 | 10111 |
| XXXX | 0300 | 5003 | 10111 |
| XXXX | 0300 | 5004 | 10111 |
| XXXX | 0300 | 5005 | 10111 |
| XXXX | 0300 | 5006 | 10111 |
| XXXX | 0300 | 5007 | 10111 |
| XXXX | 0300 | 5008 | 10111 |
| XXXX | 0300 | 5009 | 10111 |
| XXXX | 0300 | 6001 | 10111 |
| XXXX | 0300 | 6002 | 10111 |
| XXXX | 0300 | 6003 | 10111 |
| XXXX | 0300 | 6004 | 10111 |
| XXXX | 0300 | 6005 | 10111 |
| XXXX | 0300 | 6006 | 10111 |
| XXXX | 0300 | 6007 | 10111 |
| XXXX | 0300 | 6008 | 10111 |
| XXXX | 0300 | 6009 | 10111 |
| XXXX | 0300 | 7001 | 10111 |
| XXXX | 0300 | 7002 | 10111 |
| XXXX | 0300 | 7003 | 10111 |
| XXXX | 0300 | 7004 | 10111 |
| XXXX | 0300 | 7005 | 10111 |
| XXXX | 0300 | 7006 | 10111 |
| XXXX | 0300 | 7007 | 10111 |
| XXXX | 0300 | 7008 | 10111 |
| XXXX | 0300 | 7009 | 10111 |
| XXXX | 0300 | 8001 | 10111 |
| XXXX | 0400 | 4006 | 11000 |
| XXXX | 0400 | 4007 | 11000 |
| XXXX | 0400 | 4008 | 11000 |
| XXXX | 0400 | 4009 | 11000 |
| XXXX | 0400 | 5001 | 11000 |
| XXXX | 0400 | 5002 | 11000 |
| XXXX | 0400 | 5003 | 11000 |
| XXXX | 0400 | 5004 | 11000 |
| XXXX | 0400 | 5005 | 11000 |
| XXXX | 0400 | 5006 | 11000 |
| XXXX | 0400 | 5007 | 11000 |
| XXXX | 0400 | 5008 | 11000 |
| XXXX | 0400 | 5009 | 11000 |
| XXXX | 0400 | 6001 | 11000 |
| XXXX | 0400 | 6002 | 11000 |
| XXXX | 0400 | 6003 | 11000 |
| XXXX | 0400 | 6004 | 11000 |
| XXXX | 0400 | 6005 | 11000 |
| XXXX | 0400 | 6006 | 11000 |
| XXXX | 0400 | 6007 | 11000 |

TABLE 3-continued

| Window Contents | | | X' |
|---|---|---|---|
| XXXX | 0400 | 6008 | 11000 |
| XXXX | 0400 | 6009 | 11000 |
| XXXX | 0400 | 7001 | 11000 |
| XXXX | 0400 | 7002 | 11000 |
| XXXX | 0400 | 7003 | 11000 |
| XXXX | 0400 | 7004 | 11000 |
| XXXX | 0400 | 7005 | 11000 |
| XXXX | 0400 | 7006 | 11000 |
| XXXX | 0400 | 7007 | 11000 |
| XXXX | 0400 | 7008 | 11000 |
| XXXX | 0400 | 7009 | 11000 |
| XXXX | 0400 | 8001 | 11000 |
| XXXX | 0500 | 4006 | 11001 |
| XXXX | 0500 | 4007 | 11001 |
| XXXX | 0500 | 4008 | 11001 |
| XXXX | 0500 | 4009 | 11001 |
| XXXX | 0500 | 5001 | 11001 |
| XXXX | 0500 | 5002 | 11001 |
| XXXX | 0500 | 5003 | 11001 |
| XXXX | 0500 | 5004 | 11001 |
| XXXX | 0500 | 5005 | 11001 |
| XXXX | 0500 | 5006 | 11001 |
| XXXX | 0500 | 5007 | 11001 |
| XXXX | 0500 | 5008 | 11001 |
| XXXX | 0500 | 5009 | 11001 |
| XXXX | 0500 | 6001 | 11001 |
| XXXX | 0500 | 6002 | 11001 |
| XXXX | 0500 | 6003 | 11001 |
| XXXX | 0500 | 6004 | 11001 |
| XXXX | 0500 | 6005 | 11001 |
| XXXX | 0500 | 6006 | 11001 |
| XXXX | 0500 | 6007 | 11001 |
| XXXX | 0500 | 6008 | 11001 |
| XXXX | 0500 | 6009 | 11001 |
| XXXX | 0500 | 7001 | 11001 |
| XXXX | 0500 | 7002 | 11001 |
| XXXX | 0500 | 7003 | 11001 |
| XXXX | 0500 | 7004 | 11001 |
| XXXX | 0500 | 7005 | 11001 |
| XXXX | 0500 | 7006 | 11001 |
| XXXX | 0500 | 7007 | 11001 |
| XXXX | 0500 | 7008 | 11001 |
| XXXX | 0500 | 7009 | 11001 |
| XXXX | 0500 | 8001 | 11001 |
| XXXX | 0600 | 4006 | 11010 |
| XXXX | 0600 | 4007 | 11010 |
| XXXX | 0600 | 4008 | 11010 |
| XXXX | 0600 | 4009 | 11010 |
| XXXX | 0600 | 5001 | 11010 |
| XXXX | 0600 | 5002 | 11010 |
| XXXX | 0600 | 5003 | 11010 |
| XXXX | 0600 | 5004 | 11010 |
| XXXX | 0600 | 5005 | 11010 |
| XXXX | 0600 | 5006 | 11010 |
| XXXX | 0600 | 5007 | 11010 |
| XXXX | 0600 | 5008 | 11010 |
| XXXX | 0600 | 5009 | 11010 |
| XXXX | 0600 | 6001 | 11010 |
| XXXX | 0600 | 6002 | 11010 |
| XXXX | 0600 | 6003 | 11010 |
| XXXX | 0600 | 6004 | 11010 |
| XXXX | 0600 | 6005 | 11010 |
| XXXX | 0600 | 6006 | 11010 |
| XXXX | 0600 | 6007 | 11010 |
| XXXX | 0600 | 6008 | 11010 |
| XXXX | 0600 | 6009 | 11010 |
| XXXX | 0600 | 7001 | 11010 |
| XXXX | 0600 | 7002 | 11010 |
| XXXX | 0600 | 7003 | 11010 |
| XXXX | 0600 | 7004 | 11010 |
| XXXX | 0600 | 7005 | 11010 |
| XXXX | 0600 | 7006 | 11010 |
| XXXX | 0600 | 7007 | 11010 |
| XXXX | 0600 | 7008 | 11010 |
| XXXX | 0600 | 7009 | 11010 |
| XXXX | 0600 | 8001 | 11010 |
| XXXX | 0700 | 4006 | 11011 |

TABLE 3-continued

| Window Contents | | | X' |
|---|---|---|---|
| XXXX | 0700 | 4007 | 11011 |
| XXXX | 0700 | 4008 | 11011 |
| XXXX | 0700 | 4009 | 11011 |
| XXXX | 0700 | 5001 | 11011 |
| XXXX | 0700 | 5002 | 11011 |
| XXXX | 0700 | 5003 | 11011 |
| XXXX | 0700 | 5004 | 11011 |
| XXXX | 0700 | 5005 | 11011 |
| XXXX | 0700 | 5006 | 11011 |
| XXXX | 0700 | 5007 | 11011 |
| XXXX | 0700 | 5008 | 11011 |
| XXXX | 0700 | 5009 | 11011 |
| XXXX | 0700 | 6001 | 11011 |
| XXXX | 0700 | 6002 | 11011 |
| XXXX | 0700 | 6003 | 11011 |
| XXXX | 0700 | 6004 | 11011 |
| XXXX | 0700 | 6005 | 11011 |
| XXXX | 0700 | 6006 | 11011 |
| XXXX | 0700 | 6007 | 11011 |
| XXXX | 0700 | 6008 | 11011 |
| XXXX | 0700 | 6009 | 11011 |
| XXXX | 0700 | 7001 | 11011 |
| XXXX | 0700 | 7002 | 11011 |
| XXXX | 0700 | 7003 | 11011 |
| XXXX | 0700 | 7004 | 11011 |
| XXXX | 0700 | 7005 | 11011 |
| XXXX | 0700 | 7006 | 11011 |
| XXXX | 0700 | 7007 | 11011 |
| XXXX | 0700 | 7008 | 11011 |
| XXXX | 0700 | 7009 | 11011 |
| XXXX | 0700 | 8001 | 11011 |
| XXXX | 0100 | 8002 | 11100 |
| XXXX | 0100 | 8003 | 11100 |
| XXXX | 0100 | 8004 | 11100 |
| XXXX | 0100 | 8005 | 11100 |
| XXXX | 0100 | 8006 | 11100 |
| XXXX | 0100 | 8007 | 11100 |
| XXXX | 0100 | 8008 | 11100 |
| XXXX | 0100 | 8009 | 11100 |
| XXXX | 0100 | 9001 | 11100 |
| XXXX | 0100 | 9002 | 11100 |
| XXXX | 0100 | 9003 | 11100 |
| XXXX | 0100 | 9004 | 11100 |
| XXXX | 0100 | 9005 | 11100 |
| XXXX | 0100 | 9006 | 11100 |
| XXXX | 0100 | 9007 | 11100 |
| XXXX | 0100 | 9008 | 11100 |
| XXXX | 0100 | 9009 | 11100 |
| XXXX | 0100 | 1000 | 11100 |
| XXXX | 0100 | 2000 | 11100 |
| XXXX | 0100 | 3000 | 11100 |
| XXXX | 0200 | 8002 | 11101 |
| XXXX | 0200 | 8003 | 11101 |
| XXXX | 0200 | 8004 | 11101 |
| XXXX | 0200 | 8005 | 11101 |
| XXXX | 0200 | 8006 | 11101 |
| XXXX | 0200 | 8007 | 11101 |
| XXXX | 0200 | 8008 | 11101 |
| XXXX | 0200 | 8009 | 11101 |
| XXXX | 0200 | 9001 | 11101 |
| XXXX | 0200 | 9002 | 11101 |
| XXXX | 0200 | 9003 | 11101 |
| XXXX | 0200 | 9004 | 11101 |
| XXXX | 0200 | 9005 | 11101 |
| XXXX | 0200 | 9006 | 11101 |
| XXXX | 0200 | 9007 | 11101 |
| XXXX | 0200 | 9008 | 11101 |
| XXXX | 0200 | 9009 | 11101 |
| XXXX | 0200 | 1000 | 11101 |
| XXXX | 0200 | 2000 | 11101 |
| XXXX | 0200 | 3000 | 11101 |
| XXXX | 0300 | 8002 | 11110 |
| XXXX | 0300 | 8003 | 11110 |
| XXXX | 0300 | 8004 | 11110 |
| XXXX | 0300 | 8005 | 11110 |
| XXXX | 0300 | 8006 | 11110 |
| XXXX | 0300 | 8007 | 11110 |

TABLE 3-continued

| Window Contents | | | X' |
|---|---|---|---|
| X X X X | 0 3 0 0 | 8 0 0 8 | 1 1 1 1 0 |
| X X X X | 0 3 0 0 | 8 0 0 9 | 1 1 1 1 0 |
| X X X X | 0 3 0 0 | 9 0 0 1 | 1 1 1 1 0 |
| X X X X | 0 3 0 0 | 9 0 0 2 | 1 1 1 1 0 |
| X X X X | 0 3 0 0 | 9 0 0 3 | 1 1 1 1 0 |
| X X X X | 0 3 0 0 | 9 0 0 4 | 1 1 1 1 0 |
| X X X X | 0 3 0 0 | 9 0 0 5 | 1 1 1 1 0 |
| X X X X | 0 3 0 0 | 9 0 0 6 | 1 1 1 1 0 |
| X X X X | 0 3 0 0 | 9 0 0 7 | 1 1 1 1 0 |
| X X X X | 0 3 0 0 | 9 0 0 8 | 1 1 1 1 0 |
| X X X X | 0 3 0 0 | 9 0 0 9 | 1 1 1 1 0 |
| X X X X | 0 3 0 0 | 1 0 0 0 | 1 1 1 1 0 |
| X X X X | 0 3 0 0 | 2 0 0 0 | 1 1 1 1 0 |
| X X X X | 0 3 0 0 | 3 0 0 0 | 1 1 1 1 0 |
| X X X X | 0 4 0 0 | 8 0 0 2 | 1 1 1 1 1 |
| X X X X | 0 4 0 0 | 8 0 0 3 | 1 1 1 1 1 |
| X X X X | 0 4 0 0 | 8 0 0 4 | 1 1 1 1 1 |
| X X X X | 0 4 0 0 | 8 0 0 5 | 1 1 1 1 1 |
| X X X X | 0 4 0 0 | 8 0 0 6 | 1 1 1 1 1 |
| X X X X | 0 4 0 0 | 8 0 0 7 | 1 1 1 1 1 |
| X X X X | 0 4 0 0 | 8 0 0 8 | 1 1 1 1 1 |
| X X X X | 0 4 0 0 | 8 0 0 9 | 1 1 1 1 1 |
| X X X X | 0 4 0 0 | 9 0 0 1 | 1 1 1 1 1 |
| X X X X | 0 4 0 0 | 9 0 0 2 | 1 1 1 1 1 |
| X X X X | 0 4 0 0 | 9 0 0 3 | 1 1 1 1 1 |
| X X X X | 0 4 0 0 | 9 0 0 4 | 1 1 1 1 1 |
| X X X X | 0 4 0 0 | 9 0 0 5 | 1 1 1 1 1 |
| X X X X | 0 4 0 0 | 9 0 0 6 | 1 1 1 1 1 |
| X X X X | 0 4 0 0 | 9 0 0 7 | 1 1 1 1 1 |
| X X X X | 0 4 0 0 | 9 0 0 8 | 1 1 1 1 1 |
| X X X X | 0 4 0 0 | 9 0 0 9 | 1 1 1 1 1 |
| X X X X | 0 4 0 0 | 1 0 0 0 | 1 1 1 1 1 |
| X X X X | 0 4 0 0 | 2 0 0 0 | 1 1 1 1 1 |
| X X X X | 0 4 0 0 | 3 0 0 0 | 1 1 1 1 1 |
| 0 0 0 0 | 0 0 0 0 | 0 1 0 0 | 0 0 0 0 0 |
| 0 0 0 0 | 0 0 0 0 | 0 2 0 0 | 0 0 0 0 0 |
| 0 0 0 0 | 0 0 0 0 | 0 3 0 0 | 0 0 0 0 0 |
| 0 0 0 0 | 0 0 0 0 | 0 4 0 0 | 0 0 0 0 0 |
| 0 0 0 0 | 0 0 0 0 | 0 5 0 0 | 0 0 0 0 0 |
| 0 0 0 0 | 0 0 0 0 | 0 6 0 0 | 0 0 0 0 0 |
| 0 0 0 0 | 0 0 0 0 | 0 7 0 0 | 0 0 0 0 0 |
| 0 X 0 0 | 0 0 0 0 | 0 1 0 0 | 0 0 0 0 0 |
| 0 X 0 0 | 0 0 0 0 | 0 2 0 0 | 0 0 0 0 0 |
| 0 X 0 0 | 0 0 0 0 | 0 3 0 0 | 0 0 0 0 0 |
| 0 X 0 0 | 0 0 0 0 | 0 4 0 0 | 0 0 0 0 0 |
| 0 X 0 0 | 0 0 0 0 | 0 5 0 0 | 0 0 0 0 0 |
| 0 X 0 0 | 0 0 0 0 | 0 6 0 0 | 0 0 0 0 0 |
| 0 X 0 0 | 0 0 0 0 | 0 7 0 0 | 0 0 0 0 0 |
| X 0 0 0 | 0 0 0 0 | 0 1 0 0 | 0 0 0 0 0 |
| X 0 0 0 | 0 0 0 0 | 0 2 0 0 | 0 0 0 0 0 |
| X 0 0 0 | 0 0 0 0 | 0 3 0 0 | 0 0 0 0 0 |
| X 0 0 0 | 0 0 0 0 | 0 4 0 0 | 0 0 0 0 0 |
| X 0 0 0 | 0 0 0 0 | 0 5 0 0 | 0 0 0 0 0 |
| X 0 0 0 | 0 0 0 0 | 0 6 0 0 | 0 0 0 0 0 |
| X 0 0 0 | 0 0 0 0 | 0 7 0 0 | 0 0 0 0 0 |
| 0 0 0 0 | 0 0 0 0 | 4 0 0 0 | 0 0 0 0 1 |
| 0 0 0 0 | 0 0 0 0 | 5 0 0 0 | 0 0 0 0 1 |
| 0 0 0 0 | 0 0 0 0 | 6 0 0 0 | 0 0 0 0 1 |
| 0 0 0 0 | 0 0 0 0 | 7 0 0 0 | 0 0 0 0 1 |
| 0 0 0 0 | 0 0 0 0 | 8 0 0 0 | 0 0 0 0 1 |
| 0 0 0 0 | 0 0 0 0 | 9 0 0 0 | 0 0 0 0 1 |
| 0 0 0 0 | 0 0 0 0 | 0 8 0 0 | 0 0 0 0 1 |
| 0 0 0 0 | 0 0 0 0 | 0 9 0 0 | 0 0 0 0 1 |
| 0 X 0 0 | 0 0 0 0 | 4 0 0 0 | 0 0 0 0 1 |
| 0 X 0 0 | 0 0 0 0 | 5 0 0 0 | 0 0 0 0 1 |
| 0 X 0 0 | 0 0 0 0 | 6 0 0 0 | 0 0 0 0 1 |
| 0 X 0 0 | 0 0 0 0 | 7 0 0 0 | 0 0 0 0 1 |
| 0 X 0 0 | 0 0 0 0 | 8 0 0 0 | 0 0 0 0 1 |
| 0 X 0 0 | 0 0 0 0 | 9 0 0 0 | 0 0 0 0 1 |
| 0 X 0 0 | 0 0 0 0 | 0 8 0 0 | 0 0 0 0 1 |
| 0 X 0 0 | 0 0 0 0 | 0 9 0 0 | 0 0 0 0 1 |
| X 0 0 0 | 0 0 0 0 | 4 0 0 0 | 0 0 0 0 1 |
| X 0 0 0 | 0 0 0 0 | 5 0 0 0 | 0 0 0 0 1 |
| X 0 0 0 | 0 0 0 0 | 6 0 0 0 | 0 0 0 0 1 |
| X 0 0 0 | 0 0 0 0 | 7 0 0 0 | 0 0 0 0 1 |
| X 0 0 0 | 0 0 0 0 | 8 0 0 0 | 0 0 0 0 1 |
| X 0 0 0 | 0 0 0 0 | 9 0 0 0 | 0 0 0 0 1 |

TABLE 3-continued

| Window Contents | | | X' |
|---|---|---|---|
| X 0 0 0 | 0 0 0 0 | 0 8 0 0 | 0 0 0 0 1 |
| X 0 0 0 | 0 0 0 0 | 0 9 0 0 | 0 0 0 0 1 |
| 0 0 0 0 | 0 0 0 0 | 1 0 0 1 | 0 0 0 1 0 |
| 0 0 0 0 | 0 0 0 0 | 1 0 0 2 | 0 0 0 1 0 |
| 0 0 0 0 | 0 0 0 0 | 1 0 0 3 | 0 0 0 1 0 |
| 0 0 0 0 | 0 0 0 0 | 1 0 0 4 | 0 0 0 1 0 |
| 0 0 0 0 | 0 0 0 0 | 1 0 0 5 | 0 0 0 1 0 |
| 0 0 0 0 | 0 0 0 0 | 1 0 0 6 | 0 0 0 1 0 |
| 0 0 0 0 | 0 0 0 0 | 1 0 0 7 | 0 0 0 1 0 |
| 0 0 0 0 | 0 0 0 0 | 1 0 0 8 | 0 0 0 1 0 |
| 0 0 0 0 | 0 0 0 0 | 1 0 0 9 | 0 0 0 1 0 |
| 0 0 0 0 | 0 0 0 0 | 2 0 0 1 | 0 0 0 1 0 |
| 0 0 0 0 | 0 0 0 0 | 2 0 0 2 | 0 0 0 1 0 |
| 0 0 0 0 | 0 0 0 0 | 2 0 0 3 | 0 0 0 1 0 |
| 0 0 0 0 | 0 0 0 0 | 2 0 0 4 | 0 0 0 1 0 |
| 0 0 0 0 | 0 0 0 0 | 2 0 0 5 | 0 0 0 1 0 |
| 0 0 0 0 | 0 0 0 0 | 2 0 0 6 | 0 0 0 1 0 |
| 0 0 0 0 | 0 0 0 0 | 2 0 0 7 | 0 0 0 1 0 |
| 0 0 0 0 | 0 0 0 0 | 2 0 0 8 | 0 0 0 1 0 |
| 0 0 0 0 | 0 0 0 0 | 2 0 0 9 | 0 0 0 1 0 |
| 0 0 0 0 | 0 0 0 0 | 3 0 0 1 | 0 0 0 1 0 |
| 0 0 0 0 | 0 0 0 0 | 3 0 0 2 | 0 0 0 1 0 |
| 0 0 0 0 | 0 0 0 0 | 3 0 0 3 | 0 0 0 1 0 |
| 0 0 0 0 | 0 0 0 0 | 3 0 0 4 | 0 0 0 1 0 |
| 0 0 0 0 | 0 0 0 0 | 3 0 0 5 | 0 0 0 1 0 |
| 0 0 0 0 | 0 0 0 0 | 3 0 0 6 | 0 0 0 1 0 |
| 0 0 0 0 | 0 0 0 0 | 3 0 0 7 | 0 0 0 1 0 |
| 0 0 0 0 | 0 0 0 0 | 3 0 0 8 | 0 0 0 1 0 |
| 0 0 0 0 | 0 0 0 0 | 3 0 0 9 | 0 0 0 1 0 |
| 0 0 0 0 | 0 0 0 0 | 4 0 0 1 | 0 0 0 1 0 |
| 0 0 0 0 | 0 0 0 0 | 4 0 0 2 | 0 0 0 1 0 |
| 0 0 0 0 | 0 0 0 0 | 4 0 0 3 | 0 0 0 1 0 |
| 0 0 0 0 | 0 0 0 0 | 4 0 0 4 | 0 0 0 1 0 |
| 0 0 0 0 | 0 0 0 0 | 4 0 0 5 | 0 0 0 1 0 |
| 0 X 0 0 | 0 0 0 0 | 1 0 0 1 | 0 0 0 1 0 |
| 0 X 0 0 | 0 0 0 0 | 1 0 0 2 | 0 0 0 1 0 |
| 0 X 0 0 | 0 0 0 0 | 1 0 0 3 | 0 0 0 1 0 |
| 0 X 0 0 | 0 0 0 0 | 1 0 0 4 | 0 0 0 1 0 |
| 0 X 0 0 | 0 0 0 0 | 1 0 0 5 | 0 0 0 1 0 |
| 0 X 0 0 | 0 0 0 0 | 1 0 0 6 | 0 0 0 1 0 |
| 0 X 0 0 | 0 0 0 0 | 1 0 0 7 | 0 0 0 1 0 |
| 0 X 0 0 | 0 0 0 0 | 1 0 0 8 | 0 0 0 1 0 |
| 0 X 0 0 | 0 0 0 0 | 1 0 0 9 | 0 0 0 1 0 |
| 0 X 0 0 | 0 0 0 0 | 2 0 0 1 | 0 0 0 1 0 |
| 0 X 0 0 | 0 0 0 0 | 2 0 0 2 | 0 0 0 1 0 |
| 0 X 0 0 | 0 0 0 0 | 2 0 0 3 | 0 0 0 1 0 |
| 0 X 0 0 | 0 0 0 0 | 2 0 0 4 | 0 0 0 1 0 |
| 0 X 0 0 | 0 0 0 0 | 2 0 0 5 | 0 0 0 1 0 |
| 0 X 0 0 | 0 0 0 0 | 2 0 0 6 | 0 0 0 1 0 |
| 0 X 0 0 | 0 0 0 0 | 2 0 0 7 | 0 0 0 1 0 |
| 0 X 0 0 | 0 0 0 0 | 2 0 0 8 | 0 0 0 1 0 |
| 0 X 0 0 | 0 0 0 0 | 2 0 0 9 | 0 0 0 1 0 |
| 0 X 0 0 | 0 0 0 0 | 3 0 0 1 | 0 0 0 1 0 |
| 0 X 0 0 | 0 0 0 0 | 3 0 0 2 | 0 0 0 1 0 |
| 0 X 0 0 | 0 0 0 0 | 3 0 0 3 | 0 0 0 1 0 |
| 0 X 0 0 | 0 0 0 0 | 3 0 0 4 | 0 0 0 1 0 |
| 0 X 0 0 | 0 0 0 0 | 3 0 0 5 | 0 0 0 1 0 |
| 0 X 0 0 | 0 0 0 0 | 3 0 0 6 | 0 0 0 1 0 |
| 0 X 0 0 | 0 0 0 0 | 3 0 0 7 | 0 0 0 1 0 |
| 0 X 0 0 | 0 0 0 0 | 3 0 0 8 | 0 0 0 1 0 |
| 0 X 0 0 | 0 0 0 0 | 3 0 0 9 | 0 0 0 1 0 |
| 0 X 0 0 | 0 0 0 0 | 4 0 0 1 | 0 0 0 1 0 |
| 0 X 0 0 | 0 0 0 0 | 4 0 0 2 | 0 0 0 1 0 |
| 0 X 0 0 | 0 0 0 0 | 4 0 0 3 | 0 0 0 1 0 |
| 0 X 0 0 | 0 0 0 0 | 4 0 0 4 | 0 0 0 1 0 |
| 0 X 0 0 | 0 0 0 0 | 4 0 0 5 | 0 0 0 1 0 |
| X 0 0 0 | 0 0 0 0 | 1 0 0 1 | 0 0 0 1 0 |
| X 0 0 0 | 0 0 0 0 | 1 0 0 2 | 0 0 0 1 0 |
| X 0 0 0 | 0 0 0 0 | 1 0 0 3 | 0 0 0 1 0 |
| X 0 0 0 | 0 0 0 0 | 1 0 0 4 | 0 0 0 1 0 |
| X 0 0 0 | 0 0 0 0 | 1 0 0 5 | 0 0 0 1 0 |
| X 0 0 0 | 0 0 0 0 | 1 0 0 6 | 0 0 0 1 0 |
| X 0 0 0 | 0 0 0 0 | 1 0 0 7 | 0 0 0 1 0 |
| X 0 0 0 | 0 0 0 0 | 1 0 0 8 | 0 0 0 1 0 |
| X 0 0 0 | 0 0 0 0 | 1 0 0 9 | 0 0 0 1 0 |
| X 0 0 0 | 0 0 0 0 | 2 0 0 1 | 0 0 0 1 0 |
| X 0 0 0 | 0 0 0 0 | 2 0 0 2 | 0 0 0 1 0 |

TABLE 3-continued

| Window Contents | | | X' |
|---|---|---|---|
| X 0 0 0 | 0 0 0 0 | 2 0 0 3 | 0 0 0 1 0 |
| X 0 0 0 | 0 0 0 0 | 2 0 0 4 | 0 0 0 1 0 |
| X 0 0 0 | 0 0 0 0 | 2 0 0 5 | 0 0 0 1 0 |
| X 0 0 0 | 0 0 0 0 | 2 0 0 6 | 0 0 0 1 0 |
| X 0 0 0 | 0 0 0 0 | 2 0 0 7 | 0 0 0 1 0 |
| X 0 0 0 | 0 0 0 0 | 2 0 0 8 | 0 0 0 1 0 |
| X 0 0 0 | 0 0 0 0 | 2 0 0 9 | 0 0 0 1 0 |
| X 0 0 0 | 0 0 0 0 | 3 0 0 1 | 0 0 0 1 0 |
| X 0 0 0 | 0 0 0 0 | 3 0 0 2 | 0 0 0 1 0 |
| X 0 0 0 | 0 0 0 0 | 3 0 0 3 | 0 0 0 1 0 |
| X 0 0 0 | 0 0 0 0 | 3 0 0 4 | 0 0 0 1 0 |
| X 0 0 0 | 0 0 0 0 | 3 0 0 5 | 0 0 0 1 0 |
| X 0 0 0 | 0 0 0 0 | 3 0 0 6 | 0 0 0 1 0 |
| X 0 0 0 | 0 0 0 0 | 3 0 0 7 | 0 0 0 1 0 |
| X 0 0 0 | 0 0 0 0 | 3 0 0 8 | 0 0 0 1 0 |
| X 0 0 0 | 0 0 0 0 | 3 0 0 9 | 0 0 0 1 0 |
| X 0 0 0 | 0 0 0 0 | 4 0 0 1 | 0 0 0 1 0 |
| X 0 0 0 | 0 0 0 0 | 4 0 0 2 | 0 0 0 1 0 |
| X 0 0 0 | 0 0 0 0 | 4 0 0 3 | 0 0 0 1 0 |
| X 0 0 0 | 0 0 0 0 | 4 0 0 4 | 0 0 0 1 0 |
| X 0 0 0 | 0 0 0 0 | 4 0 0 5 | 0 0 0 1 0 |
| 0 0 0 0 | 0 0 0 0 | 4 0 0 6 | 0 0 0 1 1 |
| 0 0 0 0 | 0 0 0 0 | 4 0 0 7 | 0 0 0 1 1 |
| 0 0 0 0 | 0 0 0 0 | 4 0 0 8 | 0 0 0 1 1 |
| 0 0 0 0 | 0 0 0 0 | 4 0 0 9 | 0 0 0 1 1 |
| 0 0 0 0 | 0 0 0 0 | 5 0 0 1 | 0 0 0 1 1 |
| 0 0 0 0 | 0 0 0 0 | 5 0 0 2 | 0 0 0 1 1 |
| 0 0 0 0 | 0 0 0 0 | 5 0 0 3 | 0 0 0 1 1 |
| 0 0 0 0 | 0 0 0 0 | 5 0 0 4 | 0 0 0 1 1 |
| 0 0 0 0 | 0 0 0 0 | 5 0 0 5 | 0 0 0 1 1 |
| 0 0 0 0 | 0 0 0 0 | 5 0 0 6 | 0 0 0 1 1 |
| 0 0 0 0 | 0 0 0 0 | 5 0 0 7 | 0 0 0 1 1 |
| 0 0 0 0 | 0 0 0 0 | 5 0 0 8 | 0 0 0 1 1 |
| 0 0 0 0 | 0 0 0 0 | 5 0 0 9 | 0 0 0 1 1 |
| 0 0 0 0 | 0 0 0 0 | 6 0 0 1 | 0 0 0 1 1 |
| 0 0 0 0 | 0 0 0 0 | 6 0 0 2 | 0 0 0 1 1 |
| 0 0 0 0 | 0 0 0 0 | 6 0 0 3 | 0 0 0 1 1 |
| 0 0 0 0 | 0 0 0 0 | 6 0 0 4 | 0 0 0 1 1 |
| 0 0 0 0 | 0 0 0 0 | 6 0 0 5 | 0 0 0 1 1 |
| 0 0 0 0 | 0 0 0 0 | 6 0 0 6 | 0 0 0 1 1 |
| 0 0 0 0 | 0 0 0 0 | 6 0 0 7 | 0 0 0 1 1 |
| 0 0 0 0 | 0 0 0 0 | 6 0 0 8 | 0 0 0 1 1 |
| 0 0 0 0 | 0 0 0 0 | 6 0 0 9 | 0 0 0 1 1 |
| 0 0 0 0 | 0 0 0 0 | 7 0 0 1 | 0 0 0 1 1 |
| 0 0 0 0 | 0 0 0 0 | 7 0 0 2 | 0 0 0 1 1 |
| 0 0 0 0 | 0 0 0 0 | 7 0 0 3 | 0 0 0 1 1 |
| 0 0 0 0 | 0 0 0 0 | 7 0 0 4 | 0 0 0 1 1 |
| 0 0 0 0 | 0 0 0 0 | 7 0 0 5 | 0 0 0 1 1 |
| 0 0 0 0 | 0 0 0 0 | 7 0 0 6 | 0 0 0 1 1 |
| 0 0 0 0 | 0 0 0 0 | 7 0 0 7 | 0 0 0 1 1 |
| 0 0 0 0 | 0 0 0 0 | 7 0 0 8 | 0 0 0 1 1 |
| 0 0 0 0 | 0 0 0 0 | 7 0 0 9 | 0 0 0 1 1 |
| 0 0 0 0 | 0 0 0 0 | 8 0 0 1 | 0 0 0 1 1 |
| 0 X 0 0 | 0 0 0 0 | 4 0 0 6 | 0 0 0 1 1 |
| 0 X 0 0 | 0 0 0 0 | 4 0 0 7 | 0 0 0 1 1 |
| 0 X 0 0 | 0 0 0 0 | 4 0 0 8 | 0 0 0 1 1 |
| 0 X 0 0 | 0 0 0 0 | 4 0 0 9 | 0 0 0 1 1 |
| 0 X 0 0 | 0 0 0 0 | 5 0 0 1 | 0 0 0 1 1 |
| 0 X 0 0 | 0 0 0 0 | 5 0 0 2 | 0 0 0 1 1 |
| 0 X 0 0 | 0 0 0 0 | 5 0 0 3 | 0 0 0 1 1 |
| 0 X 0 0 | 0 0 0 0 | 5 0 0 4 | 0 0 0 1 1 |
| 0 X 0 0 | 0 0 0 0 | 5 0 0 5 | 0 0 0 1 1 |
| 0 X 0 0 | 0 0 0 0 | 5 0 0 6 | 0 0 0 1 1 |
| 0 X 0 0 | 0 0 0 0 | 5 0 0 7 | 0 0 0 1 1 |
| 0 X 0 0 | 0 0 0 0 | 5 0 0 8 | 0 0 0 1 1 |
| 0 X 0 0 | 0 0 0 0 | 5 0 0 9 | 0 0 0 1 1 |
| 0 X 0 0 | 0 0 0 0 | 6 0 0 1 | 0 0 0 1 1 |
| 0 X 0 0 | 0 0 0 0 | 6 0 0 2 | 0 0 0 1 1 |
| 0 X 0 0 | 0 0 0 0 | 6 0 0 3 | 0 0 0 1 1 |
| 0 X 0 0 | 0 0 0 0 | 6 0 0 4 | 0 0 0 1 1 |
| 0 X 0 0 | 0 0 0 0 | 6 0 0 5 | 0 0 0 1 1 |
| 0 X 0 0 | 0 0 0 0 | 6 0 0 6 | 0 0 0 1 1 |
| 0 X 0 0 | 0 0 0 0 | 6 0 0 7 | 0 0 0 1 1 |
| 0 X 0 0 | 0 0 0 0 | 6 0 0 8 | 0 0 0 1 1 |
| 0 X 0 0 | 0 0 0 0 | 6 0 0 9 | 0 0 0 1 1 |
| 0 X 0 0 | 0 0 0 0 | 7 0 0 1 | 0 0 0 1 1 |
| 0 X 0 0 | 0 0 0 0 | 7 0 0 2 | 0 0 0 1 1 |

TABLE 3-continued

| Window Contents | | | X' |
|---|---|---|---|
| 0 X 0 0 | 0 0 0 0 | 7 0 0 3 | 0 0 0 1 1 |
| 0 X 0 0 | 0 0 0 0 | 7 0 0 4 | 0 0 0 1 1 |
| 0 X 0 0 | 0 0 0 0 | 7 0 0 5 | 0 0 0 1 1 |
| 0 X 0 0 | 0 0 0 0 | 7 0 0 6 | 0 0 0 1 1 |
| 0 X 0 0 | 0 0 0 0 | 7 0 0 7 | 0 0 0 1 1 |
| 0 X 0 0 | 0 0 0 0 | 7 0 0 8 | 0 0 0 1 1 |
| 0 X 0 0 | 0 0 0 0 | 7 0 0 9 | 0 0 0 1 1 |
| 0 X 0 0 | 0 0 0 0 | 8 0 0 1 | 0 0 0 1 1 |
| X 0 0 0 | 0 0 0 0 | 4 0 0 6 | 0 0 0 1 1 |
| X 0 0 0 | 0 0 0 0 | 4 0 0 7 | 0 0 0 1 1 |
| X 0 0 0 | 0 0 0 0 | 4 0 0 8 | 0 0 0 1 1 |
| X 0 0 0 | 0 0 0 0 | 4 0 0 9 | 0 0 0 1 1 |
| X 0 0 0 | 0 0 0 0 | 5 0 0 1 | 0 0 0 1 1 |
| X 0 0 0 | 0 0 0 0 | 5 0 0 2 | 0 0 0 1 1 |
| X 0 0 0 | 0 0 0 0 | 5 0 0 3 | 0 0 0 1 1 |
| X 0 0 0 | 0 0 0 0 | 5 0 0 4 | 0 0 0 1 1 |
| X 0 0 0 | 0 0 0 0 | 5 0 0 5 | 0 0 0 1 1 |
| X 0 0 0 | 0 0 0 0 | 5 0 0 6 | 0 0 0 1 1 |
| X 0 0 0 | 0 0 0 0 | 5 0 0 7 | 0 0 0 1 1 |
| X 0 0 0 | 0 0 0 0 | 5 0 0 8 | 0 0 0 1 1 |
| X 0 0 0 | 0 0 0 0 | 5 0 0 9 | 0 0 0 1 1 |
| X 0 0 0 | 0 0 0 0 | 6 0 0 1 | 0 0 0 1 1 |
| X 0 0 0 | 0 0 0 0 | 6 0 0 2 | 0 0 0 1 1 |
| X 0 0 0 | 0 0 0 0 | 6 0 0 3 | 0 0 0 1 1 |
| X 0 0 0 | 0 0 0 0 | 6 0 0 4 | 0 0 0 1 1 |
| X 0 0 0 | 0 0 0 0 | 6 0 0 5 | 0 0 0 1 1 |
| X 0 0 0 | 0 0 0 0 | 6 0 0 6 | 0 0 0 1 1 |
| X 0 0 0 | 0 0 0 0 | 6 0 0 7 | 0 0 0 1 1 |
| X 0 0 0 | 0 0 0 0 | 6 0 0 8 | 0 0 0 1 1 |
| X 0 0 0 | 0 0 0 0 | 6 0 0 9 | 0 0 0 1 1 |
| X 0 0 0 | 0 0 0 0 | 7 0 0 1 | 0 0 0 1 1 |
| X 0 0 0 | 0 0 0 0 | 7 0 0 2 | 0 0 0 1 1 |
| X 0 0 0 | 0 0 0 0 | 7 0 0 3 | 0 0 0 1 1 |
| X 0 0 0 | 0 0 0 0 | 7 0 0 4 | 0 0 0 1 1 |
| X 0 0 0 | 0 0 0 0 | 7 0 0 5 | 0 0 0 1 1 |
| X 0 0 0 | 0 0 0 0 | 7 0 0 6 | 0 0 0 1 1 |
| X 0 0 0 | 0 0 0 0 | 7 0 0 7 | 0 0 0 1 1 |
| X 0 0 0 | 0 0 0 0 | 7 0 0 8 | 0 0 0 1 1 |
| X 0 0 0 | 0 0 0 0 | 7 0 0 9 | 0 0 0 1 1 |
| X 0 0 0 | 0 0 0 0 | 8 0 0 1 | 0 0 0 1 1 |
| 0 0 0 0 | 0 0 0 0 | 8 0 0 2 | 0 0 1 0 0 |
| 0 0 0 0 | 0 0 0 0 | 8 0 0 3 | 0 0 1 0 0 |
| 0 0 0 0 | 0 0 0 0 | 8 0 0 4 | 0 0 1 0 0 |
| 0 0 0 0 | 0 0 0 0 | 8 0 0 5 | 0 0 1 0 0 |
| 0 0 0 0 | 0 0 0 0 | 8 0 0 6 | 0 0 1 0 0 |
| 0 0 0 0 | 0 0 0 0 | 8 0 0 7 | 0 0 1 0 0 |
| 0 0 0 0 | 0 0 0 0 | 8 0 0 8 | 0 0 1 0 0 |
| 0 0 0 0 | 0 0 0 0 | 8 0 0 9 | 0 0 1 0 0 |
| 0 0 0 0 | 0 0 0 0 | 9 0 0 1 | 0 0 1 0 0 |
| 0 0 0 0 | 0 0 0 0 | 9 0 0 2 | 0 0 1 0 0 |
| 0 0 0 0 | 0 0 0 0 | 9 0 0 3 | 0 0 1 0 0 |
| 0 0 0 0 | 0 0 0 0 | 9 0 0 4 | 0 0 1 0 0 |
| 0 0 0 0 | 0 0 0 0 | 9 0 0 5 | 0 0 1 0 0 |
| 0 0 0 0 | 0 0 0 0 | 9 0 0 6 | 0 0 1 0 0 |
| 0 0 0 0 | 0 0 0 0 | 9 0 0 7 | 0 0 1 0 0 |
| 0 0 0 0 | 0 0 0 0 | 9 0 0 8 | 0 0 1 0 0 |
| 0 0 0 0 | 0 0 0 0 | 9 0 0 9 | 0 0 1 0 0 |
| 0 0 0 0 | 0 0 0 0 | 1 0 0 0 | 0 0 1 0 0 |
| 0 0 0 0 | 0 0 0 0 | 2 0 0 0 | 0 0 1 0 0 |
| 0 0 0 0 | 0 0 0 0 | 3 0 0 0 | 0 0 1 0 0 |
| 0 X 0 0 | 0 0 0 0 | 8 0 0 2 | 0 0 1 0 0 |
| 0 X 0 0 | 0 0 0 0 | 8 0 0 3 | 0 0 1 0 0 |
| 0 X 0 0 | 0 0 0 0 | 8 0 0 4 | 0 0 1 0 0 |
| 0 X 0 0 | 0 0 0 0 | 8 0 0 5 | 0 0 1 0 0 |
| 0 X 0 0 | 0 0 0 0 | 8 0 0 6 | 0 0 1 0 0 |
| 0 X 0 0 | 0 0 0 0 | 8 0 0 7 | 0 0 1 0 0 |
| 0 X 0 0 | 0 0 0 0 | 8 0 0 8 | 0 0 1 0 0 |
| 0 X 0 0 | 0 0 0 0 | 8 0 0 9 | 0 0 1 0 0 |
| 0 X 0 0 | 0 0 0 0 | 9 0 0 1 | 0 0 1 0 0 |
| 0 X 0 0 | 0 0 0 0 | 9 0 0 2 | 0 0 1 0 0 |
| 0 X 0 0 | 0 0 0 0 | 9 0 0 3 | 0 0 1 0 0 |
| 0 X 0 0 | 0 0 0 0 | 9 0 0 4 | 0 0 1 0 0 |
| 0 X 0 0 | 0 0 0 0 | 9 0 0 5 | 0 0 1 0 0 |
| 0 X 0 0 | 0 0 0 0 | 9 0 0 6 | 0 0 1 0 0 |
| 0 X 0 0 | 0 0 0 0 | 9 0 0 7 | 0 0 1 0 0 |
| 0 X 0 0 | 0 0 0 0 | 9 0 0 8 | 0 0 1 0 0 |
| 0 X 0 0 | 0 0 0 0 | 9 0 0 9 | 0 0 1 0 0 |

TABLE 3-continued

| Window Contents | | | X' |
|---|---|---|---|
| 0X00 | 0000 | 1000 | 00100 |
| 0X00 | 0000 | 2000 | 00100 |
| 0X00 | 0000 | 3000 | 00100 |
| X000 | 0000 | 8002 | 00100 |
| X000 | 0000 | 8003 | 00100 |
| X000 | 0000 | 8004 | 00100 |
| X000 | 0000 | 8005 | 00100 |
| X000 | 0000 | 8006 | 00100 |
| X000 | 0000 | 8007 | 00100 |
| X000 | 0000 | 8008 | 00100 |
| X000 | 0000 | 8009 | 00100 |
| X000 | 0000 | 9001 | 00100 |
| X000 | 0000 | 9002 | 00100 |
| X000 | 0000 | 9003 | 00100 |
| X000 | 0000 | 9004 | 00100 |
| X000 | 0000 | 9005 | 00100 |
| X000 | 0000 | 9006 | 00100 |
| X000 | 0000 | 9007 | 00100 |
| X000 | 0000 | 9008 | 00100 |
| X000 | 0000 | 9009 | 00100 |
| X000 | 0000 | 1000 | 00100 |
| X000 | 0000 | 2000 | 00100 |
| X000 | 0000 | 3000 | 00100 |
| XXXX | 1001 | XXXX | 00000 |
| XXXX | 1002 | XXXX | 00001 |
| XXXX | 1003 | XXXX | 00010 |
| XXXX | 1004 | XXXX | 00011 |
| XXXX | 1005 | XXXX | 00100 |
| XXXX | 1006 | XXXX | 00101 |
| XXXX | 1007 | XXXX | 00110 |
| XXXX | 1008 | XXXX | 00111 |
| XXXX | 1009 | XXXX | 01000 |
| XXXX | 2001 | XXXX | 01001 |
| XXXX | 2002 | XXXX | 01010 |
| XXXX | 2003 | XXXX | 01011 |
| XXXX | 2004 | XXXX | 01100 |
| XXXX | 2005 | XXXX | 01101 |
| XXXX | 2006 | XXXX | 01110 |
| XXXX | 2007 | XXXX | 01111 |
| XXXX | 2008 | XXXX | 10000 |
| XXXX | 2009 | XXXX | 10001 |
| XXXX | 3001 | XXXX | 10010 |
| XXXX | 3002 | XXXX | 10011 |
| XXXX | 3003 | XXXX | 10100 |
| XXXX | 3004 | XXXX | 10101 |
| XXXX | 3005 | XXXX | 10110 |
| XXXX | 3006 | XXXX | 10111 |
| XXXX | 3007 | XXXX | 11000 |
| XXXX | 3008 | XXXX | 11001 |
| XXXX | 3009 | XXXX | 11010 |
| XXXX | 4001 | XXXX | 11011 |
| XXXX | 4002 | XXXX | 11100 |
| XXXX | 4003 | XXXX | 11101 |
| XXXX | 4004 | XXXX | 11110 |
| XXXX | 4005 | XXXX | 11111 |
| XXXX | 4006 | XXXX | 00000 |
| XXXX | 4007 | XXXX | 00001 |
| XXXX | 4008 | XXXX | 00010 |
| XXXX | 4009 | XXXX | 00011 |
| XXXX | 5001 | XXXX | 00100 |
| XXXX | 5002 | XXXX | 00101 |
| XXXX | 5003 | XXXX | 00110 |
| XXXX | 5004 | XXXX | 00111 |
| XXXX | 5005 | XXXX | 01000 |
| XXXX | 5006 | XXXX | 01001 |
| XXXX | 5007 | XXXX | 01010 |
| XXXX | 5008 | XXXX | 01011 |
| XXXX | 5009 | XXXX | 01100 |
| XXXX | 6001 | XXXX | 01101 |
| XXXX | 6002 | XXXX | 01110 |
| XXXX | 6003 | XXXX | 01111 |
| XXXX | 6004 | XXXX | 10000 |
| XXXX | 6005 | XXXX | 10001 |
| XXXX | 6006 | XXXX | 10010 |
| XXXX | 6007 | XXXX | 10011 |
| XXXX | 6008 | XXXX | 10100 |
| XXXX | 6009 | XXXX | 10101 |

TABLE 3-continued

| Window Contents | | | X' |
|---|---|---|---|
| XXXX | 7001 | XXXX | 10110 |
| XXXX | 7002 | XXXX | 10111 |
| XXXX | 7003 | XXXX | 11000 |
| XXXX | 7004 | XXXX | 11001 |
| XXXX | 7005 | XXXX | 11010 |
| XXXX | 7006 | XXXX | 11011 |
| XXXX | 7007 | XXXX | 11100 |
| XXXX | 7008 | XXXX | 11101 |
| XXXX | 7009 | XXXX | 11110 |
| XXXX | 8001 | XXXX | 11111 |
| XXXX | 8002 | XXXX | 00000 |
| XXXX | 8003 | XXXX | 00001 |
| XXXX | 8004 | XXXX | 00010 |
| XXXX | 8005 | XXXX | 00011 |
| XXXX | 8006 | XXXX | 00100 |
| XXXX | 8007 | XXXX | 00101 |
| XXXX | 8008 | XXXX | 00110 |
| XXXX | 8009 | XXXX | 00111 |
| XXXX | 9001 | XXXX | 01000 |
| XXXX | 9002 | XXXX | 01001 |
| XXXX | 9003 | XXXX | 01010 |
| XXXX | 9004 | XXXX | 01011 |
| XXXX | 9005 | XXXX | 01100 |
| XXXX | 9006 | XXXX | 01101 |
| XXXX | 9007 | XXXX | 01110 |
| XXXX | 9008 | XXXX | 01111 |
| XXXX | 9009 | XXXX | 10000 |
| XXXX | 1000 | 0100 | 10001 |
| XXXX | 1000 | 0200 | 10001 |
| XXXX | 1000 | 0300 | 10001 |
| XXXX | 1000 | 0400 | 10001 |
| XXXX | 1000 | 0500 | 10001 |
| XXXX | 1000 | 0600 | 10001 |
| XXXX | 1000 | 0700 | 10001 |
| XXXX | 2000 | 0100 | 10010 |
| XXXX | 2000 | 0200 | 10010 |
| XXXX | 2000 | 0300 | 10010 |
| XXXX | 2000 | 0400 | 10010 |
| XXXX | 2000 | 0500 | 10010 |
| XXXX | 2000 | 0600 | 10010 |
| XXXX | 2000 | 0700 | 10010 |
| XXXX | 3000 | 0100 | 10011 |
| XXXX | 3000 | 0200 | 10011 |
| XXXX | 3000 | 0300 | 10011 |
| XXXX | 3000 | 0400 | 10011 |
| XXXX | 3000 | 0500 | 10011 |
| XXXX | 3000 | 0600 | 10011 |
| XXXX | 3000 | 0700 | 10011 |
| XXXX | 1000 | 0000 | 10100 |
| XXXX | 1000 | 00X0 | 10100 |
| XXXX | 1000 | 000X | 10100 |
| XXXX | 2000 | 0000 | 10101 |
| XXXX | 2000 | 00X0 | 10101 |
| XXXX | 2000 | 000X | 10101 |
| XXXX | 3000 | 0000 | 10110 |
| XXXX | 3000 | 00X0 | 10110 |
| XXXX | 3000 | 000X | 10110 |
| XXXX | 1000 | 1001 | 10111 |
| XXXX | 1000 | 1002 | 10111 |
| XXXX | 1000 | 1003 | 10111 |
| XXXX | 1000 | 1004 | 10111 |
| XXXX | 1000 | 1005 | 10111 |
| XXXX | 1000 | 1006 | 10111 |
| XXXX | 1000 | 1007 | 10111 |
| XXXX | 1000 | 1008 | 10111 |
| XXXX | 1000 | 1009 | 10111 |
| XXXX | 1000 | 2001 | 10111 |
| XXXX | 1000 | 2002 | 10111 |
| XXXX | 1000 | 2003 | 10111 |
| XXXX | 1000 | 2004 | 10111 |
| XXXX | 1000 | 2005 | 10111 |
| XXXX | 1000 | 2006 | 10111 |
| XXXX | 1000 | 2007 | 10111 |
| XXXX | 1000 | 2008 | 10111 |
| XXXX | 1000 | 2009 | 10111 |
| XXXX | 1000 | 3001 | 10111 |
| XXXX | 1000 | 3002 | 10111 |

TABLE 3-continued

| Window Contents | | | X' |
|---|---|---|---|
| XXXX | 1000 | 3003 | 10111 |
| XXXX | 1000 | 3004 | 10111 |
| XXXX | 1000 | 3005 | 10111 |
| XXXX | 1000 | 3006 | 10111 |
| XXXX | 1000 | 3007 | 10111 |
| XXXX | 1000 | 3008 | 10111 |
| XXXX | 1000 | 3009 | 10111 |
| XXXX | 1000 | 4001 | 10111 |
| XXXX | 1000 | 4002 | 10111 |
| XXXX | 1000 | 4003 | 10111 |
| XXXX | 1000 | 4004 | 10111 |
| XXXX | 1000 | 4005 | 10111 |
| XXXX | 2000 | 1001 | 11000 |
| XXXX | 2000 | 1002 | 11000 |
| XXXX | 2000 | 1003 | 11000 |
| XXXX | 2000 | 1004 | 11000 |
| XXXX | 2000 | 1005 | 11000 |
| XXXX | 2000 | 1006 | 11000 |
| XXXX | 2000 | 1007 | 11000 |
| XXXX | 2000 | 1008 | 11000 |
| XXXX | 2000 | 1009 | 11000 |
| XXXX | 2000 | 2001 | 11000 |
| XXXX | 2000 | 2002 | 11000 |
| XXXX | 2000 | 2003 | 11000 |
| XXXX | 2000 | 2004 | 11000 |
| XXXX | 2000 | 2005 | 11000 |
| XXXX | 2000 | 2006 | 11000 |
| XXXX | 2000 | 2007 | 11000 |
| XXXX | 2000 | 2008 | 11000 |
| XXXX | 2000 | 2009 | 11000 |
| XXXX | 2000 | 3001 | 11000 |
| XXXX | 2000 | 3002 | 11000 |
| XXXX | 2000 | 3003 | 11000 |
| XXXX | 2000 | 3004 | 11000 |
| XXXX | 2000 | 3005 | 11000 |
| XXXX | 2000 | 3006 | 11000 |
| XXXX | 2000 | 3007 | 11000 |
| XXXX | 2000 | 3008 | 11000 |
| XXXX | 2000 | 3009 | 11000 |
| XXXX | 2000 | 4001 | 11000 |
| XXXX | 2000 | 4002 | 11000 |
| XXXX | 2000 | 4003 | 11000 |
| XXXX | 2000 | 4004 | 11000 |
| XXXX | 2000 | 4005 | 11000 |
| XXXX | 3000 | 1001 | 11001 |
| XXXX | 3000 | 1002 | 11001 |
| XXXX | 3000 | 1003 | 11001 |
| XXXX | 3000 | 1004 | 11001 |
| XXXX | 3000 | 1005 | 11001 |
| XXXX | 3000 | 1006 | 11001 |
| XXXX | 3000 | 1007 | 11001 |
| XXXX | 3000 | 1008 | 11001 |
| XXXX | 3000 | 1009 | 11001 |
| XXXX | 3000 | 2001 | 11001 |
| XXXX | 3000 | 2002 | 11001 |
| XXXX | 3000 | 2003 | 11001 |
| XXXX | 3000 | 2004 | 11001 |
| XXXX | 3000 | 2005 | 11001 |
| XXXX | 3000 | 2006 | 11001 |
| XXXX | 3000 | 2007 | 11001 |
| XXXX | 3000 | 2008 | 11001 |
| XXXX | 3000 | 2009 | 11001 |
| XXXX | 3000 | 3001 | 11001 |
| XXXX | 3000 | 3002 | 11001 |
| XXXX | 3000 | 3003 | 11001 |
| XXXX | 3000 | 3004 | 11001 |
| XXXX | 3000 | 3005 | 11001 |
| XXXX | 3000 | 3006 | 11001 |
| XXXX | 3000 | 3007 | 11001 |
| XXXX | 3000 | 3008 | 11001 |
| XXXX | 3000 | 3009 | 11001 |
| XXXX | 3000 | 4001 | 11001 |
| XXXX | 3000 | 4002 | 11001 |
| XXXX | 3000 | 4003 | 11001 |
| XXXX | 3000 | 4004 | 11001 |
| XXXX | 3000 | 4005 | 11001 |
| XXXX | 1000 | 4006 | 11010 |

TABLE 3-continued

| Window Contents | | | X' |
|---|---|---|---|
| XXXX | 1000 | 4007 | 11010 |
| XXXX | 1000 | 4008 | 11010 |
| XXXX | 1000 | 4009 | 11010 |
| XXXX | 1000 | 5001 | 11010 |
| XXXX | 1000 | 5002 | 11010 |
| XXXX | 1000 | 5003 | 11010 |
| XXXX | 1000 | 5004 | 11010 |
| XXXX | 1000 | 5005 | 11010 |
| XXXX | 1000 | 5006 | 11010 |
| XXXX | 1000 | 5007 | 11010 |
| XXXX | 1000 | 5008 | 11010 |
| XXXX | 1000 | 5009 | 11010 |
| XXXX | 1000 | 6001 | 11010 |
| XXXX | 1000 | 6002 | 11010 |
| XXXX | 1000 | 6003 | 11010 |
| XXXX | 1000 | 6004 | 11010 |
| XXXX | 1000 | 6005 | 11010 |
| XXXX | 1000 | 6006 | 11010 |
| XXXX | 1000 | 6007 | 11010 |
| XXXX | 1000 | 6008 | 11010 |
| XXXX | 1000 | 6009 | 11010 |
| XXXX | 1000 | 7001 | 11010 |
| XXXX | 1000 | 7002 | 11010 |
| XXXX | 1000 | 7003 | 11010 |
| XXXX | 1000 | 7004 | 11010 |
| XXXX | 1000 | 7005 | 11010 |
| XXXX | 1000 | 7006 | 11010 |
| XXXX | 1000 | 7007 | 11010 |
| XXXX | 1000 | 7008 | 11010 |
| XXXX | 1000 | 7009 | 11010 |
| XXXX | 1000 | 8001 | 11010 |
| XXXX | 2000 | 4006 | 11011 |
| XXXX | 2000 | 4007 | 11011 |
| XXXX | 2000 | 4008 | 11011 |
| XXXX | 2000 | 4009 | 11011 |
| XXXX | 2000 | 5001 | 11011 |
| XXXX | 2000 | 5002 | 11011 |
| XXXX | 2000 | 5003 | 11011 |
| XXXX | 2000 | 5004 | 11011 |
| XXXX | 2000 | 5005 | 11011 |
| XXXX | 2000 | 5006 | 11011 |
| XXXX | 2000 | 5007 | 11011 |
| XXXX | 2000 | 5008 | 11011 |
| XXXX | 2000 | 5009 | 11011 |
| XXXX | 2000 | 6001 | 11011 |
| XXXX | 2000 | 6002 | 11011 |
| XXXX | 2000 | 6003 | 11011 |
| XXXX | 2000 | 6004 | 11011 |
| XXXX | 2000 | 6005 | 11011 |
| XXXX | 2000 | 6006 | 11011 |
| XXXX | 2000 | 6007 | 11011 |
| XXXX | 2000 | 6008 | 11011 |
| XXXX | 2000 | 6009 | 11011 |
| XXXX | 2000 | 7001 | 11011 |
| XXXX | 2000 | 7002 | 11011 |
| XXXX | 2000 | 7003 | 11011 |
| XXXX | 2000 | 7004 | 11011 |
| XXXX | 2000 | 7005 | 11011 |
| XXXX | 2000 | 7006 | 11011 |
| XXXX | 2000 | 7007 | 11011 |
| XXXX | 2000 | 7008 | 11011 |
| XXXX | 2000 | 7009 | 11011 |
| XXXX | 2000 | 8001 | 11011 |
| XXXX | 3000 | 4006 | 11100 |
| XXXX | 3000 | 4007 | 11100 |
| XXXX | 3000 | 4008 | 11100 |
| XXXX | 3000 | 4009 | 11100 |
| XXXX | 3000 | 5001 | 11100 |
| XXXX | 3000 | 5002 | 11100 |
| XXXX | 3000 | 5003 | 11100 |
| XXXX | 3000 | 5004 | 11100 |
| XXXX | 3000 | 5005 | 11100 |
| XXXX | 3000 | 5006 | 11100 |
| XXXX | 3000 | 5007 | 11100 |
| XXXX | 3000 | 5008 | 11100 |
| XXXX | 3000 | 5009 | 11100 |
| XXXX | 3000 | 6001 | 11100 |

TABLE 3-continued

| Window Contents | | | X' |
|---|---|---|---|
| XXXX | 3000 | 6002 | 11100 |
| XXXX | 3000 | 6003 | 11100 |
| XXXX | 3000 | 6004 | 11100 |
| XXXX | 3000 | 6005 | 11100 |
| XXXX | 3000 | 6006 | 11100 |
| XXXX | 3000 | 6007 | 11100 |
| XXXX | 3000 | 6008 | 11100 |
| XXXX | 3000 | 6009 | 11100 |
| XXXX | 3000 | 7001 | 11100 |
| XXXX | 3000 | 7002 | 11100 |
| XXXX | 3000 | 7003 | 11100 |
| XXXX | 3000 | 7004 | 11100 |
| XXXX | 3000 | 7005 | 11100 |
| XXXX | 3000 | 7006 | 11100 |
| XXXX | 3000 | 7007 | 11100 |
| XXXX | 3000 | 7008 | 11100 |
| XXXX | 3000 | 7009 | 11100 |
| XXXX | 3000 | 8001 | 11100 |
| XXXX | 1000 | 8002 | 11101 |
| XXXX | 1000 | 8003 | 11101 |
| XXXX | 1000 | 8004 | 11101 |
| XXXX | 1000 | 8005 | 11101 |
| XXXX | 1000 | 8006 | 11101 |
| XXXX | 1000 | 8007 | 11101 |
| XXXX | 1000 | 8008 | 11101 |
| XXXX | 1000 | 8009 | 11101 |
| XXXX | 1000 | 9001 | 11101 |
| XXXX | 1000 | 9002 | 11101 |
| XXXX | 1000 | 9003 | 11101 |
| XXXX | 1000 | 9004 | 11101 |
| XXXX | 1000 | 9005 | 11101 |
| XXXX | 1000 | 9006 | 11101 |
| XXXX | 1000 | 9007 | 11101 |
| XXXX | 1000 | 9008 | 11101 |
| XXXX | 1000 | 9009 | 11101 |
| XXXX | 1000 | 1000 | 11101 |
| XXXX | 1000 | 2000 | 11101 |
| XXXX | 1000 | 3000 | 11101 |
| XXXX | 2000 | 8002 | 11110 |
| XXXX | 2000 | 8003 | 11110 |
| XXXX | 2000 | 8004 | 11110 |
| XXXX | 2000 | 8005 | 11110 |
| XXXX | 2000 | 8006 | 11110 |
| XXXX | 2000 | 8007 | 11110 |
| XXXX | 2000 | 8008 | 11110 |
| XXXX | 2000 | 8009 | 11110 |
| XXXX | 2000 | 9001 | 11110 |
| XXXX | 2000 | 9002 | 11110 |
| XXXX | 2000 | 9003 | 11110 |
| XXXX | 2000 | 9004 | 11110 |
| XXXX | 2000 | 9005 | 11110 |
| XXXX | 2000 | 9006 | 11110 |
| XXXX | 2000 | 9007 | 11110 |
| XXXX | 2000 | 9008 | 11110 |
| XXXX | 2000 | 9009 | 11110 |
| XXXX | 2000 | 1000 | 11110 |
| XXXX | 2000 | 2000 | 11110 |
| XXXX | 2000 | 3000 | 11110 |
| XXXX | 3000 | 8002 | 11111 |
| XXXX | 3000 | 8003 | 11111 |
| XXXX | 3000 | 8004 | 11111 |
| XXXX | 3000 | 8005 | 11111 |
| XXXX | 3000 | 8006 | 11111 |
| XXXX | 3000 | 8007 | 11111 |
| XXXX | 3000 | 8008 | 11111 |
| XXXX | 3000 | 8009 | 11111 |
| XXXX | 3000 | 9001 | 11111 |
| XXXX | 3000 | 9002 | 11111 |
| XXXX | 3000 | 9003 | 11111 |
| XXXX | 3000 | 9004 | 11111 |
| XXXX | 3000 | 9005 | 11111 |
| XXXX | 3000 | 9006 | 11111 |
| XXXX | 3000 | 9007 | 11111 |
| XXXX | 3000 | 9008 | 11111 |
| XXXX | 3000 | 9009 | 11111 |
| XXXX | 3000 | 1000 | 11111 |
| XXXX | 3000 | 2000 | 11111 |

TABLE 3-continued

| Window Contents | | | X' |
|---|---|---|---|
| XXXX | 3000 | 3000 | 11111 |
| XXXX | 4000 | 0100 | 00000 |
| XXXX | 4000 | 0200 | 00000 |
| XXXX | 4000 | 0300 | 00000 |
| XXXX | 4000 | 0400 | 00000 |
| XXXX | 4000 | 0500 | 00000 |
| XXXX | 4000 | 0600 | 00000 |
| XXXX | 4000 | 0700 | 00000 |
| XXXX | 5000 | 0100 | 00001 |
| XXXX | 5000 | 0200 | 00001 |
| XXXX | 5000 | 0300 | 00001 |
| XXXX | 5000 | 0400 | 00001 |
| XXXX | 5000 | 0500 | 00001 |
| XXXX | 5000 | 0600 | 00001 |
| XXXX | 5000 | 0700 | 00001 |
| XXXX | 6000 | 0100 | 00010 |
| XXXX | 6000 | 0200 | 00010 |
| XXXX | 6000 | 0300 | 00010 |
| XXXX | 6000 | 0400 | 00010 |
| XXXX | 6000 | 0500 | 00010 |
| XXXX | 6000 | 0600 | 00010 |
| XXXX | 6000 | 0700 | 00010 |
| XXXX | 7000 | 0100 | 00011 |
| XXXX | 7000 | 0200 | 00011 |
| XXXX | 7000 | 0300 | 00011 |
| XXXX | 7000 | 0400 | 00011 |
| XXXX | 7000 | 0500 | 00011 |
| XXXX | 7000 | 0600 | 00011 |
| XXXX | 7000 | 0700 | 00011 |
| XXXX | 8000 | 0100 | 00100 |
| XXXX | 8000 | 0200 | 00100 |
| XXXX | 8000 | 0300 | 00100 |
| XXXX | 8000 | 0400 | 00100 |
| XXXX | 8000 | 0500 | 00100 |
| XXXX | 8000 | 0600 | 00100 |
| XXXX | 8000 | 0700 | 00100 |
| XXXX | 9000 | 0100 | 00101 |
| XXXX | 9000 | 0200 | 00101 |
| XXXX | 9000 | 0300 | 00101 |
| XXXX | 9000 | 0400 | 00101 |
| XXXX | 9000 | 0500 | 00101 |
| XXXX | 9000 | 0600 | 00101 |
| XXXX | 9000 | 0700 | 00101 |
| XXXX | 4000 | 0000 | 00110 |
| XXXX | 4000 | 00X0 | 00110 |
| XXXX | 4000 | 000X | 00110 |
| XXXX | 5000 | 0000 | 00111 |
| XXXX | 5000 | 00X0 | 00111 |
| XXXX | 5000 | 000X | 00111 |
| XXXX | 6000 | 0000 | 01000 |
| XXXX | 6000 | 00X0 | 01000 |
| XXXX | 6000 | 000X | 01000 |
| XXXX | 7000 | 0000 | 01001 |
| XXXX | 7000 | 00X0 | 01001 |
| XXXX | 7000 | 000X | 01001 |
| XXXX | 8000 | 0000 | 01010 |
| XXXX | 8000 | 00X0 | 01010 |
| XXXX | 8000 | 000X | 01010 |
| XXXX | 9000 | 0000 | 01011 |
| XXXX | 9000 | 00X0 | 01011 |
| XXXX | 9000 | 000X | 01011 |
| XXXX | 4000 | 1001 | 01100 |
| XXXX | 4000 | 1002 | 01100 |
| XXXX | 4000 | 1003 | 01100 |
| XXXX | 4000 | 1004 | 01100 |
| XXXX | 4000 | 1005 | 01100 |
| XXXX | 4000 | 1006 | 01100 |
| XXXX | 4000 | 1007 | 01100 |
| XXXX | 4000 | 1008 | 01100 |
| XXXX | 4000 | 1009 | 01100 |
| XXXX | 4000 | 2001 | 01100 |
| XXXX | 4000 | 2002 | 01100 |
| XXXX | 4000 | 2003 | 01100 |
| XXXX | 4000 | 2004 | 01100 |
| XXXX | 4000 | 2005 | 01100 |
| XXXX | 4000 | 2006 | 01100 |
| XXXX | 4000 | 2007 | 01100 |

TABLE 3-continued

| Window Contents | | | X' |
|---|---|---|---|
| XXXX | 4000 | 2008 | 01100 |
| XXXX | 4000 | 2009 | 01100 |
| XXXX | 4000 | 3001 | 01100 |
| XXXX | 4000 | 3002 | 01100 |
| XXXX | 4000 | 3003 | 01100 |
| XXXX | 4000 | 3004 | 01100 |
| XXXX | 4000 | 3005 | 01100 |
| XXXX | 4000 | 3006 | 01100 |
| XXXX | 4000 | 3007 | 01100 |
| XXXX | 4000 | 3008 | 01100 |
| XXXX | 4000 | 3009 | 01100 |
| XXXX | 4000 | 4001 | 01100 |
| XXXX | 4000 | 4002 | 01100 |
| XXXX | 4000 | 4003 | 01100 |
| XXXX | 4000 | 4004 | 01100 |
| XXXX | 4000 | 4005 | 01100 |
| XXXX | 5000 | 1001 | 01101 |
| XXXX | 5000 | 1002 | 01101 |
| XXXX | 5000 | 1003 | 01101 |
| XXXX | 5000 | 1004 | 01101 |
| XXXX | 5000 | 1005 | 01101 |
| XXXX | 5000 | 1006 | 01101 |
| XXXX | 5000 | 1007 | 01101 |
| XXXX | 5000 | 1008 | 01101 |
| XXXX | 5000 | 1009 | 01101 |
| XXXX | 5000 | 2001 | 01101 |
| XXXX | 5000 | 2002 | 01101 |
| XXXX | 5000 | 2003 | 01101 |
| XXXX | 5000 | 2004 | 01101 |
| XXXX | 5000 | 2005 | 01101 |
| XXXX | 5000 | 2006 | 01101 |
| XXXX | 5000 | 2007 | 01101 |
| XXXX | 5000 | 2008 | 01101 |
| XXXX | 5000 | 2009 | 01101 |
| XXXX | 5000 | 3001 | 01101 |
| XXXX | 5000 | 3002 | 01101 |
| XXXX | 5000 | 3003 | 01101 |
| XXXX | 5000 | 3004 | 01101 |
| XXXX | 5000 | 3005 | 01101 |
| XXXX | 5000 | 3006 | 01101 |
| XXXX | 5000 | 3007 | 01101 |
| XXXX | 5000 | 3008 | 01101 |
| XXXX | 5000 | 3009 | 01101 |
| XXXX | 5000 | 4001 | 01101 |
| XXXX | 5000 | 4002 | 01101 |
| XXXX | 5000 | 4003 | 01101 |
| XXXX | 5000 | 4004 | 01101 |
| XXXX | 5000 | 4005 | 01101 |
| XXXX | 6000 | 1001 | 01110 |
| XXXX | 6000 | 1002 | 01110 |
| XXXX | 6000 | 1003 | 01110 |
| XXXX | 6000 | 1004 | 01110 |
| XXXX | 6000 | 1005 | 01110 |
| XXXX | 6000 | 1006 | 01110 |
| XXXX | 6000 | 1007 | 01110 |
| XXXX | 6000 | 1008 | 01110 |
| XXXX | 6000 | 1009 | 01110 |
| XXXX | 6000 | 2001 | 01110 |
| XXXX | 6000 | 2002 | 01110 |
| XXXX | 6000 | 2003 | 01110 |
| XXXX | 6000 | 2004 | 01110 |
| XXXX | 6000 | 2005 | 01110 |
| XXXX | 6000 | 2006 | 01110 |
| XXXX | 6000 | 2007 | 01110 |
| XXXX | 6000 | 2008 | 01110 |
| XXXX | 6000 | 2009 | 01110 |
| XXXX | 6000 | 3001 | 01110 |
| XXXX | 6000 | 3002 | 01110 |
| XXXX | 6000 | 3003 | 01110 |
| XXXX | 6000 | 3004 | 01110 |
| XXXX | 6000 | 3005 | 01110 |
| XXXX | 6000 | 3006 | 01110 |
| XXXX | 6000 | 3007 | 01110 |
| XXXX | 6000 | 3008 | 01110 |
| XXXX | 6000 | 3009 | 01110 |
| XXXX | 6000 | 4001 | 01110 |
| XXXX | 6000 | 4002 | 01110 |

TABLE 3-continued

| Window Contents | | | X' |
|---|---|---|---|
| XXXX | 6000 | 4003 | 01110 |
| XXXX | 6000 | 4004 | 01110 |
| XXXX | 6000 | 4005 | 01110 |
| XXXX | 7000 | 1001 | 01111 |
| XXXX | 7000 | 1002 | 01111 |
| XXXX | 7000 | 1003 | 01111 |
| XXXX | 7000 | 1004 | 01111 |
| XXXX | 7000 | 1005 | 01111 |
| XXXX | 7000 | 1006 | 01111 |
| XXXX | 7000 | 1007 | 01111 |
| XXXX | 7000 | 1008 | 01111 |
| XXXX | 7000 | 1009 | 01111 |
| XXXX | 7000 | 2001 | 01111 |
| XXXX | 7000 | 2002 | 01111 |
| XXXX | 7000 | 2003 | 01111 |
| XXXX | 7000 | 2004 | 01111 |
| XXXX | 7000 | 2005 | 01111 |
| XXXX | 7000 | 2006 | 01111 |
| XXXX | 7000 | 2007 | 01111 |
| XXXX | 7000 | 2008 | 01111 |
| XXXX | 7000 | 2009 | 01111 |
| XXXX | 7000 | 3001 | 01111 |
| XXXX | 7000 | 3002 | 01111 |
| XXXX | 7000 | 3003 | 01111 |
| XXXX | 7000 | 3004 | 01111 |
| XXXX | 7000 | 3005 | 01111 |
| XXXX | 7000 | 3006 | 01111 |
| XXXX | 7000 | 3007 | 01111 |
| XXXX | 7000 | 3008 | 01111 |
| XXXX | 7000 | 3009 | 01111 |
| XXXX | 7000 | 4001 | 01111 |
| XXXX | 7000 | 4002 | 01111 |
| XXXX | 7000 | 4003 | 01111 |
| XXXX | 7000 | 4004 | 01111 |
| XXXX | 7000 | 4005 | 01111 |
| XXXX | 8000 | 1001 | 10000 |
| XXXX | 8000 | 1002 | 10000 |
| XXXX | 8000 | 1003 | 10000 |
| XXXX | 8000 | 1004 | 10000 |
| XXXX | 8000 | 1005 | 10000 |
| XXXX | 8000 | 1006 | 10000 |
| XXXX | 8000 | 1007 | 10000 |
| XXXX | 8000 | 1008 | 10000 |
| XXXX | 8000 | 1009 | 10000 |
| XXXX | 8000 | 2001 | 10000 |
| XXXX | 8000 | 2002 | 10000 |
| XXXX | 8000 | 2003 | 10000 |
| XXXX | 8000 | 2004 | 10000 |
| XXXX | 8000 | 2005 | 10000 |
| XXXX | 8000 | 2006 | 10000 |
| XXXX | 8000 | 2007 | 10000 |
| XXXX | 8000 | 2008 | 10000 |
| XXXX | 8000 | 2009 | 10000 |
| XXXX | 8000 | 3001 | 10000 |
| XXXX | 8000 | 3002 | 10000 |
| XXXX | 8000 | 3003 | 10000 |
| XXXX | 8000 | 3004 | 10000 |
| XXXX | 8000 | 3005 | 10000 |
| XXXX | 8000 | 3006 | 10000 |
| XXXX | 8000 | 3007 | 10000 |
| XXXX | 8000 | 3008 | 10000 |
| XXXX | 8000 | 3009 | 10000 |
| XXXX | 8000 | 4001 | 10000 |
| XXXX | 8000 | 4002 | 10000 |
| XXXX | 8000 | 4003 | 10000 |
| XXXX | 8000 | 4004 | 10000 |
| XXXX | 8000 | 4005 | 10000 |
| XXXX | 9000 | 1001 | 10001 |
| XXXX | 9000 | 1002 | 10001 |
| XXXX | 9000 | 1003 | 10001 |
| XXXX | 9000 | 1004 | 10001 |
| XXXX | 9000 | 1005 | 10001 |
| XXXX | 9000 | 1006 | 10001 |
| XXXX | 9000 | 1007 | 10001 |
| XXXX | 9000 | 1008 | 10001 |
| XXXX | 9000 | 1009 | 10001 |
| XXXX | 9000 | 2001 | 10001 |

TABLE 3-continued

| Window Contents | | | X' |
|---|---|---|---|
| XXXX | 9000 | 2002 | 10001 |
| XXXX | 9000 | 2003 | 10001 |
| XXXX | 9000 | 2004 | 10001 |
| XXXX | 9000 | 2005 | 10001 |
| XXXX | 9000 | 2006 | 10001 |
| XXXX | 9000 | 2007 | 10001 |
| XXXX | 9000 | 2008 | 10001 |
| XXXX | 9000 | 2009 | 10001 |
| XXXX | 9000 | 3001 | 10001 |
| XXXX | 9000 | 3002 | 10001 |
| XXXX | 9000 | 3003 | 10001 |
| XXXX | 9000 | 3004 | 10001 |
| XXXX | 9000 | 3005 | 10001 |
| XXXX | 9000 | 3006 | 10001 |
| XXXX | 9000 | 3007 | 10001 |
| XXXX | 9000 | 3008 | 10001 |
| XXXX | 9000 | 3009 | 10001 |
| XXXX | 9000 | 4001 | 10001 |
| XXXX | 9000 | 4002 | 10001 |
| XXXX | 9000 | 4003 | 10001 |
| XXXX | 9000 | 4004 | 10001 |
| XXXX | 9000 | 4005 | 10001 |
| XXXX | 4000 | 4006 | 10010 |
| XXXX | 4000 | 4007 | 10010 |
| XXXX | 4000 | 4008 | 10010 |
| XXXX | 4000 | 4009 | 10010 |
| XXXX | 4000 | 5001 | 10010 |
| XXXX | 4000 | 5002 | 10010 |
| XXXX | 4000 | 5003 | 10010 |
| XXXX | 4000 | 5004 | 10010 |
| XXXX | 4000 | 5005 | 10010 |
| XXXX | 4000 | 5006 | 10010 |
| XXXX | 4000 | 5007 | 10010 |
| XXXX | 4000 | 5008 | 10010 |
| XXXX | 4000 | 5009 | 10010 |
| XXXX | 4000 | 6001 | 10010 |
| XXXX | 4000 | 6002 | 10010 |
| XXXX | 4000 | 6003 | 10010 |
| XXXX | 4000 | 6004 | 10010 |
| XXXX | 4000 | 6005 | 10010 |
| XXXX | 4000 | 6006 | 10010 |
| XXXX | 4000 | 6007 | 10010 |
| XXXX | 4000 | 6008 | 10010 |
| XXXX | 4000 | 6009 | 10010 |
| XXXX | 4000 | 7001 | 10010 |
| XXXX | 4000 | 7002 | 10010 |
| XXXX | 4000 | 7003 | 10010 |
| XXXX | 4000 | 7004 | 10010 |
| XXXX | 4000 | 7005 | 10010 |
| XXXX | 4000 | 7006 | 10010 |
| XXXX | 4000 | 7007 | 10010 |
| XXXX | 4000 | 7008 | 10010 |
| XXXX | 4000 | 7009 | 10010 |
| XXXX | 4000 | 8001 | 10010 |
| XXXX | 5000 | 4006 | 10011 |
| XXXX | 5000 | 4007 | 10011 |
| XXXX | 5000 | 4008 | 10011 |
| XXXX | 5000 | 4009 | 10011 |
| XXXX | 5000 | 5001 | 10011 |
| XXXX | 5000 | 5002 | 10011 |
| XXXX | 5000 | 5003 | 10011 |
| XXXX | 5000 | 5004 | 10011 |
| XXXX | 5000 | 5005 | 10011 |
| XXXX | 5000 | 5006 | 10011 |
| XXXX | 5000 | 5007 | 10011 |
| XXXX | 5000 | 5008 | 10011 |
| XXXX | 5000 | 5009 | 10011 |
| XXXX | 5000 | 6001 | 10011 |
| XXXX | 5000 | 6002 | 10011 |
| XXXX | 5000 | 6003 | 10011 |
| XXXX | 5000 | 6004 | 10011 |
| XXXX | 5000 | 6005 | 10011 |
| XXXX | 5000 | 6006 | 10011 |
| XXXX | 5000 | 6007 | 10011 |
| XXXX | 5000 | 6008 | 10011 |
| XXXX | 5000 | 6009 | 10011 |
| XXXX | 5000 | 7001 | 10011 |

TABLE 3-continued

| Window Contents | | | X' |
|---|---|---|---|
| XXXX | 5000 | 7002 | 10011 |
| XXXX | 5000 | 7003 | 10011 |
| XXXX | 5000 | 7004 | 10011 |
| XXXX | 5000 | 7005 | 10011 |
| XXXX | 5000 | 7006 | 10011 |
| XXXX | 5000 | 7007 | 10011 |
| XXXX | 5000 | 7008 | 10011 |
| XXXX | 5000 | 7009 | 10011 |
| XXXX | 5000 | 8001 | 10011 |
| XXXX | 6000 | 4006 | 10100 |
| XXXX | 6000 | 4007 | 10100 |
| XXXX | 6000 | 4008 | 10100 |
| XXXX | 6000 | 4009 | 10100 |
| XXXX | 6000 | 5001 | 10100 |
| XXXX | 6000 | 5002 | 10100 |
| XXXX | 6000 | 5003 | 10100 |
| XXXX | 6000 | 5004 | 10100 |
| XXXX | 6000 | 5005 | 10100 |
| XXXX | 6000 | 5006 | 10100 |
| XXXX | 6000 | 5007 | 10100 |
| XXXX | 6000 | 5008 | 10100 |
| XXXX | 6000 | 5009 | 10100 |
| XXXX | 6000 | 6001 | 10100 |
| XXXX | 6000 | 6002 | 10100 |
| XXXX | 6000 | 6003 | 10100 |
| XXXX | 6000 | 6004 | 10100 |
| XXXX | 6000 | 6005 | 10100 |
| XXXX | 6000 | 6006 | 10100 |
| XXXX | 6000 | 6007 | 10100 |
| XXXX | 6000 | 6008 | 10100 |
| XXXX | 6000 | 6009 | 10100 |
| XXXX | 6000 | 7001 | 10100 |
| XXXX | 6000 | 7002 | 10100 |
| XXXX | 6000 | 7003 | 10100 |
| XXXX | 6000 | 7004 | 10100 |
| XXXX | 6000 | 7005 | 10100 |
| XXXX | 6000 | 7006 | 10100 |
| XXXX | 6000 | 7007 | 10100 |
| XXXX | 6000 | 7008 | 10100 |
| XXXX | 6000 | 7009 | 10100 |
| XXXX | 6000 | 8001 | 10100 |
| XXXX | 7000 | 4006 | 10101 |
| XXXX | 7000 | 4007 | 10101 |
| XXXX | 7000 | 4008 | 10101 |
| XXXX | 7000 | 4009 | 10101 |
| XXXX | 7000 | 5001 | 10101 |
| XXXX | 7000 | 5002 | 10101 |
| XXXX | 7000 | 5003 | 10101 |
| XXXX | 7000 | 5004 | 10101 |
| XXXX | 7000 | 5005 | 10101 |
| XXXX | 7000 | 5006 | 10101 |
| XXXX | 7000 | 5007 | 10101 |
| XXXX | 7000 | 5008 | 10101 |
| XXXX | 7000 | 5009 | 10101 |
| XXXX | 7000 | 6001 | 10101 |
| XXXX | 7000 | 6002 | 10101 |
| XXXX | 7000 | 6003 | 10101 |
| XXXX | 7000 | 6004 | 10101 |
| XXXX | 7000 | 6005 | 10101 |
| XXXX | 7000 | 6006 | 10101 |
| XXXX | 7000 | 6007 | 10101 |
| XXXX | 7000 | 6008 | 10101 |
| XXXX | 7000 | 6009 | 10101 |
| XXXX | 7000 | 7001 | 10101 |
| XXXX | 7000 | 7002 | 10101 |
| XXXX | 7000 | 7003 | 10101 |
| XXXX | 7000 | 7004 | 10101 |
| XXXX | 7000 | 7005 | 10101 |
| XXXX | 7000 | 7006 | 10101 |
| XXXX | 7000 | 7007 | 10101 |
| XXXX | 7000 | 7008 | 10101 |
| XXXX | 7000 | 7009 | 10101 |
| XXXX | 7000 | 8001 | 10101 |
| XXXX | 8000 | 4006 | 10110 |
| XXXX | 8000 | 4007 | 10110 |
| XXXX | 8000 | 4008 | 10110 |
| XXXX | 8000 | 4009 | 10110 |

TABLE 3-continued

| Window Contents | | | X' |
|---|---|---|---|
| XXXX | 8000 | 5001 | 10110 |
| XXXX | 8000 | 5002 | 10110 |
| XXXX | 8000 | 5003 | 10110 |
| XXXX | 8000 | 5004 | 10110 |
| XXXX | 8000 | 5005 | 10110 |
| XXXX | 8000 | 5006 | 10110 |
| XXXX | 8000 | 5007 | 10110 |
| XXXX | 8000 | 5008 | 10110 |
| XXXX | 8000 | 5009 | 10110 |
| XXXX | 8000 | 6001 | 10110 |
| XXXX | 8000 | 6002 | 10110 |
| XXXX | 8000 | 6003 | 10110 |
| XXXX | 8000 | 6004 | 10110 |
| XXXX | 8000 | 6005 | 10110 |
| XXXX | 8000 | 6006 | 10110 |
| XXXX | 8000 | 6007 | 10110 |
| XXXX | 8000 | 6008 | 10110 |
| XXXX | 8000 | 6009 | 10110 |
| XXXX | 8000 | 7001 | 10110 |
| XXXX | 8000 | 7002 | 10110 |
| XXXX | 8000 | 7003 | 10110 |
| XXXX | 8000 | 7004 | 10110 |
| XXXX | 8000 | 7005 | 10110 |
| XXXX | 8000 | 7006 | 10110 |
| XXXX | 8000 | 7007 | 10110 |
| XXXX | 8000 | 7008 | 10110 |
| XXXX | 8000 | 7009 | 10110 |
| XXXX | 8000 | 8001 | 10110 |
| XXXX | 9000 | 4006 | 10111 |
| XXXX | 9000 | 4007 | 10111 |
| XXXX | 9000 | 4008 | 10111 |
| XXXX | 9000 | 4009 | 10111 |
| XXXX | 9000 | 5001 | 10111 |
| XXXX | 9000 | 5002 | 10111 |
| XXXX | 9000 | 5003 | 10111 |
| XXXX | 9000 | 5004 | 10111 |
| XXXX | 9000 | 5005 | 10111 |
| XXXX | 9000 | 5006 | 10111 |
| XXXX | 9000 | 5007 | 10111 |
| XXXX | 9000 | 5008 | 10111 |
| XXXX | 9000 | 5009 | 10111 |
| XXXX | 9000 | 6001 | 10111 |
| XXXX | 9000 | 6002 | 10111 |
| XXXX | 9000 | 6003 | 10111 |
| XXXX | 9000 | 6004 | 10111 |
| XXXX | 9000 | 6005 | 10111 |
| XXXX | 9000 | 6006 | 10111 |
| XXXX | 9000 | 6007 | 10111 |
| XXXX | 9000 | 6008 | 10111 |
| XXXX | 9000 | 6009 | 10111 |
| XXXX | 9000 | 7001 | 10111 |
| XXXX | 9000 | 7002 | 10111 |
| XXXX | 9000 | 7003 | 10111 |
| XXXX | 9000 | 7004 | 10111 |
| XXXX | 9000 | 7005 | 10111 |
| XXXX | 9000 | 7006 | 10111 |
| XXXX | 9000 | 7007 | 10111 |
| XXXX | 9000 | 7008 | 10111 |
| XXXX | 9000 | 7009 | 10111 |
| XXXX | 9000 | 8001 | 10111 |
| XXXX | 4000 | 8002 | 11000 |
| XXXX | 4000 | 8003 | 11000 |
| XXXX | 4000 | 8004 | 11000 |
| XXXX | 4000 | 8005 | 11000 |
| XXXX | 4000 | 8006 | 11000 |
| XXXX | 4000 | 8007 | 11000 |
| XXXX | 4000 | 8008 | 11000 |
| XXXX | 4000 | 8009 | 11000 |
| XXXX | 4000 | 9001 | 11000 |
| XXXX | 4000 | 9002 | 11000 |
| XXXX | 4000 | 9003 | 11000 |
| XXXX | 4000 | 9004 | 11000 |
| XXXX | 4000 | 9005 | 11000 |
| XXXX | 4000 | 9006 | 11000 |
| XXXX | 4000 | 9007 | 11000 |
| XXXX | 4000 | 9008 | 11000 |
| XXXX | 4000 | 9009 | 11000 |

TABLE 3-continued

| Window Contents | | | X' |
|---|---|---|---|
| XXXX | 4000 | 1000 | 11000 |
| XXXX | 4000 | 2000 | 11000 |
| XXXX | 4000 | 3000 | 11000 |
| XXXX | 5000 | 8002 | 11001 |
| XXXX | 5000 | 8003 | 11001 |
| XXXX | 5000 | 8004 | 11001 |
| XXXX | 5000 | 8005 | 11001 |
| XXXX | 5000 | 8006 | 11001 |
| XXXX | 5000 | 8007 | 11001 |
| XXXX | 5000 | 8008 | 11001 |
| XXXX | 5000 | 8009 | 11001 |
| XXXX | 5000 | 9001 | 11001 |
| XXXX | 5000 | 9002 | 11001 |
| XXXX | 5000 | 9003 | 11001 |
| XXXX | 5000 | 9004 | 11001 |
| XXXX | 5000 | 9005 | 11001 |
| XXXX | 5000 | 9006 | 11001 |
| XXXX | 5000 | 9007 | 11001 |
| XXXX | 5000 | 9008 | 11001 |
| XXXX | 5000 | 9009 | 11001 |
| XXXX | 5000 | 1000 | 11001 |
| XXXX | 5000 | 2000 | 11001 |
| XXXX | 5000 | 3000 | 11001 |
| XXXX | 6000 | 8002 | 11010 |
| XXXX | 6000 | 8003 | 11010 |
| XXXX | 6000 | 8004 | 11010 |
| XXXX | 6000 | 8005 | 11010 |
| XXXX | 6000 | 8006 | 11010 |
| XXXX | 6000 | 8007 | 11010 |
| XXXX | 6000 | 8008 | 11010 |
| XXXX | 6000 | 8009 | 11010 |
| XXXX | 6000 | 9001 | 11010 |
| XXXX | 6000 | 9002 | 11010 |
| XXXX | 6000 | 9003 | 11010 |
| XXXX | 6000 | 9004 | 11010 |
| XXXX | 6000 | 9005 | 11010 |
| XXXX | 6000 | 9006 | 11010 |
| XXXX | 6000 | 9007 | 11010 |
| XXXX | 6000 | 9008 | 11010 |
| XXXX | 6000 | 9009 | 11010 |
| XXXX | 6000 | 1000 | 11010 |
| XXXX | 6000 | 2000 | 11010 |
| XXXX | 6000 | 3000 | 11010 |
| XXXX | 7000 | 8002 | 11011 |
| XXXX | 7000 | 8003 | 11011 |
| XXXX | 7000 | 8004 | 11011 |
| XXXX | 7000 | 8005 | 11011 |
| XXXX | 7000 | 8006 | 11011 |
| XXXX | 7000 | 8007 | 11011 |
| XXXX | 7000 | 8008 | 11011 |
| XXXX | 7000 | 8009 | 11011 |
| XXXX | 7000 | 9001 | 11011 |
| XXXX | 7000 | 9002 | 11011 |
| XXXX | 7000 | 9003 | 11011 |
| XXXX | 7000 | 9004 | 11011 |
| XXXX | 7000 | 9005 | 11011 |
| XXXX | 7000 | 9006 | 11011 |
| XXXX | 7000 | 9007 | 11011 |
| XXXX | 7000 | 9008 | 11011 |
| XXXX | 7000 | 9009 | 11011 |
| XXXX | 7000 | 1000 | 11011 |
| XXXX | 7000 | 2000 | 11011 |
| XXXX | 7000 | 3000 | 11011 |
| XXXX | 8000 | 8002 | 11100 |
| XXXX | 8000 | 8003 | 11100 |
| XXXX | 8000 | 8004 | 11100 |
| XXXX | 8000 | 8005 | 11100 |
| XXXX | 8000 | 8006 | 11100 |
| XXXX | 8000 | 8007 | 11100 |
| XXXX | 8000 | 8008 | 11100 |
| XXXX | 8000 | 8009 | 11100 |
| XXXX | 8000 | 9001 | 11100 |
| XXXX | 8000 | 9002 | 11100 |
| XXXX | 8000 | 9003 | 11100 |
| XXXX | 8000 | 9004 | 11100 |
| XXXX | 8000 | 9005 | 11100 |
| XXXX | 8000 | 9006 | 11100 |

TABLE 3-continued

| Window Contents | | | X' |
|---|---|---|---|
| X X X X | 8 0 0 0 | 9 0 0 7 | 1 1 1 0 0 |
| X X X X | 8 0 0 0 | 9 0 0 8 | 1 1 1 0 0 |
| X X X X | 8 0 0 0 | 9 0 0 9 | 1 1 1 0 0 |
| X X X X | 8 0 0 0 | 1 0 0 0 | 1 1 1 0 0 |
| X X X X | 8 0 0 0 | 2 0 0 0 | 1 1 1 0 0 |
| X X X X | 8 0 0 0 | 3 0 0 0 | 1 1 1 0 0 |
| X X X X | 9 0 0 0 | 8 0 0 2 | 1 1 1 0 1 |
| X X X X | 9 0 0 0 | 8 0 0 3 | 1 1 1 0 1 |
| X X X X | 9 0 0 0 | 8 0 0 4 | 1 1 1 0 1 |
| X X X X | 9 0 0 0 | 8 0 0 5 | 1 1 1 0 1 |
| X X X X | 9 0 0 0 | 8 0 0 6 | 1 1 1 0 1 |
| X X X X | 9 0 0 0 | 8 0 0 7 | 1 1 1 0 1 |
| X X X X | 9 0 0 0 | 8 0 0 8 | 1 1 1 0 1 |
| X X X X | 9 0 0 0 | 8 0 0 9 | 1 1 1 0 1 |
| X X X X | 9 0 0 0 | 9 0 0 1 | 1 1 1 0 1 |
| X X X X | 9 0 0 0 | 9 0 0 2 | 1 1 1 0 1 |
| X X X X | 9 0 0 0 | 9 0 0 3 | 1 1 1 0 1 |
| X X X X | 9 0 0 0 | 9 0 0 4 | 1 1 1 0 1 |
| X X X X | 9 0 0 0 | 9 0 0 5 | 1 1 1 0 1 |
| X X X X | 9 0 0 0 | 9 0 0 6 | 1 1 1 0 1 |
| X X X X | 9 0 0 0 | 9 0 0 7 | 1 1 1 0 1 |
| X X X X | 9 0 0 0 | 9 0 0 8 | 1 1 1 0 1 |
| X X X X | 9 0 0 0 | 9 0 0 9 | 1 1 1 0 1 |
| X X X X | 9 0 0 0 | 1 0 0 0 | 1 1 1 0 1 |
| X X X X | 9 0 0 0 | 2 0 0 0 | 1 1 1 0 1 |
| X X X X | 9 0 0 0 | 3 0 0 0 | 1 1 1 0 1 |
| X X X X | 0 8 0 0 | X X X X | 1 1 1 1 0 |
| X X X X | 0 9 0 0 | X X X X | 1 1 1 1 1 |

7. Encoder Start-up and Shut-down

It should be noted that at the end of a data stream, there is a period of time during which window 704 is not full. For example, referring to FIG. 7, suppose that the code symbols '0200' are the last in the data stream. Thus when decoder 212 attempts to decode code symbols '0200', there are no future code symbols available. What is needed is a way to "shut-down" encoder 204.

Figure 8:
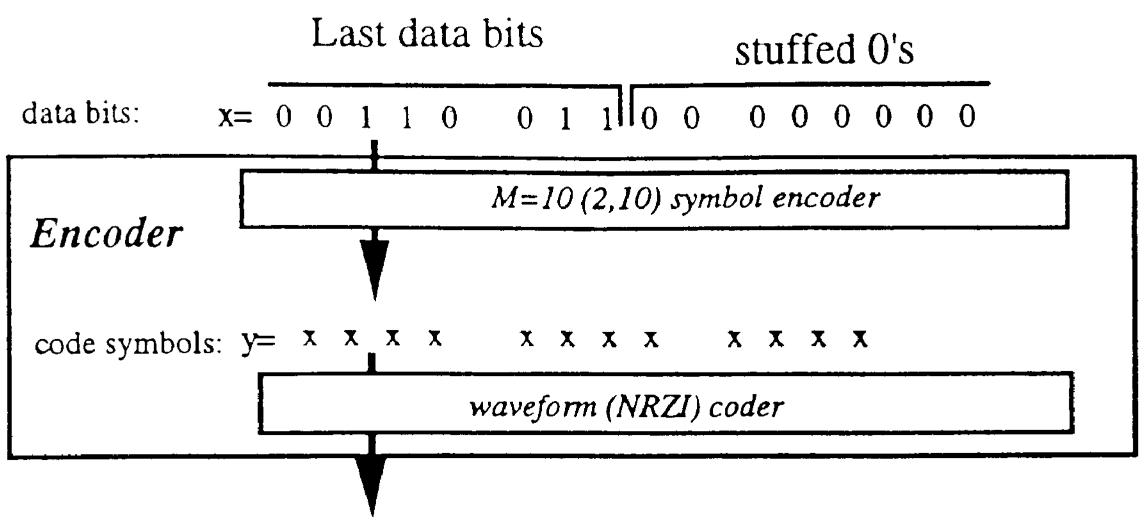
FIG. 8 is a diagram illustrating encoder shut-down.

FIG. 8 is a diagram illustrating encoder shut-down. In a preferred embodiment, encoder 204 is shut-down by appending a block of p=6 "stuffed" bits to the stream of input data bits; in a preferred embodiment, the stuffed bits are all zeros. Because the end of the input data stream may not coincide with the end of a block of p=6 input data bits, the number of stuffed bits varies. When this happens, stuffed bits are also added to complete the incomplete block of input data bits, as shown in FIG. 8.

It should also be noted that at the beginning of a data stream, there is a period of time during which window 704 is not full. For example, referring to FIG. 7, suppose that the code symbols '3003' are the first in the data stream. Thus when decoder 212 attempts to decode code symbols '3003', there are no past code symbols available. What is needed is a way to "start-up" encoder 204.

The present invention provides two ways to start-up encoder 204. In a first embodiment, a block of p=6 stuffed bits is inserted at the beginning of the input data stream; these stuffed bits provide the q=4 past code symbols required by decoder 212; in a preferred embodiment, the stuffed bits are all zeros. In a second embodiment, encoder 204 is started in a state that eliminates the need for past code symbols; in a preferred embodiment, encoder 204 is started in state 3.

8. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for encoding a series of binary input data bits x into an M=10 run-length limited (2,10) code having a rate R=5/4, to produce a series of code symbols y, the method comprising the steps of:

receiving at a seven-state encoder an input data bit set $x_0$–$x_4$ to be encoded into the M=10 run-length limited (2,10) code; and generating in said encoder a code symbol set $y_0$–$y_3$ based on said input data bit set $x_0$–$x_4$ according to the following table:

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |

-continued

| INPUT | OUTPUT | NEXT STATE |
|---|---|---|
| 26 | 0600 | 4 |
| 27 | 0700 | 4 |
| 28 | 0100 | 5 |
| 29 | 0200 | 5 |
| 30 | 0300 | 5 |
| 31 | 0400 | 5 |
| | State 2 | |
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 3 | |
| 0 | 1001 | 0 |
| 1 | 1002 | 0 |
| 2 | 1003 | 0 |
| 3 | 1004 | 0 |
| 4 | 1005 | 0 |
| 5 | 1006 | 0 |
| 6 | 1007 | 0 |
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |

-continued

| INPUT | OUTPUT | NEXT STATE |
|---|---|---|
| 1 | 4007 | 0 |
| 2 | 4008 | 0 |
| 3 | 4009 | 0 |
| 4 | 5001 | 0 |
| 5 | 5002 | 0 |
| 6 | 5003 | 0 |
| 7 | 5004 | 0 |
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |
| 6 | 8008 | 0 |
| 7 | 8009 | 0 |
| 8 | 9001 | 0 |
| 9 | 9002 | 0 |
| 10 | 9003 | 0 |
| 11 | 9004 | 0 |
| 12 | 9005 | 0 |
| 13 | 9006 | 0 |
| 14 | 9007 | 0 |
| 15 | 9008 | 0 |
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |

-continued

| INPUT | OUTPUT | NEXT STATE |
|---|---|---|
| 10 | 8000 | 2 |
| 11 | 9000 | 2 |
| 12 | 4000 | 3 |
| 13 | 5000 | 3 |
| 14 | 6000 | 3 |
| 15 | 7000 | 3 |
| 16 | 8000 | 3 |
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

wherein said code symbol set $y_0$–$y_3$ is generated based on the input data bit set $x_0$–$x_4$ and the current state of said seven-state encoder when said data bit set $x_0$–$x_4$ is received.

2. The method of claim 1, further comprising the step of:

modulating a signal with waveform signal amplitudes to transmit a series of features across the channel, each feature being at a level corresponding to one of said waveform signal amplitudes; and wherein said generating step comprises the steps of:

encoding the binary input data bits into an M=10 (2,10) code having a rate R=5/4 to produce a series of code symbols, each code symbol being at one of M levels, and each pair of non-zero code symbols having a minimum of two and a maximum of ten zeroes therebetween, said encoding step comprising the step of generating a code symbol set $y_0$–$y_3$ for each input data bit set $x_0$–$x_4$ according to the following table:

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |

-continued

| INPUT | OUTPUT | NEXT STATE |
|---|---|---|
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |
| 26 | 0600 | 4 |
| 27 | 0700 | 4 |
| 28 | 0100 | 5 |
| 29 | 0200 | 5 |
| 30 | 0300 | 5 |
| 31 | 0400 | 5 |
| | State 2 | |
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |

-continued

| INPUT | OUTPUT | NEXT STATE |
|---|---|---|
| 31 | 0090 | 1 |
| | State 3 | |
| 0 | 1001 | 0 |
| 1 | 1002 | 0 |
| 2 | 1003 | 0 |
| 3 | 1004 | 0 |
| 4 | 1005 | 0 |
| 5 | 1006 | 0 |
| 6 | 1007 | 0 |
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |
| 1 | 4007 | 0 |
| 2 | 4008 | 0 |
| 3 | 4009 | 0 |
| 4 | 5001 | 0 |
| 5 | 5002 | 0 |
| 6 | 5003 | 0 |
| 7 | 5004 | 0 |
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |

-continued

| INPUT | OUTPUT | NEXT STATE |
|---|---|---|
| 6 | 8008 | 0 |
| 7 | 8009 | 0 |
| 8 | 9001 | 0 |
| 9 | 9002 | 0 |
| 10 | 9003 | 0 |
| 11 | 9004 | 0 |
| 12 | 9005 | 0 |
| 13 | 9006 | 0 |
| 14 | 9007 | 0 |
| 15 | 9008 | 0 |
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |
| 10 | 8000 | 2 |
| 11 | 9000 | 2 |
| 12 | 4000 | 3 |
| 13 | 5000 | 3 |
| 14 | 6000 | 3 |
| 15 | 7000 | 3 |
| 16 | 8000 | 3 |
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

wherein said code symbol set $y_0$–$y_3$ is generated based on the input data bit set $x_0$–$x_4$ and the current state of said seven-state encoder when said data bit set $x_0$–$x_4$ is received; and generating in a waveform encoder waveform signal amplitudes based on said code symbols, wherein each said waveform signal amplitude is generated by modulo ten addition of a current code symbol with a previous waveform signal amplitude.

3. A method for converting binary input data bits into a series of waveform amplitudes, each amplitude being at one of M=10 levels, the method comprising the steps of:

encoding the binary input data bits into an M=10 (2,10) code having a rate R=5/4 to produce a series of code symbols, each code symbol being at one of M levels, and each pair of non-zero code symbols having a minimum of two and a maximum of ten zeroes therebetween, said encoding step comprising the step of generating a code symbol set $y_0$–$y_3$ for each input data bit set $x_0$–$x_4$ according to the following table:

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |
| 26 | 0600 | 4 |
| 27 | 0700 | 4 |
| 28 | 0100 | 5 |
| 29 | 0200 | 5 |
| 30 | 0300 | 5 |
| 31 | 0400 | 5 |
| | State 2 | |

-continued

| INPUT | OUTPUT | NEXT STATE |
|---|---|---|
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 3 | |
| 0 | 1001 | 0 |
| 1 | 1002 | 0 |
| 2 | 1003 | 0 |
| 3 | 1004 | 0 |
| 4 | 1005 | 0 |
| 5 | 1006 | 0 |
| 6 | 1007 | 0 |
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |
| 1 | 4007 | 0 |
| 2 | 4008 | 0 |
| 3 | 4009 | 0 |
| 4 | 5001 | 0 |
| 5 | 5002 | 0 |
| 6 | 5003 | 0 |
| 7 | 5004 | 0 |

-continued

| INPUT | OUTPUT | NEXT STATE |
|---|---|---|
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |
| 6 | 8008 | 0 |
| 7 | 8009 | 0 |
| 8 | 9001 | 0 |
| 9 | 9002 | 0 |
| 10 | 9003 | 0 |
| 11 | 9004 | 0 |
| 12 | 9005 | 0 |
| 13 | 9006 | 0 |
| 14 | 9007 | 0 |
| 15 | 9008 | 0 |
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |
| 10 | 8000 | 2 |
| 11 | 9000 | 2 |
| 12 | 4000 | 3 |
| 13 | 5000 | 3 |
| 14 | 6000 | 3 |
| 15 | 7000 | 3 |
| 16 | 8000 | 3 |

-continued

| INPUT | OUTPUT | NEXT STATE |
|---|---|---|
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

wherein said code symbol set $y_0$–$y_3$ is generated based on the input data bit set $x_0$–$x_4$ and the current state of said seven-state encoder when said data bit set $x_0$–$x_4$ is received; and generating in a waveform encoder waveform signal amplitudes based on said code symbols, wherein each said waveform signal amplitude is generated by modulo ten addition of a current code symbol with a previous waveform signal amplitude.

4. The method of claim 3, further comprising the step of modulating a signal with said waveform signal amplitudes to generate a series of features, each feature being at a level corresponding to a waveform signal amplitude; and wherein said waveform signal amplitudes modulate a write laser and wherein said modulated write laser writes said features onto a storage medium.

5. The method of claim 4, further comprising the steps of:

receiving said features to recover output waveform signal amplitudes;

converting said output waveform signal amplitudes into output code symbols, wherein each output code symbol is at one of ten levels; and decoding said output code symbols to obtain output data bits, wherein said output data bits correspond to the binary input data.

6. The method of claim 5, wherein said step of decoding comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit set for said given code symbol set.

7. The method of claim 6, wherein said lookup table provides an output bit set x' for each sequence of code symbols y' according to the following table:

| Window Contents | | | X' |
|---|---|---|---|
| 000X | 0000 | 0100 | 00000 |
| 000X | 0000 | 0200 | 00000 |
| 000X | 0000 | 0300 | 00000 |
| 000X | 0000 | 0400 | 00000 |
| 000X | 0000 | 0500 | 00000 |
| 000X | 0000 | 0600 | 00000 |
| 000X | 0000 | 0700 | 00000 |
| 00X0 | 0000 | 0100 | 00000 |
| 00X0 | 0000 | 0200 | 00000 |
| 00X0 | 0000 | 0300 | 00000 |
| 00X0 | 0000 | 0400 | 00000 |
| 00X0 | 0000 | 0500 | 00000 |
| 00X0 | 0000 | 0600 | 00000 |
| 00X0 | 0000 | 0700 | 00000 |
| X00X | 0000 | 0100 | 00000 |
| X00X | 0000 | 0200 | 00000 |
| X00X | 0000 | 0300 | 00000 |
| X00X | 0000 | 0400 | 00000 |
| X00X | 0000 | 0500 | 00000 |
| X00X | 0000 | 0600 | 00000 |
| X00X | 0000 | 0700 | 00000 |
| 000X | 0000 | 0000 | 00001 |
| 000X | 0000 | 00X0 | 00001 |
| 000X | 0000 | 000X | 00001 |
| 00X0 | 0000 | 0000 | 00001 |
| 00X0 | 0000 | 00X0 | 00001 |
| 00X0 | 0000 | 000X | 00001 |
| X00X | 0000 | 0000 | 00001 |
| X00X | 0000 | 00X0 | 00001 |
| X00X | 0000 | 000X | 00001 |
| 000X | 0000 | 1001 | 00010 |
| 000X | 0000 | 1002 | 00010 |
| 000X | 0000 | 1003 | 00010 |
| 000X | 0000 | 1004 | 00010 |
| 000X | 0000 | 1005 | 00010 |
| 000X | 0000 | 1006 | 00010 |
| 000X | 0000 | 1007 | 00010 |
| 000X | 0000 | 1008 | 00010 |
| 000X | 0000 | 1009 | 00010 |
| 000X | 0000 | 2001 | 00010 |
| 000X | 0000 | 2002 | 00010 |
| 000X | 0000 | 2003 | 00010 |
| 000X | 0000 | 2004 | 00010 |
| 000X | 0000 | 2005 | 00010 |
| 000X | 0000 | 2006 | 00010 |
| 000X | 0000 | 2007 | 00010 |
| 000X | 0000 | 2008 | 00010 |
| 000X | 0000 | 2009 | 00010 |
| 000X | 0000 | 3001 | 00010 |
| 000X | 0000 | 3002 | 00010 |
| 000X | 0000 | 3003 | 00010 |
| 000X | 0000 | 3004 | 00010 |
| 000X | 0000 | 3005 | 00010 |
| 000X | 0000 | 3006 | 00010 |
| 000X | 0000 | 3007 | 00010 |
| 000X | 0000 | 3008 | 00010 |
| 000X | 0000 | 3009 | 00010 |
| 000X | 0000 | 4001 | 00010 |
| 000X | 0000 | 4002 | 00010 |
| 000X | 0000 | 4003 | 00010 |
| 000X | 0000 | 4004 | 00010 |
| 000X | 0000 | 4005 | 00010 |
| 00X0 | 0000 | 1001 | 00010 |
| 00X0 | 0000 | 1002 | 00010 |
| 00X0 | 0000 | 1003 | 00010 |
| 00X0 | 0000 | 1004 | 00010 |
| 00X0 | 0000 | 1005 | 00010 |
| 00X0 | 0000 | 1006 | 00010 |
| 00X0 | 0000 | 1007 | 00010 |
| 00X0 | 0000 | 1008 | 00010 |
| 00X0 | 0000 | 1009 | 00010 |
| 00X0 | 0000 | 2001 | 00010 |
| 00X0 | 0000 | 2002 | 00010 |
| 00X0 | 0000 | 2003 | 00010 |
| 00X0 | 0000 | 2004 | 00010 |
| 00X0 | 0000 | 2005 | 00010 |
| 00X0 | 0000 | 2006 | 00010 |

-continued

| Window Contents | | | X' |
|---|---|---|---|
| 00X0 | 0000 | 2007 | 00010 |
| 00X0 | 0000 | 2008 | 00010 |
| 00X0 | 0000 | 2009 | 00010 |
| 00X0 | 0000 | 3001 | 00010 |
| 00X0 | 0000 | 3002 | 00010 |
| 00X0 | 0000 | 3003 | 00010 |
| 00X0 | 0000 | 3004 | 00010 |
| 00X0 | 0000 | 3005 | 00010 |
| 00X0 | 0000 | 3006 | 00010 |
| 00X0 | 0000 | 3007 | 00010 |
| 00X0 | 0000 | 3008 | 00010 |
| 00X0 | 0000 | 3009 | 00010 |
| 00X0 | 0000 | 4001 | 00010 |
| 00X0 | 0000 | 4002 | 00010 |
| 00X0 | 0000 | 4003 | 00010 |
| 00X0 | 0000 | 4004 | 00010 |
| 00X0 | 0000 | 4005 | 00010 |
| X00X | 0000 | 1001 | 00010 |
| X00X | 0000 | 1002 | 00010 |
| X00X | 0000 | 1003 | 00010 |
| X00X | 0000 | 1004 | 00010 |
| X00X | 0000 | 1005 | 00010 |
| X00X | 0000 | 1006 | 00010 |
| X00X | 0000 | 1007 | 00010 |
| X00X | 0000 | 1008 | 00010 |
| X00X | 0000 | 1009 | 00010 |
| X00X | 0000 | 2001 | 00010 |
| X00X | 0000 | 2002 | 00010 |
| X00X | 0000 | 2003 | 00010 |
| X00X | 0000 | 2004 | 00010 |
| X00X | 0000 | 2005 | 00010 |
| X00X | 0000 | 2006 | 00010 |
| X00X | 0000 | 2007 | 00010 |
| X00X | 0000 | 2008 | 00010 |
| X00X | 0000 | 2009 | 00010 |
| X00X | 0000 | 3001 | 00010 |
| X00X | 0000 | 3002 | 00010 |
| X00X | 0000 | 3003 | 00010 |
| X00X | 0000 | 3004 | 00010 |
| X00X | 0000 | 3005 | 00010 |
| X00X | 0000 | 3006 | 00010 |
| X00X | 0000 | 3007 | 00010 |
| X00X | 0000 | 3008 | 00010 |
| X00X | 0000 | 3009 | 00010 |
| X00X | 0000 | 4001 | 00010 |
| X00X | 0000 | 4002 | 00010 |
| X00X | 0000 | 4003 | 00010 |
| X00X | 0000 | 4004 | 00010 |
| X00X | 0000 | 4005 | 00010 |
| 000X | 0000 | 4006 | 00011 |
| 000X | 0000 | 4007 | 00011 |
| 000X | 0000 | 4008 | 00011 |
| 000X | 0000 | 4009 | 00011 |
| 000X | 0000 | 5001 | 00011 |
| 000X | 0000 | 5002 | 00011 |
| 000X | 0000 | 5003 | 00011 |
| 000X | 0000 | 5004 | 00011 |
| 000X | 0000 | 5005 | 00011 |
| 000X | 0000 | 5006 | 00011 |
| 000X | 0000 | 5007 | 00011 |
| 000X | 0000 | 5008 | 00011 |
| 000X | 0000 | 5009 | 00011 |
| 000X | 0000 | 6001 | 00011 |
| 000X | 0000 | 6002 | 00011 |
| 000X | 0000 | 6003 | 00011 |
| 000X | 0000 | 6004 | 00011 |
| 000X | 0000 | 6005 | 00011 |
| 000X | 0000 | 6006 | 00011 |
| 000X | 0000 | 6007 | 00011 |
| 000X | 0000 | 6008 | 00011 |
| 000X | 0000 | 6009 | 00011 |
| 000X | 0000 | 7001 | 00011 |
| 000X | 0000 | 7002 | 00011 |
| 000X | 0000 | 7003 | 00011 |
| 000X | 0000 | 7004 | 00011 |
| 000X | 0000 | 7005 | 00011 |
| 000X | 0000 | 7006 | 00011 |

-continued

| Window Contents | | | X' |
|---|---|---|---|
| 0 0 0 X | 0 0 0 0 | 7 0 0 7 | 0 0 0 1 1 |
| 0 0 0 X | 0 0 0 0 | 7 0 0 8 | 0 0 0 1 1 |
| 0 0 0 X | 0 0 0 0 | 7 0 0 9 | 0 0 0 1 1 |
| 0 0 0 X | 0 0 0 0 | 8 0 0 1 | 0 0 0 1 1 |
| 0 0 X 0 | 0 0 0 0 | 4 0 0 6 | 0 0 0 1 1 |
| 0 0 X 0 | 0 0 0 0 | 4 0 0 7 | 0 0 0 1 1 |
| 0 0 X 0 | 0 0 0 0 | 4 0 0 8 | 0 0 0 1 1 |
| 0 0 X 0 | 0 0 0 0 | 4 0 0 9 | 0 0 0 1 1 |
| 0 0 X 0 | 0 0 0 0 | 5 0 0 1 | 0 0 0 1 1 |
| 0 0 X 0 | 0 0 0 0 | 5 0 0 2 | 0 0 0 1 1 |
| 0 0 X 0 | 0 0 0 0 | 5 0 0 3 | 0 0 0 1 1 |
| 0 0 X 0 | 0 0 0 0 | 5 0 0 4 | 0 0 0 1 1 |
| 0 0 X 0 | 0 0 0 0 | 5 0 0 5 | 0 0 0 1 1 |
| 0 0 X 0 | 0 0 0 0 | 5 0 0 6 | 0 0 0 1 1 |
| 0 0 X 0 | 0 0 0 0 | 5 0 0 7 | 0 0 0 1 1 |
| 0 0 X 0 | 0 0 0 0 | 5 0 0 8 | 0 0 0 1 1 |
| 0 0 X 0 | 0 0 0 0 | 5 0 0 9 | 0 0 0 1 1 |
| 0 0 X 0 | 0 0 0 0 | 6 0 0 1 | 0 0 0 1 1 |
| 0 0 X 0 | 0 0 0 0 | 6 0 0 2 | 0 0 0 1 1 |
| 0 0 X 0 | 0 0 0 0 | 6 0 0 3 | 0 0 0 1 1 |
| 0 0 X 0 | 0 0 0 0 | 6 0 0 4 | 0 0 0 1 1 |
| 0 0 X 0 | 0 0 0 0 | 6 0 0 5 | 0 0 0 1 1 |
| 0 0 X 0 | 0 0 0 0 | 6 0 0 6 | 0 0 0 1 1 |
| 0 0 X 0 | 0 0 0 0 | 6 0 0 7 | 0 0 0 1 1 |
| 0 0 X 0 | 0 0 0 0 | 6 0 0 8 | 0 0 0 1 1 |
| 0 0 X 0 | 0 0 0 0 | 6 0 0 9 | 0 0 0 1 1 |
| 0 0 X 0 | 0 0 0 0 | 7 0 0 1 | 0 0 0 1 1 |
| 0 0 X 0 | 0 0 0 0 | 7 0 0 2 | 0 0 0 1 1 |
| 0 0 X 0 | 0 0 0 0 | 7 0 0 3 | 0 0 0 1 1 |
| 0 0 X 0 | 0 0 0 0 | 7 0 0 4 | 0 0 0 1 1 |
| 0 0 X 0 | 0 0 0 0 | 7 0 0 5 | 0 0 0 1 1 |
| 0 0 X 0 | 0 0 0 0 | 7 0 0 6 | 0 0 0 1 1 |
| 0 0 X 0 | 0 0 0 0 | 7 0 0 7 | 0 0 0 1 1 |
| 0 0 X 0 | 0 0 0 0 | 7 0 0 8 | 0 0 0 1 1 |
| 0 0 X 0 | 0 0 0 0 | 7 0 0 9 | 0 0 0 1 1 |
| 0 0 X 0 | 0 0 0 0 | 8 0 0 1 | 0 0 0 1 1 |
| X 0 0 X | 0 0 0 0 | 4 0 0 6 | 0 0 0 1 1 |
| X 0 0 X | 0 0 0 0 | 4 0 0 7 | 0 0 0 1 1 |
| X 0 0 X | 0 0 0 0 | 4 0 0 8 | 0 0 0 1 1 |
| X 0 0 X | 0 0 0 0 | 4 0 0 9 | 0 0 0 1 1 |
| X 0 0 X | 0 0 0 0 | 5 0 0 1 | 0 0 0 1 1 |
| X 0 0 X | 0 0 0 0 | 5 0 0 2 | 0 0 0 1 1 |
| X 0 0 X | 0 0 0 0 | 5 0 0 3 | 0 0 0 1 1 |
| X 0 0 X | 0 0 0 0 | 5 0 0 4 | 0 0 0 1 1 |
| X 0 0 X | 0 0 0 0 | 5 0 0 5 | 0 0 0 1 1 |
| X 0 0 X | 0 0 0 0 | 5 0 0 6 | 0 0 0 1 1 |
| X 0 0 X | 0 0 0 0 | 5 0 0 7 | 0 0 0 1 1 |
| X 0 0 X | 0 0 0 0 | 5 0 0 8 | 0 0 0 1 1 |
| X 0 0 X | 0 0 0 0 | 5 0 0 9 | 0 0 0 1 1 |
| X 0 0 X | 0 0 0 0 | 6 0 0 1 | 0 0 0 1 1 |
| X 0 0 X | 0 0 0 0 | 6 0 0 2 | 0 0 0 1 1 |
| X 0 0 X | 0 0 0 0 | 6 0 0 3 | 0 0 0 1 1 |
| X 0 0 X | 0 0 0 0 | 6 0 0 4 | 0 0 0 1 1 |
| X 0 0 X | 0 0 0 0 | 6 0 0 5 | 0 0 0 1 1 |
| X 0 0 X | 0 0 0 0 | 6 0 0 6 | 0 0 0 1 1 |
| X 0 0 X | 0 0 0 0 | 6 0 0 7 | 0 0 0 1 1 |
| X 0 0 X | 0 0 0 0 | 6 0 0 8 | 0 0 0 1 1 |
| X 0 0 X | 0 0 0 0 | 6 0 0 9 | 0 0 0 1 1 |
| X 0 0 X | 0 0 0 0 | 7 0 0 1 | 0 0 0 1 1 |
| X 0 0 X | 0 0 0 0 | 7 0 0 2 | 0 0 0 1 1 |
| X 0 0 X | 0 0 0 0 | 7 0 0 3 | 0 0 0 1 1 |
| X 0 0 X | 0 0 0 0 | 7 0 0 4 | 0 0 0 1 1 |
| X 0 0 X | 0 0 0 0 | 7 0 0 5 | 0 0 0 1 1 |
| X 0 0 X | 0 0 0 0 | 7 0 0 6 | 0 0 0 1 1 |
| X 0 0 X | 0 0 0 0 | 7 0 0 7 | 0 0 0 1 1 |
| X 0 0 X | 0 0 0 0 | 7 0 0 8 | 0 0 0 1 1 |
| X 0 0 X | 0 0 0 0 | 7 0 0 9 | 0 0 0 1 1 |
| X 0 0 X | 0 0 0 0 | 8 0 0 1 | 0 0 0 1 1 |
| 0 0 0 X | 0 0 0 0 | 8 0 0 2 | 0 0 1 0 0 |
| 0 0 0 X | 0 0 0 0 | 8 0 0 3 | 0 0 1 0 0 |
| 0 0 0 X | 0 0 0 0 | 8 0 0 4 | 0 0 1 0 0 |
| 0 0 0 X | 0 0 0 0 | 8 0 0 5 | 0 0 1 0 0 |
| 0 0 0 X | 0 0 0 0 | 8 0 0 6 | 0 0 1 0 0 |
| 0 0 0 X | 0 0 0 0 | 8 0 0 7 | 0 0 1 0 0 |
| 0 0 0 X | 0 0 0 0 | 8 0 0 8 | 0 0 1 0 0 |
| 0 0 0 X | 0 0 0 0 | 8 0 0 9 | 0 0 1 0 0 |
| 0 0 0 X | 0 0 0 0 | 9 0 0 1 | 0 0 1 0 0 |

-continued

| Window Contents | | | X' |
|---|---|---|---|
| 0 0 0 X | 0 0 0 0 | 9 0 0 2 | 0 0 1 0 0 |
| 0 0 0 X | 0 0 0 0 | 9 0 0 3 | 0 0 1 0 0 |
| 0 0 0 X | 0 0 0 0 | 9 0 0 4 | 0 0 1 0 0 |
| 0 0 0 X | 0 0 0 0 | 9 0 0 5 | 0 0 1 0 0 |
| 0 0 0 X | 0 0 0 0 | 9 0 0 6 | 0 0 1 0 0 |
| 0 0 0 X | 0 0 0 0 | 9 0 0 7 | 0 0 1 0 0 |
| 0 0 0 X | 0 0 0 0 | 9 0 0 8 | 0 0 1 0 0 |
| 0 0 0 X | 0 0 0 0 | 9 0 0 9 | 0 0 1 0 0 |
| 0 0 0 X | 0 0 0 0 | 1 0 0 0 | 0 0 1 0 0 |
| 0 0 0 X | 0 0 0 0 | 2 0 0 0 | 0 0 1 0 0 |
| 0 0 0 X | 0 0 0 0 | 3 0 0 0 | 0 0 1 0 0 |
| 0 0 X 0 | 0 0 0 0 | 8 0 0 2 | 0 0 1 0 0 |
| 0 0 X 0 | 0 0 0 0 | 8 0 0 3 | 0 0 1 0 0 |
| 0 0 X 0 | 0 0 0 0 | 8 0 0 4 | 0 0 1 0 0 |
| 0 0 X 0 | 0 0 0 0 | 8 0 0 5 | 0 0 1 0 0 |
| 0 0 X 0 | 0 0 0 0 | 8 0 0 6 | 0 0 1 0 0 |
| 0 0 X 0 | 0 0 0 0 | 8 0 0 7 | 0 0 1 0 0 |
| 0 0 X 0 | 0 0 0 0 | 8 0 0 8 | 0 0 1 0 0 |
| 0 0 X 0 | 0 0 0 0 | 8 0 0 9 | 0 0 1 0 0 |
| 0 0 X 0 | 0 0 0 0 | 9 0 0 1 | 0 0 1 0 0 |
| 0 0 X 0 | 0 0 0 0 | 9 0 0 2 | 0 0 1 0 0 |
| 0 0 X 0 | 0 0 0 0 | 9 0 0 3 | 0 0 1 0 0 |
| 0 0 X 0 | 0 0 0 0 | 9 0 0 4 | 0 0 1 0 0 |
| 0 0 X 0 | 0 0 0 0 | 9 0 0 5 | 0 0 1 0 0 |
| 0 0 X 0 | 0 0 0 0 | 9 0 0 6 | 0 0 1 0 0 |
| 0 0 X 0 | 0 0 0 0 | 9 0 0 7 | 0 0 1 0 0 |
| 0 0 X 0 | 0 0 0 0 | 9 0 0 8 | 0 0 1 0 0 |
| 0 0 X 0 | 0 0 0 0 | 9 0 0 9 | 0 0 1 0 0 |
| 0 0 X 0 | 0 0 0 0 | 1 0 0 0 | 0 0 1 0 0 |
| 0 0 X 0 | 0 0 0 0 | 2 0 0 0 | 0 0 1 0 0 |
| 0 0 X 0 | 0 0 0 0 | 3 0 0 0 | 0 0 1 0 0 |
| X 0 0 X | 0 0 0 0 | 8 0 0 2 | 0 0 1 0 0 |
| X 0 0 X | 0 0 0 0 | 8 0 0 3 | 0 0 1 0 0 |
| X 0 0 X | 0 0 0 0 | 8 0 0 4 | 0 0 1 0 0 |
| X 0 0 X | 0 0 0 0 | 8 0 0 5 | 0 0 1 0 0 |
| X 0 0 X | 0 0 0 0 | 8 0 0 6 | 0 0 1 0 0 |
| X 0 0 X | 0 0 0 0 | 8 0 0 7 | 0 0 1 0 0 |
| X 0 0 X | 0 0 0 0 | 8 0 0 8 | 0 0 1 0 0 |
| X 0 0 X | 0 0 0 0 | 8 0 0 9 | 0 0 1 0 0 |
| X 0 0 X | 0 0 0 0 | 9 0 0 1 | 0 0 1 0 0 |
| X 0 0 X | 0 0 0 0 | 9 0 0 2 | 0 0 1 0 0 |
| X 0 0 X | 0 0 0 0 | 9 0 0 3 | 0 0 1 0 0 |
| X 0 0 X | 0 0 0 0 | 9 0 0 4 | 0 0 1 0 0 |
| X 0 0 X | 0 0 0 0 | 9 0 0 5 | 0 0 1 0 0 |
| X 0 0 X | 0 0 0 0 | 9 0 0 6 | 0 0 1 0 0 |
| X 0 0 X | 0 0 0 0 | 9 0 0 7 | 0 0 1 0 0 |
| X 0 0 X | 0 0 0 0 | 9 0 0 8 | 0 0 1 0 0 |
| X 0 0 X | 0 0 0 0 | 9 0 0 9 | 0 0 1 0 0 |
| X 0 0 X | 0 0 0 0 | 1 0 0 0 | 0 0 1 0 0 |
| X 0 0 X | 0 0 0 0 | 2 0 0 0 | 0 0 1 0 0 |
| X 0 0 X | 0 0 0 0 | 3 0 0 0 | 0 0 1 0 0 |
| X X X X | 0 0 0 1 | X X X X | 0 0 1 0 1 |
| X X X X | 0 0 0 2 | X X X X | 0 0 1 1 0 |
| X X X X | 0 0 0 3 | X X X X | 0 0 1 1 1 |
| X X X X | 0 0 0 4 | X X X X | 0 1 0 0 0 |
| X X X X | 0 0 0 5 | X X X X | 0 1 0 0 1 |
| X X X X | 0 0 0 6 | X X X X | 0 1 0 1 0 |
| X X X X | 0 0 0 7 | X X X X | 0 1 0 1 1 |
| X X X X | 0 0 0 8 | X X X X | 0 1 1 0 0 |
| X X X X | 0 0 0 9 | X X X X | 0 1 1 0 1 |
| X X X X | 0 0 1 0 | 0 0 0 0 | 0 1 1 1 0 |
| X X X X | 0 0 1 0 | 0 0 X 0 | 0 1 1 1 0 |
| X X X X | 0 0 1 0 | 0 0 0 X | 0 1 1 1 0 |
| X X X X | 0 0 2 0 | 0 0 0 0 | 0 1 1 1 1 |
| X X X X | 0 0 2 0 | 0 0 X 0 | 0 1 1 1 1 |
| X X X X | 0 0 2 0 | 0 0 0 X | 0 1 1 1 1 |
| X X X X | 0 0 3 0 | 0 0 0 0 | 1 0 0 0 0 |
| X X X X | 0 0 3 0 | 0 0 X 0 | 1 0 0 0 0 |
| X X X X | 0 0 3 0 | 0 0 0 X | 1 0 0 0 0 |
| X X X X | 0 0 4 0 | 0 0 0 0 | 1 0 0 0 1 |
| X X X X | 0 0 4 0 | 0 0 X 0 | 1 0 0 0 1 |
| X X X X | 0 0 4 0 | 0 0 0 X | 1 0 0 0 1 |
| X X X X | 0 0 5 0 | 0 0 0 0 | 1 0 0 1 0 |
| X X X X | 0 0 5 0 | 0 0 X 0 | 1 0 0 1 0 |
| X X X X | 0 0 5 0 | 0 0 0 X | 1 0 0 1 0 |
| X X X X | 0 0 6 0 | 0 0 0 0 | 1 0 0 1 1 |
| X X X X | 0 0 6 0 | 0 0 X 0 | 1 0 0 1 1 |

-continued

| Window Contents | | | X' |
|---|---|---|---|
| X X X X | 0 0 6 0 | 0 0 0 X | 1 0 0 1 1 |
| X X X X | 0 0 7 0 | 0 0 0 0 | 1 0 1 0 0 |
| X X X X | 0 0 7 0 | 0 0 X 0 | 1 0 1 0 0 |
| X X X X | 0 0 7 0 | 0 0 0 X | 1 0 1 0 0 |
| X X X X | 0 0 8 0 | 0 0 0 0 | 1 0 1 0 1 |
| X X X X | 0 0 8 0 | 0 0 X 0 | 1 0 1 0 1 |
| X X X X | 0 0 8 0 | 0 0 0 X | 1 0 1 0 1 |
| X X X X | 0 0 9 0 | 0 0 0 0 | 1 0 1 1 0 |
| X X X X | 0 0 9 0 | 0 0 X 0 | 1 0 1 1 0 |
| X X X X | 0 0 9 0 | 0 0 0 X | 1 0 1 1 0 |
| X X X X | 0 0 1 0 | 0 1 0 0 | 1 0 1 1 1 |
| X X X X | 0 0 1 0 | 0 2 0 0 | 1 0 1 1 1 |
| X X X X | 0 0 1 0 | 0 3 0 0 | 1 0 1 1 1 |
| X X X X | 0 0 1 0 | 0 4 0 0 | 1 0 1 1 1 |
| X X X X | 0 0 1 0 | 0 5 0 0 | 1 0 1 1 1 |
| X X X X | 0 0 1 0 | 0 6 0 0 | 1 0 1 1 1 |
| X X X X | 0 0 1 0 | 0 7 0 0 | 1 0 1 1 1 |
| X X X X | 0 0 2 0 | 0 1 0 0 | 1 1 0 0 0 |
| X X X X | 0 0 2 0 | 0 2 0 0 | 1 1 0 0 0 |
| X X X X | 0 0 2 0 | 0 3 0 0 | 1 1 0 0 0 |
| X X X X | 0 0 2 0 | 0 4 0 0 | 1 1 0 0 0 |
| X X X X | 0 0 2 0 | 0 5 0 0 | 1 1 0 0 0 |
| X X X X | 0 0 2 0 | 0 6 0 0 | 1 1 0 0 0 |
| X X X X | 0 0 2 0 | 0 7 0 0 | 1 1 0 0 0 |
| X X X X | 0 0 3 0 | 0 1 0 0 | 1 1 0 0 1 |
| X X X X | 0 0 3 0 | 0 2 0 0 | 1 1 0 0 1 |
| X X X X | 0 0 3 0 | 0 3 0 0 | 1 1 0 0 1 |
| X X X X | 0 0 3 0 | 0 4 0 0 | 1 1 0 0 1 |
| X X X X | 0 0 3 0 | 0 5 0 0 | 1 1 0 0 1 |
| X X X X | 0 0 3 0 | 0 6 0 0 | 1 1 0 0 1 |
| X X X X | 0 0 3 0 | 0 7 0 0 | 1 1 0 0 1 |
| X X X X | 0 0 4 0 | 0 1 0 0 | 1 1 0 1 0 |
| X X X X | 0 0 4 0 | 0 2 0 0 | 1 1 0 1 0 |
| X X X X | 0 0 4 0 | 0 3 0 0 | 1 1 0 1 0 |
| X X X X | 0 0 4 0 | 0 4 0 0 | 1 1 0 1 0 |
| X X X X | 0 0 4 0 | 0 5 0 0 | 1 1 0 1 0 |
| X X X X | 0 0 4 0 | 0 6 0 0 | 1 1 0 1 0 |
| X X X X | 0 0 4 0 | 0 7 0 0 | 1 1 0 1 0 |
| X X X X | 0 0 5 0 | 0 1 0 0 | 1 1 0 1 1 |
| X X X X | 0 0 5 0 | 0 2 0 0 | 1 1 0 1 1 |
| X X X X | 0 0 5 0 | 0 3 0 0 | 1 1 0 1 1 |
| X X X X | 0 0 5 0 | 0 4 0 0 | 1 1 0 1 1 |
| X X X X | 0 0 5 0 | 0 5 0 0 | 1 1 0 1 1 |
| X X X X | 0 0 5 0 | 0 6 0 0 | 1 1 0 1 1 |
| X X X X | 0 0 5 0 | 0 7 0 0 | 1 1 0 1 1 |
| X X X X | 0 0 6 0 | 0 1 0 0 | 1 1 1 0 0 |
| X X X X | 0 0 6 0 | 0 2 0 0 | 1 1 1 0 0 |
| X X X X | 0 0 6 0 | 0 3 0 0 | 1 1 1 0 0 |
| X X X X | 0 0 6 0 | 0 4 0 0 | 1 1 1 0 0 |
| X X X X | 0 0 6 0 | 0 5 0 0 | 1 1 1 0 0 |
| X X X X | 0 0 6 0 | 0 6 0 0 | 1 1 1 0 0 |
| X X X X | 0 0 6 0 | 0 7 0 0 | 1 1 1 0 0 |
| X X X X | 0 0 7 0 | 0 1 0 0 | 1 1 1 0 1 |
| X X X X | 0 0 7 0 | 0 2 0 0 | 1 1 1 0 1 |
| X X X X | 0 0 7 0 | 0 3 0 0 | 1 1 1 0 1 |
| X X X X | 0 0 7 0 | 0 4 0 0 | 1 1 1 0 1 |
| X X X X | 0 0 7 0 | 0 5 0 0 | 1 1 1 0 1 |
| X X X X | 0 0 7 0 | 0 6 0 0 | 1 1 1 0 1 |
| X X X X | 0 0 7 0 | 0 7 0 0 | 1 1 1 0 1 |
| X X X X | 0 0 8 0 | 0 1 0 0 | 1 1 1 1 0 |
| X X X X | 0 0 8 0 | 0 2 0 0 | 1 1 1 1 0 |
| X X X X | 0 0 8 0 | 0 3 0 0 | 1 1 1 1 0 |
| X X X X | 0 0 8 0 | 0 4 0 0 | 1 1 1 1 0 |
| X X X X | 0 0 8 0 | 0 5 0 0 | 1 1 1 1 0 |
| X X X X | 0 0 8 0 | 0 6 0 0 | 1 1 1 1 0 |
| X X X X | 0 0 8 0 | 0 7 0 0 | 1 1 1 1 0 |
| X X X X | 0 0 9 0 | 0 1 0 0 | 1 1 1 1 1 |
| X X X X | 0 0 9 0 | 0 2 0 0 | 1 1 1 1 1 |
| X X X X | 0 0 9 0 | 0 3 0 0 | 1 1 1 1 1 |
| X X X X | 0 0 9 0 | 0 4 0 0 | 1 1 1 1 1 |
| X X X X | 0 0 9 0 | 0 5 0 0 | 1 1 1 1 1 |
| X X X X | 0 0 9 0 | 0 6 0 0 | 1 1 1 1 1 |
| X X X X | 0 0 9 0 | 0 7 0 0 | 1 1 1 1 1 |
| X X X X | 0 1 0 0 | 0 1 0 0 | 0 0 0 0 0 |
| X X X X | 0 1 0 0 | 0 2 0 0 | 0 0 0 0 0 |
| X X X X | 0 1 0 0 | 0 3 0 0 | 0 0 0 0 0 |
| X X X X | 0 1 0 0 | 0 4 0 0 | 0 0 0 0 0 |

-continued

| Window Contents | | | X' |
|---|---|---|---|
| X X X X | 0 1 0 0 | 0 5 0 0 | 0 0 0 0 0 |
| X X X X | 0 1 0 0 | 0 6 0 0 | 0 0 0 0 0 |
| X X X X | 0 1 0 0 | 0 7 0 0 | 0 0 0 0 0 |
| X X X X | 0 2 0 0 | 0 1 0 0 | 0 0 0 0 1 |
| X X X X | 0 2 0 0 | 0 2 0 0 | 0 0 0 0 1 |
| X X X X | 0 2 0 0 | 0 3 0 0 | 0 0 0 0 1 |
| X X X X | 0 2 0 0 | 0 4 0 0 | 0 0 0 0 1 |
| X X X X | 0 2 0 0 | 0 5 0 0 | 0 0 0 0 1 |
| X X X X | 0 2 0 0 | 0 6 0 0 | 0 0 0 0 1 |
| X X X X | 0 2 0 0 | 0 7 0 0 | 0 0 0 0 1 |
| X X X X | 0 3 0 0 | 0 1 0 0 | 0 0 0 1 0 |
| X X X X | 0 3 0 0 | 0 2 0 0 | 0 0 0 1 0 |
| X X X X | 0 3 0 0 | 0 3 0 0 | 0 0 0 1 0 |
| X X X X | 0 3 0 0 | 0 4 0 0 | 0 0 0 1 0 |
| X X X X | 0 3 0 0 | 0 5 0 0 | 0 0 0 1 0 |
| X X X X | 0 3 0 0 | 0 6 0 0 | 0 0 0 1 0 |
| X X X X | 0 3 0 0 | 0 7 0 0 | 0 0 0 1 0 |
| X X X X | 0 4 0 0 | 0 1 0 0 | 0 0 0 1 1 |
| X X X X | 0 4 0 0 | 0 2 0 0 | 0 0 0 1 1 |
| X X X X | 0 4 0 0 | 0 3 0 0 | 0 0 0 1 1 |
| X X X X | 0 4 0 0 | 0 4 0 0 | 0 0 0 1 1 |
| X X X X | 0 4 0 0 | 0 5 0 0 | 0 0 0 1 1 |
| X X X X | 0 4 0 0 | 0 6 0 0 | 0 0 0 1 1 |
| X X X X | 0 4 0 0 | 0 7 0 0 | 0 0 0 1 1 |
| X X X X | 0 5 0 0 | 0 1 0 0 | 0 0 1 0 0 |
| X X X X | 0 5 0 0 | 0 2 0 0 | 0 0 1 0 0 |
| X X X X | 0 5 0 0 | 0 3 0 0 | 0 0 1 0 0 |
| X X X X | 0 5 0 0 | 0 4 0 0 | 0 0 1 0 0 |
| X X X X | 0 5 0 0 | 0 5 0 0 | 0 0 1 0 0 |
| X X X X | 0 5 0 0 | 0 6 0 0 | 0 0 1 0 0 |
| X X X X | 0 5 0 0 | 0 7 0 0 | 0 0 1 0 0 |
| X X X X | 0 6 0 0 | 0 1 0 0 | 0 0 1 0 1 |
| X X X X | 0 6 0 0 | 0 2 0 0 | 0 0 1 0 1 |
| X X X X | 0 6 0 0 | 0 3 0 0 | 0 0 1 0 1 |
| X X X X | 0 6 0 0 | 0 4 0 0 | 0 0 1 0 1 |
| X X X X | 0 6 0 0 | 0 5 0 0 | 0 0 1 0 1 |
| X X X X | 0 6 0 0 | 0 6 0 0 | 0 0 1 0 1 |
| X X X X | 0 6 0 0 | 0 7 0 0 | 0 0 1 0 1 |
| X X X X | 0 7 0 0 | 0 1 0 0 | 0 0 1 1 0 |
| X X X X | 0 7 0 0 | 0 2 0 0 | 0 0 1 1 0 |
| X X X X | 0 7 0 0 | 0 3 0 0 | 0 0 1 1 0 |
| X X X X | 0 7 0 0 | 0 4 0 0 | 0 0 1 1 0 |
| X X X X | 0 7 0 0 | 0 5 0 0 | 0 0 1 1 0 |
| X X X X | 0 7 0 0 | 0 6 0 0 | 0 0 1 1 0 |
| X X X X | 0 7 0 0 | 0 7 0 0 | 0 0 1 1 0 |
| X X X X | 0 1 0 0 | 0 0 0 0 | 0 0 1 1 1 |
| X X X X | 0 1 0 0 | 0 0 X 0 | 0 0 1 1 1 |
| X X X X | 0 1 0 0 | 0 0 0 X | 0 0 1 1 1 |
| X X X X | 0 2 0 0 | 0 0 0 0 | 0 1 0 0 0 |
| X X X X | 0 2 0 0 | 0 0 X 0 | 0 1 0 0 0 |
| X X X X | 0 2 0 0 | 0 0 0 X | 0 1 0 0 0 |
| X X X X | 0 3 0 0 | 0 0 0 0 | 0 1 0 0 1 |
| X X X X | 0 3 0 0 | 0 0 X 0 | 0 1 0 0 1 |
| X X X X | 0 3 0 0 | 0 0 0 X | 0 1 0 0 1 |
| X X X X | 0 4 0 0 | 0 0 0 0 | 0 1 0 1 0 |
| X X X X | 0 4 0 0 | 0 0 X 0 | 0 1 0 1 0 |
| X X X X | 0 4 0 0 | 0 0 0 X | 0 1 0 1 0 |
| X X X X | 0 5 0 0 | 0 0 0 0 | 0 1 0 1 1 |
| X X X X | 0 5 0 0 | 0 0 X 0 | 0 1 0 1 1 |
| X X X X | 0 5 0 0 | 0 0 0 X | 0 1 0 1 1 |
| X X X X | 0 6 0 0 | 0 0 0 0 | 0 1 1 0 0 |
| X X X X | 0 6 0 0 | 0 0 X 0 | 0 1 1 0 0 |
| X X X X | 0 6 0 0 | 0 0 0 X | 0 1 1 0 0 |
| X X X X | 0 7 0 0 | 0 0 0 0 | 0 1 1 0 1 |
| X X X X | 0 7 0 0 | 0 0 X 0 | 0 1 1 0 1 |
| X X X X | 0 7 0 0 | 0 0 0 X | 0 1 1 0 1 |
| X X X X | 0 1 0 0 | 1 0 0 1 | 0 1 1 1 0 |
| X X X X | 0 1 0 0 | 1 0 0 2 | 0 1 1 1 0 |
| X X X X | 0 1 0 0 | 1 0 0 3 | 0 1 1 1 0 |
| X X X X | 0 1 0 0 | 1 0 0 4 | 0 1 1 1 0 |
| X X X X | 0 1 0 0 | 1 0 0 5 | 0 1 1 1 0 |
| X X X X | 0 1 0 0 | 1 0 0 6 | 0 1 1 1 0 |
| X X X X | 0 1 0 0 | 1 0 0 7 | 0 1 1 1 0 |
| X X X X | 0 1 0 0 | 1 0 0 8 | 0 1 1 1 0 |
| X X X X | 0 1 0 0 | 1 0 0 9 | 0 1 1 1 0 |
| X X X X | 0 1 0 0 | 2 0 0 1 | 0 1 1 1 0 |
| X X X X | 0 1 0 0 | 2 0 0 2 | 0 1 1 1 0 |

-continued

| Window Contents | | | X' |
|---|---|---|---|
| XXXX | 0100 | 2003 | 01110 |
| XXXX | 0100 | 2004 | 01110 |
| XXXX | 0100 | 2005 | 01110 |
| XXXX | 0100 | 2006 | 01110 |
| XXXX | 0100 | 2007 | 01110 |
| XXXX | 0100 | 2008 | 01110 |
| XXXX | 0100 | 2009 | 01110 |
| XXXX | 0100 | 3001 | 01110 |
| XXXX | 0100 | 3002 | 01110 |
| XXXX | 0100 | 3003 | 01110 |
| XXXX | 0100 | 3004 | 01110 |
| XXXX | 0100 | 3005 | 01110 |
| XXXX | 0100 | 3006 | 01110 |
| XXXX | 0100 | 3007 | 01110 |
| XXXX | 0100 | 3008 | 01110 |
| XXXX | 0100 | 3009 | 01110 |
| XXXX | 0100 | 4001 | 01110 |
| XXXX | 0100 | 4002 | 01110 |
| XXXX | 0100 | 4003 | 01110 |
| XXXX | 0100 | 4004 | 01110 |
| XXXX | 0100 | 4005 | 01110 |
| XXXX | 0200 | 1001 | 01111 |
| XXXX | 0200 | 1002 | 01111 |
| XXXX | 0200 | 1003 | 01111 |
| XXXX | 0200 | 1004 | 01111 |
| XXXX | 0200 | 1005 | 01111 |
| XXXX | 0200 | 1006 | 01111 |
| XXXX | 0200 | 1007 | 01111 |
| XXXX | 0200 | 1008 | 01111 |
| XXXX | 0200 | 1009 | 01111 |
| XXXX | 0200 | 2001 | 01111 |
| XXXX | 0200 | 2002 | 01111 |
| XXXX | 0200 | 2003 | 01111 |
| XXXX | 0200 | 2004 | 01111 |
| XXXX | 0200 | 2005 | 01111 |
| XXXX | 0200 | 2006 | 01111 |
| XXXX | 0200 | 2007 | 01111 |
| XXXX | 0200 | 2008 | 01111 |
| XXXX | 0200 | 2009 | 01111 |
| XXXX | 0200 | 3001 | 01111 |
| XXXX | 0200 | 3002 | 01111 |
| XXXX | 0200 | 3003 | 01111 |
| XXXX | 0200 | 3004 | 01111 |
| XXXX | 0200 | 3005 | 01111 |
| XXXX | 0200 | 3006 | 01111 |
| XXXX | 0200 | 3007 | 01111 |
| XXXX | 0200 | 3008 | 01111 |
| XXXX | 0200 | 3009 | 01111 |
| XXXX | 0200 | 4001 | 01111 |
| XXXX | 0200 | 4002 | 01111 |
| XXXX | 0200 | 4003 | 01111 |
| XXXX | 0200 | 4004 | 01111 |
| XXXX | 0200 | 4005 | 01111 |
| XXXX | 0300 | 1001 | 10000 |
| XXXX | 0300 | 1002 | 10000 |
| XXXX | 0300 | 1003 | 10000 |
| XXXX | 0300 | 1004 | 10000 |
| XXXX | 0300 | 1005 | 10000 |
| XXXX | 0300 | 1006 | 10000 |
| XXXX | 0300 | 1007 | 10000 |
| XXXX | 0300 | 1008 | 10000 |
| XXXX | 0300 | 1009 | 10000 |
| XXXX | 0300 | 2001 | 10000 |
| XXXX | 0300 | 2002 | 10000 |
| XXXX | 0300 | 2003 | 10000 |
| XXXX | 0300 | 2004 | 10000 |
| XXXX | 0300 | 2005 | 10000 |
| XXXX | 0300 | 2006 | 10000 |
| XXXX | 0300 | 2007 | 10000 |
| XXXX | 0300 | 2008 | 10000 |
| XXXX | 0300 | 2009 | 10000 |
| XXXX | 0300 | 3001 | 10000 |
| XXXX | 0300 | 3002 | 10000 |
| XXXX | 0300 | 3003 | 10000 |
| XXXX | 0300 | 3004 | 10000 |
| XXXX | 0300 | 3005 | 10000 |
| XXXX | 0300 | 3006 | 10000 |

-continued

| Window Contents | | | X' |
|---|---|---|---|
| XXXX | 0300 | 3007 | 10000 |
| XXXX | 0300 | 3008 | 10000 |
| XXXX | 0300 | 3009 | 10000 |
| XXXX | 0300 | 4001 | 10000 |
| XXXX | 0300 | 4002 | 10000 |
| XXXX | 0300 | 4003 | 10000 |
| XXXX | 0300 | 4004 | 10000 |
| XXXX | 0300 | 4005 | 10000 |
| XXXX | 0400 | 1001 | 10001 |
| XXXX | 0400 | 1002 | 10001 |
| XXXX | 0400 | 1003 | 10001 |
| XXXX | 0400 | 1004 | 10001 |
| XXXX | 0400 | 1005 | 10001 |
| XXXX | 0400 | 1006 | 10001 |
| XXXX | 0400 | 1007 | 10001 |
| XXXX | 0400 | 1008 | 10001 |
| XXXX | 0400 | 1009 | 10001 |
| XXXX | 0400 | 2001 | 10001 |
| XXXX | 0400 | 2002 | 10001 |
| XXXX | 0400 | 2003 | 10001 |
| XXXX | 0400 | 2004 | 10001 |
| XXXX | 0400 | 2005 | 10001 |
| XXXX | 0400 | 2006 | 10001 |
| XXXX | 0400 | 2007 | 10001 |
| XXXX | 0400 | 2008 | 10001 |
| XXXX | 0400 | 2009 | 10001 |
| XXXX | 0400 | 3001 | 10001 |
| XXXX | 0400 | 3002 | 10001 |
| XXXX | 0400 | 3003 | 10001 |
| XXXX | 0400 | 3004 | 10001 |
| XXXX | 0400 | 3005 | 10001 |
| XXXX | 0400 | 3006 | 10001 |
| XXXX | 0400 | 3007 | 10001 |
| XXXX | 0400 | 3008 | 10001 |
| XXXX | 0400 | 3009 | 10001 |
| XXXX | 0400 | 4001 | 10001 |
| XXXX | 0400 | 4002 | 10001 |
| XXXX | 0400 | 4003 | 10001 |
| XXXX | 0400 | 4004 | 10001 |
| XXXX | 0400 | 4005 | 10001 |
| XXXX | 0500 | 1001 | 10010 |
| XXXX | 0500 | 1002 | 10010 |
| XXXX | 0500 | 1003 | 10010 |
| XXXX | 0500 | 1004 | 10010 |
| XXXX | 0500 | 1005 | 10010 |
| XXXX | 0500 | 1006 | 10010 |
| XXXX | 0500 | 1007 | 10010 |
| XXXX | 0500 | 1008 | 10010 |
| XXXX | 0500 | 1009 | 10010 |
| XXXX | 0500 | 2001 | 10010 |
| XXXX | 0500 | 2002 | 10010 |
| XXXX | 0500 | 2003 | 10010 |
| XXXX | 0500 | 2004 | 10010 |
| XXXX | 0500 | 2005 | 10010 |
| XXXX | 0500 | 2006 | 10010 |
| XXXX | 0500 | 2007 | 10010 |
| XXXX | 0500 | 2008 | 10010 |
| XXXX | 0500 | 2009 | 10010 |
| XXXX | 0500 | 3001 | 10010 |
| XXXX | 0500 | 3002 | 10010 |
| XXXX | 0500 | 3003 | 10010 |
| XXXX | 0500 | 3004 | 10010 |
| XXXX | 0500 | 3005 | 10010 |
| XXXX | 0500 | 3006 | 10010 |
| XXXX | 0500 | 3007 | 10010 |
| XXXX | 0500 | 3008 | 10010 |
| XXXX | 0500 | 3009 | 10010 |
| XXXX | 0500 | 4001 | 10010 |
| XXXX | 0500 | 4002 | 10010 |
| XXXX | 0500 | 4003 | 10010 |
| XXXX | 0500 | 4004 | 10010 |
| XXXX | 0500 | 4005 | 10010 |
| XXXX | 0600 | 1001 | 10011 |
| XXXX | 0600 | 1002 | 10011 |
| XXXX | 0600 | 1003 | 10011 |
| XXXX | 0600 | 1004 | 10011 |
| XXXX | 0600 | 1005 | 10011 |

-continued

| Window Contents | | | X' |
|---|---|---|---|
| XXXX | 0600 | 1006 | 10011 |
| XXXX | 0600 | 1007 | 10011 |
| XXXX | 0600 | 1008 | 10011 |
| XXXX | 0600 | 1009 | 10011 |
| XXXX | 0600 | 2001 | 10011 |
| XXXX | 0600 | 2002 | 10011 |
| XXXX | 0600 | 2003 | 10011 |
| XXXX | 0600 | 2004 | 10011 |
| XXXX | 0600 | 2005 | 10011 |
| XXXX | 0600 | 2006 | 10011 |
| XXXX | 0600 | 2007 | 10011 |
| XXXX | 0600 | 2008 | 10011 |
| XXXX | 0600 | 2009 | 10011 |
| XXXX | 0600 | 3001 | 10011 |
| XXXX | 0600 | 3002 | 10011 |
| XXXX | 0600 | 3003 | 10011 |
| XXXX | 0600 | 3004 | 10011 |
| XXXX | 0600 | 3005 | 10011 |
| XXXX | 0600 | 3006 | 10011 |
| XXXX | 0600 | 3007 | 10011 |
| XXXX | 0600 | 3008 | 10011 |
| XXXX | 0600 | 3009 | 10011 |
| XXXX | 0600 | 4001 | 10011 |
| XXXX | 0600 | 4002 | 10011 |
| XXXX | 0600 | 4003 | 10011 |
| XXXX | 0600 | 4004 | 10011 |
| XXXX | 0600 | 4005 | 10011 |
| XXXX | 0700 | 1001 | 10100 |
| XXXX | 0700 | 1002 | 10100 |
| XXXX | 0700 | 1003 | 10100 |
| XXXX | 0700 | 1004 | 10100 |
| XXXX | 0700 | 1005 | 10100 |
| XXXX | 0700 | 1006 | 10100 |
| XXXX | 0700 | 1007 | 10100 |
| XXXX | 0700 | 1008 | 10100 |
| XXXX | 0700 | 1009 | 10100 |
| XXXX | 0700 | 2001 | 10100 |
| XXXX | 0700 | 2002 | 10100 |
| XXXX | 0700 | 2003 | 10100 |
| XXXX | 0700 | 2004 | 10100 |
| XXXX | 0700 | 2005 | 10100 |
| XXXX | 0700 | 2006 | 10100 |
| XXXX | 0700 | 2007 | 10100 |
| XXXX | 0700 | 2008 | 10100 |
| XXXX | 0700 | 2009 | 10100 |
| XXXX | 0700 | 3001 | 10100 |
| XXXX | 0700 | 3002 | 10100 |
| XXXX | 0700 | 3003 | 10100 |
| XXXX | 0700 | 3004 | 10100 |
| XXXX | 0700 | 3005 | 10100 |
| XXXX | 0700 | 3006 | 10100 |
| XXXX | 0700 | 3007 | 10100 |
| XXXX | 0700 | 3008 | 10100 |
| XXXX | 0700 | 3009 | 10100 |
| XXXX | 0700 | 4001 | 10100 |
| XXXX | 0700 | 4002 | 10100 |
| XXXX | 0700 | 4003 | 10100 |
| XXXX | 0700 | 4004 | 10100 |
| XXXX | 0700 | 4005 | 10100 |
| XXXX | 0100 | 4006 | 10101 |
| XXXX | 0100 | 4007 | 10101 |
| XXXX | 0100 | 4008 | 10101 |
| XXXX | 0100 | 4009 | 10101 |
| XXXX | 0100 | 5001 | 10101 |
| XXXX | 0100 | 5002 | 10101 |
| XXXX | 0100 | 5003 | 10101 |
| XXXX | 0100 | 5004 | 10101 |
| XXXX | 0100 | 5005 | 10101 |
| XXXX | 0100 | 5006 | 10101 |
| XXXX | 0100 | 5007 | 10101 |
| XXXX | 0100 | 5008 | 10101 |
| XXXX | 0100 | 5009 | 10101 |
| XXXX | 0100 | 6001 | 10101 |
| XXXX | 0100 | 6002 | 10101 |
| XXXX | 0100 | 6003 | 10101 |
| XXXX | 0100 | 6004 | 10101 |
| XXXX | 0100 | 6005 | 10101 |

-continued

| Window Contents | | | X' |
|---|---|---|---|
| XXXX | 0100 | 6006 | 10101 |
| XXXX | 0100 | 6007 | 10101 |
| XXXX | 0100 | 6008 | 10101 |
| XXXX | 0100 | 6009 | 10101 |
| XXXX | 0100 | 7001 | 10101 |
| XXXX | 0100 | 7002 | 10101 |
| XXXX | 0100 | 7003 | 10101 |
| XXXX | 0100 | 7004 | 10101 |
| XXXX | 0100 | 7005 | 10101 |
| XXXX | 0100 | 7006 | 10101 |
| XXXX | 0100 | 7007 | 10101 |
| XXXX | 0100 | 7008 | 10101 |
| XXXX | 0100 | 7009 | 10101 |
| XXXX | 0100 | 8001 | 10101 |
| XXXX | 0200 | 4006 | 10110 |
| XXXX | 0200 | 4007 | 10110 |
| XXXX | 0200 | 4008 | 10110 |
| XXXX | 0200 | 4009 | 10110 |
| XXXX | 0200 | 5001 | 10110 |
| XXXX | 0200 | 5002 | 10110 |
| XXXX | 0200 | 5003 | 10110 |
| XXXX | 0200 | 5004 | 10110 |
| XXXX | 0200 | 5005 | 10110 |
| XXXX | 0200 | 5006 | 10110 |
| XXXX | 0200 | 5007 | 10110 |
| XXXX | 0200 | 5008 | 10110 |
| XXXX | 0200 | 5009 | 10110 |
| XXXX | 0200 | 6001 | 10110 |
| XXXX | 0200 | 6002 | 10110 |
| XXXX | 0200 | 6003 | 10110 |
| XXXX | 0200 | 6004 | 10110 |
| XXXX | 0200 | 6005 | 10110 |
| XXXX | 0200 | 6006 | 10110 |
| XXXX | 0200 | 6007 | 10110 |
| XXXX | 0200 | 6008 | 10110 |
| XXXX | 0200 | 6009 | 10110 |
| XXXX | 0200 | 7001 | 10110 |
| XXXX | 0200 | 7002 | 10110 |
| XXXX | 0200 | 7003 | 10110 |
| XXXX | 0200 | 7004 | 10110 |
| XXXX | 0200 | 7005 | 10110 |
| XXXX | 0200 | 7006 | 10110 |
| XXXX | 0200 | 7007 | 10110 |
| XXXX | 0200 | 7008 | 10110 |
| XXXX | 0200 | 7009 | 10110 |
| XXXX | 0200 | 8001 | 10110 |
| XXXX | 0300 | 4006 | 10111 |
| XXXX | 0300 | 4007 | 10111 |
| XXXX | 0300 | 4008 | 10111 |
| XXXX | 0300 | 4009 | 10111 |
| XXXX | 0300 | 5001 | 10111 |
| XXXX | 0300 | 5002 | 10111 |
| XXXX | 0300 | 5003 | 10111 |
| XXXX | 0300 | 5004 | 10111 |
| XXXX | 0300 | 5005 | 10111 |
| XXXX | 0300 | 5006 | 10111 |
| XXXX | 0300 | 5007 | 10111 |
| XXXX | 0300 | 5008 | 10111 |
| XXXX | 0300 | 5009 | 10111 |
| XXXX | 0300 | 6001 | 10111 |
| XXXX | 0300 | 6002 | 10111 |
| XXXX | 0300 | 6003 | 10111 |
| XXXX | 0300 | 6004 | 10111 |
| XXXX | 0300 | 6005 | 10111 |
| XXXX | 0300 | 6006 | 10111 |
| XXXX | 0300 | 6007 | 10111 |
| XXXX | 0300 | 6008 | 10111 |
| XXXX | 0300 | 6009 | 10111 |
| XXXX | 0300 | 7001 | 10111 |
| XXXX | 0300 | 7002 | 10111 |
| XXXX | 0300 | 7003 | 10111 |
| XXXX | 0300 | 7004 | 10111 |
| XXXX | 0300 | 7005 | 10111 |
| XXXX | 0300 | 7006 | 10111 |
| XXXX | 0300 | 7007 | 10111 |
| XXXX | 0300 | 7008 | 10111 |
| XXXX | 0300 | 7009 | 10111 |

-continued

| Window Contents | | | X' |
|---|---|---|---|
| XXXX | 0300 | 8001 | 10111 |
| XXXX | 0400 | 4006 | 11000 |
| XXXX | 0400 | 4007 | 11000 |
| XXXX | 0400 | 4008 | 11000 |
| XXXX | 0400 | 4009 | 11000 |
| XXXX | 0400 | 5001 | 11000 |
| XXXX | 0400 | 5002 | 11000 |
| XXXX | 0400 | 5003 | 11000 |
| XXXX | 0400 | 5004 | 11000 |
| XXXX | 0400 | 5005 | 11000 |
| XXXX | 0400 | 5006 | 11000 |
| XXXX | 0400 | 5007 | 11000 |
| XXXX | 0400 | 5008 | 11000 |
| XXXX | 0400 | 5009 | 11000 |
| XXXX | 0400 | 6001 | 11000 |
| XXXX | 0400 | 6002 | 11000 |
| XXXX | 0400 | 6003 | 11000 |
| XXXX | 0400 | 6004 | 11000 |
| XXXX | 0400 | 6005 | 11000 |
| XXXX | 0400 | 6006 | 11000 |
| XXXX | 0400 | 6007 | 11000 |
| XXXX | 0400 | 6008 | 11000 |
| XXXX | 0400 | 6009 | 11000 |
| XXXX | 0400 | 7001 | 11000 |
| XXXX | 0400 | 7002 | 11000 |
| XXXX | 0400 | 7003 | 11000 |
| XXXX | 0400 | 7004 | 11000 |
| XXXX | 0400 | 7005 | 11000 |
| XXXX | 0400 | 7006 | 11000 |
| XXXX | 0400 | 7007 | 11000 |
| XXXX | 0400 | 7008 | 11000 |
| XXXX | 0400 | 7009 | 11000 |
| XXXX | 0400 | 8001 | 11000 |
| XXXX | 0500 | 4006 | 11001 |
| XXXX | 0500 | 4007 | 11001 |
| XXXX | 0500 | 4008 | 11001 |
| XXXX | 0500 | 4009 | 11001 |
| XXXX | 0500 | 5001 | 11001 |
| XXXX | 0500 | 5002 | 11001 |
| XXXX | 0500 | 5003 | 11001 |
| XXXX | 0500 | 5004 | 11001 |
| XXXX | 0500 | 5005 | 11001 |
| XXXX | 0500 | 5006 | 11001 |
| XXXX | 0500 | 5007 | 11001 |
| XXXX | 0500 | 5008 | 11001 |
| XXXX | 0500 | 5009 | 11001 |
| XXXX | 0500 | 6001 | 11001 |
| XXXX | 0500 | 6002 | 11001 |
| XXXX | 0500 | 6003 | 11001 |
| XXXX | 0500 | 6004 | 11001 |
| XXXX | 0500 | 6005 | 11001 |
| XXXX | 0500 | 6006 | 11001 |
| XXXX | 0500 | 6007 | 11001 |
| XXXX | 0500 | 6008 | 11001 |
| XXXX | 0500 | 6009 | 11001 |
| XXXX | 0500 | 7001 | 11001 |
| XXXX | 0500 | 7002 | 11001 |
| XXXX | 0500 | 7003 | 11001 |
| XXXX | 0500 | 7004 | 11001 |
| XXXX | 0500 | 7005 | 11001 |
| XXXX | 0500 | 7006 | 11001 |
| XXXX | 0500 | 7007 | 11001 |
| XXXX | 0500 | 7008 | 11001 |
| XXXX | 0500 | 7009 | 11001 |
| XXXX | 0500 | 8001 | 11001 |
| XXXX | 0600 | 4006 | 11010 |
| XXXX | 0600 | 4007 | 11010 |
| XXXX | 0600 | 4008 | 11010 |
| XXXX | 0600 | 4009 | 11010 |
| XXXX | 0600 | 5001 | 11010 |
| XXXX | 0600 | 5002 | 11010 |
| XXXX | 0600 | 5003 | 11010 |
| XXXX | 0600 | 5004 | 11010 |
| XXXX | 0600 | 5005 | 11010 |
| XXXX | 0600 | 5006 | 11010 |
| XXXX | 0600 | 5007 | 11010 |
| XXXX | 0600 | 5008 | 11010 |

-continued

| Window Contents | | | X' |
|---|---|---|---|
| XXXX | 0600 | 5009 | 11010 |
| XXXX | 0600 | 6001 | 11010 |
| XXXX | 0600 | 6002 | 11010 |
| XXXX | 0600 | 6003 | 11010 |
| XXXX | 0600 | 6004 | 11010 |
| XXXX | 0600 | 6005 | 11010 |
| XXXX | 0600 | 6006 | 11010 |
| XXXX | 0600 | 6007 | 11010 |
| XXXX | 0600 | 6008 | 11010 |
| XXXX | 0600 | 6009 | 11010 |
| XXXX | 0600 | 7001 | 11010 |
| XXXX | 0600 | 7002 | 11010 |
| XXXX | 0600 | 7003 | 11010 |
| XXXX | 0600 | 7004 | 11010 |
| XXXX | 0600 | 7005 | 11010 |
| XXXX | 0600 | 7006 | 11010 |
| XXXX | 0600 | 7007 | 11010 |
| XXXX | 0600 | 7008 | 11010 |
| XXXX | 0600 | 7009 | 11010 |
| XXXX | 0600 | 8001 | 11010 |
| XXXX | 0700 | 4006 | 11011 |
| XXXX | 0700 | 4007 | 11011 |
| XXXX | 0700 | 4008 | 11011 |
| XXXX | 0700 | 4009 | 11011 |
| XXXX | 0700 | 5001 | 11011 |
| XXXX | 0700 | 5002 | 11011 |
| XXXX | 0700 | 5003 | 11011 |
| XXXX | 0700 | 5004 | 11011 |
| XXXX | 0700 | 5005 | 11011 |
| XXXX | 0700 | 5006 | 11011 |
| XXXX | 0700 | 5007 | 11011 |
| XXXX | 0700 | 5008 | 11011 |
| XXXX | 0700 | 5009 | 11011 |
| XXXX | 0700 | 6001 | 11011 |
| XXXX | 0700 | 6002 | 11011 |
| XXXX | 0700 | 6003 | 11011 |
| XXXX | 0700 | 6004 | 11011 |
| XXXX | 0700 | 6005 | 11011 |
| XXXX | 0700 | 6006 | 11011 |
| XXXX | 0700 | 6007 | 11011 |
| XXXX | 0700 | 6008 | 11011 |
| XXXX | 0700 | 6009 | 11011 |
| XXXX | 0700 | 7001 | 11011 |
| XXXX | 0700 | 7002 | 11011 |
| XXXX | 0700 | 7003 | 11011 |
| XXXX | 0700 | 7004 | 11011 |
| XXXX | 0700 | 7005 | 11011 |
| XXXX | 0700 | 7006 | 11011 |
| XXXX | 0700 | 7007 | 11011 |
| XXXX | 0700 | 7008 | 11011 |
| XXXX | 0700 | 7009 | 11011 |
| XXXX | 0700 | 8001 | 11011 |
| XXXX | 0100 | 8002 | 11100 |
| XXXX | 0100 | 8003 | 11100 |
| XXXX | 0100 | 8004 | 11100 |
| XXXX | 0100 | 8005 | 11100 |
| XXXX | 0100 | 8006 | 11100 |
| XXXX | 0100 | 8007 | 11100 |
| XXXX | 0100 | 8008 | 11100 |
| XXXX | 0100 | 8009 | 11100 |
| XXXX | 0100 | 9001 | 11100 |
| XXXX | 0100 | 9002 | 11100 |
| XXXX | 0100 | 9003 | 11100 |
| XXXX | 0100 | 9004 | 11100 |
| XXXX | 0100 | 9005 | 11100 |
| XXXX | 0100 | 9006 | 11100 |
| XXXX | 0100 | 9007 | 11100 |
| XXXX | 0100 | 9008 | 11100 |
| XXXX | 0100 | 9009 | 11100 |
| XXXX | 0100 | 1000 | 11100 |
| XXXX | 0100 | 2000 | 11100 |
| XXXX | 0100 | 3000 | 11100 |
| XXXX | 0200 | 8002 | 11101 |
| XXXX | 0200 | 8003 | 11101 |
| XXXX | 0200 | 8004 | 11101 |
| XXXX | 0200 | 8005 | 11101 |
| XXXX | 0200 | 8006 | 11101 |

-continued

| Window Contents | | | X' |
|---|---|---|---|
| XXXX | 0200 | 8007 | 11101 |
| XXXX | 0200 | 8008 | 11101 |
| XXXX | 0200 | 8009 | 11101 |
| XXXX | 0200 | 9001 | 11101 |
| XXXX | 0200 | 9002 | 11101 |
| XXXX | 0200 | 9003 | 11101 |
| XXXX | 0200 | 9004 | 11101 |
| XXXX | 0200 | 9005 | 11101 |
| XXXX | 0200 | 9006 | 11101 |
| XXXX | 0200 | 9007 | 11101 |
| XXXX | 0200 | 9008 | 11101 |
| XXXX | 0200 | 9009 | 11101 |
| XXXX | 0200 | 1000 | 11101 |
| XXXX | 0200 | 2000 | 11101 |
| XXXX | 0200 | 3000 | 11101 |
| XXXX | 0300 | 8002 | 11110 |
| XXXX | 0300 | 8003 | 11110 |
| XXXX | 0300 | 8004 | 11110 |
| XXXX | 0300 | 8005 | 11110 |
| XXXX | 0300 | 8006 | 11110 |
| XXXX | 0300 | 8007 | 11110 |
| XXXX | 0300 | 8008 | 11110 |
| XXXX | 0300 | 8009 | 11110 |
| XXXX | 0300 | 9001 | 11110 |
| XXXX | 0300 | 9002 | 11110 |
| XXXX | 0300 | 9003 | 11110 |
| XXXX | 0300 | 9004 | 11110 |
| XXXX | 0300 | 9005 | 11110 |
| XXXX | 0300 | 9006 | 11110 |
| XXXX | 0300 | 9007 | 11110 |
| XXXX | 0300 | 9008 | 11110 |
| XXXX | 0300 | 9009 | 11110 |
| XXXX | 0300 | 1000 | 11110 |
| XXXX | 0300 | 2000 | 11110 |
| XXXX | 0300 | 3000 | 11110 |
| XXXX | 0400 | 8002 | 11111 |
| XXXX | 0400 | 8003 | 11111 |
| XXXX | 0400 | 8004 | 11111 |
| XXXX | 0400 | 8005 | 11111 |
| XXXX | 0400 | 8006 | 11111 |
| XXXX | 0400 | 8007 | 11111 |
| XXXX | 0400 | 8008 | 11111 |
| XXXX | 0400 | 8009 | 11111 |
| XXXX | 0400 | 9001 | 11111 |
| XXXX | 0400 | 9002 | 11111 |
| XXXX | 0400 | 9003 | 11111 |
| XXXX | 0400 | 9004 | 11111 |
| XXXX | 0400 | 9005 | 11111 |
| XXXX | 0400 | 9006 | 11111 |
| XXXX | 0400 | 9007 | 11111 |
| XXXX | 0400 | 9008 | 11111 |
| XXXX | 0400 | 9009 | 11111 |
| XXXX | 0400 | 1000 | 11111 |
| XXXX | 0400 | 2000 | 11111 |
| XXXX | 0400 | 3000 | 11111 |
| 0000 | 0000 | 0100 | 00000 |
| 0000 | 0000 | 0200 | 00000 |
| 0000 | 0000 | 0300 | 00000 |
| 0000 | 0000 | 0400 | 00000 |
| 0000 | 0000 | 0500 | 00000 |
| 0000 | 0000 | 0600 | 00000 |
| 0000 | 0000 | 0700 | 00000 |
| 0X00 | 0000 | 0100 | 00000 |
| 0X00 | 0000 | 0200 | 00000 |
| 0X00 | 0000 | 0300 | 00000 |
| 0X00 | 0000 | 0400 | 00000 |
| 0X00 | 0000 | 0500 | 00000 |
| 0X00 | 0000 | 0600 | 00000 |
| 0X00 | 0000 | 0700 | 00000 |
| X000 | 0000 | 0100 | 00000 |
| X000 | 0000 | 0200 | 00000 |
| X000 | 0000 | 0300 | 00000 |
| X000 | 0000 | 0400 | 00000 |
| X000 | 0000 | 0500 | 00000 |
| X000 | 0000 | 0600 | 00000 |
| X000 | 0000 | 0700 | 00000 |
| 0000 | 0000 | 4000 | 00001 |

-continued

| Window Contents | | | X' |
|---|---|---|---|
| 0000 | 0000 | 5000 | 00001 |
| 0000 | 0000 | 6000 | 00001 |
| 0000 | 0000 | 7000 | 00001 |
| 0000 | 0000 | 8000 | 00001 |
| 0000 | 0000 | 9000 | 00001 |
| 0000 | 0000 | 0800 | 00001 |
| 0000 | 0000 | 0900 | 00001 |
| 0X00 | 0000 | 4000 | 00001 |
| 0X00 | 0000 | 5000 | 00001 |
| 0X00 | 0000 | 6000 | 00001 |
| 0X00 | 0000 | 7000 | 00001 |
| 0X00 | 0000 | 8000 | 00001 |
| 0X00 | 0000 | 9000 | 00001 |
| 0X00 | 0000 | 0800 | 00001 |
| 0X00 | 0000 | 0900 | 00001 |
| X000 | 0000 | 4000 | 00001 |
| X000 | 0000 | 5000 | 00001 |
| X000 | 0000 | 6000 | 00001 |
| X000 | 0000 | 7000 | 00001 |
| X000 | 0000 | 8000 | 00001 |
| X000 | 0000 | 9000 | 00001 |
| X000 | 0000 | 0800 | 00001 |
| X000 | 0000 | 0900 | 00001 |
| 0000 | 0000 | 1001 | 00010 |
| 0000 | 0000 | 1002 | 00010 |
| 0000 | 0000 | 1003 | 00010 |
| 0000 | 0000 | 1004 | 00010 |
| 0000 | 0000 | 1005 | 00010 |
| 0000 | 0000 | 1006 | 00010 |
| 0000 | 0000 | 1007 | 00010 |
| 0000 | 0000 | 1008 | 00010 |
| 0000 | 0000 | 1009 | 00010 |
| 0000 | 0000 | 2001 | 00010 |
| 0000 | 0000 | 2002 | 00010 |
| 0000 | 0000 | 2003 | 00010 |
| 0000 | 0000 | 2004 | 00010 |
| 0000 | 0000 | 2005 | 00010 |
| 0000 | 0000 | 2006 | 00010 |
| 0000 | 0000 | 2007 | 00010 |
| 0000 | 0000 | 2008 | 00010 |
| 0000 | 0000 | 2009 | 00010 |
| 0000 | 0000 | 3001 | 00010 |
| 0000 | 0000 | 3002 | 00010 |
| 0000 | 0000 | 3003 | 00010 |
| 0000 | 0000 | 3004 | 00010 |
| 0000 | 0000 | 3005 | 00010 |
| 0000 | 0000 | 3006 | 00010 |
| 0000 | 0000 | 3007 | 00010 |
| 0000 | 0000 | 3008 | 00010 |
| 0000 | 0000 | 3009 | 00010 |
| 0000 | 0000 | 4001 | 00010 |
| 0000 | 0000 | 4002 | 00010 |
| 0000 | 0000 | 4003 | 00010 |
| 0000 | 0000 | 4004 | 00010 |
| 0000 | 0000 | 4005 | 00010 |
| 0X00 | 0000 | 1001 | 00010 |
| 0X00 | 0000 | 1002 | 00010 |
| 0X00 | 0000 | 1003 | 00010 |
| 0X00 | 0000 | 1004 | 00010 |
| 0X00 | 0000 | 1005 | 00010 |
| 0X00 | 0000 | 1006 | 00010 |
| 0X00 | 0000 | 1007 | 00010 |
| 0X00 | 0000 | 1008 | 00010 |
| 0X00 | 0000 | 1009 | 00010 |
| 0X00 | 0000 | 2001 | 00010 |
| 0X00 | 0000 | 2002 | 00010 |
| 0X00 | 0000 | 2003 | 00010 |
| 0X00 | 0000 | 2004 | 00010 |
| 0X00 | 0000 | 2005 | 00010 |
| 0X00 | 0000 | 2006 | 00010 |
| 0X00 | 0000 | 2007 | 00010 |
| 0X00 | 0000 | 2008 | 00010 |
| 0X00 | 0000 | 2009 | 00010 |
| 0X00 | 0000 | 3001 | 00010 |
| 0X00 | 0000 | 3002 | 00010 |
| 0X00 | 0000 | 3003 | 00010 |
| 0X00 | 0000 | 3004 | 00010 |

-continued

| Window Contents | X' |
|---|---|
| 0X00 0000 3005 | 00010 |
| 0X00 0000 3006 | 00010 |
| 0X00 0000 3007 | 00010 |
| 0X00 0000 3008 | 00010 |
| 0X00 0000 3009 | 00010 |
| 0X00 0000 4001 | 00010 |
| 0X00 0000 4002 | 00010 |
| 0X00 0000 4003 | 00010 |
| 0X00 0000 4004 | 00010 |
| 0X00 0000 4005 | 00010 |
| X000 0000 1001 | 00010 |
| X000 0000 1002 | 00010 |
| X000 0000 1003 | 00010 |
| X000 0000 1004 | 00010 |
| X000 0000 1005 | 00010 |
| X000 0000 1006 | 00010 |
| X000 0000 1007 | 00010 |
| X000 0000 1008 | 00010 |
| X000 0000 1009 | 00010 |
| X000 0000 2001 | 00010 |
| X000 0000 2002 | 00010 |
| X000 0000 2003 | 00010 |
| X000 0000 2004 | 00010 |
| X000 0000 2005 | 00010 |
| X000 0000 2006 | 00010 |
| X000 0000 2007 | 00010 |
| X000 0000 2008 | 00010 |
| X000 0000 2009 | 00010 |
| X000 0000 3001 | 00010 |
| X000 0000 3002 | 00010 |
| X000 0000 3003 | 00010 |
| X000 0000 3004 | 00010 |
| X000 0000 3005 | 00010 |
| X000 0000 3006 | 00010 |
| X000 0000 3007 | 00010 |
| X000 0000 3008 | 00010 |
| X000 0000 3009 | 00010 |
| X000 0000 4001 | 00010 |
| X000 0000 4002 | 00010 |
| X000 0000 4003 | 00010 |
| X000 0000 4004 | 00010 |
| X000 0000 4005 | 00010 |
| 0000 0000 4006 | 00011 |
| 0000 0000 4007 | 00011 |
| 0000 0000 4008 | 00011 |
| 0000 0000 4009 | 00011 |
| 0000 0000 5001 | 00011 |
| 0000 0000 5002 | 00011 |
| 0000 0000 5003 | 00011 |
| 0000 0000 5004 | 00011 |
| 0000 0000 5005 | 00011 |
| 0000 0000 5006 | 00011 |
| 0000 0000 5007 | 00011 |
| 0000 0000 5008 | 00011 |
| 0000 0000 5009 | 00011 |
| 0000 0000 6001 | 00011 |
| 0000 0000 6002 | 00011 |
| 0000 0000 6003 | 00011 |
| 0000 0000 6004 | 00011 |
| 0000 0000 6005 | 00011 |
| 0000 0000 6006 | 00011 |
| 0000 0000 6007 | 00011 |
| 0000 0000 6008 | 00011 |
| 0000 0000 6009 | 00011 |
| 0000 0000 7001 | 00011 |
| 0000 0000 7002 | 00011 |
| 0000 0000 7003 | 00011 |
| 0000 0000 7004 | 00011 |
| 0000 0000 7005 | 00011 |
| 0000 0000 7006 | 00011 |
| 0000 0000 7007 | 00011 |
| 0000 0000 7008 | 00011 |
| 0000 0000 7009 | 00011 |
| 0000 0000 8001 | 00011 |
| 0X00 0000 4006 | 00011 |
| 0X00 0000 4007 | 00011 |
| 0X00 0000 4008 | 00011 |

-continued

| Window Contents | X' |
|---|---|
| 0X00 0000 4009 | 00011 |
| 0X00 0000 5001 | 00011 |
| 0X00 0000 5002 | 00011 |
| 0X00 0000 5003 | 00011 |
| 0X00 0000 5004 | 00011 |
| 0X00 0000 5005 | 00011 |
| 0X00 0000 5006 | 00011 |
| 0X00 0000 5007 | 00011 |
| 0X00 0000 5008 | 00011 |
| 0X00 0000 5009 | 00011 |
| 0X00 0000 6001 | 00011 |
| 0X00 0000 6002 | 00011 |
| 0X00 0000 6003 | 00011 |
| 0X00 0000 6004 | 00011 |
| 0X00 0000 6005 | 00011 |
| 0X00 0000 6006 | 00011 |
| 0X00 0000 6007 | 00011 |
| 0X00 0000 6008 | 00011 |
| 0X00 0000 6009 | 00011 |
| 0X00 0000 7001 | 00011 |
| 0X00 0000 7002 | 00011 |
| 0X00 0000 7003 | 00011 |
| 0X00 0000 7004 | 00011 |
| 0X00 0000 7005 | 00011 |
| 0X00 0000 7006 | 00011 |
| 0X00 0000 7007 | 00011 |
| 0X00 0000 7008 | 00011 |
| 0X00 0000 7009 | 00011 |
| 0X00 0000 8001 | 00011 |
| X000 0000 4006 | 00011 |
| X000 0000 4007 | 00011 |
| X000 0000 4008 | 00011 |
| X000 0000 4009 | 00011 |
| X000 0000 5001 | 00011 |
| X000 0000 5002 | 00011 |
| X000 0000 5003 | 00011 |
| X000 0000 5004 | 00011 |
| X000 0000 5005 | 00011 |
| X000 0000 5006 | 00011 |
| X000 0000 5007 | 00011 |
| X000 0000 5008 | 00011 |
| X000 0000 5009 | 00011 |
| X000 0000 6001 | 00011 |
| X000 0000 6002 | 00011 |
| X000 0000 6003 | 00011 |
| X000 0000 6004 | 00011 |
| X000 0000 6005 | 00011 |
| X000 0000 6006 | 00011 |
| X000 0000 6007 | 00011 |
| X000 0000 6008 | 00011 |
| X000 0000 6009 | 00011 |
| X000 0000 7001 | 00011 |
| X000 0000 7002 | 00011 |
| X000 0000 7003 | 00011 |
| X000 0000 7004 | 00011 |
| X000 0000 7005 | 00011 |
| X000 0000 7006 | 00011 |
| X000 0000 7007 | 00011 |
| X000 0000 7008 | 00011 |
| X000 0000 7009 | 00011 |
| X000 0000 8001 | 00011 |
| 0000 0000 8002 | 00100 |
| 0000 0000 8003 | 00100 |
| 0000 0000 8004 | 00100 |
| 0000 0000 8005 | 00100 |
| 0000 0000 8006 | 00100 |
| 0000 0000 8007 | 00100 |
| 0000 0000 8008 | 00100 |
| 0000 0000 8009 | 00100 |
| 0000 0000 9001 | 00100 |
| 0000 0000 9002 | 00100 |
| 0000 0000 9003 | 00100 |
| 0000 0000 9004 | 00100 |
| 0000 0000 9005 | 00100 |
| 0000 0000 9006 | 00100 |
| 0000 0000 9007 | 00100 |
| 0000 0000 9008 | 00100 |

-continued

| Window Contents | | | X' |
|---|---|---|---|
| 0000 | 0000 | 9009 | 00100 |
| 0000 | 0000 | 1000 | 00100 |
| 0000 | 0000 | 2000 | 00100 |
| 0000 | 0000 | 3000 | 00100 |
| 0X00 | 0000 | 8002 | 00100 |
| 0X00 | 0000 | 8003 | 00100 |
| 0X00 | 0000 | 8004 | 00100 |
| 0X00 | 0000 | 8005 | 00100 |
| 0X00 | 0000 | 8006 | 00100 |
| 0X00 | 0000 | 8007 | 00100 |
| 0X00 | 0000 | 8008 | 00100 |
| 0X00 | 0000 | 8009 | 00100 |
| 0X00 | 0000 | 9001 | 00100 |
| 0X00 | 0000 | 9002 | 00100 |
| 0X00 | 0000 | 9003 | 00100 |
| 0X00 | 0000 | 9004 | 00100 |
| 0X00 | 0000 | 9005 | 00100 |
| 0X00 | 0000 | 9006 | 00100 |
| 0X00 | 0000 | 9007 | 00100 |
| 0X00 | 0000 | 9008 | 00100 |
| 0X00 | 0000 | 9009 | 00100 |
| 0X00 | 0000 | 1000 | 00100 |
| 0X00 | 0000 | 2000 | 00100 |
| 0X00 | 0000 | 3000 | 00100 |
| X000 | 0000 | 8002 | 00100 |
| X000 | 0000 | 8003 | 00100 |
| X000 | 0000 | 8004 | 00100 |
| X000 | 0000 | 8005 | 00100 |
| X000 | 0000 | 8006 | 00100 |
| X000 | 0000 | 8007 | 00100 |
| X000 | 0000 | 8008 | 00100 |
| X000 | 0000 | 8009 | 00100 |
| X000 | 0000 | 9001 | 00100 |
| X000 | 0000 | 9002 | 00100 |
| X000 | 0000 | 9003 | 00100 |
| X000 | 0000 | 9004 | 00100 |
| X000 | 0000 | 9005 | 00100 |
| X000 | 0000 | 9006 | 00100 |
| X000 | 0000 | 9007 | 00100 |
| X000 | 0000 | 9008 | 00100 |
| X000 | 0000 | 9009 | 00100 |
| X000 | 0000 | 1000 | 00100 |
| X000 | 0000 | 2000 | 00100 |
| X000 | 0000 | 3000 | 00100 |
| XXXX | 1001 | XXXX | 00000 |
| XXXX | 1002 | XXXX | 00001 |
| XXXX | 1003 | XXXX | 00010 |
| XXXX | 1004 | XXXX | 00011 |
| XXXX | 1005 | XXXX | 00100 |
| XXXX | 1006 | XXXX | 00101 |
| XXXX | 1007 | XXXX | 00110 |
| XXXX | 1008 | XXXX | 00111 |
| XXXX | 1009 | XXXX | 01000 |
| XXXX | 2001 | XXXX | 01001 |
| XXXX | 2002 | XXXX | 01010 |
| XXXX | 2003 | XXXX | 01011 |
| XXXX | 2004 | XXXX | 01100 |
| XXXX | 2005 | XXXX | 01101 |
| XXXX | 2006 | XXXX | 01110 |
| XXXX | 2007 | XXXX | 01111 |
| XXXX | 2008 | XXXX | 10000 |
| XXXX | 2009 | XXXX | 10001 |
| XXXX | 3001 | XXXX | 10010 |
| XXXX | 3002 | XXXX | 10011 |
| XXXX | 3003 | XXXX | 10100 |
| XXXX | 3004 | XXXX | 10101 |
| XXXX | 3005 | XXXX | 10110 |
| XXXX | 3006 | XXXX | 10111 |
| XXXX | 3007 | XXXX | 11000 |
| XXXX | 3008 | XXXX | 11001 |
| XXXX | 3009 | XXXX | 11010 |
| XXXX | 4001 | XXXX | 11011 |
| XXXX | 4002 | XXXX | 11100 |
| XXXX | 4003 | XXXX | 11101 |
| XXXX | 4004 | XXXX | 11110 |
| XXXX | 4005 | XXXX | 11111 |
| XXXX | 4006 | XXXX | 00000 |

-continued

| Window Contents | | | X' |
|---|---|---|---|
| XXXX | 4007 | XXXX | 00001 |
| XXXX | 4008 | XXXX | 00010 |
| XXXX | 4009 | XXXX | 00011 |
| XXXX | 5001 | XXXX | 00100 |
| XXXX | 5002 | XXXX | 00101 |
| XXXX | 5003 | XXXX | 00110 |
| XXXX | 5004 | XXXX | 00111 |
| XXXX | 5005 | XXXX | 01000 |
| XXXX | 5006 | XXXX | 01001 |
| XXXX | 5007 | XXXX | 01010 |
| XXXX | 5008 | XXXX | 01011 |
| XXXX | 5009 | XXXX | 01100 |
| XXXX | 6001 | XXXX | 01101 |
| XXXX | 6002 | XXXX | 01110 |
| XXXX | 6003 | XXXX | 01111 |
| XXXX | 6004 | XXXX | 10000 |
| XXXX | 6005 | XXXX | 10001 |
| XXXX | 6006 | XXXX | 10010 |
| XXXX | 6007 | XXXX | 10011 |
| XXXX | 6008 | XXXX | 10100 |
| XXXX | 6009 | XXXX | 10101 |
| XXXX | 7001 | XXXX | 10110 |
| XXXX | 7002 | XXXX | 10111 |
| XXXX | 7003 | XXXX | 11000 |
| XXXX | 7004 | XXXX | 11001 |
| XXXX | 7005 | XXXX | 11010 |
| XXXX | 7006 | XXXX | 11011 |
| XXXX | 7007 | XXXX | 11100 |
| XXXX | 7008 | XXXX | 11101 |
| XXXX | 7009 | XXXX | 11110 |
| XXXX | 8001 | XXXX | 11111 |
| XXXX | 8002 | XXXX | 00000 |
| XXXX | 8003 | XXXX | 00001 |
| XXXX | 8004 | XXXX | 00010 |
| XXXX | 8005 | XXXX | 00011 |
| XXXX | 8006 | XXXX | 00100 |
| XXXX | 8007 | XXXX | 00101 |
| XXXX | 8008 | XXXX | 00110 |
| XXXX | 8009 | XXXX | 00111 |
| XXXX | 9001 | XXXX | 01000 |
| XXXX | 9002 | XXXX | 01001 |
| XXXX | 9003 | XXXX | 01010 |
| XXXX | 9004 | XXXX | 01011 |
| XXXX | 9005 | XXXX | 01100 |
| XXXX | 9006 | XXXX | 01101 |
| XXXX | 9007 | XXXX | 01110 |
| XXXX | 9008 | XXXX | 01111 |
| XXXX | 9009 | XXXX | 10000 |
| XXXX | 1000 | 0100 | 10001 |
| XXXX | 1000 | 0200 | 10001 |
| XXXX | 1000 | 0300 | 10001 |
| XXXX | 1000 | 0400 | 10001 |
| XXXX | 1000 | 0500 | 10001 |
| XXXX | 1000 | 0600 | 10001 |
| XXXX | 1000 | 0700 | 10001 |
| XXXX | 2000 | 0100 | 10010 |
| XXXX | 2000 | 0200 | 10010 |
| XXXX | 2000 | 0300 | 10010 |
| XXXX | 2000 | 0400 | 10010 |
| XXXX | 2000 | 0500 | 10010 |
| XXXX | 2000 | 0600 | 10010 |
| XXXX | 2000 | 0700 | 10010 |
| XXXX | 3000 | 0100 | 10011 |
| XXXX | 3000 | 0200 | 10011 |
| XXXX | 3000 | 0300 | 10011 |
| XXXX | 3000 | 0400 | 10011 |
| XXXX | 3000 | 0500 | 10011 |
| XXXX | 3000 | 0600 | 10011 |
| XXXX | 3000 | 0700 | 10011 |
| XXXX | 1000 | 0000 | 10100 |
| XXXX | 1000 | 00X0 | 10100 |
| XXXX | 1000 | 000X | 10100 |
| XXXX | 2000 | 0000 | 10101 |
| XXXX | 2000 | 00X0 | 10101 |
| XXXX | 2000 | 000X | 10101 |
| XXXX | 3000 | 0000 | 10110 |
| XXXX | 3000 | 00X0 | 10110 |

-continued

| Window Contents | | | X' |
|---|---|---|---|
| XXXX | 3000 | 000X | 10110 |
| XXXX | 1000 | 1001 | 10111 |
| XXXX | 1000 | 1002 | 10111 |
| XXXX | 1000 | 1003 | 10111 |
| XXXX | 1000 | 1004 | 10111 |
| XXXX | 1000 | 1005 | 10111 |
| XXXX | 1000 | 1006 | 10111 |
| XXXX | 1000 | 1007 | 10111 |
| XXXX | 1000 | 1008 | 10111 |
| XXXX | 1000 | 1009 | 10111 |
| XXXX | 1000 | 2001 | 10111 |
| XXXX | 1000 | 2002 | 10111 |
| XXXX | 1000 | 2003 | 10111 |
| XXXX | 1000 | 2004 | 10111 |
| XXXX | 1000 | 2005 | 10111 |
| XXXX | 1000 | 2006 | 10111 |
| XXXX | 1000 | 2007 | 10111 |
| XXXX | 1000 | 2008 | 10111 |
| XXXX | 1000 | 2009 | 10111 |
| XXXX | 1000 | 3001 | 10111 |
| XXXX | 1000 | 3002 | 10111 |
| XXXX | 1000 | 3003 | 10111 |
| XXXX | 1000 | 3004 | 10111 |
| XXXX | 1000 | 3005 | 10111 |
| XXXX | 1000 | 3006 | 10111 |
| XXXX | 1000 | 3007 | 10111 |
| XXXX | 1000 | 3008 | 10111 |
| XXXX | 1000 | 3009 | 10111 |
| XXXX | 1000 | 4001 | 10111 |
| XXXX | 1000 | 4002 | 10111 |
| XXXX | 1000 | 4003 | 10111 |
| XXXX | 1000 | 4004 | 10111 |
| XXXX | 1000 | 4005 | 10111 |
| XXXX | 2000 | 1001 | 11000 |
| XXXX | 2000 | 1002 | 11000 |
| XXXX | 2000 | 1003 | 11000 |
| XXXX | 2000 | 1004 | 11000 |
| XXXX | 2000 | 1005 | 11000 |
| XXXX | 2000 | 1006 | 11000 |
| XXXX | 2000 | 1007 | 11000 |
| XXXX | 2000 | 1008 | 11000 |
| XXXX | 2000 | 1009 | 11000 |
| XXXX | 2000 | 2001 | 11000 |
| XXXX | 2000 | 2002 | 11000 |
| XXXX | 2000 | 2003 | 11000 |
| XXXX | 2000 | 2004 | 11000 |
| XXXX | 2000 | 2005 | 11000 |
| XXXX | 2000 | 2006 | 11000 |
| XXXX | 2000 | 2007 | 11000 |
| XXXX | 2000 | 2008 | 11000 |
| XXXX | 2000 | 2009 | 11000 |
| XXXX | 2000 | 3001 | 11000 |
| XXXX | 2000 | 3002 | 11000 |
| XXXX | 2000 | 3003 | 11000 |
| XXXX | 2000 | 3004 | 11000 |
| XXXX | 2000 | 3005 | 11000 |
| XXXX | 2000 | 3006 | 11000 |
| XXXX | 2000 | 3007 | 11000 |
| XXXX | 2000 | 3008 | 11000 |
| XXXX | 2000 | 3009 | 11000 |
| XXXX | 2000 | 4001 | 11000 |
| XXXX | 2000 | 4002 | 11000 |
| XXXX | 2000 | 4003 | 11000 |
| XXXX | 2000 | 4004 | 11000 |
| XXXX | 2000 | 4005 | 11000 |
| XXXX | 3000 | 1001 | 11001 |
| XXXX | 3000 | 1002 | 11001 |
| XXXX | 3000 | 1003 | 11001 |
| XXXX | 3000 | 1004 | 11001 |
| XXXX | 3000 | 1005 | 11001 |
| XXXX | 3000 | 1006 | 11001 |
| XXXX | 3000 | 1007 | 11001 |
| XXXX | 3000 | 1008 | 11001 |
| XXXX | 3000 | 1009 | 11001 |
| XXXX | 3000 | 2001 | 11001 |
| XXXX | 3000 | 2002 | 11001 |
| XXXX | 3000 | 2003 | 11001 |

-continued

| Window Contents | | | X' |
|---|---|---|---|
| XXXX | 3000 | 2004 | 11001 |
| XXXX | 3000 | 2005 | 11001 |
| XXXX | 3000 | 2006 | 11001 |
| XXXX | 3000 | 2007 | 11001 |
| XXXX | 3000 | 2008 | 11001 |
| XXXX | 3000 | 2009 | 11001 |
| XXXX | 3000 | 3001 | 11001 |
| XXXX | 3000 | 3002 | 11001 |
| XXXX | 3000 | 3003 | 11001 |
| XXXX | 3000 | 3004 | 11001 |
| XXXX | 3000 | 3005 | 11001 |
| XXXX | 3000 | 3006 | 11001 |
| XXXX | 3000 | 3007 | 11001 |
| XXXX | 3000 | 3008 | 11001 |
| XXXX | 3000 | 3009 | 11001 |
| XXXX | 3000 | 4001 | 11001 |
| XXXX | 3000 | 4002 | 11001 |
| XXXX | 3000 | 4003 | 11001 |
| XXXX | 3000 | 4004 | 11001 |
| XXXX | 3000 | 4005 | 11001 |
| XXXX | 1000 | 4006 | 11010 |
| XXXX | 1000 | 4007 | 11010 |
| XXXX | 1000 | 4008 | 11010 |
| XXXX | 1000 | 4009 | 11010 |
| XXXX | 1000 | 5001 | 11010 |
| XXXX | 1000 | 5002 | 11010 |
| XXXX | 1000 | 5003 | 11010 |
| XXXX | 1000 | 5004 | 11010 |
| XXXX | 1000 | 5005 | 11010 |
| XXXX | 1000 | 5006 | 11010 |
| XXXX | 1000 | 5007 | 11010 |
| XXXX | 1000 | 5008 | 11010 |
| XXXX | 1000 | 5009 | 11010 |
| XXXX | 1000 | 6001 | 11010 |
| XXXX | 1000 | 6002 | 11010 |
| XXXX | 1000 | 6003 | 11010 |
| XXXX | 1000 | 6004 | 11010 |
| XXXX | 1000 | 6005 | 11010 |
| XXXX | 1000 | 6006 | 11010 |
| XXXX | 1000 | 6007 | 11010 |
| XXXX | 1000 | 6008 | 11010 |
| XXXX | 1000 | 6009 | 11010 |
| XXXX | 1000 | 7001 | 11010 |
| XXXX | 1000 | 7002 | 11010 |
| XXXX | 1000 | 7003 | 11010 |
| XXXX | 1000 | 7004 | 11010 |
| XXXX | 1000 | 7005 | 11010 |
| XXXX | 1000 | 7006 | 11010 |
| XXXX | 1000 | 7007 | 11010 |
| XXXX | 1000 | 7008 | 11010 |
| XXXX | 1000 | 7009 | 11010 |
| XXXX | 1000 | 8001 | 11010 |
| XXXX | 2000 | 4006 | 11011 |
| XXXX | 2000 | 4007 | 11011 |
| XXXX | 2000 | 4008 | 11011 |
| XXXX | 2000 | 4009 | 11011 |
| XXXX | 2000 | 5001 | 11011 |
| XXXX | 2000 | 5002 | 11011 |
| XXXX | 2000 | 5003 | 11011 |
| XXXX | 2000 | 5004 | 11011 |
| XXXX | 2000 | 5005 | 11011 |
| XXXX | 2000 | 5006 | 11011 |
| XXXX | 2000 | 5007 | 11011 |
| XXXX | 2000 | 5008 | 11011 |
| XXXX | 2000 | 5009 | 11011 |
| XXXX | 2000 | 6001 | 11011 |
| XXXX | 2000 | 6002 | 11011 |
| XXXX | 2000 | 6003 | 11011 |
| XXXX | 2000 | 6004 | 11011 |
| XXXX | 2000 | 6005 | 11011 |
| XXXX | 2000 | 6006 | 11011 |
| XXXX | 2000 | 6007 | 11011 |
| XXXX | 2000 | 6008 | 11011 |
| XXXX | 2000 | 6009 | 11011 |
| XXXX | 2000 | 7001 | 11011 |
| XXXX | 2000 | 7002 | 11011 |
| XXXX | 2000 | 7003 | 11011 |

-continued

| Window Contents | | | X' |
|---|---|---|---|
| X X X X | 2 0 0 0 | 7 0 0 4 | 1 1 0 1 1 |
| X X X X | 2 0 0 0 | 7 0 0 5 | 1 1 0 1 1 |
| X X X X | 2 0 0 0 | 7 0 0 6 | 1 1 0 1 1 |
| X X X X | 2 0 0 0 | 7 0 0 7 | 1 1 0 1 1 |
| X X X X | 2 0 0 0 | 7 0 0 8 | 1 1 0 1 1 |
| X X X X | 2 0 0 0 | 7 0 0 9 | 1 1 0 1 1 |
| X X X X | 2 0 0 0 | 8 0 0 1 | 1 1 0 1 1 |
| X X X X | 3 0 0 0 | 4 0 0 6 | 1 1 1 0 0 |
| X X X X | 3 0 0 0 | 4 0 0 7 | 1 1 1 0 0 |
| X X X X | 3 0 0 0 | 4 0 0 8 | 1 1 1 0 0 |
| X X X X | 3 0 0 0 | 4 0 0 9 | 1 1 1 0 0 |
| X X X X | 3 0 0 0 | 5 0 0 1 | 1 1 1 0 0 |
| X X X X | 3 0 0 0 | 5 0 0 2 | 1 1 1 0 0 |
| X X X X | 3 0 0 0 | 5 0 0 3 | 1 1 1 0 0 |
| X X X X | 3 0 0 0 | 5 0 0 4 | 1 1 1 0 0 |
| X X X X | 3 0 0 0 | 5 0 0 5 | 1 1 1 0 0 |
| X X X X | 3 0 0 0 | 5 0 0 6 | 1 1 1 0 0 |
| X X X X | 3 0 0 0 | 5 0 0 7 | 1 1 1 0 0 |
| X X X X | 3 0 0 0 | 5 0 0 8 | 1 1 1 0 0 |
| X X X X | 3 0 0 0 | 5 0 0 9 | 1 1 1 0 0 |
| X X X X | 3 0 0 0 | 6 0 0 1 | 1 1 1 0 0 |
| X X X X | 3 0 0 0 | 6 0 0 2 | 1 1 1 0 0 |
| X X X X | 3 0 0 0 | 6 0 0 3 | 1 1 1 0 0 |
| X X X X | 3 0 0 0 | 6 0 0 4 | 1 1 1 0 0 |
| X X X X | 3 0 0 0 | 6 0 0 5 | 1 1 1 0 0 |
| X X X X | 3 0 0 0 | 6 0 0 6 | 1 1 1 0 0 |
| X X X X | 3 0 0 0 | 6 0 0 7 | 1 1 1 0 0 |
| X X X X | 3 0 0 0 | 6 0 0 8 | 1 1 1 0 0 |
| X X X X | 3 0 0 0 | 6 0 0 9 | 1 1 1 0 0 |
| X X X X | 3 0 0 0 | 7 0 0 1 | 1 1 1 0 0 |
| X X X X | 3 0 0 0 | 7 0 0 2 | 1 1 1 0 0 |
| X X X X | 3 0 0 0 | 7 0 0 3 | 1 1 1 0 0 |
| X X X X | 3 0 0 0 | 7 0 0 4 | 1 1 1 0 0 |
| X X X X | 3 0 0 0 | 7 0 0 5 | 1 1 1 0 0 |
| X X X X | 3 0 0 0 | 7 0 0 6 | 1 1 1 0 0 |
| X X X X | 3 0 0 0 | 7 0 0 7 | 1 1 1 0 0 |
| X X X X | 3 0 0 0 | 7 0 0 8 | 1 1 1 0 0 |
| X X X X | 3 0 0 0 | 7 0 0 9 | 1 1 1 0 0 |
| X X X X | 3 0 0 0 | 8 0 0 1 | 1 1 1 0 0 |
| X X X X | 1 0 0 0 | 8 0 0 2 | 1 1 1 0 1 |
| X X X X | 1 0 0 0 | 8 0 0 3 | 1 1 1 0 1 |
| X X X X | 1 0 0 0 | 8 0 0 4 | 1 1 1 0 1 |
| X X X X | 1 0 0 0 | 8 0 0 5 | 1 1 1 0 1 |
| X X X X | 1 0 0 0 | 8 0 0 6 | 1 1 1 0 1 |
| X X X X | 1 0 0 0 | 8 0 0 7 | 1 1 1 0 1 |
| X X X X | 1 0 0 0 | 8 0 0 8 | 1 1 1 0 1 |
| X X X X | 1 0 0 0 | 8 0 0 9 | 1 1 1 0 1 |
| X X X X | 1 0 0 0 | 9 0 0 1 | 1 1 1 0 1 |
| X X X X | 1 0 0 0 | 9 0 0 2 | 1 1 1 0 1 |
| X X X X | 1 0 0 0 | 9 0 0 3 | 1 1 1 0 1 |
| X X X X | 1 0 0 0 | 9 0 0 4 | 1 1 1 0 1 |
| X X X X | 1 0 0 0 | 9 0 0 5 | 1 1 1 0 1 |
| X X X X | 1 0 0 0 | 9 0 0 6 | 1 1 1 0 1 |
| X X X X | 1 0 0 0 | 9 0 0 7 | 1 1 1 0 1 |
| X X X X | 1 0 0 0 | 9 0 0 8 | 1 1 1 0 1 |
| X X X X | 1 0 0 0 | 9 0 0 9 | 1 1 1 0 1 |
| X X X X | 1 0 0 0 | 1 0 0 0 | 1 1 1 0 1 |
| X X X X | 1 0 0 0 | 2 0 0 0 | 1 1 1 0 1 |
| X X X X | 1 0 0 0 | 3 0 0 0 | 1 1 1 0 1 |
| X X X X | 2 0 0 0 | 8 0 0 2 | 1 1 1 1 0 |
| X X X X | 2 0 0 0 | 8 0 0 3 | 1 1 1 1 0 |
| X X X X | 2 0 0 0 | 8 0 0 4 | 1 1 1 1 0 |
| X X X X | 2 0 0 0 | 8 0 0 5 | 1 1 1 1 0 |
| X X X X | 2 0 0 0 | 8 0 0 6 | 1 1 1 1 0 |
| X X X X | 2 0 0 0 | 8 0 0 7 | 1 1 1 1 0 |
| X X X X | 2 0 0 0 | 8 0 0 8 | 1 1 1 1 0 |
| X X X X | 2 0 0 0 | 8 0 0 9 | 1 1 1 1 0 |
| X X X X | 2 0 0 0 | 9 0 0 1 | 1 1 1 1 0 |
| X X X X | 2 0 0 0 | 9 0 0 2 | 1 1 1 1 0 |
| X X X X | 2 0 0 0 | 9 0 0 3 | 1 1 1 1 0 |
| X X X X | 2 0 0 0 | 9 0 0 4 | 1 1 1 1 0 |
| X X X X | 2 0 0 0 | 9 0 0 5 | 1 1 1 1 0 |
| X X X X | 2 0 0 0 | 9 0 0 6 | 1 1 1 1 0 |
| X X X X | 2 0 0 0 | 9 0 0 7 | 1 1 1 1 0 |
| X X X X | 2 0 0 0 | 9 0 0 8 | 1 1 1 1 0 |
| X X X X | 2 0 0 0 | 9 0 0 9 | 1 1 1 1 0 |
| X X X X | 2 0 0 0 | 1 0 0 0 | 1 1 1 1 0 |

-continued

| Window Contents | | | X' |
|---|---|---|---|
| X X X X | 2 0 0 0 | 2 0 0 0 | 1 1 1 1 0 |
| X X X X | 2 0 0 0 | 3 0 0 0 | 1 1 1 1 0 |
| X X X X | 3 0 0 0 | 8 0 0 2 | 1 1 1 1 1 |
| X X X X | 3 0 0 0 | 8 0 0 3 | 1 1 1 1 1 |
| X X X X | 3 0 0 0 | 8 0 0 4 | 1 1 1 1 1 |
| X X X X | 3 0 0 0 | 8 0 0 5 | 1 1 1 1 1 |
| X X X X | 3 0 0 0 | 8 0 0 6 | 1 1 1 1 1 |
| X X X X | 3 0 0 0 | 8 0 0 7 | 1 1 1 1 1 |
| X X X X | 3 0 0 0 | 8 0 0 8 | 1 1 1 1 1 |
| X X X X | 3 0 0 0 | 8 0 0 9 | 1 1 1 1 1 |
| X X X X | 3 0 0 0 | 9 0 0 1 | 1 1 1 1 1 |
| X X X X | 3 0 0 0 | 9 0 0 2 | 1 1 1 1 1 |
| X X X X | 3 0 0 0 | 9 0 0 3 | 1 1 1 1 1 |
| X X X X | 3 0 0 0 | 9 0 0 4 | 1 1 1 1 1 |
| X X X X | 3 0 0 0 | 9 0 0 5 | 1 1 1 1 1 |
| X X X X | 3 0 0 0 | 9 0 0 6 | 1 1 1 1 1 |
| X X X X | 3 0 0 0 | 9 0 0 7 | 1 1 1 1 1 |
| X X X X | 3 0 0 0 | 9 0 0 8 | 1 1 1 1 1 |
| X X X X | 3 0 0 0 | 9 0 0 9 | 1 1 1 1 1 |
| X X X X | 3 0 0 0 | 1 0 0 0 | 1 1 1 1 1 |
| X X X X | 3 0 0 0 | 2 0 0 0 | 1 1 1 1 1 |
| X X X X | 3 0 0 0 | 3 0 0 0 | 1 1 1 1 1 |
| X X X X | 4 0 0 0 | 0 1 0 0 | 0 0 0 0 0 |
| X X X X | 4 0 0 0 | 0 2 0 0 | 0 0 0 0 0 |
| X X X X | 4 0 0 0 | 0 3 0 0 | 0 0 0 0 0 |
| X X X X | 4 0 0 0 | 0 4 0 0 | 0 0 0 0 0 |
| X X X X | 4 0 0 0 | 0 5 0 0 | 0 0 0 0 0 |
| X X X X | 4 0 0 0 | 0 6 0 0 | 0 0 0 0 0 |
| X X X X | 4 0 0 0 | 0 7 0 0 | 0 0 0 0 0 |
| X X X X | 5 0 0 0 | 0 1 0 0 | 0 0 0 0 1 |
| X X X X | 5 0 0 0 | 0 2 0 0 | 0 0 0 0 1 |
| X X X X | 5 0 0 0 | 0 3 0 0 | 0 0 0 0 1 |
| X X X X | 5 0 0 0 | 0 4 0 0 | 0 0 0 0 1 |
| X X X X | 5 0 0 0 | 0 5 0 0 | 0 0 0 0 1 |
| X X X X | 5 0 0 0 | 0 6 0 0 | 0 0 0 0 1 |
| X X X X | 5 0 0 0 | 0 7 0 0 | 0 0 0 0 1 |
| X X X X | 6 0 0 0 | 0 1 0 0 | 0 0 0 1 0 |
| X X X X | 6 0 0 0 | 0 2 0 0 | 0 0 0 1 0 |
| X X X X | 6 0 0 0 | 0 3 0 0 | 0 0 0 1 0 |
| X X X X | 6 0 0 0 | 0 4 0 0 | 0 0 0 1 0 |
| X X X X | 6 0 0 0 | 0 5 0 0 | 0 0 0 1 0 |
| X X X X | 6 0 0 0 | 0 6 0 0 | 0 0 0 1 0 |
| X X X X | 6 0 0 0 | 0 7 0 0 | 0 0 0 1 0 |
| X X X X | 7 0 0 0 | 0 1 0 0 | 0 0 0 1 1 |
| X X X X | 7 0 0 0 | 0 2 0 0 | 0 0 0 1 1 |
| X X X X | 7 0 0 0 | 0 3 0 0 | 0 0 0 1 1 |
| X X X X | 7 0 0 0 | 0 4 0 0 | 0 0 0 1 1 |
| X X X X | 7 0 0 0 | 0 5 0 0 | 0 0 0 1 1 |
| X X X X | 7 0 0 0 | 0 6 0 0 | 0 0 0 1 1 |
| X X X X | 7 0 0 0 | 0 7 0 0 | 0 0 0 1 1 |
| X X X X | 8 0 0 0 | 0 1 0 0 | 0 0 1 0 0 |
| X X X X | 8 0 0 0 | 0 2 0 0 | 0 0 1 0 0 |
| X X X X | 8 0 0 0 | 0 3 0 0 | 0 0 1 0 0 |
| X X X X | 8 0 0 0 | 0 4 0 0 | 0 0 1 0 0 |
| X X X X | 8 0 0 0 | 0 5 0 0 | 0 0 1 0 0 |
| X X X X | 8 0 0 0 | 0 6 0 0 | 0 0 1 0 0 |
| X X X X | 8 0 0 0 | 0 7 0 0 | 0 0 1 0 0 |
| X X X X | 9 0 0 0 | 0 1 0 0 | 0 0 1 0 1 |
| X X X X | 9 0 0 0 | 0 2 0 0 | 0 0 1 0 1 |
| X X X X | 9 0 0 0 | 0 3 0 0 | 0 0 1 0 1 |
| X X X X | 9 0 0 0 | 0 4 0 0 | 0 0 1 0 1 |
| X X X X | 9 0 0 0 | 0 5 0 0 | 0 0 1 0 1 |
| X X X X | 9 0 0 0 | 0 6 0 0 | 0 0 1 0 1 |
| X X X X | 9 0 0 0 | 0 7 0 0 | 0 0 1 0 1 |
| X X X X | 4 0 0 0 | 0 0 0 0 | 0 0 1 1 0 |
| X X X X | 4 0 0 0 | 0 0 X 0 | 0 0 1 1 0 |
| X X X X | 4 0 0 0 | 0 0 0 X | 0 0 1 1 0 |
| X X X X | 5 0 0 0 | 0 0 0 0 | 0 0 1 1 1 |
| X X X X | 5 0 0 0 | 0 0 X 0 | 0 0 1 1 1 |
| X X X X | 5 0 0 0 | 0 0 0 X | 0 0 1 1 1 |
| X X X X | 6 0 0 0 | 0 0 0 0 | 0 1 0 0 0 |
| X X X X | 6 0 0 0 | 0 0 X 0 | 0 1 0 0 0 |
| X X X X | 6 0 0 0 | 0 0 0 X | 0 1 0 0 0 |
| X X X X | 7 0 0 0 | 0 0 0 0 | 0 1 0 0 1 |
| X X X X | 7 0 0 0 | 0 0 X 0 | 0 1 0 0 1 |
| X X X X | 7 0 0 0 | 0 0 0 X | 0 1 0 0 1 |
| X X X X | 8 0 0 0 | 0 0 0 0 | 0 1 0 1 0 |

-continued

| Window Contents | | | X' |
|---|---|---|---|
| XXXX | 8000 | 00X0 | 01010 |
| XXXX | 8000 | 000X | 01010 |
| XXXX | 9000 | 0000 | 01011 |
| XXXX | 9000 | 00X0 | 01011 |
| XXXX | 9000 | 000X | 01011 |
| XXXX | 4000 | 1001 | 01100 |
| XXXX | 4000 | 1002 | 01100 |
| XXXX | 4000 | 1003 | 01100 |
| XXXX | 4000 | 1004 | 01100 |
| XXXX | 4000 | 1005 | 01100 |
| XXXX | 4000 | 1006 | 01100 |
| XXXX | 4000 | 1007 | 01100 |
| XXXX | 4000 | 1008 | 01100 |
| XXXX | 4000 | 1009 | 01100 |
| XXXX | 4000 | 2001 | 01100 |
| XXXX | 4000 | 2002 | 01100 |
| XXXX | 4000 | 2003 | 01100 |
| XXXX | 4000 | 2004 | 01100 |
| XXXX | 4000 | 2005 | 01100 |
| XXXX | 4000 | 2006 | 01100 |
| XXXX | 4000 | 2007 | 01100 |
| XXXX | 4000 | 2008 | 01100 |
| XXXX | 4000 | 2009 | 01100 |
| XXXX | 4000 | 3001 | 01100 |
| XXXX | 4000 | 3002 | 01100 |
| XXXX | 4000 | 3003 | 01100 |
| XXXX | 4000 | 3004 | 01100 |
| XXXX | 4000 | 3005 | 01100 |
| XXXX | 4000 | 3006 | 01100 |
| XXXX | 4000 | 3007 | 01100 |
| XXXX | 4000 | 3008 | 01100 |
| XXXX | 4000 | 3009 | 01100 |
| XXXX | 4000 | 4001 | 01100 |
| XXXX | 4000 | 4002 | 01100 |
| XXXX | 4000 | 4003 | 01100 |
| XXXX | 4000 | 4004 | 01100 |
| XXXX | 4000 | 4005 | 01100 |
| XXXX | 5000 | 1001 | 01101 |
| XXXX | 5000 | 1002 | 01101 |
| XXXX | 5000 | 1003 | 01101 |
| XXXX | 5000 | 1004 | 01101 |
| XXXX | 5000 | 1005 | 01101 |
| XXXX | 5000 | 1006 | 01101 |
| XXXX | 5000 | 1007 | 01101 |
| XXXX | 5000 | 1008 | 01101 |
| XXXX | 5000 | 1009 | 01101 |
| XXXX | 5000 | 2001 | 01101 |
| XXXX | 5000 | 2002 | 01101 |
| XXXX | 5000 | 2003 | 01101 |
| XXXX | 5000 | 2004 | 01101 |
| XXXX | 5000 | 2005 | 01101 |
| XXXX | 5000 | 2006 | 01101 |
| XXXX | 5000 | 2007 | 01101 |
| XXXX | 5000 | 2008 | 01101 |
| XXXX | 5000 | 2009 | 01101 |
| XXXX | 5000 | 3001 | 01101 |
| XXXX | 5000 | 3002 | 01101 |
| XXXX | 5000 | 3003 | 01101 |
| XXXX | 5000 | 3004 | 01101 |
| XXXX | 5000 | 3005 | 01101 |
| XXXX | 5000 | 3006 | 01101 |
| XXXX | 5000 | 3007 | 01101 |
| XXXX | 5000 | 3008 | 01101 |
| XXXX | 5000 | 3009 | 01101 |
| XXXX | 5000 | 4001 | 01101 |
| XXXX | 5000 | 4002 | 01101 |
| XXXX | 5000 | 4003 | 01101 |
| XXXX | 5000 | 4004 | 01101 |
| XXXX | 5000 | 4005 | 01101 |
| XXXX | 6000 | 1001 | 01110 |
| XXXX | 6000 | 1002 | 01110 |
| XXXX | 6000 | 1003 | 01110 |
| XXXX | 6000 | 1004 | 01110 |
| XXXX | 6000 | 1005 | 01110 |
| XXXX | 6000 | 1006 | 01110 |
| XXXX | 6000 | 1007 | 01110 |
| XXXX | 6000 | 1008 | 01110 |

-continued

| Window Contents | | | X' |
|---|---|---|---|
| XXXX | 6000 | 1009 | 01110 |
| XXXX | 6000 | 2001 | 01110 |
| XXXX | 6000 | 2002 | 01110 |
| XXXX | 6000 | 2003 | 01110 |
| XXXX | 6000 | 2004 | 01110 |
| XXXX | 6000 | 2005 | 01110 |
| XXXX | 6000 | 2006 | 01110 |
| XXXX | 6000 | 2007 | 01110 |
| XXXX | 6000 | 2008 | 01110 |
| XXXX | 6000 | 2009 | 01110 |
| XXXX | 6000 | 3001 | 01110 |
| XXXX | 6000 | 3002 | 01110 |
| XXXX | 6000 | 3003 | 01110 |
| XXXX | 6000 | 3004 | 01110 |
| XXXX | 6000 | 3005 | 01110 |
| XXXX | 6000 | 3006 | 01110 |
| XXXX | 6000 | 3007 | 01110 |
| XXXX | 6000 | 3008 | 01110 |
| XXXX | 6000 | 3009 | 01110 |
| XXXX | 6000 | 4001 | 01110 |
| XXXX | 6000 | 4002 | 01110 |
| XXXX | 6000 | 4003 | 01110 |
| XXXX | 6000 | 4004 | 01110 |
| XXXX | 6000 | 4005 | 01110 |
| XXXX | 7000 | 1001 | 01111 |
| XXXX | 7000 | 1002 | 01111 |
| XXXX | 7000 | 1003 | 01111 |
| XXXX | 7000 | 1004 | 01111 |
| XXXX | 7000 | 1005 | 01111 |
| XXXX | 7000 | 1006 | 01111 |
| XXXX | 7000 | 1007 | 01111 |
| XXXX | 7000 | 1008 | 01111 |
| XXXX | 7000 | 1009 | 01111 |
| XXXX | 7000 | 2001 | 01111 |
| XXXX | 7000 | 2002 | 01111 |
| XXXX | 7000 | 2003 | 01111 |
| XXXX | 7000 | 2004 | 01111 |
| XXXX | 7000 | 2005 | 01111 |
| XXXX | 7000 | 2006 | 01111 |
| XXXX | 7000 | 2007 | 01111 |
| XXXX | 7000 | 2008 | 01111 |
| XXXX | 7000 | 2009 | 01111 |
| XXXX | 7000 | 3001 | 01111 |
| XXXX | 7000 | 3002 | 01111 |
| XXXX | 7000 | 3003 | 01111 |
| XXXX | 7000 | 3004 | 01111 |
| XXXX | 7000 | 3005 | 01111 |
| XXXX | 7000 | 3006 | 01111 |
| XXXX | 7000 | 3007 | 01111 |
| XXXX | 7000 | 3008 | 01111 |
| XXXX | 7000 | 3009 | 01111 |
| XXXX | 7000 | 4001 | 01111 |
| XXXX | 7000 | 4002 | 01111 |
| XXXX | 7000 | 4003 | 01111 |
| XXXX | 7000 | 4004 | 01111 |
| XXXX | 7000 | 4005 | 01111 |
| XXXX | 8000 | 1001 | 10000 |
| XXXX | 8000 | 1002 | 10000 |
| XXXX | 8000 | 1003 | 10000 |
| XXXX | 8000 | 1004 | 10000 |
| XXXX | 8000 | 1005 | 10000 |
| XXXX | 8000 | 1006 | 10000 |
| XXXX | 8000 | 1007 | 10000 |
| XXXX | 8000 | 1008 | 10000 |
| XXXX | 8000 | 1009 | 10000 |
| XXXX | 8000 | 2001 | 10000 |
| XXXX | 8000 | 2002 | 10000 |
| XXXX | 8000 | 2003 | 10000 |
| XXXX | 8000 | 2004 | 10000 |
| XXXX | 8000 | 2005 | 10000 |
| XXXX | 8000 | 2006 | 10000 |
| XXXX | 8000 | 2007 | 10000 |
| XXXX | 8000 | 2008 | 10000 |
| XXXX | 8000 | 2009 | 10000 |
| XXXX | 8000 | 3001 | 10000 |
| XXXX | 8000 | 3002 | 10000 |
| XXXX | 8000 | 3003 | 10000 |

-continued

| Window Contents | | | X' |
|---|---|---|---|
| XXXX | 8000 | 3004 | 10000 |
| XXXX | 8000 | 3005 | 10000 |
| XXXX | 8000 | 3006 | 10000 |
| XXXX | 8000 | 3007 | 10000 |
| XXXX | 8000 | 3008 | 10000 |
| XXXX | 8000 | 3009 | 10000 |
| XXXX | 8000 | 4001 | 10000 |
| XXXX | 8000 | 4002 | 10000 |
| XXXX | 8000 | 4003 | 10000 |
| XXXX | 8000 | 4004 | 10000 |
| XXXX | 8000 | 4005 | 10000 |
| XXXX | 9000 | 1001 | 10001 |
| XXXX | 9000 | 1002 | 10001 |
| XXXX | 9000 | 1003 | 10001 |
| XXXX | 9000 | 1004 | 10001 |
| XXXX | 9000 | 1005 | 10001 |
| XXXX | 9000 | 1006 | 10001 |
| XXXX | 9000 | 1007 | 10001 |
| XXXX | 9000 | 1008 | 10001 |
| XXXX | 9000 | 1009 | 10001 |
| XXXX | 9000 | 2001 | 10001 |
| XXXX | 9000 | 2002 | 10001 |
| XXXX | 9000 | 2003 | 10001 |
| XXXX | 9000 | 2004 | 10001 |
| XXXX | 9000 | 2005 | 10001 |
| XXXX | 9000 | 2006 | 10001 |
| XXXX | 9000 | 2007 | 10001 |
| XXXX | 9000 | 2008 | 10001 |
| XXXX | 9000 | 2009 | 10001 |
| XXXX | 9000 | 3001 | 10001 |
| XXXX | 9000 | 3002 | 10001 |
| XXXX | 9000 | 3003 | 10001 |
| XXXX | 9000 | 3004 | 10001 |
| XXXX | 9000 | 3005 | 10001 |
| XXXX | 9000 | 3006 | 10001 |
| XXXX | 9000 | 3007 | 10001 |
| XXXX | 9000 | 3008 | 10001 |
| XXXX | 9000 | 3009 | 10001 |
| XXXX | 9000 | 4001 | 10001 |
| XXXX | 9000 | 4002 | 10001 |
| XXXX | 9000 | 4003 | 10001 |
| XXXX | 9000 | 4004 | 10001 |
| XXXX | 9000 | 4005 | 10001 |
| XXXX | 4000 | 4006 | 10010 |
| XXXX | 4000 | 4007 | 10010 |
| XXXX | 4000 | 4008 | 10010 |
| XXXX | 4000 | 4009 | 10010 |
| XXXX | 4000 | 5001 | 10010 |
| XXXX | 4000 | 5002 | 10010 |
| XXXX | 4000 | 5003 | 10010 |
| XXXX | 4000 | 5004 | 10010 |
| XXXX | 4000 | 5005 | 10010 |
| XXXX | 4000 | 5006 | 10010 |
| XXXX | 4000 | 5007 | 10010 |
| XXXX | 4000 | 5008 | 10010 |
| XXXX | 4000 | 5009 | 10010 |
| XXXX | 4000 | 6001 | 10010 |
| XXXX | 4000 | 6002 | 10010 |
| XXXX | 4000 | 6003 | 10010 |
| XXXX | 4000 | 6004 | 10010 |
| XXXX | 4000 | 6005 | 10010 |
| XXXX | 4000 | 6006 | 10010 |
| XXXX | 4000 | 6007 | 10010 |
| XXXX | 4000 | 6008 | 10010 |
| XXXX | 4000 | 6009 | 10010 |
| XXXX | 4000 | 7001 | 10010 |
| XXXX | 4000 | 7002 | 10010 |
| XXXX | 4000 | 7003 | 10010 |
| XXXX | 4000 | 7004 | 10010 |
| XXXX | 4000 | 7005 | 10010 |
| XXXX | 4000 | 7006 | 10010 |
| XXXX | 4000 | 7007 | 10010 |
| XXXX | 4000 | 7008 | 10010 |
| XXXX | 4000 | 7009 | 10010 |
| XXXX | 4000 | 8001 | 10010 |
| XXXX | 5000 | 4006 | 10011 |
| XXXX | 5000 | 4007 | 10011 |

-continued

| Window Contents | | | X' |
|---|---|---|---|
| XXXX | 5000 | 4008 | 10011 |
| XXXX | 5000 | 4009 | 10011 |
| XXXX | 5000 | 5001 | 10011 |
| XXXX | 5000 | 5002 | 10011 |
| XXXX | 5000 | 5003 | 10011 |
| XXXX | 5000 | 5004 | 10011 |
| XXXX | 5000 | 5005 | 10011 |
| XXXX | 5000 | 5006 | 10011 |
| XXXX | 5000 | 5007 | 10011 |
| XXXX | 5000 | 5008 | 10011 |
| XXXX | 5000 | 5009 | 10011 |
| XXXX | 5000 | 6001 | 10011 |
| XXXX | 5000 | 6002 | 10011 |
| XXXX | 5000 | 6003 | 10011 |
| XXXX | 5000 | 6004 | 10011 |
| XXXX | 5000 | 6005 | 10011 |
| XXXX | 5000 | 6006 | 10011 |
| XXXX | 5000 | 6007 | 10011 |
| XXXX | 5000 | 6008 | 10011 |
| XXXX | 5000 | 6009 | 10011 |
| XXXX | 5000 | 7001 | 10011 |
| XXXX | 5000 | 7002 | 10011 |
| XXXX | 5000 | 7003 | 10011 |
| XXXX | 5000 | 7004 | 10011 |
| XXXX | 5000 | 7005 | 10011 |
| XXXX | 5000 | 7006 | 10011 |
| XXXX | 5000 | 7007 | 10011 |
| XXXX | 5000 | 7008 | 10011 |
| XXXX | 5000 | 7009 | 10011 |
| XXXX | 5000 | 8001 | 10011 |
| XXXX | 6000 | 4006 | 10100 |
| XXXX | 6000 | 4007 | 10100 |
| XXXX | 6000 | 4008 | 10100 |
| XXXX | 6000 | 4009 | 10100 |
| XXXX | 6000 | 5001 | 10100 |
| XXXX | 6000 | 5002 | 10100 |
| XXXX | 6000 | 5003 | 10100 |
| XXXX | 6000 | 5004 | 10100 |
| XXXX | 6000 | 5005 | 10100 |
| XXXX | 6000 | 5006 | 10100 |
| XXXX | 6000 | 5007 | 10100 |
| XXXX | 6000 | 5008 | 10100 |
| XXXX | 6000 | 5009 | 10100 |
| XXXX | 6000 | 6001 | 10100 |
| XXXX | 6000 | 6002 | 10100 |
| XXXX | 6000 | 6003 | 10100 |
| XXXX | 6000 | 6004 | 10100 |
| XXXX | 6000 | 6005 | 10100 |
| XXXX | 6000 | 6006 | 10100 |
| XXXX | 6000 | 6007 | 10100 |
| XXXX | 6000 | 6008 | 10100 |
| XXXX | 6000 | 6009 | 10100 |
| XXXX | 6000 | 7001 | 10100 |
| XXXX | 6000 | 7002 | 10100 |
| XXXX | 6000 | 7003 | 10100 |
| XXXX | 6000 | 7004 | 10100 |
| XXXX | 6000 | 7005 | 10100 |
| XXXX | 6000 | 7006 | 10100 |
| XXXX | 6000 | 7007 | 10100 |
| XXXX | 6000 | 7008 | 10100 |
| XXXX | 6000 | 7009 | 10100 |
| XXXX | 6000 | 8001 | 10100 |
| XXXX | 7000 | 4006 | 10101 |
| XXXX | 7000 | 4007 | 10101 |
| XXXX | 7000 | 4008 | 10101 |
| XXXX | 7000 | 4009 | 10101 |
| XXXX | 7000 | 5001 | 10101 |
| XXXX | 7000 | 5002 | 10101 |
| XXXX | 7000 | 5003 | 10101 |
| XXXX | 7000 | 5004 | 10101 |
| XXXX | 7000 | 5005 | 10101 |
| XXXX | 7000 | 5006 | 10101 |
| XXXX | 7000 | 5007 | 10101 |
| XXXX | 7000 | 5008 | 10101 |
| XXXX | 7000 | 5009 | 10101 |
| XXXX | 7000 | 6001 | 10101 |
| XXXX | 7000 | 6002 | 10101 |

-continued

| Window Contents | | | X' |
|---|---|---|---|
| XXXX | 7000 | 6003 | 10101 |
| XXXX | 7000 | 6004 | 10101 |
| XXXX | 7000 | 6005 | 10101 |
| XXXX | 7000 | 6006 | 10101 |
| XXXX | 7000 | 6007 | 10101 |
| XXXX | 7000 | 6008 | 10101 |
| XXXX | 7000 | 6009 | 10101 |
| XXXX | 7000 | 7001 | 10101 |
| XXXX | 7000 | 7002 | 10101 |
| XXXX | 7000 | 7003 | 10101 |
| XXXX | 7000 | 7004 | 10101 |
| XXXX | 7000 | 7005 | 10101 |
| XXXX | 7000 | 7006 | 10101 |
| XXXX | 7000 | 7007 | 10101 |
| XXXX | 7000 | 7008 | 10101 |
| XXXX | 7000 | 7009 | 10101 |
| XXXX | 7000 | 8001 | 10101 |
| XXXX | 8000 | 4006 | 10110 |
| XXXX | 8000 | 4007 | 10110 |
| XXXX | 8000 | 4008 | 10110 |
| XXXX | 8000 | 4009 | 10110 |
| XXXX | 8000 | 5001 | 10110 |
| XXXX | 8000 | 5002 | 10110 |
| XXXX | 8000 | 5003 | 10110 |
| XXXX | 8000 | 5004 | 10110 |
| XXXX | 8000 | 5005 | 10110 |
| XXXX | 8000 | 5006 | 10110 |
| XXXX | 8000 | 5007 | 10110 |
| XXXX | 8000 | 5008 | 10110 |
| XXXX | 8000 | 5009 | 10110 |
| XXXX | 8000 | 6001 | 10110 |
| XXXX | 8000 | 6002 | 10110 |
| XXXX | 8000 | 6003 | 10110 |
| XXXX | 8000 | 6004 | 10110 |
| XXXX | 8000 | 6005 | 10110 |
| XXXX | 8000 | 6006 | 10110 |
| XXXX | 8000 | 6007 | 10110 |
| XXXX | 8000 | 6008 | 10110 |
| XXXX | 8000 | 6009 | 10110 |
| XXXX | 8000 | 7001 | 10110 |
| XXXX | 8000 | 7002 | 10110 |
| XXXX | 8000 | 7003 | 10110 |
| XXXX | 8000 | 7004 | 10110 |
| XXXX | 8000 | 7005 | 10110 |
| XXXX | 8000 | 7006 | 10110 |
| XXXX | 8000 | 7007 | 10110 |
| XXXX | 8000 | 7008 | 10110 |
| XXXX | 8000 | 7009 | 10110 |
| XXXX | 8000 | 8001 | 10110 |
| XXXX | 9000 | 4006 | 10111 |
| XXXX | 9000 | 4007 | 10111 |
| XXXX | 9000 | 4008 | 10111 |
| XXXX | 9000 | 4009 | 10111 |
| XXXX | 9000 | 5001 | 10111 |
| XXXX | 9000 | 5002 | 10111 |
| XXXX | 9000 | 5003 | 10111 |
| XXXX | 9000 | 5004 | 10111 |
| XXXX | 9000 | 5005 | 10111 |
| XXXX | 9000 | 5006 | 10111 |
| XXXX | 9000 | 5007 | 10111 |
| XXXX | 9000 | 5008 | 10111 |
| XXXX | 9000 | 5009 | 10111 |
| XXXX | 9000 | 6001 | 10111 |
| XXXX | 9000 | 6002 | 10111 |
| XXXX | 9000 | 6003 | 10111 |
| XXXX | 9000 | 6004 | 10111 |
| XXXX | 9000 | 6005 | 10111 |
| XXXX | 9000 | 6006 | 10111 |
| XXXX | 9000 | 6007 | 10111 |
| XXXX | 9000 | 6008 | 10111 |
| XXXX | 9000 | 6009 | 10111 |
| XXXX | 9000 | 7001 | 10111 |
| XXXX | 9000 | 7002 | 10111 |
| XXXX | 9000 | 7003 | 10111 |
| XXXX | 9000 | 7004 | 10111 |
| XXXX | 9000 | 7005 | 10111 |
| XXXX | 9000 | 7006 | 10111 |

-continued

| Window Contents | | | X' |
|---|---|---|---|
| XXXX | 9000 | 7007 | 10111 |
| XXXX | 9000 | 7008 | 10111 |
| XXXX | 9000 | 7009 | 10111 |
| XXXX | 9000 | 8001 | 10111 |
| XXXX | 4000 | 8002 | 11000 |
| XXXX | 4000 | 8003 | 11000 |
| XXXX | 4000 | 8004 | 11000 |
| XXXX | 4000 | 8005 | 11000 |
| XXXX | 4000 | 8006 | 11000 |
| XXXX | 4000 | 8007 | 11000 |
| XXXX | 4000 | 8008 | 11000 |
| XXXX | 4000 | 8009 | 11000 |
| XXXX | 4000 | 9001 | 11000 |
| XXXX | 4000 | 9002 | 11000 |
| XXXX | 4000 | 9003 | 11000 |
| XXXX | 4000 | 9004 | 11000 |
| XXXX | 4000 | 9005 | 11000 |
| XXXX | 4000 | 9006 | 11000 |
| XXXX | 4000 | 9007 | 11000 |
| XXXX | 4000 | 9008 | 11000 |
| XXXX | 4000 | 9009 | 11000 |
| XXXX | 4000 | 1000 | 11000 |
| XXXX | 4000 | 2000 | 11000 |
| XXXX | 4000 | 3000 | 11000 |
| XXXX | 5000 | 8002 | 11001 |
| XXXX | 5000 | 8003 | 11001 |
| XXXX | 5000 | 8004 | 11001 |
| XXXX | 5000 | 8005 | 11001 |
| XXXX | 5000 | 8006 | 11001 |
| XXXX | 5000 | 8007 | 11001 |
| XXXX | 5000 | 8008 | 11001 |
| XXXX | 5000 | 8009 | 11001 |
| XXXX | 5000 | 9001 | 11001 |
| XXXX | 5000 | 9002 | 11001 |
| XXXX | 5000 | 9003 | 11001 |
| XXXX | 5000 | 9004 | 11001 |
| XXXX | 5000 | 9005 | 11001 |
| XXXX | 5000 | 9006 | 11001 |
| XXXX | 5000 | 9007 | 11001 |
| XXXX | 5000 | 9008 | 11001 |
| XXXX | 5000 | 9009 | 11001 |
| XXXX | 5000 | 1000 | 11001 |
| XXXX | 5000 | 2000 | 11001 |
| XXXX | 5000 | 3000 | 11001 |
| XXXX | 6000 | 8002 | 11010 |
| XXXX | 6000 | 8003 | 11010 |
| XXXX | 6000 | 8004 | 11010 |
| XXXX | 6000 | 8005 | 11010 |
| XXXX | 6000 | 8006 | 11010 |
| XXXX | 6000 | 8007 | 11010 |
| XXXX | 6000 | 8008 | 11010 |
| XXXX | 6000 | 8009 | 11010 |
| XXXX | 6000 | 9001 | 11010 |
| XXXX | 6000 | 9002 | 11010 |
| XXXX | 6000 | 9003 | 11010 |
| XXXX | 6000 | 9004 | 11010 |
| XXXX | 6000 | 9005 | 11010 |
| XXXX | 6000 | 9006 | 11010 |
| XXXX | 6000 | 9007 | 11010 |
| XXXX | 6000 | 9008 | 11010 |
| XXXX | 6000 | 9009 | 11010 |
| XXXX | 6000 | 1000 | 11010 |
| XXXX | 6000 | 2000 | 11010 |
| XXXX | 6000 | 3000 | 11010 |
| XXXX | 7000 | 8002 | 11011 |
| XXXX | 7000 | 8003 | 11011 |
| XXXX | 7000 | 8004 | 11011 |
| XXXX | 7000 | 8005 | 11011 |
| XXXX | 7000 | 8006 | 11011 |
| XXXX | 7000 | 8007 | 11011 |
| XXXX | 7000 | 8008 | 11011 |
| XXXX | 7000 | 8009 | 11011 |
| XXXX | 7000 | 9001 | 11011 |
| XXXX | 7000 | 9002 | 11011 |
| XXXX | 7000 | 9003 | 11011 |
| XXXX | 7000 | 9004 | 11011 |
| XXXX | 7000 | 9005 | 11011 |

-continued

| Window Contents | | | X' |
|---|---|---|---|
| XXXX | 7000 | 9006 | 11011 |
| XXXX | 7000 | 9007 | 11011 |
| XXXX | 7000 | 9008 | 11011 |
| XXXX | 7000 | 9009 | 11011 |
| XXXX | 7000 | 1000 | 11011 |
| XXXX | 7000 | 2000 | 11011 |
| XXXX | 7000 | 3000 | 11011 |
| XXXX | 8000 | 8002 | 11100 |
| XXXX | 8000 | 8003 | 11100 |
| XXXX | 8000 | 8004 | 11100 |
| XXXX | 8000 | 8005 | 11100 |
| XXXX | 8000 | 8006 | 11100 |
| XXXX | 8000 | 8007 | 11100 |
| XXXX | 8000 | 8008 | 11100 |
| XXXX | 8000 | 8009 | 11100 |
| XXXX | 8000 | 9001 | 11100 |
| XXXX | 8000 | 9002 | 11100 |
| XXXX | 8000 | 9003 | 11100 |
| XXXX | 8000 | 9004 | 11100 |
| XXXX | 8000 | 9005 | 11100 |
| XXXX | 8000 | 9006 | 11100 |
| XXXX | 8000 | 9007 | 11100 |
| XXXX | 8000 | 9008 | 11100 |
| XXXX | 8000 | 9009 | 11100 |
| XXXX | 8000 | 1000 | 11100 |
| XXXX | 8000 | 2000 | 11100 |
| XXXX | 8000 | 3000 | 11100 |
| XXXX | 9000 | 8002 | 11101 |
| XXXX | 9000 | 8003 | 11101 |
| XXXX | 9000 | 8004 | 11101 |
| XXXX | 9000 | 8005 | 11101 |
| XXXX | 9000 | 8006 | 11101 |
| XXXX | 9000 | 8007 | 11101 |
| XXXX | 9000 | 8008 | 11101 |
| XXXX | 9000 | 8009 | 11101 |
| XXXX | 9000 | 9001 | 11101 |
| XXXX | 9000 | 9002 | 11101 |
| XXXX | 9000 | 9003 | 11101 |
| XXXX | 9000 | 9004 | 11101 |
| XXXX | 9000 | 9005 | 11101 |
| XXXX | 9000 | 9006 | 11101 |
| XXXX | 9000 | 9007 | 11101 |
| XXXX | 9000 | 9008 | 11101 |
| XXXX | 9000 | 9009 | 11101 |
| XXXX | 9000 | 1000 | 11101 |
| XXXX | 9000 | 2000 | 11101 |
| XXXX | 9000 | 3000 | 11101 |
| XXXX | 0800 | XXXX | 11110 |
| XXXX | 0900 | XXXX | 11111. |

8. The method of claim 6, wherein said look-up step comprises the step of determining, using a squared euclidean distance, which table entry is identified by a sequence of code symbols.

9. The method of claim 3, further comprising the step of modulating a signal with said waveform signal amplitudes to generate a series of features, each feature being at a level corresponding to a waveform signal amplitude; and wherein said waveform signal amplitudes modulate a transmitter and wherein said transmitter transmits said features over a communications channel.

10. A method for decoding data on a channel, wherein said data has been encoded using an M=10 (2,10) code, comprising the steps of:

reading the data to recover output waveform signal amplitudes;

converting said output waveform signal amplitudes into output code symbols, wherein each output code symbol is at one of ten levels; and decoding said output code symbols to obtain output data bits, wherein said output data bits correspond to the encoded data.

11. The method of claim 10, wherein said decoding step comprises the steps of:

identifying with a sliding window a sequence of code symbols that represents a given code symbol set; and in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit set for said given code symbol set.

12. The method of claim 11, wherein said table provides an output bit set x' for each sequence of code symbols y' according to the following table:

| Window Contents | | | X' |
|---|---|---|---|
| 000X | 0000 | 0100 | 00000 |
| 000X | 0000 | 0200 | 00000 |
| 000X | 0000 | 0300 | 00000 |
| 000X | 0000 | 0400 | 00000 |
| 000X | 0000 | 0500 | 00000 |
| 000X | 0000 | 0600 | 00000 |
| 000X | 0000 | 0700 | 00000 |
| 00X0 | 0000 | 0100 | 00000 |
| 00X0 | 0000 | 0200 | 00000 |
| 00X0 | 0000 | 0300 | 00000 |
| 00X0 | 0000 | 0400 | 00000 |
| 00X0 | 0000 | 0500 | 00000 |
| 00X0 | 0000 | 0600 | 00000 |
| 00X0 | 0000 | 0700 | 00000 |
| X00X | 0000 | 0100 | 00000 |
| X00X | 0000 | 0200 | 00000 |
| X00X | 0000 | 0300 | 00000 |
| X00X | 0000 | 0400 | 00000 |
| X00X | 0000 | 0500 | 00000 |
| X00X | 0000 | 0600 | 00000 |
| X00X | 0000 | 0700 | 00000 |
| 000X | 0000 | 0000 | 00001 |
| 000X | 0000 | 00X0 | 00001 |
| 000X | 0000 | 000X | 00001 |
| 00X0 | 0000 | 0000 | 00001 |
| 00X0 | 0000 | 00X0 | 00001 |
| 00X0 | 0000 | 000X | 00001 |
| X00X | 0000 | 0000 | 00001 |
| X00X | 0000 | 00X0 | 00001 |
| X00X | 0000 | 000X | 00001 |
| 000X | 0000 | 1001 | 00010 |
| 000X | 0000 | 1002 | 00010 |
| 000X | 0000 | 1003 | 00010 |
| 000X | 0000 | 1004 | 00010 |
| 000X | 0000 | 1005 | 00010 |
| 000X | 0000 | 1006 | 00010 |
| 000X | 0000 | 1007 | 00010 |
| 000X | 0000 | 1008 | 00010 |
| 000X | 0000 | 1009 | 00010 |
| 000X | 0000 | 2001 | 00010 |
| 000X | 0000 | 2002 | 00010 |
| 000X | 0000 | 2003 | 00010 |
| 000X | 0000 | 2004 | 00010 |
| 000X | 0000 | 2005 | 00010 |
| 000X | 0000 | 2006 | 00010 |
| 000X | 0000 | 2007 | 00010 |
| 000X | 0000 | 2008 | 00010 |
| 000X | 0000 | 2009 | 00010 |
| 000X | 0000 | 3001 | 00010 |
| 000X | 0000 | 3002 | 00010 |
| 000X | 0000 | 3003 | 00010 |
| 000X | 0000 | 3004 | 00010 |
| 000X | 0000 | 3005 | 00010 |
| 000X | 0000 | 3006 | 00010 |
| 000X | 0000 | 3007 | 00010 |

-continued

| Window Contents | | | X' |
|---|---|---|---|
| 0 0 0 X | 0 0 0 0 | 3 0 0 8 | 0 0 0 1 0 |
| 0 0 0 X | 0 0 0 0 | 3 0 0 9 | 0 0 0 1 0 |
| 0 0 0 X | 0 0 0 0 | 4 0 0 1 | 0 0 0 1 0 |
| 0 0 0 X | 0 0 0 0 | 4 0 0 2 | 0 0 0 1 0 |
| 0 0 0 X | 0 0 0 0 | 4 0 0 3 | 0 0 0 1 0 |
| 0 0 0 X | 0 0 0 0 | 4 0 0 4 | 0 0 0 1 0 |
| 0 0 0 X | 0 0 0 0 | 4 0 0 5 | 0 0 0 1 0 |
| 0 0 X 0 | 0 0 0 0 | 1 0 0 1 | 0 0 0 1 0 |
| 0 0 X 0 | 0 0 0 0 | 1 0 0 2 | 0 0 0 1 0 |
| 0 0 X 0 | 0 0 0 0 | 1 0 0 3 | 0 0 0 1 0 |
| 0 0 X 0 | 0 0 0 0 | 1 0 0 4 | 0 0 0 1 0 |
| 0 0 X 0 | 0 0 0 0 | 1 0 0 5 | 0 0 0 1 0 |
| 0 0 X 0 | 0 0 0 0 | 1 0 0 6 | 0 0 0 1 0 |
| 0 0 X 0 | 0 0 0 0 | 1 0 0 7 | 0 0 0 1 0 |
| 0 0 X 0 | 0 0 0 0 | 1 0 0 8 | 0 0 0 1 0 |
| 0 0 X 0 | 0 0 0 0 | 1 0 0 9 | 0 0 0 1 0 |
| 0 0 X 0 | 0 0 0 0 | 2 0 0 1 | 0 0 0 1 0 |
| 0 0 X 0 | 0 0 0 0 | 2 0 0 2 | 0 0 0 1 0 |
| 0 0 X 0 | 0 0 0 0 | 2 0 0 3 | 0 0 0 1 0 |
| 0 0 X 0 | 0 0 0 0 | 2 0 0 4 | 0 0 0 1 0 |
| 0 0 X 0 | 0 0 0 0 | 2 0 0 5 | 0 0 0 1 0 |
| 0 0 X 0 | 0 0 0 0 | 2 0 0 6 | 0 0 0 1 0 |
| 0 0 X 0 | 0 0 0 0 | 2 0 0 7 | 0 0 0 1 0 |
| 0 0 X 0 | 0 0 0 0 | 2 0 0 8 | 0 0 0 1 0 |
| 0 0 X 0 | 0 0 0 0 | 2 0 0 9 | 0 0 0 1 0 |
| 0 0 X 0 | 0 0 0 0 | 3 0 0 1 | 0 0 0 1 0 |
| 0 0 X 0 | 0 0 0 0 | 3 0 0 2 | 0 0 0 1 0 |
| 0 0 X 0 | 0 0 0 0 | 3 0 0 3 | 0 0 0 1 0 |
| 0 0 X 0 | 0 0 0 0 | 3 0 0 4 | 0 0 0 1 0 |
| 0 0 X 0 | 0 0 0 0 | 3 0 0 5 | 0 0 0 1 0 |
| 0 0 X 0 | 0 0 0 0 | 3 0 0 6 | 0 0 0 1 0 |
| 0 0 X 0 | 0 0 0 0 | 3 0 0 7 | 0 0 0 1 0 |
| 0 0 X 0 | 0 0 0 0 | 3 0 0 8 | 0 0 0 1 0 |
| 0 0 X 0 | 0 0 0 0 | 3 0 0 9 | 0 0 0 1 0 |
| 0 0 X 0 | 0 0 0 0 | 4 0 0 1 | 0 0 0 1 0 |
| 0 0 X 0 | 0 0 0 0 | 4 0 0 2 | 0 0 0 1 0 |
| 0 0 X 0 | 0 0 0 0 | 4 0 0 3 | 0 0 0 1 0 |
| 0 0 X 0 | 0 0 0 0 | 4 0 0 4 | 0 0 0 1 0 |
| 0 0 X 0 | 0 0 0 0 | 4 0 0 5 | 0 0 0 1 0 |
| X 0 0 X | 0 0 0 0 | 1 0 0 1 | 0 0 0 1 0 |
| X 0 0 X | 0 0 0 0 | 1 0 0 2 | 0 0 0 1 0 |
| X 0 0 X | 0 0 0 0 | 1 0 0 3 | 0 0 0 1 0 |
| X 0 0 X | 0 0 0 0 | 1 0 0 4 | 0 0 0 1 0 |
| X 0 0 X | 0 0 0 0 | 1 0 0 5 | 0 0 0 1 0 |
| X 0 0 X | 0 0 0 0 | 1 0 0 6 | 0 0 0 1 0 |
| X 0 0 X | 0 0 0 0 | 1 0 0 7 | 0 0 0 1 0 |
| X 0 0 X | 0 0 0 0 | 1 0 0 8 | 0 0 0 1 0 |
| X 0 0 X | 0 0 0 0 | 1 0 0 9 | 0 0 0 1 0 |
| X 0 0 X | 0 0 0 0 | 2 0 0 1 | 0 0 0 1 0 |
| X 0 0 X | 0 0 0 0 | 2 0 0 2 | 0 0 0 1 0 |
| X 0 0 X | 0 0 0 0 | 2 0 0 3 | 0 0 0 1 0 |
| X 0 0 X | 0 0 0 0 | 2 0 0 4 | 0 0 0 1 0 |
| X 0 0 X | 0 0 0 0 | 2 0 0 5 | 0 0 0 1 0 |
| X 0 0 X | 0 0 0 0 | 2 0 0 6 | 0 0 0 1 0 |
| X 0 0 X | 0 0 0 0 | 2 0 0 7 | 0 0 0 1 0 |
| X 0 0 X | 0 0 0 0 | 2 0 0 8 | 0 0 0 1 0 |
| X 0 0 X | 0 0 0 0 | 2 0 0 9 | 0 0 0 1 0 |
| X 0 0 X | 0 0 0 0 | 3 0 0 1 | 0 0 0 1 0 |
| X 0 0 X | 0 0 0 0 | 3 0 0 2 | 0 0 0 1 0 |
| X 0 0 X | 0 0 0 0 | 3 0 0 3 | 0 0 0 1 0 |
| X 0 0 X | 0 0 0 0 | 3 0 0 4 | 0 0 0 1 0 |
| X 0 0 X | 0 0 0 0 | 3 0 0 5 | 0 0 0 1 0 |
| X 0 0 X | 0 0 0 0 | 3 0 0 6 | 0 0 0 1 0 |
| X 0 0 X | 0 0 0 0 | 3 0 0 7 | 0 0 0 1 0 |
| X 0 0 X | 0 0 0 0 | 3 0 0 8 | 0 0 0 1 0 |
| X 0 0 X | 0 0 0 0 | 3 0 0 9 | 0 0 0 1 0 |
| X 0 0 X | 0 0 0 0 | 4 0 0 1 | 0 0 0 1 0 |
| X 0 0 X | 0 0 0 0 | 4 0 0 2 | 0 0 0 1 0 |
| X 0 0 X | 0 0 0 0 | 4 0 0 3 | 0 0 0 1 0 |
| X 0 0 X | 0 0 0 0 | 4 0 0 4 | 0 0 0 1 0 |
| X 0 0 X | 0 0 0 0 | 4 0 0 5 | 0 0 0 1 0 |
| 0 0 0 X | 0 0 0 0 | 4 0 0 6 | 0 0 0 1 1 |
| 0 0 0 X | 0 0 0 0 | 4 0 0 7 | 0 0 0 1 1 |
| 0 0 0 X | 0 0 0 0 | 4 0 0 8 | 0 0 0 1 1 |
| 0 0 0 X | 0 0 0 0 | 4 0 0 9 | 0 0 0 1 1 |
| 0 0 0 X | 0 0 0 0 | 5 0 0 1 | 0 0 0 1 1 |
| 0 0 0 X | 0 0 0 0 | 5 0 0 2 | 0 0 0 1 1 |

-continued

| Window Contents | | | X' |
|---|---|---|---|
| 0 0 0 X | 0 0 0 0 | 5 0 0 3 | 0 0 0 1 1 |
| 0 0 0 X | 0 0 0 0 | 5 0 0 4 | 0 0 0 1 1 |
| 0 0 0 X | 0 0 0 0 | 5 0 0 5 | 0 0 0 1 1 |
| 0 0 0 X | 0 0 0 0 | 5 0 0 6 | 0 0 0 1 1 |
| 0 0 0 X | 0 0 0 0 | 5 0 0 7 | 0 0 0 1 1 |
| 0 0 0 X | 0 0 0 0 | 5 0 0 8 | 0 0 0 1 1 |
| 0 0 0 X | 0 0 0 0 | 5 0 0 9 | 0 0 0 1 1 |
| 0 0 0 X | 0 0 0 0 | 6 0 0 1 | 0 0 0 1 1 |
| 0 0 0 X | 0 0 0 0 | 6 0 0 2 | 0 0 0 1 1 |
| 0 0 0 X | 0 0 0 0 | 6 0 0 3 | 0 0 0 1 1 |
| 0 0 0 X | 0 0 0 0 | 6 0 0 4 | 0 0 0 1 1 |
| 0 0 0 X | 0 0 0 0 | 6 0 0 5 | 0 0 0 1 1 |
| 0 0 0 X | 0 0 0 0 | 6 0 0 6 | 0 0 0 1 1 |
| 0 0 0 X | 0 0 0 0 | 6 0 0 7 | 0 0 0 1 1 |
| 0 0 0 X | 0 0 0 0 | 6 0 0 8 | 0 0 0 1 1 |
| 0 0 0 X | 0 0 0 0 | 6 0 0 9 | 0 0 0 1 1 |
| 0 0 0 X | 0 0 0 0 | 7 0 0 1 | 0 0 0 1 1 |
| 0 0 0 X | 0 0 0 0 | 7 0 0 2 | 0 0 0 1 1 |
| 0 0 0 X | 0 0 0 0 | 7 0 0 3 | 0 0 0 1 1 |
| 0 0 0 X | 0 0 0 0 | 7 0 0 4 | 0 0 0 1 1 |
| 0 0 0 X | 0 0 0 0 | 7 0 0 5 | 0 0 0 1 1 |
| 0 0 0 X | 0 0 0 0 | 7 0 0 6 | 0 0 0 1 1 |
| 0 0 0 X | 0 0 0 0 | 7 0 0 7 | 0 0 0 1 1 |
| 0 0 0 X | 0 0 0 0 | 7 0 0 8 | 0 0 0 1 1 |
| 0 0 0 X | 0 0 0 0 | 7 0 0 9 | 0 0 0 1 1 |
| 0 0 0 X | 0 0 0 0 | 8 0 0 1 | 0 0 0 1 1 |
| 0 0 X 0 | 0 0 0 0 | 4 0 0 6 | 0 0 0 1 1 |
| 0 0 X 0 | 0 0 0 0 | 4 0 0 7 | 0 0 0 1 1 |
| 0 0 X 0 | 0 0 0 0 | 4 0 0 8 | 0 0 0 1 1 |
| 0 0 X 0 | 0 0 0 0 | 4 0 0 9 | 0 0 0 1 1 |
| 0 0 X 0 | 0 0 0 0 | 5 0 0 1 | 0 0 0 1 1 |
| 0 0 X 0 | 0 0 0 0 | 5 0 0 2 | 0 0 0 1 1 |
| 0 0 X 0 | 0 0 0 0 | 5 0 0 3 | 0 0 0 1 1 |
| 0 0 X 0 | 0 0 0 0 | 5 0 0 4 | 0 0 0 1 1 |
| 0 0 X 0 | 0 0 0 0 | 5 0 0 5 | 0 0 0 1 1 |
| 0 0 X 0 | 0 0 0 0 | 5 0 0 6 | 0 0 0 1 1 |
| 0 0 X 0 | 0 0 0 0 | 5 0 0 7 | 0 0 0 1 1 |
| 0 0 X 0 | 0 0 0 0 | 5 0 0 8 | 0 0 0 1 1 |
| 0 0 X 0 | 0 0 0 0 | 5 0 0 9 | 0 0 0 1 1 |
| 0 0 X 0 | 0 0 0 0 | 6 0 0 1 | 0 0 0 1 1 |
| 0 0 X 0 | 0 0 0 0 | 6 0 0 2 | 0 0 0 1 1 |
| 0 0 X 0 | 0 0 0 0 | 6 0 0 3 | 0 0 0 1 1 |
| 0 0 X 0 | 0 0 0 0 | 6 0 0 4 | 0 0 0 1 1 |
| 0 0 X 0 | 0 0 0 0 | 6 0 0 5 | 0 0 0 1 1 |
| 0 0 X 0 | 0 0 0 0 | 6 0 0 6 | 0 0 0 1 1 |
| 0 0 X 0 | 0 0 0 0 | 6 0 0 7 | 0 0 0 1 1 |
| 0 0 X 0 | 0 0 0 0 | 6 0 0 8 | 0 0 0 1 1 |
| 0 0 X 0 | 0 0 0 0 | 6 0 0 9 | 0 0 0 1 1 |
| 0 0 X 0 | 0 0 0 0 | 7 0 0 1 | 0 0 0 1 1 |
| 0 0 X 0 | 0 0 0 0 | 7 0 0 2 | 0 0 0 1 1 |
| 0 0 X 0 | 0 0 0 0 | 7 0 0 3 | 0 0 0 1 1 |
| 0 0 X 0 | 0 0 0 0 | 7 0 0 4 | 0 0 0 1 1 |
| 0 0 X 0 | 0 0 0 0 | 7 0 0 5 | 0 0 0 1 1 |
| 0 0 X 0 | 0 0 0 0 | 7 0 0 6 | 0 0 0 1 1 |
| 0 0 X 0 | 0 0 0 0 | 7 0 0 7 | 0 0 0 1 1 |
| 0 0 X 0 | 0 0 0 0 | 7 0 0 8 | 0 0 0 1 1 |
| 0 0 X 0 | 0 0 0 0 | 7 0 0 9 | 0 0 0 1 1 |
| 0 0 X 0 | 0 0 0 0 | 8 0 0 1 | 0 0 0 1 1 |
| X 0 0 X | 0 0 0 0 | 4 0 0 6 | 0 0 0 1 1 |
| X 0 0 X | 0 0 0 0 | 4 0 0 7 | 0 0 0 1 1 |
| X 0 0 X | 0 0 0 0 | 4 0 0 8 | 0 0 0 1 1 |
| X 0 0 X | 0 0 0 0 | 4 0 0 9 | 0 0 0 1 1 |
| X 0 0 X | 0 0 0 0 | 5 0 0 1 | 0 0 0 1 1 |
| X 0 0 X | 0 0 0 0 | 5 0 0 2 | 0 0 0 1 1 |
| X 0 0 X | 0 0 0 0 | 5 0 0 3 | 0 0 0 1 1 |
| X 0 0 X | 0 0 0 0 | 5 0 0 4 | 0 0 0 1 1 |
| X 0 0 X | 0 0 0 0 | 5 0 0 5 | 0 0 0 1 1 |
| X 0 0 X | 0 0 0 0 | 5 0 0 6 | 0 0 0 1 1 |
| X 0 0 X | 0 0 0 0 | 5 0 0 7 | 0 0 0 1 1 |
| X 0 0 X | 0 0 0 0 | 5 0 0 8 | 0 0 0 1 1 |
| X 0 0 X | 0 0 0 0 | 5 0 0 9 | 0 0 0 1 1 |
| X 0 0 X | 0 0 0 0 | 6 0 0 1 | 0 0 0 1 1 |
| X 0 0 X | 0 0 0 0 | 6 0 0 2 | 0 0 0 1 1 |
| X 0 0 X | 0 0 0 0 | 6 0 0 3 | 0 0 0 1 1 |
| X 0 0 X | 0 0 0 0 | 6 0 0 4 | 0 0 0 1 1 |
| X 0 0 X | 0 0 0 0 | 6 0 0 5 | 0 0 0 1 1 |
| X 0 0 X | 0 0 0 0 | 6 0 0 6 | 0 0 0 1 1 |

-continued

| Window Contents | | | X' |
|---|---|---|---|
| X00X | 0000 | 6007 | 00011 |
| X00X | 0000 | 6008 | 00011 |
| X00X | 0000 | 6009 | 00011 |
| X00X | 0000 | 7001 | 00011 |
| X00X | 0000 | 7002 | 00011 |
| X00X | 0000 | 7003 | 00011 |
| X00X | 0000 | 7004 | 00011 |
| X00X | 0000 | 7005 | 00011 |
| X00X | 0000 | 7006 | 00011 |
| X00X | 0000 | 7007 | 00011 |
| X00X | 0000 | 7008 | 00011 |
| X00X | 0000 | 7009 | 00011 |
| X00X | 0000 | 8001 | 00011 |
| 000X | 0000 | 8002 | 00100 |
| 000X | 0000 | 8003 | 00100 |
| 000X | 0000 | 8004 | 00100 |
| 000X | 0000 | 8005 | 00100 |
| 000X | 0000 | 8006 | 00100 |
| 000X | 0000 | 8007 | 00100 |
| 000X | 0000 | 8008 | 00100 |
| 000X | 0000 | 8009 | 00100 |
| 000X | 0000 | 9001 | 00100 |
| 000X | 0000 | 9002 | 00100 |
| 000X | 0000 | 9003 | 00100 |
| 000X | 0000 | 9004 | 00100 |
| 000X | 0000 | 9005 | 00100 |
| 000X | 0000 | 9006 | 00100 |
| 000X | 0000 | 9007 | 00100 |
| 000X | 0000 | 9008 | 00100 |
| 000X | 0000 | 9009 | 00100 |
| 000X | 0000 | 1000 | 00100 |
| 000X | 0000 | 2000 | 00100 |
| 000X | 0000 | 3000 | 00100 |
| 00X0 | 0000 | 8002 | 00100 |
| 00X0 | 0000 | 8003 | 00100 |
| 00X0 | 0000 | 8004 | 00100 |
| 00X0 | 0000 | 8005 | 00100 |
| 00X0 | 0000 | 8006 | 00100 |
| 00X0 | 0000 | 8007 | 00100 |
| 00X0 | 0000 | 8008 | 00100 |
| 00X0 | 0000 | 8009 | 00100 |
| 00X0 | 0000 | 9001 | 00100 |
| 00X0 | 0000 | 9002 | 00100 |
| 00X0 | 0000 | 9003 | 00100 |
| 00X0 | 0000 | 9004 | 00100 |
| 00X0 | 0000 | 9005 | 00100 |
| 00X0 | 0000 | 9006 | 00100 |
| 00X0 | 0000 | 9007 | 00100 |
| 00X0 | 0000 | 9008 | 00100 |
| 00X0 | 0000 | 9009 | 00100 |
| 00X0 | 0000 | 1000 | 00100 |
| 00X0 | 0000 | 2000 | 00100 |
| 00X0 | 0000 | 3000 | 00100 |
| X00X | 0000 | 8002 | 00100 |
| X00X | 0000 | 8003 | 00100 |
| X00X | 0000 | 8004 | 00100 |
| X00X | 0000 | 8005 | 00100 |
| X00X | 0000 | 8006 | 00100 |
| X00X | 0000 | 8007 | 00100 |
| X00X | 0000 | 8008 | 00100 |
| X00X | 0000 | 8009 | 00100 |
| X00X | 0000 | 9001 | 00100 |
| X00X | 0000 | 9002 | 00100 |
| X00X | 0000 | 9003 | 00100 |
| X00X | 0000 | 9004 | 00100 |
| X00X | 0000 | 9005 | 00100 |
| X00X | 0000 | 9006 | 00100 |
| X00X | 0000 | 9007 | 00100 |
| X00X | 0000 | 9008 | 00100 |
| X00X | 0000 | 9009 | 00100 |
| X00X | 0000 | 1000 | 00100 |
| X00X | 0000 | 2000 | 00100 |
| X00X | 0000 | 3000 | 00100 |
| XXXX | 0001 | XXXX | 00101 |
| XXXX | 0002 | XXXX | 00110 |
| XXXX | 0003 | XXXX | 00111 |
| XXXX | 0004 | XXXX | 01000 |

-continued

| Window Contents | | | X' |
|---|---|---|---|
| XXXX | 0005 | XXXX | 01001 |
| XXXX | 0006 | XXXX | 01010 |
| XXXX | 0007 | XXXX | 01011 |
| XXXX | 0008 | XXXX | 01100 |
| XXXX | 0009 | XXXX | 01101 |
| XXXX | 0010 | 0000 | 01110 |
| XXXX | 0010 | 00X0 | 01110 |
| XXXX | 0010 | 000X | 01110 |
| XXXX | 0020 | 0000 | 01111 |
| XXXX | 0020 | 00X0 | 01111 |
| XXXX | 0020 | 000X | 01111 |
| XXXX | 0030 | 0000 | 10000 |
| XXXX | 0030 | 00X0 | 10000 |
| XXXX | 0030 | 000X | 10000 |
| XXXX | 0040 | 0000 | 10001 |
| XXXX | 0040 | 00X0 | 10001 |
| XXXX | 0040 | 000X | 10001 |
| XXXX | 0050 | 0000 | 10010 |
| XXXX | 0050 | 00X0 | 10010 |
| XXXX | 0050 | 000X | 10010 |
| XXXX | 0060 | 0000 | 10011 |
| XXXX | 0060 | 00X0 | 10011 |
| XXXX | 0060 | 000X | 10011 |
| XXXX | 0070 | 0000 | 10100 |
| XXXX | 0070 | 00X0 | 10100 |
| XXXX | 0070 | 000X | 10100 |
| XXXX | 0080 | 0000 | 10101 |
| XXXX | 0080 | 00X0 | 10101 |
| XXXX | 0080 | 000X | 10101 |
| XXXX | 0090 | 0000 | 10110 |
| XXXX | 0090 | 00X0 | 10110 |
| XXXX | 0090 | 000X | 10110 |
| XXXX | 0010 | 0100 | 10111 |
| XXXX | 0010 | 0200 | 10111 |
| XXXX | 0010 | 0300 | 10111 |
| XXXX | 0010 | 0400 | 10111 |
| XXXX | 0010 | 0500 | 10111 |
| XXXX | 0010 | 0600 | 10111 |
| XXXX | 0010 | 0700 | 10111 |
| XXXX | 0020 | 0100 | 11000 |
| XXXX | 0020 | 0200 | 11000 |
| XXXX | 0020 | 0300 | 11000 |
| XXXX | 0020 | 0400 | 11000 |
| XXXX | 0020 | 0500 | 11000 |
| XXXX | 0020 | 0600 | 11000 |
| XXXX | 0020 | 0700 | 11000 |
| XXXX | 0030 | 0100 | 11001 |
| XXXX | 0030 | 0200 | 11001 |
| XXXX | 0030 | 0300 | 11001 |
| XXXX | 0030 | 0400 | 11001 |
| XXXX | 0030 | 0500 | 11001 |
| XXXX | 0030 | 0600 | 11001 |
| XXXX | 0030 | 0700 | 11001 |
| XXXX | 0040 | 0100 | 11010 |
| XXXX | 0040 | 0200 | 11010 |
| XXXX | 0040 | 0300 | 11010 |
| XXXX | 0040 | 0400 | 11010 |
| XXXX | 0040 | 0500 | 11010 |
| XXXX | 0040 | 0600 | 11010 |
| XXXX | 0040 | 0700 | 11010 |
| XXXX | 0050 | 0100 | 11011 |
| XXXX | 0050 | 0200 | 11011 |
| XXXX | 0050 | 0300 | 11011 |
| XXXX | 0050 | 0400 | 11011 |
| XXXX | 0050 | 0500 | 11011 |
| XXXX | 0050 | 0600 | 11011 |
| XXXX | 0050 | 0700 | 11011 |
| XXXX | 0060 | 0100 | 11100 |
| XXXX | 0060 | 0200 | 11100 |
| XXXX | 0060 | 0300 | 11100 |
| XXXX | 0060 | 0400 | 11100 |
| XXXX | 0060 | 0500 | 11100 |
| XXXX | 0060 | 0600 | 11100 |
| XXXX | 0060 | 0700 | 11100 |
| XXXX | 0070 | 0100 | 11101 |
| XXXX | 0070 | 0200 | 11101 |
| XXXX | 0070 | 0300 | 11101 |

-continued

| Window Contents | | | X' |
|---|---|---|---|
| X X X X | 0 0 7 0 | 0 4 0 0 | 1 1 1 0 1 |
| X X X X | 0 0 7 0 | 0 5 0 0 | 1 1 1 0 1 |
| X X X X | 0 0 7 0 | 0 6 0 0 | 1 1 1 0 1 |
| X X X X | 0 0 7 0 | 0 7 0 0 | 1 1 1 0 1 |
| X X X X | 0 0 8 0 | 0 1 0 0 | 1 1 1 1 0 |
| X X X X | 0 0 8 0 | 0 2 0 0 | 1 1 1 1 0 |
| X X X X | 0 0 8 0 | 0 3 0 0 | 1 1 1 1 0 |
| X X X X | 0 0 8 0 | 0 4 0 0 | 1 1 1 1 0 |
| X X X X | 0 0 8 0 | 0 5 0 0 | 1 1 1 1 0 |
| X X X X | 0 0 8 0 | 0 6 0 0 | 1 1 1 1 0 |
| X X X X | 0 0 8 0 | 0 7 0 0 | 1 1 1 1 0 |
| X X X X | 0 0 9 0 | 0 1 0 0 | 1 1 1 1 1 |
| X X X X | 0 0 9 0 | 0 2 0 0 | 1 1 1 1 1 |
| X X X X | 0 0 9 0 | 0 3 0 0 | 1 1 1 1 1 |
| X X X X | 0 0 9 0 | 0 4 0 0 | 1 1 1 1 1 |
| X X X X | 0 0 9 0 | 0 5 0 0 | 1 1 1 1 1 |
| X X X X | 0 0 9 0 | 0 6 0 0 | 1 1 1 1 1 |
| X X X X | 0 0 9 0 | 0 7 0 0 | 1 1 1 1 1 |
| X X X X | 0 1 0 0 | 0 1 0 0 | 0 0 0 0 0 |
| X X X X | 0 1 0 0 | 0 2 0 0 | 0 0 0 0 0 |
| X X X X | 0 1 0 0 | 0 3 0 0 | 0 0 0 0 0 |
| X X X X | 0 1 0 0 | 0 4 0 0 | 0 0 0 0 0 |
| X X X X | 0 1 0 0 | 0 5 0 0 | 0 0 0 0 0 |
| X X X X | 0 1 0 0 | 0 6 0 0 | 0 0 0 0 0 |
| X X X X | 0 1 0 0 | 0 7 0 0 | 0 0 0 0 0 |
| X X X X | 0 2 0 0 | 0 1 0 0 | 0 0 0 0 1 |
| X X X X | 0 2 0 0 | 0 2 0 0 | 0 0 0 0 1 |
| X X X X | 0 2 0 0 | 0 3 0 0 | 0 0 0 0 1 |
| X X X X | 0 2 0 0 | 0 4 0 0 | 0 0 0 0 1 |
| X X X X | 0 2 0 0 | 0 5 0 0 | 0 0 0 0 1 |
| X X X X | 0 2 0 0 | 0 6 0 0 | 0 0 0 0 1 |
| X X X X | 0 2 0 0 | 0 7 0 0 | 0 0 0 0 1 |
| X X X X | 0 3 0 0 | 0 1 0 0 | 0 0 0 1 0 |
| X X X X | 0 3 0 0 | 0 2 0 0 | 0 0 0 1 0 |
| X X X X | 0 3 0 0 | 0 3 0 0 | 0 0 0 1 0 |
| X X X X | 0 3 0 0 | 0 4 0 0 | 0 0 0 1 0 |
| X X X X | 0 3 0 0 | 0 5 0 0 | 0 0 0 1 0 |
| X X X X | 0 3 0 0 | 0 6 0 0 | 0 0 0 1 0 |
| X X X X | 0 3 0 0 | 0 7 0 0 | 0 0 0 1 0 |
| X X X X | 0 4 0 0 | 0 1 0 0 | 0 0 0 1 1 |
| X X X X | 0 4 0 0 | 0 2 0 0 | 0 0 0 1 1 |
| X X X X | 0 4 0 0 | 0 3 0 0 | 0 0 0 1 1 |
| X X X X | 0 4 0 0 | 0 4 0 0 | 0 0 0 1 1 |
| X X X X | 0 4 0 0 | 0 5 0 0 | 0 0 0 1 1 |
| X X X X | 0 4 0 0 | 0 6 0 0 | 0 0 0 1 1 |
| X X X X | 0 4 0 0 | 0 7 0 0 | 0 0 0 1 1 |
| X X X X | 0 5 0 0 | 0 1 0 0 | 0 0 1 0 0 |
| X X X X | 0 5 0 0 | 0 2 0 0 | 0 0 1 0 0 |
| X X X X | 0 5 0 0 | 0 3 0 0 | 0 0 1 0 0 |
| X X X X | 0 5 0 0 | 0 4 0 0 | 0 0 1 0 0 |
| X X X X | 0 5 0 0 | 0 5 0 0 | 0 0 1 0 0 |
| X X X X | 0 5 0 0 | 0 6 0 0 | 0 0 1 0 0 |
| X X X X | 0 5 0 0 | 0 7 0 0 | 0 0 1 0 0 |
| X X X X | 0 6 0 0 | 0 1 0 0 | 0 0 1 0 1 |
| X X X X | 0 6 0 0 | 0 2 0 0 | 0 0 1 0 1 |
| X X X X | 0 6 0 0 | 0 3 0 0 | 0 0 1 0 1 |
| X X X X | 0 6 0 0 | 0 4 0 0 | 0 0 1 0 1 |
| X X X X | 0 6 0 0 | 0 5 0 0 | 0 0 1 0 1 |
| X X X X | 0 6 0 0 | 0 6 0 0 | 0 0 1 0 1 |
| X X X X | 0 6 0 0 | 0 7 0 0 | 0 0 1 0 1 |
| X X X X | 0 7 0 0 | 0 1 0 0 | 0 0 1 1 0 |
| X X X X | 0 7 0 0 | 0 2 0 0 | 0 0 1 1 0 |
| X X X X | 0 7 0 0 | 0 3 0 0 | 0 0 1 1 0 |
| X X X X | 0 7 0 0 | 0 4 0 0 | 0 0 1 1 0 |
| X X X X | 0 7 0 0 | 0 5 0 0 | 0 0 1 1 0 |
| X X X X | 0 7 0 0 | 0 6 0 0 | 0 0 1 1 0 |
| X X X X | 0 7 0 0 | 0 7 0 0 | 0 0 1 1 0 |
| X X X X | 0 1 0 0 | 0 0 0 0 | 0 0 1 1 1 |
| X X X X | 0 1 0 0 | 0 0 X 0 | 0 0 1 1 1 |
| X X X X | 0 1 0 0 | 0 0 0 X | 0 0 1 1 1 |
| X X X X | 0 2 0 0 | 0 0 0 0 | 0 1 0 0 0 |
| X X X X | 0 2 0 0 | 0 0 X 0 | 0 1 0 0 0 |
| X X X X | 0 2 0 0 | 0 0 0 X | 0 1 0 0 0 |
| X X X X | 0 3 0 0 | 0 0 0 0 | 0 1 0 0 1 |
| X X X X | 0 3 0 0 | 0 0 X 0 | 0 1 0 0 1 |
| X X X X | 0 3 0 0 | 0 0 0 X | 0 1 0 0 1 |
| X X X X | 0 4 0 0 | 0 0 0 0 | 0 1 0 1 0 |

-continued

| Window Contents | | | X' |
|---|---|---|---|
| X X X X | 0 4 0 0 | 0 0 X 0 | 0 1 0 1 0 |
| X X X X | 0 4 0 0 | 0 0 0 X | 0 1 0 1 0 |
| X X X X | 0 5 0 0 | 0 0 0 0 | 0 1 0 1 1 |
| X X X X | 0 5 0 0 | 0 0 X 0 | 0 1 0 1 1 |
| X X X X | 0 5 0 0 | 0 0 0 X | 0 1 0 1 1 |
| X X X X | 0 6 0 0 | 0 0 0 0 | 0 1 1 0 0 |
| X X X X | 0 6 0 0 | 0 0 X 0 | 0 1 1 0 0 |
| X X X X | 0 6 0 0 | 0 0 0 X | 0 1 1 0 0 |
| X X X X | 0 7 0 0 | 0 0 0 0 | 0 1 1 0 1 |
| X X X X | 0 7 0 0 | 0 0 X 0 | 0 1 1 0 1 |
| X X X X | 0 7 0 0 | 0 0 0 X | 0 1 1 0 1 |
| X X X X | 0 1 0 0 | 1 0 0 1 | 0 1 1 1 0 |
| X X X X | 0 1 0 0 | 1 0 0 2 | 0 1 1 1 0 |
| X X X X | 0 1 0 0 | 1 0 0 3 | 0 1 1 1 0 |
| X X X X | 0 1 0 0 | 1 0 0 4 | 0 1 1 1 0 |
| X X X X | 0 1 0 0 | 1 0 0 5 | 0 1 1 1 0 |
| X X X X | 0 1 0 0 | 1 0 0 6 | 0 1 1 1 0 |
| X X X X | 0 1 0 0 | 1 0 0 7 | 0 1 1 1 0 |
| X X X X | 0 1 0 0 | 1 0 0 8 | 0 1 1 1 0 |
| X X X X | 0 1 0 0 | 1 0 0 9 | 0 1 1 1 0 |
| X X X X | 0 1 0 0 | 2 0 0 1 | 0 1 1 1 0 |
| X X X X | 0 1 0 0 | 2 0 0 2 | 0 1 1 1 0 |
| X X X X | 0 1 0 0 | 2 0 0 3 | 0 1 1 1 0 |
| X X X X | 0 1 0 0 | 2 0 0 4 | 0 1 1 1 0 |
| X X X X | 0 1 0 0 | 2 0 0 5 | 0 1 1 1 0 |
| X X X X | 0 1 0 0 | 2 0 0 6 | 0 1 1 1 0 |
| X X X X | 0 1 0 0 | 2 0 0 7 | 0 1 1 1 0 |
| X X X X | 0 1 0 0 | 2 0 0 8 | 0 1 1 1 0 |
| X X X X | 0 1 0 0 | 2 0 0 9 | 0 1 1 1 0 |
| X X X X | 0 1 0 0 | 3 0 0 1 | 0 1 1 1 0 |
| X X X X | 0 1 0 0 | 3 0 0 2 | 0 1 1 1 0 |
| X X X X | 0 1 0 0 | 3 0 0 3 | 0 1 1 1 0 |
| X X X X | 0 1 0 0 | 3 0 0 4 | 0 1 1 1 0 |
| X X X X | 0 1 0 0 | 3 0 0 5 | 0 1 1 1 0 |
| X X X X | 0 1 0 0 | 3 0 0 6 | 0 1 1 1 0 |
| X X X X | 0 1 0 0 | 3 0 0 7 | 0 1 1 1 0 |
| X X X X | 0 1 0 0 | 3 0 0 8 | 0 1 1 1 0 |
| X X X X | 0 1 0 0 | 3 0 0 9 | 0 1 1 1 0 |
| X X X X | 0 1 0 0 | 4 0 0 1 | 0 1 1 1 0 |
| X X X X | 0 1 0 0 | 4 0 0 2 | 0 1 1 1 0 |
| X X X X | 0 1 0 0 | 4 0 0 3 | 0 1 1 1 0 |
| X X X X | 0 1 0 0 | 4 0 0 4 | 0 1 1 1 0 |
| X X X X | 0 1 0 0 | 4 0 0 5 | 0 1 1 1 0 |
| X X X X | 0 2 0 0 | 1 0 0 1 | 0 1 1 1 1 |
| X X X X | 0 2 0 0 | 1 0 0 2 | 0 1 1 1 1 |
| X X X X | 0 2 0 0 | 1 0 0 3 | 0 1 1 1 1 |
| X X X X | 0 2 0 0 | 1 0 0 4 | 0 1 1 1 1 |
| X X X X | 0 2 0 0 | 1 0 0 5 | 0 1 1 1 1 |
| X X X X | 0 2 0 0 | 1 0 0 6 | 0 1 1 1 1 |
| X X X X | 0 2 0 0 | 1 0 0 7 | 0 1 1 1 1 |
| X X X X | 0 2 0 0 | 1 0 0 8 | 0 1 1 1 1 |
| X X X X | 0 2 0 0 | 1 0 0 9 | 0 1 1 1 1 |
| X X X X | 0 2 0 0 | 2 0 0 1 | 0 1 1 1 1 |
| X X X X | 0 2 0 0 | 2 0 0 2 | 0 1 1 1 1 |
| X X X X | 0 2 0 0 | 2 0 0 3 | 0 1 1 1 1 |
| X X X X | 0 2 0 0 | 2 0 0 4 | 0 1 1 1 1 |
| X X X X | 0 2 0 0 | 2 0 0 5 | 0 1 1 1 1 |
| X X X X | 0 2 0 0 | 2 0 0 6 | 0 1 1 1 1 |
| X X X X | 0 2 0 0 | 2 0 0 7 | 0 1 1 1 1 |
| X X X X | 0 2 0 0 | 2 0 0 8 | 0 1 1 1 1 |
| X X X X | 0 2 0 0 | 2 0 0 9 | 0 1 1 1 1 |
| X X X X | 0 2 0 0 | 3 0 0 1 | 0 1 1 1 1 |
| X X X X | 0 2 0 0 | 3 0 0 2 | 0 1 1 1 1 |
| X X X X | 0 2 0 0 | 3 0 0 3 | 0 1 1 1 1 |
| X X X X | 0 2 0 0 | 3 0 0 4 | 0 1 1 1 1 |
| X X X X | 0 2 0 0 | 3 0 0 5 | 0 1 1 1 1 |
| X X X X | 0 2 0 0 | 3 0 0 6 | 0 1 1 1 1 |
| X X X X | 0 2 0 0 | 3 0 0 7 | 0 1 1 1 1 |
| X X X X | 0 2 0 0 | 3 0 0 8 | 0 1 1 1 1 |
| X X X X | 0 2 0 0 | 3 0 0 9 | 0 1 1 1 1 |
| X X X X | 0 2 0 0 | 4 0 0 1 | 0 1 1 1 1 |
| X X X X | 0 2 0 0 | 4 0 0 2 | 0 1 1 1 1 |
| X X X X | 0 2 0 0 | 4 0 0 3 | 0 1 1 1 1 |
| X X X X | 0 2 0 0 | 4 0 0 4 | 0 1 1 1 1 |
| X X X X | 0 2 0 0 | 4 0 0 5 | 0 1 1 1 1 |
| X X X X | 0 3 0 0 | 1 0 0 1 | 1 0 0 0 0 |
| X X X X | 0 3 0 0 | 1 0 0 2 | 1 0 0 0 0 |

-continued

| Window Contents | | | X' |
|---|---|---|---|
| XXXX | 0300 | 1003 | 10000 |
| XXXX | 0300 | 1004 | 10000 |
| XXXX | 0300 | 1005 | 10000 |
| XXXX | 0300 | 1006 | 10000 |
| XXXX | 0300 | 1007 | 10000 |
| XXXX | 0300 | 1008 | 10000 |
| XXXX | 0300 | 1009 | 10000 |
| XXXX | 0300 | 2001 | 10000 |
| XXXX | 0300 | 2002 | 10000 |
| XXXX | 0300 | 2003 | 10000 |
| XXXX | 0300 | 2004 | 10000 |
| XXXX | 0300 | 2005 | 10000 |
| XXXX | 0300 | 2006 | 10000 |
| XXXX | 0300 | 2007 | 10000 |
| XXXX | 0300 | 2008 | 10000 |
| XXXX | 0300 | 2009 | 10000 |
| XXXX | 0300 | 3001 | 10000 |
| XXXX | 0300 | 3002 | 10000 |
| XXXX | 0300 | 3003 | 10000 |
| XXXX | 0300 | 3004 | 10000 |
| XXXX | 0300 | 3005 | 10000 |
| XXXX | 0300 | 3006 | 10000 |
| XXXX | 0300 | 3007 | 10000 |
| XXXX | 0300 | 3008 | 10000 |
| XXXX | 0300 | 3009 | 10000 |
| XXXX | 0300 | 4001 | 10000 |
| XXXX | 0300 | 4002 | 10000 |
| XXXX | 0300 | 4003 | 10000 |
| XXXX | 0300 | 4004 | 10000 |
| XXXX | 0300 | 4005 | 10000 |
| XXXX | 0400 | 1001 | 10001 |
| XXXX | 0400 | 1002 | 10001 |
| XXXX | 0400 | 1003 | 10001 |
| XXXX | 0400 | 1004 | 10001 |
| XXXX | 0400 | 1005 | 10001 |
| XXXX | 0400 | 1006 | 10001 |
| XXXX | 0400 | 1007 | 10001 |
| XXXX | 0400 | 1008 | 10001 |
| XXXX | 0400 | 1009 | 10001 |
| XXXX | 0400 | 2001 | 10001 |
| XXXX | 0400 | 2002 | 10001 |
| XXXX | 0400 | 2003 | 10001 |
| XXXX | 0400 | 2004 | 10001 |
| XXXX | 0400 | 2005 | 10001 |
| XXXX | 0400 | 2006 | 10001 |
| XXXX | 0400 | 2007 | 10001 |
| XXXX | 0400 | 2008 | 10001 |
| XXXX | 0400 | 2009 | 10001 |
| XXXX | 0400 | 3001 | 10001 |
| XXXX | 0400 | 3002 | 10001 |
| XXXX | 0400 | 3003 | 10001 |
| XXXX | 0400 | 3004 | 10001 |
| XXXX | 0400 | 3005 | 10001 |
| XXXX | 0400 | 3006 | 10001 |
| XXXX | 0400 | 3007 | 10001 |
| XXXX | 0400 | 3008 | 10001 |
| XXXX | 0400 | 3009 | 10001 |
| XXXX | 0400 | 4001 | 10001 |
| XXXX | 0400 | 4002 | 10001 |
| XXXX | 0400 | 4003 | 10001 |
| XXXX | 0400 | 4004 | 10001 |
| XXXX | 0400 | 4005 | 10001 |
| XXXX | 0500 | 1001 | 10010 |
| XXXX | 0500 | 1002 | 10010 |
| XXXX | 0500 | 1003 | 10010 |
| XXXX | 0500 | 1004 | 10010 |
| XXXX | 0500 | 1005 | 10010 |
| XXXX | 0500 | 1006 | 10010 |
| XXXX | 0500 | 1007 | 10010 |
| XXXX | 0500 | 1008 | 10010 |
| XXXX | 0500 | 1009 | 10010 |
| XXXX | 0500 | 2001 | 10010 |
| XXXX | 0500 | 2002 | 10010 |
| XXXX | 0500 | 2003 | 10010 |
| XXXX | 0500 | 2004 | 10010 |
| XXXX | 0500 | 2005 | 10010 |
| XXXX | 0500 | 2006 | 10010 |

-continued

| Window Contents | | | X' |
|---|---|---|---|
| XXXX | 0500 | 2007 | 10010 |
| XXXX | 0500 | 2008 | 10010 |
| XXXX | 0500 | 2009 | 10010 |
| XXXX | 0500 | 3001 | 10010 |
| XXXX | 0500 | 3002 | 10010 |
| XXXX | 0500 | 3003 | 10010 |
| XXXX | 0500 | 3004 | 10010 |
| XXXX | 0500 | 3005 | 10010 |
| XXXX | 0500 | 3006 | 10010 |
| XXXX | 0500 | 3007 | 10010 |
| XXXX | 0500 | 3008 | 10010 |
| XXXX | 0500 | 3009 | 10010 |
| XXXX | 0500 | 4001 | 10010 |
| XXXX | 0500 | 4002 | 10010 |
| XXXX | 0500 | 4003 | 10010 |
| XXXX | 0500 | 4004 | 10010 |
| XXXX | 0500 | 4005 | 10010 |
| XXXX | 0600 | 1001 | 10011 |
| XXXX | 0600 | 1002 | 10011 |
| XXXX | 0600 | 1003 | 10011 |
| XXXX | 0600 | 1004 | 10011 |
| XXXX | 0600 | 1005 | 10011 |
| XXXX | 0600 | 1006 | 10011 |
| XXXX | 0600 | 1007 | 10011 |
| XXXX | 0600 | 1008 | 10011 |
| XXXX | 0600 | 1009 | 10011 |
| XXXX | 0600 | 2001 | 10011 |
| XXXX | 0600 | 2002 | 10011 |
| XXXX | 0600 | 2003 | 10011 |
| XXXX | 0600 | 2004 | 10011 |
| XXXX | 0600 | 2005 | 10011 |
| XXXX | 0600 | 2006 | 10011 |
| XXXX | 0600 | 2007 | 10011 |
| XXXX | 0600 | 2008 | 10011 |
| XXXX | 0600 | 2009 | 10011 |
| XXXX | 0600 | 3001 | 10011 |
| XXXX | 0600 | 3002 | 10011 |
| XXXX | 0600 | 3003 | 10011 |
| XXXX | 0600 | 3004 | 10011 |
| XXXX | 0600 | 3005 | 10011 |
| XXXX | 0600 | 3006 | 10011 |
| XXXX | 0600 | 3007 | 10011 |
| XXXX | 0600 | 3008 | 10011 |
| XXXX | 0600 | 3009 | 10011 |
| XXXX | 0600 | 4001 | 10011 |
| XXXX | 0600 | 4002 | 10011 |
| XXXX | 0600 | 4003 | 10011 |
| XXXX | 0600 | 4004 | 10011 |
| XXXX | 0600 | 4005 | 10011 |
| XXXX | 0700 | 1001 | 10100 |
| XXXX | 0700 | 1002 | 10100 |
| XXXX | 0700 | 1003 | 10100 |
| XXXX | 0700 | 1004 | 10100 |
| XXXX | 0700 | 1005 | 10100 |
| XXXX | 0700 | 1006 | 10100 |
| XXXX | 0700 | 1007 | 10100 |
| XXXX | 0700 | 1008 | 10100 |
| XXXX | 0700 | 1009 | 10100 |
| XXXX | 0700 | 2001 | 10100 |
| XXXX | 0700 | 2002 | 10100 |
| XXXX | 0700 | 2003 | 10100 |
| XXXX | 0700 | 2004 | 10100 |
| XXXX | 0700 | 2005 | 10100 |
| XXXX | 0700 | 2006 | 10100 |
| XXXX | 0700 | 2007 | 10100 |
| XXXX | 0700 | 2008 | 10100 |
| XXXX | 0700 | 2009 | 10100 |
| XXXX | 0700 | 3001 | 10100 |
| XXXX | 0700 | 3002 | 10100 |
| XXXX | 0700 | 3003 | 10100 |
| XXXX | 0700 | 3004 | 10100 |
| XXXX | 0700 | 3005 | 10100 |
| XXXX | 0700 | 3006 | 10100 |
| XXXX | 0700 | 3007 | 10100 |
| XXXX | 0700 | 3008 | 10100 |
| XXXX | 0700 | 3009 | 10100 |
| XXXX | 0700 | 4001 | 10100 |

-continued

| Window Contents | | | X' |
|---|---|---|---|
| XXXX | 0700 | 4002 | 10100 |
| XXXX | 0700 | 4003 | 10100 |
| XXXX | 0700 | 4004 | 10100 |
| XXXX | 0700 | 4005 | 10100 |
| XXXX | 0100 | 4006 | 10101 |
| XXXX | 0100 | 4007 | 10101 |
| XXXX | 0100 | 4008 | 10101 |
| XXXX | 0100 | 4009 | 10101 |
| XXXX | 0100 | 5001 | 10101 |
| XXXX | 0100 | 5002 | 10101 |
| XXXX | 0100 | 5003 | 10101 |
| XXXX | 0100 | 5004 | 10101 |
| XXXX | 0100 | 5005 | 10101 |
| XXXX | 0100 | 5006 | 10101 |
| XXXX | 0100 | 5007 | 10101 |
| XXXX | 0100 | 5008 | 10101 |
| XXXX | 0100 | 5009 | 10101 |
| XXXX | 0100 | 6001 | 10101 |
| XXXX | 0100 | 6002 | 10101 |
| XXXX | 0100 | 6003 | 10101 |
| XXXX | 0100 | 6004 | 10101 |
| XXXX | 0100 | 6005 | 10101 |
| XXXX | 0100 | 6006 | 10101 |
| XXXX | 0100 | 6007 | 10101 |
| XXXX | 0100 | 6008 | 10101 |
| XXXX | 0100 | 6009 | 10101 |
| XXXX | 0100 | 7001 | 10101 |
| XXXX | 0100 | 7002 | 10101 |
| XXXX | 0100 | 7003 | 10101 |
| XXXX | 0100 | 7004 | 10101 |
| XXXX | 0100 | 7005 | 10101 |
| XXXX | 0100 | 7006 | 10101 |
| XXXX | 0100 | 7007 | 10101 |
| XXXX | 0100 | 7008 | 10101 |
| XXXX | 0100 | 7009 | 10101 |
| XXXX | 0100 | 8001 | 10101 |
| XXXX | 0200 | 4006 | 10110 |
| XXXX | 0200 | 4007 | 10110 |
| XXXX | 0200 | 4008 | 10110 |
| XXXX | 0200 | 4009 | 10110 |
| XXXX | 0200 | 5001 | 10110 |
| XXXX | 0200 | 5002 | 10110 |
| XXXX | 0200 | 5003 | 10110 |
| XXXX | 0200 | 5004 | 10110 |
| XXXX | 0200 | 5005 | 10110 |
| XXXX | 0200 | 5006 | 10110 |
| XXXX | 0200 | 5007 | 10110 |
| XXXX | 0200 | 5008 | 10110 |
| XXXX | 0200 | 5009 | 10110 |
| XXXX | 0200 | 6001 | 10110 |
| XXXX | 0200 | 6002 | 10110 |
| XXXX | 0200 | 6003 | 10110 |
| XXXX | 0200 | 6004 | 10110 |
| XXXX | 0200 | 6005 | 10110 |
| XXXX | 0200 | 6006 | 10110 |
| XXXX | 0200 | 6007 | 10110 |
| XXXX | 0200 | 6008 | 10110 |
| XXXX | 0200 | 6009 | 10110 |
| XXXX | 0200 | 7001 | 10110 |
| XXXX | 0200 | 7002 | 10110 |
| XXXX | 0200 | 7003 | 10110 |
| XXXX | 0200 | 7004 | 10110 |
| XXXX | 0200 | 7005 | 10110 |
| XXXX | 0200 | 7006 | 10110 |
| XXXX | 0200 | 7007 | 10110 |
| XXXX | 0200 | 7008 | 10110 |
| XXXX | 0200 | 7009 | 10110 |
| XXXX | 0200 | 8001 | 10110 |
| XXXX | 0300 | 4006 | 10111 |
| XXXX | 0300 | 4007 | 10111 |
| XXXX | 0300 | 4008 | 10111 |
| XXXX | 0300 | 4009 | 10111 |
| XXXX | 0300 | 5001 | 10111 |
| XXXX | 0300 | 5002 | 10111 |
| XXXX | 0300 | 5003 | 10111 |
| XXXX | 0300 | 5004 | 10111 |
| XXXX | 0300 | 5005 | 10111 |

-continued

| Window Contents | | | X' |
|---|---|---|---|
| XXXX | 0300 | 5006 | 10111 |
| XXXX | 0300 | 5007 | 10111 |
| XXXX | 0300 | 5008 | 10111 |
| XXXX | 0300 | 5009 | 10111 |
| XXXX | 0300 | 6001 | 10111 |
| XXXX | 0300 | 6002 | 10111 |
| XXXX | 0300 | 6003 | 10111 |
| XXXX | 0300 | 6004 | 10111 |
| XXXX | 0300 | 6005 | 10111 |
| XXXX | 0300 | 6006 | 10111 |
| XXXX | 0300 | 6007 | 10111 |
| XXXX | 0300 | 6008 | 10111 |
| XXXX | 0300 | 6009 | 10111 |
| XXXX | 0300 | 7001 | 10111 |
| XXXX | 0300 | 7002 | 10111 |
| XXXX | 0300 | 7003 | 10111 |
| XXXX | 0300 | 7004 | 10111 |
| XXXX | 0300 | 7005 | 10111 |
| XXXX | 0300 | 7006 | 10111 |
| XXXX | 0300 | 7007 | 10111 |
| XXXX | 0300 | 7008 | 10111 |
| XXXX | 0300 | 7009 | 10111 |
| XXXX | 0300 | 8001 | 10111 |
| XXXX | 0400 | 4006 | 11000 |
| XXXX | 0400 | 4007 | 11000 |
| XXXX | 0400 | 4008 | 11000 |
| XXXX | 0400 | 4009 | 11000 |
| XXXX | 0400 | 5001 | 11000 |
| XXXX | 0400 | 5002 | 11000 |
| XXXX | 0400 | 5003 | 11000 |
| XXXX | 0400 | 5004 | 11000 |
| XXXX | 0400 | 5005 | 11000 |
| XXXX | 0400 | 5006 | 11000 |
| XXXX | 0400 | 5007 | 11000 |
| XXXX | 0400 | 5008 | 11000 |
| XXXX | 0400 | 5009 | 11000 |
| XXXX | 0400 | 6001 | 11000 |
| XXXX | 0400 | 6002 | 11000 |
| XXXX | 0400 | 6003 | 11000 |
| XXXX | 0400 | 6004 | 11000 |
| XXXX | 0400 | 6005 | 11000 |
| XXXX | 0400 | 6006 | 11000 |
| XXXX | 0400 | 6007 | 11000 |
| XXXX | 0400 | 6008 | 11000 |
| XXXX | 0400 | 6009 | 11000 |
| XXXX | 0400 | 7001 | 11000 |
| XXXX | 0400 | 7002 | 11000 |
| XXXX | 0400 | 7003 | 11000 |
| XXXX | 0400 | 7004 | 11000 |
| XXXX | 0400 | 7005 | 11000 |
| XXXX | 0400 | 7006 | 11000 |
| XXXX | 0400 | 7007 | 11000 |
| XXXX | 0400 | 7008 | 11000 |
| XXXX | 0400 | 7009 | 11000 |
| XXXX | 0400 | 8001 | 11000 |
| XXXX | 0500 | 4006 | 11001 |
| XXXX | 0500 | 4007 | 11001 |
| XXXX | 0500 | 4008 | 11001 |
| XXXX | 0500 | 4009 | 11001 |
| XXXX | 0500 | 5001 | 11001 |
| XXXX | 0500 | 5002 | 11001 |
| XXXX | 0500 | 5003 | 11001 |
| XXXX | 0500 | 5004 | 11001 |
| XXXX | 0500 | 5005 | 11001 |
| XXXX | 0500 | 5006 | 11001 |
| XXXX | 0500 | 5007 | 11001 |
| XXXX | 0500 | 5008 | 11001 |
| XXXX | 0500 | 5009 | 11001 |
| XXXX | 0500 | 6001 | 11001 |
| XXXX | 0500 | 6002 | 11001 |
| XXXX | 0500 | 6003 | 11001 |
| XXXX | 0500 | 6004 | 11001 |
| XXXX | 0500 | 6005 | 11001 |
| XXXX | 0500 | 6006 | 11001 |
| XXXX | 0500 | 6007 | 11001 |
| XXXX | 0500 | 6008 | 11001 |
| XXXX | 0500 | 6009 | 11001 |

-continued

| Window Contents | | | X' |
|---|---|---|---|
| XXXX | 0500 | 7001 | 11001 |
| XXXX | 0500 | 7002 | 11001 |
| XXXX | 0500 | 7003 | 11001 |
| XXXX | 0500 | 7004 | 11001 |
| XXXX | 0500 | 7005 | 11001 |
| XXXX | 0500 | 7006 | 11001 |
| XXXX | 0500 | 7007 | 11001 |
| XXXX | 0500 | 7008 | 11001 |
| XXXX | 0500 | 7009 | 11001 |
| XXXX | 0500 | 8001 | 11001 |
| XXXX | 0600 | 4006 | 11010 |
| XXXX | 0600 | 4007 | 11010 |
| XXXX | 0600 | 4008 | 11010 |
| XXXX | 0600 | 4009 | 11010 |
| XXXX | 0600 | 5001 | 11010 |
| XXXX | 0600 | 5002 | 11010 |
| XXXX | 0600 | 5003 | 11010 |
| XXXX | 0600 | 5004 | 11010 |
| XXXX | 0600 | 5005 | 11010 |
| XXXX | 0600 | 5006 | 11010 |
| XXXX | 0600 | 5007 | 11010 |
| XXXX | 0600 | 5008 | 11010 |
| XXXX | 0600 | 5009 | 11010 |
| XXXX | 0600 | 6001 | 11010 |
| XXXX | 0600 | 6002 | 11010 |
| XXXX | 0600 | 6003 | 11010 |
| XXXX | 0600 | 6004 | 11010 |
| XXXX | 0600 | 6005 | 11010 |
| XXXX | 0600 | 6006 | 11010 |
| XXXX | 0600 | 6007 | 11010 |
| XXXX | 0600 | 6008 | 11010 |
| XXXX | 0600 | 6009 | 11010 |
| XXXX | 0600 | 7001 | 11010 |
| XXXX | 0600 | 7002 | 11010 |
| XXXX | 0600 | 7003 | 11010 |
| XXXX | 0600 | 7004 | 11010 |
| XXXX | 0600 | 7005 | 11010 |
| XXXX | 0600 | 7006 | 11010 |
| XXXX | 0600 | 7007 | 11010 |
| XXXX | 0600 | 7008 | 11010 |
| XXXX | 0600 | 7009 | 11010 |
| XXXX | 0600 | 8001 | 11010 |
| XXXX | 0700 | 4006 | 11011 |
| XXXX | 0700 | 4007 | 11011 |
| XXXX | 0700 | 4008 | 11011 |
| XXXX | 0700 | 4009 | 11011 |
| XXXX | 0700 | 5001 | 11011 |
| XXXX | 0700 | 5002 | 11011 |
| XXXX | 0700 | 5003 | 11011 |
| XXXX | 0700 | 5004 | 11011 |
| XXXX | 0700 | 5005 | 11011 |
| XXXX | 0700 | 5006 | 11011 |
| XXXX | 0700 | 5007 | 11011 |
| XXXX | 0700 | 5008 | 11011 |
| XXXX | 0700 | 5009 | 11011 |
| XXXX | 0700 | 6001 | 11011 |
| XXXX | 0700 | 6002 | 11011 |
| XXXX | 0700 | 6003 | 11011 |
| XXXX | 0700 | 6004 | 11011 |
| XXXX | 0700 | 6005 | 11011 |
| XXXX | 0700 | 6006 | 11011 |
| XXXX | 0700 | 6007 | 11011 |
| XXXX | 0700 | 6008 | 11011 |
| XXXX | 0700 | 6009 | 11011 |
| XXXX | 0700 | 7001 | 11011 |
| XXXX | 0700 | 7002 | 11011 |
| XXXX | 0700 | 7003 | 11011 |
| XXXX | 0700 | 7004 | 11011 |
| XXXX | 0700 | 7005 | 11011 |
| XXXX | 0700 | 7006 | 11011 |
| XXXX | 0700 | 7007 | 11011 |
| XXXX | 0700 | 7008 | 11011 |
| XXXX | 0700 | 7009 | 11011 |
| XXXX | 0700 | 8001 | 11011 |
| XXXX | 0100 | 8002 | 11100 |
| XXXX | 0100 | 8003 | 11100 |
| XXXX | 0100 | 8004 | 11100 |

-continued

| Window Contents | | | X' |
|---|---|---|---|
| XXXX | 0100 | 8005 | 11100 |
| XXXX | 0100 | 8006 | 11100 |
| XXXX | 0100 | 8007 | 11100 |
| XXXX | 0100 | 8008 | 11100 |
| XXXX | 0100 | 8009 | 11100 |
| XXXX | 0100 | 9001 | 11100 |
| XXXX | 0100 | 9002 | 11100 |
| XXXX | 0100 | 9003 | 11100 |
| XXXX | 0100 | 9004 | 11100 |
| XXXX | 0100 | 9005 | 11100 |
| XXXX | 0100 | 9006 | 11100 |
| XXXX | 0100 | 9007 | 11100 |
| XXXX | 0100 | 9008 | 11100 |
| XXXX | 0100 | 9009 | 11100 |
| XXXX | 0100 | 1000 | 11100 |
| XXXX | 0100 | 2000 | 11100 |
| XXXX | 0100 | 3000 | 11100 |
| XXXX | 0200 | 8002 | 11101 |
| XXXX | 0200 | 8003 | 11101 |
| XXXX | 0200 | 8004 | 11101 |
| XXXX | 0200 | 8005 | 11101 |
| XXXX | 0200 | 8006 | 11101 |
| XXXX | 0200 | 8007 | 11101 |
| XXXX | 0200 | 8008 | 11101 |
| XXXX | 0200 | 8009 | 11101 |
| XXXX | 0200 | 9001 | 11101 |
| XXXX | 0200 | 9002 | 11101 |
| XXXX | 0200 | 9003 | 11101 |
| XXXX | 0200 | 9004 | 11101 |
| XXXX | 0200 | 9005 | 11101 |
| XXXX | 0200 | 9006 | 11101 |
| XXXX | 0200 | 9007 | 11101 |
| XXXX | 0200 | 9008 | 11101 |
| XXXX | 0200 | 9009 | 11101 |
| XXXX | 0200 | 1000 | 11101 |
| XXXX | 0200 | 2000 | 11101 |
| XXXX | 0200 | 3000 | 11101 |
| XXXX | 0300 | 8002 | 11110 |
| XXXX | 0300 | 8003 | 11110 |
| XXXX | 0300 | 8004 | 11110 |
| XXXX | 0300 | 8005 | 11110 |
| XXXX | 0300 | 8006 | 11110 |
| XXXX | 0300 | 8007 | 11110 |
| XXXX | 0300 | 8008 | 11110 |
| XXXX | 0300 | 8009 | 11110 |
| XXXX | 0300 | 9001 | 11110 |
| XXXX | 0300 | 9002 | 11110 |
| XXXX | 0300 | 9003 | 11110 |
| XXXX | 0300 | 9004 | 11110 |
| XXXX | 0300 | 9005 | 11110 |
| XXXX | 0300 | 9006 | 11110 |
| XXXX | 0300 | 9007 | 11110 |
| XXXX | 0300 | 9008 | 11110 |
| XXXX | 0300 | 9009 | 11110 |
| XXXX | 0300 | 1000 | 11110 |
| XXXX | 0300 | 2000 | 11110 |
| XXXX | 0300 | 3000 | 11110 |
| XXXX | 0400 | 8002 | 11111 |
| XXXX | 0400 | 8003 | 11111 |
| XXXX | 0400 | 8004 | 11111 |
| XXXX | 0400 | 8005 | 11111 |
| XXXX | 0400 | 8006 | 11111 |
| XXXX | 0400 | 8007 | 11111 |
| XXXX | 0400 | 8008 | 11111 |
| XXXX | 0400 | 8009 | 11111 |
| XXXX | 0400 | 9001 | 11111 |
| XXXX | 0400 | 9002 | 11111 |
| XXXX | 0400 | 9003 | 11111 |
| XXXX | 0400 | 9004 | 11111 |
| XXXX | 0400 | 9005 | 11111 |
| XXXX | 0400 | 9006 | 11111 |
| XXXX | 0400 | 9007 | 11111 |
| XXXX | 0400 | 9008 | 11111 |
| XXXX | 0400 | 9009 | 11111 |
| XXXX | 0400 | 1000 | 11111 |
| XXXX | 0400 | 2000 | 11111 |
| XXXX | 0400 | 3000 | 11111 |

-continued

| Window Contents | | | X' |
|---|---|---|---|
| 0000 | 0000 | 0100 | 00000 |
| 0000 | 0000 | 0200 | 00000 |
| 0000 | 0000 | 0300 | 00000 |
| 0000 | 0000 | 0400 | 00000 |
| 0000 | 0000 | 0500 | 00000 |
| 0000 | 0000 | 0600 | 00000 |
| 0000 | 0000 | 0700 | 00000 |
| 0X00 | 0000 | 0100 | 00000 |
| 0X00 | 0000 | 0200 | 00000 |
| 0X00 | 0000 | 0300 | 00000 |
| 0X00 | 0000 | 0400 | 00000 |
| 0X00 | 0000 | 0500 | 00000 |
| 0X00 | 0000 | 0600 | 00000 |
| 0X00 | 0000 | 0700 | 00000 |
| X000 | 0000 | 0100 | 00000 |
| X000 | 0000 | 0200 | 00000 |
| X000 | 0000 | 0300 | 00000 |
| X000 | 0000 | 0400 | 00000 |
| X000 | 0000 | 0500 | 00000 |
| X000 | 0000 | 0600 | 00000 |
| X000 | 0000 | 0700 | 00000 |
| 0000 | 0000 | 4000 | 00001 |
| 0000 | 0000 | 5000 | 00001 |
| 0000 | 0000 | 6000 | 00001 |
| 0000 | 0000 | 7000 | 00001 |
| 0000 | 0000 | 8000 | 00001 |
| 0000 | 0000 | 9000 | 00001 |
| 0000 | 0000 | 0800 | 00001 |
| 0000 | 0000 | 0900 | 00001 |
| 0X00 | 0000 | 4000 | 00001 |
| 0X00 | 0000 | 5000 | 00001 |
| 0X00 | 0000 | 6000 | 00001 |
| 0X00 | 0000 | 7000 | 00001 |
| 0X00 | 0000 | 8000 | 00001 |
| 0X00 | 0000 | 9000 | 00001 |
| 0X00 | 0000 | 0800 | 00001 |
| 0X00 | 0000 | 0900 | 00001 |
| X000 | 0000 | 4000 | 00001 |
| X000 | 0000 | 5000 | 00001 |
| X000 | 0000 | 6000 | 00001 |
| X000 | 0000 | 7000 | 00001 |
| X000 | 0000 | 8000 | 00001 |
| X000 | 0000 | 9000 | 00001 |
| X000 | 0000 | 0800 | 00001 |
| X000 | 0000 | 0900 | 00001 |
| 0000 | 0000 | 1001 | 00010 |
| 0000 | 0000 | 1002 | 00010 |
| 0000 | 0000 | 1003 | 00010 |
| 0000 | 0000 | 1004 | 00010 |
| 0000 | 0000 | 1005 | 00010 |
| 0000 | 0000 | 1006 | 00010 |
| 0000 | 0000 | 1007 | 00010 |
| 0000 | 0000 | 1008 | 00010 |
| 0000 | 0000 | 1009 | 00010 |
| 0000 | 0000 | 2001 | 00010 |
| 0000 | 0000 | 2002 | 00010 |
| 0000 | 0000 | 2003 | 00010 |
| 0000 | 0000 | 2004 | 00010 |
| 0000 | 0000 | 2005 | 00010 |
| 0000 | 0000 | 2006 | 00010 |
| 0000 | 0000 | 2007 | 00010 |
| 0000 | 0000 | 2008 | 00010 |
| 0000 | 0000 | 2009 | 00010 |
| 0000 | 0000 | 3001 | 00010 |
| 0000 | 0000 | 3002 | 00010 |
| 0000 | 0000 | 3003 | 00010 |
| 0000 | 0000 | 3004 | 00010 |
| 0000 | 0000 | 3005 | 00010 |
| 0000 | 0000 | 3006 | 00010 |
| 0000 | 0000 | 3007 | 00010 |
| 0000 | 0000 | 3008 | 00010 |
| 0000 | 0000 | 3009 | 00010 |
| 0000 | 0000 | 4001 | 00010 |
| 0000 | 0000 | 4002 | 00010 |
| 0000 | 0000 | 4003 | 00010 |
| 0000 | 0000 | 4004 | 00010 |
| 0000 | 0000 | 4005 | 00010 |

-continued

| Window Contents | | | X' |
|---|---|---|---|
| 0X00 | 0000 | 1001 | 00010 |
| 0X00 | 0000 | 1002 | 00010 |
| 0X00 | 0000 | 1003 | 00010 |
| 0X00 | 0000 | 1004 | 00010 |
| 0X00 | 0000 | 1005 | 00010 |
| 0X00 | 0000 | 1006 | 00010 |
| 0X00 | 0000 | 1007 | 00010 |
| 0X00 | 0000 | 1008 | 00010 |
| 0X00 | 0000 | 1009 | 00010 |
| 0X00 | 0000 | 2001 | 00010 |
| 0X00 | 0000 | 2002 | 00010 |
| 0X00 | 0000 | 2003 | 00010 |
| 0X00 | 0000 | 2004 | 00010 |
| 0X00 | 0000 | 2005 | 00010 |
| 0X00 | 0000 | 2006 | 00010 |
| 0X00 | 0000 | 2007 | 00010 |
| 0X00 | 0000 | 2008 | 00010 |
| 0X00 | 0000 | 2009 | 00010 |
| 0X00 | 0000 | 3001 | 00010 |
| 0X00 | 0000 | 3002 | 00010 |
| 0X00 | 0000 | 3003 | 00010 |
| 0X00 | 0000 | 3004 | 00010 |
| 0X00 | 0000 | 3005 | 00010 |
| 0X00 | 0000 | 3006 | 00010 |
| 0X00 | 0000 | 3007 | 00010 |
| 0X00 | 0000 | 3008 | 00010 |
| 0X00 | 0000 | 3009 | 00010 |
| 0X00 | 0000 | 4001 | 00010 |
| 0X00 | 0000 | 4002 | 00010 |
| 0X00 | 0000 | 4003 | 00010 |
| 0X00 | 0000 | 4004 | 00010 |
| 0X00 | 0000 | 4005 | 00010 |
| X000 | 0000 | 1001 | 00010 |
| X000 | 0000 | 1002 | 00010 |
| X000 | 0000 | 1003 | 00010 |
| X000 | 0000 | 1004 | 00010 |
| X000 | 0000 | 1005 | 00010 |
| X000 | 0000 | 1006 | 00010 |
| X000 | 0000 | 1007 | 00010 |
| X000 | 0000 | 1008 | 00010 |
| X000 | 0000 | 1009 | 00010 |
| X000 | 0000 | 2001 | 00010 |
| X000 | 0000 | 2002 | 00010 |
| X000 | 0000 | 2003 | 00010 |
| X000 | 0000 | 2004 | 00010 |
| X000 | 0000 | 2005 | 00010 |
| X000 | 0000 | 2006 | 00010 |
| X000 | 0000 | 2007 | 00010 |
| X000 | 0000 | 2008 | 00010 |
| X000 | 0000 | 2009 | 00010 |
| X000 | 0000 | 3001 | 00010 |
| X000 | 0000 | 3002 | 00010 |
| X000 | 0000 | 3003 | 00010 |
| X000 | 0000 | 3004 | 00010 |
| X000 | 0000 | 3005 | 00010 |
| X000 | 0000 | 3006 | 00010 |
| X000 | 0000 | 3007 | 00010 |
| X000 | 0000 | 3008 | 00010 |
| X000 | 0000 | 3009 | 00010 |
| X000 | 0000 | 4001 | 00010 |
| X000 | 0000 | 4002 | 00010 |
| X000 | 0000 | 4003 | 00010 |
| X000 | 0000 | 4004 | 00010 |
| X000 | 0000 | 4005 | 00010 |
| 0000 | 0000 | 4006 | 00011 |
| 0000 | 0000 | 4007 | 00011 |
| 0000 | 0000 | 4008 | 00011 |
| 0000 | 0000 | 4009 | 00011 |
| 0000 | 0000 | 5001 | 00011 |
| 0000 | 0000 | 5002 | 00011 |
| 0000 | 0000 | 5003 | 00011 |
| 0000 | 0000 | 5004 | 00011 |
| 0000 | 0000 | 5005 | 00011 |
| 0000 | 0000 | 5006 | 00011 |
| 0000 | 0000 | 5007 | 00011 |
| 0000 | 0000 | 5008 | 00011 |
| 0000 | 0000 | 5009 | 00011 |

-continued

| Window Contents | | | X' |
|---|---|---|---|
| 0 0 0 0 | 0 0 0 0 | 6 0 0 1 | 0 0 0 1 1 |
| 0 0 0 0 | 0 0 0 0 | 6 0 0 2 | 0 0 0 1 1 |
| 0 0 0 0 | 0 0 0 0 | 6 0 0 3 | 0 0 0 1 1 |
| 0 0 0 0 | 0 0 0 0 | 6 0 0 4 | 0 0 0 1 1 |
| 0 0 0 0 | 0 0 0 0 | 6 0 0 5 | 0 0 0 1 1 |
| 0 0 0 0 | 0 0 0 0 | 6 0 0 6 | 0 0 0 1 1 |
| 0 0 0 0 | 0 0 0 0 | 6 0 0 7 | 0 0 0 1 1 |
| 0 0 0 0 | 0 0 0 0 | 6 0 0 8 | 0 0 0 1 1 |
| 0 0 0 0 | 0 0 0 0 | 6 0 0 9 | 0 0 0 1 1 |
| 0 0 0 0 | 0 0 0 0 | 7 0 0 1 | 0 0 0 1 1 |
| 0 0 0 0 | 0 0 0 0 | 7 0 0 2 | 0 0 0 1 1 |
| 0 0 0 0 | 0 0 0 0 | 7 0 0 3 | 0 0 0 1 1 |
| 0 0 0 0 | 0 0 0 0 | 7 0 0 4 | 0 0 0 1 1 |
| 0 0 0 0 | 0 0 0 0 | 7 0 0 5 | 0 0 0 1 1 |
| 0 0 0 0 | 0 0 0 0 | 7 0 0 6 | 0 0 0 1 1 |
| 0 0 0 0 | 0 0 0 0 | 7 0 0 7 | 0 0 0 1 1 |
| 0 0 0 0 | 0 0 0 0 | 7 0 0 8 | 0 0 0 1 1 |
| 0 0 0 0 | 0 0 0 0 | 7 0 0 9 | 0 0 0 1 1 |
| 0 0 0 0 | 0 0 0 0 | 8 0 0 1 | 0 0 0 1 1 |
| 0 X 0 0 | 0 0 0 0 | 4 0 0 6 | 0 0 0 1 1 |
| 0 X 0 0 | 0 0 0 0 | 4 0 0 7 | 0 0 0 1 1 |
| 0 X 0 0 | 0 0 0 0 | 4 0 0 8 | 0 0 0 1 1 |
| 0 X 0 0 | 0 0 0 0 | 4 0 0 9 | 0 0 0 1 1 |
| 0 X 0 0 | 0 0 0 0 | 5 0 0 1 | 0 0 0 1 1 |
| 0 X 0 0 | 0 0 0 0 | 5 0 0 2 | 0 0 0 1 1 |
| 0 X 0 0 | 0 0 0 0 | 5 0 0 3 | 0 0 0 1 1 |
| 0 X 0 0 | 0 0 0 0 | 5 0 0 4 | 0 0 0 1 1 |
| 0 X 0 0 | 0 0 0 0 | 5 0 0 5 | 0 0 0 1 1 |
| 0 X 0 0 | 0 0 0 0 | 5 0 0 6 | 0 0 0 1 1 |
| 0 X 0 0 | 0 0 0 0 | 5 0 0 7 | 0 0 0 1 1 |
| 0 X 0 0 | 0 0 0 0 | 5 0 0 8 | 0 0 0 1 1 |
| 0 X 0 0 | 0 0 0 0 | 5 0 0 9 | 0 0 0 1 1 |
| 0 X 0 0 | 0 0 0 0 | 6 0 0 1 | 0 0 0 1 1 |
| 0 X 0 0 | 0 0 0 0 | 6 0 0 2 | 0 0 0 1 1 |
| 0 X 0 0 | 0 0 0 0 | 6 0 0 3 | 0 0 0 1 1 |
| 0 X 0 0 | 0 0 0 0 | 6 0 0 4 | 0 0 0 1 1 |
| 0 X 0 0 | 0 0 0 0 | 6 0 0 5 | 0 0 0 1 1 |
| 0 X 0 0 | 0 0 0 0 | 6 0 0 6 | 0 0 0 1 1 |
| 0 X 0 0 | 0 0 0 0 | 6 0 0 7 | 0 0 0 1 1 |
| 0 X 0 0 | 0 0 0 0 | 6 0 0 8 | 0 0 0 1 1 |
| 0 X 0 0 | 0 0 0 0 | 6 0 0 9 | 0 0 0 1 1 |
| 0 X 0 0 | 0 0 0 0 | 7 0 0 1 | 0 0 0 1 1 |
| 0 X 0 0 | 0 0 0 0 | 7 0 0 2 | 0 0 0 1 1 |
| 0 X 0 0 | 0 0 0 0 | 7 0 0 3 | 0 0 0 1 1 |
| 0 X 0 0 | 0 0 0 0 | 7 0 0 4 | 0 0 0 1 1 |
| 0 X 0 0 | 0 0 0 0 | 7 0 0 5 | 0 0 0 1 1 |
| 0 X 0 0 | 0 0 0 0 | 7 0 0 6 | 0 0 0 1 1 |
| 0 X 0 0 | 0 0 0 0 | 7 0 0 7 | 0 0 0 1 1 |
| 0 X 0 0 | 0 0 0 0 | 7 0 0 8 | 0 0 0 1 1 |
| 0 X 0 0 | 0 0 0 0 | 7 0 0 9 | 0 0 0 1 1 |
| 0 X 0 0 | 0 0 0 0 | 8 0 0 1 | 0 0 0 1 1 |
| X 0 0 0 | 0 0 0 0 | 4 0 0 6 | 0 0 0 1 1 |
| X 0 0 0 | 0 0 0 0 | 4 0 0 7 | 0 0 0 1 1 |
| X 0 0 0 | 0 0 0 0 | 4 0 0 8 | 0 0 0 1 1 |
| X 0 0 0 | 0 0 0 0 | 4 0 0 9 | 0 0 0 1 1 |
| X 0 0 0 | 0 0 0 0 | 5 0 0 1 | 0 0 0 1 1 |
| X 0 0 0 | 0 0 0 0 | 5 0 0 2 | 0 0 0 1 1 |
| X 0 0 0 | 0 0 0 0 | 5 0 0 3 | 0 0 0 1 1 |
| X 0 0 0 | 0 0 0 0 | 5 0 0 4 | 0 0 0 1 1 |
| X 0 0 0 | 0 0 0 0 | 5 0 0 5 | 0 0 0 1 1 |
| X 0 0 0 | 0 0 0 0 | 5 0 0 6 | 0 0 0 1 1 |
| X 0 0 0 | 0 0 0 0 | 5 0 0 7 | 0 0 0 1 1 |
| X 0 0 0 | 0 0 0 0 | 5 0 0 8 | 0 0 0 1 1 |
| X 0 0 0 | 0 0 0 0 | 5 0 0 9 | 0 0 0 1 1 |
| X 0 0 0 | 0 0 0 0 | 6 0 0 1 | 0 0 0 1 1 |
| X 0 0 0 | 0 0 0 0 | 6 0 0 2 | 0 0 0 1 1 |
| X 0 0 0 | 0 0 0 0 | 6 0 0 3 | 0 0 0 1 1 |
| X 0 0 0 | 0 0 0 0 | 6 0 0 4 | 0 0 0 1 1 |
| X 0 0 0 | 0 0 0 0 | 6 0 0 5 | 0 0 0 1 1 |
| X 0 0 0 | 0 0 0 0 | 6 0 0 6 | 0 0 0 1 1 |
| X 0 0 0 | 0 0 0 0 | 6 0 0 7 | 0 0 0 1 1 |
| X 0 0 0 | 0 0 0 0 | 6 0 0 8 | 0 0 0 1 1 |
| X 0 0 0 | 0 0 0 0 | 6 0 0 9 | 0 0 0 1 1 |
| X 0 0 0 | 0 0 0 0 | 7 0 0 1 | 0 0 0 1 1 |
| X 0 0 0 | 0 0 0 0 | 7 0 0 2 | 0 0 0 1 1 |
| X 0 0 0 | 0 0 0 0 | 7 0 0 3 | 0 0 0 1 1 |
| X 0 0 0 | 0 0 0 0 | 7 0 0 4 | 0 0 0 1 1 |

-continued

| Window Contents | | | X' |
|---|---|---|---|
| X 0 0 0 | 0 0 0 0 | 7 0 0 5 | 0 0 0 1 1 |
| X 0 0 0 | 0 0 0 0 | 7 0 0 6 | 0 0 0 1 1 |
| X 0 0 0 | 0 0 0 0 | 7 0 0 7 | 0 0 0 1 1 |
| X 0 0 0 | 0 0 0 0 | 7 0 0 8 | 0 0 0 1 1 |
| X 0 0 0 | 0 0 0 0 | 7 0 0 9 | 0 0 0 1 1 |
| X 0 0 0 | 0 0 0 0 | 8 0 0 1 | 0 0 0 1 1 |
| 0 0 0 0 | 0 0 0 0 | 8 0 0 2 | 0 0 1 0 0 |
| 0 0 0 0 | 0 0 0 0 | 8 0 0 3 | 0 0 1 0 0 |
| 0 0 0 0 | 0 0 0 0 | 8 0 0 4 | 0 0 1 0 0 |
| 0 0 0 0 | 0 0 0 0 | 8 0 0 5 | 0 0 1 0 0 |
| 0 0 0 0 | 0 0 0 0 | 8 0 0 6 | 0 0 1 0 0 |
| 0 0 0 0 | 0 0 0 0 | 8 0 0 7 | 0 0 1 0 0 |
| 0 0 0 0 | 0 0 0 0 | 8 0 0 8 | 0 0 1 0 0 |
| 0 0 0 0 | 0 0 0 0 | 8 0 0 9 | 0 0 1 0 0 |
| 0 0 0 0 | 0 0 0 0 | 9 0 0 1 | 0 0 1 0 0 |
| 0 0 0 0 | 0 0 0 0 | 9 0 0 2 | 0 0 1 0 0 |
| 0 0 0 0 | 0 0 0 0 | 9 0 0 3 | 0 0 1 0 0 |
| 0 0 0 0 | 0 0 0 0 | 9 0 0 4 | 0 0 1 0 0 |
| 0 0 0 0 | 0 0 0 0 | 9 0 0 5 | 0 0 1 0 0 |
| 0 0 0 0 | 0 0 0 0 | 9 0 0 6 | 0 0 1 0 0 |
| 0 0 0 0 | 0 0 0 0 | 9 0 0 7 | 0 0 1 0 0 |
| 0 0 0 0 | 0 0 0 0 | 9 0 0 8 | 0 0 1 0 0 |
| 0 0 0 0 | 0 0 0 0 | 9 0 0 9 | 0 0 1 0 0 |
| 0 0 0 0 | 0 0 0 0 | 1 0 0 0 | 0 0 1 0 0 |
| 0 0 0 0 | 0 0 0 0 | 2 0 0 0 | 0 0 1 0 0 |
| 0 0 0 0 | 0 0 0 0 | 3 0 0 0 | 0 0 1 0 0 |
| 0 X 0 0 | 0 0 0 0 | 8 0 0 2 | 0 0 1 0 0 |
| 0 X 0 0 | 0 0 0 0 | 8 0 0 3 | 0 0 1 0 0 |
| 0 X 0 0 | 0 0 0 0 | 8 0 0 4 | 0 0 1 0 0 |
| 0 X 0 0 | 0 0 0 0 | 8 0 0 5 | 0 0 1 0 0 |
| 0 X 0 0 | 0 0 0 0 | 8 0 0 6 | 0 0 1 0 0 |
| 0 X 0 0 | 0 0 0 0 | 8 0 0 7 | 0 0 1 0 0 |
| 0 X 0 0 | 0 0 0 0 | 8 0 0 8 | 0 0 1 0 0 |
| 0 X 0 0 | 0 0 0 0 | 8 0 0 9 | 0 0 1 0 0 |
| 0 X 0 0 | 0 0 0 0 | 9 0 0 1 | 0 0 1 0 0 |
| 0 X 0 0 | 0 0 0 0 | 9 0 0 2 | 0 0 1 0 0 |
| 0 X 0 0 | 0 0 0 0 | 9 0 0 3 | 0 0 1 0 0 |
| 0 X 0 0 | 0 0 0 0 | 9 0 0 4 | 0 0 1 0 0 |
| 0 X 0 0 | 0 0 0 0 | 9 0 0 5 | 0 0 1 0 0 |
| 0 X 0 0 | 0 0 0 0 | 9 0 0 6 | 0 0 1 0 0 |
| 0 X 0 0 | 0 0 0 0 | 9 0 0 7 | 0 0 1 0 0 |
| 0 X 0 0 | 0 0 0 0 | 9 0 0 8 | 0 0 1 0 0 |
| 0 X 0 0 | 0 0 0 0 | 9 0 0 9 | 0 0 1 0 0 |
| 0 X 0 0 | 0 0 0 0 | 1 0 0 0 | 0 0 1 0 0 |
| 0 X 0 0 | 0 0 0 0 | 2 0 0 0 | 0 0 1 0 0 |
| 0 X 0 0 | 0 0 0 0 | 3 0 0 0 | 0 0 1 0 0 |
| X 0 0 0 | 0 0 0 0 | 8 0 0 2 | 0 0 1 0 0 |
| X 0 0 0 | 0 0 0 0 | 8 0 0 3 | 0 0 1 0 0 |
| X 0 0 0 | 0 0 0 0 | 8 0 0 4 | 0 0 1 0 0 |
| X 0 0 0 | 0 0 0 0 | 8 0 0 5 | 0 0 1 0 0 |
| X 0 0 0 | 0 0 0 0 | 8 0 0 6 | 0 0 1 0 0 |
| X 0 0 0 | 0 0 0 0 | 8 0 0 7 | 0 0 1 0 0 |
| X 0 0 0 | 0 0 0 0 | 8 0 0 8 | 0 0 1 0 0 |
| X 0 0 0 | 0 0 0 0 | 8 0 0 9 | 0 0 1 0 0 |
| X 0 0 0 | 0 0 0 0 | 9 0 0 1 | 0 0 1 0 0 |
| X 0 0 0 | 0 0 0 0 | 9 0 0 2 | 0 0 1 0 0 |
| X 0 0 0 | 0 0 0 0 | 9 0 0 3 | 0 0 1 0 0 |
| X 0 0 0 | 0 0 0 0 | 9 0 0 4 | 0 0 1 0 0 |
| X 0 0 0 | 0 0 0 0 | 9 0 0 5 | 0 0 1 0 0 |
| X 0 0 0 | 0 0 0 0 | 9 0 0 6 | 0 0 1 0 0 |
| X 0 0 0 | 0 0 0 0 | 9 0 0 7 | 0 0 1 0 0 |
| X 0 0 0 | 0 0 0 0 | 9 0 0 8 | 0 0 1 0 0 |
| X 0 0 0 | 0 0 0 0 | 9 0 0 9 | 0 0 1 0 0 |
| X 0 0 0 | 0 0 0 0 | 1 0 0 0 | 0 0 1 0 0 |
| X 0 0 0 | 0 0 0 0 | 2 0 0 0 | 0 0 1 0 0 |
| X 0 0 0 | 0 0 0 0 | 3 0 0 0 | 0 0 1 0 0 |
| X X X X | 1 0 0 1 | X X X X | 0 0 0 0 0 |
| X X X X | 1 0 0 2 | X X X X | 0 0 0 0 1 |
| X X X X | 1 0 0 3 | X X X X | 0 0 0 1 0 |
| X X X X | 1 0 0 4 | X X X X | 0 0 0 1 1 |
| X X X X | 1 0 0 5 | X X X X | 0 0 1 0 0 |
| X X X X | 1 0 0 6 | X X X X | 0 0 1 0 1 |
| X X X X | 1 0 0 7 | X X X X | 0 0 1 1 0 |
| X X X X | 1 0 0 8 | X X X X | 0 0 1 1 1 |
| X X X X | 1 0 0 9 | X X X X | 0 1 0 0 0 |
| X X X X | 2 0 0 1 | X X X X | 0 1 0 0 1 |
| X X X X | 2 0 0 2 | X X X X | 0 1 0 1 0 |

-continued

| Window Contents | | | X' |
|---|---|---|---|
| X X X X | 2 0 0 3 | X X X X | 0 1 0 1 1 |
| X X X X | 2 0 0 4 | X X X X | 0 1 1 0 0 |
| X X X X | 2 0 0 5 | X X X X | 0 1 1 0 1 |
| X X X X | 2 0 0 6 | X X X X | 0 1 1 1 0 |
| X X X X | 2 0 0 7 | X X X X | 0 1 1 1 1 |
| X X X X | 2 0 0 8 | X X X X | 1 0 0 0 0 |
| X X X X | 2 0 0 9 | X X X X | 1 0 0 0 1 |
| X X X X | 3 0 0 1 | X X X X | 1 0 0 1 0 |
| X X X X | 3 0 0 2 | X X X X | 1 0 0 1 1 |
| X X X X | 3 0 0 3 | X X X X | 1 0 1 0 0 |
| X X X X | 3 0 0 4 | X X X X | 1 0 1 0 1 |
| X X X X | 3 0 0 5 | X X X X | 1 0 1 1 0 |
| X X X X | 3 0 0 6 | X X X X | 1 0 1 1 1 |
| X X X X | 3 0 0 7 | X X X X | 1 1 0 0 0 |
| X X X X | 3 0 0 8 | X X X X | 1 1 0 0 1 |
| X X X X | 3 0 0 9 | X X X X | 1 1 0 1 0 |
| X X X X | 4 0 0 1 | X X X X | 1 1 0 1 1 |
| X X X X | 4 0 0 2 | X X X X | 1 1 1 0 0 |
| X X X X | 4 0 0 3 | X X X X | 1 1 1 0 1 |
| X X X X | 4 0 0 4 | X X X X | 1 1 1 1 0 |
| X X X X | 4 0 0 5 | X X X X | 1 1 1 1 1 |
| X X X X | 4 0 0 6 | X X X X | 0 0 0 0 0 |
| X X X X | 4 0 0 7 | X X X X | 0 0 0 0 1 |
| X X X X | 4 0 0 8 | X X X X | 0 0 0 1 0 |
| X X X X | 4 0 0 9 | X X X X | 0 0 0 1 1 |
| X X X X | 5 0 0 1 | X X X X | 0 0 1 0 0 |
| X X X X | 5 0 0 2 | X X X X | 0 0 1 0 1 |
| X X X X | 5 0 0 3 | X X X X | 0 0 1 1 0 |
| X X X X | 5 0 0 4 | X X X X | 0 0 1 1 1 |
| X X X X | 5 0 0 5 | X X X X | 0 1 0 0 0 |
| X X X X | 5 0 0 6 | X X X X | 0 1 0 0 1 |
| X X X X | 5 0 0 7 | X X X X | 0 1 0 1 0 |
| X X X X | 5 0 0 8 | X X X X | 0 1 0 1 1 |
| X X X X | 5 0 0 9 | X X X X | 0 1 1 0 0 |
| X X X X | 6 0 0 1 | X X X X | 0 1 1 0 1 |
| X X X X | 6 0 0 2 | X X X X | 0 1 1 1 0 |
| X X X X | 6 0 0 3 | X X X X | 0 1 1 1 1 |
| X X X X | 6 0 0 4 | X X X X | 1 0 0 0 0 |
| X X X X | 6 0 0 5 | X X X X | 1 0 0 0 1 |
| X X X X | 6 0 0 6 | X X X X | 1 0 0 1 0 |
| X X X X | 6 0 0 7 | X X X X | 1 0 0 1 1 |
| X X X X | 6 0 0 8 | X X X X | 1 0 1 0 0 |
| X X X X | 6 0 0 9 | X X X X | 1 0 1 0 1 |
| X X X X | 7 0 0 1 | X X X X | 1 0 1 1 0 |
| X X X X | 7 0 0 2 | X X X X | 1 0 1 1 1 |
| X X X X | 7 0 0 3 | X X X X | 1 1 0 0 0 |
| X X X X | 7 0 0 4 | X X X X | 1 1 0 0 1 |
| X X X X | 7 0 0 5 | X X X X | 1 1 0 1 0 |
| X X X X | 7 0 0 6 | X X X X | 1 1 0 1 1 |
| X X X X | 7 0 0 7 | X X X X | 1 1 1 0 0 |
| X X X X | 7 0 0 8 | X X X X | 1 1 1 0 1 |
| X X X X | 7 0 0 9 | X X X X | 1 1 1 1 0 |
| X X X X | 8 0 0 1 | X X X X | 1 1 1 1 1 |
| X X X X | 8 0 0 2 | X X X X | 0 0 0 0 0 |
| X X X X | 8 0 0 3 | X X X X | 0 0 0 0 1 |
| X X X X | 8 0 0 4 | X X X X | 0 0 0 1 0 |
| X X X X | 8 0 0 5 | X X X X | 0 0 0 1 1 |
| X X X X | 8 0 0 6 | X X X X | 0 0 1 0 0 |
| X X X X | 8 0 0 7 | X X X X | 0 0 1 0 1 |
| X X X X | 8 0 0 8 | X X X X | 0 0 1 1 0 |
| X X X X | 8 0 0 9 | X X X X | 0 0 1 1 1 |
| X X X X | 9 0 0 1 | X X X X | 0 1 0 0 0 |
| X X X X | 9 0 0 2 | X X X X | 0 1 0 0 1 |
| X X X X | 9 0 0 3 | X X X X | 0 1 0 1 0 |
| X X X X | 9 0 0 4 | X X X X | 0 1 0 1 1 |
| X X X X | 9 0 0 5 | X X X X | 0 1 1 0 0 |
| X X X X | 9 0 0 6 | X X X X | 0 1 1 0 1 |
| X X X X | 9 0 0 7 | X X X X | 0 1 1 1 0 |
| X X X X | 9 0 0 8 | X X X X | 0 1 1 1 1 |
| X X X X | 9 0 0 9 | X X X X | 1 0 0 0 0 |
| X X X X | 1 0 0 0 | 0 1 0 0 | 1 0 0 0 1 |
| X X X X | 1 0 0 0 | 0 2 0 0 | 1 0 0 0 1 |
| X X X X | 1 0 0 0 | 0 3 0 0 | 1 0 0 0 1 |
| X X X X | 1 0 0 0 | 0 4 0 0 | 1 0 0 0 1 |
| X X X X | 1 0 0 0 | 0 5 0 0 | 1 0 0 0 1 |
| X X X X | 1 0 0 0 | 0 6 0 0 | 1 0 0 0 1 |
| X X X X | 1 0 0 0 | 0 7 0 0 | 1 0 0 0 1 |

-continued

| Window Contents | | | X' |
|---|---|---|---|
| X X X X | 2 0 0 0 | 0 1 0 0 | 1 0 0 1 0 |
| X X X X | 2 0 0 0 | 0 2 0 0 | 1 0 0 1 0 |
| X X X X | 2 0 0 0 | 0 3 0 0 | 1 0 0 1 0 |
| X X X X | 2 0 0 0 | 0 4 0 0 | 1 0 0 1 0 |
| X X X X | 2 0 0 0 | 0 5 0 0 | 1 0 0 1 0 |
| X X X X | 2 0 0 0 | 0 6 0 0 | 1 0 0 1 0 |
| X X X X | 2 0 0 0 | 0 7 0 0 | 1 0 0 1 0 |
| X X X X | 3 0 0 0 | 0 1 0 0 | 1 0 0 1 1 |
| X X X X | 3 0 0 0 | 0 2 0 0 | 1 0 0 1 1 |
| X X X X | 3 0 0 0 | 0 3 0 0 | 1 0 0 1 1 |
| X X X X | 3 0 0 0 | 0 4 0 0 | 1 0 0 1 1 |
| X X X X | 3 0 0 0 | 0 5 0 0 | 1 0 0 1 1 |
| X X X X | 3 0 0 0 | 0 6 0 0 | 1 0 0 1 1 |
| X X X X | 3 0 0 0 | 0 7 0 0 | 1 0 0 1 1 |
| X X X X | 1 0 0 0 | 0 0 0 0 | 1 0 1 0 0 |
| X X X X | 1 0 0 0 | 0 0 X 0 | 1 0 1 0 0 |
| X X X X | 1 0 0 0 | 0 0 0 X | 1 0 1 0 0 |
| X X X X | 2 0 0 0 | 0 0 0 0 | 1 0 1 0 1 |
| X X X X | 2 0 0 0 | 0 0 X 0 | 1 0 1 0 1 |
| X X X X | 2 0 0 0 | 0 0 0 X | 1 0 1 0 1 |
| X X X X | 3 0 0 0 | 0 0 0 0 | 1 0 1 1 0 |
| X X X X | 3 0 0 0 | 0 0 X 0 | 1 0 1 1 0 |
| X X X X | 3 0 0 0 | 0 0 0 X | 1 0 1 1 0 |
| X X X X | 1 0 0 0 | 1 0 0 1 | 1 0 1 1 1 |
| X X X X | 1 0 0 0 | 1 0 0 2 | 1 0 1 1 1 |
| X X X X | 1 0 0 0 | 1 0 0 3 | 1 0 1 1 1 |
| X X X X | 1 0 0 0 | 1 0 0 4 | 1 0 1 1 1 |
| X X X X | 1 0 0 0 | 1 0 0 5 | 1 0 1 1 1 |
| X X X X | 1 0 0 0 | 1 0 0 6 | 1 0 1 1 1 |
| X X X X | 1 0 0 0 | 1 0 0 7 | 1 0 1 1 1 |
| X X X X | 1 0 0 0 | 1 0 0 8 | 1 0 1 1 1 |
| X X X X | 1 0 0 0 | 1 0 0 9 | 1 0 1 1 1 |
| X X X X | 1 0 0 0 | 2 0 0 1 | 1 0 1 1 1 |
| X X X X | 1 0 0 0 | 2 0 0 2 | 1 0 1 1 1 |
| X X X X | 1 0 0 0 | 2 0 0 3 | 1 0 1 1 1 |
| X X X X | 1 0 0 0 | 2 0 0 4 | 1 0 1 1 1 |
| X X X X | 1 0 0 0 | 2 0 0 5 | 1 0 1 1 1 |
| X X X X | 1 0 0 0 | 2 0 0 6 | 1 0 1 1 1 |
| X X X X | 1 0 0 0 | 2 0 0 7 | 1 0 1 1 1 |
| X X X X | 1 0 0 0 | 2 0 0 8 | 1 0 1 1 1 |
| X X X X | 1 0 0 0 | 2 0 0 9 | 1 0 1 1 1 |
| X X X X | 1 0 0 0 | 3 0 0 1 | 1 0 1 1 1 |
| X X X X | 1 0 0 0 | 3 0 0 2 | 1 0 1 1 1 |
| X X X X | 1 0 0 0 | 3 0 0 3 | 1 0 1 1 1 |
| X X X X | 1 0 0 0 | 3 0 0 4 | 1 0 1 1 1 |
| X X X X | 1 0 0 0 | 3 0 0 5 | 1 0 1 1 1 |
| X X X X | 1 0 0 0 | 3 0 0 6 | 1 0 1 1 1 |
| X X X X | 1 0 0 0 | 3 0 0 7 | 1 0 1 1 1 |
| X X X X | 1 0 0 0 | 3 0 0 8 | 1 0 1 1 1 |
| X X X X | 1 0 0 0 | 3 0 0 9 | 1 0 1 1 1 |
| X X X X | 1 0 0 0 | 4 0 0 1 | 1 0 1 1 1 |
| X X X X | 1 0 0 0 | 4 0 0 2 | 1 0 1 1 1 |
| X X X X | 1 0 0 0 | 4 0 0 3 | 1 0 1 1 1 |
| X X X X | 1 0 0 0 | 4 0 0 4 | 1 0 1 1 1 |
| X X X X | 1 0 0 0 | 4 0 0 5 | 1 0 1 1 1 |
| X X X X | 2 0 0 0 | 1 0 0 1 | 1 1 0 0 0 |
| X X X X | 2 0 0 0 | 1 0 0 2 | 1 1 0 0 0 |
| X X X X | 2 0 0 0 | 1 0 0 3 | 1 1 0 0 0 |
| X X X X | 2 0 0 0 | 1 0 0 4 | 1 1 0 0 0 |
| X X X X | 2 0 0 0 | 1 0 0 5 | 1 1 0 0 0 |
| X X X X | 2 0 0 0 | 1 0 0 6 | 1 1 0 0 0 |
| X X X X | 2 0 0 0 | 1 0 0 7 | 1 1 0 0 0 |
| X X X X | 2 0 0 0 | 1 0 0 8 | 1 1 0 0 0 |
| X X X X | 2 0 0 0 | 1 0 0 9 | 1 1 0 0 0 |
| X X X X | 2 0 0 0 | 2 0 0 1 | 1 1 0 0 0 |
| X X X X | 2 0 0 0 | 2 0 0 2 | 1 1 0 0 0 |
| X X X X | 2 0 0 0 | 2 0 0 3 | 1 1 0 0 0 |
| X X X X | 2 0 0 0 | 2 0 0 4 | 1 1 0 0 0 |
| X X X X | 2 0 0 0 | 2 0 0 5 | 1 1 0 0 0 |
| X X X X | 2 0 0 0 | 2 0 0 6 | 1 1 0 0 0 |
| X X X X | 2 0 0 0 | 2 0 0 7 | 1 1 0 0 0 |
| X X X X | 2 0 0 0 | 2 0 0 8 | 1 1 0 0 0 |
| X X X X | 2 0 0 0 | 2 0 0 9 | 1 1 0 0 0 |
| X X X X | 2 0 0 0 | 3 0 0 1 | 1 1 0 0 0 |
| X X X X | 2 0 0 0 | 3 0 0 2 | 1 1 0 0 0 |
| X X X X | 2 0 0 0 | 3 0 0 3 | 1 1 0 0 0 |
| X X X X | 2 0 0 0 | 3 0 0 4 | 1 1 0 0 0 |

-continued

| Window Contents | | | X' |
|---|---|---|---|
| XXXX | 2000 | 3005 | 11000 |
| XXXX | 2000 | 3006 | 11000 |
| XXXX | 2000 | 3007 | 11000 |
| XXXX | 2000 | 3008 | 11000 |
| XXXX | 2000 | 3009 | 11000 |
| XXXX | 2000 | 4001 | 11000 |
| XXXX | 2000 | 4002 | 11000 |
| XXXX | 2000 | 4003 | 11000 |
| XXXX | 2000 | 4004 | 11000 |
| XXXX | 2000 | 4005 | 11000 |
| XXXX | 3000 | 1001 | 11001 |
| XXXX | 3000 | 1002 | 11001 |
| XXXX | 3000 | 1003 | 11001 |
| XXXX | 3000 | 1004 | 11001 |
| XXXX | 3000 | 1005 | 11001 |
| XXXX | 3000 | 1006 | 11001 |
| XXXX | 3000 | 1007 | 11001 |
| XXXX | 3000 | 1008 | 11001 |
| XXXX | 3000 | 1009 | 11001 |
| XXXX | 3000 | 2001 | 11001 |
| XXXX | 3000 | 2002 | 11001 |
| XXXX | 3000 | 2003 | 11001 |
| XXXX | 3000 | 2004 | 11001 |
| XXXX | 3000 | 2005 | 11001 |
| XXXX | 3000 | 2006 | 11001 |
| XXXX | 3000 | 2007 | 11001 |
| XXXX | 3000 | 2008 | 11001 |
| XXXX | 3000 | 2009 | 11001 |
| XXXX | 3000 | 3001 | 11001 |
| XXXX | 3000 | 3002 | 11001 |
| XXXX | 3000 | 3003 | 11001 |
| XXXX | 3000 | 3004 | 11001 |
| XXXX | 3000 | 3005 | 11001 |
| XXXX | 3000 | 3006 | 11001 |
| XXXX | 3000 | 3007 | 11001 |
| XXXX | 3000 | 3008 | 11001 |
| XXXX | 3000 | 3009 | 11001 |
| XXXX | 3000 | 4001 | 11001 |
| XXXX | 3000 | 4002 | 11001 |
| XXXX | 3000 | 4003 | 11001 |
| XXXX | 3000 | 4004 | 11001 |
| XXXX | 3000 | 4005 | 11001 |
| XXXX | 1000 | 4006 | 11010 |
| XXXX | 1000 | 4007 | 11010 |
| XXXX | 1000 | 4008 | 11010 |
| XXXX | 1000 | 4009 | 11010 |
| XXXX | 1000 | 5001 | 11010 |
| XXXX | 1000 | 5002 | 11010 |
| XXXX | 1000 | 5003 | 11010 |
| XXXX | 1000 | 5004 | 11010 |
| XXXX | 1000 | 5005 | 11010 |
| XXXX | 1000 | 5006 | 11010 |
| XXXX | 1000 | 5007 | 11010 |
| XXXX | 1000 | 5008 | 11010 |
| XXXX | 1000 | 5009 | 11010 |
| XXXX | 1000 | 6001 | 11010 |
| XXXX | 1000 | 6002 | 11010 |
| XXXX | 1000 | 6003 | 11010 |
| XXXX | 1000 | 6004 | 11010 |
| XXXX | 1000 | 6005 | 11010 |
| XXXX | 1000 | 6006 | 11010 |
| XXXX | 1000 | 6007 | 11010 |
| XXXX | 1000 | 6008 | 11010 |
| XXXX | 1000 | 6009 | 11010 |
| XXXX | 1000 | 7001 | 11010 |
| XXXX | 1000 | 7002 | 11010 |
| XXXX | 1000 | 7003 | 11010 |
| XXXX | 1000 | 7004 | 11010 |
| XXXX | 1000 | 7005 | 11010 |
| XXXX | 1000 | 7006 | 11010 |
| XXXX | 1000 | 7007 | 11010 |
| XXXX | 1000 | 7008 | 11010 |
| XXXX | 1000 | 7009 | 11010 |
| XXXX | 1000 | 8001 | 11010 |
| XXXX | 2000 | 4006 | 11011 |
| XXXX | 2000 | 4007 | 11011 |
| XXXX | 2000 | 4008 | 11011 |

-continued

| Window Contents | | | X' |
|---|---|---|---|
| XXXX | 2000 | 4009 | 11011 |
| XXXX | 2000 | 5001 | 11011 |
| XXXX | 2000 | 5002 | 11011 |
| XXXX | 2000 | 5003 | 11011 |
| XXXX | 2000 | 5004 | 11011 |
| XXXX | 2000 | 5005 | 11011 |
| XXXX | 2000 | 5006 | 11011 |
| XXXX | 2000 | 5007 | 11011 |
| XXXX | 2000 | 5008 | 11011 |
| XXXX | 2000 | 5009 | 11011 |
| XXXX | 2000 | 6001 | 11011 |
| XXXX | 2000 | 6002 | 11011 |
| XXXX | 2000 | 6003 | 11011 |
| XXXX | 2000 | 6004 | 11011 |
| XXXX | 2000 | 6005 | 11011 |
| XXXX | 2000 | 6006 | 11011 |
| XXXX | 2000 | 6007 | 11011 |
| XXXX | 2000 | 6008 | 11011 |
| XXXX | 2000 | 6009 | 11011 |
| XXXX | 2000 | 7001 | 11011 |
| XXXX | 2000 | 7002 | 11011 |
| XXXX | 2000 | 7003 | 11011 |
| XXXX | 2000 | 7004 | 11011 |
| XXXX | 2000 | 7005 | 11011 |
| XXXX | 2000 | 7006 | 11011 |
| XXXX | 2000 | 7007 | 11011 |
| XXXX | 2000 | 7008 | 11011 |
| XXXX | 2000 | 7009 | 11011 |
| XXXX | 2000 | 8001 | 11011 |
| XXXX | 3000 | 4006 | 11100 |
| XXXX | 3000 | 4007 | 11100 |
| XXXX | 3000 | 4008 | 11100 |
| XXXX | 3000 | 4009 | 11100 |
| XXXX | 3000 | 5001 | 11100 |
| XXXX | 3000 | 5002 | 11100 |
| XXXX | 3000 | 5003 | 11100 |
| XXXX | 3000 | 5004 | 11100 |
| XXXX | 3000 | 5005 | 11100 |
| XXXX | 3000 | 5006 | 11100 |
| XXXX | 3000 | 5007 | 11100 |
| XXXX | 3000 | 5008 | 11100 |
| XXXX | 3000 | 5009 | 11100 |
| XXXX | 3000 | 6001 | 11100 |
| XXXX | 3000 | 6002 | 11100 |
| XXXX | 3000 | 6003 | 11100 |
| XXXX | 3000 | 6004 | 11100 |
| XXXX | 3000 | 6005 | 11100 |
| XXXX | 3000 | 6006 | 11100 |
| XXXX | 3000 | 6007 | 11100 |
| XXXX | 3000 | 6008 | 11100 |
| XXXX | 3000 | 6009 | 11100 |
| XXXX | 3000 | 7001 | 11100 |
| XXXX | 3000 | 7002 | 11100 |
| XXXX | 3000 | 7003 | 11100 |
| XXXX | 3000 | 7004 | 11100 |
| XXXX | 3000 | 7005 | 11100 |
| XXXX | 3000 | 7006 | 11100 |
| XXXX | 3000 | 7007 | 11100 |
| XXXX | 3000 | 7008 | 11100 |
| XXXX | 3000 | 7009 | 11100 |
| XXXX | 3000 | 8001 | 11100 |
| XXXX | 1000 | 8002 | 11101 |
| XXXX | 1000 | 8003 | 11101 |
| XXXX | 1000 | 8004 | 11101 |
| XXXX | 1000 | 8005 | 11101 |
| XXXX | 1000 | 8006 | 11101 |
| XXXX | 1000 | 8007 | 11101 |
| XXXX | 1000 | 8008 | 11101 |
| XXXX | 1000 | 8009 | 11101 |
| XXXX | 1000 | 9001 | 11101 |
| XXXX | 1000 | 9002 | 11101 |
| XXXX | 1000 | 9003 | 11101 |
| XXXX | 1000 | 9004 | 11101 |
| XXXX | 1000 | 9005 | 11101 |
| XXXX | 1000 | 9006 | 11101 |
| XXXX | 1000 | 9007 | 11101 |
| XXXX | 1000 | 9008 | 11101 |

-continued

| Window Contents | | | X' |
|---|---|---|---|
| XXXX | 1000 | 9009 | 11101 |
| XXXX | 1000 | 1000 | 11101 |
| XXXX | 1000 | 2000 | 11101 |
| XXXX | 1000 | 3000 | 11101 |
| XXXX | 2000 | 8002 | 11110 |
| XXXX | 2000 | 8003 | 11110 |
| XXXX | 2000 | 8004 | 11110 |
| XXXX | 2000 | 8005 | 11110 |
| XXXX | 2000 | 8006 | 11110 |
| XXXX | 2000 | 8007 | 11110 |
| XXXX | 2000 | 8008 | 11110 |
| XXXX | 2000 | 8009 | 11110 |
| XXXX | 2000 | 9001 | 11110 |
| XXXX | 2000 | 9002 | 11110 |
| XXXX | 2000 | 9003 | 11110 |
| XXXX | 2000 | 9004 | 11110 |
| XXXX | 2000 | 9005 | 11110 |
| XXXX | 2000 | 9006 | 11110 |
| XXXX | 2000 | 9007 | 11110 |
| XXXX | 2000 | 9008 | 11110 |
| XXXX | 2000 | 9009 | 11110 |
| XXXX | 2000 | 1000 | 11110 |
| XXXX | 2000 | 2000 | 11110 |
| XXXX | 2000 | 3000 | 11110 |
| XXXX | 3000 | 8002 | 11111 |
| XXXX | 3000 | 8003 | 11111 |
| XXXX | 3000 | 8004 | 11111 |
| XXXX | 3000 | 8005 | 11111 |
| XXXX | 3000 | 8006 | 11111 |
| XXXX | 3000 | 8007 | 11111 |
| XXXX | 3000 | 8008 | 11111 |
| XXXX | 3000 | 8009 | 11111 |
| XXXX | 3000 | 9001 | 11111 |
| XXXX | 3000 | 9002 | 11111 |
| XXXX | 3000 | 9003 | 11111 |
| XXXX | 3000 | 9004 | 11111 |
| XXXX | 3000 | 9005 | 11111 |
| XXXX | 3000 | 9006 | 11111 |
| XXXX | 3000 | 9007 | 11111 |
| XXXX | 3000 | 9008 | 11111 |
| XXXX | 3000 | 9009 | 11111 |
| XXXX | 3000 | 1000 | 11111 |
| XXXX | 3000 | 2000 | 11111 |
| XXXX | 3000 | 3000 | 11111 |
| XXXX | 4000 | 0100 | 00000 |
| XXXX | 4000 | 0200 | 00000 |
| XXXX | 4000 | 0300 | 00000 |
| XXXX | 4000 | 0400 | 00000 |
| XXXX | 4000 | 0500 | 00000 |
| XXXX | 4000 | 0600 | 00000 |
| XXXX | 4000 | 0700 | 00000 |
| XXXX | 5000 | 0100 | 00001 |
| XXXX | 5000 | 0200 | 00001 |
| XXXX | 5000 | 0300 | 00001 |
| XXXX | 5000 | 0400 | 00001 |
| XXXX | 5000 | 0500 | 00001 |
| XXXX | 5000 | 0600 | 00001 |
| XXXX | 5000 | 0700 | 00001 |
| XXXX | 6000 | 0100 | 00010 |
| XXXX | 6000 | 0200 | 00010 |
| XXXX | 6000 | 0300 | 00010 |
| XXXX | 6000 | 0400 | 00010 |
| XXXX | 6000 | 0500 | 00010 |
| XXXX | 6000 | 0600 | 00010 |
| XXXX | 6000 | 0700 | 00010 |
| XXXX | 7000 | 0100 | 00011 |
| XXXX | 7000 | 0200 | 00011 |
| XXXX | 7000 | 0300 | 00011 |
| XXXX | 7000 | 0400 | 00011 |
| XXXX | 7000 | 0500 | 00011 |
| XXXX | 7000 | 0600 | 00011 |
| XXXX | 7000 | 0700 | 00011 |
| XXXX | 8000 | 0100 | 00100 |
| XXXX | 8000 | 0200 | 00100 |
| XXXX | 8000 | 0300 | 00100 |
| XXXX | 8000 | 0400 | 00100 |
| XXXX | 8000 | 0500 | 00100 |

-continued

| Window Contents | | | X' |
|---|---|---|---|
| XXXX | 8000 | 0600 | 00100 |
| XXXX | 8000 | 0700 | 00100 |
| XXXX | 9000 | 0100 | 00101 |
| XXXX | 9000 | 0200 | 00101 |
| XXXX | 9000 | 0300 | 00101 |
| XXXX | 9000 | 0400 | 00101 |
| XXXX | 9000 | 0500 | 00101 |
| XXXX | 9000 | 0600 | 00101 |
| XXXX | 9000 | 0700 | 00101 |
| XXXX | 4000 | 0000 | 00110 |
| XXXX | 4000 | 00X0 | 00110 |
| XXXX | 4000 | 000X | 00110 |
| XXXX | 5000 | 0000 | 00111 |
| XXXX | 5000 | 00X0 | 00111 |
| XXXX | 5000 | 000X | 00111 |
| XXXX | 6000 | 0000 | 01000 |
| XXXX | 6000 | 00X0 | 01000 |
| XXXX | 6000 | 000X | 01000 |
| XXXX | 7000 | 0000 | 01001 |
| XXXX | 7000 | 00X0 | 01001 |
| XXXX | 7000 | 000X | 01001 |
| XXXX | 8000 | 0000 | 01010 |
| XXXX | 8000 | 00X0 | 01010 |
| XXXX | 8000 | 000X | 01010 |
| XXXX | 9000 | 0000 | 01011 |
| XXXX | 9000 | 00X0 | 01011 |
| XXXX | 9000 | 000X | 01011 |
| XXXX | 4000 | 1001 | 01100 |
| XXXX | 4000 | 1002 | 01100 |
| XXXX | 4000 | 1003 | 01100 |
| XXXX | 4000 | 1004 | 01100 |
| XXXX | 4000 | 1005 | 01100 |
| XXXX | 4000 | 1006 | 01100 |
| XXXX | 4000 | 1007 | 01100 |
| XXXX | 4000 | 1008 | 01100 |
| XXXX | 4000 | 1009 | 01100 |
| XXXX | 4000 | 2001 | 01100 |
| XXXX | 4000 | 2002 | 01100 |
| XXXX | 4000 | 2003 | 01100 |
| XXXX | 4000 | 2004 | 01100 |
| XXXX | 4000 | 2005 | 01100 |
| XXXX | 4000 | 2006 | 01100 |
| XXXX | 4000 | 2007 | 01100 |
| XXXX | 4000 | 2008 | 01100 |
| XXXX | 4000 | 2009 | 01100 |
| XXXX | 4000 | 3001 | 01100 |
| XXXX | 4000 | 3002 | 01100 |
| XXXX | 4000 | 3003 | 01100 |
| XXXX | 4000 | 3004 | 01100 |
| XXXX | 4000 | 3005 | 01100 |
| XXXX | 4000 | 3006 | 01100 |
| XXXX | 4000 | 3007 | 01100 |
| XXXX | 4000 | 3008 | 01100 |
| XXXX | 4000 | 3009 | 01100 |
| XXXX | 4000 | 4001 | 01100 |
| XXXX | 4000 | 4002 | 01100 |
| XXXX | 4000 | 4003 | 01100 |
| XXXX | 4000 | 4004 | 01100 |
| XXXX | 4000 | 4005 | 01100 |
| XXXX | 5000 | 1001 | 01101 |
| XXXX | 5000 | 1002 | 01101 |
| XXXX | 5000 | 1003 | 01101 |
| XXXX | 5000 | 1004 | 01101 |
| XXXX | 5000 | 1005 | 01101 |
| XXXX | 5000 | 1006 | 01101 |
| XXXX | 5000 | 1007 | 01101 |
| XXXX | 5000 | 1008 | 01101 |
| XXXX | 5000 | 1009 | 01101 |
| XXXX | 5000 | 2001 | 01101 |
| XXXX | 5000 | 2002 | 01101 |
| XXXX | 5000 | 2003 | 01101 |
| XXXX | 5000 | 2004 | 01101 |
| XXXX | 5000 | 2005 | 01101 |
| XXXX | 5000 | 2006 | 01101 |
| XXXX | 5000 | 2007 | 01101 |
| XXXX | 5000 | 2008 | 01101 |
| XXXX | 5000 | 2009 | 01101 |

-continued

| Window Contents | | | X' |
|---|---|---|---|
| XXXX | 5000 | 3001 | 01101 |
| XXXX | 5000 | 3002 | 01101 |
| XXXX | 5000 | 3003 | 01101 |
| XXXX | 5000 | 3004 | 01101 |
| XXXX | 5000 | 3005 | 01101 |
| XXXX | 5000 | 3006 | 01101 |
| XXXX | 5000 | 3007 | 01101 |
| XXXX | 5000 | 3008 | 01101 |
| XXXX | 5000 | 3009 | 01101 |
| XXXX | 5000 | 4001 | 01101 |
| XXXX | 5000 | 4002 | 01101 |
| XXXX | 5000 | 4003 | 01101 |
| XXXX | 5000 | 4004 | 01101 |
| XXXX | 5000 | 4005 | 01101 |
| XXXX | 6000 | 1001 | 01110 |
| XXXX | 6000 | 1002 | 01110 |
| XXXX | 6000 | 1003 | 01110 |
| XXXX | 6000 | 1004 | 01110 |
| XXXX | 6000 | 1005 | 01110 |
| XXXX | 6000 | 1006 | 01110 |
| XXXX | 6000 | 1007 | 01110 |
| XXXX | 6000 | 1008 | 01110 |
| XXXX | 6000 | 1009 | 01110 |
| XXXX | 6000 | 2001 | 01110 |
| XXXX | 6000 | 2002 | 01110 |
| XXXX | 6000 | 2003 | 01110 |
| XXXX | 6000 | 2004 | 01110 |
| XXXX | 6000 | 2005 | 01110 |
| XXXX | 6000 | 2006 | 01110 |
| XXXX | 6000 | 2007 | 01110 |
| XXXX | 6000 | 2008 | 01110 |
| XXXX | 6000 | 2009 | 01110 |
| XXXX | 6000 | 3001 | 01110 |
| XXXX | 6000 | 3002 | 01110 |
| XXXX | 6000 | 3003 | 01110 |
| XXXX | 6000 | 3004 | 01110 |
| XXXX | 6000 | 3005 | 01110 |
| XXXX | 6000 | 3006 | 01110 |
| XXXX | 6000 | 3007 | 01110 |
| XXXX | 6000 | 3008 | 01110 |
| XXXX | 6000 | 3009 | 01110 |
| XXXX | 6000 | 4001 | 01110 |
| XXXX | 6000 | 4002 | 01110 |
| XXXX | 6000 | 4003 | 01110 |
| XXXX | 6000 | 4004 | 01110 |
| XXXX | 6000 | 4005 | 01110 |
| XXXX | 7000 | 1001 | 01111 |
| XXXX | 7000 | 1002 | 01111 |
| XXXX | 7000 | 1003 | 01111 |
| XXXX | 7000 | 1004 | 01111 |
| XXXX | 7000 | 1005 | 01111 |
| XXXX | 7000 | 1006 | 01111 |
| XXXX | 7000 | 1007 | 01111 |
| XXXX | 7000 | 1008 | 01111 |
| XXXX | 7000 | 1009 | 01111 |
| XXXX | 7000 | 2001 | 01111 |
| XXXX | 7000 | 2002 | 01111 |
| XXXX | 7000 | 2003 | 01111 |
| XXXX | 7000 | 2004 | 01111 |
| XXXX | 7000 | 2005 | 01111 |
| XXXX | 7000 | 2006 | 01111 |
| XXXX | 7000 | 2007 | 01111 |
| XXXX | 7000 | 2008 | 01111 |
| XXXX | 7000 | 2009 | 01111 |
| XXXX | 7000 | 3001 | 01111 |
| XXXX | 7000 | 3002 | 01111 |
| XXXX | 7000 | 3003 | 01111 |
| XXXX | 7000 | 3004 | 01111 |
| XXXX | 7000 | 3005 | 01111 |
| XXXX | 7000 | 3006 | 01111 |
| XXXX | 7000 | 3007 | 01111 |
| XXXX | 7000 | 3008 | 01111 |
| XXXX | 7000 | 3009 | 01111 |
| XXXX | 7000 | 4001 | 01111 |
| XXXX | 7000 | 4002 | 01111 |
| XXXX | 7000 | 4003 | 01111 |
| XXXX | 7000 | 4004 | 01111 |

-continued

| Window Contents | | | X' |
|---|---|---|---|
| XXXX | 7000 | 4005 | 01111 |
| XXXX | 8000 | 1001 | 10000 |
| XXXX | 8000 | 1002 | 10000 |
| XXXX | 8000 | 1003 | 10000 |
| XXXX | 8000 | 1004 | 10000 |
| XXXX | 8000 | 1005 | 10000 |
| XXXX | 8000 | 1006 | 10000 |
| XXXX | 8000 | 1007 | 10000 |
| XXXX | 8000 | 1008 | 10000 |
| XXXX | 8000 | 1009 | 10000 |
| XXXX | 8000 | 2001 | 10000 |
| XXXX | 8000 | 2002 | 10000 |
| XXXX | 8000 | 2003 | 10000 |
| XXXX | 8000 | 2004 | 10000 |
| XXXX | 8000 | 2005 | 10000 |
| XXXX | 8000 | 2006 | 10000 |
| XXXX | 8000 | 2007 | 10000 |
| XXXX | 8000 | 2008 | 10000 |
| XXXX | 8000 | 2009 | 10000 |
| XXXX | 8000 | 3001 | 10000 |
| XXXX | 8000 | 3002 | 10000 |
| XXXX | 8000 | 3003 | 10000 |
| XXXX | 8000 | 3004 | 10000 |
| XXXX | 8000 | 3005 | 10000 |
| XXXX | 8000 | 3006 | 10000 |
| XXXX | 8000 | 3007 | 10000 |
| XXXX | 8000 | 3008 | 10000 |
| XXXX | 8000 | 3009 | 10000 |
| XXXX | 8000 | 4001 | 10000 |
| XXXX | 8000 | 4002 | 10000 |
| XXXX | 8000 | 4003 | 10000 |
| XXXX | 8000 | 4004 | 10000 |
| XXXX | 8000 | 4005 | 10000 |
| XXXX | 9000 | 1001 | 10001 |
| XXXX | 9000 | 1002 | 10001 |
| XXXX | 9000 | 1003 | 10001 |
| XXXX | 9000 | 1004 | 10001 |
| XXXX | 9000 | 1005 | 10001 |
| XXXX | 9000 | 1006 | 10001 |
| XXXX | 9000 | 1007 | 10001 |
| XXXX | 9000 | 1008 | 10001 |
| XXXX | 9000 | 1009 | 10001 |
| XXXX | 9000 | 2001 | 10001 |
| XXXX | 9000 | 2002 | 10001 |
| XXXX | 9000 | 2003 | 10001 |
| XXXX | 9000 | 2004 | 10001 |
| XXXX | 9000 | 2005 | 10001 |
| XXXX | 9000 | 2006 | 10001 |
| XXXX | 9000 | 2007 | 10001 |
| XXXX | 9000 | 2008 | 10001 |
| XXXX | 9000 | 2009 | 10001 |
| XXXX | 9000 | 3001 | 10001 |
| XXXX | 9000 | 3002 | 10001 |
| XXXX | 9000 | 3003 | 10001 |
| XXXX | 9000 | 3004 | 10001 |
| XXXX | 9000 | 3005 | 10001 |
| XXXX | 9000 | 3006 | 10001 |
| XXXX | 9000 | 3007 | 10001 |
| XXXX | 9000 | 3008 | 10001 |
| XXXX | 9000 | 3009 | 10001 |
| XXXX | 9000 | 4001 | 10001 |
| XXXX | 9000 | 4002 | 10001 |
| XXXX | 9000 | 4003 | 10001 |
| XXXX | 9000 | 4004 | 10001 |
| XXXX | 9000 | 4005 | 10001 |
| XXXX | 4000 | 4006 | 10010 |
| XXXX | 4000 | 4007 | 10010 |
| XXXX | 4000 | 4008 | 10010 |
| XXXX | 4000 | 4009 | 10010 |
| XXXX | 4000 | 5001 | 10010 |
| XXXX | 4000 | 5002 | 10010 |
| XXXX | 4000 | 5003 | 10010 |
| XXXX | 4000 | 5004 | 10010 |
| XXXX | 4000 | 5005 | 10010 |
| XXXX | 4000 | 5006 | 10010 |
| XXXX | 4000 | 5007 | 10010 |
| XXXX | 4000 | 5008 | 10010 |

-continued

| Window Contents | | | X' |
|---|---|---|---|
| XXXX | 4000 | 5009 | 10010 |
| XXXX | 4000 | 6001 | 10010 |
| XXXX | 4000 | 6002 | 10010 |
| XXXX | 4000 | 6003 | 10010 |
| XXXX | 4000 | 6004 | 10010 |
| XXXX | 4000 | 6005 | 10010 |
| XXXX | 4000 | 6006 | 10010 |
| XXXX | 4000 | 6007 | 10010 |
| XXXX | 4000 | 6008 | 10010 |
| XXXX | 4000 | 6009 | 10010 |
| XXXX | 4000 | 7001 | 10010 |
| XXXX | 4000 | 7002 | 10010 |
| XXXX | 4000 | 7003 | 10010 |
| XXXX | 4000 | 7004 | 10010 |
| XXXX | 4000 | 7005 | 10010 |
| XXXX | 4000 | 7006 | 10010 |
| XXXX | 4000 | 7007 | 10010 |
| XXXX | 4000 | 7008 | 10010 |
| XXXX | 4000 | 7009 | 10010 |
| XXXX | 4000 | 8001 | 10010 |
| XXXX | 5000 | 4006 | 10011 |
| XXXX | 5000 | 4007 | 10011 |
| XXXX | 5000 | 4008 | 10011 |
| XXXX | 5000 | 4009 | 10011 |
| XXXX | 5000 | 5001 | 10011 |
| XXXX | 5000 | 5002 | 10011 |
| XXXX | 5000 | 5003 | 10011 |
| XXXX | 5000 | 5004 | 10011 |
| XXXX | 5000 | 5005 | 10011 |
| XXXX | 5000 | 5006 | 10011 |
| XXXX | 5000 | 5007 | 10011 |
| XXXX | 5000 | 5008 | 10011 |
| XXXX | 5000 | 5009 | 10011 |
| XXXX | 5000 | 6001 | 10011 |
| XXXX | 5000 | 6002 | 10011 |
| XXXX | 5000 | 6003 | 10011 |
| XXXX | 5000 | 6004 | 10011 |
| XXXX | 5000 | 6005 | 10011 |
| XXXX | 5000 | 6006 | 10011 |
| XXXX | 5000 | 6007 | 10011 |
| XXXX | 5000 | 6008 | 10011 |
| XXXX | 5000 | 6009 | 10011 |
| XXXX | 5000 | 7001 | 10011 |
| XXXX | 5000 | 7002 | 10011 |
| XXXX | 5000 | 7003 | 10011 |
| XXXX | 5000 | 7004 | 10011 |
| XXXX | 5000 | 7005 | 10011 |
| XXXX | 5000 | 7006 | 10011 |
| XXXX | 5000 | 7007 | 10011 |
| XXXX | 5000 | 7008 | 10011 |
| XXXX | 5000 | 7009 | 10011 |
| XXXX | 5000 | 8001 | 10011 |
| XXXX | 6000 | 4006 | 10100 |
| XXXX | 6000 | 4007 | 10100 |
| XXXX | 6000 | 4008 | 10100 |
| XXXX | 6000 | 4009 | 10100 |
| XXXX | 6000 | 5001 | 10100 |
| XXXX | 6000 | 5002 | 10100 |
| XXXX | 6000 | 5003 | 10100 |
| XXXX | 6000 | 5004 | 10100 |
| XXXX | 6000 | 5005 | 10100 |
| XXXX | 6000 | 5006 | 10100 |
| XXXX | 6000 | 5007 | 10100 |
| XXXX | 6000 | 5008 | 10100 |
| XXXX | 6000 | 5009 | 10100 |
| XXXX | 6000 | 6001 | 10100 |
| XXXX | 6000 | 6002 | 10100 |
| XXXX | 6000 | 6003 | 10100 |
| XXXX | 6000 | 6004 | 10100 |
| XXXX | 6000 | 6005 | 10100 |
| XXXX | 6000 | 6006 | 10100 |
| XXXX | 6000 | 6007 | 10100 |
| XXXX | 6000 | 6008 | 10100 |
| XXXX | 6000 | 6009 | 10100 |
| XXXX | 6000 | 7001 | 10100 |
| XXXX | 6000 | 7002 | 10100 |
| XXXX | 6000 | 7003 | 10100 |

-continued

| Window Contents | | | X' |
|---|---|---|---|
| XXXX | 6000 | 7004 | 10100 |
| XXXX | 6000 | 7005 | 10100 |
| XXXX | 6000 | 7006 | 10100 |
| XXXX | 6000 | 7007 | 10100 |
| XXXX | 6000 | 7008 | 10100 |
| XXXX | 6000 | 7009 | 10100 |
| XXXX | 6000 | 8001 | 10100 |
| XXXX | 7000 | 4006 | 10101 |
| XXXX | 7000 | 4007 | 10101 |
| XXXX | 7000 | 4008 | 10101 |
| XXXX | 7000 | 4009 | 10101 |
| XXXX | 7000 | 5001 | 10101 |
| XXXX | 7000 | 5002 | 10101 |
| XXXX | 7000 | 5003 | 10101 |
| XXXX | 7000 | 5004 | 10101 |
| XXXX | 7000 | 5005 | 10101 |
| XXXX | 7000 | 5006 | 10101 |
| XXXX | 7000 | 5007 | 10101 |
| XXXX | 7000 | 5008 | 10101 |
| XXXX | 7000 | 5009 | 10101 |
| XXXX | 7000 | 6001 | 10101 |
| XXXX | 7000 | 6002 | 10101 |
| XXXX | 7000 | 6003 | 10101 |
| XXXX | 7000 | 6004 | 10101 |
| XXXX | 7000 | 6005 | 10101 |
| XXXX | 7000 | 6006 | 10101 |
| XXXX | 7000 | 6007 | 10101 |
| XXXX | 7000 | 6008 | 10101 |
| XXXX | 7000 | 6009 | 10101 |
| XXXX | 7000 | 7001 | 10101 |
| XXXX | 7000 | 7002 | 10101 |
| XXXX | 7000 | 7003 | 10101 |
| XXXX | 7000 | 7004 | 10101 |
| XXXX | 7000 | 7005 | 10101 |
| XXXX | 7000 | 7006 | 10101 |
| XXXX | 7000 | 7007 | 10101 |
| XXXX | 7000 | 7008 | 10101 |
| XXXX | 7000 | 7009 | 10101 |
| XXXX | 7000 | 8001 | 10101 |
| XXXX | 8000 | 4006 | 10110 |
| XXXX | 8000 | 4007 | 10110 |
| XXXX | 8000 | 4008 | 10110 |
| XXXX | 8000 | 4009 | 10110 |
| XXXX | 8000 | 5001 | 10110 |
| XXXX | 8000 | 5002 | 10110 |
| XXXX | 8000 | 5003 | 10110 |
| XXXX | 8000 | 5004 | 10110 |
| XXXX | 8000 | 5005 | 10110 |
| XXXX | 8000 | 5006 | 10110 |
| XXXX | 8000 | 5007 | 10110 |
| XXXX | 8000 | 5008 | 10110 |
| XXXX | 8000 | 5009 | 10110 |
| XXXX | 8000 | 6001 | 10110 |
| XXXX | 8000 | 6002 | 10110 |
| XXXX | 8000 | 6003 | 10110 |
| XXXX | 8000 | 6004 | 10110 |
| XXXX | 8000 | 6005 | 10110 |
| XXXX | 8000 | 6006 | 10110 |
| XXXX | 8000 | 6007 | 10110 |
| XXXX | 8000 | 6008 | 10110 |
| XXXX | 8000 | 6009 | 10110 |
| XXXX | 8000 | 7001 | 10110 |
| XXXX | 8000 | 7002 | 10110 |
| XXXX | 8000 | 7003 | 10110 |
| XXXX | 8000 | 7004 | 10110 |
| XXXX | 8000 | 7005 | 10110 |
| XXXX | 8000 | 7006 | 10110 |
| XXXX | 8000 | 7007 | 10110 |
| XXXX | 8000 | 7008 | 10110 |
| XXXX | 8000 | 7009 | 10110 |
| XXXX | 8000 | 8001 | 10110 |
| XXXX | 9000 | 4006 | 10111 |
| XXXX | 9000 | 4007 | 10111 |
| XXXX | 9000 | 4008 | 10111 |
| XXXX | 9000 | 4009 | 10111 |
| XXXX | 9000 | 5001 | 10111 |
| XXXX | 9000 | 5002 | 10111 |

-continued

| Window Contents | | | X' |
|---|---|---|---|
| XXXX | 9000 | 5003 | 10111 |
| XXXX | 9000 | 5004 | 10111 |
| XXXX | 9000 | 5005 | 10111 |
| XXXX | 9000 | 5006 | 10111 |
| XXXX | 9000 | 5007 | 10111 |
| XXXX | 9000 | 5008 | 10111 |
| XXXX | 9000 | 5009 | 10111 |
| XXXX | 9000 | 6001 | 10111 |
| XXXX | 9000 | 6002 | 10111 |
| XXXX | 9000 | 6003 | 10111 |
| XXXX | 9000 | 6004 | 10111 |
| XXXX | 9000 | 6005 | 10111 |
| XXXX | 9000 | 6006 | 10111 |
| XXXX | 9000 | 6007 | 10111 |
| XXXX | 9000 | 6008 | 10111 |
| XXXX | 9000 | 6009 | 10111 |
| XXXX | 9000 | 7001 | 10111 |
| XXXX | 9000 | 7002 | 10111 |
| XXXX | 9000 | 7003 | 10111 |
| XXXX | 9000 | 7004 | 10111 |
| XXXX | 9000 | 7005 | 10111 |
| XXXX | 9000 | 7006 | 10111 |
| XXXX | 9000 | 7007 | 10111 |
| XXXX | 9000 | 7008 | 10111 |
| XXXX | 9000 | 7009 | 10111 |
| XXXX | 9000 | 8001 | 10111 |
| XXXX | 4000 | 8002 | 11000 |
| XXXX | 4000 | 8003 | 11000 |
| XXXX | 4000 | 8004 | 11000 |
| XXXX | 4000 | 8005 | 11000 |
| XXXX | 4000 | 8006 | 11000 |
| XXXX | 4000 | 8007 | 11000 |
| XXXX | 4000 | 8008 | 11000 |
| XXXX | 4000 | 8009 | 11000 |
| XXXX | 4000 | 9001 | 11000 |
| XXXX | 4000 | 9002 | 11000 |
| XXXX | 4000 | 9003 | 11000 |
| XXXX | 4000 | 9004 | 11000 |
| XXXX | 4000 | 9005 | 11000 |
| XXXX | 4000 | 9006 | 11000 |
| XXXX | 4000 | 9007 | 11000 |
| XXXX | 4000 | 9008 | 11000 |
| XXXX | 4000 | 9009 | 11000 |
| XXXX | 4000 | 1000 | 11000 |
| XXXX | 4000 | 2000 | 11000 |
| XXXX | 4000 | 3000 | 11000 |
| XXXX | 5000 | 8002 | 11001 |
| XXXX | 5000 | 8003 | 11001 |
| XXXX | 5000 | 8004 | 11001 |
| XXXX | 5000 | 8005 | 11001 |
| XXXX | 5000 | 8006 | 11001 |
| XXXX | 5000 | 8007 | 11001 |
| XXXX | 5000 | 8008 | 11001 |
| XXXX | 5000 | 8009 | 11001 |
| XXXX | 5000 | 9001 | 11001 |
| XXXX | 5000 | 9002 | 11001 |
| XXXX | 5000 | 9003 | 11001 |
| XXXX | 5000 | 9004 | 11001 |
| XXXX | 5000 | 9005 | 11001 |
| XXXX | 5000 | 9006 | 11001 |
| XXXX | 5000 | 9007 | 11001 |
| XXXX | 5000 | 9008 | 11001 |
| XXXX | 5000 | 9009 | 11001 |
| XXXX | 5000 | 1000 | 11001 |
| XXXX | 5000 | 2000 | 11001 |
| XXXX | 5000 | 3000 | 11001 |
| XXXX | 6000 | 8002 | 11010 |
| XXXX | 6000 | 8003 | 11010 |
| XXXX | 6000 | 8004 | 11010 |
| XXXX | 6000 | 8005 | 11010 |
| XXXX | 6000 | 8006 | 11010 |
| XXXX | 6000 | 8007 | 11010 |
| XXXX | 6000 | 8008 | 11010 |
| XXXX | 6000 | 8009 | 11010 |
| XXXX | 6000 | 9001 | 11010 |
| XXXX | 6000 | 9002 | 11010 |
| XXXX | 6000 | 9003 | 11010 |

-continued

| Window Contents | | | X' |
|---|---|---|---|
| XXXX | 6000 | 9004 | 11010 |
| XXXX | 6000 | 9005 | 11010 |
| XXXX | 6000 | 9006 | 11010 |
| XXXX | 6000 | 9007 | 11010 |
| XXXX | 6000 | 9008 | 11010 |
| XXXX | 6000 | 9009 | 11010 |
| XXXX | 6000 | 1000 | 11010 |
| XXXX | 6000 | 2000 | 11010 |
| XXXX | 6000 | 3000 | 11010 |
| XXXX | 7000 | 8002 | 11011 |
| XXXX | 7000 | 8003 | 11011 |
| XXXX | 7000 | 8004 | 11011 |
| XXXX | 7000 | 8005 | 11011 |
| XXXX | 7000 | 8006 | 11011 |
| XXXX | 7000 | 8007 | 11011 |
| XXXX | 7000 | 8008 | 11011 |
| XXXX | 7000 | 8009 | 11011 |
| XXXX | 7000 | 9001 | 11011 |
| XXXX | 7000 | 9002 | 11011 |
| XXXX | 7000 | 9003 | 11011 |
| XXXX | 7000 | 9004 | 11011 |
| XXXX | 7000 | 9005 | 11011 |
| XXXX | 7000 | 9006 | 11011 |
| XXXX | 7000 | 9007 | 11011 |
| XXXX | 7000 | 9008 | 11011 |
| XXXX | 7000 | 9009 | 11011 |
| XXXX | 7000 | 1000 | 11011 |
| XXXX | 7000 | 2000 | 11011 |
| XXXX | 7000 | 3000 | 11011 |
| XXXX | 8000 | 8002 | 11100 |
| XXXX | 8000 | 8003 | 11100 |
| XXXX | 8000 | 8004 | 11100 |
| XXXX | 8000 | 8005 | 11100 |
| XXXX | 8000 | 8006 | 11100 |
| XXXX | 8000 | 8007 | 11100 |
| XXXX | 8000 | 8008 | 11100 |
| XXXX | 8000 | 8009 | 11100 |
| XXXX | 8000 | 9001 | 11100 |
| XXXX | 8000 | 9002 | 11100 |
| XXXX | 8000 | 9003 | 11100 |
| XXXX | 8000 | 9004 | 11100 |
| XXXX | 8000 | 9005 | 11100 |
| XXXX | 8000 | 9006 | 11100 |
| XXXX | 8000 | 9007 | 11100 |
| XXXX | 8000 | 9008 | 11100 |
| XXXX | 8000 | 9009 | 11100 |
| XXXX | 8000 | 1000 | 11100 |
| XXXX | 8000 | 2000 | 11100 |
| XXXX | 8000 | 3000 | 11100 |
| XXXX | 9000 | 8002 | 11101 |
| XXXX | 9000 | 8003 | 11101 |
| XXXX | 9000 | 8004 | 11101 |
| XXXX | 9000 | 8005 | 11101 |
| XXXX | 9000 | 8006 | 11101 |
| XXXX | 9000 | 8007 | 11101 |
| XXXX | 9000 | 8008 | 11101 |
| XXXX | 9000 | 8009 | 11101 |
| XXXX | 9000 | 9001 | 11101 |
| XXXX | 9000 | 9002 | 11101 |
| XXXX | 9000 | 9003 | 11101 |
| XXXX | 9000 | 9004 | 11101 |
| XXXX | 9000 | 9005 | 11101 |
| XXXX | 9000 | 9006 | 11101 |
| XXXX | 9000 | 9007 | 11101 |
| XXXX | 9000 | 9008 | 11101 |
| XXXX | 9000 | 9009 | 11101 |
| XXXX | 9000 | 1000 | 11101 |
| XXXX | 9000 | 2000 | 11101 |
| XXXX | 9000 | 3000 | 11101 |
| XXXX | 0800 | XXXX | 11110 |
| XXXX | 0900 | XXXX | 11111. |

13. The method of claim 10, wherein said channel is a storage medium or a communications channel.

14. A system for encoding a series of binary input data bits x into an M=10 run-length limited (2,10) code having a rate R=5/4, to produce a series of code symbols y, the system comprising:

means for receiving at a seven-state encoder an input data bit set $x_0$–$x_4$ to be encoded into the M=10 run-length limited (2,10) code; and means for generating in said encoder a code symbol set $y_0$–$y_3$ based on said input data bit set $x_0$–$x_4$ according to the following table:

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |
| 26 | 0600 | 4 |
| 27 | 0700 | 4 |

-continued

| INPUT | OUTPUT | NEXT STATE |
|---|---|---|
| 28 | 0100 | 5 |
| 29 | 0200 | 5 |
| 30 | 0300 | 5 |
| 31 | 0400 | 5 |
| | State 2 | |
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 3 | |
| 0 | 1001 | 0 |
| 1 | 1002 | 0 |
| 2 | 1003 | 0 |
| 3 | 1004 | 0 |
| 4 | 1005 | 0 |
| 5 | 1006 | 0 |
| 6 | 1007 | 0 |
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |
| 1 | 4007 | 0 |
| 2 | 4008 | 0 |

-continued

| INPUT | OUTPUT | NEXT STATE |
|---|---|---|
| 3 | 4009 | 0 |
| 4 | 5001 | 0 |
| 5 | 5002 | 0 |
| 6 | 5003 | 0 |
| 7 | 5004 | 0 |
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |
| 6 | 8008 | 0 |
| 7 | 8009 | 0 |
| 8 | 9001 | 0 |
| 9 | 9002 | 0 |
| 10 | 9003 | 0 |
| 11 | 9004 | 0 |
| 12 | 9005 | 0 |
| 13 | 9006 | 0 |
| 14 | 9007 | 0 |
| 15 | 9008 | 0 |
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |
| 10 | 8000 | 2 |
| 11 | 9000 | 2 |

-continued

| INPUT | OUTPUT | NEXT STATE |
|---|---|---|
| 12 | 4000 | 3 |
| 13 | 5000 | 3 |
| 14 | 6000 | 3 |
| 15 | 7000 | 3 |
| 16 | 8000 | 3 |
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

wherein said code symbol set $y_0$–$y_3$ is generated based on the input data bit set $x_0$–$x_4$ and the current state of said seven-state encoder when said data bit set $x_0$–$x_4$ is received.

15. A system for converting binary input data bits into a series of waveform amplitudes, each amplitude being at one of M=10 levels, the system comprising:

means for encoding the binary input data bits into an M=10 (2,10) code having a rate R=5/4 to produce a series of code symbols, each code symbol being at one of M levels, and each pair of non-zero code symbols having a minimum of two and a maximum of ten zeroes therebetween, said means for encoding comprising means for generating a code symbol set $y_0$–$y_3$ for each input data bit set $x_0$–$x_4$ according to the following table:

| INPUT | OUTPUT | NEXT STATE |
|---|---|---|
| | State 0 | |
| 0 | 0000 | 1 |
| 1 | 0000 | 2 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |

-continued

| INPUT | OUTPUT | NEXT STATE |
|---|---|---|
| 27 | 0050 | 1 |
| 28 | 0060 | 1 |
| 29 | 0070 | 1 |
| 30 | 0080 | 1 |
| 31 | 0090 | 1 |
| | State 1 | |
| 0 | 0100 | 1 |
| 1 | 0200 | 1 |
| 2 | 0300 | 1 |
| 3 | 0400 | 1 |
| 4 | 0500 | 1 |
| 5 | 0600 | 1 |
| 6 | 0700 | 1 |
| 7 | 0100 | 2 |
| 8 | 0200 | 2 |
| 9 | 0300 | 2 |
| 10 | 0400 | 2 |
| 11 | 0500 | 2 |
| 12 | 0600 | 2 |
| 13 | 0700 | 2 |
| 14 | 0100 | 3 |
| 15 | 0200 | 3 |
| 16 | 0300 | 3 |
| 17 | 0400 | 3 |
| 18 | 0500 | 3 |
| 19 | 0600 | 3 |
| 20 | 0700 | 3 |
| 21 | 0100 | 4 |
| 22 | 0200 | 4 |
| 23 | 0300 | 4 |
| 24 | 0400 | 4 |
| 25 | 0500 | 4 |
| 26 | 0600 | 4 |
| 27 | 0700 | 4 |
| 28 | 0100 | 5 |
| 29 | 0200 | 5 |
| 30 | 0300 | 5 |
| 31 | 0400 | 5 |
| | State 2 | |
| 0 | 0000 | 1 |
| 1 | 0000 | 6 |
| 2 | 0000 | 3 |
| 3 | 0000 | 4 |
| 4 | 0000 | 5 |
| 5 | 0001 | 0 |
| 6 | 0002 | 0 |
| 7 | 0003 | 0 |
| 8 | 0004 | 0 |
| 9 | 0005 | 0 |
| 10 | 0006 | 0 |
| 11 | 0007 | 0 |
| 12 | 0008 | 0 |
| 13 | 0009 | 0 |
| 14 | 0010 | 0 |
| 15 | 0020 | 0 |
| 16 | 0030 | 0 |
| 17 | 0040 | 0 |
| 18 | 0050 | 0 |
| 19 | 0060 | 0 |
| 20 | 0070 | 0 |
| 21 | 0080 | 0 |
| 22 | 0090 | 0 |
| 23 | 0010 | 1 |
| 24 | 0020 | 1 |
| 25 | 0030 | 1 |
| 26 | 0040 | 1 |
| 27 | 0050 | 1 |
| 28 | 0060 | 1 |
| 29 | 0070 | 1 |
| 30 | 0080 | 1 |
| 31 | 0090 | 1 |
| | State 3 | |
| 0 | 1001 | 0 |
| 1 | 1002 | 0 |

-continued

| INPUT | OUTPUT | NEXT STATE |
|---|---|---|
| 2 | 1003 | 0 |
| 3 | 1004 | 0 |
| 4 | 1005 | 0 |
| 5 | 1006 | 0 |
| 6 | 1007 | 0 |
| 7 | 1008 | 0 |
| 8 | 1009 | 0 |
| 9 | 2001 | 0 |
| 10 | 2002 | 0 |
| 11 | 2003 | 0 |
| 12 | 2004 | 0 |
| 13 | 2005 | 0 |
| 14 | 2006 | 0 |
| 15 | 2007 | 0 |
| 16 | 2008 | 0 |
| 17 | 2009 | 0 |
| 18 | 3001 | 0 |
| 19 | 3002 | 0 |
| 20 | 3003 | 0 |
| 21 | 3004 | 0 |
| 22 | 3005 | 0 |
| 23 | 3006 | 0 |
| 24 | 3007 | 0 |
| 25 | 3008 | 0 |
| 26 | 3009 | 0 |
| 27 | 4001 | 0 |
| 28 | 4002 | 0 |
| 29 | 4003 | 0 |
| 30 | 4004 | 0 |
| 31 | 4005 | 0 |
| | State 4 | |
| 0 | 4006 | 0 |
| 1 | 4007 | 0 |
| 2 | 4008 | 0 |
| 3 | 4009 | 0 |
| 4 | 5001 | 0 |
| 5 | 5002 | 0 |
| 6 | 5003 | 0 |
| 7 | 5004 | 0 |
| 8 | 5005 | 0 |
| 9 | 5006 | 0 |
| 10 | 5007 | 0 |
| 11 | 5008 | 0 |
| 12 | 5009 | 0 |
| 13 | 6001 | 0 |
| 14 | 6002 | 0 |
| 15 | 6003 | 0 |
| 16 | 6004 | 0 |
| 17 | 6005 | 0 |
| 18 | 6006 | 0 |
| 19 | 6007 | 0 |
| 20 | 6008 | 0 |
| 21 | 6009 | 0 |
| 22 | 7001 | 0 |
| 23 | 7002 | 0 |
| 24 | 7003 | 0 |
| 25 | 7004 | 0 |
| 26 | 7005 | 0 |
| 27 | 7006 | 0 |
| 28 | 7007 | 0 |
| 29 | 7008 | 0 |
| 30 | 7009 | 0 |
| 31 | 8001 | 0 |
| | State 5 | |
| 0 | 8002 | 0 |
| 1 | 8003 | 0 |
| 2 | 8004 | 0 |
| 3 | 8005 | 0 |
| 4 | 8006 | 0 |
| 5 | 8007 | 0 |
| 6 | 8008 | 0 |
| 7 | 8009 | 0 |
| 8 | 9001 | 0 |
| 9 | 9002 | 0 |
| 10 | 9003 | 0 |

-continued

| INPUT | OUTPUT | NEXT STATE |
|---|---|---|
| 11 | 9004 | 0 |
| 12 | 9005 | 0 |
| 13 | 9006 | 0 |
| 14 | 9007 | 0 |
| 15 | 9008 | 0 |
| 16 | 9009 | 0 |
| 17 | 1000 | 1 |
| 18 | 2000 | 1 |
| 19 | 3000 | 1 |
| 20 | 1000 | 2 |
| 21 | 2000 | 2 |
| 22 | 3000 | 2 |
| 23 | 1000 | 3 |
| 24 | 2000 | 3 |
| 25 | 3000 | 3 |
| 26 | 1000 | 4 |
| 27 | 2000 | 4 |
| 28 | 3000 | 4 |
| 29 | 1000 | 5 |
| 30 | 2000 | 5 |
| 31 | 3000 | 5 |
| | State 6 | |
| 0 | 4000 | 1 |
| 1 | 5000 | 1 |
| 2 | 6000 | 1 |
| 3 | 7000 | 1 |
| 4 | 8000 | 1 |
| 5 | 9000 | 1 |
| 6 | 4000 | 2 |
| 7 | 5000 | 2 |
| 8 | 6000 | 2 |
| 9 | 7000 | 2 |
| 10 | 8000 | 2 |
| 11 | 9000 | 2 |
| 12 | 4000 | 3 |
| 13 | 5000 | 3 |
| 14 | 6000 | 3 |
| 15 | 7000 | 3 |
| 16 | 8000 | 3 |
| 17 | 9000 | 3 |
| 18 | 4000 | 4 |
| 19 | 5000 | 4 |
| 20 | 6000 | 4 |
| 21 | 7000 | 4 |
| 22 | 8000 | 4 |
| 23 | 9000 | 4 |
| 24 | 4000 | 5 |
| 25 | 5000 | 5 |
| 26 | 6000 | 5 |
| 27 | 7000 | 5 |
| 28 | 8000 | 5 |
| 29 | 9000 | 5 |
| 30 | 0800 | 1 |
| 31 | 0900 | 1 |

wherein said code symbol set $y_0$–$y_3$ is generated based on the input data bit set $x_0$–$x_4$ and the current state of said seven-state encoder when said data bit set $x_0$–$x_4$ is received; and means for generating in a waveform encoder waveform signal amplitudes based on said code symbols, wherein each said waveform signal amplitude is generated by modulo ten addition of a current code symbol with a previous waveform signal amplitude.

16. The system of claim 15, further comprising means for modulating a signal with said waveform signal amplitudes to generate a series of features, each feature being at a level corresponding to a waveform signal amplitude; and wherein said waveform signal amplitudes modulate a write laser and wherein said modulated write laser writes said features onto a storage medium.

17. The system of claim 16, further comprising:

means for receiving said features to recover output waveform signal amplitudes;

means for converting said output waveform signal amplitudes into output code symbols, wherein each output code symbol is at one of ten levels; and means for decoding said output code symbols to obtain output data bits, wherein said output data bits correspond to the binary input data.

18. The system of claim 17, wherein said means for decoding comprises:

means for identifying with a sliding window a sequence of code symbols that represents a given code symbol set; and means for, in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit set for said given code symbol set.

19. The system of claim 18, wherein said lookup table provides an output bit set x' for each sequence of code symbols y' according to the following table:

| Window Contents | | | X' |
|---|---|---|---|
| 0 0 0 X | 0 0 0 0 | 0 1 0 0 | 0 0 0 0 0 |
| 0 0 0 X | 0 0 0 0 | 0 2 0 0 | 0 0 0 0 0 |
| 0 0 0 X | 0 0 0 0 | 0 3 0 0 | 0 0 0 0 0 |
| 0 0 0 X | 0 0 0 0 | 0 4 0 0 | 0 0 0 0 0 |
| 0 0 0 X | 0 0 0 0 | 0 5 0 0 | 0 0 0 0 0 |
| 0 0 0 X | 0 0 0 0 | 0 6 0 0 | 0 0 0 0 0 |
| 0 0 0 X | 0 0 0 0 | 0 7 0 0 | 0 0 0 0 0 |
| 0 0 X 0 | 0 0 0 0 | 0 1 0 0 | 0 0 0 0 0 |
| 0 0 X 0 | 0 0 0 0 | 0 2 0 0 | 0 0 0 0 0 |
| 0 0 X 0 | 0 0 0 0 | 0 3 0 0 | 0 0 0 0 0 |
| 0 0 X 0 | 0 0 0 0 | 0 4 0 0 | 0 0 0 0 0 |
| 0 0 X 0 | 0 0 0 0 | 0 5 0 0 | 0 0 0 0 0 |
| 0 0 X 0 | 0 0 0 0 | 0 6 0 0 | 0 0 0 0 0 |
| 0 0 X 0 | 0 0 0 0 | 0 7 0 0 | 0 0 0 0 0 |
| X 0 0 X | 0 0 0 0 | 0 1 0 0 | 0 0 0 0 0 |
| X 0 0 X | 0 0 0 0 | 0 2 0 0 | 0 0 0 0 0 |
| X 0 0 X | 0 0 0 0 | 0 3 0 0 | 0 0 0 0 0 |
| X 0 0 X | 0 0 0 0 | 0 4 0 0 | 0 0 0 0 0 |
| X 0 0 X | 0 0 0 0 | 0 5 0 0 | 0 0 0 0 0 |
| X 0 0 X | 0 0 0 0 | 0 6 0 0 | 0 0 0 0 0 |
| X 0 0 X | 0 0 0 0 | 0 7 0 0 | 0 0 0 0 0 |
| 0 0 0 X | 0 0 0 0 | 0 0 0 0 | 0 0 0 0 1 |
| 0 0 0 X | 0 0 0 0 | 0 0 X 0 | 0 0 0 0 1 |
| 0 0 0 X | 0 0 0 0 | 0 0 0 X | 0 0 0 0 1 |
| 0 0 X 0 | 0 0 0 0 | 0 0 0 0 | 0 0 0 0 1 |
| 0 0 X 0 | 0 0 0 0 | 0 0 X 0 | 0 0 0 0 1 |
| 0 0 X 0 | 0 0 0 0 | 0 0 0 X | 0 0 0 0 1 |
| X 0 0 X | 0 0 0 0 | 0 0 0 0 | 0 0 0 0 1 |
| X 0 0 X | 0 0 0 0 | 0 0 X 0 | 0 0 0 0 1 |
| X 0 0 X | 0 0 0 0 | 0 0 0 X | 0 0 0 0 1 |
| 0 0 0 X | 0 0 0 0 | 1 0 0 1 | 0 0 0 1 0 |
| 0 0 0 X | 0 0 0 0 | 1 0 0 2 | 0 0 0 1 0 |
| 0 0 0 X | 0 0 0 0 | 1 0 0 3 | 0 0 0 1 0 |
| 0 0 0 X | 0 0 0 0 | 1 0 0 4 | 0 0 0 1 0 |
| 0 0 0 X | 0 0 0 0 | 1 0 0 5 | 0 0 0 1 0 |
| 0 0 0 X | 0 0 0 0 | 1 0 0 6 | 0 0 0 1 0 |
| 0 0 0 X | 0 0 0 0 | 1 0 0 7 | 0 0 0 1 0 |
| 0 0 0 X | 0 0 0 0 | 1 0 0 8 | 0 0 0 1 0 |
| 0 0 0 X | 0 0 0 0 | 1 0 0 9 | 0 0 0 1 0 |
| 0 0 0 X | 0 0 0 0 | 2 0 0 1 | 0 0 0 1 0 |
| 0 0 0 X | 0 0 0 0 | 2 0 0 2 | 0 0 0 1 0 |
| 0 0 0 X | 0 0 0 0 | 2 0 0 3 | 0 0 0 1 0 |

-continued

| Window Contents | | | X' |
|---|---|---|---|
| 0 0 0 X | 0 0 0 0 | 2 0 0 4 | 0 0 0 1 0 |
| 0 0 0 X | 0 0 0 0 | 2 0 0 5 | 0 0 0 1 0 |
| 0 0 0 X | 0 0 0 0 | 2 0 0 6 | 0 0 0 1 0 |
| 0 0 0 X | 0 0 0 0 | 2 0 0 7 | 0 0 0 1 0 |
| 0 0 0 X | 0 0 0 0 | 2 0 0 8 | 0 0 0 1 0 |
| 0 0 0 X | 0 0 0 0 | 2 0 0 9 | 0 0 0 1 0 |
| 0 0 0 X | 0 0 0 0 | 3 0 0 1 | 0 0 0 1 0 |
| 0 0 0 X | 0 0 0 0 | 3 0 0 2 | 0 0 0 1 0 |
| 0 0 0 X | 0 0 0 0 | 3 0 0 3 | 0 0 0 1 0 |
| 0 0 0 X | 0 0 0 0 | 3 0 0 4 | 0 0 0 1 0 |
| 0 0 0 X | 0 0 0 0 | 3 0 0 5 | 0 0 0 1 0 |
| 0 0 0 X | 0 0 0 0 | 3 0 0 6 | 0 0 0 1 0 |
| 0 0 0 X | 0 0 0 0 | 3 0 0 7 | 0 0 0 1 0 |
| 0 0 0 X | 0 0 0 0 | 3 0 0 8 | 0 0 0 1 0 |
| 0 0 0 X | 0 0 0 0 | 3 0 0 9 | 0 0 0 1 0 |
| 0 0 0 X | 0 0 0 0 | 4 0 0 1 | 0 0 0 1 0 |
| 0 0 0 X | 0 0 0 0 | 4 0 0 2 | 0 0 0 1 0 |
| 0 0 0 X | 0 0 0 0 | 4 0 0 3 | 0 0 0 1 0 |
| 0 0 0 X | 0 0 0 0 | 4 0 0 4 | 0 0 0 1 0 |
| 0 0 0 X | 0 0 0 0 | 4 0 0 5 | 0 0 0 1 0 |
| 0 0 X 0 | 0 0 0 0 | 1 0 0 1 | 0 0 0 1 0 |
| 0 0 X 0 | 0 0 0 0 | 1 0 0 2 | 0 0 0 1 0 |
| 0 0 X 0 | 0 0 0 0 | 1 0 0 3 | 0 0 0 1 0 |
| 0 0 X 0 | 0 0 0 0 | 1 0 0 4 | 0 0 0 1 0 |
| 0 0 X 0 | 0 0 0 0 | 1 0 0 5 | 0 0 0 1 0 |
| 0 0 X 0 | 0 0 0 0 | 1 0 0 6 | 0 0 0 1 0 |
| 0 0 X 0 | 0 0 0 0 | 1 0 0 7 | 0 0 0 1 0 |
| 0 0 X 0 | 0 0 0 0 | 1 0 0 8 | 0 0 0 1 0 |
| 0 0 X 0 | 0 0 0 0 | 1 0 0 9 | 0 0 0 1 0 |
| 0 0 X 0 | 0 0 0 0 | 2 0 0 1 | 0 0 0 1 0 |
| 0 0 X 0 | 0 0 0 0 | 2 0 0 2 | 0 0 0 1 0 |
| 0 0 X 0 | 0 0 0 0 | 2 0 0 3 | 0 0 0 1 0 |
| 0 0 X 0 | 0 0 0 0 | 2 0 0 4 | 0 0 0 1 0 |
| 0 0 X 0 | 0 0 0 0 | 2 0 0 5 | 0 0 0 1 0 |
| 0 0 X 0 | 0 0 0 0 | 2 0 0 6 | 0 0 0 1 0 |
| 0 0 X 0 | 0 0 0 0 | 2 0 0 7 | 0 0 0 1 0 |
| 0 0 X 0 | 0 0 0 0 | 2 0 0 8 | 0 0 0 1 0 |
| 0 0 X 0 | 0 0 0 0 | 2 0 0 9 | 0 0 0 1 0 |
| 0 0 X 0 | 0 0 0 0 | 3 0 0 1 | 0 0 0 1 0 |
| 0 0 X 0 | 0 0 0 0 | 3 0 0 2 | 0 0 0 1 0 |
| 0 0 X 0 | 0 0 0 0 | 3 0 0 3 | 0 0 0 1 0 |
| 0 0 X 0 | 0 0 0 0 | 3 0 0 4 | 0 0 0 1 0 |
| 0 0 X 0 | 0 0 0 0 | 3 0 0 5 | 0 0 0 1 0 |
| 0 0 X 0 | 0 0 0 0 | 3 0 0 6 | 0 0 0 1 0 |
| 0 0 X 0 | 0 0 0 0 | 3 0 0 7 | 0 0 0 1 0 |
| 0 0 X 0 | 0 0 0 0 | 3 0 0 8 | 0 0 0 1 0 |
| 0 0 X 0 | 0 0 0 0 | 3 0 0 9 | 0 0 0 1 0 |
| 0 0 X 0 | 0 0 0 0 | 4 0 0 1 | 0 0 0 1 0 |
| 0 0 X 0 | 0 0 0 0 | 4 0 0 2 | 0 0 0 1 0 |
| 0 0 X 0 | 0 0 0 0 | 4 0 0 3 | 0 0 0 1 0 |
| 0 0 X 0 | 0 0 0 0 | 4 0 0 4 | 0 0 0 1 0 |
| 0 0 X 0 | 0 0 0 0 | 4 0 0 5 | 0 0 0 1 0 |
| X 0 0 X | 0 0 0 0 | 1 0 0 1 | 0 0 0 1 0 |
| X 0 0 X | 0 0 0 0 | 1 0 0 2 | 0 0 0 1 0 |
| X 0 0 X | 0 0 0 0 | 1 0 0 3 | 0 0 0 1 0 |
| X 0 0 X | 0 0 0 0 | 1 0 0 4 | 0 0 0 1 0 |
| X 0 0 X | 0 0 0 0 | 1 0 0 5 | 0 0 0 1 0 |
| X 0 0 X | 0 0 0 0 | 1 0 0 6 | 0 0 0 1 0 |
| X 0 0 X | 0 0 0 0 | 1 0 0 7 | 0 0 0 1 0 |
| X 0 0 X | 0 0 0 0 | 1 0 0 8 | 0 0 0 1 0 |
| X 0 0 X | 0 0 0 0 | 1 0 0 9 | 0 0 0 1 0 |
| X 0 0 X | 0 0 0 0 | 2 0 0 1 | 0 0 0 1 0 |
| X 0 0 X | 0 0 0 0 | 2 0 0 2 | 0 0 0 1 0 |
| X 0 0 X | 0 0 0 0 | 2 0 0 3 | 0 0 0 1 0 |
| X 0 0 X | 0 0 0 0 | 2 0 0 4 | 0 0 0 1 0 |
| X 0 0 X | 0 0 0 0 | 2 0 0 5 | 0 0 0 1 0 |
| X 0 0 X | 0 0 0 0 | 2 0 0 6 | 0 0 0 1 0 |
| X 0 0 X | 0 0 0 0 | 2 0 0 7 | 0 0 0 1 0 |
| X 0 0 X | 0 0 0 0 | 2 0 0 8 | 0 0 0 1 0 |
| X 0 0 X | 0 0 0 0 | 2 0 0 9 | 0 0 0 1 0 |
| X 0 0 X | 0 0 0 0 | 3 0 0 1 | 0 0 0 1 0 |
| X 0 0 X | 0 0 0 0 | 3 0 0 2 | 0 0 0 1 0 |
| X 0 0 X | 0 0 0 0 | 3 0 0 3 | 0 0 0 1 0 |
| X 0 0 X | 0 0 0 0 | 3 0 0 4 | 0 0 0 1 0 |
| X 0 0 X | 0 0 0 0 | 3 0 0 5 | 0 0 0 1 0 |
| X 0 0 X | 0 0 0 0 | 3 0 0 6 | 0 0 0 1 0 |
| X 0 0 X | 0 0 0 0 | 3 0 0 7 | 0 0 0 1 0 |

-continued

| Window Contents | | | X' |
|---|---|---|---|
| X 0 0 X | 0 0 0 0 | 3 0 0 8 | 0 0 0 1 0 |
| X 0 0 X | 0 0 0 0 | 3 0 0 9 | 0 0 0 1 0 |
| X 0 0 X | 0 0 0 0 | 4 0 0 1 | 0 0 0 1 0 |
| X 0 0 X | 0 0 0 0 | 4 0 0 2 | 0 0 0 1 0 |
| X 0 0 X | 0 0 0 0 | 4 0 0 3 | 0 0 0 1 0 |
| X 0 0 X | 0 0 0 0 | 4 0 0 4 | 0 0 0 1 0 |
| X 0 0 X | 0 0 0 0 | 4 0 0 5 | 0 0 0 1 0 |
| 0 0 0 X | 0 0 0 0 | 4 0 0 6 | 0 0 0 1 1 |
| 0 0 0 X | 0 0 0 0 | 4 0 0 7 | 0 0 0 1 1 |
| 0 0 0 X | 0 0 0 0 | 4 0 0 8 | 0 0 0 1 1 |
| 0 0 0 X | 0 0 0 0 | 4 0 0 9 | 0 0 0 1 1 |
| 0 0 0 X | 0 0 0 0 | 5 0 0 1 | 0 0 0 1 1 |
| 0 0 0 X | 0 0 0 0 | 5 0 0 2 | 0 0 0 1 1 |
| 0 0 0 X | 0 0 0 0 | 5 0 0 3 | 0 0 0 1 1 |
| 0 0 0 X | 0 0 0 0 | 5 0 0 4 | 0 0 0 1 1 |
| 0 0 0 X | 0 0 0 0 | 5 0 0 5 | 0 0 0 1 1 |
| 0 0 0 X | 0 0 0 0 | 5 0 0 6 | 0 0 0 1 1 |
| 0 0 0 X | 0 0 0 0 | 5 0 0 7 | 0 0 0 1 1 |
| 0 0 0 X | 0 0 0 0 | 5 0 0 8 | 0 0 0 1 1 |
| 0 0 0 X | 0 0 0 0 | 5 0 0 9 | 0 0 0 1 1 |
| 0 0 0 X | 0 0 0 0 | 6 0 0 1 | 0 0 0 1 1 |
| 0 0 0 X | 0 0 0 0 | 6 0 0 2 | 0 0 0 1 1 |
| 0 0 0 X | 0 0 0 0 | 6 0 0 3 | 0 0 0 1 1 |
| 0 0 0 X | 0 0 0 0 | 6 0 0 4 | 0 0 0 1 1 |
| 0 0 0 X | 0 0 0 0 | 6 0 0 5 | 0 0 0 1 1 |
| 0 0 0 X | 0 0 0 0 | 6 0 0 6 | 0 0 0 1 1 |
| 0 0 0 X | 0 0 0 0 | 6 0 0 7 | 0 0 0 1 1 |
| 0 0 0 X | 0 0 0 0 | 6 0 0 8 | 0 0 0 1 1 |
| 0 0 0 X | 0 0 0 0 | 6 0 0 9 | 0 0 0 1 1 |
| 0 0 0 X | 0 0 0 0 | 7 0 0 1 | 0 0 0 1 1 |
| 0 0 0 X | 0 0 0 0 | 7 0 0 2 | 0 0 0 1 1 |
| 0 0 0 X | 0 0 0 0 | 7 0 0 3 | 0 0 0 1 1 |
| 0 0 0 X | 0 0 0 0 | 7 0 0 4 | 0 0 0 1 1 |
| 0 0 0 X | 0 0 0 0 | 7 0 0 5 | 0 0 0 1 1 |
| 0 0 0 X | 0 0 0 0 | 7 0 0 6 | 0 0 0 1 1 |
| 0 0 0 X | 0 0 0 0 | 7 0 0 7 | 0 0 0 1 1 |
| 0 0 0 X | 0 0 0 0 | 7 0 0 8 | 0 0 0 1 1 |
| 0 0 0 X | 0 0 0 0 | 7 0 0 9 | 0 0 0 1 1 |
| 0 0 0 X | 0 0 0 0 | 8 0 0 1 | 0 0 0 1 1 |
| 0 0 X 0 | 0 0 0 0 | 4 0 0 6 | 0 0 0 1 1 |
| 0 0 X 0 | 0 0 0 0 | 4 0 0 7 | 0 0 0 1 1 |
| 0 0 X 0 | 0 0 0 0 | 4 0 0 8 | 0 0 0 1 1 |
| 0 0 X 0 | 0 0 0 0 | 4 0 0 9 | 0 0 0 1 1 |
| 0 0 X 0 | 0 0 0 0 | 5 0 0 1 | 0 0 0 1 1 |
| 0 0 X 0 | 0 0 0 0 | 5 0 0 2 | 0 0 0 1 1 |
| 0 0 X 0 | 0 0 0 0 | 5 0 0 3 | 0 0 0 1 1 |
| 0 0 X 0 | 0 0 0 0 | 5 0 0 4 | 0 0 0 1 1 |
| 0 0 X 0 | 0 0 0 0 | 5 0 0 5 | 0 0 0 1 1 |
| 0 0 X 0 | 0 0 0 0 | 5 0 0 6 | 0 0 0 1 1 |
| 0 0 X 0 | 0 0 0 0 | 5 0 0 7 | 0 0 0 1 1 |
| 0 0 X 0 | 0 0 0 0 | 5 0 0 8 | 0 0 0 1 1 |
| 0 0 X 0 | 0 0 0 0 | 5 0 0 9 | 0 0 0 1 1 |
| 0 0 X 0 | 0 0 0 0 | 6 0 0 1 | 0 0 0 1 1 |
| 0 0 X 0 | 0 0 0 0 | 6 0 0 2 | 0 0 0 1 1 |
| 0 0 X 0 | 0 0 0 0 | 6 0 0 3 | 0 0 0 1 1 |
| 0 0 X 0 | 0 0 0 0 | 6 0 0 4 | 0 0 0 1 1 |
| 0 0 X 0 | 0 0 0 0 | 6 0 0 5 | 0 0 0 1 1 |
| 0 0 X 0 | 0 0 0 0 | 6 0 0 6 | 0 0 0 1 1 |
| 0 0 X 0 | 0 0 0 0 | 6 0 0 7 | 0 0 0 1 1 |
| 0 0 X 0 | 0 0 0 0 | 6 0 0 8 | 0 0 0 1 1 |
| 0 0 X 0 | 0 0 0 0 | 6 0 0 9 | 0 0 0 1 1 |
| 0 0 X 0 | 0 0 0 0 | 7 0 0 1 | 0 0 0 1 1 |
| 0 0 X 0 | 0 0 0 0 | 7 0 0 2 | 0 0 0 1 1 |
| 0 0 X 0 | 0 0 0 0 | 7 0 0 3 | 0 0 0 1 1 |
| 0 0 X 0 | 0 0 0 0 | 7 0 0 4 | 0 0 0 1 1 |
| 0 0 X 0 | 0 0 0 0 | 7 0 0 5 | 0 0 0 1 1 |
| 0 0 X 0 | 0 0 0 0 | 7 0 0 6 | 0 0 0 1 1 |
| 0 0 X 0 | 0 0 0 0 | 7 0 0 7 | 0 0 0 1 1 |
| 0 0 X 0 | 0 0 0 0 | 7 0 0 8 | 0 0 0 1 1 |
| 0 0 X 0 | 0 0 0 0 | 7 0 0 9 | 0 0 0 1 1 |
| 0 0 X 0 | 0 0 0 0 | 8 0 0 1 | 0 0 0 1 1 |
| X 0 0 X | 0 0 0 0 | 4 0 0 6 | 0 0 0 1 1 |
| X 0 0 X | 0 0 0 0 | 4 0 0 7 | 0 0 0 1 1 |
| X 0 0 X | 0 0 0 0 | 4 0 0 8 | 0 0 0 1 1 |
| X 0 0 X | 0 0 0 0 | 4 0 0 9 | 0 0 0 1 1 |
| X 0 0 X | 0 0 0 0 | 5 0 0 1 | 0 0 0 1 1 |
| X 0 0 X | 0 0 0 0 | 5 0 0 2 | 0 0 0 1 1 |

-continued

| Window Contents | | | X' |
|---|---|---|---|
| X 0 0 X | 0 0 0 0 | 5 0 0 3 | 0 0 0 1 1 |
| X 0 0 X | 0 0 0 0 | 5 0 0 4 | 0 0 0 1 1 |
| X 0 0 X | 0 0 0 0 | 5 0 0 5 | 0 0 0 1 1 |
| X 0 0 X | 0 0 0 0 | 5 0 0 6 | 0 0 0 1 1 |
| X 0 0 X | 0 0 0 0 | 5 0 0 7 | 0 0 0 1 1 |
| X 0 0 X | 0 0 0 0 | 5 0 0 8 | 0 0 0 1 1 |
| X 0 0 X | 0 0 0 0 | 5 0 0 9 | 0 0 0 1 1 |
| X 0 0 X | 0 0 0 0 | 6 0 0 1 | 0 0 0 1 1 |
| X 0 0 X | 0 0 0 0 | 6 0 0 2 | 0 0 0 1 1 |
| X 0 0 X | 0 0 0 0 | 6 0 0 3 | 0 0 0 1 1 |
| X 0 0 X | 0 0 0 0 | 6 0 0 4 | 0 0 0 1 1 |
| X 0 0 X | 0 0 0 0 | 6 0 0 5 | 0 0 0 1 1 |
| X 0 0 X | 0 0 0 0 | 6 0 0 6 | 0 0 0 1 1 |
| X 0 0 X | 0 0 0 0 | 6 0 0 7 | 0 0 0 1 1 |
| X 0 0 X | 0 0 0 0 | 6 0 0 8 | 0 0 0 1 1 |
| X 0 0 X | 0 0 0 0 | 6 0 0 9 | 0 0 0 1 1 |
| X 0 0 X | 0 0 0 0 | 7 0 0 1 | 0 0 0 1 1 |
| X 0 0 X | 0 0 0 0 | 7 0 0 2 | 0 0 0 1 1 |
| X 0 0 X | 0 0 0 0 | 7 0 0 3 | 0 0 0 1 1 |
| X 0 0 X | 0 0 0 0 | 7 0 0 4 | 0 0 0 1 1 |
| X 0 0 X | 0 0 0 0 | 7 0 0 5 | 0 0 0 1 1 |
| X 0 0 X | 0 0 0 0 | 7 0 0 6 | 0 0 0 1 1 |
| X 0 0 X | 0 0 0 0 | 7 0 0 7 | 0 0 0 1 1 |
| X 0 0 X | 0 0 0 0 | 7 0 0 8 | 0 0 0 1 1 |
| X 0 0 X | 0 0 0 0 | 7 0 0 9 | 0 0 0 1 1 |
| X 0 0 X | 0 0 0 0 | 8 0 0 1 | 0 0 0 1 1 |
| 0 0 0 X | 0 0 0 0 | 8 0 0 2 | 0 0 1 0 0 |
| 0 0 0 X | 0 0 0 0 | 8 0 0 3 | 0 0 1 0 0 |
| 0 0 0 X | 0 0 0 0 | 8 0 0 4 | 0 0 1 0 0 |
| 0 0 0 X | 0 0 0 0 | 8 0 0 5 | 0 0 1 0 0 |
| 0 0 0 X | 0 0 0 0 | 8 0 0 6 | 0 0 1 0 0 |
| 0 0 0 X | 0 0 0 0 | 8 0 0 7 | 0 0 1 0 0 |
| 0 0 0 X | 0 0 0 0 | 8 0 0 8 | 0 0 1 0 0 |
| 0 0 0 X | 0 0 0 0 | 8 0 0 9 | 0 0 1 0 0 |
| 0 0 0 X | 0 0 0 0 | 9 0 0 1 | 0 0 1 0 0 |
| 0 0 0 X | 0 0 0 0 | 9 0 0 2 | 0 0 1 0 0 |
| 0 0 0 X | 0 0 0 0 | 9 0 0 3 | 0 0 1 0 0 |
| 0 0 0 X | 0 0 0 0 | 9 0 0 4 | 0 0 1 0 0 |
| 0 0 0 X | 0 0 0 0 | 9 0 0 5 | 0 0 1 0 0 |
| 0 0 0 X | 0 0 0 0 | 9 0 0 6 | 0 0 1 0 0 |
| 0 0 0 X | 0 0 0 0 | 9 0 0 7 | 0 0 1 0 0 |
| 0 0 0 X | 0 0 0 0 | 9 0 0 8 | 0 0 1 0 0 |
| 0 0 0 X | 0 0 0 0 | 9 0 0 9 | 0 0 1 0 0 |
| 0 0 0 X | 0 0 0 0 | 1 0 0 0 | 0 0 1 0 0 |
| 0 0 0 X | 0 0 0 0 | 2 0 0 0 | 0 0 1 0 0 |
| 0 0 0 X | 0 0 0 0 | 3 0 0 0 | 0 0 1 0 0 |
| 0 0 X 0 | 0 0 0 0 | 8 0 0 2 | 0 0 1 0 0 |
| 0 0 X 0 | 0 0 0 0 | 8 0 0 3 | 0 0 1 0 0 |
| 0 0 X 0 | 0 0 0 0 | 8 0 0 4 | 0 0 1 0 0 |
| 0 0 X 0 | 0 0 0 0 | 8 0 0 5 | 0 0 1 0 0 |
| 0 0 X 0 | 0 0 0 0 | 8 0 0 6 | 0 0 1 0 0 |
| 0 0 X 0 | 0 0 0 0 | 8 0 0 7 | 0 0 1 0 0 |
| 0 0 X 0 | 0 0 0 0 | 8 0 0 8 | 0 0 1 0 0 |
| 0 0 X 0 | 0 0 0 0 | 8 0 0 9 | 0 0 1 0 0 |
| 0 0 X 0 | 0 0 0 0 | 9 0 0 1 | 0 0 1 0 0 |
| 0 0 X 0 | 0 0 0 0 | 9 0 0 2 | 0 0 1 0 0 |
| 0 0 X 0 | 0 0 0 0 | 9 0 0 3 | 0 0 1 0 0 |
| 0 0 X 0 | 0 0 0 0 | 9 0 0 4 | 0 0 1 0 0 |
| 0 0 X 0 | 0 0 0 0 | 9 0 0 5 | 0 0 1 0 0 |
| 0 0 X 0 | 0 0 0 0 | 9 0 0 6 | 0 0 1 0 0 |
| 0 0 X 0 | 0 0 0 0 | 9 0 0 7 | 0 0 1 0 0 |
| 0 0 X 0 | 0 0 0 0 | 9 0 0 8 | 0 0 1 0 0 |
| 0 0 X 0 | 0 0 0 0 | 9 0 0 9 | 0 0 1 0 0 |
| 0 0 X 0 | 0 0 0 0 | 1 0 0 0 | 0 0 1 0 0 |
| 0 0 X 0 | 0 0 0 0 | 2 0 0 0 | 0 0 1 0 0 |
| 0 0 X 0 | 0 0 0 0 | 3 0 0 0 | 0 0 1 0 0 |
| X 0 0 X | 0 0 0 0 | 8 0 0 2 | 0 0 1 0 0 |
| X 0 0 X | 0 0 0 0 | 8 0 0 3 | 0 0 1 0 0 |
| X 0 0 X | 0 0 0 0 | 8 0 0 4 | 0 0 1 0 0 |
| X 0 0 X | 0 0 0 0 | 8 0 0 5 | 0 0 1 0 0 |
| X 0 0 X | 0 0 0 0 | 8 0 0 6 | 0 0 1 0 0 |
| X 0 0 X | 0 0 0 0 | 8 0 0 7 | 0 0 1 0 0 |
| X 0 0 X | 0 0 0 0 | 8 0 0 8 | 0 0 1 0 0 |
| X 0 0 X | 0 0 0 0 | 8 0 0 9 | 0 0 1 0 0 |
| X 0 0 X | 0 0 0 0 | 9 0 0 1 | 0 0 1 0 0 |
| X 0 0 X | 0 0 0 0 | 9 0 0 2 | 0 0 1 0 0 |
| X 0 0 X | 0 0 0 0 | 9 0 0 3 | 0 0 1 0 0 |

-continued

| Window Contents | | | X' |
|---|---|---|---|
| X 0 0 X | 0 0 0 0 | 9 0 0 4 | 0 0 1 0 0 |
| X 0 0 X | 0 0 0 0 | 9 0 0 5 | 0 0 1 0 0 |
| X 0 0 X | 0 0 0 0 | 9 0 0 6 | 0 0 1 0 0 |
| X 0 0 X | 0 0 0 0 | 9 0 0 7 | 0 0 1 0 0 |
| X 0 0 X | 0 0 0 0 | 9 0 0 8 | 0 0 1 0 0 |
| X 0 0 X | 0 0 0 0 | 9 0 0 9 | 0 0 1 0 0 |
| X 0 0 X | 0 0 0 0 | 1 0 0 0 | 0 0 1 0 0 |
| X 0 0 X | 0 0 0 0 | 2 0 0 0 | 0 0 1 0 0 |
| X 0 0 X | 0 0 0 0 | 3 0 0 0 | 0 0 1 0 0 |
| X X X X | 0 0 0 1 | X X X X | 0 0 1 0 1 |
| X X X X | 0 0 0 2 | X X X X | 0 0 1 1 0 |
| X X X X | 0 0 0 3 | X X X X | 0 0 1 1 1 |
| X X X X | 0 0 0 4 | X X X X | 0 1 0 0 0 |
| X X X X | 0 0 0 5 | X X X X | 0 1 0 0 1 |
| X X X X | 0 0 0 6 | X X X X | 0 1 0 1 0 |
| X X X X | 0 0 0 7 | X X X X | 0 1 0 1 1 |
| X X X X | 0 0 0 8 | X X X X | 0 1 1 0 0 |
| X X X X | 0 0 0 9 | X X X X | 0 1 1 0 1 |
| X X X X | 0 0 1 0 | 0 0 0 0 | 0 1 1 1 0 |
| X X X X | 0 0 1 0 | 0 0 X 0 | 0 1 1 1 0 |
| X X X X | 0 0 1 0 | 0 0 0 X | 0 1 1 1 0 |
| X X X X | 0 0 2 0 | 0 0 0 0 | 0 1 1 1 1 |
| X X X X | 0 0 2 0 | 0 0 X 0 | 0 1 1 1 1 |
| X X X X | 0 0 2 0 | 0 0 0 X | 0 1 1 1 1 |
| X X X X | 0 0 3 0 | 0 0 0 0 | 1 0 0 0 0 |
| X X X X | 0 0 3 0 | 0 0 X 0 | 1 0 0 0 0 |
| X X X X | 0 0 3 0 | 0 0 0 X | 1 0 0 0 0 |
| X X X X | 0 0 4 0 | 0 0 0 0 | 1 0 0 0 1 |
| X X X X | 0 0 4 0 | 0 0 X 0 | 1 0 0 0 1 |
| X X X X | 0 0 4 0 | 0 0 0 X | 1 0 0 0 1 |
| X X X X | 0 0 5 0 | 0 0 0 0 | 1 0 0 1 0 |
| X X X X | 0 0 5 0 | 0 0 X 0 | 1 0 0 1 0 |
| X X X X | 0 0 5 0 | 0 0 0 X | 1 0 0 1 0 |
| X X X X | 0 0 6 0 | 0 0 0 0 | 1 0 0 1 1 |
| X X X X | 0 0 6 0 | 0 0 X 0 | 1 0 0 1 1 |
| X X X X | 0 0 6 0 | 0 0 0 X | 1 0 0 1 1 |
| X X X X | 0 0 7 0 | 0 0 0 0 | 1 0 1 0 0 |
| X X X X | 0 0 7 0 | 0 0 X 0 | 1 0 1 0 0 |
| X X X X | 0 0 7 0 | 0 0 0 X | 1 0 1 0 0 |
| X X X X | 0 0 8 0 | 0 0 0 0 | 1 0 1 0 1 |
| X X X X | 0 0 8 0 | 0 0 X 0 | 1 0 1 0 1 |
| X X X X | 0 0 8 0 | 0 0 0 X | 1 0 1 0 1 |
| X X X X | 0 0 9 0 | 0 0 0 0 | 1 0 1 1 0 |
| X X X X | 0 0 9 0 | 0 0 X 0 | 1 0 1 1 0 |
| X X X X | 0 0 9 0 | 0 0 0 X | 1 0 1 1 0 |
| X X X X | 0 0 1 0 | 0 1 0 0 | 1 0 1 1 1 |
| X X X X | 0 0 1 0 | 0 2 0 0 | 1 0 1 1 1 |
| X X X X | 0 0 1 0 | 0 3 0 0 | 1 0 1 1 1 |
| X X X X | 0 0 1 0 | 0 4 0 0 | 1 0 1 1 1 |
| X X X X | 0 0 1 0 | 0 5 0 0 | 1 0 1 1 1 |
| X X X X | 0 0 1 0 | 0 6 0 0 | 1 0 1 1 1 |
| X X X X | 0 0 1 0 | 0 7 0 0 | 1 0 1 1 1 |
| X X X X | 0 0 2 0 | 0 1 0 0 | 1 1 0 0 0 |
| X X X X | 0 0 2 0 | 0 2 0 0 | 1 1 0 0 0 |
| X X X X | 0 0 2 0 | 0 3 0 0 | 1 1 0 0 0 |
| X X X X | 0 0 2 0 | 0 4 0 0 | 1 1 0 0 0 |
| X X X X | 0 0 2 0 | 0 5 0 0 | 1 1 0 0 0 |
| X X X X | 0 0 2 0 | 0 6 0 0 | 1 1 0 0 0 |
| X X X X | 0 0 2 0 | 0 7 0 0 | 1 1 0 0 0 |
| X X X X | 0 0 3 0 | 0 1 0 0 | 1 1 0 0 1 |
| X X X X | 0 0 3 0 | 0 2 0 0 | 1 1 0 0 1 |
| X X X X | 0 0 3 0 | 0 3 0 0 | 1 1 0 0 1 |
| X X X X | 0 0 3 0 | 0 4 0 0 | 1 1 0 0 1 |
| X X X X | 0 0 3 0 | 0 5 0 0 | 1 1 0 0 1 |
| X X X X | 0 0 3 0 | 0 6 0 0 | 1 1 0 0 1 |
| X X X X | 0 0 3 0 | 0 7 0 0 | 1 1 0 0 1 |
| X X X X | 0 0 4 0 | 0 1 0 0 | 1 1 0 1 0 |
| X X X X | 0 0 4 0 | 0 2 0 0 | 1 1 0 1 0 |
| X X X X | 0 0 4 0 | 0 3 0 0 | 1 1 0 1 0 |
| X X X X | 0 0 4 0 | 0 4 0 0 | 1 1 0 1 0 |
| X X X X | 0 0 4 0 | 0 5 0 0 | 1 1 0 1 0 |
| X X X X | 0 0 4 0 | 0 6 0 0 | 1 1 0 1 0 |
| X X X X | 0 0 4 0 | 0 7 0 0 | 1 1 0 1 0 |
| X X X X | 0 0 5 0 | 0 1 0 0 | 1 1 0 1 1 |
| X X X X | 0 0 5 0 | 0 2 0 0 | 1 1 0 1 1 |
| X X X X | 0 0 5 0 | 0 3 0 0 | 1 1 0 1 1 |
| X X X X | 0 0 5 0 | 0 4 0 0 | 1 1 0 1 1 |

-continued

| Window Contents | | | X' |
|---|---|---|---|
| X X X X | 0 0 5 0 | 0 5 0 0 | 1 1 0 1 1 |
| X X X X | 0 0 5 0 | 0 6 0 0 | 1 1 0 1 1 |
| X X X X | 0 0 5 0 | 0 7 0 0 | 1 1 0 1 1 |
| X X X X | 0 0 6 0 | 0 1 0 0 | 1 1 1 0 0 |
| X X X X | 0 0 6 0 | 0 2 0 0 | 1 1 1 0 0 |
| X X X X | 0 0 6 0 | 0 3 0 0 | 1 1 1 0 0 |
| X X X X | 0 0 6 0 | 0 4 0 0 | 1 1 1 0 0 |
| X X X X | 0 0 6 0 | 0 5 0 0 | 1 1 1 0 0 |
| X X X X | 0 0 6 0 | 0 6 0 0 | 1 1 1 0 0 |
| X X X X | 0 0 6 0 | 0 7 0 0 | 1 1 1 0 0 |
| X X X X | 0 0 7 0 | 0 1 0 0 | 1 1 1 0 1 |
| X X X X | 0 0 7 0 | 0 2 0 0 | 1 1 1 0 1 |
| X X X X | 0 0 7 0 | 0 3 0 0 | 1 1 1 0 1 |
| X X X X | 0 0 7 0 | 0 4 0 0 | 1 1 1 0 1 |
| X X X X | 0 0 7 0 | 0 5 0 0 | 1 1 1 0 1 |
| X X X X | 0 0 7 0 | 0 6 0 0 | 1 1 1 0 1 |
| X X X X | 0 0 7 0 | 0 7 0 0 | 1 1 1 0 1 |
| X X X X | 0 0 8 0 | 0 1 0 0 | 1 1 1 1 0 |
| X X X X | 0 0 8 0 | 0 2 0 0 | 1 1 1 1 0 |
| X X X X | 0 0 8 0 | 0 3 0 0 | 1 1 1 1 0 |
| X X X X | 0 0 8 0 | 0 4 0 0 | 1 1 1 1 0 |
| X X X X | 0 0 8 0 | 0 5 0 0 | 1 1 1 1 0 |
| X X X X | 0 0 8 0 | 0 6 0 0 | 1 1 1 1 0 |
| X X X X | 0 0 8 0 | 0 7 0 0 | 1 1 1 1 0 |
| X X X X | 0 0 9 0 | 0 1 0 0 | 1 1 1 1 1 |
| X X X X | 0 0 9 0 | 0 2 0 0 | 1 1 1 1 1 |
| X X X X | 0 0 9 0 | 0 3 0 0 | 1 1 1 1 1 |
| X X X X | 0 0 9 0 | 0 4 0 0 | 1 1 1 1 1 |
| X X X X | 0 0 9 0 | 0 5 0 0 | 1 1 1 1 1 |
| X X X X | 0 0 9 0 | 0 6 0 0 | 1 1 1 1 1 |
| X X X X | 0 0 9 0 | 0 7 0 0 | 1 1 1 1 1 |
| X X X X | 0 1 0 0 | 0 1 0 0 | 0 0 0 0 0 |
| X X X X | 0 1 0 0 | 0 2 0 0 | 0 0 0 0 0 |
| X X X X | 0 1 0 0 | 0 3 0 0 | 0 0 0 0 0 |
| X X X X | 0 1 0 0 | 0 4 0 0 | 0 0 0 0 0 |
| X X X X | 0 1 0 0 | 0 5 0 0 | 0 0 0 0 0 |
| X X X X | 0 1 0 0 | 0 6 0 0 | 0 0 0 0 0 |
| X X X X | 0 1 0 0 | 0 7 0 0 | 0 0 0 0 0 |
| X X X X | 0 2 0 0 | 0 1 0 0 | 0 0 0 0 1 |
| X X X X | 0 2 0 0 | 0 2 0 0 | 0 0 0 0 1 |
| X X X X | 0 2 0 0 | 0 3 0 0 | 0 0 0 0 1 |
| X X X X | 0 2 0 0 | 0 4 0 0 | 0 0 0 0 1 |
| X X X X | 0 2 0 0 | 0 5 0 0 | 0 0 0 0 1 |
| X X X X | 0 2 0 0 | 0 6 0 0 | 0 0 0 0 1 |
| X X X X | 0 2 0 0 | 0 7 0 0 | 0 0 0 0 1 |
| X X X X | 0 3 0 0 | 0 1 0 0 | 0 0 0 1 0 |
| X X X X | 0 3 0 0 | 0 2 0 0 | 0 0 0 1 0 |
| X X X X | 0 3 0 0 | 0 3 0 0 | 0 0 0 1 0 |
| X X X X | 0 3 0 0 | 0 4 0 0 | 0 0 0 1 0 |
| X X X X | 0 3 0 0 | 0 5 0 0 | 0 0 0 1 0 |
| X X X X | 0 3 0 0 | 0 6 0 0 | 0 0 0 1 0 |
| X X X X | 0 3 0 0 | 0 7 0 0 | 0 0 0 1 0 |
| X X X X | 0 4 0 0 | 0 1 0 0 | 0 0 0 1 1 |
| X X X X | 0 4 0 0 | 0 2 0 0 | 0 0 0 1 1 |
| X X X X | 0 4 0 0 | 0 3 0 0 | 0 0 0 1 1 |
| X X X X | 0 4 0 0 | 0 4 0 0 | 0 0 0 1 1 |
| X X X X | 0 4 0 0 | 0 5 0 0 | 0 0 0 1 1 |
| X X X X | 0 4 0 0 | 0 6 0 0 | 0 0 0 1 1 |
| X X X X | 0 4 0 0 | 0 7 0 0 | 0 0 0 1 1 |
| X X X X | 0 5 0 0 | 0 1 0 0 | 0 0 1 0 0 |
| X X X X | 0 5 0 0 | 0 2 0 0 | 0 0 1 0 0 |
| X X X X | 0 5 0 0 | 0 3 0 0 | 0 0 1 0 0 |
| X X X X | 0 5 0 0 | 0 4 0 0 | 0 0 1 0 0 |
| X X X X | 0 5 0 0 | 0 5 0 0 | 0 0 1 0 0 |
| X X X X | 0 5 0 0 | 0 6 0 0 | 0 0 1 0 0 |
| X X X X | 0 5 0 0 | 0 7 0 0 | 0 0 1 0 0 |
| X X X X | 0 6 0 0 | 0 1 0 0 | 0 0 1 0 1 |
| X X X X | 0 6 0 0 | 0 2 0 0 | 0 0 1 0 1 |
| X X X X | 0 6 0 0 | 0 3 0 0 | 0 0 1 0 1 |
| X X X X | 0 6 0 0 | 0 4 0 0 | 0 0 1 0 1 |
| X X X X | 0 6 0 0 | 0 5 0 0 | 0 0 1 0 1 |
| X X X X | 0 6 0 0 | 0 6 0 0 | 0 0 1 0 1 |
| X X X X | 0 6 0 0 | 0 7 0 0 | 0 0 1 0 1 |
| X X X X | 0 7 0 0 | 0 1 0 0 | 0 0 1 1 0 |
| X X X X | 0 7 0 0 | 0 2 0 0 | 0 0 1 1 0 |
| X X X X | 0 7 0 0 | 0 3 0 0 | 0 0 1 1 0 |
| X X X X | 0 7 0 0 | 0 4 0 0 | 0 0 1 1 0 |

-continued

| Window Contents | | | X' |
|---|---|---|---|
| X X X X | 0 7 0 0 | 0 5 0 0 | 0 0 1 1 0 |
| X X X X | 0 7 0 0 | 0 6 0 0 | 0 0 1 1 0 |
| X X X X | 0 7 0 0 | 0 7 0 0 | 0 0 1 1 0 |
| X X X X | 0 1 0 0 | 0 0 0 0 | 0 0 1 1 1 |
| X X X X | 0 1 0 0 | 0 0 X 0 | 0 0 1 1 1 |
| X X X X | 0 1 0 0 | 0 0 0 X | 0 0 1 1 1 |
| X X X X | 0 2 0 0 | 0 0 0 0 | 0 1 0 0 0 |
| X X X X | 0 2 0 0 | 0 0 X 0 | 0 1 0 0 0 |
| X X X X | 0 2 0 0 | 0 0 0 X | 0 1 0 0 0 |
| X X X X | 0 3 0 0 | 0 0 0 0 | 0 1 0 0 1 |
| X X X X | 0 3 0 0 | 0 0 X 0 | 0 1 0 0 1 |
| X X X X | 0 3 0 0 | 0 0 0 X | 0 1 0 0 1 |
| X X X X | 0 4 0 0 | 0 0 0 0 | 0 1 0 1 0 |
| X X X X | 0 4 0 0 | 0 0 X 0 | 0 1 0 1 0 |
| X X X X | 0 4 0 0 | 0 0 0 X | 0 1 0 1 0 |
| X X X X | 0 5 0 0 | 0 0 0 0 | 0 1 0 1 1 |
| X X X X | 0 5 0 0 | 0 0 X 0 | 0 1 0 1 1 |
| X X X X | 0 5 0 0 | 0 0 0 X | 0 1 0 1 1 |
| X X X X | 0 6 0 0 | 0 0 0 0 | 0 1 1 0 0 |
| X X X X | 0 6 0 0 | 0 0 X 0 | 0 1 1 0 0 |
| X X X X | 0 6 0 0 | 0 0 0 X | 0 1 1 0 0 |
| X X X X | 0 7 0 0 | 0 0 0 0 | 0 1 1 0 1 |
| X X X X | 0 7 0 0 | 0 0 X 0 | 0 1 1 0 1 |
| X X X X | 0 7 0 0 | 0 0 0 X | 0 1 1 0 1 |
| X X X X | 0 1 0 0 | 1 0 0 1 | 0 1 1 1 0 |
| X X X X | 0 1 0 0 | 1 0 0 2 | 0 1 1 1 0 |
| X X X X | 0 1 0 0 | 1 0 0 3 | 0 1 1 1 0 |
| X X X X | 0 1 0 0 | 1 0 0 4 | 0 1 1 1 0 |
| X X X X | 0 1 0 0 | 1 0 0 5 | 0 1 1 1 0 |
| X X X X | 0 1 0 0 | 1 0 0 6 | 0 1 1 1 0 |
| X X X X | 0 1 0 0 | 1 0 0 7 | 0 1 1 1 0 |
| X X X X | 0 1 0 0 | 1 0 0 8 | 0 1 1 1 0 |
| X X X X | 0 1 0 0 | 1 0 0 9 | 0 1 1 1 0 |
| X X X X | 0 1 0 0 | 2 0 0 1 | 0 1 1 1 0 |
| X X X X | 0 1 0 0 | 2 0 0 2 | 0 1 1 1 0 |
| X X X X | 0 1 0 0 | 2 0 0 3 | 0 1 1 1 0 |
| X X X X | 0 1 0 0 | 2 0 0 4 | 0 1 1 1 0 |
| X X X X | 0 1 0 0 | 2 0 0 5 | 0 1 1 1 0 |
| X X X X | 0 1 0 0 | 2 0 0 6 | 0 1 1 1 0 |
| X X X X | 0 1 0 0 | 2 0 0 7 | 0 1 1 1 0 |
| X X X X | 0 1 0 0 | 2 0 0 8 | 0 1 1 1 0 |
| X X X X | 0 1 0 0 | 2 0 0 9 | 0 1 1 1 0 |
| X X X X | 0 1 0 0 | 3 0 0 1 | 0 1 1 1 0 |
| X X X X | 0 1 0 0 | 3 0 0 2 | 0 1 1 1 0 |
| X X X X | 0 1 0 0 | 3 0 0 3 | 0 1 1 1 0 |
| X X X X | 0 1 0 0 | 3 0 0 4 | 0 1 1 1 0 |
| X X X X | 0 1 0 0 | 3 0 0 5 | 0 1 1 1 0 |
| X X X X | 0 1 0 0 | 3 0 0 6 | 0 1 1 1 0 |
| X X X X | 0 1 0 0 | 3 0 0 7 | 0 1 1 1 0 |
| X X X X | 0 1 0 0 | 3 0 0 8 | 0 1 1 1 0 |
| X X X X | 0 1 0 0 | 3 0 0 9 | 0 1 1 1 0 |
| X X X X | 0 1 0 0 | 4 0 0 1 | 0 1 1 1 0 |
| X X X X | 0 1 0 0 | 4 0 0 2 | 0 1 1 1 0 |
| X X X X | 0 1 0 0 | 4 0 0 3 | 0 1 1 1 0 |
| X X X X | 0 1 0 0 | 4 0 0 4 | 0 1 1 1 0 |
| X X X X | 0 1 0 0 | 4 0 0 5 | 0 1 1 1 0 |
| X X X X | 0 2 0 0 | 1 0 0 1 | 0 1 1 1 1 |
| X X X X | 0 2 0 0 | 1 0 0 2 | 0 1 1 1 1 |
| X X X X | 0 2 0 0 | 1 0 0 3 | 0 1 1 1 1 |
| X X X X | 0 2 0 0 | 1 0 0 4 | 0 1 1 1 1 |
| X X X X | 0 2 0 0 | 1 0 0 5 | 0 1 1 1 1 |
| X X X X | 0 2 0 0 | 1 0 0 6 | 0 1 1 1 1 |
| X X X X | 0 2 0 0 | 1 0 0 7 | 0 1 1 1 1 |
| X X X X | 0 2 0 0 | 1 0 0 8 | 0 1 1 1 1 |
| X X X X | 0 2 0 0 | 1 0 0 9 | 0 1 1 1 1 |
| X X X X | 0 2 0 0 | 2 0 0 1 | 0 1 1 1 1 |
| X X X X | 0 2 0 0 | 2 0 0 2 | 0 1 1 1 1 |
| X X X X | 0 2 0 0 | 2 0 0 3 | 0 1 1 1 1 |
| X X X X | 0 2 0 0 | 2 0 0 4 | 0 1 1 1 1 |
| X X X X | 0 2 0 0 | 2 0 0 5 | 0 1 1 1 1 |
| X X X X | 0 2 0 0 | 2 0 0 6 | 0 1 1 1 1 |
| X X X X | 0 2 0 0 | 2 0 0 7 | 0 1 1 1 1 |
| X X X X | 0 2 0 0 | 2 0 0 8 | 0 1 1 1 1 |
| X X X X | 0 2 0 0 | 2 0 0 9 | 0 1 1 1 1 |
| X X X X | 0 2 0 0 | 3 0 0 1 | 0 1 1 1 1 |
| X X X X | 0 2 0 0 | 3 0 0 2 | 0 1 1 1 1 |
| X X X X | 0 2 0 0 | 3 0 0 3 | 0 1 1 1 1 |

-continued

| Window Contents | | | X' |
|---|---|---|---|
| X X X X | 0 2 0 0 | 3 0 0 4 | 0 1 1 1 1 |
| X X X X | 0 2 0 0 | 3 0 0 5 | 0 1 1 1 1 |
| X X X X | 0 2 0 0 | 3 0 0 6 | 0 1 1 1 1 |
| X X X X | 0 2 0 0 | 3 0 0 7 | 0 1 1 1 1 |
| X X X X | 0 2 0 0 | 3 0 0 8 | 0 1 1 1 1 |
| X X X X | 0 2 0 0 | 3 0 0 9 | 0 1 1 1 1 |
| X X X X | 0 2 0 0 | 4 0 0 1 | 0 1 1 1 1 |
| X X X X | 0 2 0 0 | 4 0 0 2 | 0 1 1 1 1 |
| X X X X | 0 2 0 0 | 4 0 0 3 | 0 1 1 1 1 |
| X X X X | 0 2 0 0 | 4 0 0 4 | 0 1 1 1 1 |
| X X X X | 0 2 0 0 | 4 0 0 5 | 0 1 1 1 1 |
| X X X X | 0 3 0 0 | 1 0 0 1 | 1 0 0 0 0 |
| X X X X | 0 3 0 0 | 1 0 0 2 | 1 0 0 0 0 |
| X X X X | 0 3 0 0 | 1 0 0 3 | 1 0 0 0 0 |
| X X X X | 0 3 0 0 | 1 0 0 4 | 1 0 0 0 0 |
| X X X X | 0 3 0 0 | 1 0 0 5 | 1 0 0 0 0 |
| X X X X | 0 3 0 0 | 1 0 0 6 | 1 0 0 0 0 |
| X X X X | 0 3 0 0 | 1 0 0 7 | 1 0 0 0 0 |
| X X X X | 0 3 0 0 | 1 0 0 8 | 1 0 0 0 0 |
| X X X X | 0 3 0 0 | 1 0 0 9 | 1 0 0 0 0 |
| X X X X | 0 3 0 0 | 2 0 0 1 | 1 0 0 0 0 |
| X X X X | 0 3 0 0 | 2 0 0 2 | 1 0 0 0 0 |
| X X X X | 0 3 0 0 | 2 0 0 3 | 1 0 0 0 0 |
| X X X X | 0 3 0 0 | 2 0 0 4 | 1 0 0 0 0 |
| X X X X | 0 3 0 0 | 2 0 0 5 | 1 0 0 0 0 |
| X X X X | 0 3 0 0 | 2 0 0 6 | 1 0 0 0 0 |
| X X X X | 0 3 0 0 | 2 0 0 7 | 1 0 0 0 0 |
| X X X X | 0 3 0 0 | 2 0 0 8 | 1 0 0 0 0 |
| X X X X | 0 3 0 0 | 2 0 0 9 | 1 0 0 0 0 |
| X X X X | 0 3 0 0 | 3 0 0 1 | 1 0 0 0 0 |
| X X X X | 0 3 0 0 | 3 0 0 2 | 1 0 0 0 0 |
| X X X X | 0 3 0 0 | 3 0 0 3 | 1 0 0 0 0 |
| X X X X | 0 3 0 0 | 3 0 0 4 | 1 0 0 0 0 |
| X X X X | 0 3 0 0 | 3 0 0 5 | 1 0 0 0 0 |
| X X X X | 0 3 0 0 | 3 0 0 6 | 1 0 0 0 0 |
| X X X X | 0 3 0 0 | 3 0 0 7 | 1 0 0 0 0 |
| X X X X | 0 3 0 0 | 3 0 0 8 | 1 0 0 0 0 |
| X X X X | 0 3 0 0 | 3 0 0 9 | 1 0 0 0 0 |
| X X X X | 0 3 0 0 | 4 0 0 1 | 1 0 0 0 0 |
| X X X X | 0 3 0 0 | 4 0 0 2 | 1 0 0 0 0 |
| X X X X | 0 3 0 0 | 4 0 0 3 | 1 0 0 0 0 |
| X X X X | 0 3 0 0 | 4 0 0 4 | 1 0 0 0 0 |
| X X X X | 0 3 0 0 | 4 0 0 5 | 1 0 0 0 0 |
| X X X X | 0 4 0 0 | 1 0 0 1 | 1 0 0 0 1 |
| X X X X | 0 4 0 0 | 1 0 0 2 | 1 0 0 0 1 |
| X X X X | 0 4 0 0 | 1 0 0 3 | 1 0 0 0 1 |
| X X X X | 0 4 0 0 | 1 0 0 4 | 1 0 0 0 1 |
| X X X X | 0 4 0 0 | 1 0 0 5 | 1 0 0 0 1 |
| X X X X | 0 4 0 0 | 1 0 0 6 | 1 0 0 0 1 |
| X X X X | 0 4 0 0 | 1 0 0 7 | 1 0 0 0 1 |
| X X X X | 0 4 0 0 | 1 0 0 8 | 1 0 0 0 1 |
| X X X X | 0 4 0 0 | 1 0 0 9 | 1 0 0 0 1 |
| X X X X | 0 4 0 0 | 2 0 0 1 | 1 0 0 0 1 |
| X X X X | 0 4 0 0 | 2 0 0 2 | 1 0 0 0 1 |
| X X X X | 0 4 0 0 | 2 0 0 3 | 1 0 0 0 1 |
| X X X X | 0 4 0 0 | 2 0 0 4 | 1 0 0 0 1 |
| X X X X | 0 4 0 0 | 2 0 0 5 | 1 0 0 0 1 |
| X X X X | 0 4 0 0 | 2 0 0 6 | 1 0 0 0 1 |
| X X X X | 0 4 0 0 | 2 0 0 7 | 1 0 0 0 1 |
| X X X X | 0 4 0 0 | 2 0 0 8 | 1 0 0 0 1 |
| X X X X | 0 4 0 0 | 2 0 0 9 | 1 0 0 0 1 |
| X X X X | 0 4 0 0 | 3 0 0 1 | 1 0 0 0 1 |
| X X X X | 0 4 0 0 | 3 0 0 2 | 1 0 0 0 1 |
| X X X X | 0 4 0 0 | 3 0 0 3 | 1 0 0 0 1 |
| X X X X | 0 4 0 0 | 3 0 0 4 | 1 0 0 0 1 |
| X X X X | 0 4 0 0 | 3 0 0 5 | 1 0 0 0 1 |
| X X X X | 0 4 0 0 | 3 0 0 6 | 1 0 0 0 1 |
| X X X X | 0 4 0 0 | 3 0 0 7 | 1 0 0 0 1 |
| X X X X | 0 4 0 0 | 3 0 0 8 | 1 0 0 0 1 |
| X X X X | 0 4 0 0 | 3 0 0 9 | 1 0 0 0 1 |
| X X X X | 0 4 0 0 | 4 0 0 1 | 1 0 0 0 1 |
| X X X X | 0 4 0 0 | 4 0 0 2 | 1 0 0 0 1 |
| X X X X | 0 4 0 0 | 4 0 0 3 | 1 0 0 0 1 |
| X X X X | 0 4 0 0 | 4 0 0 4 | 1 0 0 0 1 |
| X X X X | 0 4 0 0 | 4 0 0 5 | 1 0 0 0 1 |
| X X X X | 0 5 0 0 | 1 0 0 1 | 1 0 0 1 0 |
| X X X X | 0 5 0 0 | 1 0 0 2 | 1 0 0 1 0 |

-continued

| Window Contents | | | X' |
|---|---|---|---|
| X X X X | 0 5 0 0 | 1 0 0 3 | 1 0 0 1 0 |
| X X X X | 0 5 0 0 | 1 0 0 4 | 1 0 0 1 0 |
| X X X X | 0 5 0 0 | 1 0 0 5 | 1 0 0 1 0 |
| X X X X | 0 5 0 0 | 1 0 0 6 | 1 0 0 1 0 |
| X X X X | 0 5 0 0 | 1 0 0 7 | 1 0 0 1 0 |
| X X X X | 0 5 0 0 | 1 0 0 8 | 1 0 0 1 0 |
| X X X X | 0 5 0 0 | 1 0 0 9 | 1 0 0 1 0 |
| X X X X | 0 5 0 0 | 2 0 0 1 | 1 0 0 1 0 |
| X X X X | 0 5 0 0 | 2 0 0 2 | 1 0 0 1 0 |
| X X X X | 0 5 0 0 | 2 0 0 3 | 1 0 0 1 0 |
| X X X X | 0 5 0 0 | 2 0 0 4 | 1 0 0 1 0 |
| X X X X | 0 5 0 0 | 2 0 0 5 | 1 0 0 1 0 |
| X X X X | 0 5 0 0 | 2 0 0 6 | 1 0 0 1 0 |
| X X X X | 0 5 0 0 | 2 0 0 7 | 1 0 0 1 0 |
| X X X X | 0 5 0 0 | 2 0 0 8 | 1 0 0 1 0 |
| X X X X | 0 5 0 0 | 2 0 0 9 | 1 0 0 1 0 |
| X X X X | 0 5 0 0 | 3 0 0 1 | 1 0 0 1 0 |
| X X X X | 0 5 0 0 | 3 0 0 2 | 1 0 0 1 0 |
| X X X X | 0 5 0 0 | 3 0 0 3 | 1 0 0 1 0 |
| X X X X | 0 5 0 0 | 3 0 0 4 | 1 0 0 1 0 |
| X X X X | 0 5 0 0 | 3 0 0 5 | 1 0 0 1 0 |
| X X X X | 0 5 0 0 | 3 0 0 6 | 1 0 0 1 0 |
| X X X X | 0 5 0 0 | 3 0 0 7 | 1 0 0 1 0 |
| X X X X | 0 5 0 0 | 3 0 0 8 | 1 0 0 1 0 |
| X X X X | 0 5 0 0 | 3 0 0 9 | 1 0 0 1 0 |
| X X X X | 0 5 0 0 | 4 0 0 1 | 1 0 0 1 0 |
| X X X X | 0 5 0 0 | 4 0 0 2 | 1 0 0 1 0 |
| X X X X | 0 5 0 0 | 4 0 0 3 | 1 0 0 1 0 |
| X X X X | 0 5 0 0 | 4 0 0 4 | 1 0 0 1 0 |
| X X X X | 0 5 0 0 | 4 0 0 5 | 1 0 0 1 0 |
| X X X X | 0 6 0 0 | 1 0 0 1 | 1 0 0 1 1 |
| X X X X | 0 6 0 0 | 1 0 0 2 | 1 0 0 1 1 |
| X X X X | 0 6 0 0 | 1 0 0 3 | 1 0 0 1 1 |
| X X X X | 0 6 0 0 | 1 0 0 4 | 1 0 0 1 1 |
| X X X X | 0 6 0 0 | 1 0 0 5 | 1 0 0 1 1 |
| X X X X | 0 6 0 0 | 1 0 0 6 | 1 0 0 1 1 |
| X X X X | 0 6 0 0 | 1 0 0 7 | 1 0 0 1 1 |
| X X X X | 0 6 0 0 | 1 0 0 8 | 1 0 0 1 1 |
| X X X X | 0 6 0 0 | 1 0 0 9 | 1 0 0 1 1 |
| X X X X | 0 6 0 0 | 2 0 0 1 | 1 0 0 1 1 |
| X X X X | 0 6 0 0 | 2 0 0 2 | 1 0 0 1 1 |
| X X X X | 0 6 0 0 | 2 0 0 3 | 1 0 0 1 1 |
| X X X X | 0 6 0 0 | 2 0 0 4 | 1 0 0 1 1 |
| X X X X | 0 6 0 0 | 2 0 0 5 | 1 0 0 1 1 |
| X X X X | 0 6 0 0 | 2 0 0 6 | 1 0 0 1 1 |
| X X X X | 0 6 0 0 | 2 0 0 7 | 1 0 0 1 1 |
| X X X X | 0 6 0 0 | 2 0 0 8 | 1 0 0 1 1 |
| X X X X | 0 6 0 0 | 2 0 0 9 | 1 0 0 1 1 |
| X X X X | 0 6 0 0 | 3 0 0 1 | 1 0 0 1 1 |
| X X X X | 0 6 0 0 | 3 0 0 2 | 1 0 0 1 1 |
| X X X X | 0 6 0 0 | 3 0 0 3 | 1 0 0 1 1 |
| X X X X | 0 6 0 0 | 3 0 0 4 | 1 0 0 1 1 |
| X X X X | 0 6 0 0 | 3 0 0 5 | 1 0 0 1 1 |
| X X X X | 0 6 0 0 | 3 0 0 6 | 1 0 0 1 1 |
| X X X X | 0 6 0 0 | 3 0 0 7 | 1 0 0 1 1 |
| X X X X | 0 6 0 0 | 3 0 0 8 | 1 0 0 1 1 |
| X X X X | 0 6 0 0 | 3 0 0 9 | 1 0 0 1 1 |
| X X X X | 0 6 0 0 | 4 0 0 1 | 1 0 0 1 1 |
| X X X X | 0 6 0 0 | 4 0 0 2 | 1 0 0 1 1 |
| X X X X | 0 6 0 0 | 4 0 0 3 | 1 0 0 1 1 |
| X X X X | 0 6 0 0 | 4 0 0 4 | 1 0 0 1 1 |
| X X X X | 0 6 0 0 | 4 0 0 5 | 1 0 0 1 1 |
| X X X X | 0 7 0 0 | 1 0 0 1 | 1 0 1 0 0 |
| X X X X | 0 7 0 0 | 1 0 0 2 | 1 0 1 0 0 |
| X X X X | 0 7 0 0 | 1 0 0 3 | 1 0 1 0 0 |
| X X X X | 0 7 0 0 | 1 0 0 4 | 1 0 1 0 0 |
| X X X X | 0 7 0 0 | 1 0 0 5 | 1 0 1 0 0 |
| X X X X | 0 7 0 0 | 1 0 0 6 | 1 0 1 0 0 |
| X X X X | 0 7 0 0 | 1 0 0 7 | 1 0 1 0 0 |
| X X X X | 0 7 0 0 | 1 0 0 8 | 1 0 1 0 0 |
| X X X X | 0 7 0 0 | 1 0 0 9 | 1 0 1 0 0 |
| X X X X | 0 7 0 0 | 2 0 0 1 | 1 0 1 0 0 |
| X X X X | 0 7 0 0 | 2 0 0 2 | 1 0 1 0 0 |
| X X X X | 0 7 0 0 | 2 0 0 3 | 1 0 1 0 0 |
| X X X X | 0 7 0 0 | 2 0 0 4 | 1 0 1 0 0 |
| X X X X | 0 7 0 0 | 2 0 0 5 | 1 0 1 0 0 |
| X X X X | 0 7 0 0 | 2 0 0 6 | 1 0 1 0 0 |

-continued

| Window Contents | | | X' |
|---|---|---|---|
| XXXX | 0700 | 2007 | 10100 |
| XXXX | 0700 | 2008 | 10100 |
| XXXX | 0700 | 2009 | 10100 |
| XXXX | 0700 | 3001 | 10100 |
| XXXX | 0700 | 3002 | 10100 |
| XXXX | 0700 | 3003 | 10100 |
| XXXX | 0700 | 3004 | 10100 |
| XXXX | 0700 | 3005 | 10100 |
| XXXX | 0700 | 3006 | 10100 |
| XXXX | 0700 | 3007 | 10100 |
| XXXX | 0700 | 3008 | 10100 |
| XXXX | 0700 | 3009 | 10100 |
| XXXX | 0700 | 4001 | 10100 |
| XXXX | 0700 | 4002 | 10100 |
| XXXX | 0700 | 4003 | 10100 |
| XXXX | 0700 | 4004 | 10100 |
| XXXX | 0700 | 4005 | 10100 |
| XXXX | 0100 | 4006 | 10101 |
| XXXX | 0100 | 4007 | 10101 |
| XXXX | 0100 | 4008 | 10101 |
| XXXX | 0100 | 4009 | 10101 |
| XXXX | 0100 | 5001 | 10101 |
| XXXX | 0100 | 5002 | 10101 |
| XXXX | 0100 | 5003 | 10101 |
| XXXX | 0100 | 5004 | 10101 |
| XXXX | 0100 | 5005 | 10101 |
| XXXX | 0100 | 5006 | 10101 |
| XXXX | 0100 | 5007 | 10101 |
| XXXX | 0100 | 5008 | 10101 |
| XXXX | 0100 | 5009 | 10101 |
| XXXX | 0100 | 6001 | 10101 |
| XXXX | 0100 | 6002 | 10101 |
| XXXX | 0100 | 6003 | 10101 |
| XXXX | 0100 | 6004 | 10101 |
| XXXX | 0100 | 6005 | 10101 |
| XXXX | 0100 | 6006 | 10101 |
| XXXX | 0100 | 6007 | 10101 |
| XXXX | 0100 | 6008 | 10101 |
| XXXX | 0100 | 6009 | 10101 |
| XXXX | 0100 | 7001 | 10101 |
| XXXX | 0100 | 7002 | 10101 |
| XXXX | 0100 | 7003 | 10101 |
| XXXX | 0100 | 7004 | 10101 |
| XXXX | 0100 | 7005 | 10101 |
| XXXX | 0100 | 7006 | 10101 |
| XXXX | 0100 | 7007 | 10101 |
| XXXX | 0100 | 7008 | 10101 |
| XXXX | 0100 | 7009 | 10101 |
| XXXX | 0100 | 8001 | 10101 |
| XXXX | 0200 | 4006 | 10110 |
| XXXX | 0200 | 4007 | 10110 |
| XXXX | 0200 | 4008 | 10110 |
| XXXX | 0200 | 4009 | 10110 |
| XXXX | 0200 | 5001 | 10110 |
| XXXX | 0200 | 5002 | 10110 |
| XXXX | 0200 | 5003 | 10110 |
| XXXX | 0200 | 5004 | 10110 |
| XXXX | 0200 | 5005 | 10110 |
| XXXX | 0200 | 5006 | 10110 |
| XXXX | 0200 | 5007 | 10110 |
| XXXX | 0200 | 5008 | 10110 |
| XXXX | 0200 | 5009 | 10110 |
| XXXX | 0200 | 6001 | 10110 |
| XXXX | 0200 | 6002 | 10110 |
| XXXX | 0200 | 6003 | 10110 |
| XXXX | 0200 | 6004 | 10110 |
| XXXX | 0200 | 6005 | 10110 |
| XXXX | 0200 | 6006 | 10110 |
| XXXX | 0200 | 6007 | 10110 |
| XXXX | 0200 | 6008 | 10110 |
| XXXX | 0200 | 6009 | 10110 |
| XXXX | 0200 | 7001 | 10110 |
| XXXX | 0200 | 7002 | 10110 |
| XXXX | 0200 | 7003 | 10110 |
| XXXX | 0200 | 7004 | 10110 |
| XXXX | 0200 | 7005 | 10110 |
| XXXX | 0200 | 7006 | 10110 |

-continued

| Window Contents | | | X' |
|---|---|---|---|
| XXXX | 0200 | 7007 | 10110 |
| XXXX | 0200 | 7008 | 10110 |
| XXXX | 0200 | 7009 | 10110 |
| XXXX | 0200 | 8001 | 10110 |
| XXXX | 0300 | 4006 | 10111 |
| XXXX | 0300 | 4007 | 10111 |
| XXXX | 0300 | 4008 | 10111 |
| XXXX | 0300 | 4009 | 10111 |
| XXXX | 0300 | 5001 | 10111 |
| XXXX | 0300 | 5002 | 10111 |
| XXXX | 0300 | 5003 | 10111 |
| XXXX | 0300 | 5004 | 10111 |
| XXXX | 0300 | 5005 | 10111 |
| XXXX | 0300 | 5006 | 10111 |
| XXXX | 0300 | 5007 | 10111 |
| XXXX | 0300 | 5008 | 10111 |
| XXXX | 0300 | 5009 | 10111 |
| XXXX | 0300 | 6001 | 10111 |
| XXXX | 0300 | 6002 | 10111 |
| XXXX | 0300 | 6003 | 10111 |
| XXXX | 0300 | 6004 | 10111 |
| XXXX | 0300 | 6005 | 10111 |
| XXXX | 0300 | 6006 | 10111 |
| XXXX | 0300 | 6007 | 10111 |
| XXXX | 0300 | 6008 | 10111 |
| XXXX | 0300 | 6009 | 10111 |
| XXXX | 0300 | 7001 | 10111 |
| XXXX | 0300 | 7002 | 10111 |
| XXXX | 0300 | 7003 | 10111 |
| XXXX | 0300 | 7004 | 10111 |
| XXXX | 0300 | 7005 | 10111 |
| XXXX | 0300 | 7006 | 10111 |
| XXXX | 0300 | 7007 | 10111 |
| XXXX | 0300 | 7008 | 10111 |
| XXXX | 0300 | 7009 | 10111 |
| XXXX | 0300 | 8001 | 10111 |
| XXXX | 0400 | 4006 | 11000 |
| XXXX | 0400 | 4007 | 11000 |
| XXXX | 0400 | 4008 | 11000 |
| XXXX | 0400 | 4009 | 11000 |
| XXXX | 0400 | 5001 | 11000 |
| XXXX | 0400 | 5002 | 11000 |
| XXXX | 0400 | 5003 | 11000 |
| XXXX | 0400 | 5004 | 11000 |
| XXXX | 0400 | 5005 | 11000 |
| XXXX | 0400 | 5006 | 11000 |
| XXXX | 0400 | 5007 | 11000 |
| XXXX | 0400 | 5008 | 11000 |
| XXXX | 0400 | 5009 | 11000 |
| XXXX | 0400 | 6001 | 11000 |
| XXXX | 0400 | 6002 | 11000 |
| XXXX | 0400 | 6003 | 11000 |
| XXXX | 0400 | 6004 | 11000 |
| XXXX | 0400 | 6005 | 11000 |
| XXXX | 0400 | 6006 | 11000 |
| XXXX | 0400 | 6007 | 11000 |
| XXXX | 0400 | 6008 | 11000 |
| XXXX | 0400 | 6009 | 11000 |
| XXXX | 0400 | 7001 | 11000 |
| XXXX | 0400 | 7002 | 11000 |
| XXXX | 0400 | 7003 | 11000 |
| XXXX | 0400 | 7004 | 11000 |
| XXXX | 0400 | 7005 | 11000 |
| XXXX | 0400 | 7006 | 11000 |
| XXXX | 0400 | 7007 | 11000 |
| XXXX | 0400 | 7008 | 11000 |
| XXXX | 0400 | 7009 | 11000 |
| XXXX | 0400 | 8001 | 11000 |
| XXXX | 0500 | 4006 | 11001 |
| XXXX | 0500 | 4007 | 11001 |
| XXXX | 0500 | 4008 | 11001 |
| XXXX | 0500 | 4009 | 11001 |
| XXXX | 0500 | 5001 | 11001 |
| XXXX | 0500 | 5002 | 11001 |
| XXXX | 0500 | 5003 | 11001 |
| XXXX | 0500 | 5004 | 11001 |
| XXXX | 0500 | 5005 | 11001 |

-continued

| Window Contents | | | X' |
|---|---|---|---|
| XXXX | 0500 | 5006 | 11001 |
| XXXX | 0500 | 5007 | 11001 |
| XXXX | 0500 | 5008 | 11001 |
| XXXX | 0500 | 5009 | 11001 |
| XXXX | 0500 | 6001 | 11001 |
| XXXX | 0500 | 6002 | 11001 |
| XXXX | 0500 | 6003 | 11001 |
| XXXX | 0500 | 6004 | 11001 |
| XXXX | 0500 | 6005 | 11001 |
| XXXX | 0500 | 6006 | 11001 |
| XXXX | 0500 | 6007 | 11001 |
| XXXX | 0500 | 6008 | 11001 |
| XXXX | 0500 | 6009 | 11001 |
| XXXX | 0500 | 7001 | 11001 |
| XXXX | 0500 | 7002 | 11001 |
| XXXX | 0500 | 7003 | 11001 |
| XXXX | 0500 | 7004 | 11001 |
| XXXX | 0500 | 7005 | 11001 |
| XXXX | 0500 | 7006 | 11001 |
| XXXX | 0500 | 7007 | 11001 |
| XXXX | 0500 | 7008 | 11001 |
| XXXX | 0500 | 7009 | 11001 |
| XXXX | 0500 | 8001 | 11001 |
| XXXX | 0600 | 4006 | 11010 |
| XXXX | 0600 | 4007 | 11010 |
| XXXX | 0600 | 4008 | 11010 |
| XXXX | 0600 | 4009 | 11010 |
| XXXX | 0600 | 5001 | 11010 |
| XXXX | 0600 | 5002 | 11010 |
| XXXX | 0600 | 5003 | 11010 |
| XXXX | 0600 | 5004 | 11010 |
| XXXX | 0600 | 5005 | 11010 |
| XXXX | 0600 | 5006 | 11010 |
| XXXX | 0600 | 5007 | 11010 |
| XXXX | 0600 | 5008 | 11010 |
| XXXX | 0600 | 5009 | 11010 |
| XXXX | 0600 | 6001 | 11010 |
| XXXX | 0600 | 6002 | 11010 |
| XXXX | 0600 | 6003 | 11010 |
| XXXX | 0600 | 6004 | 11010 |
| XXXX | 0600 | 6005 | 11010 |
| XXXX | 0600 | 6006 | 11010 |
| XXXX | 0600 | 6007 | 11010 |
| XXXX | 0600 | 6008 | 11010 |
| XXXX | 0600 | 6009 | 11010 |
| XXXX | 0600 | 7001 | 11010 |
| XXXX | 0600 | 7002 | 11010 |
| XXXX | 0600 | 7003 | 11010 |
| XXXX | 0600 | 7004 | 11010 |
| XXXX | 0600 | 7005 | 11010 |
| XXXX | 0600 | 7006 | 11010 |
| XXXX | 0600 | 7007 | 11010 |
| XXXX | 0600 | 7008 | 11010 |
| XXXX | 0600 | 7009 | 11010 |
| XXXX | 0600 | 8001 | 11010 |
| XXXX | 0700 | 4006 | 11011 |
| XXXX | 0700 | 4007 | 11011 |
| XXXX | 0700 | 4008 | 11011 |
| XXXX | 0700 | 4009 | 11011 |
| XXXX | 0700 | 5001 | 11011 |
| XXXX | 0700 | 5002 | 11011 |
| XXXX | 0700 | 5003 | 11011 |
| XXXX | 0700 | 5004 | 11011 |
| XXXX | 0700 | 5005 | 11011 |
| XXXX | 0700 | 5006 | 11011 |
| XXXX | 0700 | 5007 | 11011 |
| XXXX | 0700 | 5008 | 11011 |
| XXXX | 0700 | 5009 | 11011 |
| XXXX | 0700 | 6001 | 11011 |
| XXXX | 0700 | 6002 | 11011 |
| XXXX | 0700 | 6003 | 11011 |
| XXXX | 0700 | 6004 | 11011 |
| XXXX | 0700 | 6005 | 11011 |
| XXXX | 0700 | 6006 | 11011 |
| XXXX | 0700 | 6007 | 11011 |
| XXXX | 0700 | 6008 | 11011 |
| XXXX | 0700 | 6009 | 11011 |

-continued

| Window Contents | | | X' |
|---|---|---|---|
| XXXX | 0700 | 7001 | 11011 |
| XXXX | 0700 | 7002 | 11011 |
| XXXX | 0700 | 7003 | 11011 |
| XXXX | 0700 | 7004 | 11011 |
| XXXX | 0700 | 7005 | 11011 |
| XXXX | 0700 | 7006 | 11011 |
| XXXX | 0700 | 7007 | 11011 |
| XXXX | 0700 | 7008 | 11011 |
| XXXX | 0700 | 7009 | 11011 |
| XXXX | 0700 | 8001 | 11011 |
| XXXX | 0100 | 8002 | 11100 |
| XXXX | 0100 | 8003 | 11100 |
| XXXX | 0100 | 8004 | 11100 |
| XXXX | 0100 | 8005 | 11100 |
| XXXX | 0100 | 8006 | 11100 |
| XXXX | 0100 | 8007 | 11100 |
| XXXX | 0100 | 8008 | 11100 |
| XXXX | 0100 | 8009 | 11100 |
| XXXX | 0100 | 9001 | 11100 |
| XXXX | 0100 | 9002 | 11100 |
| XXXX | 0100 | 9003 | 11100 |
| XXXX | 0100 | 9004 | 11100 |
| XXXX | 0100 | 9005 | 11100 |
| XXXX | 0100 | 9006 | 11100 |
| XXXX | 0100 | 9007 | 11100 |
| XXXX | 0100 | 9008 | 11100 |
| XXXX | 0100 | 9009 | 11100 |
| XXXX | 0100 | 1000 | 11100 |
| XXXX | 0100 | 2000 | 11100 |
| XXXX | 0100 | 3000 | 11100 |
| XXXX | 0200 | 8002 | 11101 |
| XXXX | 0200 | 8003 | 11101 |
| XXXX | 0200 | 8004 | 11101 |
| XXXX | 0200 | 8005 | 11101 |
| XXXX | 0200 | 8006 | 11101 |
| XXXX | 0200 | 8007 | 11101 |
| XXXX | 0200 | 8008 | 11101 |
| XXXX | 0200 | 8009 | 11101 |
| XXXX | 0200 | 9001 | 11101 |
| XXXX | 0200 | 9002 | 11101 |
| XXXX | 0200 | 9003 | 11101 |
| XXXX | 0200 | 9004 | 11101 |
| XXXX | 0200 | 9005 | 11101 |
| XXXX | 0200 | 9006 | 11101 |
| XXXX | 0200 | 9007 | 11101 |
| XXXX | 0200 | 9008 | 11101 |
| XXXX | 0200 | 9009 | 11101 |
| XXXX | 0200 | 1000 | 11101 |
| XXXX | 0200 | 2000 | 11101 |
| XXXX | 0200 | 3000 | 11101 |
| XXXX | 0300 | 8002 | 11110 |
| XXXX | 0300 | 8003 | 11110 |
| XXXX | 0300 | 8004 | 11110 |
| XXXX | 0300 | 8005 | 11110 |
| XXXX | 0300 | 8006 | 11110 |
| XXXX | 0300 | 8007 | 11110 |
| XXXX | 0300 | 8008 | 11110 |
| XXXX | 0300 | 8009 | 11110 |
| XXXX | 0300 | 9001 | 11110 |
| XXXX | 0300 | 9002 | 11110 |
| XXXX | 0300 | 9003 | 11110 |
| XXXX | 0300 | 9004 | 11110 |
| XXXX | 0300 | 9005 | 11110 |
| XXXX | 0300 | 9006 | 11110 |
| XXXX | 0300 | 9007 | 11110 |
| XXXX | 0300 | 9008 | 11110 |
| XXXX | 0300 | 9009 | 11110 |
| XXXX | 0300 | 1000 | 11110 |
| XXXX | 0300 | 2000 | 11110 |
| XXXX | 0300 | 3000 | 11110 |
| XXXX | 0400 | 8002 | 11111 |
| XXXX | 0400 | 8003 | 11111 |
| XXXX | 0400 | 8004 | 11111 |
| XXXX | 0400 | 8005 | 11111 |
| XXXX | 0400 | 8006 | 11111 |
| XXXX | 0400 | 8007 | 11111 |
| XXXX | 0400 | 8008 | 11111 |

-continued

| Window Contents | | | X' |
|---|---|---|---|
| XXXX | 0400 | 8009 | 11111 |
| XXXX | 0400 | 9001 | 11111 |
| XXXX | 0400 | 9002 | 11111 |
| XXXX | 0400 | 9003 | 11111 |
| XXXX | 0400 | 9004 | 11111 |
| XXXX | 0400 | 9005 | 11111 |
| XXXX | 0400 | 9006 | 11111 |
| XXXX | 0400 | 9007 | 11111 |
| XXXX | 0400 | 9008 | 11111 |
| XXXX | 0400 | 9009 | 11111 |
| XXXX | 0400 | 1000 | 11111 |
| XXXX | 0400 | 2000 | 11111 |
| XXXX | 0400 | 3000 | 11111 |
| 0000 | 0000 | 0100 | 00000 |
| 0000 | 0000 | 0200 | 00000 |
| 0000 | 0000 | 0300 | 00000 |
| 0000 | 0000 | 0400 | 00000 |
| 0000 | 0000 | 0500 | 00000 |
| 0000 | 0000 | 0600 | 00000 |
| 0000 | 0000 | 0700 | 00000 |
| 0X00 | 0000 | 0100 | 00000 |
| 0X00 | 0000 | 0200 | 00000 |
| 0X00 | 0000 | 0300 | 00000 |
| 0X00 | 0000 | 0400 | 00000 |
| 0X00 | 0000 | 0500 | 00000 |
| 0X00 | 0000 | 0600 | 00000 |
| 0X00 | 0000 | 0700 | 00000 |
| X000 | 0000 | 0100 | 00000 |
| X000 | 0000 | 0200 | 00000 |
| X000 | 0000 | 0300 | 00000 |
| X000 | 0000 | 0400 | 00000 |
| X000 | 0000 | 0500 | 00000 |
| X000 | 0000 | 0600 | 00000 |
| X000 | 0000 | 0700 | 00000 |
| 0000 | 0000 | 4000 | 00001 |
| 0000 | 0000 | 5000 | 00001 |
| 0000 | 0000 | 6000 | 00001 |
| 0000 | 0000 | 7000 | 00001 |
| 0000 | 0000 | 8000 | 00001 |
| 0000 | 0000 | 9000 | 00001 |
| 0000 | 0000 | 0800 | 00001 |
| 0000 | 0000 | 0900 | 00001 |
| 0X00 | 0000 | 4000 | 00001 |
| 0X00 | 0000 | 5000 | 00001 |
| 0X00 | 0000 | 6000 | 00001 |
| 0X00 | 0000 | 7000 | 00001 |
| 0X00 | 0000 | 8000 | 00001 |
| 0X00 | 0000 | 9000 | 00001 |
| 0X00 | 0000 | 0800 | 00001 |
| 0X00 | 0000 | 0900 | 00001 |
| X000 | 0000 | 4000 | 00001 |
| X000 | 0000 | 5000 | 00001 |
| X000 | 0000 | 6000 | 00001 |
| X000 | 0000 | 7000 | 00001 |
| X000 | 0000 | 8000 | 00001 |
| X000 | 0000 | 9000 | 00001 |
| X000 | 0000 | 0800 | 00001 |
| X000 | 0000 | 0900 | 00001 |
| 0000 | 0000 | 1001 | 00010 |
| 0000 | 0000 | 1002 | 00010 |
| 0000 | 0000 | 1003 | 00010 |
| 0000 | 0000 | 1004 | 00010 |
| 0000 | 0000 | 1005 | 00010 |
| 0000 | 0000 | 1006 | 00010 |
| 0000 | 0000 | 1007 | 00010 |
| 0000 | 0000 | 1008 | 00010 |
| 0000 | 0000 | 1009 | 00010 |
| 0000 | 0000 | 2001 | 00010 |
| 0000 | 0000 | 2002 | 00010 |
| 0000 | 0000 | 2003 | 00010 |
| 0000 | 0000 | 2004 | 00010 |
| 0000 | 0000 | 2005 | 00010 |
| 0000 | 0000 | 2006 | 00010 |
| 0000 | 0000 | 2007 | 00010 |
| 0000 | 0000 | 2008 | 00010 |
| 0000 | 0000 | 2009 | 00010 |
| 0000 | 0000 | 3001 | 00010 |

-continued

| Window Contents | | | X' |
|---|---|---|---|
| 0000 | 0000 | 3002 | 00010 |
| 0000 | 0000 | 3003 | 00010 |
| 0000 | 0000 | 3004 | 00010 |
| 0000 | 0000 | 3005 | 00010 |
| 0000 | 0000 | 3006 | 00010 |
| 0000 | 0000 | 3007 | 00010 |
| 0000 | 0000 | 3008 | 00010 |
| 0000 | 0000 | 3009 | 00010 |
| 0000 | 0000 | 4001 | 00010 |
| 0000 | 0000 | 4002 | 00010 |
| 0000 | 0000 | 4003 | 00010 |
| 0000 | 0000 | 4004 | 00010 |
| 0000 | 0000 | 4005 | 00010 |
| 0X00 | 0000 | 1001 | 00010 |
| 0X00 | 0000 | 1002 | 00010 |
| 0X00 | 0000 | 1003 | 00010 |
| 0X00 | 0000 | 1004 | 00010 |
| 0X00 | 0000 | 1005 | 00010 |
| 0X00 | 0000 | 1006 | 00010 |
| 0X00 | 0000 | 1007 | 00010 |
| 0X00 | 0000 | 1008 | 00010 |
| 0X00 | 0000 | 1009 | 00010 |
| 0X00 | 0000 | 2001 | 00010 |
| 0X00 | 0000 | 2002 | 00010 |
| 0X00 | 0000 | 2003 | 00010 |
| 0X00 | 0000 | 2004 | 00010 |
| 0X00 | 0000 | 2005 | 00010 |
| 0X00 | 0000 | 2006 | 00010 |
| 0X00 | 0000 | 2007 | 00010 |
| 0X00 | 0000 | 2008 | 00010 |
| 0X00 | 0000 | 2009 | 00010 |
| 0X00 | 0000 | 3001 | 00010 |
| 0X00 | 0000 | 3002 | 00010 |
| 0X00 | 0000 | 3003 | 00010 |
| 0X00 | 0000 | 3004 | 00010 |
| 0X00 | 0000 | 3005 | 00010 |
| 0X00 | 0000 | 3006 | 00010 |
| 0X00 | 0000 | 3007 | 00010 |
| 0X00 | 0000 | 3008 | 00010 |
| 0X00 | 0000 | 3009 | 00010 |
| 0X00 | 0000 | 4001 | 00010 |
| 0X00 | 0000 | 4002 | 00010 |
| 0X00 | 0000 | 4003 | 00010 |
| 0X00 | 0000 | 4004 | 00010 |
| 0X00 | 0000 | 4005 | 00010 |
| X000 | 0000 | 1001 | 00010 |
| X000 | 0000 | 1002 | 00010 |
| X000 | 0000 | 1003 | 00010 |
| X000 | 0000 | 1004 | 00010 |
| X000 | 0000 | 1005 | 00010 |
| X000 | 0000 | 1006 | 00010 |
| X000 | 0000 | 1007 | 00010 |
| X000 | 0000 | 1008 | 00010 |
| X000 | 0000 | 1009 | 00010 |
| X000 | 0000 | 2001 | 00010 |
| X000 | 0000 | 2002 | 00010 |
| X000 | 0000 | 2003 | 00010 |
| X000 | 0000 | 2004 | 00010 |
| X000 | 0000 | 2005 | 00010 |
| X000 | 0000 | 2006 | 00010 |
| X000 | 0000 | 2007 | 00010 |
| X000 | 0000 | 2008 | 00010 |
| X000 | 0000 | 2009 | 00010 |
| X000 | 0000 | 3001 | 00010 |
| X000 | 0000 | 3002 | 00010 |
| X000 | 0000 | 3003 | 00010 |
| X000 | 0000 | 3004 | 00010 |
| X000 | 0000 | 3005 | 00010 |
| X000 | 0000 | 3006 | 00010 |
| X000 | 0000 | 3007 | 00010 |
| X000 | 0000 | 3008 | 00010 |
| X000 | 0000 | 3009 | 00010 |
| X000 | 0000 | 4001 | 00010 |
| X000 | 0000 | 4002 | 00010 |
| X000 | 0000 | 4003 | 00010 |
| X000 | 0000 | 4004 | 00010 |
| X000 | 0000 | 4005 | 00010 |

-continued

| Window Contents | | | X' |
|---|---|---|---|
| 0000 | 0000 | 4006 | 00011 |
| 0000 | 0000 | 4007 | 00011 |
| 0000 | 0000 | 4008 | 00011 |
| 0000 | 0000 | 4009 | 00011 |
| 0000 | 0000 | 5001 | 00011 |
| 0000 | 0000 | 5002 | 00011 |
| 0000 | 0000 | 5003 | 00011 |
| 0000 | 0000 | 5004 | 00011 |
| 0000 | 0000 | 5005 | 00011 |
| 0000 | 0000 | 5006 | 00011 |
| 0000 | 0000 | 5007 | 00011 |
| 0000 | 0000 | 5008 | 00011 |
| 0000 | 0000 | 5009 | 00011 |
| 0000 | 0000 | 6001 | 00011 |
| 0000 | 0000 | 6002 | 00011 |
| 0000 | 0000 | 6003 | 00011 |
| 0000 | 0000 | 6004 | 00011 |
| 0000 | 0000 | 6005 | 00011 |
| 0000 | 0000 | 6006 | 00011 |
| 0000 | 0000 | 6007 | 00011 |
| 0000 | 0000 | 6008 | 00011 |
| 0000 | 0000 | 6009 | 00011 |
| 0000 | 0000 | 7001 | 00011 |
| 0000 | 0000 | 7002 | 00011 |
| 0000 | 0000 | 7003 | 00011 |
| 0000 | 0000 | 7004 | 00011 |
| 0000 | 0000 | 7005 | 00011 |
| 0000 | 0000 | 7006 | 00011 |
| 0000 | 0000 | 7007 | 00011 |
| 0000 | 0000 | 7008 | 00011 |
| 0000 | 0000 | 7009 | 00011 |
| 0000 | 0000 | 8001 | 00011 |
| 0X00 | 0000 | 4006 | 00011 |
| 0X00 | 0000 | 4007 | 00011 |
| 0X00 | 0000 | 4008 | 00011 |
| 0X00 | 0000 | 4009 | 00011 |
| 0X00 | 0000 | 5001 | 00011 |
| 0X00 | 0000 | 5002 | 00011 |
| 0X00 | 0000 | 5003 | 00011 |
| 0X00 | 0000 | 5004 | 00011 |
| 0X00 | 0000 | 5005 | 00011 |
| 0X00 | 0000 | 5006 | 00011 |
| 0X00 | 0000 | 5007 | 00011 |
| 0X00 | 0000 | 5008 | 00011 |
| 0X00 | 0000 | 5009 | 00011 |
| 0X00 | 0000 | 6001 | 00011 |
| 0X00 | 0000 | 6002 | 00011 |
| 0X00 | 0000 | 6003 | 00011 |
| 0X00 | 0000 | 6004 | 00011 |
| 0X00 | 0000 | 6005 | 00011 |
| 0X00 | 0000 | 6006 | 00011 |
| 0X00 | 0000 | 6007 | 00011 |
| 0X00 | 0000 | 6008 | 00011 |
| 0X00 | 0000 | 6009 | 00011 |
| 0X00 | 0000 | 7001 | 00011 |
| 0X00 | 0000 | 7002 | 00011 |
| 0X00 | 0000 | 7003 | 00011 |
| 0X00 | 0000 | 7004 | 00011 |
| 0X00 | 0000 | 7005 | 00011 |
| 0X00 | 0000 | 7006 | 00011 |
| 0X00 | 0000 | 7007 | 00011 |
| 0X00 | 0000 | 7008 | 00011 |
| 0X00 | 0000 | 7009 | 00011 |
| 0X00 | 0000 | 8001 | 00011 |
| X000 | 0000 | 4006 | 00011 |
| X000 | 0000 | 4007 | 00011 |
| X000 | 0000 | 4008 | 00011 |
| X000 | 0000 | 4009 | 00011 |
| X000 | 0000 | 5001 | 00011 |
| X000 | 0000 | 5002 | 00011 |
| X000 | 0000 | 5003 | 00011 |
| X000 | 0000 | 5004 | 00011 |
| X000 | 0000 | 5005 | 00011 |
| X000 | 0000 | 5006 | 00011 |
| X000 | 0000 | 5007 | 00011 |
| X000 | 0000 | 5008 | 00011 |
| X000 | 0000 | 5009 | 00011 |

-continued

| Window Contents | | | X' |
|---|---|---|---|
| X000 | 0000 | 6001 | 00011 |
| X000 | 0000 | 6002 | 00011 |
| X000 | 0000 | 6003 | 00011 |
| X000 | 0000 | 6004 | 00011 |
| X000 | 0000 | 6005 | 00011 |
| X000 | 0000 | 6006 | 00011 |
| X000 | 0000 | 6007 | 00011 |
| X000 | 0000 | 6008 | 00011 |
| X000 | 0000 | 6009 | 00011 |
| X000 | 0000 | 7001 | 00011 |
| X000 | 0000 | 7002 | 00011 |
| X000 | 0000 | 7003 | 00011 |
| X000 | 0000 | 7004 | 00011 |
| X000 | 0000 | 7005 | 00011 |
| X000 | 0000 | 7006 | 00011 |
| X000 | 0000 | 7007 | 00011 |
| X000 | 0000 | 7008 | 00011 |
| X000 | 0000 | 7009 | 00011 |
| X000 | 0000 | 8001 | 00011 |
| 0000 | 0000 | 8002 | 00100 |
| 0000 | 0000 | 8003 | 00100 |
| 0000 | 0000 | 8004 | 00100 |
| 0000 | 0000 | 8005 | 00100 |
| 0000 | 0000 | 8006 | 00100 |
| 0000 | 0000 | 8007 | 00100 |
| 0000 | 0000 | 8008 | 00100 |
| 0000 | 0000 | 8009 | 00100 |
| 0000 | 0000 | 9001 | 00100 |
| 0000 | 0000 | 9002 | 00100 |
| 0000 | 0000 | 9003 | 00100 |
| 0000 | 0000 | 9004 | 00100 |
| 0000 | 0000 | 9005 | 00100 |
| 0000 | 0000 | 9006 | 00100 |
| 0000 | 0000 | 9007 | 00100 |
| 0000 | 0000 | 9008 | 00100 |
| 0000 | 0000 | 9009 | 00100 |
| 0000 | 0000 | 1000 | 00100 |
| 0000 | 0000 | 2000 | 00100 |
| 0000 | 0000 | 3000 | 00100 |
| 0X00 | 0000 | 8002 | 00100 |
| 0X00 | 0000 | 8003 | 00100 |
| 0X00 | 0000 | 8004 | 00100 |
| 0X00 | 0000 | 8005 | 00100 |
| 0X00 | 0000 | 8006 | 00100 |
| 0X00 | 0000 | 8007 | 00100 |
| 0X00 | 0000 | 8008 | 00100 |
| 0X00 | 0000 | 8009 | 00100 |
| 0X00 | 0000 | 9001 | 00100 |
| 0X00 | 0000 | 9002 | 00100 |
| 0X00 | 0000 | 9003 | 00100 |
| 0X00 | 0000 | 9004 | 00100 |
| 0X00 | 0000 | 9005 | 00100 |
| 0X00 | 0000 | 9006 | 00100 |
| 0X00 | 0000 | 9007 | 00100 |
| 0X00 | 0000 | 9008 | 00100 |
| 0X00 | 0000 | 9009 | 00100 |
| 0X00 | 0000 | 1000 | 00100 |
| 0X00 | 0000 | 2000 | 00100 |
| 0X00 | 0000 | 3000 | 00100 |
| X000 | 0000 | 8002 | 00100 |
| X000 | 0000 | 8003 | 00100 |
| X000 | 0000 | 8004 | 00100 |
| X000 | 0000 | 8005 | 00100 |
| X000 | 0000 | 8006 | 00100 |
| X000 | 0000 | 8007 | 00100 |
| X000 | 0000 | 8008 | 00100 |
| X000 | 0000 | 8009 | 00100 |
| X000 | 0000 | 9001 | 00100 |
| X000 | 0000 | 9002 | 00100 |
| X000 | 0000 | 9003 | 00100 |
| X000 | 0000 | 9004 | 00100 |
| X000 | 0000 | 9005 | 00100 |
| X000 | 0000 | 9006 | 00100 |
| X000 | 0000 | 9007 | 00100 |
| X000 | 0000 | 9008 | 00100 |
| X000 | 0000 | 9009 | 00100 |
| X000 | 0000 | 1000 | 00100 |

-continued

| Window Contents | | | X' |
|---|---|---|---|
| X000 | 0000 | 2000 | 00100 |
| X000 | 0000 | 3000 | 00100 |
| XXXX | 1001 | XXXX | 00000 |
| XXXX | 1002 | XXXX | 00001 |
| XXXX | 1003 | XXXX | 00010 |
| XXXX | 1004 | XXXX | 00011 |
| XXXX | 1005 | XXXX | 00100 |
| XXXX | 1006 | XXXX | 00101 |
| XXXX | 1007 | XXXX | 00110 |
| XXXX | 1008 | XXXX | 00111 |
| XXXX | 1009 | XXXX | 01000 |
| XXXX | 2001 | XXXX | 01001 |
| XXXX | 2002 | XXXX | 01010 |
| XXXX | 2003 | XXXX | 01011 |
| XXXX | 2004 | XXXX | 01100 |
| XXXX | 2005 | XXXX | 01101 |
| XXXX | 2006 | XXXX | 01110 |
| XXXX | 2007 | XXXX | 01111 |
| XXXX | 2008 | XXXX | 10000 |
| XXXX | 2009 | XXXX | 10001 |
| XXXX | 3001 | XXXX | 10010 |
| XXXX | 3002 | XXXX | 10011 |
| XXXX | 3003 | XXXX | 10100 |
| XXXX | 3004 | XXXX | 10101 |
| XXXX | 3005 | XXXX | 10110 |
| XXXX | 3006 | XXXX | 10111 |
| XXXX | 3007 | XXXX | 11000 |
| XXXX | 3008 | XXXX | 11001 |
| XXXX | 3009 | XXXX | 11010 |
| XXXX | 4001 | XXXX | 11011 |
| XXXX | 4002 | XXXX | 11100 |
| XXXX | 4003 | XXXX | 11101 |
| XXXX | 4004 | XXXX | 11110 |
| XXXX | 4005 | XXXX | 11111 |
| XXXX | 4006 | XXXX | 00000 |
| XXXX | 4007 | XXXX | 00001 |
| XXXX | 4008 | XXXX | 00010 |
| XXXX | 4009 | XXXX | 00011 |
| XXXX | 5001 | XXXX | 00100 |
| XXXX | 5002 | XXXX | 00101 |
| XXXX | 5003 | XXXX | 00110 |
| XXXX | 5004 | XXXX | 00111 |
| XXXX | 5005 | XXXX | 01000 |
| XXXX | 5006 | XXXX | 01001 |
| XXXX | 5007 | XXXX | 01010 |
| XXXX | 5008 | XXXX | 01011 |
| XXXX | 5009 | XXXX | 01100 |
| XXXX | 6001 | XXXX | 01101 |
| XXXX | 6002 | XXXX | 01110 |
| XXXX | 6003 | XXXX | 01111 |
| XXXX | 6004 | XXXX | 10000 |
| XXXX | 6005 | XXXX | 10001 |
| XXXX | 6006 | XXXX | 10010 |
| XXXX | 6007 | XXXX | 10011 |
| XXXX | 6008 | XXXX | 10100 |
| XXXX | 6009 | XXXX | 10101 |
| XXXX | 7001 | XXXX | 10110 |
| XXXX | 7002 | XXXX | 10111 |
| XXXX | 7003 | XXXX | 11000 |
| XXXX | 7004 | XXXX | 11001 |
| XXXX | 7005 | XXXX | 11010 |
| XXXX | 7006 | XXXX | 11011 |
| XXXX | 7007 | XXXX | 11100 |
| XXXX | 7008 | XXXX | 11101 |
| XXXX | 7009 | XXXX | 11110 |
| XXXX | 8001 | XXXX | 11111 |
| XXXX | 8002 | XXXX | 00000 |
| XXXX | 8003 | XXXX | 00001 |
| XXXX | 8004 | XXXX | 00010 |
| XXXX | 8005 | XXXX | 00011 |
| XXXX | 8006 | XXXX | 00100 |
| XXXX | 8007 | XXXX | 00101 |
| XXXX | 8008 | XXXX | 00110 |
| XXXX | 8009 | XXXX | 00111 |
| XXXX | 9001 | XXXX | 01000 |
| XXXX | 9002 | XXXX | 01001 |
| XXXX | 9003 | XXXX | 01010 |

-continued

| Window Contents | | | X' |
|---|---|---|---|
| XXXX | 9004 | XXXX | 01011 |
| XXXX | 9005 | XXXX | 01100 |
| XXXX | 9006 | XXXX | 01101 |
| XXXX | 9007 | XXXX | 01110 |
| XXXX | 9008 | XXXX | 01111 |
| XXXX | 9009 | XXXX | 10000 |
| XXXX | 1000 | 0100 | 10001 |
| XXXX | 1000 | 0200 | 10001 |
| XXXX | 1000 | 0300 | 10001 |
| XXXX | 1000 | 0400 | 10001 |
| XXXX | 1000 | 0500 | 10001 |
| XXXX | 1000 | 0600 | 10001 |
| XXXX | 1000 | 0700 | 10001 |
| XXXX | 2000 | 0100 | 10010 |
| XXXX | 2000 | 0200 | 10010 |
| XXXX | 2000 | 0300 | 10010 |
| XXXX | 2000 | 0400 | 10010 |
| XXXX | 2000 | 0500 | 10010 |
| XXXX | 2000 | 0600 | 10010 |
| XXXX | 2000 | 0700 | 10010 |
| XXXX | 3000 | 0100 | 10011 |
| XXXX | 3000 | 0200 | 10011 |
| XXXX | 3000 | 0300 | 10011 |
| XXXX | 3000 | 0400 | 10011 |
| XXXX | 3000 | 0500 | 10011 |
| XXXX | 3000 | 0600 | 10011 |
| XXXX | 3000 | 0700 | 10011 |
| XXXX | 1000 | 0000 | 10100 |
| XXXX | 1000 | 00X0 | 10100 |
| XXXX | 1000 | 000X | 10100 |
| XXXX | 2000 | 0000 | 10101 |
| XXXX | 2000 | 00X0 | 10101 |
| XXXX | 2000 | 000X | 10101 |
| XXXX | 3000 | 0000 | 10110 |
| XXXX | 3000 | 00X0 | 10110 |
| XXXX | 3000 | 000X | 10110 |
| XXXX | 1000 | 1001 | 10111 |
| XXXX | 1000 | 1002 | 10111 |
| XXXX | 1000 | 1003 | 10111 |
| XXXX | 1000 | 1004 | 10111 |
| XXXX | 1000 | 1005 | 10111 |
| XXXX | 1000 | 1006 | 10111 |
| XXXX | 1000 | 1007 | 10111 |
| XXXX | 1000 | 1008 | 10111 |
| XXXX | 1000 | 1009 | 10111 |
| XXXX | 1000 | 2001 | 10111 |
| XXXX | 1000 | 2002 | 10111 |
| XXXX | 1000 | 2003 | 10111 |
| XXXX | 1000 | 2004 | 10111 |
| XXXX | 1000 | 2005 | 10111 |
| XXXX | 1000 | 2006 | 10111 |
| XXXX | 1000 | 2007 | 10111 |
| XXXX | 1000 | 2008 | 10111 |
| XXXX | 1000 | 2009 | 10111 |
| XXXX | 1000 | 3001 | 10111 |
| XXXX | 1000 | 3002 | 10111 |
| XXXX | 1000 | 3003 | 10111 |
| XXXX | 1000 | 3004 | 10111 |
| XXXX | 1000 | 3005 | 10111 |
| XXXX | 1000 | 3006 | 10111 |
| XXXX | 1000 | 3007 | 10111 |
| XXXX | 1000 | 3008 | 10111 |
| XXXX | 1000 | 3009 | 10111 |
| XXXX | 1000 | 4001 | 10111 |
| XXXX | 1000 | 4002 | 10111 |
| XXXX | 1000 | 4003 | 10111 |
| XXXX | 1000 | 4004 | 10111 |
| XXXX | 1000 | 4005 | 10111 |
| XXXX | 2000 | 1001 | 11000 |
| XXXX | 2000 | 1002 | 11000 |
| XXXX | 2000 | 1003 | 11000 |
| XXXX | 2000 | 1004 | 11000 |
| XXXX | 2000 | 1005 | 11000 |
| XXXX | 2000 | 1006 | 11000 |
| XXXX | 2000 | 1007 | 11000 |
| XXXX | 2000 | 1008 | 11000 |
| XXXX | 2000 | 1009 | 11000 |

-continued

| Window Contents | | | X' |
|---|---|---|---|
| XXXX | 2000 | 2001 | 11000 |
| XXXX | 2000 | 2002 | 11000 |
| XXXX | 2000 | 2003 | 11000 |
| XXXX | 2000 | 2004 | 11000 |
| XXXX | 2000 | 2005 | 11000 |
| XXXX | 2000 | 2006 | 11000 |
| XXXX | 2000 | 2007 | 11000 |
| XXXX | 2000 | 2008 | 11000 |
| XXXX | 2000 | 2009 | 11000 |
| XXXX | 2000 | 3001 | 11000 |
| XXXX | 2000 | 3002 | 11000 |
| XXXX | 2000 | 3003 | 11000 |
| XXXX | 2000 | 3004 | 11000 |
| XXXX | 2000 | 3005 | 11000 |
| XXXX | 2000 | 3006 | 11000 |
| XXXX | 2000 | 3007 | 11000 |
| XXXX | 2000 | 3008 | 11000 |
| XXXX | 2000 | 3009 | 11000 |
| XXXX | 2000 | 4001 | 11000 |
| XXXX | 2000 | 4002 | 11000 |
| XXXX | 2000 | 4003 | 11000 |
| XXXX | 2000 | 4004 | 11000 |
| XXXX | 2000 | 4005 | 11000 |
| XXXX | 3000 | 1001 | 11001 |
| XXXX | 3000 | 1002 | 11001 |
| XXXX | 3000 | 1003 | 11001 |
| XXXX | 3000 | 1004 | 11001 |
| XXXX | 3000 | 1005 | 11001 |
| XXXX | 3000 | 1006 | 11001 |
| XXXX | 3000 | 1007 | 11001 |
| XXXX | 3000 | 1008 | 11001 |
| XXXX | 3000 | 1009 | 11001 |
| XXXX | 3000 | 2001 | 11001 |
| XXXX | 3000 | 2002 | 11001 |
| XXXX | 3000 | 2003 | 11001 |
| XXXX | 3000 | 2004 | 11001 |
| XXXX | 3000 | 2005 | 11001 |
| XXXX | 3000 | 2006 | 11001 |
| XXXX | 3000 | 2007 | 11001 |
| XXXX | 3000 | 2008 | 11001 |
| XXXX | 3000 | 2009 | 11001 |
| XXXX | 3000 | 3001 | 11001 |
| XXXX | 3000 | 3002 | 11001 |
| XXXX | 3000 | 3003 | 11001 |
| XXXX | 3000 | 3004 | 11001 |
| XXXX | 3000 | 3005 | 11001 |
| XXXX | 3000 | 3006 | 11001 |
| XXXX | 3000 | 3007 | 11001 |
| XXXX | 3000 | 3008 | 11001 |
| XXXX | 3000 | 3009 | 11001 |
| XXXX | 3000 | 4001 | 11001 |
| XXXX | 3000 | 4002 | 11001 |
| XXXX | 3000 | 4003 | 11001 |
| XXXX | 3000 | 4004 | 11001 |
| XXXX | 3000 | 4005 | 11001 |
| XXXX | 1000 | 4006 | 11010 |
| XXXX | 1000 | 4007 | 11010 |
| XXXX | 1000 | 4008 | 11010 |
| XXXX | 1000 | 4009 | 11010 |
| XXXX | 1000 | 5001 | 11010 |
| XXXX | 1000 | 5002 | 11010 |
| XXXX | 1000 | 5003 | 11010 |
| XXXX | 1000 | 5004 | 11010 |
| XXXX | 1000 | 5005 | 11010 |
| XXXX | 1000 | 5006 | 11010 |
| XXXX | 1000 | 5007 | 11010 |
| XXXX | 1000 | 5008 | 11010 |
| XXXX | 1000 | 5009 | 11010 |
| XXXX | 1000 | 6001 | 11010 |
| XXXX | 1000 | 6002 | 11010 |
| XXXX | 1000 | 6003 | 11010 |
| XXXX | 1000 | 6004 | 11010 |
| XXXX | 1000 | 6005 | 11010 |
| XXXX | 1000 | 6006 | 11010 |
| XXXX | 1000 | 6007 | 11010 |
| XXXX | 1000 | 6008 | 11010 |
| XXXX | 1000 | 6009 | 11010 |

-continued

| Window Contents | | | X' |
|---|---|---|---|
| XXXX | 1000 | 7001 | 11010 |
| XXXX | 1000 | 7002 | 11010 |
| XXXX | 1000 | 7003 | 11010 |
| XXXX | 1000 | 7004 | 11010 |
| XXXX | 1000 | 7005 | 11010 |
| XXXX | 1000 | 7006 | 11010 |
| XXXX | 1000 | 7007 | 11010 |
| XXXX | 1000 | 7008 | 11010 |
| XXXX | 1000 | 7009 | 11010 |
| XXXX | 1000 | 8001 | 11010 |
| XXXX | 2000 | 4006 | 11011 |
| XXXX | 2000 | 4007 | 11011 |
| XXXX | 2000 | 4008 | 11011 |
| XXXX | 2000 | 4009 | 11011 |
| XXXX | 2000 | 5001 | 11011 |
| XXXX | 2000 | 5002 | 11011 |
| XXXX | 2000 | 5003 | 11011 |
| XXXX | 2000 | 5004 | 11011 |
| XXXX | 2000 | 5005 | 11011 |
| XXXX | 2000 | 5006 | 11011 |
| XXXX | 2000 | 5007 | 11011 |
| XXXX | 2000 | 5008 | 11011 |
| XXXX | 2000 | 5009 | 11011 |
| XXXX | 2000 | 6001 | 11011 |
| XXXX | 2000 | 6002 | 11011 |
| XXXX | 2000 | 6003 | 11011 |
| XXXX | 2000 | 6004 | 11011 |
| XXXX | 2000 | 6005 | 11011 |
| XXXX | 2000 | 6006 | 11011 |
| XXXX | 2000 | 6007 | 11011 |
| XXXX | 2000 | 6008 | 11011 |
| XXXX | 2000 | 6009 | 11011 |
| XXXX | 2000 | 7001 | 11011 |
| XXXX | 2000 | 7002 | 11011 |
| XXXX | 2000 | 7003 | 11011 |
| XXXX | 2000 | 7004 | 11011 |
| XXXX | 2000 | 7005 | 11011 |
| XXXX | 2000 | 7006 | 11011 |
| XXXX | 2000 | 7007 | 11011 |
| XXXX | 2000 | 7008 | 11011 |
| XXXX | 2000 | 7009 | 11011 |
| XXXX | 2000 | 8001 | 11011 |
| XXXX | 3000 | 4006 | 11100 |
| XXXX | 3000 | 4007 | 11100 |
| XXXX | 3000 | 4008 | 11100 |
| XXXX | 3000 | 4009 | 11100 |
| XXXX | 3000 | 5001 | 11100 |
| XXXX | 3000 | 5002 | 11100 |
| XXXX | 3000 | 5003 | 11100 |
| XXXX | 3000 | 5004 | 11100 |
| XXXX | 3000 | 5005 | 11100 |
| XXXX | 3000 | 5006 | 11100 |
| XXXX | 3000 | 5007 | 11100 |
| XXXX | 3000 | 5008 | 11100 |
| XXXX | 3000 | 5009 | 11100 |
| XXXX | 3000 | 6001 | 11100 |
| XXXX | 3000 | 6002 | 11100 |
| XXXX | 3000 | 6003 | 11100 |
| XXXX | 3000 | 6004 | 11100 |
| XXXX | 3000 | 6005 | 11100 |
| XXXX | 3000 | 6006 | 11100 |
| XXXX | 3000 | 6007 | 11100 |
| XXXX | 3000 | 6008 | 11100 |
| XXXX | 3000 | 6009 | 11100 |
| XXXX | 3000 | 7001 | 11100 |
| XXXX | 3000 | 7002 | 11100 |
| XXXX | 3000 | 7003 | 11100 |
| XXXX | 3000 | 7004 | 11100 |
| XXXX | 3000 | 7005 | 11100 |
| XXXX | 3000 | 7006 | 11100 |
| XXXX | 3000 | 7007 | 11100 |
| XXXX | 3000 | 7008 | 11100 |
| XXXX | 3000 | 7009 | 11100 |
| XXXX | 3000 | 8001 | 11100 |
| XXXX | 1000 | 8002 | 11101 |
| XXXX | 1000 | 8003 | 11101 |
| XXXX | 1000 | 8004 | 11101 |

-continued

| Window Contents | | | X' |
|---|---|---|---|
| XXXX | 1000 | 8005 | 11101 |
| XXXX | 1000 | 8006 | 11101 |
| XXXX | 1000 | 8007 | 11101 |
| XXXX | 1000 | 8008 | 11101 |
| XXXX | 1000 | 8009 | 11101 |
| XXXX | 1000 | 9001 | 11101 |
| XXXX | 1000 | 9002 | 11101 |
| XXXX | 1000 | 9003 | 11101 |
| XXXX | 1000 | 9004 | 11101 |
| XXXX | 1000 | 9005 | 11101 |
| XXXX | 1000 | 9006 | 11101 |
| XXXX | 1000 | 9007 | 11101 |
| XXXX | 1000 | 9008 | 11101 |
| XXXX | 1000 | 9009 | 11101 |
| XXXX | 1000 | 1000 | 11101 |
| XXXX | 1000 | 2000 | 11101 |
| XXXX | 1000 | 3000 | 11101 |
| XXXX | 2000 | 8002 | 11110 |
| XXXX | 2000 | 8003 | 11110 |
| XXXX | 2000 | 8004 | 11110 |
| XXXX | 2000 | 8005 | 11110 |
| XXXX | 2000 | 8006 | 11110 |
| XXXX | 2000 | 8007 | 11110 |
| XXXX | 2000 | 8008 | 11110 |
| XXXX | 2000 | 8009 | 11110 |
| XXXX | 2000 | 9001 | 11110 |
| XXXX | 2000 | 9002 | 11110 |
| XXXX | 2000 | 9003 | 11110 |
| XXXX | 2000 | 9004 | 11110 |
| XXXX | 2000 | 9005 | 11110 |
| XXXX | 2000 | 9006 | 11110 |
| XXXX | 2000 | 9007 | 11110 |
| XXXX | 2000 | 9008 | 11110 |
| XXXX | 2000 | 9009 | 11110 |
| XXXX | 2000 | 1000 | 11110 |
| XXXX | 2000 | 2000 | 11110 |
| XXXX | 2000 | 3000 | 11110 |
| XXXX | 3000 | 8002 | 11111 |
| XXXX | 3000 | 8003 | 11111 |
| XXXX | 3000 | 8004 | 11111 |
| XXXX | 3000 | 8005 | 11111 |
| XXXX | 3000 | 8006 | 11111 |
| XXXX | 3000 | 8007 | 11111 |
| XXXX | 3000 | 8008 | 11111 |
| XXXX | 3000 | 8009 | 11111 |
| XXXX | 3000 | 9001 | 11111 |
| XXXX | 3000 | 9002 | 11111 |
| XXXX | 3000 | 9003 | 11111 |
| XXXX | 3000 | 9004 | 11111 |
| XXXX | 3000 | 9005 | 11111 |
| XXXX | 3000 | 9006 | 11111 |
| XXXX | 3000 | 9007 | 11111 |
| XXXX | 3000 | 9008 | 11111 |
| XXXX | 3000 | 9009 | 11111 |
| XXXX | 3000 | 1000 | 11111 |
| XXXX | 3000 | 2000 | 11111 |
| XXXX | 3000 | 3000 | 11111 |
| XXXX | 4000 | 0100 | 00000 |
| XXXX | 4000 | 0200 | 00000 |
| XXXX | 4000 | 0300 | 00000 |
| XXXX | 4000 | 0400 | 00000 |
| XXXX | 4000 | 0500 | 00000 |
| XXXX | 4000 | 0600 | 00000 |
| XXXX | 4000 | 0700 | 00000 |
| XXXX | 5000 | 0100 | 00001 |
| XXXX | 5000 | 0200 | 00001 |
| XXXX | 5000 | 0300 | 00001 |
| XXXX | 5000 | 0400 | 00001 |
| XXXX | 5000 | 0500 | 00001 |
| XXXX | 5000 | 0600 | 00001 |
| XXXX | 5000 | 0700 | 00001 |
| XXXX | 6000 | 0100 | 00010 |
| XXXX | 6000 | 0200 | 00010 |
| XXXX | 6000 | 0300 | 00010 |
| XXXX | 6000 | 0400 | 00010 |
| XXXX | 6000 | 0500 | 00010 |
| XXXX | 6000 | 0600 | 00010 |

-continued

| Window Contents | | | X' |
|---|---|---|---|
| XXXX | 6000 | 0700 | 00010 |
| XXXX | 7000 | 0100 | 00011 |
| XXXX | 7000 | 0200 | 00011 |
| XXXX | 7000 | 0300 | 00011 |
| XXXX | 7000 | 0400 | 00011 |
| XXXX | 7000 | 0500 | 00011 |
| XXXX | 7000 | 0600 | 00011 |
| XXXX | 7000 | 0700 | 00011 |
| XXXX | 8000 | 0100 | 00100 |
| XXXX | 8000 | 0200 | 00100 |
| XXXX | 8000 | 0300 | 00100 |
| XXXX | 8000 | 0400 | 00100 |
| XXXX | 8000 | 0500 | 00100 |
| XXXX | 8000 | 0600 | 00100 |
| XXXX | 8000 | 0700 | 00100 |
| XXXX | 9000 | 0100 | 00101 |
| XXXX | 9000 | 0200 | 00101 |
| XXXX | 9000 | 0300 | 00101 |
| XXXX | 9000 | 0400 | 00101 |
| XXXX | 9000 | 0500 | 00101 |
| XXXX | 9000 | 0600 | 00101 |
| XXXX | 9000 | 0700 | 00101 |
| XXXX | 4000 | 0000 | 00110 |
| XXXX | 4000 | 00X0 | 00110 |
| XXXX | 4000 | 000X | 00110 |
| XXXX | 5000 | 0000 | 00111 |
| XXXX | 5000 | 00X0 | 00111 |
| XXXX | 5000 | 000X | 00111 |
| XXXX | 6000 | 0000 | 01000 |
| XXXX | 6000 | 00X0 | 01000 |
| XXXX | 6000 | 000X | 01000 |
| XXXX | 7000 | 0000 | 01001 |
| XXXX | 7000 | 00X0 | 01001 |
| XXXX | 7000 | 000X | 01001 |
| XXXX | 8000 | 0000 | 01010 |
| XXXX | 8000 | 00X0 | 01010 |
| XXXX | 8000 | 000X | 01010 |
| XXXX | 9000 | 0000 | 01011 |
| XXXX | 9000 | 00X0 | 01011 |
| XXXX | 9000 | 000X | 01011 |
| XXXX | 4000 | 1001 | 01100 |
| XXXX | 4000 | 1002 | 01100 |
| XXXX | 4000 | 1003 | 01100 |
| XXXX | 4000 | 1004 | 01100 |
| XXXX | 4000 | 1005 | 01100 |
| XXXX | 4000 | 1006 | 01100 |
| XXXX | 4000 | 1007 | 01100 |
| XXXX | 4000 | 1008 | 01100 |
| XXXX | 4000 | 1009 | 01100 |
| XXXX | 4000 | 2001 | 01100 |
| XXXX | 4000 | 2002 | 01100 |
| XXXX | 4000 | 2003 | 01100 |
| XXXX | 4000 | 2004 | 01100 |
| XXXX | 4000 | 2005 | 01100 |
| XXXX | 4000 | 2006 | 01100 |
| XXXX | 4000 | 2007 | 01100 |
| XXXX | 4000 | 2008 | 01100 |
| XXXX | 4000 | 2009 | 01100 |
| XXXX | 4000 | 3001 | 01100 |
| XXXX | 4000 | 3002 | 01100 |
| XXXX | 4000 | 3003 | 01100 |
| XXXX | 4000 | 3004 | 01100 |
| XXXX | 4000 | 3005 | 01100 |
| XXXX | 4000 | 3006 | 01100 |
| XXXX | 4000 | 3007 | 01100 |
| XXXX | 4000 | 3008 | 01100 |
| XXXX | 4000 | 3009 | 01100 |
| XXXX | 4000 | 4001 | 01100 |
| XXXX | 4000 | 4002 | 01100 |
| XXXX | 4000 | 4003 | 01100 |
| XXXX | 4000 | 4004 | 01100 |
| XXXX | 4000 | 4005 | 01100 |
| XXXX | 5000 | 1001 | 01101 |
| XXXX | 5000 | 1002 | 01101 |
| XXXX | 5000 | 1003 | 01101 |
| XXXX | 5000 | 1004 | 01101 |
| XXXX | 5000 | 1005 | 01101 |

-continued

| Window Contents | | | X' |
|---|---|---|---|
| X X X X | 5 0 0 0 | 1 0 0 6 | 0 1 1 0 1 |
| X X X X | 5 0 0 0 | 1 0 0 7 | 0 1 1 0 1 |
| X X X X | 5 0 0 0 | 1 0 0 8 | 0 1 1 0 1 |
| X X X X | 5 0 0 0 | 1 0 0 9 | 0 1 1 0 1 |
| X X X X | 5 0 0 0 | 2 0 0 1 | 0 1 1 0 1 |
| X X X X | 5 0 0 0 | 2 0 0 2 | 0 1 1 0 1 |
| X X X X | 5 0 0 0 | 2 0 0 3 | 0 1 1 0 1 |
| X X X X | 5 0 0 0 | 2 0 0 4 | 0 1 1 0 1 |
| X X X X | 5 0 0 0 | 2 0 0 5 | 0 1 1 0 1 |
| X X X X | 5 0 0 0 | 2 0 0 6 | 0 1 1 0 1 |
| X X X X | 5 0 0 0 | 2 0 0 7 | 0 1 1 0 1 |
| X X X X | 5 0 0 0 | 2 0 0 8 | 0 1 1 0 1 |
| X X X X | 5 0 0 0 | 2 0 0 9 | 0 1 1 0 1 |
| X X X X | 5 0 0 0 | 3 0 0 1 | 0 1 1 0 1 |
| X X X X | 5 0 0 0 | 3 0 0 2 | 0 1 1 0 1 |
| X X X X | 5 0 0 0 | 3 0 0 3 | 0 1 1 0 1 |
| X X X X | 5 0 0 0 | 3 0 0 4 | 0 1 1 0 1 |
| X X X X | 5 0 0 0 | 3 0 0 5 | 0 1 1 0 1 |
| X X X X | 5 0 0 0 | 3 0 0 6 | 0 1 1 0 1 |
| X X X X | 5 0 0 0 | 3 0 0 7 | 0 1 1 0 1 |
| X X X X | 5 0 0 0 | 3 0 0 8 | 0 1 1 0 1 |
| X X X X | 5 0 0 0 | 3 0 0 9 | 0 1 1 0 1 |
| X X X X | 5 0 0 0 | 4 0 0 1 | 0 1 1 0 1 |
| X X X X | 5 0 0 0 | 4 0 0 2 | 0 1 1 0 1 |
| X X X X | 5 0 0 0 | 4 0 0 3 | 0 1 1 0 1 |
| X X X X | 5 0 0 0 | 4 0 0 4 | 0 1 1 0 1 |
| X X X X | 5 0 0 0 | 4 0 0 5 | 0 1 1 0 1 |
| X X X X | 6 0 0 0 | 1 0 0 1 | 0 1 1 1 0 |
| X X X X | 6 0 0 0 | 1 0 0 2 | 0 1 1 1 0 |
| X X X X | 6 0 0 0 | 1 0 0 3 | 0 1 1 1 0 |
| X X X X | 6 0 0 0 | 1 0 0 4 | 0 1 1 1 0 |
| X X X X | 6 0 0 0 | 1 0 0 5 | 0 1 1 1 0 |
| X X X X | 6 0 0 0 | 1 0 0 6 | 0 1 1 1 0 |
| X X X X | 6 0 0 0 | 1 0 0 7 | 0 1 1 1 0 |
| X X X X | 6 0 0 0 | 1 0 0 8 | 0 1 1 1 0 |
| X X X X | 6 0 0 0 | 1 0 0 9 | 0 1 1 1 0 |
| X X X X | 6 0 0 0 | 2 0 0 1 | 0 1 1 1 0 |
| X X X X | 6 0 0 0 | 2 0 0 2 | 0 1 1 1 0 |
| X X X X | 6 0 0 0 | 2 0 0 3 | 0 1 1 1 0 |
| X X X X | 6 0 0 0 | 2 0 0 4 | 0 1 1 1 0 |
| X X X X | 6 0 0 0 | 2 0 0 5 | 0 1 1 1 0 |
| X X X X | 6 0 0 0 | 2 0 0 6 | 0 1 1 1 0 |
| X X X X | 6 0 0 0 | 2 0 0 7 | 0 1 1 1 0 |
| X X X X | 6 0 0 0 | 2 0 0 8 | 0 1 1 1 0 |
| X X X X | 6 0 0 0 | 2 0 0 9 | 0 1 1 1 0 |
| X X X X | 6 0 0 0 | 3 0 0 1 | 0 1 1 1 0 |
| X X X X | 6 0 0 0 | 3 0 0 2 | 0 1 1 1 0 |
| X X X X | 6 0 0 0 | 3 0 0 3 | 0 1 1 1 0 |
| X X X X | 6 0 0 0 | 3 0 0 4 | 0 1 1 1 0 |
| X X X X | 6 0 0 0 | 3 0 0 5 | 0 1 1 1 0 |
| X X X X | 6 0 0 0 | 3 0 0 6 | 0 1 1 1 0 |
| X X X X | 6 0 0 0 | 3 0 0 7 | 0 1 1 1 0 |
| X X X X | 6 0 0 0 | 3 0 0 8 | 0 1 1 1 0 |
| X X X X | 6 0 0 0 | 3 0 0 9 | 0 1 1 1 0 |
| X X X X | 6 0 0 0 | 4 0 0 1 | 0 1 1 1 0 |
| X X X X | 6 0 0 0 | 4 0 0 2 | 0 1 1 1 0 |
| X X X X | 6 0 0 0 | 4 0 0 3 | 0 1 1 1 0 |
| X X X X | 6 0 0 0 | 4 0 0 4 | 0 1 1 1 0 |
| X X X X | 6 0 0 0 | 4 0 0 5 | 0 1 1 1 0 |
| X X X X | 7 0 0 0 | 1 0 0 1 | 0 1 1 1 1 |
| X X X X | 7 0 0 0 | 1 0 0 2 | 0 1 1 1 1 |
| X X X X | 7 0 0 0 | 1 0 0 3 | 0 1 1 1 1 |
| X X X X | 7 0 0 0 | 1 0 0 4 | 0 1 1 1 1 |
| X X X X | 7 0 0 0 | 1 0 0 5 | 0 1 1 1 1 |
| X X X X | 7 0 0 0 | 1 0 0 6 | 0 1 1 1 1 |
| X X X X | 7 0 0 0 | 1 0 0 7 | 0 1 1 1 1 |
| X X X X | 7 0 0 0 | 1 0 0 8 | 0 1 1 1 1 |
| X X X X | 7 0 0 0 | 1 0 0 9 | 0 1 1 1 1 |
| X X X X | 7 0 0 0 | 2 0 0 1 | 0 1 1 1 1 |
| X X X X | 7 0 0 0 | 2 0 0 2 | 0 1 1 1 1 |
| X X X X | 7 0 0 0 | 2 0 0 3 | 0 1 1 1 1 |
| X X X X | 7 0 0 0 | 2 0 0 4 | 0 1 1 1 1 |
| X X X X | 7 0 0 0 | 2 0 0 5 | 0 1 1 1 1 |
| X X X X | 7 0 0 0 | 2 0 0 6 | 0 1 1 1 1 |
| X X X X | 7 0 0 0 | 2 0 0 7 | 0 1 1 1 1 |
| X X X X | 7 0 0 0 | 2 0 0 8 | 0 1 1 1 1 |
| X X X X | 7 0 0 0 | 2 0 0 9 | 0 1 1 1 1 |

-continued

| Window Contents | | | X' |
|---|---|---|---|
| X X X X | 7 0 0 0 | 3 0 0 1 | 0 1 1 1 1 |
| X X X X | 7 0 0 0 | 3 0 0 2 | 0 1 1 1 1 |
| X X X X | 7 0 0 0 | 3 0 0 3 | 0 1 1 1 1 |
| X X X X | 7 0 0 0 | 3 0 0 4 | 0 1 1 1 1 |
| X X X X | 7 0 0 0 | 3 0 0 5 | 0 1 1 1 1 |
| X X X X | 7 0 0 0 | 3 0 0 6 | 0 1 1 1 1 |
| X X X X | 7 0 0 0 | 3 0 0 7 | 0 1 1 1 1 |
| X X X X | 7 0 0 0 | 3 0 0 8 | 0 1 1 1 1 |
| X X X X | 7 0 0 0 | 3 0 0 9 | 0 1 1 1 1 |
| X X X X | 7 0 0 0 | 4 0 0 1 | 0 1 1 1 1 |
| X X X X | 7 0 0 0 | 4 0 0 2 | 0 1 1 1 1 |
| X X X X | 7 0 0 0 | 4 0 0 3 | 0 1 1 1 1 |
| X X X X | 7 0 0 0 | 4 0 0 4 | 0 1 1 1 1 |
| X X X X | 7 0 0 0 | 4 0 0 5 | 0 1 1 1 1 |
| X X X X | 8 0 0 0 | 1 0 0 1 | 1 0 0 0 0 |
| X X X X | 8 0 0 0 | 1 0 0 2 | 1 0 0 0 0 |
| X X X X | 8 0 0 0 | 1 0 0 3 | 1 0 0 0 0 |
| X X X X | 8 0 0 0 | 1 0 0 4 | 1 0 0 0 0 |
| X X X X | 8 0 0 0 | 1 0 0 5 | 1 0 0 0 0 |
| X X X X | 8 0 0 0 | 1 0 0 6 | 1 0 0 0 0 |
| X X X X | 8 0 0 0 | 1 0 0 7 | 1 0 0 0 0 |
| X X X X | 8 0 0 0 | 1 0 0 8 | 1 0 0 0 0 |
| X X X X | 8 0 0 0 | 1 0 0 9 | 1 0 0 0 0 |
| X X X X | 8 0 0 0 | 2 0 0 1 | 1 0 0 0 0 |
| X X X X | 8 0 0 0 | 2 0 0 2 | 1 0 0 0 0 |
| X X X X | 8 0 0 0 | 2 0 0 3 | 1 0 0 0 0 |
| X X X X | 8 0 0 0 | 2 0 0 4 | 1 0 0 0 0 |
| X X X X | 8 0 0 0 | 2 0 0 5 | 1 0 0 0 0 |
| X X X X | 8 0 0 0 | 2 0 0 6 | 1 0 0 0 0 |
| X X X X | 8 0 0 0 | 2 0 0 7 | 1 0 0 0 0 |
| X X X X | 8 0 0 0 | 2 0 0 8 | 1 0 0 0 0 |
| X X X X | 8 0 0 0 | 2 0 0 9 | 1 0 0 0 0 |
| X X X X | 8 0 0 0 | 3 0 0 1 | 1 0 0 0 0 |
| X X X X | 8 0 0 0 | 3 0 0 2 | 1 0 0 0 0 |
| X X X X | 8 0 0 0 | 3 0 0 3 | 1 0 0 0 0 |
| X X X X | 8 0 0 0 | 3 0 0 4 | 1 0 0 0 0 |
| X X X X | 8 0 0 0 | 3 0 0 5 | 1 0 0 0 0 |
| X X X X | 8 0 0 0 | 3 0 0 6 | 1 0 0 0 0 |
| X X X X | 8 0 0 0 | 3 0 0 7 | 1 0 0 0 0 |
| X X X X | 8 0 0 0 | 3 0 0 8 | 1 0 0 0 0 |
| X X X X | 8 0 0 0 | 3 0 0 9 | 1 0 0 0 0 |
| X X X X | 8 0 0 0 | 4 0 0 1 | 1 0 0 0 0 |
| X X X X | 8 0 0 0 | 4 0 0 2 | 1 0 0 0 0 |
| X X X X | 8 0 0 0 | 4 0 0 3 | 1 0 0 0 0 |
| X X X X | 8 0 0 0 | 4 0 0 4 | 1 0 0 0 0 |
| X X X X | 8 0 0 0 | 4 0 0 5 | 1 0 0 0 0 |
| X X X X | 9 0 0 0 | 1 0 0 1 | 1 0 0 0 1 |
| X X X X | 9 0 0 0 | 1 0 0 2 | 1 0 0 0 1 |
| X X X X | 9 0 0 0 | 1 0 0 3 | 1 0 0 0 1 |
| X X X X | 9 0 0 0 | 1 0 0 4 | 1 0 0 0 1 |
| X X X X | 9 0 0 0 | 1 0 0 5 | 1 0 0 0 1 |
| X X X X | 9 0 0 0 | 1 0 0 6 | 1 0 0 0 1 |
| X X X X | 9 0 0 0 | 1 0 0 7 | 1 0 0 0 1 |
| X X X X | 9 0 0 0 | 1 0 0 8 | 1 0 0 0 1 |
| X X X X | 9 0 0 0 | 1 0 0 9 | 1 0 0 0 1 |
| X X X X | 9 0 0 0 | 2 0 0 1 | 1 0 0 0 1 |
| X X X X | 9 0 0 0 | 2 0 0 2 | 1 0 0 0 1 |
| X X X X | 9 0 0 0 | 2 0 0 3 | 1 0 0 0 1 |
| X X X X | 9 0 0 0 | 2 0 0 4 | 1 0 0 0 1 |
| X X X X | 9 0 0 0 | 2 0 0 5 | 1 0 0 0 1 |
| X X X X | 9 0 0 0 | 2 0 0 6 | 1 0 0 0 1 |
| X X X X | 9 0 0 0 | 2 0 0 7 | 1 0 0 0 1 |
| X X X X | 9 0 0 0 | 2 0 0 8 | 1 0 0 0 1 |
| X X X X | 9 0 0 0 | 2 0 0 9 | 1 0 0 0 1 |
| X X X X | 9 0 0 0 | 3 0 0 1 | 1 0 0 0 1 |
| X X X X | 9 0 0 0 | 3 0 0 2 | 1 0 0 0 1 |
| X X X X | 9 0 0 0 | 3 0 0 3 | 1 0 0 0 1 |
| X X X X | 9 0 0 0 | 3 0 0 4 | 1 0 0 0 1 |
| X X X X | 9 0 0 0 | 3 0 0 5 | 1 0 0 0 1 |
| X X X X | 9 0 0 0 | 3 0 0 6 | 1 0 0 0 1 |
| X X X X | 9 0 0 0 | 3 0 0 7 | 1 0 0 0 1 |
| X X X X | 9 0 0 0 | 3 0 0 8 | 1 0 0 0 1 |
| X X X X | 9 0 0 0 | 3 0 0 9 | 1 0 0 0 1 |
| X X X X | 9 0 0 0 | 4 0 0 1 | 1 0 0 0 1 |
| X X X X | 9 0 0 0 | 4 0 0 2 | 1 0 0 0 1 |
| X X X X | 9 0 0 0 | 4 0 0 3 | 1 0 0 0 1 |
| X X X X | 9 0 0 0 | 4 0 0 4 | 1 0 0 0 1 |

-continued

| Window Contents | | | X' |
|---|---|---|---|
| XXXX | 9000 | 4005 | 10001 |
| XXXX | 4000 | 4006 | 10010 |
| XXXX | 4000 | 4007 | 10010 |
| XXXX | 4000 | 4008 | 10010 |
| XXXX | 4000 | 4009 | 10010 |
| XXXX | 4000 | 5001 | 10010 |
| XXXX | 4000 | 5002 | 10010 |
| XXXX | 4000 | 5003 | 10010 |
| XXXX | 4000 | 5004 | 10010 |
| XXXX | 4000 | 5005 | 10010 |
| XXXX | 4000 | 5006 | 10010 |
| XXXX | 4000 | 5007 | 10010 |
| XXXX | 4000 | 5008 | 10010 |
| XXXX | 4000 | 5009 | 10010 |
| XXXX | 4000 | 6001 | 10010 |
| XXXX | 4000 | 6002 | 10010 |
| XXXX | 4000 | 6003 | 10010 |
| XXXX | 4000 | 6004 | 10010 |
| XXXX | 4000 | 6005 | 10010 |
| XXXX | 4000 | 6006 | 10010 |
| XXXX | 4000 | 6007 | 10010 |
| XXXX | 4000 | 6008 | 10010 |
| XXXX | 4000 | 6009 | 10010 |
| XXXX | 4000 | 7001 | 10010 |
| XXXX | 4000 | 7002 | 10010 |
| XXXX | 4000 | 7003 | 10010 |
| XXXX | 4000 | 7004 | 10010 |
| XXXX | 4000 | 7005 | 10010 |
| XXXX | 4000 | 7006 | 10010 |
| XXXX | 4000 | 7007 | 10010 |
| XXXX | 4000 | 7008 | 10010 |
| XXXX | 4000 | 7009 | 10010 |
| XXXX | 4000 | 8001 | 10010 |
| XXXX | 5000 | 4006 | 10011 |
| XXXX | 5000 | 4007 | 10011 |
| XXXX | 5000 | 4008 | 10011 |
| XXXX | 5000 | 4009 | 10011 |
| XXXX | 5000 | 5001 | 10011 |
| XXXX | 5000 | 5002 | 10011 |
| XXXX | 5000 | 5003 | 10011 |
| XXXX | 5000 | 5004 | 10011 |
| XXXX | 5000 | 5005 | 10011 |
| XXXX | 5000 | 5006 | 10011 |
| XXXX | 5000 | 5007 | 10011 |
| XXXX | 5000 | 5008 | 10011 |
| XXXX | 5000 | 5009 | 10011 |
| XXXX | 5000 | 6001 | 10011 |
| XXXX | 5000 | 6002 | 10011 |
| XXXX | 5000 | 6003 | 10011 |
| XXXX | 5000 | 6004 | 10011 |
| XXXX | 5000 | 6005 | 10011 |
| XXXX | 5000 | 6006 | 10011 |
| XXXX | 5000 | 6007 | 10011 |
| XXXX | 5000 | 6008 | 10011 |
| XXXX | 5000 | 6009 | 10011 |
| XXXX | 5000 | 7001 | 10011 |
| XXXX | 5000 | 7002 | 10011 |
| XXXX | 5000 | 7003 | 10011 |
| XXXX | 5000 | 7004 | 10011 |
| XXXX | 5000 | 7005 | 10011 |
| XXXX | 5000 | 7006 | 10011 |
| XXXX | 5000 | 7007 | 10011 |
| XXXX | 5000 | 7008 | 10011 |
| XXXX | 5000 | 7009 | 10011 |
| XXXX | 5000 | 8001 | 10011 |
| XXXX | 6000 | 4006 | 10100 |
| XXXX | 6000 | 4007 | 10100 |
| XXXX | 6000 | 4008 | 10100 |
| XXXX | 6000 | 4009 | 10100 |
| XXXX | 6000 | 5001 | 10100 |
| XXXX | 6000 | 5002 | 10100 |
| XXXX | 6000 | 5003 | 10100 |
| XXXX | 6000 | 5004 | 10100 |
| XXXX | 6000 | 5005 | 10100 |
| XXXX | 6000 | 5006 | 10100 |
| XXXX | 6000 | 5007 | 10100 |
| XXXX | 6000 | 5008 | 10100 |

-continued

| Window Contents | | | X' |
|---|---|---|---|
| XXXX | 6000 | 5009 | 10100 |
| XXXX | 6000 | 6001 | 10100 |
| XXXX | 6000 | 6002 | 10100 |
| XXXX | 6000 | 6003 | 10100 |
| XXXX | 6000 | 6004 | 10100 |
| XXXX | 6000 | 6005 | 10100 |
| XXXX | 6000 | 6006 | 10100 |
| XXXX | 6000 | 6007 | 10100 |
| XXXX | 6000 | 6008 | 10100 |
| XXXX | 6000 | 6009 | 10100 |
| XXXX | 6000 | 7001 | 10100 |
| XXXX | 6000 | 7002 | 10100 |
| XXXX | 6000 | 7003 | 10100 |
| XXXX | 6000 | 7004 | 10100 |
| XXXX | 6000 | 7005 | 10100 |
| XXXX | 6000 | 7006 | 10100 |
| XXXX | 6000 | 7007 | 10100 |
| XXXX | 6000 | 7008 | 10100 |
| XXXX | 6000 | 7009 | 10100 |
| XXXX | 6000 | 8001 | 10100 |
| XXXX | 7000 | 4006 | 10101 |
| XXXX | 7000 | 4007 | 10101 |
| XXXX | 7000 | 4008 | 10101 |
| XXXX | 7000 | 4009 | 10101 |
| XXXX | 7000 | 5001 | 10101 |
| XXXX | 7000 | 5002 | 10101 |
| XXXX | 7000 | 5003 | 10101 |
| XXXX | 7000 | 5004 | 10101 |
| XXXX | 7000 | 5005 | 10101 |
| XXXX | 7000 | 5006 | 10101 |
| XXXX | 7000 | 5007 | 10101 |
| XXXX | 7000 | 5008 | 10101 |
| XXXX | 7000 | 5009 | 10101 |
| XXXX | 7000 | 6001 | 10101 |
| XXXX | 7000 | 6002 | 10101 |
| XXXX | 7000 | 6003 | 10101 |
| XXXX | 7000 | 6004 | 10101 |
| XXXX | 7000 | 6005 | 10101 |
| XXXX | 7000 | 6006 | 10101 |
| XXXX | 7000 | 6007 | 10101 |
| XXXX | 7000 | 6008 | 10101 |
| XXXX | 7000 | 6009 | 10101 |
| XXXX | 7000 | 7001 | 10101 |
| XXXX | 7000 | 7002 | 10101 |
| XXXX | 7000 | 7003 | 10101 |
| XXXX | 7000 | 7004 | 10101 |
| XXXX | 7000 | 7005 | 10101 |
| XXXX | 7000 | 7006 | 10101 |
| XXXX | 7000 | 7007 | 10101 |
| XXXX | 7000 | 7008 | 10101 |
| XXXX | 7000 | 7009 | 10101 |
| XXXX | 7000 | 8001 | 10101 |
| XXXX | 8000 | 4006 | 10110 |
| XXXX | 8000 | 4007 | 10110 |
| XXXX | 8000 | 4008 | 10110 |
| XXXX | 8000 | 4009 | 10110 |
| XXXX | 8000 | 5001 | 10110 |
| XXXX | 8000 | 5002 | 10110 |
| XXXX | 8000 | 5003 | 10110 |
| XXXX | 8000 | 5004 | 10110 |
| XXXX | 8000 | 5005 | 10110 |
| XXXX | 8000 | 5006 | 10110 |
| XXXX | 8000 | 5007 | 10110 |
| XXXX | 8000 | 5008 | 10110 |
| XXXX | 8000 | 5009 | 10110 |
| XXXX | 8000 | 6001 | 10110 |
| XXXX | 8000 | 6002 | 10110 |
| XXXX | 8000 | 6003 | 10110 |
| XXXX | 8000 | 6004 | 10110 |
| XXXX | 8000 | 6005 | 10110 |
| XXXX | 8000 | 6006 | 10110 |
| XXXX | 8000 | 6007 | 10110 |
| XXXX | 8000 | 6008 | 10110 |
| XXXX | 8000 | 6009 | 10110 |
| XXXX | 8000 | 7001 | 10110 |
| XXXX | 8000 | 7002 | 10110 |
| XXXX | 8000 | 7003 | 10110 |

-continued

| Window Contents | | | X' |
|---|---|---|---|
| XXXX | 8000 | 7004 | 10110 |
| XXXX | 8000 | 7005 | 10110 |
| XXXX | 8000 | 7006 | 10110 |
| XXXX | 8000 | 7007 | 10110 |
| XXXX | 8000 | 7008 | 10110 |
| XXXX | 8000 | 7009 | 10110 |
| XXXX | 8000 | 8001 | 10110 |
| XXXX | 9000 | 4006 | 10111 |
| XXXX | 9000 | 4007 | 10111 |
| XXXX | 9000 | 4008 | 10111 |
| XXXX | 9000 | 4009 | 10111 |
| XXXX | 9000 | 5001 | 10111 |
| XXXX | 9000 | 5002 | 10111 |
| XXXX | 9000 | 5003 | 10111 |
| XXXX | 9000 | 5004 | 10111 |
| XXXX | 9000 | 5005 | 10111 |
| XXXX | 9000 | 5006 | 10111 |
| XXXX | 9000 | 5007 | 10111 |
| XXXX | 9000 | 5008 | 10111 |
| XXXX | 9000 | 5009 | 10111 |
| XXXX | 9000 | 6001 | 10111 |
| XXXX | 9000 | 6002 | 10111 |
| XXXX | 9000 | 6003 | 10111 |
| XXXX | 9000 | 6004 | 10111 |
| XXXX | 9000 | 6005 | 10111 |
| XXXX | 9000 | 6006 | 10111 |
| XXXX | 9000 | 6007 | 10111 |
| XXXX | 9000 | 6008 | 10111 |
| XXXX | 9000 | 6009 | 10111 |
| XXXX | 9000 | 7001 | 10111 |
| XXXX | 9000 | 7002 | 10111 |
| XXXX | 9000 | 7003 | 10111 |
| XXXX | 9000 | 7004 | 10111 |
| XXXX | 9000 | 7005 | 10111 |
| XXXX | 9000 | 7006 | 10111 |
| XXXX | 9000 | 7007 | 10111 |
| XXXX | 9000 | 7008 | 10111 |
| XXXX | 9000 | 7009 | 10111 |
| XXXX | 9000 | 8001 | 10111 |
| XXXX | 4000 | 8002 | 11000 |
| XXXX | 4000 | 8003 | 11000 |
| XXXX | 4000 | 8004 | 11000 |
| XXXX | 4000 | 8005 | 11000 |
| XXXX | 4000 | 8006 | 11000 |
| XXXX | 4000 | 8007 | 11000 |
| XXXX | 4000 | 8008 | 11000 |
| XXXX | 4000 | 8009 | 11000 |
| XXXX | 4000 | 9001 | 11000 |
| XXXX | 4000 | 9002 | 11000 |
| XXXX | 4000 | 9003 | 11000 |
| XXXX | 4000 | 9004 | 11000 |
| XXXX | 4000 | 9005 | 11000 |
| XXXX | 4000 | 9006 | 11000 |
| XXXX | 4000 | 9007 | 11000 |
| XXXX | 4000 | 9008 | 11000 |
| XXXX | 4000 | 9009 | 11000 |
| XXXX | 4000 | 1000 | 11000 |
| XXXX | 4000 | 2000 | 11000 |
| XXXX | 4000 | 3000 | 11000 |
| XXXX | 5000 | 8002 | 11001 |
| XXXX | 5000 | 8003 | 11001 |
| XXXX | 5000 | 8004 | 11001 |
| XXXX | 5000 | 8005 | 11001 |
| XXXX | 5000 | 8006 | 11001 |
| XXXX | 5000 | 8007 | 11001 |
| XXXX | 5000 | 8008 | 11001 |
| XXXX | 5000 | 8009 | 11001 |
| XXXX | 5000 | 9001 | 11001 |
| XXXX | 5000 | 9002 | 11001 |
| XXXX | 5000 | 9003 | 11001 |
| XXXX | 5000 | 9004 | 11001 |
| XXXX | 5000 | 9005 | 11001 |
| XXXX | 5000 | 9006 | 11001 |
| XXXX | 5000 | 9007 | 11001 |
| XXXX | 5000 | 9008 | 11001 |
| XXXX | 5000 | 9009 | 11001 |
| XXXX | 5000 | 1000 | 11001 |

-continued

| Window Contents | | | X' |
|---|---|---|---|
| XXXX | 5000 | 2000 | 11001 |
| XXXX | 5000 | 3000 | 11001 |
| XXXX | 6000 | 8002 | 11010 |
| XXXX | 6000 | 8003 | 11010 |
| XXXX | 6000 | 8004 | 11010 |
| XXXX | 6000 | 8005 | 11010 |
| XXXX | 6000 | 8006 | 11010 |
| XXXX | 6000 | 8007 | 11010 |
| XXXX | 6000 | 8008 | 11010 |
| XXXX | 6000 | 8009 | 11010 |
| XXXX | 6000 | 9001 | 11010 |
| XXXX | 6000 | 9002 | 11010 |
| XXXX | 6000 | 9003 | 11010 |
| XXXX | 6000 | 9004 | 11010 |
| XXXX | 6000 | 9005 | 11010 |
| XXXX | 6000 | 9006 | 11010 |
| XXXX | 6000 | 9007 | 11010 |
| XXXX | 6000 | 9008 | 11010 |
| XXXX | 6000 | 9009 | 11010 |
| XXXX | 6000 | 1000 | 11010 |
| XXXX | 6000 | 2000 | 11010 |
| XXXX | 6000 | 3000 | 11010 |
| XXXX | 7000 | 8002 | 11011 |
| XXXX | 7000 | 8003 | 11011 |
| XXXX | 7000 | 8004 | 11011 |
| XXXX | 7000 | 8005 | 11011 |
| XXXX | 7000 | 8006 | 11011 |
| XXXX | 7000 | 8007 | 11011 |
| XXXX | 7000 | 8008 | 11011 |
| XXXX | 7000 | 8009 | 11011 |
| XXXX | 7000 | 9001 | 11011 |
| XXXX | 7000 | 9002 | 11011 |
| XXXX | 7000 | 9003 | 11011 |
| XXXX | 7000 | 9004 | 11011 |
| XXXX | 7000 | 9005 | 11011 |
| XXXX | 7000 | 9006 | 11011 |
| XXXX | 7000 | 9007 | 11011 |
| XXXX | 7000 | 9008 | 11011 |
| XXXX | 7000 | 9009 | 11011 |
| XXXX | 7000 | 1000 | 11011 |
| XXXX | 7000 | 2000 | 11011 |
| XXXX | 7000 | 3000 | 11011 |
| XXXX | 8000 | 8002 | 11100 |
| XXXX | 8000 | 8003 | 11100 |
| XXXX | 8000 | 8004 | 11100 |
| XXXX | 8000 | 8005 | 11100 |
| XXXX | 8000 | 8006 | 11100 |
| XXXX | 8000 | 8007 | 11100 |
| XXXX | 8000 | 8008 | 11100 |
| XXXX | 8000 | 8009 | 11100 |
| XXXX | 8000 | 9001 | 11100 |
| XXXX | 8000 | 9002 | 11100 |
| XXXX | 8000 | 9003 | 11100 |
| XXXX | 8000 | 9004 | 11100 |
| XXXX | 8000 | 9005 | 11100 |
| XXXX | 8000 | 9006 | 11100 |
| XXXX | 8000 | 9007 | 11100 |
| XXXX | 8000 | 9008 | 11100 |
| XXXX | 8000 | 9009 | 11100 |
| XXXX | 8000 | 1000 | 11100 |
| XXXX | 8000 | 2000 | 11100 |
| XXXX | 8000 | 3000 | 11100 |
| XXXX | 9000 | 8002 | 11101 |
| XXXX | 9000 | 8003 | 11101 |
| XXXX | 9000 | 8004 | 11101 |
| XXXX | 9000 | 8005 | 11101 |
| XXXX | 9000 | 8006 | 11101 |
| XXXX | 9000 | 8007 | 11101 |
| XXXX | 9000 | 8008 | 11101 |
| XXXX | 9000 | 8009 | 11101 |
| XXXX | 9000 | 9001 | 11101 |
| XXXX | 9000 | 9002 | 11101 |
| XXXX | 9000 | 9003 | 11101 |
| XXXX | 9000 | 9004 | 11101 |
| XXXX | 9000 | 9005 | 11101 |
| XXXX | 9000 | 9006 | 11101 |
| XXXX | 9000 | 9007 | 11101 |

-continued

| Window Contents | | | X' |
|---|---|---|---|
| X X X X | 9 0 0 0 | 9 0 0 8 | 1 1 1 0 1 |
| X X X X | 9 0 0 0 | 9 0 0 9 | 1 1 1 0 1 |
| X X X X | 9 0 0 0 | 1 0 0 0 | 1 1 1 0 1 |
| X X X X | 9 0 0 0 | 2 0 0 0 | 1 1 1 0 1 |
| X X X X | 9 0 0 0 | 3 0 0 0 | 1 1 1 0 1 |
| X X X X | 0 8 0 0 | X X X X | 1 1 1 1 0 |
| X X X X | 0 9 0 0 | X X X X | 1 1 1 1 1. |

20. The system of claim 18, wherein said means for looking up comprises means for determining, using a squared euclidean distance, which table entry is identified by a sequence of code symbols.

21. The system of claim 15, further comprising means for modulating a signal with said waveform signal amplitudes to generate a series of features, each feature being at a level corresponding to a waveform signal amplitude; and wherein said waveform signal amplitudes modulate a transmitter and wherein said transmitter transmits said features over a communications channel.

22. A system for decoding data on a channel, wherein said data has been encoded using an M=10 (2,10) code, comprising:

means for reading the data to recover output waveform signal amplitudes;

means for converting said output waveform signal amplitudes into output code symbols, wherein each output code symbol is at one of ten levels; and means for decoding said output code symbols to obtain output data bits, wherein said output data bits correspond to the encoded data.

23. The system of claim 22, wherein said means for decoding comprises:

means for identifying with a sliding window a sequence of code symbols that represents a given code symbol set; and means for, in a table comprising a number of entries corresponding to a number of possible unique sequences of code symbols, each entry identified by one of said possible unique sequences of code symbols, and wherein each entry identifies an output data bit set that is a decoded data bit set for the code symbol set represented by the sequence of code symbols that identifies that entry, looking up with said identified sequence of code symbols the output data bit set for said given code symbol set.

24. The system of claim 23, wherein said table provides an output bit set x' for each sequence of code symbols y' according to the following table:

| Window Contents | | | X' |
|---|---|---|---|
| 0 0 0 X | 0 0 0 0 | 0 1 0 0 | 0 0 0 0 0 |
| 0 0 0 X | 0 0 0 0 | 0 2 0 0 | 0 0 0 0 0 |
| 0 0 0 X | 0 0 0 0 | 0 3 0 0 | 0 0 0 0 0 |
| 0 0 0 X | 0 0 0 0 | 0 4 0 0 | 0 0 0 0 0 |
| 0 0 0 X | 0 0 0 0 | 0 5 0 0 | 0 0 0 0 0 |
| 0 0 0 X | 0 0 0 0 | 0 6 0 0 | 0 0 0 0 0 |
| 0 0 0 X | 0 0 0 0 | 0 7 0 0 | 0 0 0 0 0 |
| 0 0 X 0 | 0 0 0 0 | 0 1 0 0 | 0 0 0 0 0 |
| 0 0 X 0 | 0 0 0 0 | 0 2 0 0 | 0 0 0 0 0 |

-continued

| Window Contents | | | X' |
|---|---|---|---|
| 0 0 X 0 | 0 0 0 0 | 0 3 0 0 | 0 0 0 0 0 |
| 0 0 X 0 | 0 0 0 0 | 0 4 0 0 | 0 0 0 0 0 |
| 0 0 X 0 | 0 0 0 0 | 0 5 0 0 | 0 0 0 0 0 |
| 0 0 X 0 | 0 0 0 0 | 0 6 0 0 | 0 0 0 0 0 |
| 0 0 X 0 | 0 0 0 0 | 0 7 0 0 | 0 0 0 0 0 |
| X 0 0 X | 0 0 0 0 | 0 1 0 0 | 0 0 0 0 0 |
| X 0 0 X | 0 0 0 0 | 0 2 0 0 | 0 0 0 0 0 |
| X 0 0 X | 0 0 0 0 | 0 3 0 0 | 0 0 0 0 0 |
| X 0 0 X | 0 0 0 0 | 0 4 0 0 | 0 0 0 0 0 |
| X 0 0 X | 0 0 0 0 | 0 5 0 0 | 0 0 0 0 0 |
| X 0 0 X | 0 0 0 0 | 0 6 0 0 | 0 0 0 0 0 |
| X 0 0 X | 0 0 0 0 | 0 7 0 0 | 0 0 0 0 0 |
| 0 0 0 X | 0 0 0 0 | 0 0 0 0 | 0 0 0 0 1 |
| 0 0 0 X | 0 0 0 0 | 0 0 X 0 | 0 0 0 0 1 |
| 0 0 0 X | 0 0 0 0 | 0 0 0 X | 0 0 0 0 1 |
| 0 0 X 0 | 0 0 0 0 | 0 0 0 0 | 0 0 0 0 1 |
| 0 0 X 0 | 0 0 0 0 | 0 0 X 0 | 0 0 0 0 1 |
| 0 0 X 0 | 0 0 0 0 | 0 0 0 X | 0 0 0 0 1 |
| X 0 0 X | 0 0 0 0 | 0 0 0 0 | 0 0 0 0 1 |
| X 0 0 X | 0 0 0 0 | 0 0 X 0 | 0 0 0 0 1 |
| X 0 0 X | 0 0 0 0 | 0 0 0 X | 0 0 0 0 1 |
| 0 0 0 X | 0 0 0 0 | 1 0 0 1 | 0 0 0 1 0 |
| 0 0 0 X | 0 0 0 0 | 1 0 0 2 | 0 0 0 1 0 |
| 0 0 0 X | 0 0 0 0 | 1 0 0 3 | 0 0 0 1 0 |
| 0 0 0 X | 0 0 0 0 | 1 0 0 4 | 0 0 0 1 0 |
| 0 0 0 X | 0 0 0 0 | 1 0 0 5 | 0 0 0 1 0 |
| 0 0 0 X | 0 0 0 0 | 1 0 0 6 | 0 0 0 1 0 |
| 0 0 0 X | 0 0 0 0 | 1 0 0 7 | 0 0 0 1 0 |
| 0 0 0 X | 0 0 0 0 | 1 0 0 8 | 0 0 0 1 0 |
| 0 0 0 X | 0 0 0 0 | 1 0 0 9 | 0 0 0 1 0 |
| 0 0 0 X | 0 0 0 0 | 2 0 0 1 | 0 0 0 1 0 |
| 0 0 0 X | 0 0 0 0 | 2 0 0 2 | 0 0 0 1 0 |
| 0 0 0 X | 0 0 0 0 | 2 0 0 3 | 0 0 0 1 0 |
| 0 0 0 X | 0 0 0 0 | 2 0 0 4 | 0 0 0 1 0 |
| 0 0 0 X | 0 0 0 0 | 2 0 0 5 | 0 0 0 1 0 |
| 0 0 0 X | 0 0 0 0 | 2 0 0 6 | 0 0 0 1 0 |
| 0 0 0 X | 0 0 0 0 | 2 0 0 7 | 0 0 0 1 0 |
| 0 0 0 X | 0 0 0 0 | 2 0 0 8 | 0 0 0 1 0 |
| 0 0 0 X | 0 0 0 0 | 2 0 0 9 | 0 0 0 1 0 |
| 0 0 0 X | 0 0 0 0 | 3 0 0 1 | 0 0 0 1 0 |
| 0 0 0 X | 0 0 0 0 | 3 0 0 2 | 0 0 0 1 0 |
| 0 0 0 X | 0 0 0 0 | 3 0 0 3 | 0 0 0 1 0 |
| 0 0 0 X | 0 0 0 0 | 3 0 0 4 | 0 0 0 1 0 |
| 0 0 0 X | 0 0 0 0 | 3 0 0 5 | 0 0 0 1 0 |
| 0 0 0 X | 0 0 0 0 | 3 0 0 6 | 0 0 0 1 0 |
| 0 0 0 X | 0 0 0 0 | 3 0 0 7 | 0 0 0 1 0 |
| 0 0 0 X | 0 0 0 0 | 3 0 0 8 | 0 0 0 1 0 |
| 0 0 0 X | 0 0 0 0 | 3 0 0 9 | 0 0 0 1 0 |
| 0 0 0 X | 0 0 0 0 | 4 0 0 1 | 0 0 0 1 0 |
| 0 0 0 X | 0 0 0 0 | 4 0 0 2 | 0 0 0 1 0 |
| 0 0 0 X | 0 0 0 0 | 4 0 0 3 | 0 0 0 1 0 |
| 0 0 0 X | 0 0 0 0 | 4 0 0 4 | 0 0 0 1 0 |
| 0 0 0 X | 0 0 0 0 | 4 0 0 5 | 0 0 0 1 0 |
| 0 0 X 0 | 0 0 0 0 | 1 0 0 1 | 0 0 0 1 0 |
| 0 0 X 0 | 0 0 0 0 | 1 0 0 2 | 0 0 0 1 0 |
| 0 0 X 0 | 0 0 0 0 | 1 0 0 3 | 0 0 0 1 0 |
| 0 0 X 0 | 0 0 0 0 | 1 0 0 4 | 0 0 0 1 0 |
| 0 0 X 0 | 0 0 0 0 | 1 0 0 5 | 0 0 0 1 0 |
| 0 0 X 0 | 0 0 0 0 | 1 0 0 6 | 0 0 0 1 0 |
| 0 0 X 0 | 0 0 0 0 | 1 0 0 7 | 0 0 0 1 0 |
| 0 0 X 0 | 0 0 0 0 | 1 0 0 8 | 0 0 0 1 0 |
| 0 0 X 0 | 0 0 0 0 | 1 0 0 9 | 0 0 0 1 0 |
| 0 0 X 0 | 0 0 0 0 | 2 0 0 1 | 0 0 0 1 0 |
| 0 0 X 0 | 0 0 0 0 | 2 0 0 2 | 0 0 0 1 0 |
| 0 0 X 0 | 0 0 0 0 | 2 0 0 3 | 0 0 0 1 0 |
| 0 0 X 0 | 0 0 0 0 | 2 0 0 4 | 0 0 0 1 0 |
| 0 0 X 0 | 0 0 0 0 | 2 0 0 5 | 0 0 0 1 0 |
| 0 0 X 0 | 0 0 0 0 | 2 0 0 6 | 0 0 0 1 0 |
| 0 0 X 0 | 0 0 0 0 | 2 0 0 7 | 0 0 0 1 0 |
| 0 0 X 0 | 0 0 0 0 | 2 0 0 8 | 0 0 0 1 0 |
| 0 0 X 0 | 0 0 0 0 | 2 0 0 9 | 0 0 0 1 0 |
| 0 0 X 0 | 0 0 0 0 | 3 0 0 1 | 0 0 0 1 0 |
| 0 0 X 0 | 0 0 0 0 | 3 0 0 2 | 0 0 0 1 0 |
| 0 0 X 0 | 0 0 0 0 | 3 0 0 3 | 0 0 0 1 0 |
| 0 0 X 0 | 0 0 0 0 | 3 0 0 4 | 0 0 0 1 0 |
| 0 0 X 0 | 0 0 0 0 | 3 0 0 5 | 0 0 0 1 0 |
| 0 0 X 0 | 0 0 0 0 | 3 0 0 6 | 0 0 0 1 0 |

-continued

| Window Contents | | | X' |
|---|---|---|---|
| 0 0 X 0 | 0 0 0 0 | 3 0 0 7 | 0 0 0 1 0 |
| 0 0 X 0 | 0 0 0 0 | 3 0 0 8 | 0 0 0 1 0 |
| 0 0 X 0 | 0 0 0 0 | 3 0 0 9 | 0 0 0 1 0 |
| 0 0 X 0 | 0 0 0 0 | 4 0 0 1 | 0 0 0 1 0 |
| 0 0 X 0 | 0 0 0 0 | 4 0 0 2 | 0 0 0 1 0 |
| 0 0 X 0 | 0 0 0 0 | 4 0 0 3 | 0 0 0 1 0 |
| 0 0 X 0 | 0 0 0 0 | 4 0 0 4 | 0 0 0 1 0 |
| 0 0 X 0 | 0 0 0 0 | 4 0 0 5 | 0 0 0 1 0 |
| X 0 0 X | 0 0 0 0 | 1 0 0 1 | 0 0 0 1 0 |
| X 0 0 X | 0 0 0 0 | 1 0 0 2 | 0 0 0 1 0 |
| X 0 0 X | 0 0 0 0 | 1 0 0 3 | 0 0 0 1 0 |
| X 0 0 X | 0 0 0 0 | 1 0 0 4 | 0 0 0 1 0 |
| X 0 0 X | 0 0 0 0 | 1 0 0 5 | 0 0 0 1 0 |
| X 0 0 X | 0 0 0 0 | 1 0 0 6 | 0 0 0 1 0 |
| X 0 0 X | 0 0 0 0 | 1 0 0 7 | 0 0 0 1 0 |
| X 0 0 X | 0 0 0 0 | 1 0 0 8 | 0 0 0 1 0 |
| X 0 0 X | 0 0 0 0 | 1 0 0 9 | 0 0 0 1 0 |
| X 0 0 X | 0 0 0 0 | 2 0 0 1 | 0 0 0 1 0 |
| X 0 0 X | 0 0 0 0 | 2 0 0 2 | 0 0 0 1 0 |
| X 0 0 X | 0 0 0 0 | 2 0 0 3 | 0 0 0 1 0 |
| X 0 0 X | 0 0 0 0 | 2 0 0 4 | 0 0 0 1 0 |
| X 0 0 X | 0 0 0 0 | 2 0 0 5 | 0 0 0 1 0 |
| X 0 0 X | 0 0 0 0 | 2 0 0 6 | 0 0 0 1 0 |
| X 0 0 X | 0 0 0 0 | 2 0 0 7 | 0 0 0 1 0 |
| X 0 0 X | 0 0 0 0 | 2 0 0 8 | 0 0 0 1 0 |
| X 0 0 X | 0 0 0 0 | 2 0 0 9 | 0 0 0 1 0 |
| X 0 0 X | 0 0 0 0 | 3 0 0 1 | 0 0 0 1 0 |
| X 0 0 X | 0 0 0 0 | 3 0 0 2 | 0 0 0 1 0 |
| X 0 0 X | 0 0 0 0 | 3 0 0 3 | 0 0 0 1 0 |
| X 0 0 X | 0 0 0 0 | 3 0 0 4 | 0 0 0 1 0 |
| X 0 0 X | 0 0 0 0 | 3 0 0 5 | 0 0 0 1 0 |
| X 0 0 X | 0 0 0 0 | 3 0 0 6 | 0 0 0 1 0 |
| X 0 0 X | 0 0 0 0 | 3 0 0 7 | 0 0 0 1 0 |
| X 0 0 X | 0 0 0 0 | 3 0 0 8 | 0 0 0 1 0 |
| X 0 0 X | 0 0 0 0 | 3 0 0 9 | 0 0 0 1 0 |
| X 0 0 X | 0 0 0 0 | 4 0 0 1 | 0 0 0 1 0 |
| X 0 0 X | 0 0 0 0 | 4 0 0 2 | 0 0 0 1 0 |
| X 0 0 X | 0 0 0 0 | 4 0 0 3 | 0 0 0 1 0 |
| X 0 0 X | 0 0 0 0 | 4 0 0 4 | 0 0 0 1 0 |
| X 0 0 X | 0 0 0 0 | 4 0 0 5 | 0 0 0 1 0 |
| 0 0 0 X | 0 0 0 0 | 4 0 0 6 | 0 0 0 1 1 |
| 0 0 0 X | 0 0 0 0 | 4 0 0 7 | 0 0 0 1 1 |
| 0 0 0 X | 0 0 0 0 | 4 0 0 8 | 0 0 0 1 1 |
| 0 0 0 X | 0 0 0 0 | 4 0 0 9 | 0 0 0 1 1 |
| 0 0 0 X | 0 0 0 0 | 5 0 0 1 | 0 0 0 1 1 |
| 0 0 0 X | 0 0 0 0 | 5 0 0 2 | 0 0 0 1 1 |
| 0 0 0 X | 0 0 0 0 | 5 0 0 3 | 0 0 0 1 1 |
| 0 0 0 X | 0 0 0 0 | 5 0 0 4 | 0 0 0 1 1 |
| 0 0 0 X | 0 0 0 0 | 5 0 0 5 | 0 0 0 1 1 |
| 0 0 0 X | 0 0 0 0 | 5 0 0 6 | 0 0 0 1 1 |
| 0 0 0 X | 0 0 0 0 | 5 0 0 7 | 0 0 0 1 1 |
| 0 0 0 X | 0 0 0 0 | 5 0 0 8 | 0 0 0 1 1 |
| 0 0 0 X | 0 0 0 0 | 5 0 0 9 | 0 0 0 1 1 |
| 0 0 0 X | 0 0 0 0 | 6 0 0 1 | 0 0 0 1 1 |
| 0 0 0 X | 0 0 0 0 | 6 0 0 2 | 0 0 0 1 1 |
| 0 0 0 X | 0 0 0 0 | 6 0 0 3 | 0 0 0 1 1 |
| 0 0 0 X | 0 0 0 0 | 6 0 0 4 | 0 0 0 1 1 |
| 0 0 0 X | 0 0 0 0 | 6 0 0 5 | 0 0 0 1 1 |
| 0 0 0 X | 0 0 0 0 | 6 0 0 6 | 0 0 0 1 1 |
| 0 0 0 X | 0 0 0 0 | 6 0 0 7 | 0 0 0 1 1 |
| 0 0 0 X | 0 0 0 0 | 6 0 0 8 | 0 0 0 1 1 |
| 0 0 0 X | 0 0 0 0 | 6 0 0 9 | 0 0 0 1 1 |
| 0 0 0 X | 0 0 0 0 | 7 0 0 1 | 0 0 0 1 1 |
| 0 0 0 X | 0 0 0 0 | 7 0 0 2 | 0 0 0 1 1 |
| 0 0 0 X | 0 0 0 0 | 7 0 0 3 | 0 0 0 1 1 |
| 0 0 0 X | 0 0 0 0 | 7 0 0 4 | 0 0 0 1 1 |
| 0 0 0 X | 0 0 0 0 | 7 0 0 5 | 0 0 0 1 1 |
| 0 0 0 X | 0 0 0 0 | 7 0 0 6 | 0 0 0 1 1 |
| 0 0 0 X | 0 0 0 0 | 7 0 0 7 | 0 0 0 1 1 |
| 0 0 0 X | 0 0 0 0 | 7 0 0 8 | 0 0 0 1 1 |
| 0 0 0 X | 0 0 0 0 | 7 0 0 9 | 0 0 0 1 1 |
| 0 0 0 X | 0 0 0 0 | 8 0 0 1 | 0 0 0 1 1 |
| 0 0 X 0 | 0 0 0 0 | 4 0 0 6 | 0 0 0 1 1 |
| 0 0 X 0 | 0 0 0 0 | 4 0 0 7 | 0 0 0 1 1 |
| 0 0 X 0 | 0 0 0 0 | 4 0 0 8 | 0 0 0 1 1 |
| 0 0 X 0 | 0 0 0 0 | 4 0 0 9 | 0 0 0 1 1 |
| 0 0 X 0 | 0 0 0 0 | 5 0 0 1 | 0 0 0 1 1 |

-continued

| Window Contents | | | X' |
|---|---|---|---|
| 0 0 X 0 | 0 0 0 0 | 5 0 0 2 | 0 0 0 1 1 |
| 0 0 X 0 | 0 0 0 0 | 5 0 0 3 | 0 0 0 1 1 |
| 0 0 X 0 | 0 0 0 0 | 5 0 0 4 | 0 0 0 1 1 |
| 0 0 X 0 | 0 0 0 0 | 5 0 0 5 | 0 0 0 1 1 |
| 0 0 X 0 | 0 0 0 0 | 5 0 0 6 | 0 0 0 1 1 |
| 0 0 X 0 | 0 0 0 0 | 5 0 0 7 | 0 0 0 1 1 |
| 0 0 X 0 | 0 0 0 0 | 5 0 0 8 | 0 0 0 1 1 |
| 0 0 X 0 | 0 0 0 0 | 5 0 0 9 | 0 0 0 1 1 |
| 0 0 X 0 | 0 0 0 0 | 6 0 0 1 | 0 0 0 1 1 |
| 0 0 X 0 | 0 0 0 0 | 6 0 0 2 | 0 0 0 1 1 |
| 0 0 X 0 | 0 0 0 0 | 6 0 0 3 | 0 0 0 1 1 |
| 0 0 X 0 | 0 0 0 0 | 6 0 0 4 | 0 0 0 1 1 |
| 0 0 X 0 | 0 0 0 0 | 6 0 0 5 | 0 0 0 1 1 |
| 0 0 X 0 | 0 0 0 0 | 6 0 0 6 | 0 0 0 1 1 |
| 0 0 X 0 | 0 0 0 0 | 6 0 0 7 | 0 0 0 1 1 |
| 0 0 X 0 | 0 0 0 0 | 6 0 0 8 | 0 0 0 1 1 |
| 0 0 X 0 | 0 0 0 0 | 6 0 0 9 | 0 0 0 1 1 |
| 0 0 X 0 | 0 0 0 0 | 7 0 0 1 | 0 0 0 1 1 |
| 0 0 X 0 | 0 0 0 0 | 7 0 0 2 | 0 0 0 1 1 |
| 0 0 X 0 | 0 0 0 0 | 7 0 0 3 | 0 0 0 1 1 |
| 0 0 X 0 | 0 0 0 0 | 7 0 0 4 | 0 0 0 1 1 |
| 0 0 X 0 | 0 0 0 0 | 7 0 0 5 | 0 0 0 1 1 |
| 0 0 X 0 | 0 0 0 0 | 7 0 0 6 | 0 0 0 1 1 |
| 0 0 X 0 | 0 0 0 0 | 7 0 0 7 | 0 0 0 1 1 |
| 0 0 X 0 | 0 0 0 0 | 7 0 0 8 | 0 0 0 1 1 |
| 0 0 X 0 | 0 0 0 0 | 7 0 0 9 | 0 0 0 1 1 |
| 0 0 X 0 | 0 0 0 0 | 8 0 0 1 | 0 0 0 1 1 |
| X 0 0 X | 0 0 0 0 | 4 0 0 6 | 0 0 0 1 1 |
| X 0 0 X | 0 0 0 0 | 4 0 0 7 | 0 0 0 1 1 |
| X 0 0 X | 0 0 0 0 | 4 0 0 8 | 0 0 0 1 1 |
| X 0 0 X | 0 0 0 0 | 4 0 0 9 | 0 0 0 1 1 |
| X 0 0 X | 0 0 0 0 | 5 0 0 1 | 0 0 0 1 1 |
| X 0 0 X | 0 0 0 0 | 5 0 0 2 | 0 0 0 1 1 |
| X 0 0 X | 0 0 0 0 | 5 0 0 3 | 0 0 0 1 1 |
| X 0 0 X | 0 0 0 0 | 5 0 0 4 | 0 0 0 1 1 |
| X 0 0 X | 0 0 0 0 | 5 0 0 5 | 0 0 0 1 1 |
| X 0 0 X | 0 0 0 0 | 5 0 0 6 | 0 0 0 1 1 |
| X 0 0 X | 0 0 0 0 | 5 0 0 7 | 0 0 0 1 1 |
| X 0 0 X | 0 0 0 0 | 5 0 0 8 | 0 0 0 1 1 |
| X 0 0 X | 0 0 0 0 | 5 0 0 9 | 0 0 0 1 1 |
| X 0 0 X | 0 0 0 0 | 6 0 0 1 | 0 0 0 1 1 |
| X 0 0 X | 0 0 0 0 | 6 0 0 2 | 0 0 0 1 1 |
| X 0 0 X | 0 0 0 0 | 6 0 0 3 | 0 0 0 1 1 |
| X 0 0 X | 0 0 0 0 | 6 0 0 4 | 0 0 0 1 1 |
| X 0 0 X | 0 0 0 0 | 6 0 0 5 | 0 0 0 1 1 |
| X 0 0 X | 0 0 0 0 | 6 0 0 6 | 0 0 0 1 1 |
| X 0 0 X | 0 0 0 0 | 6 0 0 7 | 0 0 0 1 1 |
| X 0 0 X | 0 0 0 0 | 6 0 0 8 | 0 0 0 1 1 |
| X 0 0 X | 0 0 0 0 | 6 0 0 9 | 0 0 0 1 1 |
| X 0 0 X | 0 0 0 0 | 7 0 0 1 | 0 0 0 1 1 |
| X 0 0 X | 0 0 0 0 | 7 0 0 2 | 0 0 0 1 1 |
| X 0 0 X | 0 0 0 0 | 7 0 0 3 | 0 0 0 1 1 |
| X 0 0 X | 0 0 0 0 | 7 0 0 4 | 0 0 0 1 1 |
| X 0 0 X | 0 0 0 0 | 7 0 0 5 | 0 0 0 1 1 |
| X 0 0 X | 0 0 0 0 | 7 0 0 6 | 0 0 0 1 1 |
| X 0 0 X | 0 0 0 0 | 7 0 0 7 | 0 0 0 1 1 |
| X 0 0 X | 0 0 0 0 | 7 0 0 8 | 0 0 0 1 1 |
| X 0 0 X | 0 0 0 0 | 7 0 0 9 | 0 0 0 1 1 |
| X 0 0 X | 0 0 0 0 | 8 0 0 1 | 0 0 0 1 1 |
| 0 0 0 X | 0 0 0 0 | 8 0 0 2 | 0 0 1 0 0 |
| 0 0 0 X | 0 0 0 0 | 8 0 0 3 | 0 0 1 0 0 |
| 0 0 0 X | 0 0 0 0 | 8 0 0 4 | 0 0 1 0 0 |
| 0 0 0 X | 0 0 0 0 | 8 0 0 5 | 0 0 1 0 0 |
| 0 0 0 X | 0 0 0 0 | 8 0 0 6 | 0 0 1 0 0 |
| 0 0 0 X | 0 0 0 0 | 8 0 0 7 | 0 0 1 0 0 |
| 0 0 0 X | 0 0 0 0 | 8 0 0 8 | 0 0 1 0 0 |
| 0 0 0 X | 0 0 0 0 | 8 0 0 9 | 0 0 1 0 0 |
| 0 0 0 X | 0 0 0 0 | 9 0 0 1 | 0 0 1 0 0 |
| 0 0 0 X | 0 0 0 0 | 9 0 0 2 | 0 0 1 0 0 |
| 0 0 0 X | 0 0 0 0 | 9 0 0 3 | 0 0 1 0 0 |
| 0 0 0 X | 0 0 0 0 | 9 0 0 4 | 0 0 1 0 0 |
| 0 0 0 X | 0 0 0 0 | 9 0 0 5 | 0 0 1 0 0 |
| 0 0 0 X | 0 0 0 0 | 9 0 0 6 | 0 0 1 0 0 |
| 0 0 0 X | 0 0 0 0 | 9 0 0 7 | 0 0 1 0 0 |
| 0 0 0 X | 0 0 0 0 | 9 0 0 8 | 0 0 1 0 0 |
| 0 0 0 X | 0 0 0 0 | 9 0 0 9 | 0 0 1 0 0 |
| 0 0 0 X | 0 0 0 0 | 1 0 0 0 | 0 0 1 0 0 |

-continued

| Window Contents | | | X' |
|---|---|---|---|
| 0 0 0 X | 0 0 0 0 | 2 0 0 0 | 0 0 1 0 0 |
| 0 0 0 X | 0 0 0 0 | 3 0 0 0 | 0 0 1 0 0 |
| 0 0 X 0 | 0 0 0 0 | 8 0 0 2 | 0 0 1 0 0 |
| 0 0 X 0 | 0 0 0 0 | 8 0 0 3 | 0 0 1 0 0 |
| 0 0 X 0 | 0 0 0 0 | 8 0 0 4 | 0 0 1 0 0 |
| 0 0 X 0 | 0 0 0 0 | 8 0 0 5 | 0 0 1 0 0 |
| 0 0 X 0 | 0 0 0 0 | 8 0 0 6 | 0 0 1 0 0 |
| 0 0 X 0 | 0 0 0 0 | 8 0 0 7 | 0 0 1 0 0 |
| 0 0 X 0 | 0 0 0 0 | 8 0 0 8 | 0 0 1 0 0 |
| 0 0 X 0 | 0 0 0 0 | 8 0 0 9 | 0 0 1 0 0 |
| 0 0 X 0 | 0 0 0 0 | 9 0 0 1 | 0 0 1 0 0 |
| 0 0 X 0 | 0 0 0 0 | 9 0 0 2 | 0 0 1 0 0 |
| 0 0 X 0 | 0 0 0 0 | 9 0 0 3 | 0 0 1 0 0 |
| 0 0 X 0 | 0 0 0 0 | 9 0 0 4 | 0 0 1 0 0 |
| 0 0 X 0 | 0 0 0 0 | 9 0 0 5 | 0 0 1 0 0 |
| 0 0 X 0 | 0 0 0 0 | 9 0 0 6 | 0 0 1 0 0 |
| 0 0 X 0 | 0 0 0 0 | 9 0 0 7 | 0 0 1 0 0 |
| 0 0 X 0 | 0 0 0 0 | 9 0 0 8 | 0 0 1 0 0 |
| 0 0 X 0 | 0 0 0 0 | 9 0 0 9 | 0 0 1 0 0 |
| 0 0 X 0 | 0 0 0 0 | 1 0 0 0 | 0 0 1 0 0 |
| 0 0 X 0 | 0 0 0 0 | 2 0 0 0 | 0 0 1 0 0 |
| 0 0 X 0 | 0 0 0 0 | 3 0 0 0 | 0 0 1 0 0 |
| X 0 0 X | 0 0 0 0 | 8 0 0 2 | 0 0 1 0 0 |
| X 0 0 X | 0 0 0 0 | 8 0 0 3 | 0 0 1 0 0 |
| X 0 0 X | 0 0 0 0 | 8 0 0 4 | 0 0 1 0 0 |
| X 0 0 X | 0 0 0 0 | 8 0 0 5 | 0 0 1 0 0 |
| X 0 0 X | 0 0 0 0 | 8 0 0 6 | 0 0 1 0 0 |
| X 0 0 X | 0 0 0 0 | 8 0 0 7 | 0 0 1 0 0 |
| X 0 0 X | 0 0 0 0 | 8 0 0 8 | 0 0 1 0 0 |
| X 0 0 X | 0 0 0 0 | 8 0 0 9 | 0 0 1 0 0 |
| X 0 0 X | 0 0 0 0 | 9 0 0 1 | 0 0 1 0 0 |
| X 0 0 X | 0 0 0 0 | 9 0 0 2 | 0 0 1 0 0 |
| X 0 0 X | 0 0 0 0 | 9 0 0 3 | 0 0 1 0 0 |
| X 0 0 X | 0 0 0 0 | 9 0 0 4 | 0 0 1 0 0 |
| X 0 0 X | 0 0 0 0 | 9 0 0 5 | 0 0 1 0 0 |
| X 0 0 X | 0 0 0 0 | 9 0 0 6 | 0 0 1 0 0 |
| X 0 0 X | 0 0 0 0 | 9 0 0 7 | 0 0 1 0 0 |
| X 0 0 X | 0 0 0 0 | 9 0 0 8 | 0 0 1 0 0 |
| X 0 0 X | 0 0 0 0 | 9 0 0 9 | 0 0 1 0 0 |
| X 0 0 X | 0 0 0 0 | 1 0 0 0 | 0 0 1 0 0 |
| X 0 0 X | 0 0 0 0 | 2 0 0 0 | 0 0 1 0 0 |
| X 0 0 X | 0 0 0 0 | 3 0 0 0 | 0 0 1 0 0 |
| X X X X | 0 0 0 1 | X X X X | 0 0 1 0 1 |
| X X X X | 0 0 0 2 | X X X X | 0 0 1 1 0 |
| X X X X | 0 0 0 3 | X X X X | 0 0 1 1 1 |
| X X X X | 0 0 0 4 | X X X X | 0 1 0 0 0 |
| X X X X | 0 0 0 5 | X X X X | 0 1 0 0 1 |
| X X X X | 0 0 0 6 | X X X X | 0 1 0 1 0 |
| X X X X | 0 0 0 7 | X X X X | 0 1 0 1 1 |
| X X X X | 0 0 0 8 | X X X X | 0 1 1 0 0 |
| X X X X | 0 0 0 9 | X X X X | 0 1 1 0 1 |
| X X X X | 0 0 1 0 | 0 0 0 0 | 0 1 1 1 0 |
| X X X X | 0 0 1 0 | 0 0 X 0 | 0 1 1 1 0 |
| X X X X | 0 0 1 0 | 0 0 0 X | 0 1 1 1 0 |
| X X X X | 0 0 2 0 | 0 0 0 0 | 0 1 1 1 1 |
| X X X X | 0 0 2 0 | 0 0 X 0 | 0 1 1 1 1 |
| X X X X | 0 0 2 0 | 0 0 0 X | 0 1 1 1 1 |
| X X X X | 0 0 3 0 | 0 0 0 0 | 1 0 0 0 0 |
| X X X X | 0 0 3 0 | 0 0 X 0 | 1 0 0 0 0 |
| X X X X | 0 0 3 0 | 0 0 0 X | 1 0 0 0 0 |
| X X X X | 0 0 4 0 | 0 0 0 0 | 1 0 0 0 1 |
| X X X X | 0 0 4 0 | 0 0 X 0 | 1 0 0 0 1 |
| X X X X | 0 0 4 0 | 0 0 0 X | 1 0 0 0 1 |
| X X X X | 0 0 5 0 | 0 0 0 0 | 1 0 0 1 0 |
| X X X X | 0 0 5 0 | 0 0 X 0 | 1 0 0 1 0 |
| X X X X | 0 0 5 0 | 0 0 0 X | 1 0 0 1 0 |
| X X X X | 0 0 6 0 | 0 0 0 0 | 1 0 0 1 1 |
| X X X X | 0 0 6 0 | 0 0 X 0 | 1 0 0 1 1 |
| X X X X | 0 0 6 0 | 0 0 0 X | 1 0 0 1 1 |
| X X X X | 0 0 7 0 | 0 0 0 0 | 1 0 1 0 0 |
| X X X X | 0 0 7 0 | 0 0 X 0 | 1 0 1 0 0 |
| X X X X | 0 0 7 0 | 0 0 0 X | 1 0 1 0 0 |
| X X X X | 0 0 8 0 | 0 0 0 0 | 1 0 1 0 1 |
| X X X X | 0 0 8 0 | 0 0 X 0 | 1 0 1 0 1 |
| X X X X | 0 0 8 0 | 0 0 0 X | 1 0 1 0 1 |
| X X X X | 0 0 9 0 | 0 0 0 0 | 1 0 1 1 0 |
| X X X X | 0 0 9 0 | 0 0 X 0 | 1 0 1 1 0 |

-continued

| Window Contents | | | X' |
|---|---|---|---|
| X X X X | 0 0 9 0 | 0 0 0 X | 1 0 1 1 0 |
| X X X X | 0 0 1 0 | 0 1 0 0 | 1 0 1 1 1 |
| X X X X | 0 0 1 0 | 0 2 0 0 | 1 0 1 1 1 |
| X X X X | 0 0 1 0 | 0 3 0 0 | 1 0 1 1 1 |
| X X X X | 0 0 1 0 | 0 4 0 0 | 1 0 1 1 1 |
| X X X X | 0 0 1 0 | 0 5 0 0 | 1 0 1 1 1 |
| X X X X | 0 0 1 0 | 0 6 0 0 | 1 0 1 1 1 |
| X X X X | 0 0 1 0 | 0 7 0 0 | 1 0 1 1 1 |
| X X X X | 0 0 2 0 | 0 1 0 0 | 1 1 0 0 0 |
| X X X X | 0 0 2 0 | 0 2 0 0 | 1 1 0 0 0 |
| X X X X | 0 0 2 0 | 0 3 0 0 | 1 1 0 0 0 |
| X X X X | 0 0 2 0 | 0 4 0 0 | 1 1 0 0 0 |
| X X X X | 0 0 2 0 | 0 5 0 0 | 1 1 0 0 0 |
| X X X X | 0 0 2 0 | 0 6 0 0 | 1 1 0 0 0 |
| X X X X | 0 0 2 0 | 0 7 0 0 | 1 1 0 0 0 |
| X X X X | 0 0 3 0 | 0 1 0 0 | 1 1 0 0 1 |
| X X X X | 0 0 3 0 | 0 2 0 0 | 1 1 0 0 1 |
| X X X X | 0 0 3 0 | 0 3 0 0 | 1 1 0 0 1 |
| X X X X | 0 0 3 0 | 0 4 0 0 | 1 1 0 0 1 |
| X X X X | 0 0 3 0 | 0 5 0 0 | 1 1 0 0 1 |
| X X X X | 0 0 3 0 | 0 6 0 0 | 1 1 0 0 1 |
| X X X X | 0 0 3 0 | 0 7 0 0 | 1 1 0 0 1 |
| X X X X | 0 0 4 0 | 0 1 0 0 | 1 1 0 1 0 |
| X X X X | 0 0 4 0 | 0 2 0 0 | 1 1 0 1 0 |
| X X X X | 0 0 4 0 | 0 3 0 0 | 1 1 0 1 0 |
| X X X X | 0 0 4 0 | 0 4 0 0 | 1 1 0 1 0 |
| X X X X | 0 0 4 0 | 0 5 0 0 | 1 1 0 1 0 |
| X X X X | 0 0 4 0 | 0 6 0 0 | 1 1 0 1 0 |
| X X X X | 0 0 4 0 | 0 7 0 0 | 1 1 0 1 0 |
| X X X X | 0 0 5 0 | 0 1 0 0 | 1 1 0 1 1 |
| X X X X | 0 0 5 0 | 0 2 0 0 | 1 1 0 1 1 |
| X X X X | 0 0 5 0 | 0 3 0 0 | 1 1 0 1 1 |
| X X X X | 0 0 5 0 | 0 4 0 0 | 1 1 0 1 1 |
| X X X X | 0 0 5 0 | 0 5 0 0 | 1 1 0 1 1 |
| X X X X | 0 0 5 0 | 0 6 0 0 | 1 1 0 1 1 |
| X X X X | 0 0 5 0 | 0 7 0 0 | 1 1 0 1 1 |
| X X X X | 0 0 6 0 | 0 1 0 0 | 1 1 1 0 0 |
| X X X X | 0 0 6 0 | 0 2 0 0 | 1 1 1 0 0 |
| X X X X | 0 0 6 0 | 0 3 0 0 | 1 1 1 0 0 |
| X X X X | 0 0 6 0 | 0 4 0 0 | 1 1 1 0 0 |
| X X X X | 0 0 6 0 | 0 5 0 0 | 1 1 1 0 0 |
| X X X X | 0 0 6 0 | 0 6 0 0 | 1 1 1 0 0 |
| X X X X | 0 0 6 0 | 0 7 0 0 | 1 1 1 0 0 |
| X X X X | 0 0 7 0 | 0 1 0 0 | 1 1 1 0 1 |
| X X X X | 0 0 7 0 | 0 2 0 0 | 1 1 1 0 1 |
| X X X X | 0 0 7 0 | 0 3 0 0 | 1 1 1 0 1 |
| X X X X | 0 0 7 0 | 0 4 0 0 | 1 1 1 0 1 |
| X X X X | 0 0 7 0 | 0 5 0 0 | 1 1 1 0 1 |
| X X X X | 0 0 7 0 | 0 6 0 0 | 1 1 1 0 1 |
| X X X X | 0 0 7 0 | 0 7 0 0 | 1 1 1 0 1 |
| X X X X | 0 0 8 0 | 0 1 0 0 | 1 1 1 1 0 |
| X X X X | 0 0 8 0 | 0 2 0 0 | 1 1 1 1 0 |
| X X X X | 0 0 8 0 | 0 3 0 0 | 1 1 1 1 0 |
| X X X X | 0 0 8 0 | 0 4 0 0 | 1 1 1 1 0 |
| X X X X | 0 0 8 0 | 0 5 0 0 | 1 1 1 1 0 |
| X X X X | 0 0 8 0 | 0 6 0 0 | 1 1 1 1 0 |
| X X X X | 0 0 8 0 | 0 7 0 0 | 1 1 1 1 0 |
| X X X X | 0 0 9 0 | 0 1 0 0 | 1 1 1 1 1 |
| X X X X | 0 0 9 0 | 0 2 0 0 | 1 1 1 1 1 |
| X X X X | 0 0 9 0 | 0 3 0 0 | 1 1 1 1 1 |
| X X X X | 0 0 9 0 | 0 4 0 0 | 1 1 1 1 1 |
| X X X X | 0 0 9 0 | 0 5 0 0 | 1 1 1 1 1 |
| X X X X | 0 0 9 0 | 0 6 0 0 | 1 1 1 1 1 |
| X X X X | 0 0 9 0 | 0 7 0 0 | 1 1 1 1 1 |
| X X X X | 0 1 0 0 | 0 1 0 0 | 0 0 0 0 0 |
| X X X X | 0 1 0 0 | 0 2 0 0 | 0 0 0 0 0 |
| X X X X | 0 1 0 0 | 0 3 0 0 | 0 0 0 0 0 |
| X X X X | 0 1 0 0 | 0 4 0 0 | 0 0 0 0 0 |
| X X X X | 0 1 0 0 | 0 5 0 0 | 0 0 0 0 0 |
| X X X X | 0 1 0 0 | 0 6 0 0 | 0 0 0 0 0 |
| X X X X | 0 1 0 0 | 0 7 0 0 | 0 0 0 0 0 |
| X X X X | 0 2 0 0 | 0 1 0 0 | 0 0 0 0 1 |
| X X X X | 0 2 0 0 | 0 2 0 0 | 0 0 0 0 1 |
| X X X X | 0 2 0 0 | 0 3 0 0 | 0 0 0 0 1 |
| X X X X | 0 2 0 0 | 0 4 0 0 | 0 0 0 0 1 |
| X X X X | 0 2 0 0 | 0 5 0 0 | 0 0 0 0 1 |
| X X X X | 0 2 0 0 | 0 6 0 0 | 0 0 0 0 1 |

-continued

| Window Contents | | | X' |
|---|---|---|---|
| XXXX | 0200 | 0700 | 00001 |
| XXXX | 0300 | 0100 | 00010 |
| XXXX | 0300 | 0200 | 00010 |
| XXXX | 0300 | 0300 | 00010 |
| XXXX | 0300 | 0400 | 00010 |
| XXXX | 0300 | 0500 | 00010 |
| XXXX | 0300 | 0600 | 00010 |
| XXXX | 0300 | 0700 | 00010 |
| XXXX | 0400 | 0100 | 00011 |
| XXXX | 0400 | 0200 | 00011 |
| XXXX | 0400 | 0300 | 00011 |
| XXXX | 0400 | 0400 | 00011 |
| XXXX | 0400 | 0500 | 00011 |
| XXXX | 0400 | 0600 | 00011 |
| XXXX | 0400 | 0700 | 00011 |
| XXXX | 0500 | 0100 | 00100 |
| XXXX | 0500 | 0200 | 00100 |
| XXXX | 0500 | 0300 | 00100 |
| XXXX | 0500 | 0400 | 00100 |
| XXXX | 0500 | 0500 | 00100 |
| XXXX | 0500 | 0600 | 00100 |
| XXXX | 0500 | 0700 | 00100 |
| XXXX | 0600 | 0100 | 00101 |
| XXXX | 0600 | 0200 | 00101 |
| XXXX | 0600 | 0300 | 00101 |
| XXXX | 0600 | 0400 | 00101 |
| XXXX | 0600 | 0500 | 00101 |
| XXXX | 0600 | 0600 | 00101 |
| XXXX | 0600 | 0700 | 00101 |
| XXXX | 0700 | 0100 | 00110 |
| XXXX | 0700 | 0200 | 00110 |
| XXXX | 0700 | 0300 | 00110 |
| XXXX | 0700 | 0400 | 00110 |
| XXXX | 0700 | 0500 | 00110 |
| XXXX | 0700 | 0600 | 00110 |
| XXXX | 0700 | 0700 | 00110 |
| XXXX | 0100 | 0000 | 00111 |
| XXXX | 0100 | 00X0 | 00111 |
| XXXX | 0100 | 000X | 00111 |
| XXXX | 0200 | 0000 | 01000 |
| XXXX | 0200 | 00X0 | 01000 |
| XXXX | 0200 | 000X | 01000 |
| XXXX | 0300 | 0000 | 01001 |
| XXXX | 0300 | 00X0 | 01001 |
| XXXX | 0300 | 000X | 01001 |
| XXXX | 0400 | 0000 | 01010 |
| XXXX | 0400 | 00X0 | 01010 |
| XXXX | 0400 | 000X | 01010 |
| XXXX | 0500 | 0000 | 01011 |
| XXXX | 0500 | 00X0 | 01011 |
| XXXX | 0500 | 000X | 01011 |
| XXXX | 0600 | 0000 | 01100 |
| XXXX | 0600 | 00X0 | 01100 |
| XXXX | 0600 | 000X | 01100 |
| XXXX | 0700 | 0000 | 01101 |
| XXXX | 0700 | 00X0 | 01101 |
| XXXX | 0700 | 000X | 01101 |
| XXXX | 0100 | 1001 | 01110 |
| XXXX | 0100 | 1002 | 01110 |
| XXXX | 0100 | 1003 | 01110 |
| XXXX | 0100 | 1004 | 01110 |
| XXXX | 0100 | 1005 | 01110 |
| XXXX | 0100 | 1006 | 01110 |
| XXXX | 0100 | 1007 | 01110 |
| XXXX | 0100 | 1008 | 01110 |
| XXXX | 0100 | 1009 | 01110 |
| XXXX | 0100 | 2001 | 01110 |
| XXXX | 0100 | 2002 | 01110 |
| XXXX | 0100 | 2003 | 01110 |
| XXXX | 0100 | 2004 | 01110 |
| XXXX | 0100 | 2005 | 01110 |
| XXXX | 0100 | 2006 | 01110 |
| XXXX | 0100 | 2007 | 01110 |
| XXXX | 0100 | 2008 | 01110 |
| XXXX | 0100 | 2009 | 01110 |
| XXXX | 0100 | 3001 | 01110 |
| XXXX | 0100 | 3002 | 01110 |

-continued

| Window Contents | | | X' |
|---|---|---|---|
| XXXX | 0100 | 3003 | 01110 |
| XXXX | 0100 | 3004 | 01110 |
| XXXX | 0100 | 3005 | 01110 |
| XXXX | 0100 | 3006 | 01110 |
| XXXX | 0100 | 3007 | 01110 |
| XXXX | 0100 | 3008 | 01110 |
| XXXX | 0100 | 3009 | 01110 |
| XXXX | 0100 | 4001 | 01110 |
| XXXX | 0100 | 4002 | 01110 |
| XXXX | 0100 | 4003 | 01110 |
| XXXX | 0100 | 4004 | 01110 |
| XXXX | 0100 | 4005 | 01110 |
| XXXX | 0200 | 1001 | 01111 |
| XXXX | 0200 | 1002 | 01111 |
| XXXX | 0200 | 1003 | 01111 |
| XXXX | 0200 | 1004 | 01111 |
| XXXX | 0200 | 1005 | 01111 |
| XXXX | 0200 | 1006 | 01111 |
| XXXX | 0200 | 1007 | 01111 |
| XXXX | 0200 | 1008 | 01111 |
| XXXX | 0200 | 1009 | 01111 |
| XXXX | 0200 | 2001 | 01111 |
| XXXX | 0200 | 2002 | 01111 |
| XXXX | 0200 | 2003 | 01111 |
| XXXX | 0200 | 2004 | 01111 |
| XXXX | 0200 | 2005 | 01111 |
| XXXX | 0200 | 2006 | 01111 |
| XXXX | 0200 | 2007 | 01111 |
| XXXX | 0200 | 2008 | 01111 |
| XXXX | 0200 | 2009 | 01111 |
| XXXX | 0200 | 3001 | 01111 |
| XXXX | 0200 | 3002 | 01111 |
| XXXX | 0200 | 3003 | 01111 |
| XXXX | 0200 | 3004 | 01111 |
| XXXX | 0200 | 3005 | 01111 |
| XXXX | 0200 | 3006 | 01111 |
| XXXX | 0200 | 3007 | 01111 |
| XXXX | 0200 | 3008 | 01111 |
| XXXX | 0200 | 3009 | 01111 |
| XXXX | 0200 | 4001 | 01111 |
| XXXX | 0200 | 4002 | 01111 |
| XXXX | 0200 | 4003 | 01111 |
| XXXX | 0200 | 4004 | 01111 |
| XXXX | 0200 | 4005 | 01111 |
| XXXX | 0300 | 1001 | 10000 |
| XXXX | 0300 | 1002 | 10000 |
| XXXX | 0300 | 1003 | 10000 |
| XXXX | 0300 | 1004 | 10000 |
| XXXX | 0300 | 1005 | 10000 |
| XXXX | 0300 | 1006 | 10000 |
| XXXX | 0300 | 1007 | 10000 |
| XXXX | 0300 | 1008 | 10000 |
| XXXX | 0300 | 1009 | 10000 |
| XXXX | 0300 | 2001 | 10000 |
| XXXX | 0300 | 2002 | 10000 |
| XXXX | 0300 | 2003 | 10000 |
| XXXX | 0300 | 2004 | 10000 |
| XXXX | 0300 | 2005 | 10000 |
| XXXX | 0300 | 2006 | 10000 |
| XXXX | 0300 | 2007 | 10000 |
| XXXX | 0300 | 2008 | 10000 |
| XXXX | 0300 | 2009 | 10000 |
| XXXX | 0300 | 3001 | 10000 |
| XXXX | 0300 | 3002 | 10000 |
| XXXX | 0300 | 3003 | 10000 |
| XXXX | 0300 | 3004 | 10000 |
| XXXX | 0300 | 3005 | 10000 |
| XXXX | 0300 | 3006 | 10000 |
| XXXX | 0300 | 3007 | 10000 |
| XXXX | 0300 | 3008 | 10000 |
| XXXX | 0300 | 3009 | 10000 |
| XXXX | 0300 | 4001 | 10000 |
| XXXX | 0300 | 4002 | 10000 |
| XXXX | 0300 | 4003 | 10000 |
| XXXX | 0300 | 4004 | 10000 |
| XXXX | 0300 | 4005 | 10000 |
| XXXX | 0400 | 1001 | 10001 |

-continued

| Window Contents | | | X' |
|---|---|---|---|
| XXXX | 0400 | 1002 | 10001 |
| XXXX | 0400 | 1003 | 10001 |
| XXXX | 0400 | 1004 | 10001 |
| XXXX | 0400 | 1005 | 10001 |
| XXXX | 0400 | 1006 | 10001 |
| XXXX | 0400 | 1007 | 10001 |
| XXXX | 0400 | 1008 | 10001 |
| XXXX | 0400 | 1009 | 10001 |
| XXXX | 0400 | 2001 | 10001 |
| XXXX | 0400 | 2002 | 10001 |
| XXXX | 0400 | 2003 | 10001 |
| XXXX | 0400 | 2004 | 10001 |
| XXXX | 0400 | 2005 | 10001 |
| XXXX | 0400 | 2006 | 10001 |
| XXXX | 0400 | 2007 | 10001 |
| XXXX | 0400 | 2008 | 10001 |
| XXXX | 0400 | 2009 | 10001 |
| XXXX | 0400 | 3001 | 10001 |
| XXXX | 0400 | 3002 | 10001 |
| XXXX | 0400 | 3003 | 10001 |
| XXXX | 0400 | 3004 | 10001 |
| XXXX | 0400 | 3005 | 10001 |
| XXXX | 0400 | 3006 | 10001 |
| XXXX | 0400 | 3007 | 10001 |
| XXXX | 0400 | 3008 | 10001 |
| XXXX | 0400 | 3009 | 10001 |
| XXXX | 0400 | 4001 | 10001 |
| XXXX | 0400 | 4002 | 10001 |
| XXXX | 0400 | 4003 | 10001 |
| XXXX | 0400 | 4004 | 10001 |
| XXXX | 0400 | 4005 | 10001 |
| XXXX | 0500 | 1001 | 10010 |
| XXXX | 0500 | 1002 | 10010 |
| XXXX | 0500 | 1003 | 10010 |
| XXXX | 0500 | 1004 | 10010 |
| XXXX | 0500 | 1005 | 10010 |
| XXXX | 0500 | 1006 | 10010 |
| XXXX | 0500 | 1007 | 10010 |
| XXXX | 0500 | 1008 | 10010 |
| XXXX | 0500 | 1009 | 10010 |
| XXXX | 0500 | 2001 | 10010 |
| XXXX | 0500 | 2002 | 10010 |
| XXXX | 0500 | 2003 | 10010 |
| XXXX | 0500 | 2004 | 10010 |
| XXXX | 0500 | 2005 | 10010 |
| XXXX | 0500 | 2006 | 10010 |
| XXXX | 0500 | 2007 | 10010 |
| XXXX | 0500 | 2008 | 10010 |
| XXXX | 0500 | 2009 | 10010 |
| XXXX | 0500 | 3001 | 10010 |
| XXXX | 0500 | 3002 | 10010 |
| XXXX | 0500 | 3003 | 10010 |
| XXXX | 0500 | 3004 | 10010 |
| XXXX | 0500 | 3005 | 10010 |
| XXXX | 0500 | 3006 | 10010 |
| XXXX | 0500 | 3007 | 10010 |
| XXXX | 0500 | 3008 | 10010 |
| XXXX | 0500 | 3009 | 10010 |
| XXXX | 0500 | 4001 | 10010 |
| XXXX | 0500 | 4002 | 10010 |
| XXXX | 0500 | 4003 | 10010 |
| XXXX | 0500 | 4004 | 10010 |
| XXXX | 0500 | 4005 | 10010 |
| XXXX | 0600 | 1001 | 10011 |
| XXXX | 0600 | 1002 | 10011 |
| XXXX | 0600 | 1003 | 10011 |
| XXXX | 0600 | 1004 | 10011 |
| XXXX | 0600 | 1005 | 10011 |
| XXXX | 0600 | 1006 | 10011 |
| XXXX | 0600 | 1007 | 10011 |
| XXXX | 0600 | 1008 | 10011 |
| XXXX | 0600 | 1009 | 10011 |
| XXXX | 0600 | 2001 | 10011 |
| XXXX | 0600 | 2002 | 10011 |
| XXXX | 0600 | 2003 | 10011 |
| XXXX | 0600 | 2004 | 10011 |
| XXXX | 0600 | 2005 | 10011 |

-continued

| Window Contents | | | X' |
|---|---|---|---|
| XXXX | 0600 | 2006 | 10011 |
| XXXX | 0600 | 2007 | 10011 |
| XXXX | 0600 | 2008 | 10011 |
| XXXX | 0600 | 2009 | 10011 |
| XXXX | 0600 | 3001 | 10011 |
| XXXX | 0600 | 3002 | 10011 |
| XXXX | 0600 | 3003 | 10011 |
| XXXX | 0600 | 3004 | 10011 |
| XXXX | 0600 | 3005 | 10011 |
| XXXX | 0600 | 3006 | 10011 |
| XXXX | 0600 | 3007 | 10011 |
| XXXX | 0600 | 3008 | 10011 |
| XXXX | 0600 | 3009 | 10011 |
| XXXX | 0600 | 4001 | 10011 |
| XXXX | 0600 | 4002 | 10011 |
| XXXX | 0600 | 4003 | 10011 |
| XXXX | 0600 | 4004 | 10011 |
| XXXX | 0600 | 4005 | 10011 |
| XXXX | 0700 | 1001 | 10100 |
| XXXX | 0700 | 1002 | 10100 |
| XXXX | 0700 | 1003 | 10100 |
| XXXX | 0700 | 1004 | 10100 |
| XXXX | 0700 | 1005 | 10100 |
| XXXX | 0700 | 1006 | 10100 |
| XXXX | 0700 | 1007 | 10100 |
| XXXX | 0700 | 1008 | 10100 |
| XXXX | 0700 | 1009 | 10100 |
| XXXX | 0700 | 2001 | 10100 |
| XXXX | 0700 | 2002 | 10100 |
| XXXX | 0700 | 2003 | 10100 |
| XXXX | 0700 | 2004 | 10100 |
| XXXX | 0700 | 2005 | 10100 |
| XXXX | 0700 | 2006 | 10100 |
| XXXX | 0700 | 2007 | 10100 |
| XXXX | 0700 | 2008 | 10100 |
| XXXX | 0700 | 2009 | 10100 |
| XXXX | 0700 | 3001 | 10100 |
| XXXX | 0700 | 3002 | 10100 |
| XXXX | 0700 | 3003 | 10100 |
| XXXX | 0700 | 3004 | 10100 |
| XXXX | 0700 | 3005 | 10100 |
| XXXX | 0700 | 3006 | 10100 |
| XXXX | 0700 | 3007 | 10100 |
| XXXX | 0700 | 3008 | 10100 |
| XXXX | 0700 | 3009 | 10100 |
| XXXX | 0700 | 4001 | 10100 |
| XXXX | 0700 | 4002 | 10100 |
| XXXX | 0700 | 4003 | 10100 |
| XXXX | 0700 | 4004 | 10100 |
| XXXX | 0700 | 4005 | 10100 |
| XXXX | 0100 | 4006 | 10101 |
| XXXX | 0100 | 4007 | 10101 |
| XXXX | 0100 | 4008 | 10101 |
| XXXX | 0100 | 4009 | 10101 |
| XXXX | 0100 | 5001 | 10101 |
| XXXX | 0100 | 5002 | 10101 |
| XXXX | 0100 | 5003 | 10101 |
| XXXX | 0100 | 5004 | 10101 |
| XXXX | 0100 | 5005 | 10101 |
| XXXX | 0100 | 5006 | 10101 |
| XXXX | 0100 | 5007 | 10101 |
| XXXX | 0100 | 5008 | 10101 |
| XXXX | 0100 | 5009 | 10101 |
| XXXX | 0100 | 6001 | 10101 |
| XXXX | 0100 | 6002 | 10101 |
| XXXX | 0100 | 6003 | 10101 |
| XXXX | 0100 | 6004 | 10101 |
| XXXX | 0100 | 6005 | 10101 |
| XXXX | 0100 | 6006 | 10101 |
| XXXX | 0100 | 6007 | 10101 |
| XXXX | 0100 | 6008 | 10101 |
| XXXX | 0100 | 6009 | 10101 |
| XXXX | 0100 | 7001 | 10101 |
| XXXX | 0100 | 7002 | 10101 |
| XXXX | 0100 | 7003 | 10101 |
| XXXX | 0100 | 7004 | 10101 |
| XXXX | 0100 | 7005 | 10101 |

-continued

| Window Contents | | | X' |
|---|---|---|---|
| XXXX | 0100 | 7006 | 10101 |
| XXXX | 0100 | 7007 | 10101 |
| XXXX | 0100 | 7008 | 10101 |
| XXXX | 0100 | 7009 | 10101 |
| XXXX | 0100 | 8001 | 10101 |
| XXXX | 0200 | 4006 | 10110 |
| XXXX | 0200 | 4007 | 10110 |
| XXXX | 0200 | 4008 | 10110 |
| XXXX | 0200 | 4009 | 10110 |
| XXXX | 0200 | 5001 | 10110 |
| XXXX | 0200 | 5002 | 10110 |
| XXXX | 0200 | 5003 | 10110 |
| XXXX | 0200 | 5004 | 10110 |
| XXXX | 0200 | 5005 | 10110 |
| XXXX | 0200 | 5006 | 10110 |
| XXXX | 0200 | 5007 | 10110 |
| XXXX | 0200 | 5008 | 10110 |
| XXXX | 0200 | 5009 | 10110 |
| XXXX | 0200 | 6001 | 10110 |
| XXXX | 0200 | 6002 | 10110 |
| XXXX | 0200 | 6003 | 10110 |
| XXXX | 0200 | 6004 | 10110 |
| XXXX | 0200 | 6005 | 10110 |
| XXXX | 0200 | 6006 | 10110 |
| XXXX | 0200 | 6007 | 10110 |
| XXXX | 0200 | 6008 | 10110 |
| XXXX | 0200 | 6009 | 10110 |
| XXXX | 0200 | 7001 | 10110 |
| XXXX | 0200 | 7002 | 10110 |
| XXXX | 0200 | 7003 | 10110 |
| XXXX | 0200 | 7004 | 10110 |
| XXXX | 0200 | 7005 | 10110 |
| XXXX | 0200 | 7006 | 10110 |
| XXXX | 0200 | 7007 | 10110 |
| XXXX | 0200 | 7008 | 10110 |
| XXXX | 0200 | 7009 | 10110 |
| XXXX | 0200 | 8001 | 10110 |
| XXXX | 0300 | 4006 | 10111 |
| XXXX | 0300 | 4007 | 10111 |
| XXXX | 0300 | 4008 | 10111 |
| XXXX | 0300 | 4009 | 10111 |
| XXXX | 0300 | 5001 | 10111 |
| XXXX | 0300 | 5002 | 10111 |
| XXXX | 0300 | 5003 | 10111 |
| XXXX | 0300 | 5004 | 10111 |
| XXXX | 0300 | 5005 | 10111 |
| XXXX | 0300 | 5006 | 10111 |
| XXXX | 0300 | 5007 | 10111 |
| XXXX | 0300 | 5008 | 10111 |
| XXXX | 0300 | 5009 | 10111 |
| XXXX | 0300 | 6001 | 10111 |
| XXXX | 0300 | 6002 | 10111 |
| XXXX | 0300 | 6003 | 10111 |
| XXXX | 0300 | 6004 | 10111 |
| XXXX | 0300 | 6005 | 10111 |
| XXXX | 0300 | 6006 | 10111 |
| XXXX | 0300 | 6007 | 10111 |
| XXXX | 0300 | 6008 | 10111 |
| XXXX | 0300 | 6009 | 10111 |
| XXXX | 0300 | 7001 | 10111 |
| XXXX | 0300 | 7002 | 10111 |
| XXXX | 0300 | 7003 | 10111 |
| XXXX | 0300 | 7004 | 10111 |
| XXXX | 0300 | 7005 | 10111 |
| XXXX | 0300 | 7006 | 10111 |
| XXXX | 0300 | 7007 | 10111 |
| XXXX | 0300 | 7008 | 10111 |
| XXXX | 0300 | 7009 | 10111 |
| XXXX | 0300 | 8001 | 10111 |
| XXXX | 0400 | 4006 | 11000 |
| XXXX | 0400 | 4007 | 11000 |
| XXXX | 0400 | 4008 | 11000 |
| XXXX | 0400 | 4009 | 11000 |
| XXXX | 0400 | 5001 | 11000 |
| XXXX | 0400 | 5002 | 11000 |
| XXXX | 0400 | 5003 | 11000 |
| XXXX | 0400 | 5004 | 11000 |

-continued

| Window Contents | | | X' |
|---|---|---|---|
| XXXX | 0400 | 5005 | 11000 |
| XXXX | 0400 | 5006 | 11000 |
| XXXX | 0400 | 5007 | 11000 |
| XXXX | 0400 | 5008 | 11000 |
| XXXX | 0400 | 5009 | 11000 |
| XXXX | 0400 | 6001 | 11000 |
| XXXX | 0400 | 6002 | 11000 |
| XXXX | 0400 | 6003 | 11000 |
| XXXX | 0400 | 6004 | 11000 |
| XXXX | 0400 | 6005 | 11000 |
| XXXX | 0400 | 6006 | 11000 |
| XXXX | 0400 | 6007 | 11000 |
| XXXX | 0400 | 6008 | 11000 |
| XXXX | 0400 | 6009 | 11000 |
| XXXX | 0400 | 7001 | 11000 |
| XXXX | 0400 | 7002 | 11000 |
| XXXX | 0400 | 7003 | 11000 |
| XXXX | 0400 | 7004 | 11000 |
| XXXX | 0400 | 7005 | 11000 |
| XXXX | 0400 | 7006 | 11000 |
| XXXX | 0400 | 7007 | 11000 |
| XXXX | 0400 | 7008 | 11000 |
| XXXX | 0400 | 7009 | 11000 |
| XXXX | 0400 | 8001 | 11000 |
| XXXX | 0500 | 4006 | 11001 |
| XXXX | 0500 | 4007 | 11001 |
| XXXX | 0500 | 4008 | 11001 |
| XXXX | 0500 | 4009 | 11001 |
| XXXX | 0500 | 5001 | 11001 |
| XXXX | 0500 | 5002 | 11001 |
| XXXX | 0500 | 5003 | 11001 |
| XXXX | 0500 | 5004 | 11001 |
| XXXX | 0500 | 5005 | 11001 |
| XXXX | 0500 | 5006 | 11001 |
| XXXX | 0500 | 5007 | 11001 |
| XXXX | 0500 | 5008 | 11001 |
| XXXX | 0500 | 5009 | 11001 |
| XXXX | 0500 | 6001 | 11001 |
| XXXX | 0500 | 6002 | 11001 |
| XXXX | 0500 | 6003 | 11001 |
| XXXX | 0500 | 6004 | 11001 |
| XXXX | 0500 | 6005 | 11001 |
| XXXX | 0500 | 6006 | 11001 |
| XXXX | 0500 | 6007 | 11001 |
| XXXX | 0500 | 6008 | 11001 |
| XXXX | 0500 | 6009 | 11001 |
| XXXX | 0500 | 7001 | 11001 |
| XXXX | 0500 | 7002 | 11001 |
| XXXX | 0500 | 7003 | 11001 |
| XXXX | 0500 | 7004 | 11001 |
| XXXX | 0500 | 7005 | 11001 |
| XXXX | 0500 | 7006 | 11001 |
| XXXX | 0500 | 7007 | 11001 |
| XXXX | 0500 | 7008 | 11001 |
| XXXX | 0500 | 7009 | 11001 |
| XXXX | 0500 | 8001 | 11001 |
| XXXX | 0600 | 4006 | 11010 |
| XXXX | 0600 | 4007 | 11010 |
| XXXX | 0600 | 4008 | 11010 |
| XXXX | 0600 | 4009 | 11010 |
| XXXX | 0600 | 5001 | 11010 |
| XXXX | 0600 | 5002 | 11010 |
| XXXX | 0600 | 5003 | 11010 |
| XXXX | 0600 | 5004 | 11010 |
| XXXX | 0600 | 5005 | 11010 |
| XXXX | 0600 | 5006 | 11010 |
| XXXX | 0600 | 5007 | 11010 |
| XXXX | 0600 | 5008 | 11010 |
| XXXX | 0600 | 5009 | 11010 |
| XXXX | 0600 | 6001 | 11010 |
| XXXX | 0600 | 6002 | 11010 |
| XXXX | 0600 | 6003 | 11010 |
| XXXX | 0600 | 6004 | 11010 |
| XXXX | 0600 | 6005 | 11010 |
| XXXX | 0600 | 6006 | 11010 |
| XXXX | 0600 | 6007 | 11010 |
| XXXX | 0600 | 6008 | 11010 |

-continued

| Window Contents | | | X' |
|---|---|---|---|
| X X X X | 0 6 0 0 | 6 0 0 9 | 1 1 0 1 0 |
| X X X X | 0 6 0 0 | 7 0 0 1 | 1 1 0 1 0 |
| X X X X | 0 6 0 0 | 7 0 0 2 | 1 1 0 1 0 |
| X X X X | 0 6 0 0 | 7 0 0 3 | 1 1 0 1 0 |
| X X X X | 0 6 0 0 | 7 0 0 4 | 1 1 0 1 0 |
| X X X X | 0 6 0 0 | 7 0 0 5 | 1 1 0 1 0 |
| X X X X | 0 6 0 0 | 7 0 0 6 | 1 1 0 1 0 |
| X X X X | 0 6 0 0 | 7 0 0 7 | 1 1 0 1 0 |
| X X X X | 0 6 0 0 | 7 0 0 8 | 1 1 0 1 0 |
| X X X X | 0 6 0 0 | 7 0 0 9 | 1 1 0 1 0 |
| X X X X | 0 6 0 0 | 8 0 0 1 | 1 1 0 1 0 |
| X X X X | 0 7 0 0 | 4 0 0 6 | 1 1 0 1 1 |
| X X X X | 0 7 0 0 | 4 0 0 7 | 1 1 0 1 1 |
| X X X X | 0 7 0 0 | 4 0 0 8 | 1 1 0 1 1 |
| X X X X | 0 7 0 0 | 4 0 0 9 | 1 1 0 1 1 |
| X X X X | 0 7 0 0 | 5 0 0 1 | 1 1 0 1 1 |
| X X X X | 0 7 0 0 | 5 0 0 2 | 1 1 0 1 1 |
| X X X X | 0 7 0 0 | 5 0 0 3 | 1 1 0 1 1 |
| X X X X | 0 7 0 0 | 5 0 0 4 | 1 1 0 1 1 |
| X X X X | 0 7 0 0 | 5 0 0 5 | 1 1 0 1 1 |
| X X X X | 0 7 0 0 | 5 0 0 6 | 1 1 0 1 1 |
| X X X X | 0 7 0 0 | 5 0 0 7 | 1 1 0 1 1 |
| X X X X | 0 7 0 0 | 5 0 0 8 | 1 1 0 1 1 |
| X X X X | 0 7 0 0 | 5 0 0 9 | 1 1 0 1 1 |
| X X X X | 0 7 0 0 | 6 0 0 1 | 1 1 0 1 1 |
| X X X X | 0 7 0 0 | 6 0 0 2 | 1 1 0 1 1 |
| X X X X | 0 7 0 0 | 6 0 0 3 | 1 1 0 1 1 |
| X X X X | 0 7 0 0 | 6 0 0 4 | 1 1 0 1 1 |
| X X X X | 0 7 0 0 | 6 0 0 5 | 1 1 0 1 1 |
| X X X X | 0 7 0 0 | 6 0 0 6 | 1 1 0 1 1 |
| X X X X | 0 7 0 0 | 6 0 0 7 | 1 1 0 1 1 |
| X X X X | 0 7 0 0 | 6 0 0 8 | 1 1 0 1 1 |
| X X X X | 0 7 0 0 | 6 0 0 9 | 1 1 0 1 1 |
| X X X X | 0 7 0 0 | 7 0 0 1 | 1 1 0 1 1 |
| X X X X | 0 7 0 0 | 7 0 0 2 | 1 1 0 1 1 |
| X X X X | 0 7 0 0 | 7 0 0 3 | 1 1 0 1 1 |
| X X X X | 0 7 0 0 | 7 0 0 4 | 1 1 0 1 1 |
| X X X X | 0 7 0 0 | 7 0 0 5 | 1 1 0 1 1 |
| X X X X | 0 7 0 0 | 7 0 0 6 | 1 1 0 1 1 |
| X X X X | 0 7 0 0 | 7 0 0 7 | 1 1 0 1 1 |
| X X X X | 0 7 0 0 | 7 0 0 8 | 1 1 0 1 1 |
| X X X X | 0 7 0 0 | 7 0 0 9 | 1 1 0 1 1 |
| X X X X | 0 7 0 0 | 8 0 0 1 | 1 1 0 1 1 |
| X X X X | 0 1 0 0 | 8 0 0 2 | 1 1 1 0 0 |
| X X X X | 0 1 0 0 | 8 0 0 3 | 1 1 1 0 0 |
| X X X X | 0 1 0 0 | 8 0 0 4 | 1 1 1 0 0 |
| X X X X | 0 1 0 0 | 8 0 0 5 | 1 1 1 0 0 |
| X X X X | 0 1 0 0 | 8 0 0 6 | 1 1 1 0 0 |
| X X X X | 0 1 0 0 | 8 0 0 7 | 1 1 1 0 0 |
| X X X X | 0 1 0 0 | 8 0 0 8 | 1 1 1 0 0 |
| X X X X | 0 1 0 0 | 8 0 0 9 | 1 1 1 0 0 |
| X X X X | 0 1 0 0 | 9 0 0 1 | 1 1 1 0 0 |
| X X X X | 0 1 0 0 | 9 0 0 2 | 1 1 1 0 0 |
| X X X X | 0 1 0 0 | 9 0 0 3 | 1 1 1 0 0 |
| X X X X | 0 1 0 0 | 9 0 0 4 | 1 1 1 0 0 |
| X X X X | 0 1 0 0 | 9 0 0 5 | 1 1 1 0 0 |
| X X X X | 0 1 0 0 | 9 0 0 6 | 1 1 1 0 0 |
| X X X X | 0 1 0 0 | 9 0 0 7 | 1 1 1 0 0 |
| X X X X | 0 1 0 0 | 9 0 0 8 | 1 1 1 0 0 |
| X X X X | 0 1 0 0 | 9 0 0 9 | 1 1 1 0 0 |
| X X X X | 0 1 0 0 | 1 0 0 0 | 1 1 1 0 0 |
| X X X X | 0 1 0 0 | 2 0 0 0 | 1 1 1 0 0 |
| X X X X | 0 1 0 0 | 3 0 0 0 | 1 1 1 0 0 |
| X X X X | 0 2 0 0 | 8 0 0 2 | 1 1 1 0 1 |
| X X X X | 0 2 0 0 | 8 0 0 3 | 1 1 1 0 1 |
| X X X X | 0 2 0 0 | 8 0 0 4 | 1 1 1 0 1 |
| X X X X | 0 2 0 0 | 8 0 0 5 | 1 1 1 0 1 |
| X X X X | 0 2 0 0 | 8 0 0 6 | 1 1 1 0 1 |
| X X X X | 0 2 0 0 | 8 0 0 7 | 1 1 1 0 1 |
| X X X X | 0 2 0 0 | 8 0 0 8 | 1 1 1 0 1 |
| X X X X | 0 2 0 0 | 8 0 0 9 | 1 1 1 0 1 |
| X X X X | 0 2 0 0 | 9 0 0 1 | 1 1 1 0 1 |
| X X X X | 0 2 0 0 | 9 0 0 2 | 1 1 1 0 1 |
| X X X X | 0 2 0 0 | 9 0 0 3 | 1 1 1 0 1 |
| X X X X | 0 2 0 0 | 9 0 0 4 | 1 1 1 0 1 |
| X X X X | 0 2 0 0 | 9 0 0 5 | 1 1 1 0 1 |
| X X X X | 0 2 0 0 | 9 0 0 6 | 1 1 1 0 1 |

-continued

| Window Contents | | | X' |
|---|---|---|---|
| X X X X | 0 2 0 0 | 9 0 0 7 | 1 1 1 0 1 |
| X X X X | 0 2 0 0 | 9 0 0 8 | 1 1 1 0 1 |
| X X X X | 0 2 0 0 | 9 0 0 9 | 1 1 1 0 1 |
| X X X X | 0 2 0 0 | 1 0 0 0 | 1 1 1 0 1 |
| X X X X | 0 2 0 0 | 2 0 0 0 | 1 1 1 0 1 |
| X X X X | 0 2 0 0 | 3 0 0 0 | 1 1 1 0 1 |
| X X X X | 0 3 0 0 | 8 0 0 2 | 1 1 1 1 0 |
| X X X X | 0 3 0 0 | 8 0 0 3 | 1 1 1 1 0 |
| X X X X | 0 3 0 0 | 8 0 0 4 | 1 1 1 1 0 |
| X X X X | 0 3 0 0 | 8 0 0 5 | 1 1 1 1 0 |
| X X X X | 0 3 0 0 | 8 0 0 6 | 1 1 1 1 0 |
| X X X X | 0 3 0 0 | 8 0 0 7 | 1 1 1 1 0 |
| X X X X | 0 3 0 0 | 8 0 0 8 | 1 1 1 1 0 |
| X X X X | 0 3 0 0 | 8 0 0 9 | 1 1 1 1 0 |
| X X X X | 0 3 0 0 | 9 0 0 1 | 1 1 1 1 0 |
| X X X X | 0 3 0 0 | 9 0 0 2 | 1 1 1 1 0 |
| X X X X | 0 3 0 0 | 9 0 0 3 | 1 1 1 1 0 |
| X X X X | 0 3 0 0 | 9 0 0 4 | 1 1 1 1 0 |
| X X X X | 0 3 0 0 | 9 0 0 5 | 1 1 1 1 0 |
| X X X X | 0 3 0 0 | 9 0 0 6 | 1 1 1 1 0 |
| X X X X | 0 3 0 0 | 9 0 0 7 | 1 1 1 1 0 |
| X X X X | 0 3 0 0 | 9 0 0 8 | 1 1 1 1 0 |
| X X X X | 0 3 0 0 | 9 0 0 9 | 1 1 1 1 0 |
| X X X X | 0 3 0 0 | 1 0 0 0 | 1 1 1 1 0 |
| X X X X | 0 3 0 0 | 2 0 0 0 | 1 1 1 1 0 |
| X X X X | 0 3 0 0 | 3 0 0 0 | 1 1 1 1 0 |
| X X X X | 0 4 0 0 | 8 0 0 2 | 1 1 1 1 1 |
| X X X X | 0 4 0 0 | 8 0 0 3 | 1 1 1 1 1 |
| X X X X | 0 4 0 0 | 8 0 0 4 | 1 1 1 1 1 |
| X X X X | 0 4 0 0 | 8 0 0 5 | 1 1 1 1 1 |
| X X X X | 0 4 0 0 | 8 0 0 6 | 1 1 1 1 1 |
| X X X X | 0 4 0 0 | 8 0 0 7 | 1 1 1 1 1 |
| X X X X | 0 4 0 0 | 8 0 0 8 | 1 1 1 1 1 |
| X X X X | 0 4 0 0 | 8 0 0 9 | 1 1 1 1 1 |
| X X X X | 0 4 0 0 | 9 0 0 1 | 1 1 1 1 1 |
| X X X X | 0 4 0 0 | 9 0 0 2 | 1 1 1 1 1 |
| X X X X | 0 4 0 0 | 9 0 0 3 | 1 1 1 1 1 |
| X X X X | 0 4 0 0 | 9 0 0 4 | 1 1 1 1 1 |
| X X X X | 0 4 0 0 | 9 0 0 5 | 1 1 1 1 1 |
| X X X X | 0 4 0 0 | 9 0 0 6 | 1 1 1 1 1 |
| X X X X | 0 4 0 0 | 9 0 0 7 | 1 1 1 1 1 |
| X X X X | 0 4 0 0 | 9 0 0 8 | 1 1 1 1 1 |
| X X X X | 0 4 0 0 | 9 0 0 9 | 1 1 1 1 1 |
| X X X X | 0 4 0 0 | 1 0 0 0 | 1 1 1 1 1 |
| X X X X | 0 4 0 0 | 2 0 0 0 | 1 1 1 1 1 |
| X X X X | 0 4 0 0 | 3 0 0 0 | 1 1 1 1 1 |
| 0 0 0 0 | 0 0 0 0 | 0 1 0 0 | 0 0 0 0 0 |
| 0 0 0 0 | 0 0 0 0 | 0 2 0 0 | 0 0 0 0 0 |
| 0 0 0 0 | 0 0 0 0 | 0 3 0 0 | 0 0 0 0 0 |
| 0 0 0 0 | 0 0 0 0 | 0 4 0 0 | 0 0 0 0 0 |
| 0 0 0 0 | 0 0 0 0 | 0 5 0 0 | 0 0 0 0 0 |
| 0 0 0 0 | 0 0 0 0 | 0 6 0 0 | 0 0 0 0 0 |
| 0 0 0 0 | 0 0 0 0 | 0 7 0 0 | 0 0 0 0 0 |
| 0 X 0 0 | 0 0 0 0 | 0 1 0 0 | 0 0 0 0 0 |
| 0 X 0 0 | 0 0 0 0 | 0 2 0 0 | 0 0 0 0 0 |
| 0 X 0 0 | 0 0 0 0 | 0 3 0 0 | 0 0 0 0 0 |
| 0 X 0 0 | 0 0 0 0 | 0 4 0 0 | 0 0 0 0 0 |
| 0 X 0 0 | 0 0 0 0 | 0 5 0 0 | 0 0 0 0 0 |
| 0 X 0 0 | 0 0 0 0 | 0 6 0 0 | 0 0 0 0 0 |
| 0 X 0 0 | 0 0 0 0 | 0 7 0 0 | 0 0 0 0 0 |
| X 0 0 0 | 0 0 0 0 | 0 1 0 0 | 0 0 0 0 0 |
| X 0 0 0 | 0 0 0 0 | 0 2 0 0 | 0 0 0 0 0 |
| X 0 0 0 | 0 0 0 0 | 0 3 0 0 | 0 0 0 0 0 |
| X 0 0 0 | 0 0 0 0 | 0 4 0 0 | 0 0 0 0 0 |
| X 0 0 0 | 0 0 0 0 | 0 5 0 0 | 0 0 0 0 0 |
| X 0 0 0 | 0 0 0 0 | 0 6 0 0 | 0 0 0 0 0 |
| X 0 0 0 | 0 0 0 0 | 0 7 0 0 | 0 0 0 0 0 |
| 0 0 0 0 | 0 0 0 0 | 4 0 0 0 | 0 0 0 0 1 |
| 0 0 0 0 | 0 0 0 0 | 5 0 0 0 | 0 0 0 0 1 |
| 0 0 0 0 | 0 0 0 0 | 6 0 0 0 | 0 0 0 0 1 |
| 0 0 0 0 | 0 0 0 0 | 7 0 0 0 | 0 0 0 0 1 |
| 0 0 0 0 | 0 0 0 0 | 8 0 0 0 | 0 0 0 0 1 |
| 0 0 0 0 | 0 0 0 0 | 9 0 0 0 | 0 0 0 0 1 |
| 0 0 0 0 | 0 0 0 0 | 0 8 0 0 | 0 0 0 0 1 |
| 0 0 0 0 | 0 0 0 0 | 0 9 0 0 | 0 0 0 0 1 |
| 0 X 0 0 | 0 0 0 0 | 4 0 0 0 | 0 0 0 0 1 |
| 0 X 0 0 | 0 0 0 0 | 5 0 0 0 | 0 0 0 0 1 |

-continued

| Window Contents | | | X' |
|---|---|---|---|
| 0 X 0 0 | 0 0 0 0 | 6 0 0 0 | 0 0 0 0 1 |
| 0 X 0 0 | 0 0 0 0 | 7 0 0 0 | 0 0 0 0 1 |
| 0 X 0 0 | 0 0 0 0 | 8 0 0 0 | 0 0 0 0 1 |
| 0 X 0 0 | 0 0 0 0 | 9 0 0 0 | 0 0 0 0 1 |
| 0 X 0 0 | 0 0 0 0 | 0 8 0 0 | 0 0 0 0 1 |
| 0 X 0 0 | 0 0 0 0 | 0 9 0 0 | 0 0 0 0 1 |
| X 0 0 0 | 0 0 0 0 | 4 0 0 0 | 0 0 0 0 1 |
| X 0 0 0 | 0 0 0 0 | 5 0 0 0 | 0 0 0 0 1 |
| X 0 0 0 | 0 0 0 0 | 6 0 0 0 | 0 0 0 0 1 |
| X 0 0 0 | 0 0 0 0 | 7 0 0 0 | 0 0 0 0 1 |
| X 0 0 0 | 0 0 0 0 | 8 0 0 0 | 0 0 0 0 1 |
| X 0 0 0 | 0 0 0 0 | 9 0 0 0 | 0 0 0 0 1 |
| X 0 0 0 | 0 0 0 0 | 0 8 0 0 | 0 0 0 0 1 |
| X 0 0 0 | 0 0 0 0 | 0 9 0 0 | 0 0 0 0 1 |
| 0 0 0 0 | 0 0 0 0 | 1 0 0 1 | 0 0 0 1 0 |
| 0 0 0 0 | 0 0 0 0 | 1 0 0 2 | 0 0 0 1 0 |
| 0 0 0 0 | 0 0 0 0 | 1 0 0 3 | 0 0 0 1 0 |
| 0 0 0 0 | 0 0 0 0 | 1 0 0 4 | 0 0 0 1 0 |
| 0 0 0 0 | 0 0 0 0 | 1 0 0 5 | 0 0 0 1 0 |
| 0 0 0 0 | 0 0 0 0 | 1 0 0 6 | 0 0 0 1 0 |
| 0 0 0 0 | 0 0 0 0 | 1 0 0 7 | 0 0 0 1 0 |
| 0 0 0 0 | 0 0 0 0 | 1 0 0 8 | 0 0 0 1 0 |
| 0 0 0 0 | 0 0 0 0 | 1 0 0 9 | 0 0 0 1 0 |
| 0 0 0 0 | 0 0 0 0 | 2 0 0 1 | 0 0 0 1 0 |
| 0 0 0 0 | 0 0 0 0 | 2 0 0 2 | 0 0 0 1 0 |
| 0 0 0 0 | 0 0 0 0 | 2 0 0 3 | 0 0 0 1 0 |
| 0 0 0 0 | 0 0 0 0 | 2 0 0 4 | 0 0 0 1 0 |
| 0 0 0 0 | 0 0 0 0 | 2 0 0 5 | 0 0 0 1 0 |
| 0 0 0 0 | 0 0 0 0 | 2 0 0 6 | 0 0 0 1 0 |
| 0 0 0 0 | 0 0 0 0 | 2 0 0 7 | 0 0 0 1 0 |
| 0 0 0 0 | 0 0 0 0 | 2 0 0 8 | 0 0 0 1 0 |
| 0 0 0 0 | 0 0 0 0 | 2 0 0 9 | 0 0 0 1 0 |
| 0 0 0 0 | 0 0 0 0 | 3 0 0 1 | 0 0 0 1 0 |
| 0 0 0 0 | 0 0 0 0 | 3 0 0 2 | 0 0 0 1 0 |
| 0 0 0 0 | 0 0 0 0 | 3 0 0 3 | 0 0 0 1 0 |
| 0 0 0 0 | 0 0 0 0 | 3 0 0 4 | 0 0 0 1 0 |
| 0 0 0 0 | 0 0 0 0 | 3 0 0 5 | 0 0 0 1 0 |
| 0 0 0 0 | 0 0 0 0 | 3 0 0 6 | 0 0 0 1 0 |
| 0 0 0 0 | 0 0 0 0 | 3 0 0 7 | 0 0 0 1 0 |
| 0 0 0 0 | 0 0 0 0 | 3 0 0 8 | 0 0 0 1 0 |
| 0 0 0 0 | 0 0 0 0 | 3 0 0 9 | 0 0 0 1 0 |
| 0 0 0 0 | 0 0 0 0 | 4 0 0 1 | 0 0 0 1 0 |
| 0 0 0 0 | 0 0 0 0 | 4 0 0 2 | 0 0 0 1 0 |
| 0 0 0 0 | 0 0 0 0 | 4 0 0 3 | 0 0 0 1 0 |
| 0 0 0 0 | 0 0 0 0 | 4 0 0 4 | 0 0 0 1 0 |
| 0 0 0 0 | 0 0 0 0 | 4 0 0 5 | 0 0 0 1 0 |
| 0 X 0 0 | 0 0 0 0 | 1 0 0 1 | 0 0 0 1 0 |
| 0 X 0 0 | 0 0 0 0 | 1 0 0 2 | 0 0 0 1 0 |
| 0 X 0 0 | 0 0 0 0 | 1 0 0 3 | 0 0 0 1 0 |
| 0 X 0 0 | 0 0 0 0 | 1 0 0 4 | 0 0 0 1 0 |
| 0 X 0 0 | 0 0 0 0 | 1 0 0 5 | 0 0 0 1 0 |
| 0 X 0 0 | 0 0 0 0 | 1 0 0 6 | 0 0 0 1 0 |
| 0 X 0 0 | 0 0 0 0 | 1 0 0 7 | 0 0 0 1 0 |
| 0 X 0 0 | 0 0 0 0 | 1 0 0 8 | 0 0 0 1 0 |
| 0 X 0 0 | 0 0 0 0 | 1 0 0 9 | 0 0 0 1 0 |
| 0 X 0 0 | 0 0 0 0 | 2 0 0 1 | 0 0 0 1 0 |
| 0 X 0 0 | 0 0 0 0 | 2 0 0 2 | 0 0 0 1 0 |
| 0 X 0 0 | 0 0 0 0 | 2 0 0 3 | 0 0 0 1 0 |
| 0 X 0 0 | 0 0 0 0 | 2 0 0 4 | 0 0 0 1 0 |
| 0 X 0 0 | 0 0 0 0 | 2 0 0 5 | 0 0 0 1 0 |
| 0 X 0 0 | 0 0 0 0 | 2 0 0 6 | 0 0 0 1 0 |
| 0 X 0 0 | 0 0 0 0 | 2 0 0 7 | 0 0 0 1 0 |
| 0 X 0 0 | 0 0 0 0 | 2 0 0 8 | 0 0 0 1 0 |
| 0 X 0 0 | 0 0 0 0 | 2 0 0 9 | 0 0 0 1 0 |
| 0 X 0 0 | 0 0 0 0 | 3 0 0 1 | 0 0 0 1 0 |
| 0 X 0 0 | 0 0 0 0 | 3 0 0 2 | 0 0 0 1 0 |
| 0 X 0 0 | 0 0 0 0 | 3 0 0 3 | 0 0 0 1 0 |
| 0 X 0 0 | 0 0 0 0 | 3 0 0 4 | 0 0 0 1 0 |
| 0 X 0 0 | 0 0 0 0 | 3 0 0 5 | 0 0 0 1 0 |
| 0 X 0 0 | 0 0 0 0 | 3 0 0 6 | 0 0 0 1 0 |
| 0 X 0 0 | 0 0 0 0 | 3 0 0 7 | 0 0 0 1 0 |
| 0 X 0 0 | 0 0 0 0 | 3 0 0 8 | 0 0 0 1 0 |
| 0 X 0 0 | 0 0 0 0 | 3 0 0 9 | 0 0 0 1 0 |
| 0 X 0 0 | 0 0 0 0 | 4 0 0 1 | 0 0 0 1 0 |
| 0 X 0 0 | 0 0 0 0 | 4 0 0 2 | 0 0 0 1 0 |
| 0 X 0 0 | 0 0 0 0 | 4 0 0 3 | 0 0 0 1 0 |
| 0 X 0 0 | 0 0 0 0 | 4 0 0 4 | 0 0 0 1 0 |

-continued

| Window Contents | | | X' |
|---|---|---|---|
| 0 X 0 0 | 0 0 0 0 | 4 0 0 5 | 0 0 0 1 0 |
| X 0 0 0 | 0 0 0 0 | 1 0 0 1 | 0 0 0 1 0 |
| X 0 0 0 | 0 0 0 0 | 1 0 0 2 | 0 0 0 1 0 |
| X 0 0 0 | 0 0 0 0 | 1 0 0 3 | 0 0 0 1 0 |
| X 0 0 0 | 0 0 0 0 | 1 0 0 4 | 0 0 0 1 0 |
| X 0 0 0 | 0 0 0 0 | 1 0 0 5 | 0 0 0 1 0 |
| X 0 0 0 | 0 0 0 0 | 1 0 0 6 | 0 0 0 1 0 |
| X 0 0 0 | 0 0 0 0 | 1 0 0 7 | 0 0 0 1 0 |
| X 0 0 0 | 0 0 0 0 | 1 0 0 8 | 0 0 0 1 0 |
| X 0 0 0 | 0 0 0 0 | 1 0 0 9 | 0 0 0 1 0 |
| X 0 0 0 | 0 0 0 0 | 2 0 0 1 | 0 0 0 1 0 |
| X 0 0 0 | 0 0 0 0 | 2 0 0 2 | 0 0 0 1 0 |
| X 0 0 0 | 0 0 0 0 | 2 0 0 3 | 0 0 0 1 0 |
| X 0 0 0 | 0 0 0 0 | 2 0 0 4 | 0 0 0 1 0 |
| X 0 0 0 | 0 0 0 0 | 2 0 0 5 | 0 0 0 1 0 |
| X 0 0 0 | 0 0 0 0 | 2 0 0 6 | 0 0 0 1 0 |
| X 0 0 0 | 0 0 0 0 | 2 0 0 7 | 0 0 0 1 0 |
| X 0 0 0 | 0 0 0 0 | 2 0 0 8 | 0 0 0 1 0 |
| X 0 0 0 | 0 0 0 0 | 2 0 0 9 | 0 0 0 1 0 |
| X 0 0 0 | 0 0 0 0 | 3 0 0 1 | 0 0 0 1 0 |
| X 0 0 0 | 0 0 0 0 | 3 0 0 2 | 0 0 0 1 0 |
| X 0 0 0 | 0 0 0 0 | 3 0 0 3 | 0 0 0 1 0 |
| X 0 0 0 | 0 0 0 0 | 3 0 0 4 | 0 0 0 1 0 |
| X 0 0 0 | 0 0 0 0 | 3 0 0 5 | 0 0 0 1 0 |
| X 0 0 0 | 0 0 0 0 | 3 0 0 6 | 0 0 0 1 0 |
| X 0 0 0 | 0 0 0 0 | 3 0 0 7 | 0 0 0 1 0 |
| X 0 0 0 | 0 0 0 0 | 3 0 0 8 | 0 0 0 1 0 |
| X 0 0 0 | 0 0 0 0 | 3 0 0 9 | 0 0 0 1 0 |
| X 0 0 0 | 0 0 0 0 | 4 0 0 1 | 0 0 0 1 0 |
| X 0 0 0 | 0 0 0 0 | 4 0 0 2 | 0 0 0 1 0 |
| X 0 0 0 | 0 0 0 0 | 4 0 0 3 | 0 0 0 1 0 |
| X 0 0 0 | 0 0 0 0 | 4 0 0 4 | 0 0 0 1 0 |
| X 0 0 0 | 0 0 0 0 | 4 0 0 5 | 0 0 0 1 0 |
| 0 0 0 0 | 0 0 0 0 | 4 0 0 6 | 0 0 0 1 1 |
| 0 0 0 0 | 0 0 0 0 | 4 0 0 7 | 0 0 0 1 1 |
| 0 0 0 0 | 0 0 0 0 | 4 0 0 8 | 0 0 0 1 1 |
| 0 0 0 0 | 0 0 0 0 | 4 0 0 9 | 0 0 0 1 1 |
| 0 0 0 0 | 0 0 0 0 | 5 0 0 1 | 0 0 0 1 1 |
| 0 0 0 0 | 0 0 0 0 | 5 0 0 2 | 0 0 0 1 1 |
| 0 0 0 0 | 0 0 0 0 | 5 0 0 3 | 0 0 0 1 1 |
| 0 0 0 0 | 0 0 0 0 | 5 0 0 4 | 0 0 0 1 1 |
| 0 0 0 0 | 0 0 0 0 | 5 0 0 5 | 0 0 0 1 1 |
| 0 0 0 0 | 0 0 0 0 | 5 0 0 6 | 0 0 0 1 1 |
| 0 0 0 0 | 0 0 0 0 | 5 0 0 7 | 0 0 0 1 1 |
| 0 0 0 0 | 0 0 0 0 | 5 0 0 8 | 0 0 0 1 1 |
| 0 0 0 0 | 0 0 0 0 | 5 0 0 9 | 0 0 0 1 1 |
| 0 0 0 0 | 0 0 0 0 | 6 0 0 1 | 0 0 0 1 1 |
| 0 0 0 0 | 0 0 0 0 | 6 0 0 2 | 0 0 0 1 1 |
| 0 0 0 0 | 0 0 0 0 | 6 0 0 3 | 0 0 0 1 1 |
| 0 0 0 0 | 0 0 0 0 | 6 0 0 4 | 0 0 0 1 1 |
| 0 0 0 0 | 0 0 0 0 | 6 0 0 5 | 0 0 0 1 1 |
| 0 0 0 0 | 0 0 0 0 | 6 0 0 6 | 0 0 0 1 1 |
| 0 0 0 0 | 0 0 0 0 | 6 0 0 7 | 0 0 0 1 1 |
| 0 0 0 0 | 0 0 0 0 | 6 0 0 8 | 0 0 0 1 1 |
| 0 0 0 0 | 0 0 0 0 | 6 0 0 9 | 0 0 0 1 1 |
| 0 0 0 0 | 0 0 0 0 | 7 0 0 1 | 0 0 0 1 1 |
| 0 0 0 0 | 0 0 0 0 | 7 0 0 2 | 0 0 0 1 1 |
| 0 0 0 0 | 0 0 0 0 | 7 0 0 3 | 0 0 0 1 1 |
| 0 0 0 0 | 0 0 0 0 | 7 0 0 4 | 0 0 0 1 1 |
| 0 0 0 0 | 0 0 0 0 | 7 0 0 5 | 0 0 0 1 1 |
| 0 0 0 0 | 0 0 0 0 | 7 0 0 6 | 0 0 0 1 1 |
| 0 0 0 0 | 0 0 0 0 | 7 0 0 7 | 0 0 0 1 1 |
| 0 0 0 0 | 0 0 0 0 | 7 0 0 8 | 0 0 0 1 1 |
| 0 0 0 0 | 0 0 0 0 | 7 0 0 9 | 0 0 0 1 1 |
| 0 0 0 0 | 0 0 0 0 | 8 0 0 1 | 0 0 0 1 1 |
| 0 X 0 0 | 0 0 0 0 | 4 0 0 6 | 0 0 0 1 1 |
| 0 X 0 0 | 0 0 0 0 | 4 0 0 7 | 0 0 0 1 1 |
| 0 X 0 0 | 0 0 0 0 | 4 0 0 8 | 0 0 0 1 1 |
| 0 X 0 0 | 0 0 0 0 | 4 0 0 9 | 0 0 0 1 1 |
| 0 X 0 0 | 0 0 0 0 | 5 0 0 1 | 0 0 0 1 1 |
| 0 X 0 0 | 0 0 0 0 | 5 0 0 2 | 0 0 0 1 1 |
| 0 X 0 0 | 0 0 0 0 | 5 0 0 3 | 0 0 0 1 1 |
| 0 X 0 0 | 0 0 0 0 | 5 0 0 4 | 0 0 0 1 1 |
| 0 X 0 0 | 0 0 0 0 | 5 0 0 5 | 0 0 0 1 1 |
| 0 X 0 0 | 0 0 0 0 | 5 0 0 6 | 0 0 0 1 1 |
| 0 X 0 0 | 0 0 0 0 | 5 0 0 7 | 0 0 0 1 1 |
| 0 X 0 0 | 0 0 0 0 | 5 0 0 8 | 0 0 0 1 1 |

-continued

| Window Contents | | | X' |
|---|---|---|---|
| 0X00 | 0000 | 5009 | 00011 |
| 0X00 | 0000 | 6001 | 00011 |
| 0X00 | 0000 | 6002 | 00011 |
| 0X00 | 0000 | 6003 | 00011 |
| 0X00 | 0000 | 6004 | 00011 |
| 0X00 | 0000 | 6005 | 00011 |
| 0X00 | 0000 | 6006 | 00011 |
| 0X00 | 0000 | 6007 | 00011 |
| 0X00 | 0000 | 6008 | 00011 |
| 0X00 | 0000 | 6009 | 00011 |
| 0X00 | 0000 | 7001 | 00011 |
| 0X00 | 0000 | 7002 | 00011 |
| 0X00 | 0000 | 7003 | 00011 |
| 0X00 | 0000 | 7004 | 00011 |
| 0X00 | 0000 | 7005 | 00011 |
| 0X00 | 0000 | 7006 | 00011 |
| 0X00 | 0000 | 7007 | 00011 |
| 0X00 | 0000 | 7008 | 00011 |
| 0X00 | 0000 | 7009 | 00011 |
| 0X00 | 0000 | 8001 | 00011 |
| X000 | 0000 | 4006 | 00011 |
| X000 | 0000 | 4007 | 00011 |
| X000 | 0000 | 4008 | 00011 |
| X000 | 0000 | 4009 | 00011 |
| X000 | 0000 | 5001 | 00011 |
| X000 | 0000 | 5002 | 00011 |
| X000 | 0000 | 5003 | 00011 |
| X000 | 0000 | 5004 | 00011 |
| X000 | 0000 | 5005 | 00011 |
| X000 | 0000 | 5006 | 00011 |
| X000 | 0000 | 5007 | 00011 |
| X000 | 0000 | 5008 | 00011 |
| X000 | 0000 | 5009 | 00011 |
| X000 | 0000 | 6001 | 00011 |
| X000 | 0000 | 6002 | 00011 |
| X000 | 0000 | 6003 | 00011 |
| X000 | 0000 | 6004 | 00011 |
| X000 | 0000 | 6005 | 00011 |
| X000 | 0000 | 6006 | 00011 |
| X000 | 0000 | 6007 | 00011 |
| X000 | 0000 | 6008 | 00011 |
| X000 | 0000 | 6009 | 00011 |
| X000 | 0000 | 7001 | 00011 |
| X000 | 0000 | 7002 | 00011 |
| X000 | 0000 | 7003 | 00011 |
| X000 | 0000 | 7004 | 00011 |
| X000 | 0000 | 7005 | 00011 |
| X000 | 0000 | 7006 | 00011 |
| X000 | 0000 | 7007 | 00011 |
| X000 | 0000 | 7008 | 00011 |
| X000 | 0000 | 7009 | 00011 |
| X000 | 0000 | 8001 | 00011 |
| 0000 | 0000 | 8002 | 00100 |
| 0000 | 0000 | 8003 | 00100 |
| 0000 | 0000 | 8004 | 00100 |
| 0000 | 0000 | 8005 | 00100 |
| 0000 | 0000 | 8006 | 00100 |
| 0000 | 0000 | 8007 | 00100 |
| 0000 | 0000 | 8008 | 00100 |
| 0000 | 0000 | 8009 | 00100 |
| 0000 | 0000 | 9001 | 00100 |
| 0000 | 0000 | 9002 | 00100 |
| 0000 | 0000 | 9003 | 00100 |
| 0000 | 0000 | 9004 | 00100 |
| 0000 | 0000 | 9005 | 00100 |
| 0000 | 0000 | 9006 | 00100 |
| 0000 | 0000 | 9007 | 00100 |
| 0000 | 0000 | 9008 | 00100 |
| 0000 | 0000 | 9009 | 00100 |
| 0000 | 0000 | 1000 | 00100 |
| 0000 | 0000 | 2000 | 00100 |
| 0000 | 0000 | 3000 | 00100 |
| 0X00 | 0000 | 8002 | 00100 |
| 0X00 | 0000 | 8003 | 00100 |
| 0X00 | 0000 | 8004 | 00100 |
| 0X00 | 0000 | 8005 | 00100 |
| 0X00 | 0000 | 8006 | 00100 |

-continued

| Window Contents | | | X' |
|---|---|---|---|
| 0X00 | 0000 | 8007 | 00100 |
| 0X00 | 0000 | 8008 | 00100 |
| 0X00 | 0000 | 8009 | 00100 |
| 0X00 | 0000 | 9001 | 00100 |
| 0X00 | 0000 | 9002 | 00100 |
| 0X00 | 0000 | 9003 | 00100 |
| 0X00 | 0000 | 9004 | 00100 |
| 0X00 | 0000 | 9005 | 00100 |
| 0X00 | 0000 | 9006 | 00100 |
| 0X00 | 0000 | 9007 | 00100 |
| 0X00 | 0000 | 9008 | 00100 |
| 0X00 | 0000 | 9009 | 00100 |
| 0X00 | 0000 | 1000 | 00100 |
| 0X00 | 0000 | 2000 | 00100 |
| 0X00 | 0000 | 3000 | 00100 |
| X000 | 0000 | 8002 | 00100 |
| X000 | 0000 | 8003 | 00100 |
| X000 | 0000 | 8004 | 00100 |
| X000 | 0000 | 8005 | 00100 |
| X000 | 0000 | 8006 | 00100 |
| X000 | 0000 | 8007 | 00100 |
| X000 | 0000 | 8008 | 00100 |
| X000 | 0000 | 8009 | 00100 |
| X000 | 0000 | 9001 | 00100 |
| X000 | 0000 | 9002 | 00100 |
| X000 | 0000 | 9003 | 00100 |
| X000 | 0000 | 9004 | 00100 |
| X000 | 0000 | 9005 | 00100 |
| X000 | 0000 | 9006 | 00100 |
| X000 | 0000 | 9007 | 00100 |
| X000 | 0000 | 9008 | 00100 |
| X000 | 0000 | 9009 | 00100 |
| X000 | 0000 | 1000 | 00100 |
| X000 | 0000 | 2000 | 00100 |
| X000 | 0000 | 3000 | 00100 |
| XXXX | 1001 | XXXX | 00000 |
| XXXX | 1002 | XXXX | 00001 |
| XXXX | 1003 | XXXX | 00010 |
| XXXX | 1004 | XXXX | 00011 |
| XXXX | 1005 | XXXX | 00100 |
| XXXX | 1006 | XXXX | 00101 |
| XXXX | 1007 | XXXX | 00110 |
| XXXX | 1008 | XXXX | 00111 |
| XXXX | 1009 | XXXX | 01000 |
| XXXX | 2001 | XXXX | 01001 |
| XXXX | 2002 | XXXX | 01010 |
| XXXX | 2003 | XXXX | 01011 |
| XXXX | 2004 | XXXX | 01100 |
| XXXX | 2005 | XXXX | 01101 |
| XXXX | 2006 | XXXX | 01110 |
| XXXX | 2007 | XXXX | 01111 |
| XXXX | 2008 | XXXX | 10000 |
| XXXX | 2009 | XXXX | 10001 |
| XXXX | 3001 | XXXX | 10010 |
| XXXX | 3002 | XXXX | 10011 |
| XXXX | 3003 | XXXX | 10100 |
| XXXX | 3004 | XXXX | 10101 |
| XXXX | 3005 | XXXX | 10110 |
| XXXX | 3006 | XXXX | 10111 |
| XXXX | 3007 | XXXX | 11000 |
| XXXX | 3008 | XXXX | 11001 |
| XXXX | 3009 | XXXX | 11010 |
| XXXX | 4001 | XXXX | 11011 |
| XXXX | 4002 | XXXX | 11100 |
| XXXX | 4003 | XXXX | 11101 |
| XXXX | 4004 | XXXX | 11110 |
| XXXX | 4005 | XXXX | 11111 |
| XXXX | 4006 | XXXX | 00000 |
| XXXX | 4007 | XXXX | 00001 |
| XXXX | 4008 | XXXX | 00010 |
| XXXX | 4009 | XXXX | 00011 |
| XXXX | 5001 | XXXX | 00100 |
| XXXX | 5002 | XXXX | 00101 |
| XXXX | 5003 | XXXX | 00110 |
| XXXX | 5004 | XXXX | 00111 |
| XXXX | 5005 | XXXX | 01000 |
| XXXX | 5006 | XXXX | 01001 |

-continued

| Window Contents | | | X' |
|---|---|---|---|
| XXXX | 5007 | XXXX | 01010 |
| XXXX | 5008 | XXXX | 01011 |
| XXXX | 5009 | XXXX | 01100 |
| XXXX | 6001 | XXXX | 01101 |
| XXXX | 6002 | XXXX | 01110 |
| XXXX | 6003 | XXXX | 01111 |
| XXXX | 6004 | XXXX | 10000 |
| XXXX | 6005 | XXXX | 10001 |
| XXXX | 6006 | XXXX | 10010 |
| XXXX | 6007 | XXXX | 10011 |
| XXXX | 6008 | XXXX | 10100 |
| XXXX | 6009 | XXXX | 10101 |
| XXXX | 7001 | XXXX | 10110 |
| XXXX | 7002 | XXXX | 10111 |
| XXXX | 7003 | XXXX | 11000 |
| XXXX | 7004 | XXXX | 11001 |
| XXXX | 7005 | XXXX | 11010 |
| XXXX | 7006 | XXXX | 11011 |
| XXXX | 7007 | XXXX | 11100 |
| XXXX | 7008 | XXXX | 11101 |
| XXXX | 7009 | XXXX | 11110 |
| XXXX | 8001 | XXXX | 11111 |
| XXXX | 8002 | XXXX | 00000 |
| XXXX | 8003 | XXXX | 00001 |
| XXXX | 8004 | XXXX | 00010 |
| XXXX | 8005 | XXXX | 00011 |
| XXXX | 8006 | XXXX | 00100 |
| XXXX | 8007 | XXXX | 00101 |
| XXXX | 8008 | XXXX | 00110 |
| XXXX | 8009 | XXXX | 00111 |
| XXXX | 9001 | XXXX | 01000 |
| XXXX | 9002 | XXXX | 01001 |
| XXXX | 9003 | XXXX | 01010 |
| XXXX | 9004 | XXXX | 01011 |
| XXXX | 9005 | XXXX | 01100 |
| XXXX | 9006 | XXXX | 01101 |
| XXXX | 9007 | XXXX | 01110 |
| XXXX | 9008 | XXXX | 01111 |
| XXXX | 9009 | XXXX | 10000 |
| XXXX | 1000 | 0100 | 10001 |
| XXXX | 1000 | 0200 | 10001 |
| XXXX | 1000 | 0300 | 10001 |
| XXXX | 1000 | 0400 | 10001 |
| XXXX | 1000 | 0500 | 10001 |
| XXXX | 1000 | 0600 | 10001 |
| XXXX | 1000 | 0700 | 10001 |
| XXXX | 2000 | 0100 | 10010 |
| XXXX | 2000 | 0200 | 10010 |
| XXXX | 2000 | 0300 | 10010 |
| XXXX | 2000 | 0400 | 10010 |
| XXXX | 2000 | 0500 | 10010 |
| XXXX | 2000 | 0600 | 10010 |
| XXXX | 2000 | 0700 | 10010 |
| XXXX | 3000 | 0100 | 10011 |
| XXXX | 3000 | 0200 | 10011 |
| XXXX | 3000 | 0300 | 10011 |
| XXXX | 3000 | 0400 | 10011 |
| XXXX | 3000 | 0500 | 10011 |
| XXXX | 3000 | 0600 | 10011 |
| XXXX | 3000 | 0700 | 10011 |
| XXXX | 1000 | 0000 | 10100 |
| XXXX | 1000 | 00X0 | 10100 |
| XXXX | 1000 | 000X | 10100 |
| XXXX | 2000 | 0000 | 10101 |
| XXXX | 2000 | 00X0 | 10101 |
| XXXX | 2000 | 000X | 10101 |
| XXXX | 3000 | 0000 | 10110 |
| XXXX | 3000 | 00X0 | 10110 |
| XXXX | 3000 | 000X | 10110 |
| XXXX | 1000 | 1001 | 10111 |
| XXXX | 1000 | 1002 | 10111 |
| XXXX | 1000 | 1003 | 10111 |
| XXXX | 1000 | 1004 | 10111 |
| XXXX | 1000 | 1005 | 10111 |
| XXXX | 1000 | 1006 | 10111 |
| XXXX | 1000 | 1007 | 10111 |
| XXXX | 1000 | 1008 | 10111 |

-continued

| Window Contents | | | X' |
|---|---|---|---|
| XXXX | 1000 | 1009 | 10111 |
| XXXX | 1000 | 2001 | 10111 |
| XXXX | 1000 | 2002 | 10111 |
| XXXX | 1000 | 2003 | 10111 |
| XXXX | 1000 | 2004 | 10111 |
| XXXX | 1000 | 2005 | 10111 |
| XXXX | 1000 | 2006 | 10111 |
| XXXX | 1000 | 2007 | 10111 |
| XXXX | 1000 | 2008 | 10111 |
| XXXX | 1000 | 2009 | 10111 |
| XXXX | 1000 | 3001 | 10111 |
| XXXX | 1000 | 3002 | 10111 |
| XXXX | 1000 | 3003 | 10111 |
| XXXX | 1000 | 3004 | 10111 |
| XXXX | 1000 | 3005 | 10111 |
| XXXX | 1000 | 3006 | 10111 |
| XXXX | 1000 | 3007 | 10111 |
| XXXX | 1000 | 3008 | 10111 |
| XXXX | 1000 | 3009 | 10111 |
| XXXX | 1000 | 4001 | 10111 |
| XXXX | 1000 | 4002 | 10111 |
| XXXX | 1000 | 4003 | 10111 |
| XXXX | 1000 | 4004 | 10111 |
| XXXX | 1000 | 4005 | 10111 |
| XXXX | 2000 | 1001 | 11000 |
| XXXX | 2000 | 1002 | 11000 |
| XXXX | 2000 | 1003 | 11000 |
| XXXX | 2000 | 1004 | 11000 |
| XXXX | 2000 | 1005 | 11000 |
| XXXX | 2000 | 1006 | 11000 |
| XXXX | 2000 | 1007 | 11000 |
| XXXX | 2000 | 1008 | 11000 |
| XXXX | 2000 | 1009 | 11000 |
| XXXX | 2000 | 2001 | 11000 |
| XXXX | 2000 | 2002 | 11000 |
| XXXX | 2000 | 2003 | 11000 |
| XXXX | 2000 | 2004 | 11000 |
| XXXX | 2000 | 2005 | 11000 |
| XXXX | 2000 | 2006 | 11000 |
| XXXX | 2000 | 2007 | 11000 |
| XXXX | 2000 | 2008 | 11000 |
| XXXX | 2000 | 2009 | 11000 |
| XXXX | 2000 | 3001 | 11000 |
| XXXX | 2000 | 3002 | 11000 |
| XXXX | 2000 | 3003 | 11000 |
| XXXX | 2000 | 3004 | 11000 |
| XXXX | 2000 | 3005 | 11000 |
| XXXX | 2000 | 3006 | 11000 |
| XXXX | 2000 | 3007 | 11000 |
| XXXX | 2000 | 3008 | 11000 |
| XXXX | 2000 | 3009 | 11000 |
| XXXX | 2000 | 4001 | 11000 |
| XXXX | 2000 | 4002 | 11000 |
| XXXX | 2000 | 4003 | 11000 |
| XXXX | 2000 | 4004 | 11000 |
| XXXX | 2000 | 4005 | 11000 |
| XXXX | 3000 | 1001 | 11001 |
| XXXX | 3000 | 1002 | 11001 |
| XXXX | 3000 | 1003 | 11001 |
| XXXX | 3000 | 1004 | 11001 |
| XXXX | 3000 | 1005 | 11001 |
| XXXX | 3000 | 1006 | 11001 |
| XXXX | 3000 | 1007 | 11001 |
| XXXX | 3000 | 1008 | 11001 |
| XXXX | 3000 | 1009 | 11001 |
| XXXX | 3000 | 2001 | 11001 |
| XXXX | 3000 | 2002 | 11001 |
| XXXX | 3000 | 2003 | 11001 |
| XXXX | 3000 | 2004 | 11001 |
| XXXX | 3000 | 2005 | 11001 |
| XXXX | 3000 | 2006 | 11001 |
| XXXX | 3000 | 2007 | 11001 |
| XXXX | 3000 | 2008 | 11001 |
| XXXX | 3000 | 2009 | 11001 |
| XXXX | 3000 | 3001 | 11001 |
| XXXX | 3000 | 3002 | 11001 |
| XXXX | 3000 | 3003 | 11001 |

-continued

| Window Contents | | | X' |
|---|---|---|---|
| XXXX | 3000 | 3004 | 11001 |
| XXXX | 3000 | 3005 | 11001 |
| XXXX | 3000 | 3006 | 11001 |
| XXXX | 3000 | 3007 | 11001 |
| XXXX | 3000 | 3008 | 11001 |
| XXXX | 3000 | 3009 | 11001 |
| XXXX | 3000 | 4001 | 11001 |
| XXXX | 3000 | 4002 | 11001 |
| XXXX | 3000 | 4003 | 11001 |
| XXXX | 3000 | 4004 | 11001 |
| XXXX | 3000 | 4005 | 11001 |
| XXXX | 1000 | 4006 | 11010 |
| XXXX | 1000 | 4007 | 11010 |
| XXXX | 1000 | 4008 | 11010 |
| XXXX | 1000 | 4009 | 11010 |
| XXXX | 1000 | 5001 | 11010 |
| XXXX | 1000 | 5002 | 11010 |
| XXXX | 1000 | 5003 | 11010 |
| XXXX | 1000 | 5004 | 11010 |
| XXXX | 1000 | 5005 | 11010 |
| XXXX | 1000 | 5006 | 11010 |
| XXXX | 1000 | 5007 | 11010 |
| XXXX | 1000 | 5008 | 11010 |
| XXXX | 1000 | 5009 | 11010 |
| XXXX | 1000 | 6001 | 11010 |
| XXXX | 1000 | 6002 | 11010 |
| XXXX | 1000 | 6003 | 11010 |
| XXXX | 1000 | 6004 | 11010 |
| XXXX | 1000 | 6005 | 11010 |
| XXXX | 1000 | 6006 | 11010 |
| XXXX | 1000 | 6007 | 11010 |
| XXXX | 1000 | 6008 | 11010 |
| XXXX | 1000 | 6009 | 11010 |
| XXXX | 1000 | 7001 | 11010 |
| XXXX | 1000 | 7002 | 11010 |
| XXXX | 1000 | 7003 | 11010 |
| XXXX | 1000 | 7004 | 11010 |
| XXXX | 1000 | 7005 | 11010 |
| XXXX | 1000 | 7006 | 11010 |
| XXXX | 1000 | 7007 | 11010 |
| XXXX | 1000 | 7008 | 11010 |
| XXXX | 1000 | 7009 | 11010 |
| XXXX | 1000 | 8001 | 11010 |
| XXXX | 2000 | 4006 | 11011 |
| XXXX | 2000 | 4007 | 11011 |
| XXXX | 2000 | 4008 | 11011 |
| XXXX | 2000 | 4009 | 11011 |
| XXXX | 2000 | 5001 | 11011 |
| XXXX | 2000 | 5002 | 11011 |
| XXXX | 2000 | 5003 | 11011 |
| XXXX | 2000 | 5004 | 11011 |
| XXXX | 2000 | 5005 | 11011 |
| XXXX | 2000 | 5006 | 11011 |
| XXXX | 2000 | 5007 | 11011 |
| XXXX | 2000 | 5008 | 11011 |
| XXXX | 2000 | 5009 | 11011 |
| XXXX | 2000 | 6001 | 11011 |
| XXXX | 2000 | 6002 | 11011 |
| XXXX | 2000 | 6003 | 11011 |
| XXXX | 2000 | 6004 | 11011 |
| XXXX | 2000 | 6005 | 11011 |
| XXXX | 2000 | 6006 | 11011 |
| XXXX | 2000 | 6007 | 11011 |
| XXXX | 2000 | 6008 | 11011 |
| XXXX | 2000 | 6009 | 11011 |
| XXXX | 2000 | 7001 | 11011 |
| XXXX | 2000 | 7002 | 11011 |
| XXXX | 2000 | 7003 | 11011 |
| XXXX | 2000 | 7004 | 11011 |
| XXXX | 2000 | 7005 | 11011 |
| XXXX | 2000 | 7006 | 11011 |
| XXXX | 2000 | 7007 | 11011 |
| XXXX | 2000 | 7008 | 11011 |
| XXXX | 2000 | 7009 | 11011 |
| XXXX | 2000 | 8001 | 11011 |
| XXXX | 3000 | 4006 | 11100 |
| XXXX | 3000 | 4007 | 11100 |

-continued

| Window Contents | | | X' |
|---|---|---|---|
| XXXX | 3000 | 4008 | 11100 |
| XXXX | 3000 | 4009 | 11100 |
| XXXX | 3000 | 5001 | 11100 |
| XXXX | 3000 | 5002 | 11100 |
| XXXX | 3000 | 5003 | 11100 |
| XXXX | 3000 | 5004 | 11100 |
| XXXX | 3000 | 5005 | 11100 |
| XXXX | 3000 | 5006 | 11100 |
| XXXX | 3000 | 5007 | 11100 |
| XXXX | 3000 | 5008 | 11100 |
| XXXX | 3000 | 5009 | 11100 |
| XXXX | 3000 | 6001 | 11100 |
| XXXX | 3000 | 6002 | 11100 |
| XXXX | 3000 | 6003 | 11100 |
| XXXX | 3000 | 6004 | 11100 |
| XXXX | 3000 | 6005 | 11100 |
| XXXX | 3000 | 6006 | 11100 |
| XXXX | 3000 | 6007 | 11100 |
| XXXX | 3000 | 6008 | 11100 |
| XXXX | 3000 | 6009 | 11100 |
| XXXX | 3000 | 7001 | 11100 |
| XXXX | 3000 | 7002 | 11100 |
| XXXX | 3000 | 7003 | 11100 |
| XXXX | 3000 | 7004 | 11100 |
| XXXX | 3000 | 7005 | 11100 |
| XXXX | 3000 | 7006 | 11100 |
| XXXX | 3000 | 7007 | 11100 |
| XXXX | 3000 | 7008 | 11100 |
| XXXX | 3000 | 7009 | 11100 |
| XXXX | 3000 | 8001 | 11100 |
| XXXX | 1000 | 8002 | 11101 |
| XXXX | 1000 | 8003 | 11101 |
| XXXX | 1000 | 8004 | 11101 |
| XXXX | 1000 | 8005 | 11101 |
| XXXX | 1000 | 8006 | 11101 |
| XXXX | 1000 | 8007 | 11101 |
| XXXX | 1000 | 8008 | 11101 |
| XXXX | 1000 | 8009 | 11101 |
| XXXX | 1000 | 9001 | 11101 |
| XXXX | 1000 | 9002 | 11101 |
| XXXX | 1000 | 9003 | 11101 |
| XXXX | 1000 | 9004 | 11101 |
| XXXX | 1000 | 9005 | 11101 |
| XXXX | 1000 | 9006 | 11101 |
| XXXX | 1000 | 9007 | 11101 |
| XXXX | 1000 | 9008 | 11101 |
| XXXX | 1000 | 9009 | 11101 |
| XXXX | 1000 | 1000 | 11101 |
| XXXX | 1000 | 2000 | 11101 |
| XXXX | 1000 | 3000 | 11101 |
| XXXX | 2000 | 8002 | 11110 |
| XXXX | 2000 | 8003 | 11110 |
| XXXX | 2000 | 8004 | 11110 |
| XXXX | 2000 | 8005 | 11110 |
| XXXX | 2000 | 8006 | 11110 |
| XXXX | 2000 | 8007 | 11110 |
| XXXX | 2000 | 8008 | 11110 |
| XXXX | 2000 | 8009 | 11110 |
| XXXX | 2000 | 9001 | 11110 |
| XXXX | 2000 | 9002 | 11110 |
| XXXX | 2000 | 9003 | 11110 |
| XXXX | 2000 | 9004 | 11110 |
| XXXX | 2000 | 9005 | 11110 |
| XXXX | 2000 | 9006 | 11110 |
| XXXX | 2000 | 9007 | 11110 |
| XXXX | 2000 | 9008 | 11110 |
| XXXX | 2000 | 9009 | 11110 |
| XXXX | 2000 | 1000 | 11110 |
| XXXX | 2000 | 2000 | 11110 |
| XXXX | 2000 | 3000 | 11110 |
| XXXX | 3000 | 8002 | 11111 |
| XXXX | 3000 | 8003 | 11111 |
| XXXX | 3000 | 8004 | 11111 |
| XXXX | 3000 | 8005 | 11111 |
| XXXX | 3000 | 8006 | 11111 |
| XXXX | 3000 | 8007 | 11111 |
| XXXX | 3000 | 8008 | 11111 |

-continued

| Window Contents | | | X' |
|---|---|---|---|
| X X X X | 3 0 0 0 | 8 0 0 9 | 1 1 1 1 1 |
| X X X X | 3 0 0 0 | 9 0 0 1 | 1 1 1 1 1 |
| X X X X | 3 0 0 0 | 9 0 0 2 | 1 1 1 1 1 |
| X X X X | 3 0 0 0 | 9 0 0 3 | 1 1 1 1 1 |
| X X X X | 3 0 0 0 | 9 0 0 4 | 1 1 1 1 1 |
| X X X X | 3 0 0 0 | 9 0 0 5 | 1 1 1 1 1 |
| X X X X | 3 0 0 0 | 9 0 0 6 | 1 1 1 1 1 |
| X X X X | 3 0 0 0 | 9 0 0 7 | 1 1 1 1 1 |
| X X X X | 3 0 0 0 | 9 0 0 8 | 1 1 1 1 1 |
| X X X X | 3 0 0 0 | 9 0 0 9 | 1 1 1 1 1 |
| X X X X | 3 0 0 0 | 1 0 0 0 | 1 1 1 1 1 |
| X X X X | 3 0 0 0 | 2 0 0 0 | 1 1 1 1 1 |
| X X X X | 3 0 0 0 | 3 0 0 0 | 1 1 1 1 1 |
| X X X X | 4 0 0 0 | 0 1 0 0 | 0 0 0 0 0 |
| X X X X | 4 0 0 0 | 0 2 0 0 | 0 0 0 0 0 |
| X X X X | 4 0 0 0 | 0 3 0 0 | 0 0 0 0 0 |
| X X X X | 4 0 0 0 | 0 4 0 0 | 0 0 0 0 0 |
| X X X X | 4 0 0 0 | 0 5 0 0 | 0 0 0 0 0 |
| X X X X | 4 0 0 0 | 0 6 0 0 | 0 0 0 0 0 |
| X X X X | 4 0 0 0 | 0 7 0 0 | 0 0 0 0 0 |
| X X X X | 5 0 0 0 | 0 1 0 0 | 0 0 0 0 1 |
| X X X X | 5 0 0 0 | 0 2 0 0 | 0 0 0 0 1 |
| X X X X | 5 0 0 0 | 0 3 0 0 | 0 0 0 0 1 |
| X X X X | 5 0 0 0 | 0 4 0 0 | 0 0 0 0 1 |
| X X X X | 5 0 0 0 | 0 5 0 0 | 0 0 0 0 1 |
| X X X X | 5 0 0 0 | 0 6 0 0 | 0 0 0 0 1 |
| X X X X | 5 0 0 0 | 0 7 0 0 | 0 0 0 0 1 |
| X X X X | 6 0 0 0 | 0 1 0 0 | 0 0 0 1 0 |
| X X X X | 6 0 0 0 | 0 2 0 0 | 0 0 0 1 0 |
| X X X X | 6 0 0 0 | 0 3 0 0 | 0 0 0 1 0 |
| X X X X | 6 0 0 0 | 0 4 0 0 | 0 0 0 1 0 |
| X X X X | 6 0 0 0 | 0 5 0 0 | 0 0 0 1 0 |
| X X X X | 6 0 0 0 | 0 6 0 0 | 0 0 0 1 0 |
| X X X X | 6 0 0 0 | 0 7 0 0 | 0 0 0 1 0 |
| X X X X | 7 0 0 0 | 0 1 0 0 | 0 0 0 1 1 |
| X X X X | 7 0 0 0 | 0 2 0 0 | 0 0 0 1 1 |
| X X X X | 7 0 0 0 | 0 3 0 0 | 0 0 0 1 1 |
| X X X X | 7 0 0 0 | 0 4 0 0 | 0 0 0 1 1 |
| X X X X | 7 0 0 0 | 0 5 0 0 | 0 0 0 1 1 |
| X X X X | 7 0 0 0 | 0 6 0 0 | 0 0 0 1 1 |
| X X X X | 7 0 0 0 | 0 7 0 0 | 0 0 0 1 1 |
| X X X X | 8 0 0 0 | 0 1 0 0 | 0 0 1 0 0 |
| X X X X | 8 0 0 0 | 0 2 0 0 | 0 0 1 0 0 |
| X X X X | 8 0 0 0 | 0 3 0 0 | 0 0 1 0 0 |
| X X X X | 8 0 0 0 | 0 4 0 0 | 0 0 1 0 0 |
| X X X X | 8 0 0 0 | 0 5 0 0 | 0 0 1 0 0 |
| X X X X | 8 0 0 0 | 0 6 0 0 | 0 0 1 0 0 |
| X X X X | 8 0 0 0 | 0 7 0 0 | 0 0 1 0 0 |
| X X X X | 9 0 0 0 | 0 1 0 0 | 0 0 1 0 1 |
| X X X X | 9 0 0 0 | 0 2 0 0 | 0 0 1 0 1 |
| X X X X | 9 0 0 0 | 0 3 0 0 | 0 0 1 0 1 |
| X X X X | 9 0 0 0 | 0 4 0 0 | 0 0 1 0 1 |
| X X X X | 9 0 0 0 | 0 5 0 0 | 0 0 1 0 1 |
| X X X X | 9 0 0 0 | 0 6 0 0 | 0 0 1 0 1 |
| X X X X | 9 0 0 0 | 0 7 0 0 | 0 0 1 0 1 |
| X X X X | 4 0 0 0 | 0 0 0 0 | 0 0 1 1 0 |
| X X X X | 4 0 0 0 | 0 0 X 0 | 0 0 1 1 0 |
| X X X X | 4 0 0 0 | 0 0 0 X | 0 0 1 1 0 |
| X X X X | 5 0 0 0 | 0 0 0 0 | 0 0 1 1 1 |
| X X X X | 5 0 0 0 | 0 0 X 0 | 0 0 1 1 1 |
| X X X X | 5 0 0 0 | 0 0 0 X | 0 0 1 1 1 |
| X X X X | 6 0 0 0 | 0 0 0 0 | 0 1 0 0 0 |
| X X X X | 6 0 0 0 | 0 0 X 0 | 0 1 0 0 0 |
| X X X X | 6 0 0 0 | 0 0 0 X | 0 1 0 0 0 |
| X X X X | 7 0 0 0 | 0 0 0 0 | 0 1 0 0 1 |
| X X X X | 7 0 0 0 | 0 0 X 0 | 0 1 0 0 1 |
| X X X X | 7 0 0 0 | 0 0 0 X | 0 1 0 0 1 |
| X X X X | 8 0 0 0 | 0 0 0 0 | 0 1 0 1 0 |
| X X X X | 8 0 0 0 | 0 0 X 0 | 0 1 0 1 0 |
| X X X X | 8 0 0 0 | 0 0 0 X | 0 1 0 1 0 |
| X X X X | 9 0 0 0 | 0 0 0 0 | 0 1 0 1 1 |
| X X X X | 9 0 0 0 | 0 0 X 0 | 0 1 0 1 1 |
| X X X X | 9 0 0 0 | 0 0 0 X | 0 1 0 1 1 |
| X X X X | 4 0 0 0 | 1 0 0 1 | 0 1 1 0 0 |
| X X X X | 4 0 0 0 | 1 0 0 2 | 0 1 1 0 0 |
| X X X X | 4 0 0 0 | 1 0 0 3 | 0 1 1 0 0 |
| X X X X | 4 0 0 0 | 1 0 0 4 | 0 1 1 0 0 |

-continued

| Window Contents | | | X' |
|---|---|---|---|
| X X X X | 4 0 0 0 | 1 0 0 5 | 0 1 1 0 0 |
| X X X X | 4 0 0 0 | 1 0 0 6 | 0 1 1 0 0 |
| X X X X | 4 0 0 0 | 1 0 0 7 | 0 1 1 0 0 |
| X X X X | 4 0 0 0 | 1 0 0 8 | 0 1 1 0 0 |
| X X X X | 4 0 0 0 | 1 0 0 9 | 0 1 1 0 0 |
| X X X X | 4 0 0 0 | 2 0 0 1 | 0 1 1 0 0 |
| X X X X | 4 0 0 0 | 2 0 0 2 | 0 1 1 0 0 |
| X X X X | 4 0 0 0 | 2 0 0 3 | 0 1 1 0 0 |
| X X X X | 4 0 0 0 | 2 0 0 4 | 0 1 1 0 0 |
| X X X X | 4 0 0 0 | 2 0 0 5 | 0 1 1 0 0 |
| X X X X | 4 0 0 0 | 2 0 0 6 | 0 1 1 0 0 |
| X X X X | 4 0 0 0 | 2 0 0 7 | 0 1 1 0 0 |
| X X X X | 4 0 0 0 | 2 0 0 8 | 0 1 1 0 0 |
| X X X X | 4 0 0 0 | 2 0 0 9 | 0 1 1 0 0 |
| X X X X | 4 0 0 0 | 3 0 0 1 | 0 1 1 0 0 |
| X X X X | 4 0 0 0 | 3 0 0 2 | 0 1 1 0 0 |
| X X X X | 4 0 0 0 | 3 0 0 3 | 0 1 1 0 0 |
| X X X X | 4 0 0 0 | 3 0 0 4 | 0 1 1 0 0 |
| X X X X | 4 0 0 0 | 3 0 0 5 | 0 1 1 0 0 |
| X X X X | 4 0 0 0 | 3 0 0 6 | 0 1 1 0 0 |
| X X X X | 4 0 0 0 | 3 0 0 7 | 0 1 1 0 0 |
| X X X X | 4 0 0 0 | 3 0 0 8 | 0 1 1 0 0 |
| X X X X | 4 0 0 0 | 3 0 0 9 | 0 1 1 0 0 |
| X X X X | 4 0 0 0 | 4 0 0 1 | 0 1 1 0 0 |
| X X X X | 4 0 0 0 | 4 0 0 2 | 0 1 1 0 0 |
| X X X X | 4 0 0 0 | 4 0 0 3 | 0 1 1 0 0 |
| X X X X | 4 0 0 0 | 4 0 0 4 | 0 1 1 0 0 |
| X X X X | 4 0 0 0 | 4 0 0 5 | 0 1 1 0 0 |
| X X X X | 5 0 0 0 | 1 0 0 1 | 0 1 1 0 1 |
| X X X X | 5 0 0 0 | 1 0 0 2 | 0 1 1 0 1 |
| X X X X | 5 0 0 0 | 1 0 0 3 | 0 1 1 0 1 |
| X X X X | 5 0 0 0 | 1 0 0 4 | 0 1 1 0 1 |
| X X X X | 5 0 0 0 | 1 0 0 5 | 0 1 1 0 1 |
| X X X X | 5 0 0 0 | 1 0 0 6 | 0 1 1 0 1 |
| X X X X | 5 0 0 0 | 1 0 0 7 | 0 1 1 0 1 |
| X X X X | 5 0 0 0 | 1 0 0 8 | 0 1 1 0 1 |
| X X X X | 5 0 0 0 | 1 0 0 9 | 0 1 1 0 1 |
| X X X X | 5 0 0 0 | 2 0 0 1 | 0 1 1 0 1 |
| X X X X | 5 0 0 0 | 2 0 0 2 | 0 1 1 0 1 |
| X X X X | 5 0 0 0 | 2 0 0 3 | 0 1 1 0 1 |
| X X X X | 5 0 0 0 | 2 0 0 4 | 0 1 1 0 1 |
| X X X X | 5 0 0 0 | 2 0 0 5 | 0 1 1 0 1 |
| X X X X | 5 0 0 0 | 2 0 0 6 | 0 1 1 0 1 |
| X X X X | 5 0 0 0 | 2 0 0 7 | 0 1 1 0 1 |
| X X X X | 5 0 0 0 | 2 0 0 8 | 0 1 1 0 1 |
| X X X X | 5 0 0 0 | 2 0 0 9 | 0 1 1 0 1 |
| X X X X | 5 0 0 0 | 3 0 0 1 | 0 1 1 0 1 |
| X X X X | 5 0 0 0 | 3 0 0 2 | 0 1 1 0 1 |
| X X X X | 5 0 0 0 | 3 0 0 3 | 0 1 1 0 1 |
| X X X X | 5 0 0 0 | 3 0 0 4 | 0 1 1 0 1 |
| X X X X | 5 0 0 0 | 3 0 0 5 | 0 1 1 0 1 |
| X X X X | 5 0 0 0 | 3 0 0 6 | 0 1 1 0 1 |
| X X X X | 5 0 0 0 | 3 0 0 7 | 0 1 1 0 1 |
| X X X X | 5 0 0 0 | 3 0 0 8 | 0 1 1 0 1 |
| X X X X | 5 0 0 0 | 3 0 0 9 | 0 1 1 0 1 |
| X X X X | 5 0 0 0 | 4 0 0 1 | 0 1 1 0 1 |
| X X X X | 5 0 0 0 | 4 0 0 2 | 0 1 1 0 1 |
| X X X X | 5 0 0 0 | 4 0 0 3 | 0 1 1 0 1 |
| X X X X | 5 0 0 0 | 4 0 0 4 | 0 1 1 0 1 |
| X X X X | 5 0 0 0 | 4 0 0 5 | 0 1 1 0 1 |
| X X X X | 6 0 0 0 | 1 0 0 1 | 0 1 1 1 0 |
| X X X X | 6 0 0 0 | 1 0 0 2 | 0 1 1 1 0 |
| X X X X | 6 0 0 0 | 1 0 0 3 | 0 1 1 1 0 |
| X X X X | 6 0 0 0 | 1 0 0 4 | 0 1 1 1 0 |
| X X X X | 6 0 0 0 | 1 0 0 5 | 0 1 1 1 0 |
| X X X X | 6 0 0 0 | 1 0 0 6 | 0 1 1 1 0 |
| X X X X | 6 0 0 0 | 1 0 0 7 | 0 1 1 1 0 |
| X X X X | 6 0 0 0 | 1 0 0 8 | 0 1 1 1 0 |
| X X X X | 6 0 0 0 | 1 0 0 9 | 0 1 1 1 0 |
| X X X X | 6 0 0 0 | 2 0 0 1 | 0 1 1 1 0 |
| X X X X | 6 0 0 0 | 2 0 0 2 | 0 1 1 1 0 |
| X X X X | 6 0 0 0 | 2 0 0 3 | 0 1 1 1 0 |
| X X X X | 6 0 0 0 | 2 0 0 4 | 0 1 1 1 0 |
| X X X X | 6 0 0 0 | 2 0 0 5 | 0 1 1 1 0 |
| X X X X | 6 0 0 0 | 2 0 0 6 | 0 1 1 1 0 |
| X X X X | 6 0 0 0 | 2 0 0 7 | 0 1 1 1 0 |
| X X X X | 6 0 0 0 | 2 0 0 8 | 0 1 1 1 0 |

-continued

| Window Contents | | | X' |
|---|---|---|---|
| XXXX | 6000 | 2009 | 01110 |
| XXXX | 6000 | 3001 | 01110 |
| XXXX | 6000 | 3002 | 01110 |
| XXXX | 6000 | 3003 | 01110 |
| XXXX | 6000 | 3004 | 01110 |
| XXXX | 6000 | 3005 | 01110 |
| XXXX | 6000 | 3006 | 01110 |
| XXXX | 6000 | 3007 | 01110 |
| XXXX | 6000 | 3008 | 01110 |
| XXXX | 6000 | 3009 | 01110 |
| XXXX | 6000 | 4001 | 01110 |
| XXXX | 6000 | 4002 | 01110 |
| XXXX | 6000 | 4003 | 01110 |
| XXXX | 6000 | 4004 | 01110 |
| XXXX | 6000 | 4005 | 01110 |
| XXXX | 7000 | 1001 | 01111 |
| XXXX | 7000 | 1002 | 01111 |
| XXXX | 7000 | 1003 | 01111 |
| XXXX | 7000 | 1004 | 01111 |
| XXXX | 7000 | 1005 | 01111 |
| XXXX | 7000 | 1006 | 01111 |
| XXXX | 7000 | 1007 | 01111 |
| XXXX | 7000 | 1008 | 01111 |
| XXXX | 7000 | 1009 | 01111 |
| XXXX | 7000 | 2001 | 01111 |
| XXXX | 7000 | 2002 | 01111 |
| XXXX | 7000 | 2003 | 01111 |
| XXXX | 7000 | 2004 | 01111 |
| XXXX | 7000 | 2005 | 01111 |
| XXXX | 7000 | 2006 | 01111 |
| XXXX | 7000 | 2007 | 01111 |
| XXXX | 7000 | 2008 | 01111 |
| XXXX | 7000 | 2009 | 01111 |
| XXXX | 7000 | 3001 | 01111 |
| XXXX | 7000 | 3002 | 01111 |
| XXXX | 7000 | 3003 | 01111 |
| XXXX | 7000 | 3004 | 01111 |
| XXXX | 7000 | 3005 | 01111 |
| XXXX | 7000 | 3006 | 01111 |
| XXXX | 7000 | 3007 | 01111 |
| XXXX | 7000 | 3008 | 01111 |
| XXXX | 7000 | 3009 | 01111 |
| XXXX | 7000 | 4001 | 01111 |
| XXXX | 7000 | 4002 | 01111 |
| XXXX | 7000 | 4003 | 01111 |
| XXXX | 7000 | 4004 | 01111 |
| XXXX | 7000 | 4005 | 01111 |
| XXXX | 8000 | 1001 | 10000 |
| XXXX | 8000 | 1002 | 10000 |
| XXXX | 8000 | 1003 | 10000 |
| XXXX | 8000 | 1004 | 10000 |
| XXXX | 8000 | 1005 | 10000 |
| XXXX | 8000 | 1006 | 10000 |
| XXXX | 8000 | 1007 | 10000 |
| XXXX | 8000 | 1008 | 10000 |
| XXXX | 8000 | 1009 | 10000 |
| XXXX | 8000 | 2001 | 10000 |
| XXXX | 8000 | 2002 | 10000 |
| XXXX | 8000 | 2003 | 10000 |
| XXXX | 8000 | 2004 | 10000 |
| XXXX | 8000 | 2005 | 10000 |
| XXXX | 8000 | 2006 | 10000 |
| XXXX | 8000 | 2007 | 10000 |
| XXXX | 8000 | 2008 | 10000 |
| XXXX | 8000 | 2009 | 10000 |
| XXXX | 8000 | 3001 | 10000 |
| XXXX | 8000 | 3002 | 10000 |
| XXXX | 8000 | 3003 | 10000 |
| XXXX | 8000 | 3004 | 10000 |
| XXXX | 8000 | 3005 | 10000 |
| XXXX | 8000 | 3006 | 10000 |
| XXXX | 8000 | 3007 | 10000 |
| XXXX | 8000 | 3008 | 10000 |
| XXXX | 8000 | 3009 | 10000 |
| XXXX | 8000 | 4001 | 10000 |
| XXXX | 8000 | 4002 | 10000 |
| XXXX | 8000 | 4003 | 10000 |

-continued

| Window Contents | | | X' |
|---|---|---|---|
| XXXX | 8000 | 4004 | 10000 |
| XXXX | 8000 | 4005 | 10000 |
| XXXX | 9000 | 1001 | 10001 |
| XXXX | 9000 | 1002 | 10001 |
| XXXX | 9000 | 1003 | 10001 |
| XXXX | 9000 | 1004 | 10001 |
| XXXX | 9000 | 1005 | 10001 |
| XXXX | 9000 | 1006 | 10001 |
| XXXX | 9000 | 1007 | 10001 |
| XXXX | 9000 | 1008 | 10001 |
| XXXX | 9000 | 1009 | 10001 |
| XXXX | 9000 | 2001 | 10001 |
| XXXX | 9000 | 2002 | 10001 |
| XXXX | 9000 | 2003 | 10001 |
| XXXX | 9000 | 2004 | 10001 |
| XXXX | 9000 | 2005 | 10001 |
| XXXX | 9000 | 2006 | 10001 |
| XXXX | 9000 | 2007 | 10001 |
| XXXX | 9000 | 2008 | 10001 |
| XXXX | 9000 | 2009 | 10001 |
| XXXX | 9000 | 3001 | 10001 |
| XXXX | 9000 | 3002 | 10001 |
| XXXX | 9000 | 3003 | 10001 |
| XXXX | 9000 | 3004 | 10001 |
| XXXX | 9000 | 3005 | 10001 |
| XXXX | 9000 | 3006 | 10001 |
| XXXX | 9000 | 3007 | 10001 |
| XXXX | 9000 | 3008 | 10001 |
| XXXX | 9000 | 3009 | 10001 |
| XXXX | 9000 | 4001 | 10001 |
| XXXX | 9000 | 4002 | 10001 |
| XXXX | 9000 | 4003 | 10001 |
| XXXX | 9000 | 4004 | 10001 |
| XXXX | 9000 | 4005 | 10001 |
| XXXX | 4000 | 4006 | 10010 |
| XXXX | 4000 | 4007 | 10010 |
| XXXX | 4000 | 4008 | 10010 |
| XXXX | 4000 | 4009 | 10010 |
| XXXX | 4000 | 5001 | 10010 |
| XXXX | 4000 | 5002 | 10010 |
| XXXX | 4000 | 5003 | 10010 |
| XXXX | 4000 | 5004 | 10010 |
| XXXX | 4000 | 5005 | 10010 |
| XXXX | 4000 | 5006 | 10010 |
| XXXX | 4000 | 5007 | 10010 |
| XXXX | 4000 | 5008 | 10010 |
| XXXX | 4000 | 5009 | 10010 |
| XXXX | 4000 | 6001 | 10010 |
| XXXX | 4000 | 6002 | 10010 |
| XXXX | 4000 | 6003 | 10010 |
| XXXX | 4000 | 6004 | 10010 |
| XXXX | 4000 | 6005 | 10010 |
| XXXX | 4000 | 6006 | 10010 |
| XXXX | 4000 | 6007 | 10010 |
| XXXX | 4000 | 6008 | 10010 |
| XXXX | 4000 | 6009 | 10010 |
| XXXX | 4000 | 7001 | 10010 |
| XXXX | 4000 | 7002 | 10010 |
| XXXX | 4000 | 7003 | 10010 |
| XXXX | 4000 | 7004 | 10010 |
| XXXX | 4000 | 7005 | 10010 |
| XXXX | 4000 | 7006 | 10010 |
| XXXX | 4000 | 7007 | 10010 |
| XXXX | 4000 | 7008 | 10010 |
| XXXX | 4000 | 7009 | 10010 |
| XXXX | 4000 | 8001 | 10010 |
| XXXX | 5000 | 4006 | 10011 |
| XXXX | 5000 | 4007 | 10011 |
| XXXX | 5000 | 4008 | 10011 |
| XXXX | 5000 | 4009 | 10011 |
| XXXX | 5000 | 5001 | 10011 |
| XXXX | 5000 | 5002 | 10011 |
| XXXX | 5000 | 5003 | 10011 |
| XXXX | 5000 | 5004 | 10011 |
| XXXX | 5000 | 5005 | 10011 |
| XXXX | 5000 | 5006 | 10011 |
| XXXX | 5000 | 5007 | 10011 |

-continued

| Window Contents | | | X' |
|---|---|---|---|
| XXXX | 5000 | 5008 | 10011 |
| XXXX | 5000 | 5009 | 10011 |
| XXXX | 5000 | 6001 | 10011 |
| XXXX | 5000 | 6002 | 10011 |
| XXXX | 5000 | 6003 | 10011 |
| XXXX | 5000 | 6004 | 10011 |
| XXXX | 5000 | 6005 | 10011 |
| XXXX | 5000 | 6006 | 10011 |
| XXXX | 5000 | 6007 | 10011 |
| XXXX | 5000 | 6008 | 10011 |
| XXXX | 5000 | 6009 | 10011 |
| XXXX | 5000 | 7001 | 10011 |
| XXXX | 5000 | 7002 | 10011 |
| XXXX | 5000 | 7003 | 10011 |
| XXXX | 5000 | 7004 | 10011 |
| XXXX | 5000 | 7005 | 10011 |
| XXXX | 5000 | 7006 | 10011 |
| XXXX | 5000 | 7007 | 10011 |
| XXXX | 5000 | 7008 | 10011 |
| XXXX | 5000 | 7009 | 10011 |
| XXXX | 5000 | 8001 | 10011 |
| XXXX | 6000 | 4006 | 10100 |
| XXXX | 6000 | 4007 | 10100 |
| XXXX | 6000 | 4008 | 10100 |
| XXXX | 6000 | 4009 | 10100 |
| XXXX | 6000 | 5001 | 10100 |
| XXXX | 6000 | 5002 | 10100 |
| XXXX | 6000 | 5003 | 10100 |
| XXXX | 6000 | 5004 | 10100 |
| XXXX | 6000 | 5005 | 10100 |
| XXXX | 6000 | 5006 | 10100 |
| XXXX | 6000 | 5007 | 10100 |
| XXXX | 6000 | 5008 | 10100 |
| XXXX | 6000 | 5009 | 10100 |
| XXXX | 6000 | 6001 | 10100 |
| XXXX | 6000 | 6002 | 10100 |
| XXXX | 6000 | 6003 | 10100 |
| XXXX | 6000 | 6004 | 10100 |
| XXXX | 6000 | 6005 | 10100 |
| XXXX | 6000 | 6006 | 10100 |
| XXXX | 6000 | 6007 | 10100 |
| XXXX | 6000 | 6008 | 10100 |
| XXXX | 6000 | 6009 | 10100 |
| XXXX | 6000 | 7001 | 10100 |
| XXXX | 6000 | 7002 | 10100 |
| XXXX | 6000 | 7003 | 10100 |
| XXXX | 6000 | 7004 | 10100 |
| XXXX | 6000 | 7005 | 10100 |
| XXXX | 6000 | 7006 | 10100 |
| XXXX | 6000 | 7007 | 10100 |
| XXXX | 6000 | 7008 | 10100 |
| XXXX | 6000 | 7009 | 10100 |
| XXXX | 6000 | 8001 | 10100 |
| XXXX | 7000 | 4006 | 10101 |
| XXXX | 7000 | 4007 | 10101 |
| XXXX | 7000 | 4008 | 10101 |
| XXXX | 7000 | 4009 | 10101 |
| XXXX | 7000 | 5001 | 10101 |
| XXXX | 7000 | 5002 | 10101 |
| XXXX | 7000 | 5003 | 10101 |
| XXXX | 7000 | 5004 | 10101 |
| XXXX | 7000 | 5005 | 10101 |
| XXXX | 7000 | 5006 | 10101 |
| XXXX | 7000 | 5007 | 10101 |
| XXXX | 7000 | 5008 | 10101 |
| XXXX | 7000 | 5009 | 10101 |
| XXXX | 7000 | 6001 | 10101 |
| XXXX | 7000 | 6002 | 10101 |
| XXXX | 7000 | 6003 | 10101 |
| XXXX | 7000 | 6004 | 10101 |
| XXXX | 7000 | 6005 | 10101 |
| XXXX | 7000 | 6006 | 10101 |
| XXXX | 7000 | 6007 | 10101 |
| XXXX | 7000 | 6008 | 10101 |
| XXXX | 7000 | 6009 | 10101 |
| XXXX | 7000 | 7001 | 10101 |
| XXXX | 7000 | 7002 | 10101 |

-continued

| Window Contents | | | X' |
|---|---|---|---|
| XXXX | 7000 | 7003 | 10101 |
| XXXX | 7000 | 7004 | 10101 |
| XXXX | 7000 | 7005 | 10101 |
| XXXX | 7000 | 7006 | 10101 |
| XXXX | 7000 | 7007 | 10101 |
| XXXX | 7000 | 7008 | 10101 |
| XXXX | 7000 | 7009 | 10101 |
| XXXX | 7000 | 8001 | 10101 |
| XXXX | 8000 | 4006 | 10110 |
| XXXX | 8000 | 4007 | 10110 |
| XXXX | 8000 | 4008 | 10110 |
| XXXX | 8000 | 4009 | 10110 |
| XXXX | 8000 | 5001 | 10110 |
| XXXX | 8000 | 5002 | 10110 |
| XXXX | 8000 | 5003 | 10110 |
| XXXX | 8000 | 5004 | 10110 |
| XXXX | 8000 | 5005 | 10110 |
| XXXX | 8000 | 5006 | 10110 |
| XXXX | 8000 | 5007 | 10110 |
| XXXX | 8000 | 5008 | 10110 |
| XXXX | 8000 | 5009 | 10110 |
| XXXX | 8000 | 6001 | 10110 |
| XXXX | 8000 | 6002 | 10110 |
| XXXX | 8000 | 6003 | 10110 |
| XXXX | 8000 | 6004 | 10110 |
| XXXX | 8000 | 6005 | 10110 |
| XXXX | 8000 | 6006 | 10110 |
| XXXX | 8000 | 6007 | 10110 |
| XXXX | 8000 | 6008 | 10110 |
| XXXX | 8000 | 6009 | 10110 |
| XXXX | 8000 | 7001 | 10110 |
| XXXX | 8000 | 7002 | 10110 |
| XXXX | 8000 | 7003 | 10110 |
| XXXX | 8000 | 7004 | 10110 |
| XXXX | 8000 | 7005 | 10110 |
| XXXX | 8000 | 7006 | 10110 |
| XXXX | 8000 | 7007 | 10110 |
| XXXX | 8000 | 7008 | 10110 |
| XXXX | 8000 | 7009 | 10110 |
| XXXX | 8000 | 8001 | 10110 |
| XXXX | 9000 | 4006 | 10111 |
| XXXX | 9000 | 4007 | 10111 |
| XXXX | 9000 | 4008 | 10111 |
| XXXX | 9000 | 4009 | 10111 |
| XXXX | 9000 | 5001 | 10111 |
| XXXX | 9000 | 5002 | 10111 |
| XXXX | 9000 | 5003 | 10111 |
| XXXX | 9000 | 5004 | 10111 |
| XXXX | 9000 | 5005 | 10111 |
| XXXX | 9000 | 5006 | 10111 |
| XXXX | 9000 | 5007 | 10111 |
| XXXX | 9000 | 5008 | 10111 |
| XXXX | 9000 | 5009 | 10111 |
| XXXX | 9000 | 6001 | 10111 |
| XXXX | 9000 | 6002 | 10111 |
| XXXX | 9000 | 6003 | 10111 |
| XXXX | 9000 | 6004 | 10111 |
| XXXX | 9000 | 6005 | 10111 |
| XXXX | 9000 | 6006 | 10111 |
| XXXX | 9000 | 6007 | 10111 |
| XXXX | 9000 | 6008 | 10111 |
| XXXX | 9000 | 6009 | 10111 |
| XXXX | 9000 | 7001 | 10111 |
| XXXX | 9000 | 7002 | 10111 |
| XXXX | 9000 | 7003 | 10111 |
| XXXX | 9000 | 7004 | 10111 |
| XXXX | 9000 | 7005 | 10111 |
| XXXX | 9000 | 7006 | 10111 |
| XXXX | 9000 | 7007 | 10111 |
| XXXX | 9000 | 7008 | 10111 |
| XXXX | 9000 | 7009 | 10111 |
| XXXX | 9000 | 8001 | 10111 |
| XXXX | 4000 | 8002 | 11000 |
| XXXX | 4000 | 8003 | 11000 |
| XXXX | 4000 | 8004 | 11000 |
| XXXX | 4000 | 8005 | 11000 |
| XXXX | 4000 | 8006 | 11000 |

-continued

| Window Contents | | | X' |
|---|---|---|---|
| XXXX | 4000 | 8007 | 11000 |
| XXXX | 4000 | 8008 | 11000 |
| XXXX | 4000 | 8009 | 11000 |
| XXXX | 4000 | 9001 | 11000 |
| XXXX | 4000 | 9002 | 11000 |
| XXXX | 4000 | 9003 | 11000 |
| XXXX | 4000 | 9004 | 11000 |
| XXXX | 4000 | 9005 | 11000 |
| XXXX | 4000 | 9006 | 11000 |
| XXXX | 4000 | 9007 | 11000 |
| XXXX | 4000 | 9008 | 11000 |
| XXXX | 4000 | 9009 | 11000 |
| XXXX | 4000 | 1000 | 11000 |
| XXXX | 4000 | 2000 | 11000 |
| XXXX | 4000 | 3000 | 11000 |
| XXXX | 5000 | 8002 | 11001 |
| XXXX | 5000 | 8003 | 11001 |
| XXXX | 5000 | 8004 | 11001 |
| XXXX | 5000 | 8005 | 11001 |
| XXXX | 5000 | 8006 | 11001 |
| XXXX | 5000 | 8007 | 11001 |
| XXXX | 5000 | 8008 | 11001 |
| XXXX | 5000 | 8009 | 11001 |
| XXXX | 5000 | 9001 | 11001 |
| XXXX | 5000 | 9002 | 11001 |
| XXXX | 5000 | 9003 | 11001 |
| XXXX | 5000 | 9004 | 11001 |
| XXXX | 5000 | 9005 | 11001 |
| XXXX | 5000 | 9006 | 11001 |
| XXXX | 5000 | 9007 | 11001 |
| XXXX | 5000 | 9008 | 11001 |
| XXXX | 5000 | 9009 | 11001 |
| XXXX | 5000 | 1000 | 11001 |
| XXXX | 5000 | 2000 | 11001 |
| XXXX | 5000 | 3000 | 11001 |
| XXXX | 6000 | 8002 | 11010 |
| XXXX | 6000 | 8003 | 11010 |
| XXXX | 6000 | 8004 | 11010 |
| XXXX | 6000 | 8005 | 11010 |
| XXXX | 6000 | 8006 | 11010 |
| XXXX | 6000 | 8007 | 11010 |
| XXXX | 6000 | 8008 | 11010 |
| XXXX | 6000 | 8009 | 11010 |
| XXXX | 6000 | 9001 | 11010 |
| XXXX | 6000 | 9002 | 11010 |
| XXXX | 6000 | 9003 | 11010 |
| XXXX | 6000 | 9004 | 11010 |
| XXXX | 6000 | 9005 | 11010 |
| XXXX | 6000 | 9006 | 11010 |
| XXXX | 6000 | 9007 | 11010 |
| XXXX | 6000 | 9008 | 11010 |
| XXXX | 6000 | 9009 | 11010 |
| XXXX | 6000 | 1000 | 11010 |
| XXXX | 6000 | 2000 | 11010 |
| XXXX | 6000 | 3000 | 11010 |
| XXXX | 7000 | 8002 | 11011 |
| XXXX | 7000 | 8003 | 11011 |
| XXXX | 7000 | 8004 | 11011 |
| XXXX | 7000 | 8005 | 11011 |
| XXXX | 7000 | 8006 | 11011 |
| XXXX | 7000 | 8007 | 11011 |
| XXXX | 7000 | 8008 | 11011 |
| XXXX | 7000 | 8009 | 11011 |

-continued

| Window Contents | | | X' |
|---|---|---|---|
| XXXX | 7000 | 9001 | 11011 |
| XXXX | 7000 | 9002 | 11011 |
| XXXX | 7000 | 9003 | 11011 |
| XXXX | 7000 | 9004 | 11011 |
| XXXX | 7000 | 9005 | 11011 |
| XXXX | 7000 | 9006 | 11011 |
| XXXX | 7000 | 9007 | 11011 |
| XXXX | 7000 | 9008 | 11011 |
| XXXX | 7000 | 9009 | 11011 |
| XXXX | 7000 | 1000 | 11011 |
| XXXX | 7000 | 2000 | 11011 |
| XXXX | 7000 | 3000 | 11011 |
| XXXX | 8000 | 8002 | 11100 |
| XXXX | 8000 | 8003 | 11100 |
| XXXX | 8000 | 8004 | 11100 |
| XXXX | 8000 | 8005 | 11100 |
| XXXX | 8000 | 8006 | 11100 |
| XXXX | 8000 | 8007 | 11100 |
| XXXX | 8000 | 8008 | 11100 |
| XXXX | 8000 | 8009 | 11100 |
| XXXX | 8000 | 9001 | 11100 |
| XXXX | 8000 | 9002 | 11100 |
| XXXX | 8000 | 9003 | 11100 |
| XXXX | 8000 | 9004 | 11100 |
| XXXX | 8000 | 9005 | 11100 |
| XXXX | 8000 | 9006 | 11100 |
| XXXX | 8000 | 9007 | 11100 |
| XXXX | 8000 | 9008 | 11100 |
| XXXX | 8000 | 9009 | 11100 |
| XXXX | 8000 | 1000 | 11100 |
| XXXX | 8000 | 2000 | 11100 |
| XXXX | 8000 | 3000 | 11100 |
| XXXX | 9000 | 8002 | 11101 |
| XXXX | 9000 | 8003 | 11101 |
| XXXX | 9000 | 8004 | 11101 |
| XXXX | 9000 | 8005 | 11101 |
| XXXX | 9000 | 8006 | 11101 |
| XXXX | 9000 | 8007 | 11101 |
| XXXX | 9000 | 8008 | 11101 |
| XXXX | 9000 | 8009 | 11101 |
| XXXX | 9000 | 9001 | 11101 |
| XXXX | 9000 | 9002 | 11101 |
| XXXX | 9000 | 9003 | 11101 |
| XXXX | 9000 | 9004 | 11101 |
| XXXX | 9000 | 9005 | 11101 |
| XXXX | 9000 | 9006 | 11101 |
| XXXX | 9000 | 9007 | 11101 |
| XXXX | 9000 | 9008 | 11101 |
| XXXX | 9000 | 9009 | 11101 |
| XXXX | 9000 | 1000 | 11101 |
| XXXX | 9000 | 2000 | 11101 |
| XXXX | 9000 | 3000 | 11101 |
| XXXX | 0800 | XXXX | 11110 |
| XXXX | 0900 | XXXX | 11111. |

25. The system of claim 22, wherein said channel is a storage medium or a communications channel.

* * * * *